US012719242B2

(12) United States Patent
Clarke et al.

(10) Patent No.: US 12,719,242 B2
(45) Date of Patent: Aug. 25, 2026

(54) SPARK GAPS WITH HIGH CURRENT CAPABILITY FOR ELECTRICAL OVERSTRESS DETECTION AND PROTECTION

(71) Applicant: Analog Devices International Unlimited Company, Limerick (IE)

(72) Inventors: David J. Clarke, Patrickswell (IE); Alan J. O'Donnell, Castletroy (IE); Shaun Stephen Bradley, Patrickswell (IE); Stephen Denis Heffernan, County Tipperary (IE); Patrick Martin McGuinness, Pallaskenry (IE); Padraig L. Fitzgerald, Mallow (IE); Edward John Coyne, Athenry (IE); Michael P. Lynch, Bruff (IE); John Anthony Cleary, Kilmallock (IE); John Ross Wallrabenstein, Lafayette, IN (US); Paul Joseph Maher, Ennis (IE); Andrew Christopher Linehan, Castlemahon (IE); Gavin Patrick Cosgrave, Enniscorthy (IE); Michael James Twohig, County Cork (IE); Jan Kubik, Limerick (IE); Jochen Schmitt, Biedenkopf (DE); David Aherne, Limerick City (IE); Mary McSherry, Ennis (IE); Anne M. McMahon, County Clare (IE); Stanislav Jolondcovschi, Carlow (IE); Cillian Burke, Via Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 18/679,352

(22) Filed: May 30, 2024

(65) Prior Publication Data

US 2024/0405518 A1 Dec. 5, 2024

Related U.S. Application Data

(60) Provisional application No. 63/505,360, filed on May 31, 2023.

(51) Int. Cl.
*H01T 4/10* (2006.01)
*H01T 1/02* (2006.01)
(Continued)

(52) U.S. Cl.
CPC ................ *H01T 4/06* (2013.01); *H01T 1/02* (2013.01); *H01T 2/02* (2013.01); *H01T 4/10* (2013.01);
(Continued)

(58) Field of Classification Search
None
See application file for complete search history.

(56) References Cited

U.S. PATENT DOCUMENTS 3,761,673 A 9/1973 Sennowitz
3,810,063 A 5/1974 Blewitt
(Continued)

FOREIGN PATENT DOCUMENTS

CN 1577390 A 2/2005
CN 1628382 A 6/2005
(Continued)

OTHER PUBLICATIONS

Office Action Dated Jul. 28, 2025 in Taiwan Patent Application No. 113119984 in 8 pages.
(Continued)

*Primary Examiner* — Kenneth B Wells
(74) *Attorney, Agent, or Firm* — KNOBBE, MARTENS, OLSON & BEAR, LLP

(57) ABSTRACT

Apparatuses including spark gap structures for electrical overstress (EOS) monitoring or protection, and associated methods, are disclosed. In an aspect, a spark gap device includes first and second conductive layers formed over a substrate, where the first and second conductive layers are electrically connected to first and second voltage nodes, respectively. The first conductive layer includes a plurality of arcing tips configured to form arcing electrode pairs with the second conductive layer to form an arc discharge in response to an EOS voltage between the first and second voltage nodes. The spark gap device further includes a series ballast resistor electrically connected between the arcing tips and the first voltage node, where the ballast resistor in (Continued)

formed in a metallization layer over the substrate and a resistance of the series ballast resistor is substantially higher than a resistance of the second conductive layer.

7 Claims, 94 Drawing Sheets

(51) Int. Cl.
*H01T 2/02* (2006.01)
*H01T 4/06* (2006.01)
*H01T 4/12* (2006.01)
*H02H 9/06* (2006.01)
*H05K 1/02* (2006.01)

(52) U.S. Cl.
CPC ................ *H01T 4/12* (2013.01); *H02H 9/06* (2013.01); *H05K 1/0259* (2013.01)

(56) References Cited

U.S. PATENT DOCUMENTS 4,514,712 A 4/1985 McDougal
4,726,991 A 2/1988 Hyatt et al.
4,939,619 A 7/1990 Borkowicz et al.
5,315,472 A 5/1994 Fong et al.
5,357,397 A 10/1994 Leary et al.
5,659,283 A 8/1997 Arratia
5,786,613 A 7/1998 Kalnitsky
5,946,176 A 8/1999 Ghoshal
5,990,519 A 11/1999 Huang-Lu et al.
6,002,569 A 12/1999 Horvath
6,094,116 A 7/2000 Tai et al.
6,355,958 B1 * 3/2002 Orchard-Webb ......... H01T 4/08 257/358
6,977,468 B1 12/2005 Baginski
7,064,423 B2 6/2006 Okita et al.
8,390,083 B2 3/2013 O'Donnell et al.
8,629,386 B2 1/2014 Bermak et al.
8,633,575 B1 1/2014 Mangrum
8,890,286 B2 11/2014 O'Donnell et al.
9,184,569 B2 11/2015 Ehrhardt et al.
9,380,688 B1 6/2016 Feng et al.
9,575,111 B1 2/2017 Karp et al.
9,871,373 B2 1/2018 O'Donnell et al.
10,013,948 B2 7/2018 Lee et al.
10,145,906 B2 12/2018 O'Donnell et al.
10,380,869 B1 8/2019 Matyac
10,418,806 B2 9/2019 Lopez Rodriguez et al.
10,418,808 B2 9/2019 Bodette et al.
10,677,822 B2 6/2020 Clarke et al.
10,848,152 B2 11/2020 Zhao et al.
11,112,436 B2 9/2021 Clarke et al.
11,668,734 B2 6/2023 Clarke et al.
2001/0002103 A1 5/2001 Karins et al.
2002/0076840 A1 6/2002 Englisch
2003/0089979 A1 5/2003 Malinowski et al.
2004/0084729 A1 5/2004 Leung et al.
2005/0007744 A1 1/2005 Okita et al.
2005/0127444 A1 6/2005 Watanabe
2005/0156281 A1 7/2005 Eshun et al.
2005/0237684 A1 10/2005 Block et al.
2006/0044717 A1 3/2006 Hill et al.
2006/0092591 A1 5/2006 Yuan et al.
2006/0250744 A1 11/2006 McTigue et al.
2006/0274799 A1 12/2006 Collins et al.
2006/0284307 A1 12/2006 Baier et al.
2007/0139050 A1 6/2007 Ivanov et al.
2007/0201177 A1 8/2007 Kladar et al.
2007/0216015 A1 9/2007 Schnitt et al.
2007/0278617 A1 12/2007 Okada et al.
2008/0050113 A1 2/2008 Mathes
2008/0122027 A1 5/2008 Ueda
2008/0266730 A1 10/2008 Viborg et al.
2009/0287435 A1 11/2009 Ker et al.
2010/0271742 A1 10/2010 Shannon et al.
2011/0069419 A1 3/2011 Su et al.
2011/0089540 A1 4/2011 Drost et al.
2011/0169495 A1 7/2011 Lee et al.
2011/0304946 A1 12/2011 Koga et al.
2012/0304365 A1 12/2012 Howard et al.
2013/0257624 A1 10/2013 Ayotte et al.
2013/0301171 A1 11/2013 Li
2014/0268440 A1 9/2014 Chen et al.
2014/0334050 A1 11/2014 Henke
2015/0001635 A1 1/2015 Kwon et al.
2015/0068069 A1 3/2015 Tran et al.
2016/0009547 A1 * 1/2016 Mason ................. B81B 7/0022 257/415
2016/0085844 A1 3/2016 Okamoto et al.
2016/0094026 A1 3/2016 Coyne et al.
2016/0155408 A1 6/2016 Lee et al.
2016/0285255 A1 9/2016 O'Donnell et al.
2016/0322813 A1 11/2016 Aipperspach et al.
2017/0176508 A1 6/2017 Song et al.
2017/0187187 A1 6/2017 Amin et al.
2017/0299649 A1 10/2017 Coyne et al.
2018/0088155 A1 3/2018 Clarke et al.
2018/0115155 A1 4/2018 Kuo
2019/0293692 A1 * 9/2019 Clarke .................. H02H 9/042
2019/0319011 A1 10/2019 McGeehan et al.
2020/0072783 A1 3/2020 Berney et al.
2021/0143111 A1 5/2021 Aleksov et al.
2023/0375600 A1 11/2023 Clarke et al.

FOREIGN PATENT DOCUMENTS

CN 1738134 A 2/2006
CN 101350516 A 1/2009
CN 101689750 A 3/2010
CN 102201333 A 9/2011
CN 102201666 A 9/2011
CN 102570902 A 7/2012
CN 102769282 A 11/2012
CN 202549831 U 11/2012
CN 103296636 A 9/2013
CN 203562642 U 4/2014
CN 103872670 A 6/2014
CN 104984919 A 10/2015
CN 105143897 A 12/2015
CN 105655326 A 6/2016
CN 109291814 A 2/2019
CN 113687205 A 11/2021
CN 115798949 A 3/2023
EP 0580913 A1 2/1994
EP 1612897 B1 3/2007
FR 2219817 A1 9/1974
GB 1449385 A 9/1976
GB 2334627 A 8/1999
JP S62-081050 4/1987
JP S64-12565 A 1/1989
JP H08-017884 1/1996
JP 2003-533013 11/2003
JP 2005-031917 A 2/2005
JP 2005-136088 5/2005
JP 2005-517297 6/2005
JP 2007-329197 A 12/2007
JP 4116912 B2 7/2008
JP 2009-135283 A 6/2009
JP 2010-028109 2/2010
JP 2012151202 A 8/2012
TW 2003-03060 8/2003
TW 2013-10828 3/2013
TW 201330710 7/2013
TW 201515183 4/2015
TW 202004199 1/2020
WO WO 03/067651 A1 8/2003
WO WO 2012/090731 A1 7/2012
WO WO 2012/105497 8/2012
WO WO 2013/009661 A2 1/2013
WO WO 2013/044096 A2 3/2013

(56) References Cited

FOREIGN PATENT DOCUMENTS

| | | | |
|---|---|---|---|
| WO | WO 2015/167623 | A2 | 11/2015 |
| WO | WO 2016/129317 | A1 | 8/2016 |

OTHER PUBLICATIONS

Office Action Dated Aug. 12, 2025 in Taiwan Patent Application No. 113119985 in 9 pages.
International Search Report and Written Opinion dated Sep. 10, 2024 in corresponding PCT Application No. PCT/EP2024/064932; 15 pages.
International Search Report and Written Opinion dated Aug. 19, 2024 in corresponding PCT Application No. PCT/EP2024/064933; 15 pages.
International Search Report and Written Opinion dated Aug. 21, 2024 in corresponding PCT Application No. PCT/EP2024/064937; 16 pages.
International Search Report and Written Opinion dated Sep. 17, 2024 in corresponding PCT Application No. PCT/EP2024/064938; 15 pages.
International Search Report and Written Opinion dated Sep. 6, 2024 in corresponding PCT Application No. PCT/EP2024/064939; 13 pages.
Extended European Search Report dated Nov. 4, 2024 in Application No. 24180938.3, 16 pages.
Office Action dated Jul. 29, 2024 in Chinese Application No. 201980022482.1 in 18 pages.
Notification of Grant dated May 14, 2024 in Chinese Application No. 202110967517.8 in 7 pages.
European Search Report for European Application No. 17193556.2, mailed Mar. 6, 2018 in 17 pages.
Extended European Search Report dated Jun. 19, 2018 in corresponding European Patent Application No. 17193556.2; 16 pages.
International Search Report and Written Opinion dated Oct. 14, 2019 in corresponding PCT Application No. PCT/EP2019/057472; 14 pages.
Invitation to Pay Additional Fees dated Aug. 16, 2019 in PCT Patent Application No. PCT/EP2019/057472; 13 pages.
Office Action dated Jul. 22, 2019 in P.R.C. Patent Application No. 201710890198.9; 10 pages.
Office Action dated Feb. 25, 2020 in Taiwan Patent Application No. 108110439.
Office Action dated Jan. 25, 2021 in Chinese Application No. 201710890198.9.
Decision of Rejection dated Aug. 17, 2020 in Chinese Application No. 201710890198.9.
Extended European Search Report dated Apr. 28, 2021 in European Application No. 20214001.8.
Office Action dated Feb. 22, 2021 in Japanese Application No. 2019-216763.
Notice of Allowance dated Aug. 2, 2021 in counterpart Japanese Application No. 2019-216763.
Office Action dated Jul. 4, 2018 in Taiwan Patent Application No. 106133104; 11 pages.
Office Action dated Mar. 25, 2019 in Japanese Application No. 2017-184749; 4 pages.
Office Action dated Jul. 29, 2019 in Japanese Application No. 2017-184749; 3 pages.
Office Action dated Feb. 18, 2019 in European Application No. 17 193 556.2; 7 pages.
Office Action dated Apr. 6, 2020 in European Application No. 17 193 556.2.
Office Action dated Mar. 5, 2020 in Chinese Application No. 2017108901989; 10 pages.
Notice of Allowance dated Feb. 24, 2022 in U.S. Appl. No. 16/893,874.
Office Action dated Oct. 31, 2022 in Japanese Application No. 2021-142387.
Notice of Allowance dated May 22, 2023 in Japanese Application No. 2021-142387.
Office Action dated May 11, 2023 in European Application No. 20214001.8.
Office Action dated Oct. 12, 2023 in Chinese Application No. 202110967517.8 in 12 pages.
Office Action dated Dec. 26, 2023 in Chinese Application No. 201980022482.1 in 15 pages.
Office Action dated Dec. 23, 2024 in Chinese Application No. 201980022482.1 in 15 pages.
Office Action dated Mar. 18, 2025 in Taiwan Patent Application No. 113119981 in 12 pages.
Office Action dated Mar. 18, 2025 in Taiwan Patent Application No. 113119982 in 6 pages.
Office Action dated Mar. 18, 2025 in Taiwan Patent Application No. 113119983 in 16 pages.
Office Action dated Jan. 30, 2026, in U.S. Appl. No. 18/679,364 in 22 pages.
Communication pursuant to Article 94(3) EPC dated Feb. 11, 2026 in Application No. 24180938.3, 7 pages.
International Preliminary Report on Patentability dated Dec. 11, 2025 in corresponding PCT Application No. PCT/EP2024/064938; 9 pages.
International Preliminary Report on Patentability dated Dec. 11, 2025 in corresponding PCT Application No. PCT/EP2024/064933; 9 pages.
International Preliminary Report on Patentability dated Dec. 11, 2025 in corresponding PCT Application No. PCT/EP2024/064937; 10 pages.
International Preliminary Report on Patentability dated Dec. 11, 2025 in corresponding PCT Application No. PCT/EP2024/064939; 10 pages.
International Preliminary Report on Patentability dated Dec. 11, 2025 in corresponding PCT Application No. PCT/EP2024/064932; 11 pages.
Office Action dated Dec. 10, 2025 in Taiwan Patent Application No. 113119983 in 2 pages.
Office Action dated Dec. 19, 2025 in Taiwan Patent Application No. 113119982 in 15 pages.
Notice of Allowance dated Dec. 18, 2025 in Taiwan Patent Application No. 113119981 in 3 pages.

* cited by examiner 120
126
129
125
x
y
126
130
128
127
125
g1
132
131
x
z 119
122
121
x
y
124
122
123
gL
121
x
z 126a
125
126b
126d
126c 126a
125a
125b
126b
126d
125d
125c
126c 126
125

126
125
x
y

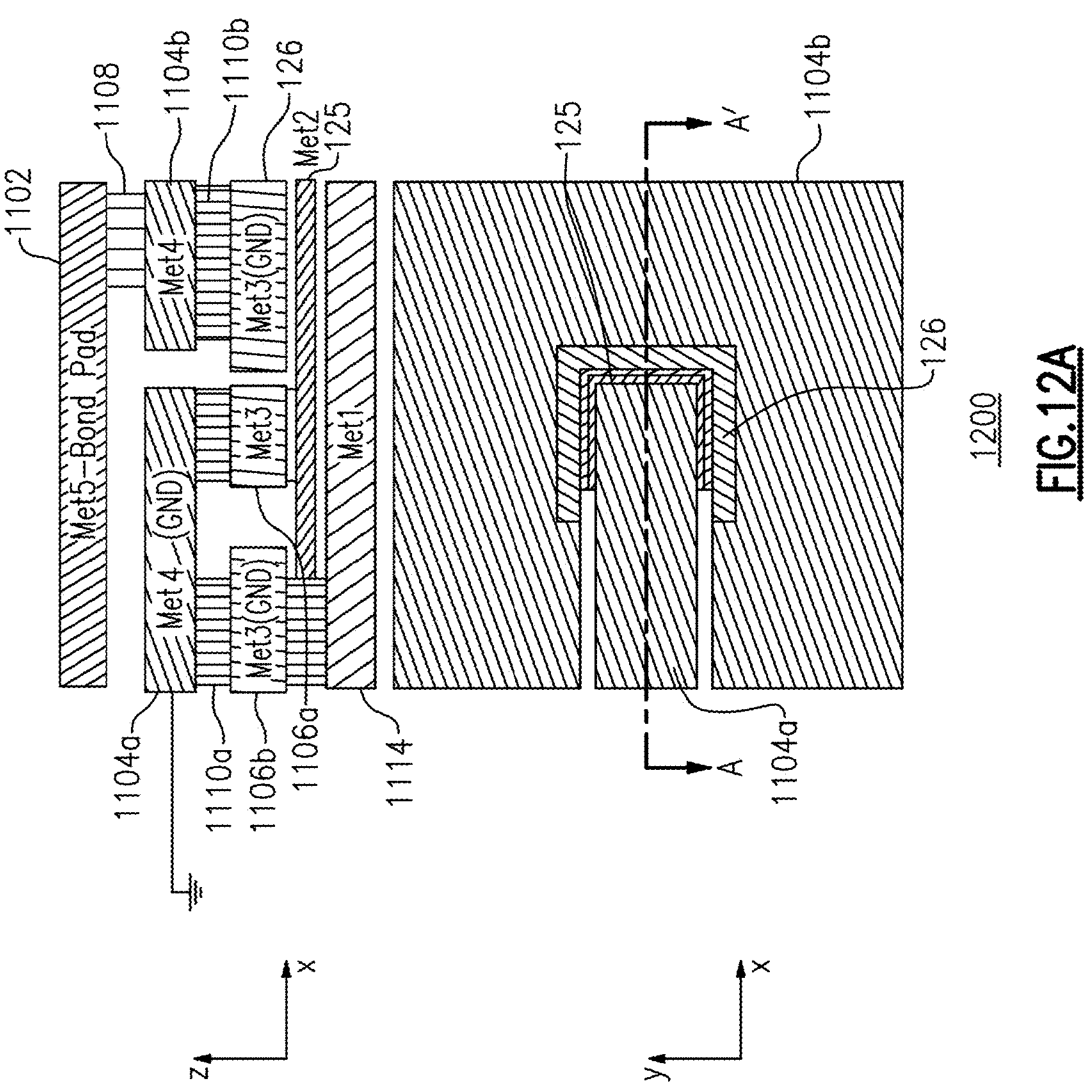
1200
FIG.12A

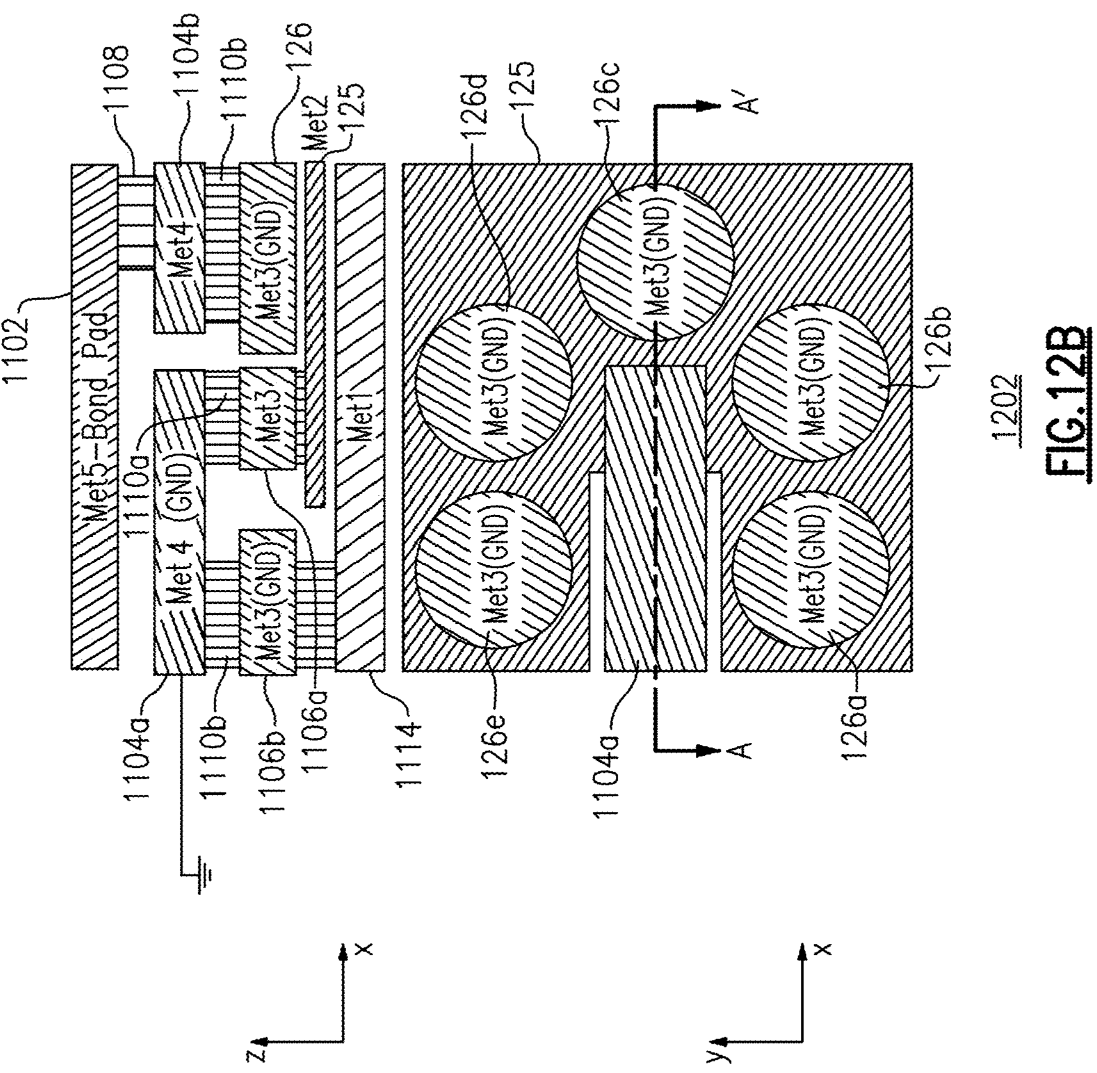
FIG.12B

Met4
Met3
1702
1703
1710

1704a
1704b
1704c
w2
l4x
l5x
l3x
1704

1110b
1110a
1104b
126b
126a
1104a
1700
1705a
1705b

1812b
$l_{6v}$
$l_{7x}$
1812a
y
x
1804

1110b
1104b
126b
1810
1802b
1802a
Met3
126a
1110a
Met4
1104a
1110b
126b
1805d
1805c
1702b
1810
1805b
1702a
126a
1805a
Met3
Met4
1110a
z
1800

2013
$l_{9x}$
2012
$l_{8x}$
q
w3
y
x 2010b
1104b
2108b
1906b
2008b
122
121
2008a
1906a
1104a
2010a
2021
2020
2013b
1906b
2015
2000
1906a
2013a
z

2426
Met2
Met3
2425e
2425d
2425c
Met3
2412a
2425a
2425b
x
y
2422
2426
2412b
Met4
Met3
Met4
Met3
2420
2412a
2406
2410
2425a
2425e
2425d
2425c
Met2
2425b
2425
z
x
2400

2564
2551
2554
2463
2553
2550
2561
x
y
(ILD2 Met4)

2542
2545
2541
(Met3)

2532
2530
(ILD1)

2525a
2508
2502b
2502a
2504
Metal 2 (bilayer)

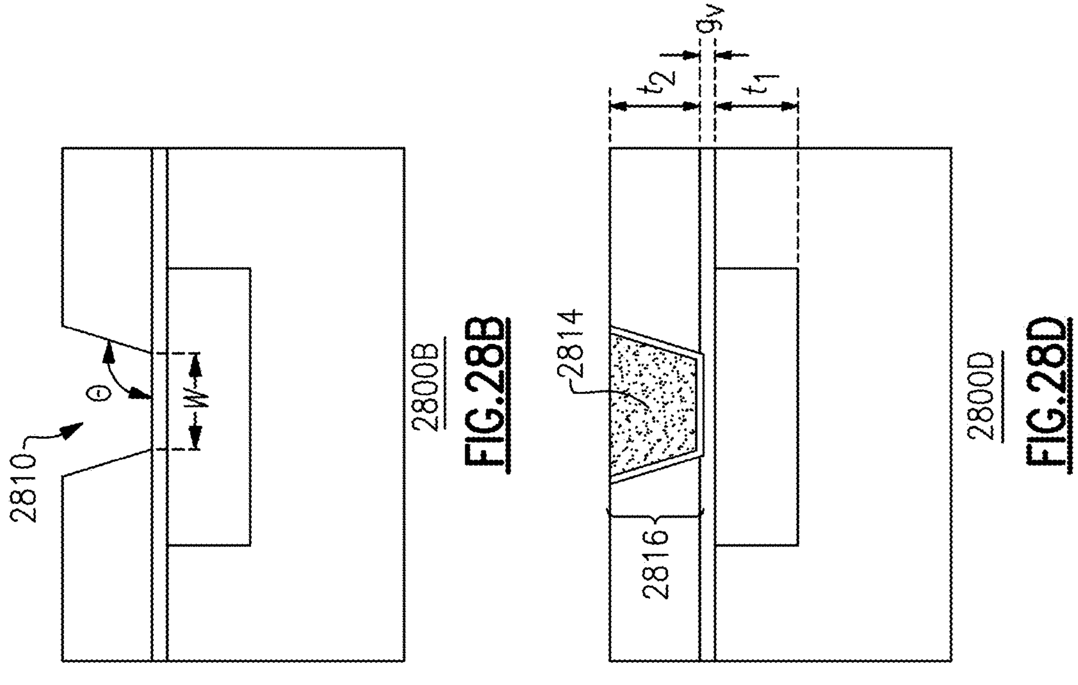
FIG.28B
FIG.28D
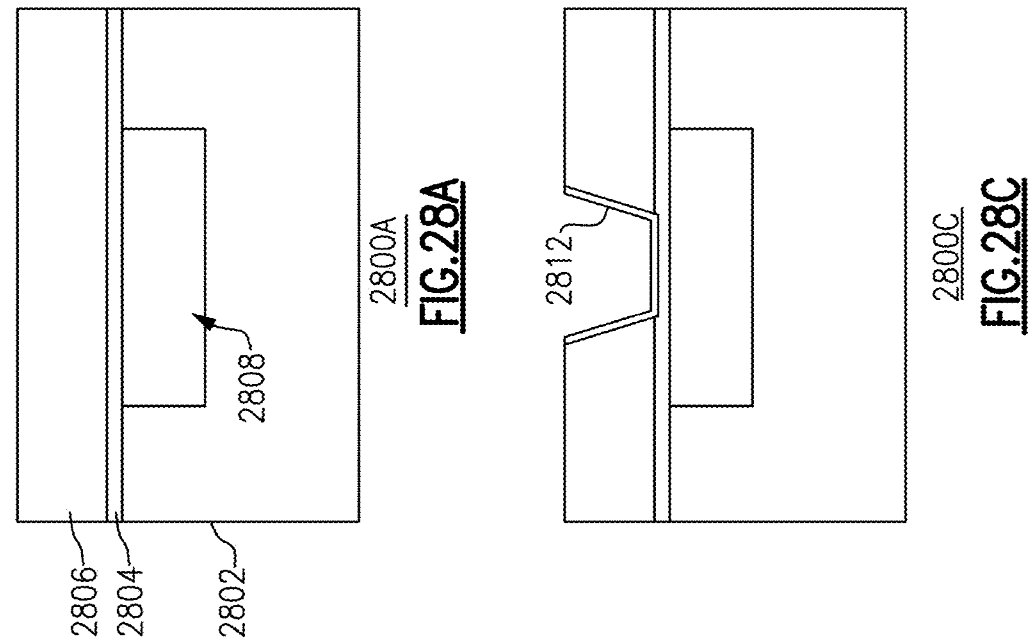
FIG.28A
FIG.28C

2902
W
2900B 2806
2804
2802
2808
2900A $g_v$
$d_1$
$t_2$
$d_2$
$t_1$
2812
2814
2816
2900D 2904
2806
2900C 3200
3206
3202
3204
W
$t_2$
$g_v$
$t_1$
z
x 3203
3206
3207a
3207b
3208
3204
$t_3$
$g_v$ 3205
3206
3210a
3210b
3210c
3204
W1
W2
$t_2$
$t_3$ 3300A
3303
3304
$g_L$
3305
$t_1$
3302
2802

3300B
3310

3308
3310
3302
2802
3300C 3311
3300D 3406
3408
3404
3408
3403
3401

3407
3409
3405
3305
3402
3303
3400

2802 gv
3608
3609b
3614
3609a
3600B 3603
3602b
3608
3610
3606
3604
3602
3602b
3602a
2802
3600A x
z 3604
3624
3626
3622
3600D 3602b
3604
3612
3610
3616
3615
3620a
3600C x
y
x
z gv
3628
3630
3615
3600E x
z
x
y 3704
3606
3702
3705
3700B 3702b
3606
3702a
3702
3704
3602
2802
3700A 3709
3712
3700D x
z
3709
3704
3708
3700C

3702

3907
3904
A
B
3902
3914

3904
A
B
3907
3902
3914

3912
3907
3910
3904
3902
3901
3906
3908
Z
X 4014
4002
4006
4002
4014
3907
4008
4000

3907
4014
3904
3901
A
B
3902
4008
4002
4006
4014
4004
4002
4000

4010b
4016
4012
3907
4016
A
B
4018
4017
4012
4010a
3914
4001

4224
4220
4225
4216b
4222b
4214
4229
4218
4228
4210
4212
4216c
4206b
4208
4226
4206
4216a
4206a
4229
4222a
4204
4203
4204
x
z
4200

4404
4408

4406
4307

4410

4301b
4301a
4301

4307

4402

4306c
4306b
4306a 4311c
4311b
4311a
4308

4414
4410
4406
4412
4408

4410
4416

4508a
4512a
4505a
4506
4510a
4513
NODE$_1$
NODE$_2$
4510
4510b
4510c
4505b
NODE$_1$
4512b
4508b
4507
4509
4501

4505
4516
NODE$_1$
4514
4518
NODE$_2$
4517
4515
4509
4502

4524
NODE$_1$
4519
4522
4520
4523
NODE$_2$
4525
4521
4509
4503

4524
NODE$_1$
4519
4522
4523
4520
NODE$_2$
4526
4509
4504

COILS/STRUCTURE TO ENABLE WIRELESS SIGNALS TO BE SENT
LAYER WITH ESD STRUCTURES

EOS MONITOR STRUCTURES
SENSOR DIE
ASIC MAIN DIE

FOS MONITORS
ENCAPSULANT/MOLD COMPOUND

EOS MONITOR DIE
ASIC
SYSTEM EMBEDDED WITHIN PCB/ LAMINATE TYPE STRUCTURE

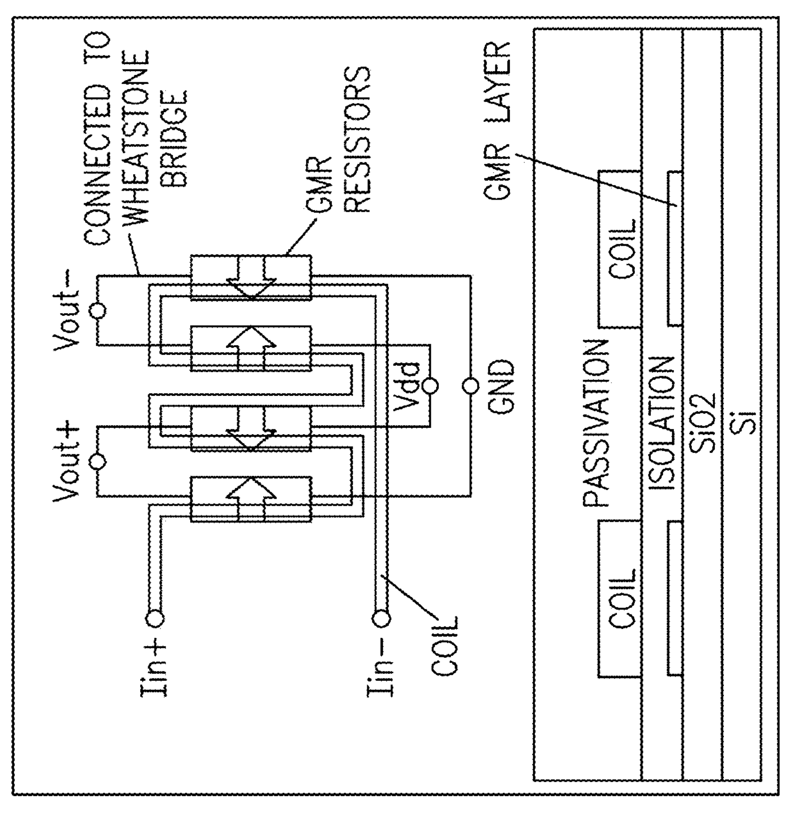
FIG.59B
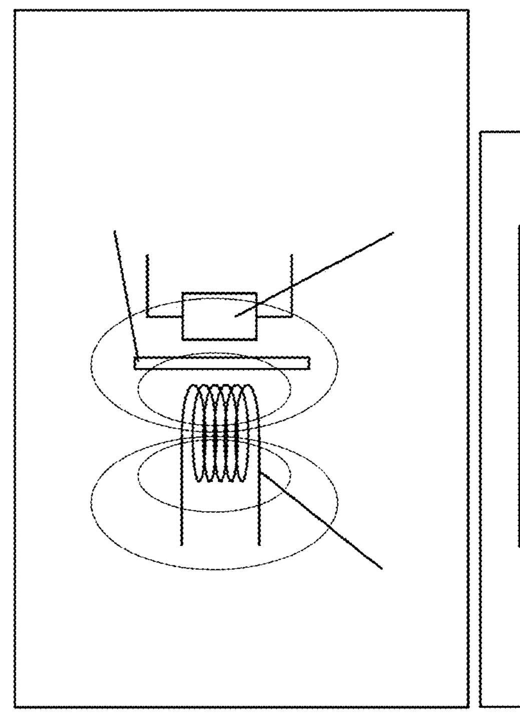
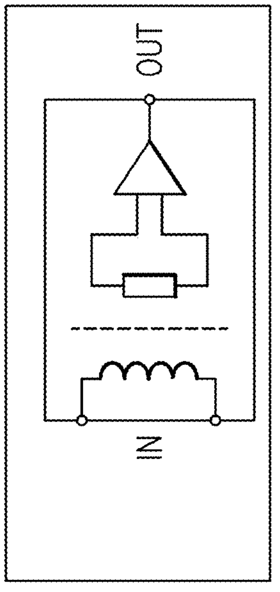
FIG.59A

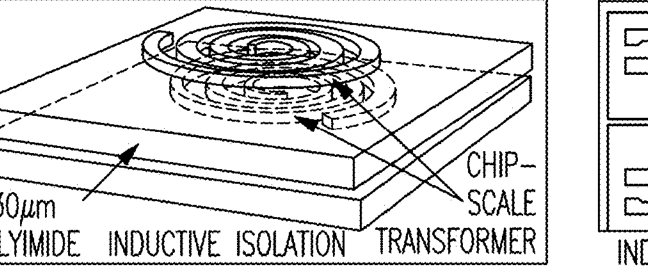

- INDUCTIVE AIR CORE MICRO TRANSFORMER TECHNOLOGY
  - HIGH VOLTAGE INSULATOR DIELECTRIC LIKE POLYIMIDE IS PLACED BETWEEN 2 INDEPENDENT SPIRAL TYPE INDUCTORS PROVIDING VOLTAGE ISOLATION.
  - INSULATOR THICKNESS IMPACTS THE ISOLATION RATING.
  - SIGNAL CONDITIONING CIRCUITRY IS PLACED EITHER SIDE OF THE ISOLATION TRANSFORMER TO SUPPORT MULTI-GIGABIT DATA TRANSFER, AND POWER TRANSFER.

SUPPORTS A WIDE RANGE OF HIGH AND LOWER SPEED INTERFACE PROTOCOLS LIKE:
- RS485/RS422
- LVDS/MLVDS
- CAN
- I2C/SPI
- USB2
- STANDARD DATA
- SUPPORTS ISOLATED DC-D POWER REQUIREMENTS

FIG.60A

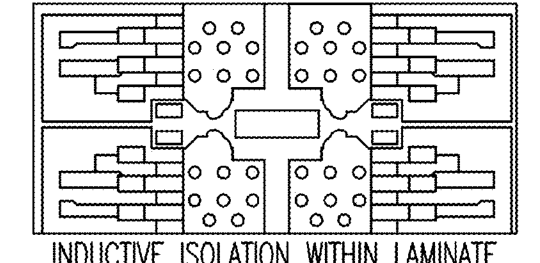

- LAMINATE BASED TRANSFORMER TECHNOLOGY
  - HIGH VOLTAGE HIGH k PCB BASED DIELECTRIC IS PLACED BETWEEN TRANSFORMER SPIRALS PROVIDING VOLTAGE ISOLATION
  - SIGNAL CONDITIONING CIRCUITRY IS PLACED EITHER SIDE OF THE ISOLATION TRANSFORMER TO SUPPORT MULTI-GIGABIT DATA TRANSFER, AND POWER TRANSFER

SUPPORTS A WIDE RANGE OF HIGH AND LOWER SPEED INTERFACE PROTOCOLS LIKE:
- RS485/RS422
- LVDS/MLVDS
- CAN
- I2C/SPI
- USB2
- STANDARD DATA
- SUPPORTS ISOLATED DC-D POWER REQUIREMENTS

FIG.60B

- CAPACITIVE ISOLATION
  - HIGH VOLTAGE INSULATOR LIKE SILICON DIOXIDE IS PLACED BETWEEN CAPACITOR TOP AND BOTTOM PLATES PROVIDING VOLTAGE ISOLATION
  - SIGNAL CONDITIONING CIRCUITRY IS PLACED EITHER SIDE OF THE ISOLATION TRANSFORMER TO SUPPORT MULTI-GIGABIT DATA TRANSFER, AND POWER TRANSFER

SUPPORTS A WIDE RANGE OF HIGH AND LOWER SPEED INTERFACE PROTOCOLS LIKE:
- RS485/RS422
- LVDS/MLVDS
- CAN
- I2C/SPI
- USB2
- STANDARD DATA
- SUPPORTS ISOLATED DC-D POWER REQUIREMENTS

FIG.60C

WALL CHARGER TECHNOLOGY:
- THE ADUM602x PRODUCT CAN BE USED TO PROVIDE DC–DC ISOLATION WITH LOW EMISSIONS.
- THIS TECHNOLOGY CAN ALSO BE USED IN ON BOARD CHARGERS (OBC) WITHIN THE AUTOMOTIVE APPLICATION SPACE, EV CHARGING..

ELECTRONIC CAR HEADLIGHTS..
- ISOLATED SERIAL BUS EXTENDER CAN BE USED TO PROVIDE ISOLATION OF ELECTRONIC CAR HEAD LIGHTS..

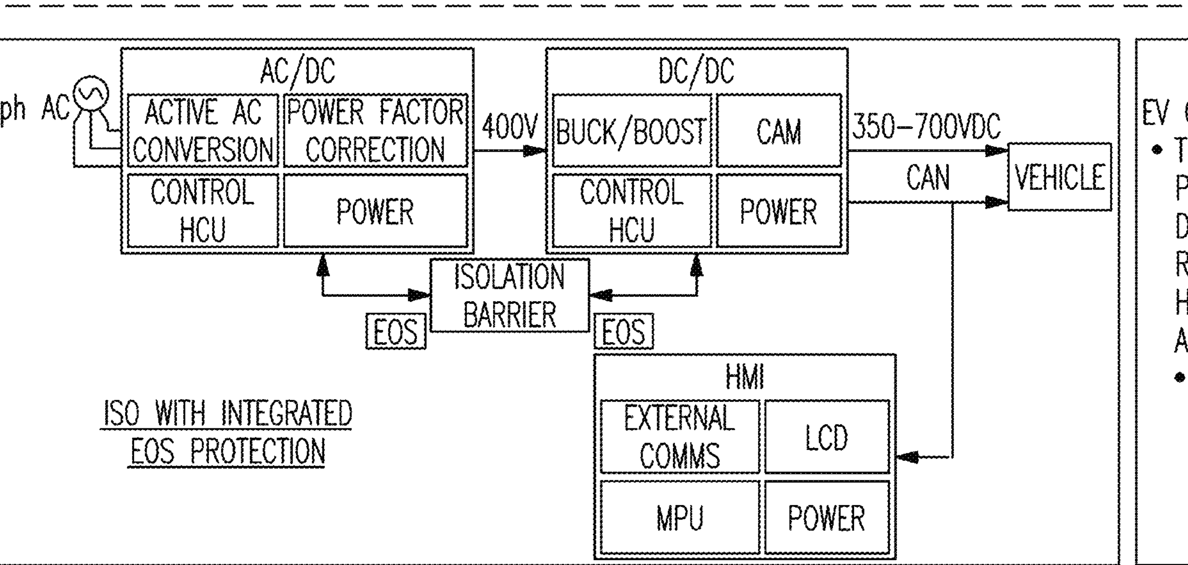

EV CHARGING SYSTEM..
- THE INTEGRATION OF AN EOS MONITOR/ PROTECTION DEVICE ON THE ISOLATION DEVICES I/O CAN PROVIDE INFORMATION REGARDS THE EXISTENCE OF ELECTRICALLY HARSH TRANSIENTS BETWEEN THE HIGH AND LOW VOLTAGE DOMAINS.
  - THE ABILITY TO DETECT A SURGE VOLTAGE EVENT VERSUS AN ESD EVENT VERSUS WORKING VOLTAGE AND RELATED WITHSTAND VOLTAGE EFFECTS.

FIG.62

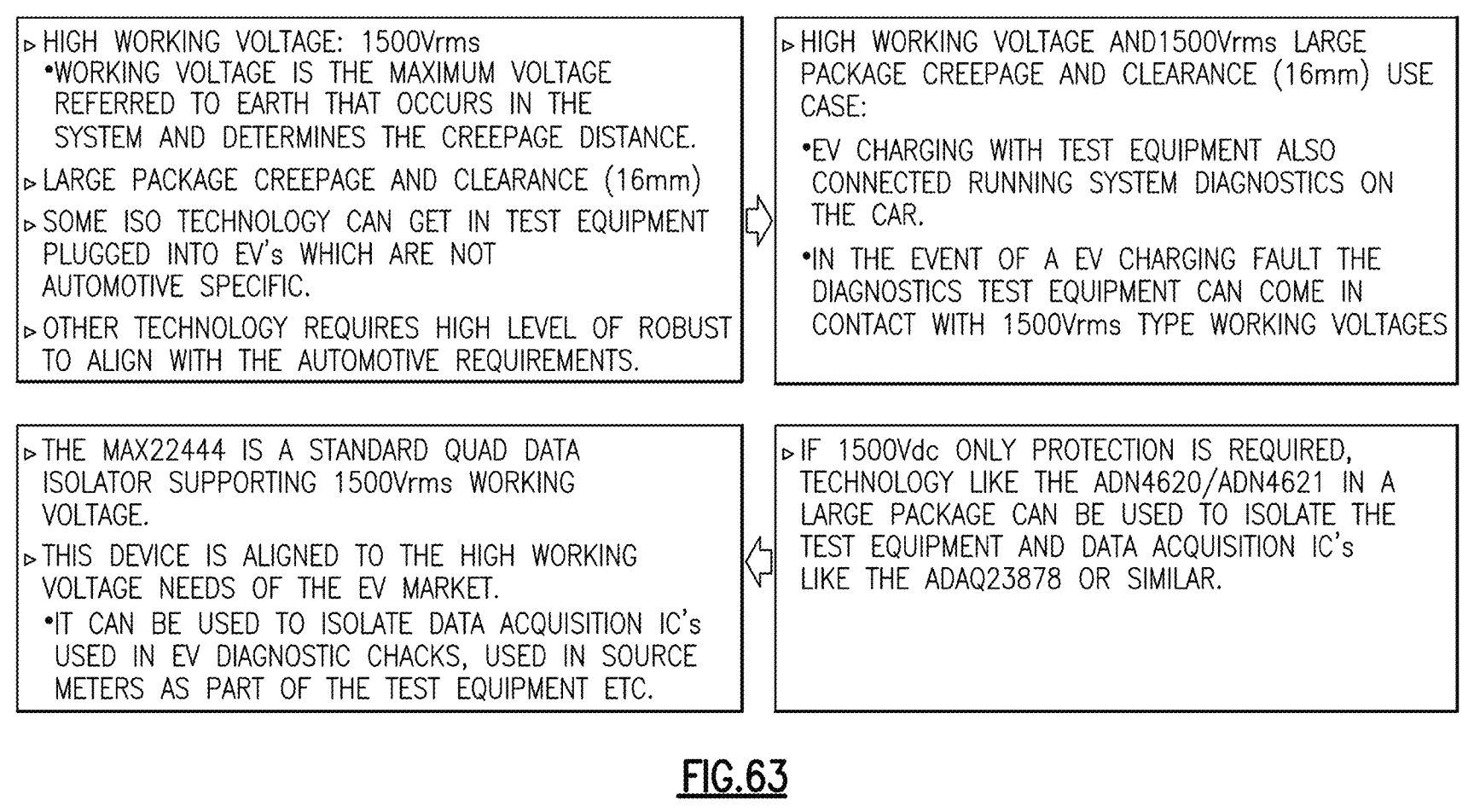

▹ HIGH WORKING VOLTAGE: 1500Vrms
- WORKING VOLTAGE IS THE MAXIMUM VOLTAGE REFERRED TO EARTH THAT OCCURS IN THE SYSTEM AND DETERMINES THE CREEPAGE DISTANCE.

▹ LARGE PACKAGE CREEPAGE AND CLEARANCE (16mm)

▹ SOME ISO TECHNOLOGY CAN GET IN TEST EQUIPMENT PLUGGED INTO EV's WHICH ARE NOT AUTOMOTIVE SPECIFIC.

▹ OTHER TECHNOLOGY REQUIRES HIGH LEVEL OF ROBUST TO ALIGN WITH THE AUTOMOTIVE REQUIREMENTS.

▹ HIGH WORKING VOLTAGE AND1500Vrms LARGE PACKAGE CREEPAGE AND CLEARANCE (16mm) USE CASE:
- EV CHARGING WITH TEST EQUIPMENT ALSO CONNECTED RUNNING SYSTEM DIAGNOSTICS ON THE CAR.
- IN THE EVENT OF A EV CHARGING FAULT THE DIAGNOSTICS TEST EQUIPMENT CAN COME IN CONTACT WITH 1500Vrms TYPE WORKING VOLTAGES ▹ IF 1500Vdc ONLY PROTECTION IS REQUIRED, TECHNOLOGY LIKE THE ADN4620/ADN4621 IN A LARGE PACKAGE CAN BE USED TO ISOLATE THE TEST EQUIPMENT AND DATA ACQUISITION IC's LIKE THE ADAQ23878 OR SIMILAR.

▹ THE MAX22444 IS A STANDARD QUAD DATA ISOLATOR SUPPORTING 1500Vrms WORKING VOLTAGE.

▹ THIS DEVICE IS ALIGNED TO THE HIGH WORKING VOLTAGE NEEDS OF THE EV MARKET.
- IT CAN BE USED TO ISOLATE DATA ACQUISITION IC's USED IN EV DIAGNOSTIC CHACKS, USED IN SOURCE METERS AS PART OF THE TEST EQUIPMENT ETC.

FIG.63

Grid AC EVSE PILOT WIRE AC ELECTRIC VEHICLE (OBC) AC/DC CONVERTER HVDC BUS BATTERY PACK

AC CHARGING STATION: LEVEL 1&2

- LEVEL 1&2 CHARGERS USED IN RESIDENTIAL AND COMMERCIAL PREMISES
  - THE ONBOARD CHARGER (OBC) WILL REGULATE THE VOLTAGE AND CURRENT FOR THE EV, SO ITS OPTIONAL FOR THE CHARGING STATION TO COMMUNICATE TO THE EV
  - THE PILOT WIRE IS USED TO SENSE THE TYPE OF CHARGER CONNECTED TO THE EV AND SETS THE REQUIRED I/P CURRENT FOR THE OBC
  - LEVEL 1 CHARGER OUTPUT CHARGE CURRENT~14A, 18HOUR CHARGE TIME
  - LEVEL 2 CHARGER OUTPUT CHARGE CURRENT~80A, 8HOUR CHARGE TIME

EVSE+ AC/DC Converter Grid AC xN stack PILOT WIRE AC ELECTRIC VEHICLE (OBC) AC/DC CONVERTER HVDC BUS BATTERY PACK

AC CHARGING STATION: LEVEL 3

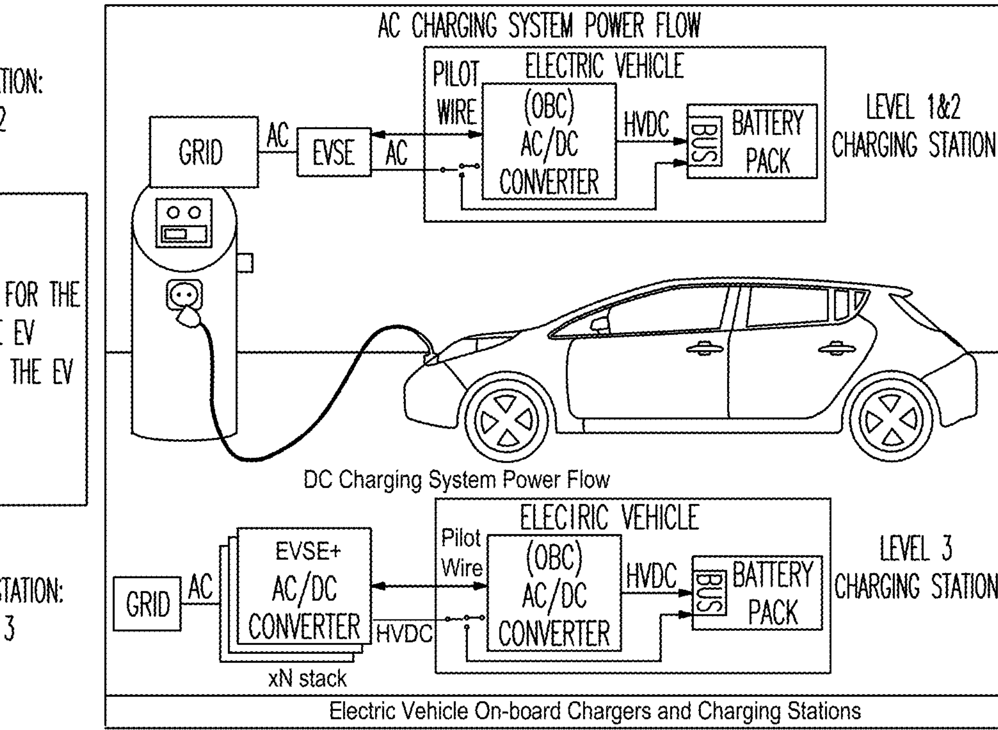

- LEVEL 3 CHARGERS ARE REFERRED TO AS SUPER CHARGERS (aka DC FAST CHARGERS, DCFC) REQUIRES 3-PHASE INPUT
  - THESE CHARGERS TAKE AC POWER FROM THE GRID, CONVERTS IT TO A DC VOLTAGE BY-PASSING THE OBC TO CHARGE THE BATTERY DIRECTLY
  - THESE CHARGERS OUTPUT UP TO 600V AND UP TO 400A ALLOWING FOR FAST BATTERY CHARGE IN 30 MINS
  - COMPLEX TO IMPLEMENT AS COMMS WITH THE EV IS REQUIRED TO CHARGE IT EFFICIENTLY AND SAFELY
  - THE PARALLEL EVSE UNITS ARE STACKED TO PROVIDE THE HIGH OUTPUT CURRENT

- DC CHARGER:
  - The DC charger has a socket which typically have 2 pins for DC power rails and comms pins for the CAN protocol.
  - As Super Chargers by-pass the OBC, its via the CAN interface (Pilot Link) that the correct voltage and current to charge the battery is selected.
  - The CAN interface communicates with the BMS of the battery pack.
- ISOLAIION IECHNOLOGY USE CASES:
  - ISOLATEED CAN (ADM305x)
  - ISOLATED DC-DC CONVERTERS (ADUM602x)
  - ISOLATED STANDARD DATA ISOLATORS (MAX22444-140CVrms)

FIG.64A

SELF CAPACITANCE [CAPACITIVE SENSING cct USED IN AD7149 COULD BE MODIFIED/OPTIMISED TO DETECT ELECTROSTATIC FIELD AS PART OF SENSING/PROTECTIVE ELEMENT WITHIN SYSTEM]

ΣΔ FEEDBACK NOT SHOWN

- Δ CAPACITANCE BETWEEN ONE ELECTRODE AND GND
- 4-PHASES CAP TO VOLTAGE CONVERTER
  - Φ1 =Csensor IS CONNECTED TO Vrefp
    - Csensor IS CHARGED
  - Φ2 =Csensor CONNECTED TO INTEGRATOR POSITIVE SUMMING NODE
    - Csensor DISCHARGED INTO Cint
  - Φ3 =Csensor CONNECTED TO Vrefn
    - Csensor IS CHARGED
  - Φ4 =Csensor CONNECTED TO INTEGRATOR NEGATIVE SUMMING NODE
    - Csensor DISCHARGED INTO Cint
- Φ3, Φ4TO CANCEL OUT Vdd/2

$$V_O = \frac{C_{sensor}}{C_{int}} x (Vrepf - Vrefn)$$

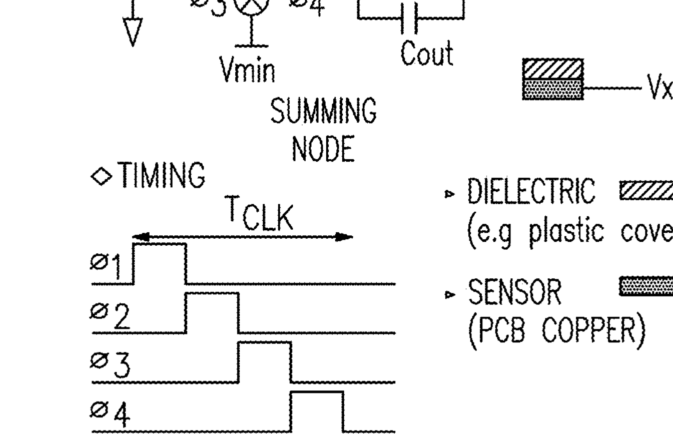

FIG.66

SPARK GAPS WITH HIGH CURRENT CAPABILITY FOR ELECTRICAL OVERSTRESS DETECTION AND PROTECTION

This application claims the benefit of priority of U.S. Provisional Application No. U.S. 63/505,360, titled "INTEGRATED ARCING STRUCTURES FOR ELECTRICAL OVERSTRESS DETECTION AND PROTECTION", filed May 31, 2023, the entire disclosure of which is incorporated herein by reference for all purposes.

BACKGROUND

Field of the Invention

The disclosed technology generally relates to devices for addressing electrical overstress, and more particularly to devices for detecting, monitoring, and/or protecting against electrical overstress events in semiconductor devices and circuits.

Description of the Related Art

Certain electronic systems can be exposed to electrical overstress (EOS) events. Such events can cause damage to an electronic device as a result of the electronic device experiencing a current and/or a voltage that is beyond the specified limits of the electronic device. For example, an electronic device can experience a transient signal event, or an electrical signal lasting a short duration and having rapidly changing voltage and/or current and having high power. Transient signal events can include, for example, electrostatic discharge (ESD) events arising from an abrupt release of charge from an object or person to an electronic system, or a voltage/current spike from the electronic device's power source. In addition, EOS events can occur whether or not the device is powered.

Electrical overstress events, such as transient signal events, can damage integrated circuits (ICs) due to overvoltage conditions and high levels of power dissipation in relatively small areas of the ICs, for example. High power dissipation can increase IC temperature, and can lead to numerous problems, such as gate oxide punch-through, junction damage, metal damage, surface charge accumulation, the like, or any combination thereof.

There is a need to develop devices that can detect and can protect integrated circuits (ICs) from the overvoltage conditions and high levels of power dissipation resulting from transient signal event. To diagnose device failures or predict device lifespan, it can be useful to characterize EOS events, e.g., in terms of voltage, power, energy and duration. However, such characterization is difficult, for example, because the duration of some EOS events can be extremely short. Thus, there is also a need to develop EOS monitors that can detect and relay a warning and can provide information about EOS events that are at least semi-quantitative.

SUMMARY

In some aspects, the techniques described herein relate to an electrical overstress (EOS) monitor or protection device including: a substrate having a horizontal main surface; and a first conductive layer and a second conductive layer each extending over the substrate and substantially parallel to the horizontal main surface while being separated in a vertical direction crossing the horizontal main surface, wherein one of the first and second conductive layers is electrically connected to a first voltage node and the other of the first and second conductive layers is electrically connected to a second voltage node, and wherein the first conductive layer includes a plurality of arcing tips configured to form arcing electrode pairs with the second conductive layer to form an arc discharge in response to an EOS voltage between the first and second voltage nodes; and a series ballast resistor defined in the first conductive layer and electrically connected between each of the arcing tips and the first voltage node, wherein a resistance of the series resistor is substantially higher than a resistance of the second conductive layer.

In some aspects, the techniques described herein relate to an electrical overstress (EOS) monitor or protection device including: a substrate having a horizontal main surface; a first metallization layer over the substrate and a second metallization layer formed over the first metallization layer; the first metallization layer including a first arcing electrode layer including a first end portion including a plurality of arcing tips each in series with a series ballast resistor, the first metallization layer further including a conductive via formed on a contacting portion of the first arcing electrode layer; and the second metallization layer including a second arcing electrode layer laterally overlapping with the arcing tips and further including a contacting metal layer overlapping and contacting the conductive via, wherein the first and second arcing electrode layers are electrically connected respectively to first and second voltage nodes configured to receive an EOS voltage therebetween to cause an arc discharge between at least one of the arcing tips and the second arcing electrode layer.

In some aspects, the techniques described herein relate to an electrical overstress (EOS) monitor or protection device including: a substrate having a horizontal main surface; a first metallization layer over the substrate and a second metallization layer formed over the first metallization layer; the first metallization layer including a first arcing electrode layer including arcing tips formed at opposing ends thereof; and the second metallization layer including a pair of second arcing electrode layers each laterally overlapping a respective one of the arcing tips at the opposing ends of the first arcing electrode layer, wherein the second arcing electrode layers are electrically connected respectively to first and second voltage nodes configured to receive an EOS voltage therebetween to cause an arc discharge between at least one of the arcing tips and corresponding ones of the second arcing electrode layers.

BRIEF DESCRIPTION OF THE DRAWINGS

Embodiments of this disclosure will now be described, by way of non-limiting example, with reference to the accompanying drawings.

FIGS. 12A-12C are schematic diagrams illustrating example vertical spark gap devices formed by vertically separated electrodes and electrically grounded plates formed in a semiconductor integrated circuit having multiple levels of interconnect metallization.

FIGS. 28A-28D illustrate side views of intermediate structures at various stages of fabricating a vertical spark gap EOS monitor/protection device comprising a pair of conductive layers including a doped semiconductor conductive layer including a doped semiconductor conductive layer, according to some embodiments.

FIGS. 59A-59B schematically illustrate example inductive isolators for providing signal isolation between various modules and/or circuits of an energy management system.

FIGS. 60A-60B schematically illustrate two examples of integrated inductive isolators, and their characteristics and specifications.

FIG. 60C schematically illustrates the concept of capacitive isolation and characteristics and specifications of an example capacitive isolator.

FIG. 62 schematically illustrates an isolation device integrated with two EOS protection/monitor devices.

FIG. 63 is a block diagram illustrating the circuits, components and voltage levels associated with a connection established between diagnostic system and an EV front-end or terminal having a high working voltage.

FIG. 64A schematically illustrates an example EV charging system and specifications of the corresponding chargers.

FIG. 66 schematically illustrates an example electric field sensor/detector that may be used in the sensing module of an energy management system.

DETAILED DESCRIPTION

Figure 1A:
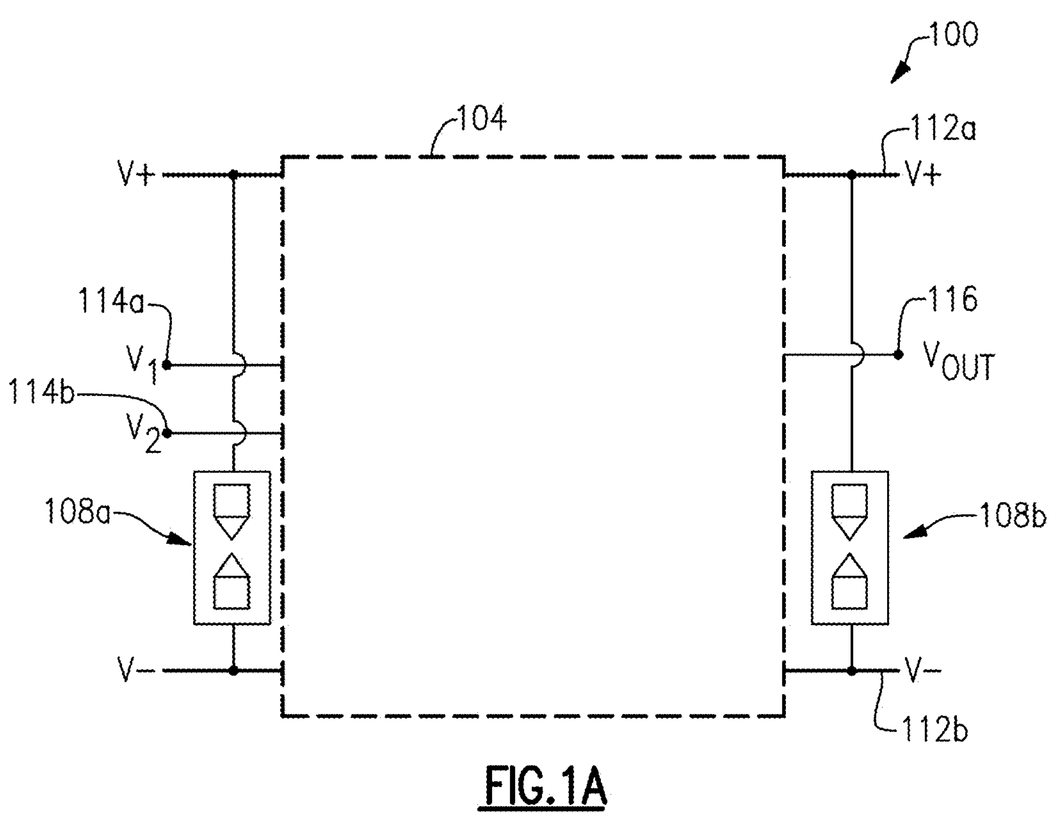
FIG. 1A is a schematic diagram of semiconductor device having a core circuit and electrical overstress (EOS) monitor and/or prevention devices including spaced conductive structures, according to embodiments.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the illustrated elements. Further, some embodiments can incorporate any suitable combination of features from two or more drawings. The headings provided herein are for convenience only and do not necessarily affect the scope or meaning of the claims.

Various electronic devices for various applications including automotive and consumer electronics that are fabricated using low voltage CMOS processes are increasingly using input/output (I/O) interface pins that operate at relatively high bidirectional voltages. These devices often operate in relatively harsh environments and should comply with applicable electrostatic discharge (ESD) and electromagnetic interference (EMI) immunity specifications. Integrated circuits (ICs) can be particularly susceptible to damage from electrical overstress (EOS) events, such as ESD events. Robust ESD and EMI immunity is desirable because the electronic devices can be subject to a wide range of high voltage transient electrical events that exceed ordinary operating conditions. High voltage events are particularly common in the automotive electronics field.

The transient electrical events can be, e.g., a rapidly changing high energy signal such as an electrostatic discharge (ESD) event. The transient electrical event can be associated with an overvoltage event caused by a user contact or contact with other objects, or simply from malfunctions in electrical systems. In other circumstances, the transient electrical event can be generated by a manufacturer to test the robustness of the transceiver integrated circuit under a defined stress condition, which can be described by standards set by various organizations, such as the Joint Electronic Device Engineering Council (JEDEC), the International Electrotechnical Commission (IEC), and the Automotive Engineering Council (AEC).

Various techniques can be employed to protect a core or a main circuitry of the electronic devices, such as ICs against these damaging transient electrical events. Some systems employ external off-chip protection devices to ensure that core electronic systems are not damaged in response to a transient electrostatic and electromagnetic events. However, due to performance, cost, and spatial considerations, there is an increasing need for protection devices that are monolithically integrated with the main circuitry, that is, the circuitry to be protected.

Electronic circuit reliability can be enhanced by providing protection devices, e.g., ESD protection devices. Such protection devices can maintain relatively high voltage levels at certain locations, e.g., IC power high supply voltage ($V_{dd}$), within a predefined safe range by transitioning from a high-impedance state to a low-impedance state when the voltage of the transient electrical event reaches a trigger voltage. Thereafter, the protection device can shunt at least a portion of the current associated with the transient electrical event to, e.g., ground, before the voltage of a transient electrical event reaches a positive or negative failure voltage that can lead to one of the most common causes of IC damage. The protection devices can be configured, for example, to protect an internal circuit against transient signals that exceed the IC power high and power low (for instance, ground) voltage supply levels. It can be desirable for an ESD protection device to be reusable, reliable, and configurable for different current and voltage (I-V) blocking characteristics and able to render protection against positive and negative transient electrical events with fast operational performance and low static power dissipation at normal operating voltage conditions. Additionally, ESD protection devices whose characteristics are less sensitive to fabrication variations and change less after a discharge event, can be desirable for practical application and low cost and high-volume production.

Electrical Overstress Monitor and Protection Devices Having Spaced Conductive Structures.

Typical electrical overstress protection devices are designed to protect core circuitry from potentially damaging electrical overstress events. The EOS protection devices are often designed to protect the core circuitry based on a range of EOS conditions the core circuitry is expected to be subjected to during use. However, because EOS protection devices are designed to trigger when the damaging EOS event exceeds a trigger condition, e.g., trigger voltage or a threshold voltage, a triggering event only indicates that the trigger condition has been exceeded, without an indication of by how much, for example. Furthermore, when a potentially damaging EOS event close to but not exceeding the trigger condition of the EOS protection device occurs, no warning is provided, even though repeated occurrences of such EOS events can eventually lead to actual damage and failure of the core circuitry and/or the EOS protection device. Thus, there is a need for a monitor device which can provide semi quantitative or quantitative information about damaging EOS events, e.g., the voltage and dissipated energy associated with the damaging EOS events, regardless of whether the EOS protection device has been triggered. Such a monitor device can detect an EOS event and relay a warning to a user, e.g., as preventive maintenance, before more damaging EOS exceeding a threshold voltage limit of a core circuit affects the device. In addition, when the device is damaged by an EOS event, the monitor/protection device can provide a history of the EOS event(s) that may have caused the damage to the device, thereby providing valuable diagnostic information to determine a root cause of the EOS event(s).

To provide these and other advantages, an electrical overstress (EOS) monitoring and protection devices are disclosed according to various embodiments. The EOS monitoring/protection device may comprise a pair of spaced conductive structures that are configured to electrically arc in response to an EOS event. Advantageously, when the core circuitry fails from a damaging EOS event despite having an EOS protection device, or when the EOS protection device itself fails as a result of a damaging EOS event, information regarding the nature of the damaging EOS event can be obtained using the EOS monitor device. Such information may include, e.g., voltage and/or energy associated with the EOS event. In addition, when potentially damaging EOS event close to but not exceeding the trigger condition of the EOS protection device occurs, the EOS monitor device can be used to provide a warning, such that repeated occurrences of such EOS events can be prevented from leading to actual damage or failure of the core circuitry and/or the EOS protection device. In addition, the EOS monitor device can advantageously be configured to serve as an EOS protection device itself. Furthermore, the EOS monitor device can serve as a monitor and/or the EOS protection device regardless of whether the core circuitry is activated. In the description below and in the figures, the term "ESD protection device" is employed to readily distinguish the label for the EOS monitor device; however, the skilled artisan will appreciate that the so-called "ESD" protection device may protect against a wider array of EOS events and is not limited to protection against ESD events.

As such, information associated with the occurrence of an EOS event e.g., voltage and/or energy associated with the EOS event, can be made available to an electronic system using the EOS monitor device disclosed herein. Various embodiments can provide more reliable circuit operation in various applications. For instance, various embodiments can reduce failures of electronics in a car or other vehicle and improve safety of a driver and/or a passenger. As another example, for electronics in healthcare applications, such as heart rate monitoring applications, embodiments can be used to more reliably detect a change in a physiological parameter so that proper action can be taken responsive to detecting such a change. When circuits in such healthcare applications fail, health can be adversely impacted. In applications where there is a need for reliable circuit operation, embodiments disclosed herein can reduce or minimize unknown potential damage to critical circuits. Furthermore, the "monitoring" function need not be responsive in real time. Rather, it is useful to have a monitor device that can be inspected after device failure, to determine how many or what level of EOS event occurred in the failed part for diagnostic purposes. Such information can be obtained, for example, by electrical monitoring during use or after failure, or by visual inspection of the failed part, as will be understood by the description below. The diagnostic information on the extent of the EOS event may be useful in pinpointing the cause of the EOS event for either avoiding such events in the future or designing parts to be more resistant to such events.

As noted above, while this disclosure may discuss "ESD" protection devices or circuits and ESD events for illustrative purposes, it will be understood that any of the principles and advantages discussed herein can be applied to any other electrical overstress (EOS) condition. EOS events can encompass a variety of events including transient signal events lasting about 1 nanosecond or less, transient signal events lasting hundreds of nanoseconds, transient signal events lasting on the order of 1 microsecond, and much longer duration events, including direct current (DC) overstresses.

FIG. 1A is a schematic diagram of an electronic device 100 having a core circuit 104 and electrical overstress (EOS) monitor/protection devices 108*a*, 108*b* including spaced conductive structures, according to embodiments. The spaced conductive structures may be referred to as spark gap devices, or spark gap devices and they are configured to allow arcing across a dielectric gap between conductive structures. The core circuit 104 may be any suitable semiconductor-based circuit to be protected, which can include transistors, diodes and resistors, among other circuit elements. The core circuit 104 may be connected to a voltage high supply 112*a*, e.g., $V_{dd}$ or $V_{cc}$, and a voltage low supply 112*b*, e.g., $V_{ss}$ or $V_{ee}$. The core circuit 104 includes input voltage terminals 114*a*, 114*b* and an output terminal 116. Electrically connected between the voltage high supply 112*a* and the voltage low supply 112*b* and electrically in parallel with the core circuit 104 are EOS monitor/protection devices 108*a*, 108*b*. In some embodiments, each of the monitor/protection devices 108*a*, 108*b* can include a first conductive structure (e.g., a first electrode) connected to the voltage high supply 112*a* serving as an anode and a second conductive structure (e.g., a second electrode) connected to the voltage low supply 112*b* serving as a cathode. At least one gap (e.g., an interelectrode gap) of designed size can be provided between the first and second conductive structures. In some examples, each EOS monitor/protection device 108*a*, 108*b* can include two or more such gaps formed in parallel, and as will be described below, these gaps can have three different sizes. In response to an ESD event, the EOS monitor/protection devices 108*a*, 108*b* are configured to electrically arc. For example, when a voltage difference between the voltage high and low supplies 112*a*, 112*b* exceeds a trigger voltage ($V_{TR}$), an impedance of the EOS monitor/protection devices 108*a*, 108*b* may abruptly change from a high value (e.g., greater than 1 megaohm) to a very low value (e.g., less than 1 kiloohm) to reduce the voltage applied to the core circuit 104. The trigger voltage ($V_{TR}$) of an EOS monitor/protection device may be determined by a material used to form the conductive structures (e.g., a conducting material used as electrode, a dielectric material used a substrate, or a material used as arcing or discharge medium), shape of each electrode, the gap size (e.g., the closest spacing) between the two electrodes. Where the EOS monitor/protection devices 108*a*, 108*b* have multiple pairs of electrodes, electrode pair may have its own trigger voltage ($V_{TR}$) determined at least based on the corresponding gap size.

Figure 1B:
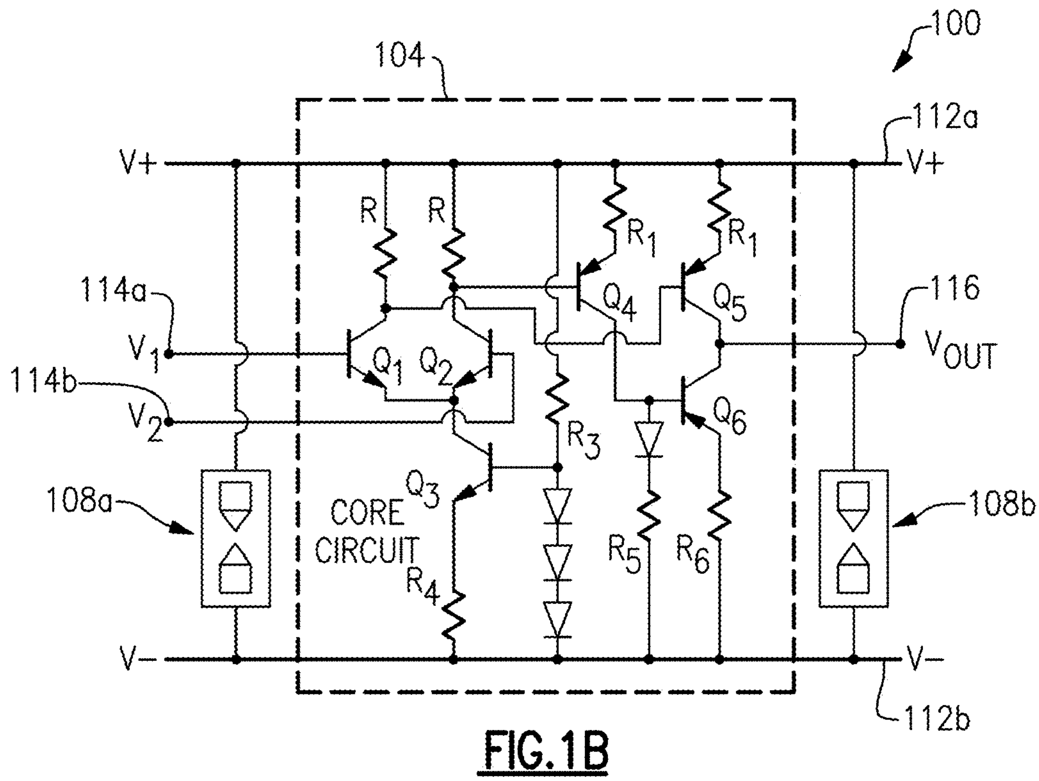
FIG. 1B illustrates one implementation of the semiconductor device illustrated in FIG. 1A with an example core circuit.

FIG. 1B is a schematic diagram of an electronic device 100 illustrating one example of a core circuit 104 electrically connected to electrical overstress (EOS) monitor/protection devices 108*a*, 108*b* including spaced conductive structures, according to embodiments. In these examples, the core circuit 104 comprises one or more of resistors, e.g., R, R1, R3, R5, R6, and/or one or more diodes, and/or one or more transistors Q1, Q2, Q4, Q5, among other circuit elements.

In the embodiments shown in FIGS. 1A and 1B, for illustrative purposes, EOS monitor/protection devices 108*a*, 108*b* are disposed between the voltage high supply ($V^+$) 112*a* and the voltage low supply ($V^-$) 112*b*. However, embodiments are not so limited and in other embodiments, EOS monitor/protection devices 108*a*, 108*b*, can be disposed in lieu of or in addition to the EOS monitor/protection devices 108*a*, 108*b* between any two voltage nodes of the $V^+$ 112*a*, the $V^-$ 112*b*, $V_1$, $V_2$ and $V_{out}$, where an electrical overstress condition may develop therebetween.

Figures 1C, 1D:
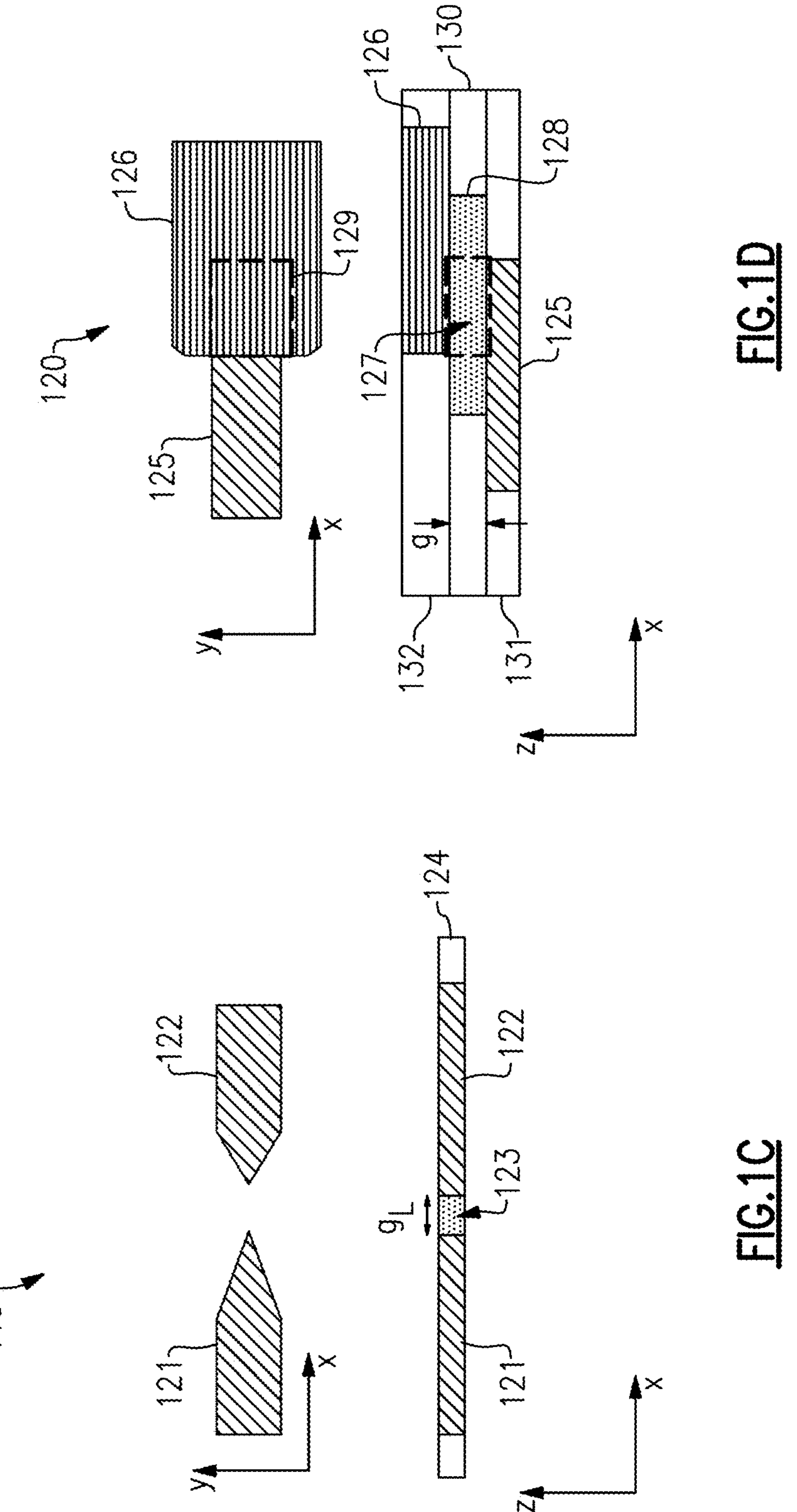
FIG. 1C is a schematic diagram of a lateral spark gap device for electrical overstress (EOS) monitoring/protection including a pair of coplanar spaced conductive structures, according to embodiments.
FIG. 1D is a schematic diagram of a vertical spark gap device for EOS monitoring/protection including a pair of non-coplanar spaced conductive structures, according to embodiments.

FIG. 1C is a schematic diagram of an example electrical overstress (EOS) monitor/protection device 119 according to one embodiment. The pair of conductive 121, 122 structures of electrical overstress (EOS) monitor/protection device 119 may comprise a coplanar structure extending in a lateral direction (e.g., along x-axis) parallel to a major surface of a substrate over which they are formed. As such, the electrical overstress (EOS) monitor/protection device 119 may be referred to as a lateral spark gap device. The top panel illustrates a top view of the EOS monitor/protection device 119 parallel to a major surface of the substrate (e.g., parallel to y-x plane). The bottom panel illustrates a side cross-sectional view of the EOS monitor/protection device 119 in a plane perpendicular to the major surface of the substrate (e.g., parallel to z-x plane).

The electrical overstress (EOS) monitor/protection device or lateral spark gap device 119 includes a pair of spaced conductive structures 121, 122 (herein referred to as electrodes 121, 122) separated by an interelectrode region 123 and is configured to electrically arc in response to an EOS event. In the embodiment shown in FIG. 1C, the electrodes 121, 122 are formed within a common metallization layer 124. In some implementations, the metallization layer 124 can be a layer in a stack of layers forming an IC device and may comprise a dielectric material. The interelectrode region 123 between the electrodes 121, 122, may comprise the same or different dielectric material compared regions of the metallization layer 124 outside of the interelectrode region. A sparking (or arcing) end of one or both of the electrode 121 and the electrode 122, closer to the interelectrode region 123, may comprise a rounded shape or a sharp tip. A lateral gap between the two arcing ends may be defined as the smallest distance between the two arcing ends long. The trigger voltage, $V_{TR}$, (also referred to as sparking or arcing voltage) above which an arc forms between the electrodes 121, 122 may be determined based on the size (e.g., lateral length) of the lateral gap ($g_L$) between the electrodes (e.g., the nearest lateral distance between the electrodes 121, 122), the shape and material of the sparking end of the electrodes 121, 122, the electrical properties of the interelectrode region 123 and the electrical properties of layers (e.g., dielectric layers) above and/or below the metallization layer 124. In various implementations, one of the first and second electrodes 121, 122, can be a cathode and the other one can be an anode. In some implementations, the interelectrode region 123 may comprise an air gap or a dielectric material configured to establish a desired trigger voltage. In some implementations, the electrodes 121, 122, may comprise a metal, metallic or a semiconductor material (e.g., doped silicon, doped polysilicon or the like).

Characteristics of the lateral spark gap device 119 (e.g., $V_{TR}$ and current handling capacity) can be highly sensitive to the geometry of the electrode ends and the gap size (g). As such, fabrication of lateral spark gap devices with specified characteristics and maintaining uniform characteristics over a large number of spark gap devices can require a highly controlled and repeatable fabrication process. In some implementations, where the shape and size of the electrode tips and the resulting lateral gap size (gr) are be determined by lithographic patterning and etching, it can be difficult to maintain the geometry of the electrodes and $g_L$ and the resulting $V_{TR}$ within a tight distribution.

In addition, when the lateral spark gap device 119 is triggered, the highly confined electrical discharge through the sparking tips of the two electrodes 121, 122 (e.g., the shortest electrical path between the two electrodes) can melt or evaporate portions of the sparking tips, which can increase $g_L$ and thereby the $V_{TR}$. As such, in some implementations, electric discharge through the lateral spark gap device 119 can be self-quenching. In some examples, the amount by which the post-arc gi increases relative to the pre-arc gi may depend, among other factors, on the magnitude of electric energy that is dissipated during arcing and material properties of the electrodes 121, 122. Because of the increased inter-electrode spacing 123, after experiencing arcing, the trigger voltage ($V_{TR}$) of the pair of electrodes (or spaced conductive structures) can undesirably increase. The structure and materials of the electrodes 121, 122 can be tuned, among other factors, such that the resulting increased $V_{TR}$ is higher than the initial $V_{TR}$ by a desired amount. Thus, according to some embodiments, whether an EOS event had occurred can be determined by measuring a change in an open circuit voltage between the electrodes 121, 122, before and after arcing.

Various fabrication technologies such as semiconductor fabrication technologies involve deposition and patterning of multiple layers. The deposited thicknesses of the various layers can be controlled relatively precisely and cost-effectively, compared to, e.g., controlling lateral dimensions of the layers with precision patterning techniques. For example, controlling the thickness of an intermetal dielectric layer using a technique such as atomic layer deposition to within a few angstroms or even sub-angstrom level can be relatively cheaper and inexpensive relative to controlling a feature size using advanced lithography within similar levels of precision. The inventors have discovered that, by designing the arcing electrodes to arc vertically through a dielectric layer, rather than laterally, their electrical characteristics can be controlled much more precisely using less expensive patterning techniques. In addition, by designing the arcing electrodes to arc between overlapping lateral surfaces, e.g., planar surfaces, rather than between, e.g., sharpened tips, the arcing electrodes can be used multiple times with less drift in trigger voltages. This is because sharpened tips can undergo a significant shape change after an arcing event.

To take advantage of these and other inventive aspects discovered by the inventors, one aspect of the disclosed technology includes arcing electrodes that are formed at or as part of different or sequentially fabricated metal layers, such that they are vertically separated, e.g., by an arcing medium such as an intermetal dielectric (IMD) or a gas.

To realize these and other technical advantages, according to various embodiments, an electrical overstress (EOS) monitor or protection device may comprise a substrate, e.g., semiconductor substrate, having a horizontal main surface. The device may include a first conductive layer and a second conductive layer each extending over the substrate and substantially parallel to the horizontal main surface while being separated in a vertical direction crossing the horizontal main surface. One of the first and second conductive layers is electrically connected to a first voltage node and the other of the first and second conductive layers is electrically connected to a second voltage node. For example, the first conductive layer may correspond to a lower metal layer formed over the substrate and the second conductive layer may correspond to an upper metal layer formed over the lower metal layer. The upper and lower metal layers can be connected to voltage nodes, e.g., high and low voltage nodes, configured to receive EOS signals. In some implementations, the first conductive layer and the second conductive layer serve as one or more arcing electrode pairs and have overlapping portions configured to generate one or more arc discharges via an arcing medium disposed between the two metal layers. The inventors have discovered that, by utilizing the precision of deposited arcing medium, e.g., dielectric materials, arcing characteristics of spark gaps can be controlled relatively precisely, reliably and cost-efficiently.

FIG. 1D is a schematic diagram illustrating an example electrical overstress (EOS) monitor/protection device 120 formed by two vertically separated metal layers. The EOS monitor/protection device 120 comprises a pair of conductive structures 125, 126, (herein referred to as pair of electrodes 125, 126) forming a non-coplanar structure fabricated within two vertically separated layers. The top panel illustrates a top view of the EOS device 120 parallel to a major surface of a substrate on which the EOS device 120 is formed (e.g., parallel to y-x plane). The bottom panel illustrates a side cross-sectional view in a plane perpendicular to the major surface of the substrate (e.g., parallel to z-x plane). The first electrode 126 (e.g., a top electrode) and a second electrode 125 (e.g., bottom electrode) are vertically separated by a vertical gap (g) where the vertical direction is perpendicular to a major surface of the substrate over which the electrodes are formed (e.g., parallel to z-axis). As such, the electrical overstress (EOS) monitor/protection device 120 may be referred to as a vertical spark gap device. In some implementations, the first electrode 125 may be formed in a first metallization layer 131 and the second electrode 126 may be formed in a second metallization layer 132 vertically separated from the first metallization layer 131 by an interelectrode dielectric layer 130. The first and second electrodes 125, 126, each may comprise a conductive plate or a conductive region. In some implementations, the thickness of the first and second electrodes 125, 126, can be substantially equal to the respective metallization layers. In some implementations, the thickness of the first and second electrodes 125, 126, can be smaller than the respective metallization layers. In some cases, a vertical projection of the second electrode 126 on the first metallization layer 131 partially overlaps with the first electrode 125 defining an overlap area 129. A region 127 (e.g., a volume) of the interelectrode dielectric layer 130 above the overlap area 129 may be referred to as gap region 127. In some implementations, an interelectrode region 128 of the interelectrode dielectric layer 130 may comprise a material composition (e.g. a dielectric material) different from that of the regions of the interelectrode dielectric region outside of the interelectrode region 128. In some examples, the interelectrode region 128 may comprise the gap region 127. The first and second electrodes 125, 126 may be configured to electrically arc through a portion of the interelectrode region 128 in response to an EOS event, according to embodiments. In some implementations, the electric discharge (also referred to as arc discharge) extends generally in the vertical direction, e.g., through the interelectrode dielectric layer 130, in response to an EOS voltage signal received between the first and second electrodes 125, 126. The arcing surfaces thus may not be substantially limited to sharpened tips of the electrodes, thereby improving the repeatability and rendering the arcing electrodes reusable. As such, the electrodes can have various lateral shapes, including circles, rectangles, rings, etc., as illustrated.

Without being limited to any theory, during an EOS event a major portion of electric discharge current may pass through the gap region 127. As such, the shape, volume, and composition of the gap region 127 may have a major impact on the electrical characteristics of the vertical spark gap device 120. The metallization layers 131, 132, and the interelectrode dielectric layer 130, can be layers in a stack of layers forming an IC device. A sparking end of one or both first electrode 125 and second electrode 126, closer to the gap region 127, may comprise a round shape, a rectangular shape, a triangular shape, or other shapes. A vertical separation (g) between the first and second electrodes 125, 126, herein referred to as gap size for the vertical spark gap device 120, can be substantially equal to the thickness of the interelectrode dielectric layer 130. The trigger or sparking voltage ($V_{TR}$) above which an arc forms between the first electrode 125 and the second electrode 126 may be determined by the vertical gap size (g), the electrical properties of the interelectrode region 128, the volume and shape of the gap region 127, the shape of the arcing ends of the first and second electrodes 125, 126, and the electrical properties of metallization layers 131, 132. In various implementations, one or more of these parameters can be used as design parameters of the vertical spark gap device.

In various implementations, one of the first and second electrodes 125, 126, can be a cathode and the other one an anode. In some embodiments, one of the first and second electrodes 125, 126, can be electrically connected to a first voltage node and the other one to a second voltage node. In various cases, the first and second voltage nodes may comprise a ground potential (electrical ground), or a positive or negative potential with respect to the ground potential. For example, one of the first and second electrodes 125, 126, can be electrically connected to the ground potential and the other one to a positive or negative voltage (with respect to electrical ground). As another example, one of the first and second electrodes 125, 126, can be electrically connected to a negative voltage (with respect to electrical ground) and other one to a positive voltage. In some implementations, an electrical connection between the first electrode 125 (or the second electrode 126) and a voltage node can be established by one or more conductive vias formed in an interlayer dielectric (ILD) layer below the first metallization layer 131 or above the second metallization layer 132. In some such implementations, the one or more conductive vias may comprise a plurality of conductive vias configured to reduce variation of the electrical potential across the corresponding electrode during a transitory EOS event to prevent formation of hot spots and/or premature arcing at a voltage less than $V_{TR}$. For example, plurality of conductive vias may comprise a two-dimensional array extending over the electrode. In some examples, at least a portion of the array may comprise equally spaced conductive vias forming a periodic arrangement.

In some embodiments, the overlap area 129 can be from 0.1 to 20 square microns, or larger values. Advantageously a large overlap area combined with controlled spatial distribution of electric potential and discharge current over the electrodes (e.g., using plurality of conducting vias), may prevent confinement of electric discharge current in a small region of the electrodes and thereby prevent physical damage to the electrodes. As such, a vertical spark gap device can be designed to handle multiple EOS events without being damaged. In some cases, a vertical spark gap device can be designed such that its electrical properties are maintained within an acceptable range after multiple EOS events.

In some implementations, certain electrode shapes or electrodes having certain symmetries, may support a more uniform electric discharge across the corresponding electrode of the vertical spark gap device. For example, an electrode structure having cylindrical symmetry may support a more uniform electric discharge. Some examples of such electrode structures are described below with respect to FIGS. 10A-10D.

In some embodiments, the first (e.g., bottom) electrode 125 and the second (e.g., top) electrode 126 may have different shapes, symmetries, sizes, and areas.

In some embodiments, one or both of the electrodes 125, 126 may be segmented and include two or more physically separated segments referred to as electrode fingers. In some cases, these electrode fingers may have similar or different shapes and sizes.

In contrast to the lateral spark gap device 119, the gap size (g) (or size of the arcing gap) of the vertical spark gap device 120 can be designed and controlled independent of the geometries of the electrodes 125, 126. Such independent control, and the additional degree of freedom, may facilitate design and fabrication of vertical spark gap devices having desired electrical properties.

In some implementations, $V_{TR}$, current handling capacity, and other electrical characteristics of the vertical spark gap device 120 can be primarily controlled by the vertical gap size (g), the geometry and composition of the gap region 127 and can be less sensitive to the geometry of the electrodes 125, 126 compared to the lateral spark gap device 119. As mentioned above, the vertical gap size (g) of the vertical spark gap device 120 is substantially equal to the thickness of the interelectrode dielectric layer 130. As such a vertical spark gap device 120 having desired electrical characteristics may be fabricated by controlling the thickness of the interelectrode dielectric layer 130 using highly controlled deposition methods. As such the variance of $V_{TR}$ and characteristics of the vertical spark gap devices over a large number of spark gap devices fabricated can be smaller than that of their lateral spark gap device counterpart.

In various implementations, a shape of the first and/or second electrodes 125, 126, may comprise a tip, a chamfer, a curved edge, a circular region or other shapes.

In consideration of the above emission properties and melting properties, among other factors, one or both of the electrodes 125 and 126 can be formed of suitable conductive and/or semiconductive material, e.g., n-doped poly silicon and p-doped poly silicon, metals including C, Al, Cu, Ni, Cr, Co, Ru, Rh, Pd, Ag, Pt, Au, Ir, Ta, and W, conductive metal nitrides, conductive metal silicides including tantalum silicides, tungsten silicides, nickel silicides, cobalt silicides, and titanium silicides, conductive metal oxides including $RuO_2$, mixtures or alloys of the above, etc., according to various embodiments. In some embodiments, one of both of the first and second electrodes 125, 126 can comprise a transition metal and may be, for example, a transition metal nitride, such as TiN, TaN, WN, or TaCN.

In some embodiments, the first and second electrodes 125, 126 can be formed of or comprise the same conductive material, while in other embodiments, they can be formed of or comprise different conductive materials.

In various implementations, the interelectrode region 128 and/or the gap region 127 may comprise air, vacuum, a solid dielectric material (e.g., an oxide such as SiO2), a gas or a gas mixture, or a liquid. In some cases, the interelectrode region 128 and/or the gap region 127 may have a dielectric constant from 1.5 to 7, from 7 to 10, from 10 to 20, or any range formed by these values or larger values. In some cases, the interelectrode region 128 and/or the gap region 127 may comprise a high-K dielectric material having a dielectric constant larger than 20 or larger than 100.

In some implementations, a vertical spark gap device may comprise a metal-insulator-metal (MIM) capacitor. For example, the first and second electrodes 125, 126, and the interelectrode dielectric layer 130 and the interelectrode and gap regions 128, 127, therein, may comprise silicon dioxide. In some examples, the vertical gap size (g) of such MIM based spark gap device can be 0.18 microns and its breakdown voltage (BV) can be 27 volts.

In various implementations, the vertical gap size (g) between the first and second electrodes 125, 126 (or the thickness of the interelectrode dielectric layer) can be from 0.02 to 0.1 microns, from 0.1 to 0.5 microns, from 0.5 to 1 micron or any range formed by these values or larger or smaller values.

Without being limited to any theory, arcing of the spaced conductive structures can initiate as a result of an electric discharge that develops due to a flow of electric current between the electrodes. The flow of current can be generated by various mechanisms, such as field emission, secondary emission and thermal emission, among other mechanisms. For example, under some circumstances, arcing of the spaced conductive structures can be initiated, facilitated or sustained by free electrons emitted by the cathode during arcing through field emission, which refers emission of electrons that is induced by an electrostatic field. Field emission can occur under a relatively strong electric field (e.g., $10^7$ V/cm), in which free electrons are pulled out of the metal surface. Once initiated, under some circumstances, arcing of the spaced conductive structures can be further facilitated or sustained by free electrons emitted by the cathode through thermionic emission. For example, the flow of current between the cathode and the anode can increase the temperature of the conductive material of the cathode, which increases the kinetic energy of free electrons therein, thereby causing electrons to be ejected from the surface of the conductive material of the cathode.

Thus generated free electrons (e.g., by field or thermoionic emission) can accelerate towards the anode because of the potential difference between the cathode and the anode resulting from an EOS event. Such electrons can further decompose atoms of the interelectrode material into charged particles, which can develop high velocities under the high electric field of an EOS event. These high velocity electrons moving from cathode toward the anode collide with atoms of the interelectrode material, e.g., air or a dielectric material, between the cathode and the anode and decompose them into charged particles i.e. electrons and ions.

As described supra, free electrons and charged particles are involved in initiating the arc and their maintenance. Without subscribing to any scientific theory, emitting electrons by an electrode (e.g., the cathode) depends on several factors, including material properties such as work function and ionization potential of the cathode and/or the anode, as well as their physical shapes and dimensions.

Figures 1E, 1F, 1G:
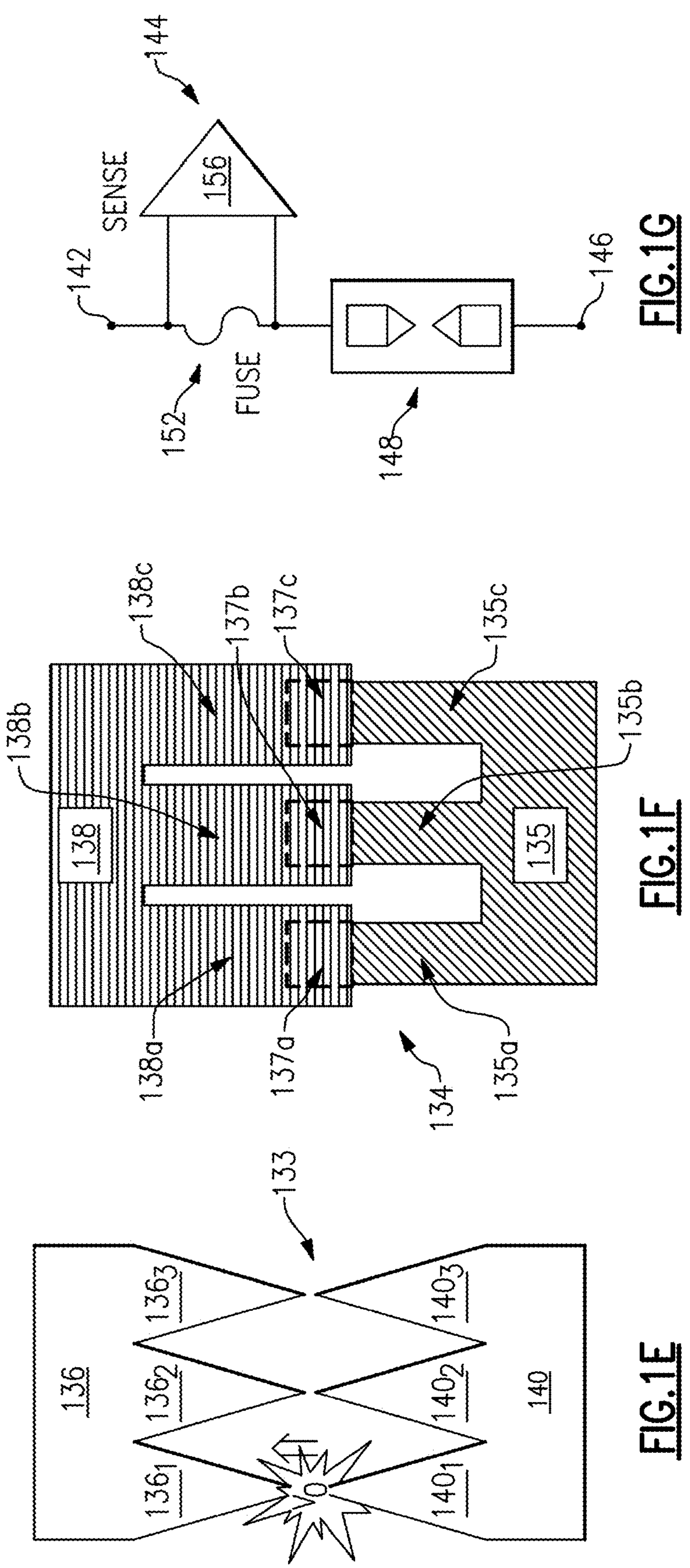
FIG. 1E is a schematic diagram of a multielectrode lateral spark gap for EOS monitoring/protection including a plurality of pairs of coplanar spaced conductive structures that are electrically connected in parallel, according to embodiments.
FIG. 1F is a schematic diagram of a vertical multielectrode spark gap device for EOS monitoring/protection including a plurality of pairs of non-coplanar spaced conductive structures that are electrically connected in parallel, according to embodiments.
FIG. 1G is a schematic illustration of an EOS monitor/protection device electrically connected in series with a fuse, according to embodiments.

In some embodiments, two or more spark gaps can be electrically connected in parallel to form a multi-gap spark gap device that includes multiple electrode pairs, multiple arcing gaps, and thereby multiple interelectrode regions. In some implementations, the arcing gaps (spark gaps) of a multi-gap spark gap device may have substantially equal or different $V_{TR}$'S. FIG. 1E is a schematic diagram of an example a multi-gap lateral spark gap device 133 including a plurality of lateral arcing gaps electrically connected in parallel, according to embodiments. The lateral spark gap devices of the EOS monitor/protection device 133 can be similar to the lateral spark gap device 119, fabricated within a common metallization layer. The EOS monitor/protection device 133 includes a first group of electrode fingers 1361, 1362, 1363 that are electrically connected via a first common conductive region or section 136 and a second group of electrode fingers 1401, 1402, 1403 that are electrically connected via a second common conductive region 140. Each electrode finger in the first group forms a lateral arcing gap with a respective electrode finger of the second group. In some embodiments, at least two lateral arcing gaps of the multi-gap lateral spark gap device 133 may have different lateral arcing gaps and thereby different $V_{TR}$S. Advantageously, such embodiments can be used for estimating the voltage at which an ESD event occurs. For example, after an ESD event, a pair of electrodes having the largest gap size among arced electrode pairs of the EOS monitor/protection device 133 may be identified to estimate overstress voltage associated with the EOS event. The trigger voltage associated with each arcing gap can be known in advance, and damage to the electrode tips bordering one interelectrode region, without damage to electrode tips of another arcing gap, can indicate an event between the threshold voltages of the two arcing gaps of the multi-gap spark gap device.

FIG. 1F is a schematic diagram of a multi-gap vertical spark gap device 134 formed by a plurality of vertical arcing gaps electrically connected in parallel, according to embodiments. A pair of electrode fingers and the corresponding arcing gap of the multi-gap vertical spark gap device 134 can be similar to the spark gap device 120, fabricated in two vertically separated metallization layers. The multi-gap vertical spark gap device 134 includes a first group of electrode fingers 138*a*, 138*b*, 138*c* that are electrically connected via a first common conductive region or section 138 and a second group of electrode fingers 135*a*, 135*b*, 135*c* that are connected via a second common conductive region 135. An individual electrode finger in the first group forms a vertical arcing gap with a respective electrode finger of the second group. The overlapping areas and gap regions of 137*a*, 137*b*, 137*c* of the resulting vertical arcing gaps can be different or substantially equal. In some embodiments, at least two laterally separated arcing gaps of the multi-gap vertical spark gap device 134 may have different overlap areas and gap regions.

In some examples, one of the electrodes of a multi-gap vertical spark gap device can be a non-segmented electrode and the arcing gaps may be formed by electrode fingers of a segmented electrode overlapping with different regions of the non-segmented electrode vertically separated from the segmented electrode.

While the multi-gap spark gap devices. 133, 134 include three electrode pairs, in various embodiments, a multi-gap spark gap devices can include any suitable number of electrode pairs and gap regions.

FIG. 1G is a schematic diagram of an EOS monitor/protection device 144 including a first terminal 146, e.g., a high voltage terminal, and a second terminal 142, e.g., a low voltage terminal, according to some embodiments. Disposed between the first and second terminals 146, 142 can be a spark gap device 148 electrically connected in series with a fuse 152, according to embodiments. The spark gap device 148 can be any one of the single-gap spark gap devices 119, 120, or any of the multi-gap spark gap devices 133, 134. In some embodiments, the first electrode of the spark gap device 148 may be a low voltage terminal and the second electrode of the spark gap device 148 may be a high voltage terminal.

Having the fuse 152 can be advantageous for several reasons. For example, the fuse 152 can be configured to estimate the current, speed and/or energy associated with the EOS event, according to various embodiments. In some embodiments, the fuse 152 can be rated based on a maximum current that the fuse can flow continuously without interrupting the circuit. Such embodiments can be advantageous when, in addition to the voltage of the EOS event, which the spark gap device 148 can be used to estimate, it is desirable to obtain the current generated by the EOS event. In some other embodiments, the fuse 152 can be rated based on the speed at which it blows, depending on how much current flows through it and the material of which the fuse is made. The operating time is not a fixed interval but decreases as the current increases. Such an embodiment can be advantageous when, in addition to the voltage of the damaging EOS event, which the spaced conductive structures of the spark gap monitor/protection device 148 can be used to estimate, the current rating of the fuse 152 can be used to estimate the current of the EOS event, when it is desirable to obtain the duration of the EOS event. In some embodiments, the fuse 152 can be rated based on a maximum energy that the fuse can continuously conduct without interrupting the circuit. Such embodiments can be advantageous when, in addition to the voltage of the EOS event which the spark gap device 148 can be used to estimate, it is desirable to obtain the energy generated by the EOS event. For example, the energy rating can be based on the value of $I^2 \times t$, where I represents the electric current and t represents the duration of the EOS event. In various embodiments, $I^2t$ may be proportional to the energy associated melting the material of the fuse 152. Since the $I^2t$ rating of the fuse is proportional to the energy the fuse 152 consumes before melting, it can be a measure of thermal damage that can be produced by the EOS event.

In various embodiments, the spark gap device 148 may comprise the lateral spark gap device 119, the vertical spark gap device 120, the multi-gap lateral spark gap device 133, or the multi-gap vertical spark gap device 134.

Still referring to FIG. 1G, the fuse 152 can additionally be advantageous for determining whether an EOS event had occurred by detecting an open circuit across the fuse 152 that is serially connected to the spark gap device 148 using, e.g., a sensing circuitry, which can include an operational amplifier 156.

Still referring to FIG. 1G, the fuse 152 can further be advantageous for shutting off the current flowing through the fuse 152 after an EOS event to prevent damage to other circuitry including the core circuit. This is because, once triggered, the spark gap 148 may continue to pass high levels of current until the voltage across it falls below a holding voltage, as discussed infra, particularly where a power source is connected during the EOS event. By having a fuse 152 in series, the current flow thorough the conductive structures of the spark gap 148 may be shut off upon exceeding a prescribed current, time and/or energy associated with the EOS event that is experienced by the spark gap 148, thus limiting damage to the core circuits and other connected devices.

Figures 2A, 2B:
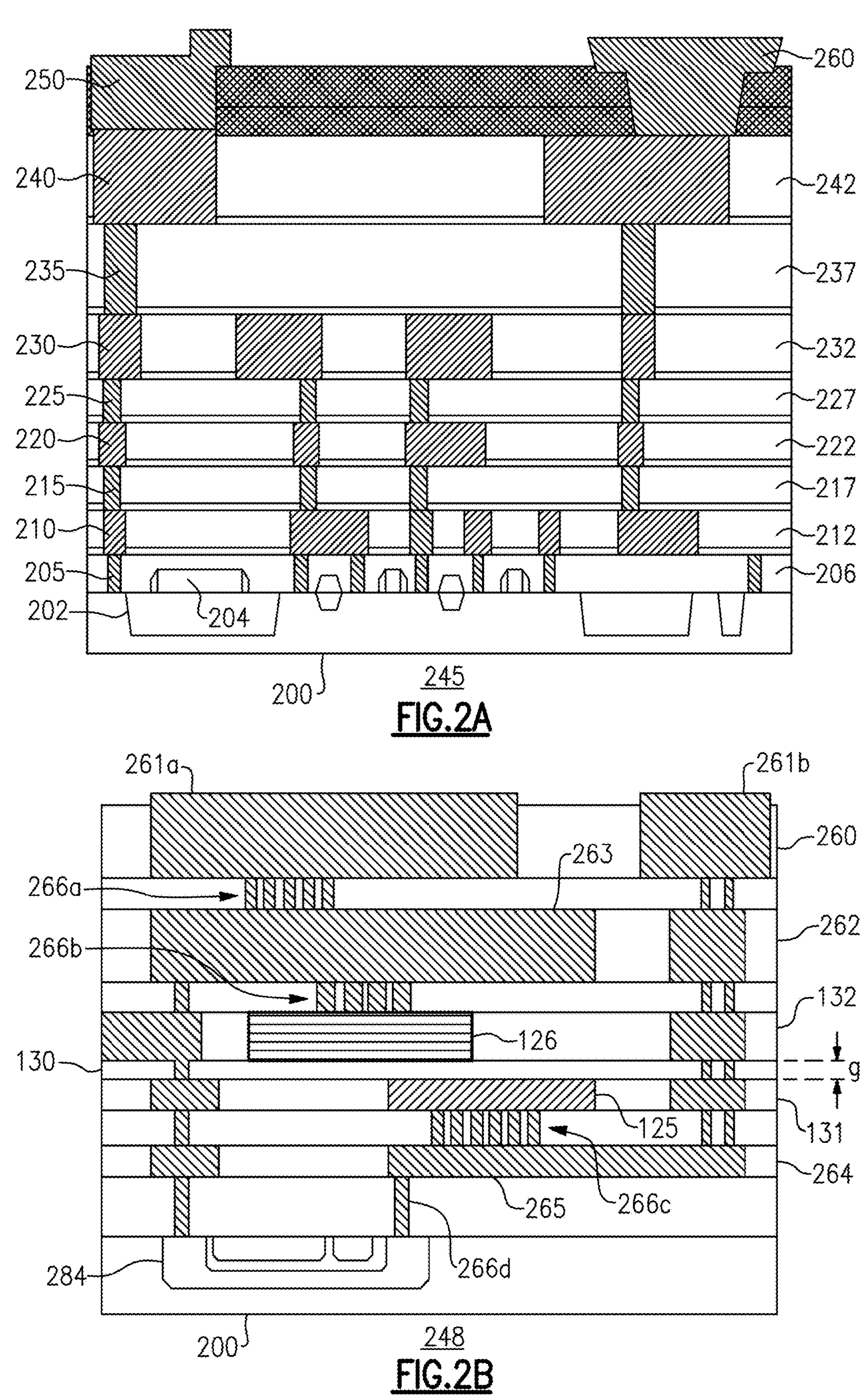
FIG. 2A is a schematic cross-sectional view of a semiconductor integrated circuit (IC) having multiple levels of interconnect metallization, where one or more of the multiple levels can include a lateral spark gap device for EOS monitoring/protection of an electrical circuit of the IC, according to embodiments.
FIG. 2B is a schematic cross-sectional view of another semiconductor integrated circuit having multiple levels of interconnect metallization, where a vertical spark gap is formed by three or more levels, for EOS monitoring/protection of an electrical circuit of the IC, according to embodiments.

FIG. 2A is a schematic cross-sectional view of a semiconductor integrated circuit including a substrate and multiple levels of interconnect metallization, where one or more of the multiple levels of interconnect metallization include an EOS monitor/protection device, according to embodiments. The semiconductor integrated circuit includes a spark gap (e.g., an EOS monitor/protection device) including pair of spaced conductive structures integrated with the substrate, where the electrodes are configured to electrically arc in response to an EOS event as described above with respect to FIGS. 1A-1D. The illustrated levels of interconnect metallization can be, e.g., Cu-based (either dual or single damascene process-based), AI-based (subtractive patterning-based) or based on other suitable metallization technology. The illustrated semiconductor integrated circuit of FIG. 2A includes a semiconductor substrate 200 e.g., a silicon substrate. The semiconductor integrated circuit includes one or more of various front-end structures including, e.g., and isolation regions 202, e.g., shallow trench isolation (STI) regions, wells, metal-oxide-semiconductor (MOS) transistors, bipolar junction transistors and PN junctions, to name a few. The semiconductor integrated circuit additionally includes multilayer interconnect metallization structures including contacts 205 (Via 0), vias 215 (Via 1), 225 (Via 2) and 235 (Via 3). The semiconductor integrated circuit additionally includes interconnect metallization levels 210 (Metal 1), 220 (Metal 2), 230 (Metal 3) and 240 (Metal 4), where Metal n and Metal n+1 are interconnected by Via n.

One or more EOS monitor/protection devices including a pair of spaced conductive structures can be formed in one or more of metallization levels 210, 220, 230 and 240. In addition, in some embodiments, fuses serially connected to the spaced conductive structures and also be formed in one or more of the same or different metallization levels 210, 220, 230 and 240. It will be understood, of course, that semiconductor integrated circuits can include additional metal levels, and that the spark gap monitor/protection devices can be formed at any suitable metal level in the back-end-of-line metallization layers of a semiconductor substrate. Furthermore, in other embodiments, the substrate may be a different material (e.g., glass) for a standalone EOS monitor die. Regardless of whether or not integrated with other devices, and whether or not formed on a semiconductor substrate, semiconductor fabrication techniques, such as photolithography and etching, can be used to define the spaced conductive structures, such as fingers, of spark gap devices. The fabrication can be performed at the wafer level with subsequent dicing, regardless of whether the spark gap device(s) are formed in a standalone monitor die or integrated with semiconductor integrated circuit.

Still referring to FIG. 2A, each of metallization layers (Metal 1 to Metal 4) or vias (Vias 0 to Via 3) are formed, or buried, in one or more dielectric layers. In the present disclosure, dielectrics between two adjacent metal levels are referred to as inter-layer dielectrics (ILD) layer, while dielectrics embedding a metal interconnect layer are referred to as intra-metal dielectrics (IMD). As shown in FIG. 2A, dielectric layers 217, 227, and 237 are ILD layers, while dielectric layers 212, 222, 232 and 242 are IMD layers (also referred to as metallization layers). The semiconductor integrated circuit additionally includes dielectric layers 206 (ILD 0), 212 (IMD 1), 217 (ILD 1), 222 (IMD 2), 227 (ILD 2), 232 (IMD 3), 237 (ILD 3) and 242 (IMD 4). The semiconductor integrated circuit can additionally include atop the interconnect metallization levels a passivation layer including wire bonding pad 250 and a bonding pad 260, which can be used, e.g., for flip chip packaging using solder balls. For illustrative purposes, the interconnect metallization process architecture of FIG. 2A has four levels of metal, namely Metal 1 (210), Metal 2 (220), Metal 3 (230) and Metal 4 (240). However, embodiments are not so limited, and the interconnect metallization process architecture according to various embodiments can include more (five or more) or less (three or less) metal levels. In the illustrated multi-level metal interconnect process architecture, alternating levels of metallization can run orthogonal to the levels above and below to minimize inter-level interference. In addition, the pitch of each interconnect metallization level can be higher compared to a lower interconnect metallization level. The semiconductor integrated circuit can further include, at the top, I/O outputs passivated through, e.g., wire bonding pad 250 or bonding pad 260, according to embodiments.

Still referring to FIG. 2A, each of the metallization levels and vias can be formed of any suitable metal described supra. According to various embodiments, the pair of spaced conductive metal structures can be formed in any of the metal levels 1 to n and can have a thickness from 0.1 μm to 10 μm, 0.1 μm to 5 μm, 0.1 μm to 1 μm, 0.1 μm to 0.5 μm, 0.5 μm to 1 μm, or any range defined by these values.

Each of IMD and ILD layers can be formed of a suitable dielectric material, e.g., silicon dioxide or silicon nitride, according to some embodiments. According to some other embodiments, the IMD and ILD layers can be formed of a suitable low-k material, e.g., fluorine-doped silicon dioxide, carbon-doped silicon dioxide, porous silicon dioxide, porous carbon-doped silicon dioxide, spin-on organic polymeric dielectric material and spin-on silicon-based polymeric dielectric material, to name a few.

FIG. 2B is a schematic cross-sectional view of another semiconductor integrated circuit 248 including a substrate 200 and multiple vertically separated metallization layers 262, 132, and 131 of interconnect metallization comprising a vertical spark gap having two electrodes 126, 125 in two metallization layers 131, 132 separated by an interelectrode layer (e.g., an ILD layer) 130. The electrodes 125, 126 are configured to electrically arc in response to an EOS event as described above with respect to FIG. 1D. The illustrated levels of interconnect metallization may comprise one or more features described above with respect to FIG. 2A. The semiconductor integrated circuit may include a semiconductor device (e.g., a metal-oxide-semiconductor (MOS) or bipolar junction transistor) formed in a well region 284 (e.g., a doped region). In some cases, the vertical spark gap device embedded can be electrically connected to one or more regions (e.g., doped regions) formed in the well region 284.

Still referring to FIG. 2B, the semiconductor circuit 248 may comprise one or more conductive contact pads configured to provide electrical connection with another electronic device, a voltage node, or electrical ground. In the example shown, two conductive contact pads 261*a*, 261*b* (also referred to as contact pads) are formed partially within a top metallization layer 260. One or both of the contact pads 261*a*, 261*b* can be configured to provide electrical connection to an external device or voltage node via a wire bond, a solder ball, or other types of electrical connections. In some implementations, the contact pad 261*a* can be electrically connected to a conductive region 263 in the metallization layer 262 via one or more conductive vias 266*a* formed in an ILD layer between the metallization layers 260 and 262 and the conductive region 263 can be electrically connected to a top electrode 126 of the vertical spark gap device via one or more conductive vias 266*b* formed in an ILD layer between the metallization layers 262 and 132. The bottom electrode 125 of the vertical spark gap device can be electrically connected to a conductive region 265 of the metallization layer 264 via one or more conductive vias 266*c* formed in an ILD layer between the metallization layers 131 and 264. The conductive region 265 can be connected to the contact pad 261*b* via a series of conductive vias and conductive regions formed in the metallization layers 131, 132, 262, 260 and the intervening ILDs. In various implementations, one or more conductive vias 266*a*, 266*b*, and/or 266*c* may comprise a plurality of conductive vias configured to provide a near uniform potential distribution over the top electrode 126 and the bottom electrode 125. In some cases, the vias that electrically connect the conductive regions 263, 265, which are directly connected to the top and bottom electrodes 126, 125, may comprise a plurality of conductive vias. In some cases, any of the pluralities of the conductive vias may comprise near identical vertically extending vias arranged as a two-dimensional array within the boundary of the respective conductive regions connected by these conductive vias.

Figures 3, 4:
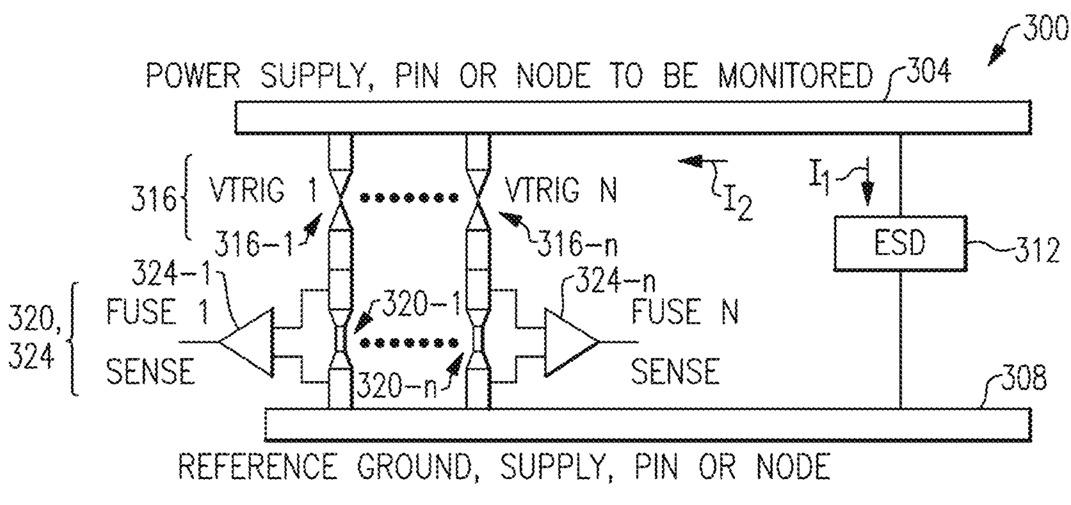
FIGS. 3 and 4 are schematic diagrams of an EOS monitor/protection device including a plurality of spark gap devices configured to monitor voltage and/or energy associated with EOS events, according to embodiments.

FIG. 3 is a schematic diagram of an EOS monitor/protection device 300 including a plurality of spark gap devices 316 having different values of $V_{TR}$'s configured to monitor voltage and/or energy associated with an EOS event, according to embodiments. In some embodiments, one or more of the spark gap devices 316 may comprise the lateral spark gap device 119, the vertical spark gap device 120, or any of the vertical spark gap devices described below. The plurality of spark gap devices 316 includes pairs 316-1, 316-2, . . . **316-*n* of conductive structures each having a different gap therebetween, where the pairs of conductive structures 316-1, 316-2, . . . 316-*n* of conductive structures are electrically connected in parallel and configured to electrically arc in response to different electrical overstress voltages $V_{TR1}$, $V_{TR2}$, . . . . $V_{TRn}$, respectively. The plurality of spark gap devices 316 are connected between a voltage high supply, a voltage high pin or a voltage high node 304 at one end and a plurality of fuses 320 and a plurality of sense circuits 324 at the other end. The plurality of fuses 320 are connected to the spark gap devices 316 at one end and a voltage low supply, a voltage low pin or a voltage low node 308 at the other end. The plurality of fuses 320 includes fuses 320-1, 320-2, . . . 320-*n* serially connected to the pairs of conductive structures 316-1, 316-2, . . . 316-*n* of conductive structures. The fuses 320-1, 320-2, . . . 320-*n* are configured to blow in response to different levels current, different durations and/or different energies, as described above with respect to FIG. 1E. The fuses 320-1, 320-2, . . . 320-*n* are connected to and configured to be sensed by sense circuits 324-1, 324-2, . . . 324-*n***.

Still referring to FIG. 3, the EOS monitor/protection device 300 additionally includes an EOS protection device, labeled as ESD device 312, which can be a semiconductor-based EOS protection device, electrically connected in parallel to the plurality of spark gap devices 316 and the plurality of fuses 320. The EOS monitor/protection device 300 is electrically connected to a core circuit (not shown).

In operation, in response to an EOS event, the ESD device 312 is triggered at a ESD trigger voltage ($V_{TR\ ESD}$) followed by the plurality of spark gap devices 316 having different $V_{TRs}$, $V_{TR1}$, $V_{TR2}$, . . . . $V_{TRn}$ each lower than the $V_{TR\ ESD}$. Upon triggering, the ESD device 312 connected to the core circuit is configured to draw a majority current I1 resulting from an EOS event, while the pairs of spark gap devices 316 connected to the core circuit is configured to draw a minority current I2 resulting from the EOS event. In various embodiments, the EOS monitor/protection device 300 can be configured such that I2 is 50% of I1 or less, 10% or less of I1, or 2% or less of I1, according to embodiments, such that the plurality of spark gap devices 316 is configured to serve primarily as a monitor/protection device to monitor voltage and/or energy associated with the EOS event without drawing a relatively high level of current relative to the ESD device 312. Nevertheless, the fuses 320 protect against excessive current flow, particularly for applications where the EOS event may occur while connected to a power supply.

FIG. 4 is a schematic diagram of an EOS monitor/protection device 400 including a plurality of spark gap devices 416 having different $V_{TR}$'s configured to monitor voltage and/or energy associated with an EOS event, according to embodiments. In some embodiments, one or more of the spark gap devices 416 may comprise the lateral spark gap device 119, the vertical spark gap device 120, or any of the vertical spark gap devices described below. The EOS monitor/protection device 400 is configured similarly in some respects to the EOS monitor/protection device 300 described above with respect to FIG. 3, whose similarities will not be described in detail. In the EOS monitor/protection device 400, a plurality of spark gap devices 416 are connected between a voltage high supply, a voltage high pin or a voltage high node 304 at one end and a plurality of fuses 420 and a plurality of sense circuits 424 at the other end. The plurality of fuses 420 are connected to the plurality of spark gap devices 416 at one end and a voltage low supply, a voltage low pin or a voltage low node 308 at the other end. Unlike the EOS monitor/protection device 300 described above with respect to FIG. 3, however, each of the fuses 420-1, 420-2, . . . **420-*n* serially connected to the spark gap devices 416-1, 416-2, . . . 416-*n* of conductive structures in turn includes a plurality of fuse elements. The fuses 420-1, 420-2, . . . 420-*n* are configured to blow in response to different levels of current, different durations and/or different energies, as described above with respect to FIG. 1E. In addition, each of the parallel fuse elements of each of fuses 420-1, 420-2, . . . 420-*n* are in turn configured to blow in response to different levels of electric current, different durations and/or different energies, as described above with respect to FIG. 1**E.

Thus, the EOS monitor/protection devices 300 (FIG. 3) and 400 (FIG. 4) comprise pairs of conductive structures that have different gaps and configured to arc in response to overstress voltages that are related, e.g., linearly related to the different gaps, such that, in response to an EOS event, a voltage associated with the EOS event can be estimated. For example, the voltage can be estimated by identifying a spark gap device having the largest separation distance among arced pairs of spaced conductive structures (electrodes) and estimating therefrom a maximum voltage associated with the EOS event.

In addition, the EOS monitor/protection devices 300 (FIG. 3) and 400 (FIG. 4) comprise one or more different fuses serially connected to different pairs of conductive structures having different gaps such that, in response to an EOS event, an energy associated with the EOS event can be estimated. For example, the energy can be estimated by, for a given pair of arced conductive structure, identifying the energy rating of the blown fuse (FIG. 3) or identifying the energy rating of a fuse having the largest energy rating among blown fuses (FIG. 4) (assuming that still higher energy rated fuses remain unblown), and estimating therefrom the energy associated with the EOS event.

Figure 5A:
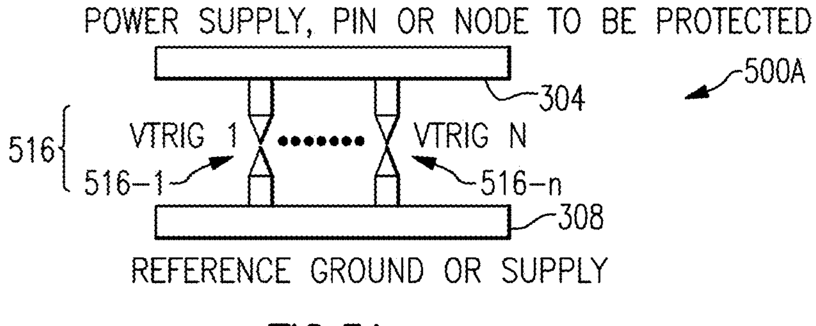
FIGS. 5A-5B are schematic diagrams of EOS protection devices including a plurality of spark gap devices configured to serve as electrostatic discharge (ESD) devices to protect a core device against an EOS event, according to embodiments.

FIG. 5A is a schematic diagram of an EOS protection device 500A including a plurality of pairs of spark gap devices 516 having different $V_{TR}$'s configured as EOS protection devices to protect a core device against an EOS event, according to embodiments. In some embodiments, one or more of the spark gap devices 516 may comprise the lateral spark gap device 119, the vertical spark gap device 120, or any of the vertical spark gap devices described below. Unlike the EOS monitor/protection devices illustrated with respect to FIGS. 3 and 4, the EOS protection device 500A may not include one or more fuses. The EOS protection device 500A includes a plurality of spark gap devices 516 which includes pairs 516-1, 516-2, . . . **516-*n* of spark gap devices each having a different gap therebetween, where the spark gap devices 516-1, 516-2, . . . 516-*n* of conductive structures are electrically connected in parallel and configured to electrically arc in response to different electrical overstress voltages $V_{TR1}$, $V_{TR2}$, . . . . $V_{TRn}$, respectively. The plurality of spark gap devices 516 are connected between a voltage high supply, a voltage high pin or a voltage high node 304 at one end and a voltage low supply, a voltage low pin or a voltage low node 308** at the other end.

In operation, the EOS protection device 500A is configured as both a protection and a monitor/protection device, and the pairs of spark gap devices 516 connected to the core circuit are configured to draw a majority or substantially all of the current resulting from the EOS event and steer it to the ground, voltage low supply, a voltage low pin or a voltage low node 308.

Figure 5B:
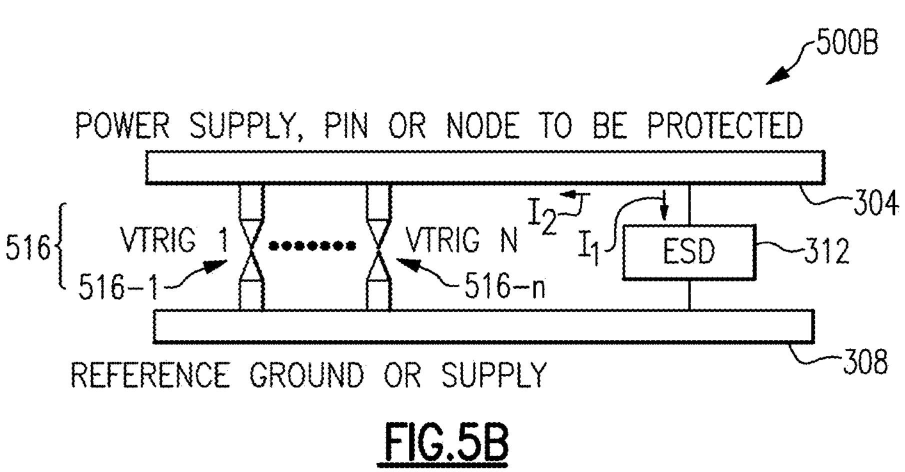

FIG. 5B is a schematic diagram of an EOS protection device 500B including a plurality of spark gap devices 516 configured as EOS monitor/protection devices to allow determination of a maximum level of voltage for one or more EOS events, according to embodiments.

Unlike the EOS protection device 500A described above with respect to FIG. 5A, the EOS monitor/protection device 500B additionally includes an EOS protection device, labeled as an ESD device 312, which can be a semiconductor-based ESD device, electrically connected in parallel to the plurality of spark gap devices 516. The EOS monitor/protection device 500B is electrically connected to a core circuit (not shown). Having the EOS protection device 500A in addition to the ESD device 312 can be advantageous where the ESD device 312 itself can be damaged under high current.

In operation, in response to an EOS event, the ESD device 312 is triggered at a ESD trigger voltage ($V_{TR\ ESD}$), followed by the plurality of spark gap devices 516 at $V_{TR1}$, $V_{TR2}$, . . . . $V_{TRn}$ each lower than the $V_{TR\ ESD}$, in a similar manner described above with respect to FIG. 3. Upon triggering, the EOS protection device 500B is configured as a protection device and the pairs of spark gap devices 516 connected to the core circuit are configured to draw a majority or substantially all of the current resulting from the EOS event and steer it to the voltage low supply, a voltage low pin or a voltage low node 308. The ESD device 312 connected to the core circuit can be configured to draw a minority current I1 resulting from an EOS event, while the pairs of spark gap devices 316 connected to the core circuit are configured to draw a majority current I2 resulting from the EOS event. In various embodiments, the EOS monitor/protection device 300 can be configured such that I2 is 50% of I1 or more, 90% or more of I1, or 98% or more of I1, according to embodiments, such that the plurality of spark gap devices 516 are configured to serve primarily as an EOS protection device to protect the core circuit.

It will be appreciated that, while in FIGS. 5A and 5B, for clarity, the illustrated EOS protection devices 500A and 500B include the pairs of spark gap devices 516-1 . . . , **516-*n* each of which are connected directly between a voltage high node 304 and a voltage low node 308. In various implementations, each of the spark gap device 516 may be connected, e.g., serially connected, to a sensing element, e.g., a serially connected fuse or a serially connected resistor, for detecting whether the spark gap device have been triggered in response to an electrical overstress event. These configurations are further illustrated elsewhere in the specification, e.g., with respect to FIGS. 7A and 7**B.

Figure 6:
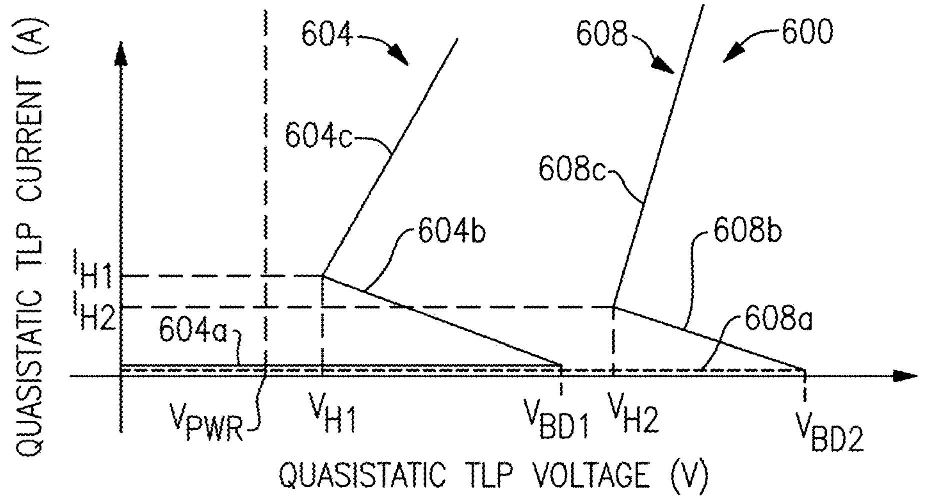
FIG. 6 illustrates schematic quasistatic current-voltage curves of a spark gap device, according to embodiments.

FIG. 6 is a graph 600 illustrating schematic quasistatic current-voltage (IV) curves 604, 608 of a spark gap device and an EOS protection device, respectively, according to embodiments. The IV curve 604 schematically illustrates a quasistatic response of the spark gap device (e.g., 516 in FIG. 5B) to an EOS event, and the curve 608 schematically illustrates a quasistatic response of an EOS protection device (e.g., 312 in FIG. 5B) to the EOS event. The x-axis and the y-axis represent the quasistatic voltage and the corresponding current, respectively. The IV curves 604 and 608 have respective blocking regions ("OFF" regions) **604*a* and 608*a*, respectively characterized by very high impedances, between the origin and respective breakdown voltages $V_{BD1}$ and $V_{BD2}$. $V_{BD1}$ may correspond to a triggering voltage ($V_{TR}$) of the spark gap device and $V_{BD2}$ may correspond to a triggering voltage ($V_{TR}$) or a threshold voltage ($V_{TH}$) of a BJT or an avalanche diode of the ESD device. When the voltage of the EOS event exceeds $V_{BD2}$, dV/dI becomes zero and switching of the EOS protection device occurs. The switching of the EOS protection device is followed by switching of the spark gap device when the voltage between the electrodes exceeds $V_{BD2}$, upon which dV/dI becomes zero and switching of the spark gap device occurs. The blocking regions 604*a* and 608*a* are followed by respective negative resistance regions 604*b* and 608*b* (also referred to as "snap-back region") between $V_{BD1}$ and a first hold voltage $V_{H1}$ and between $V_{BD2}$ and a second hold voltage $V_{H2}$, respectively, followed by respective positive resistance regions ("ON" regions) 604*c* and 608*c***. At the hold voltages $V_{H1}$ and $V_{H2}$, the corresponding holding current values are $I_{H1}$ and $I_{H2}$, respectively, which can represent minimum level of currents that can maintain the "ON" states of the respective devices. According to embodiments, the spark gap device and the EOS protection device are configured such that, under quasistatic conditions or in response to a voltage signal having a relatively long duration (e.g., longer than about 100 ns or longer than about 1 □s), the $V_{BD1}$ of the spark gap device is lower than the $V_{BD2}$ and $V_{H2}$ of the EOS protection device, such that the spark gap device is triggered while the EOS protection device remains conducting after being switched to a low impedance state in response to an EOS event. It will be appreciated that when the $V_{BD1}$ of the spark gap device is higher than the $V_{BD2}$ and $V_{H2}$ of the EOS protection device, the spark gap device may not trigger.

It will be appreciated that, under operational conditions in which the core circuit is powered up, once activated, the spark gap device may continue to conduct high levels of current even after the EOS event has ceased, if the voltage high node 304 (FIGS. 3-5B) is at a higher voltage relative to the hold voltage $V_{H1}$ of the pair of spaced conductive structures. Thus, still referring to FIG. 6, in various embodiments, it can be desirable to have the EOS monitor/protection devices configured such that its hold voltage is greater than the voltage high supply voltage $V_{PWR}$. In the following, with respect to FIGS. 7A-8B, embodiments of EOS monitor/protection devices and EOS protection devices having hold voltages higher than the $V_{PWR}$ are described.

Figure 7A:
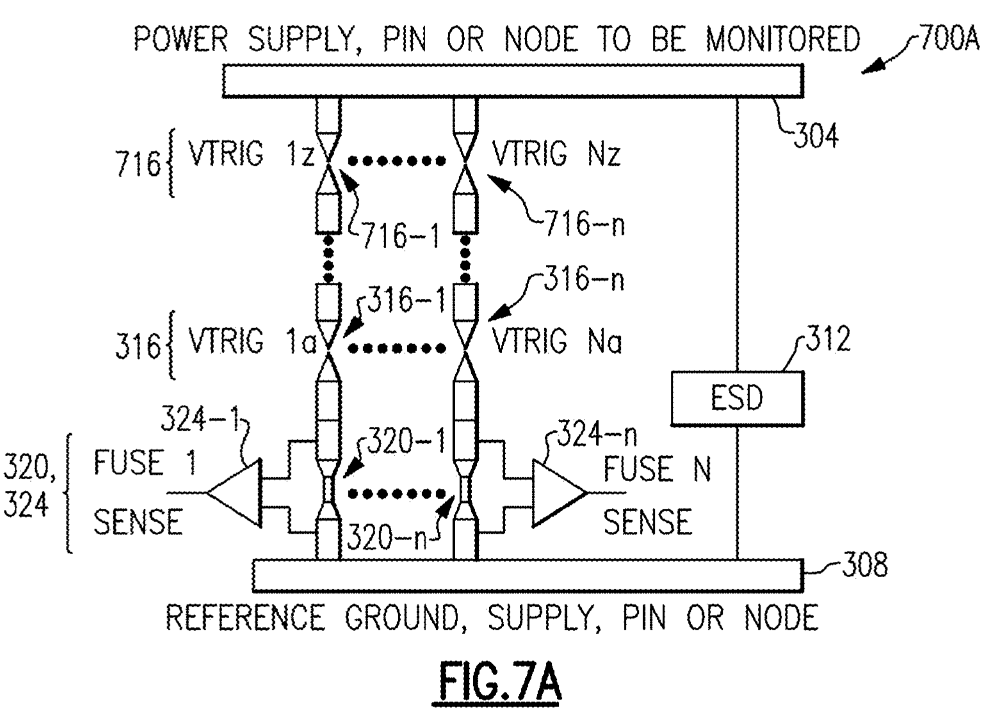
FIGS. 7A-7B are schematic diagrams of EOS monitor/protection devices including a plurality of serially connected spark gap devices configured to monitor voltage and/or energy associated with an EOS event, according to embodiments.

FIG. 7A is a schematic diagram of an EOS monitor/protection device 700A including a plurality of serially connected spark gap devices configured to monitor voltage and/or energy associated with an EOS event, according to embodiments. The EOS monitor/protection device 700A is configured similarly to the EOS monitor/protection device 300 described supra with respect to FIG. 3, except the EOS monitor/protection device 700A additionally includes a second through $z^{th}$ plurality of spark gap devices 716, wherein each includes spark gap devices 716-1, 716-2, . . . **716-*n* of conductive structures each having an interelectrode gap therebetween (and thereby having different $V_{TR}$'S). Each of spark gap devices 716-1, 716-2, . . . 716-*n* of conductive structures is connected to the voltage high node 304 on one end and serially connected to a corresponding one of spark gap devices 316-1, 316-2, . . . 316-*n* of conductive structures each having a different gap therebetween. Each serially connected the pairs, e.g., 716-1/316-1, 716-2/316-2, . . . and 716-*n*/316-*n*, are in turn electrically connected in parallel to result in a net hold voltage that is greater than each pair of conductive structures alone. Thus, each serially connected pair, e.g., 716-1/316-1, 716-2/316-2, . . . or 716-*n*/316-*n*** is configured to electrically arc in response to different electrical overstress voltages $V_{TR1}$, $V_{TR2}$, . . . . $V_{TRn}$, respectively.

Figure 7B:
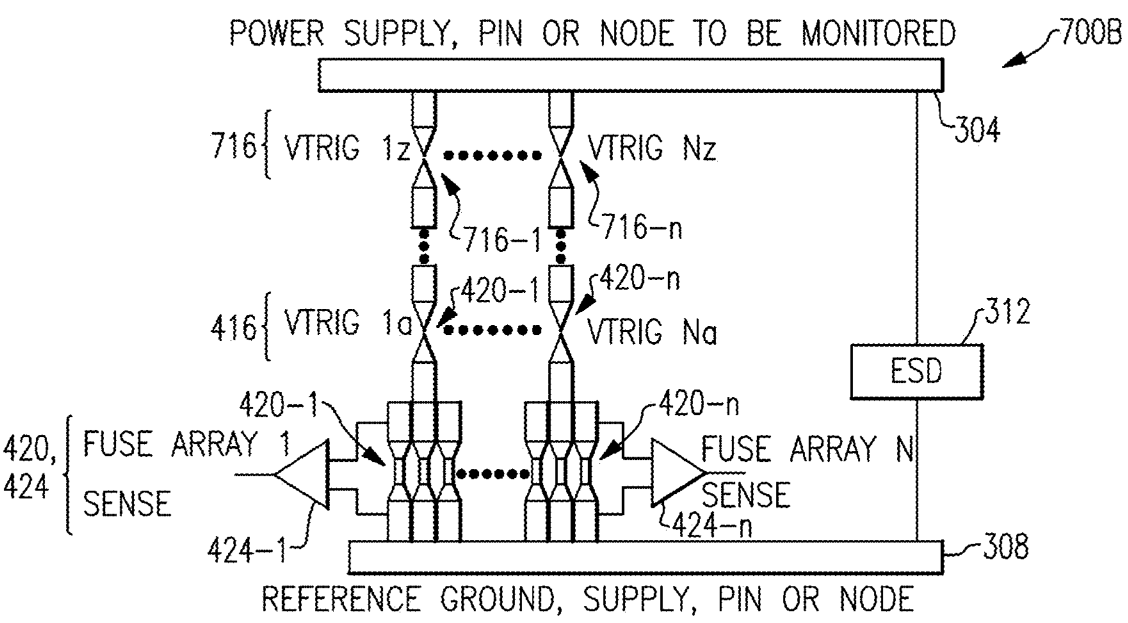

FIG. 7B is a schematic diagram of an EOS monitor/protection device including a plurality of serially connected spark gap device configured to monitor voltage and/or energy associated with an EOS event, according to embodiments. The EOS monitor/protection device 700B is configured similarly to the EOS monitor/protection device 400 described supra with respect to FIG. 4, except the EOS monitor/protection device 700B additionally includes a second through $z^{th}$ plurality of spark gap devices 716, wherein each including spark gap devices 716-1, 716-2, . . . **716-*n* of conductive structures each having a different gap therebetween. In an analogous manner as described above with respect to the EOS monitor/protection device 700A of FIG. 7A, the serially connected pairs, e.g., 716-1/416-1, 716-2/416-2, . . . and 716-*n*/416-*n*, are in turn electrically connected in parallel to result in a net hold voltage that is greater than each pair of conductive structures alone. Thus, each serially connected pair, e.g., 716-1/416-1, 716-2/416-2, . . . or 716-*n*/416-*n*** is configured to electrically arc in response to a different electrical overstress voltage $V_{TR1}$, $V_{TR2}$, . . . . $V_{TRn}$, respectively.

Figure 8A:
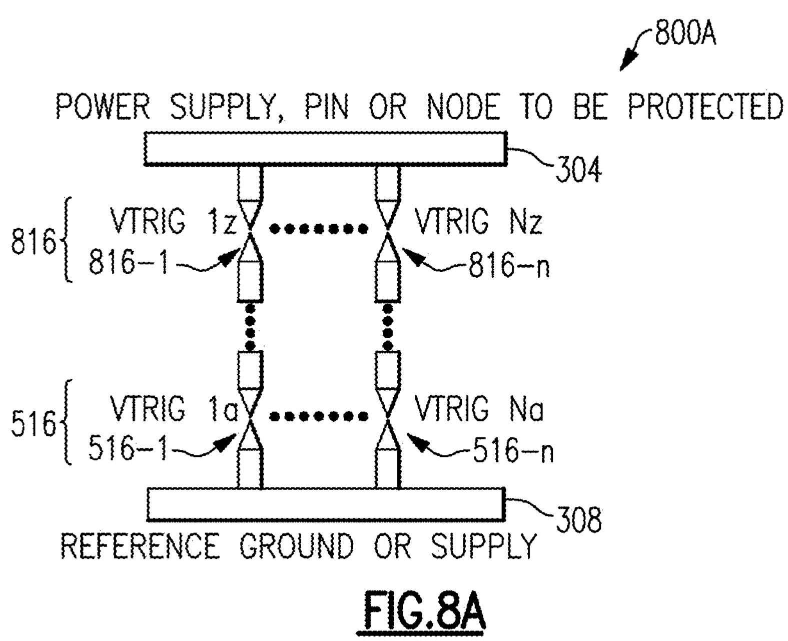
FIG. 8A is a schematic diagram of an EOS protection and monitoring arrangement including a plurality of serially connected spark gap devices configured as electrostatic discharge (ESD) devices to protect a core device against an EOS event, according to embodiments.
Figure 8B:
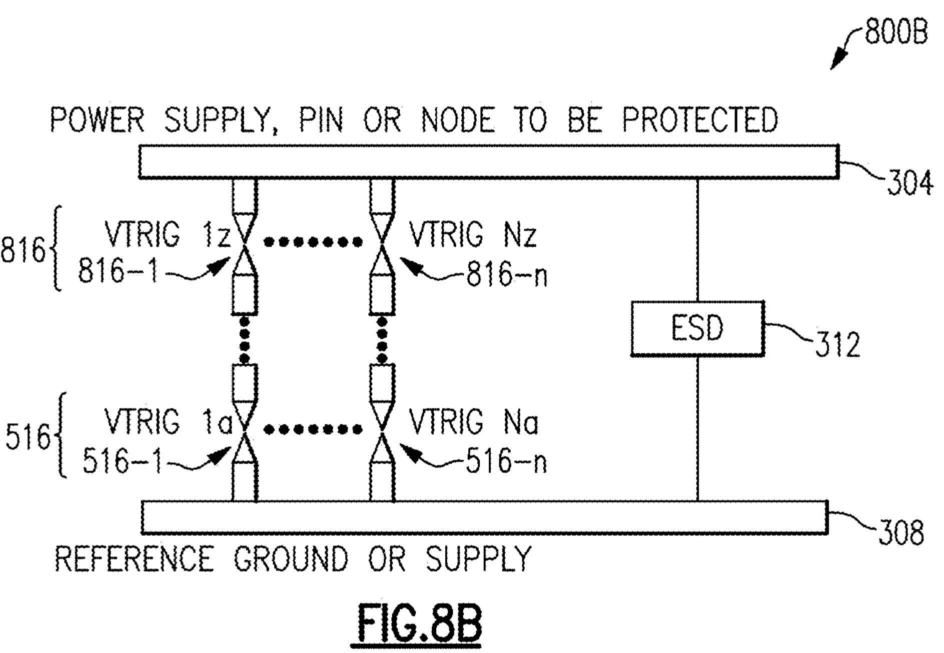
FIG. 8B is a schematic diagram of an EOS protection and monitoring arrangement including a plurality of serially connected spark gap devices configured to monitor EOS events and a separate electrostatic discharge (ESD) device configured to protect a core device against an EOS event, according to embodiments.

FIGS. 8A and 8B are schematic diagrams EOS protection devices 800A and 800B, respectively, each including a plurality of serially connected spark gap devices configured as EOS protection devices to protect a core device against an EOS event, according to embodiments. Each of EOS protection devices 800A and 800B is configured similarly to the EOS monitor/protection devices 500A (FIG. 5A) and 500B (FIG. 5B) described supra, respectively, except each of the EOS protection devices 800A and 800B additionally include a second through $z^{th}$ plurality of spark gap devices 816, each of which includes spark gap devices 816-1, 816-2, . . . **816-*n* of conductive structures each having a different gap interelectrode spacing (and thereby having different $V_{TR}$'S). In an analogous manner as described above with respect to the EOS monitor/protection devices 700A and 700B of FIGS. 7A and 7B, respectively, each serially connected pairs, e.g., 816-1/516-1, 816-2/516-2, . . . and 816-*n*/516-*n*, are in turn electrically connected in parallel to result in a net hold voltage that is greater than those of each pair of conductive structures alone. Thus, each serially connected pair, e.g., 816-1/516-1, 816-2/516-2, . . . or 816-*n*/516-*n*** is configured to electrically arc in response to a different electrical overstress voltages $V_{TR1}$, $V_{TR2}$, . . . . $V_{TRn}$, respectively.

Thus, referring back to FIG. 6, by including a plurality of serially connected pairs of spaced conductive structures, embodiments of EOS monitor/protection devices and ESD devices have hold voltages higher than the $V_{PWR}$ supplied to the core circuit, such that conduction through the serially connected spark gap devices cease when the ESD event ceases, thereby preventing excessive post ESD event leakage and/or damage to the core circuit.

As described with respect to FIG. 1D a vertical spark gap device may comprise a top electrode 126 and a bottom electrode 125 vertically separated from the top electrode 126 by an interelectrode layer (e.g., an ILD layer) 130 comprising an interelectrode region 128 and the gap region 127 therein. The interelectrode regions 128 and the gap region 127 may be configured to allow formation of an electrical arc between the top and bottom electrodes 126, 125 when a voltage difference between the top and bottom electrode 126, 125, exceeds a trigger voltage ($V_{TR}$) of the vertical spark gap device. In various embodiments, the top and bottom electrodes 126, 125, can have different shapes and geometries and may be aligned with respect to each other to provide an overlap area 129 and a corresponding gap region 127 having different shapes, sizes, or volumes. Each one of the top and bottom electrodes 126, 125, can be electrically connected to a voltage source or an electrical ground via conductive regions formed in one or more metallization layers and one or more conductive vias. In some implementations, a plurality of conductive vias electrically may connect a contact section of an electrode to a conductive region through which the electrode is electrically connected to a voltage node by a conductive path formed by one more vias and the conductive region. In various implementations, the conductive region can be a conductive region of a metallization layer above or below the metallization layer comprising the electrode. In some implementations, one or both of the bottom and top electrodes 125, 126 may comprise two or more contact regions. In various implementations, location, size, shape, and orientation of the contact regions within the respective electrodes may affect the $V_{TR}$ and/or current handling capacity of a vertical spark gap device formed by these electrodes. For example, the contact regions may be contacted by a plurality of conductive vias, e.g., a bundle of vias. The contact regions may have a variety of shapes, including a circular, elliptical, rectangular, slotted, L-shaped, C-shaped and U-shaped regions, to name a few. In some embodiments, a contact region can be electrically connected to a voltage node. In some cases, a voltage node may comprise an electric ground or ground potential.

FIGS. 9A-9F are schematic diagrams illustrating nonlimiting example electrode configurations that may be used to form a vertical spark gap device for EOS protection and monitoring. The illustrated top-down views depict the shape of the first and second conductive layers (electrodes) and contact regions through which the conductive layers are connected to voltage nodes to receive EOS signals, e.g., high voltage and ground.

Figure 9C:
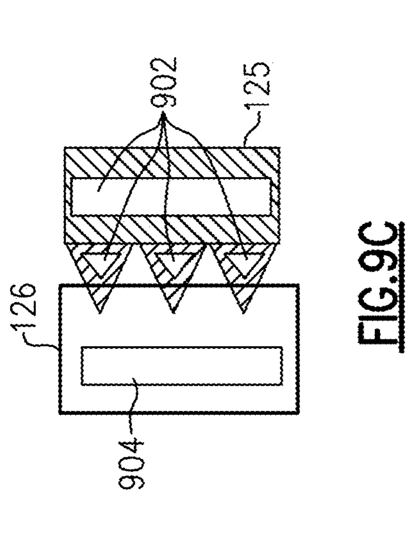
FIGS. 9A-9F are schematic diagrams illustrating example electrode configurations that may be used to form a vertical spark gap device for EOS protection/monitoring, according to embodiments.

In some embodiments, arcing one of the first and second conductive layers may comprise a corner region laterally extending over and overlapping the other of the first and second conductive layers. It will be appreciated that the corner region can form a sharpened tip generally pointing in direction different from the arcing direction. The sharped tip can point in a lateral direction, while arcing generally occurs in a vertical direction through overlapping regions between the first and second conductive layers. One such implementation is illustrated in FIG. 9A. The electrode configuration shown in FIG. 9A comprises a square- or rectangular-shaped bottom electrode 125 and a square- or rectangular-shaped top electrode 126. The bottom electrode 125 is shaped to form a pad and the top electrode 126 is shaped as a ring having a hole formed through a central region. In some implementations, the four edges of the bottom electrode 125 can be rotated with respect to the four edges of the top electrode 126 to form four triangular overlapping areas and the corresponding gap regions (e.g., comprising triangular prisms). In some examples, the four edges of the bottom electrode 125 can be rotated by about 90 degrees with respect to the four edges of the top electrode 126. In some implementations, the contact region 902 of the bottom electrode 125 may comprise a rectangular or square shaped region near the center of the bottom electrode 125 and the contact region 904 of the top electrode 126 may comprise a strip (e.g., a wide strip) extending around and near the outer edge of the top electrode 126.

In some embodiments, arcing one of the first and second conductive layers comprise a rectangular region laterally extending over and overlapped by the other of the first and second conductive layers. One such implementation is illustrated in FIG. 9B. The electrode configuration shown in FIG. 9B comprises a rectangular bottom electrode 125 and a U-shaped rectangular top electrode 126 configured to form a U-shaped overlapping area with the bottom electrode 125.

In some examples, the overlapping area can be continuously extended along three edges of the bottom electrode. In some implementations, the contact region 902 of the bottom electrode 125 may comprise a rectangular or square shaped region near an edge of the bottom electrode 125 and the contact region 904 of the top electrode 126 may comprise a U-shaped strip (e.g., a wide strip) extending around and near the outer edge of the top electrode 126.

In some embodiments, arcing one of the first and second conductive layers comprise a plurality of corner or tip region laterally extending over and overlapping the other of the first and second conductive layers. Similar to the arrangement shown in FIG. 9A, the corner regions can form sharpened tips generally pointing in a direction different from the arcing direction. One such implementation is illustrated in FIG. 9C. The electrode configuration shown in FIG. 9C comprises a rectangular top electrode 126 and a segmented bottom electrode 125 having a rectangular region (common section) and three triangular regions (electrode fingers) connected to the rectangular portion and configured to form three separate triangular overlapping areas with the top electrode 126 and thereby three separate arcing gaps and corresponding gap regions (e.g., gap regions comprising triangular prisms). In some implementations, the contact region 902 of the bottom electrode 125 may comprise a rectangular region within the rectangular portion (the common section) and three triangular regions each within one of the triangular portions. The contact region 904 of the top electrode 126 may comprise a rectangular region within the top electrode 126.

To suppress current localization, in some embodiments, one or both of the first and second conductive layers may be curved structures that avoid corners or tips. For example, the curved structures may include a circular ring or pad. Example implementations are illustrated in FIGS. 9D and 9E. The electrode configurations shown in FIGS. 9D-9E comprise a U-shaped rectangular bottom electrode 125 and multiple disk-shaped top electrodes distributed over the bottom electrode 125 and forming multiple disk-shaped overlapping areas and corresponding cylindrical gap regions. The electrode configuration shown in FIG. 9D comprises five top electrodes 126*a*-126*e* and the electrode configuration shown in FIG. 9E comprises three top electrodes 126*f*-126*h*.

Unlike the arrangements described above with respect to FIGS. 9A-9C, the arrangements illustrated in FIGS. 9D and 9E include the top electrodes that have a substantially smaller footprint relative to the bottom electrodes, such that at least some of the top electrodes are entirely overlapped by the bottom electrodes. In some implementations, the contact region 902 of the bottom electrode 125 may comprise a rectangular region near an edge of the bottom electrode and the contact regions 904 of the top electrodes 126*a*-126*h* may comprise a disk near the center of each one of the top electrodes 126*a*-126*h*. In some implementations, the electrode configurations shown in FIGS. 9D-9E may allow providing a consistent triggering condition over a wider junction area and using multiple spark gas under a common bond pad (as shown and described below with respect to FIGS. 12B and 12C below).

Figure 9F:
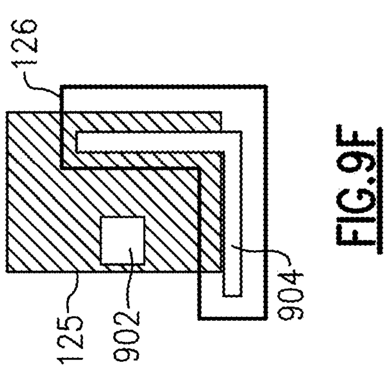
Figure 9B:
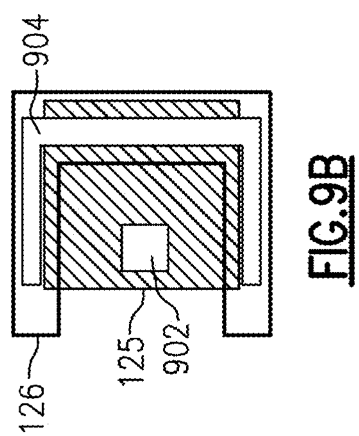
Figure 9E:
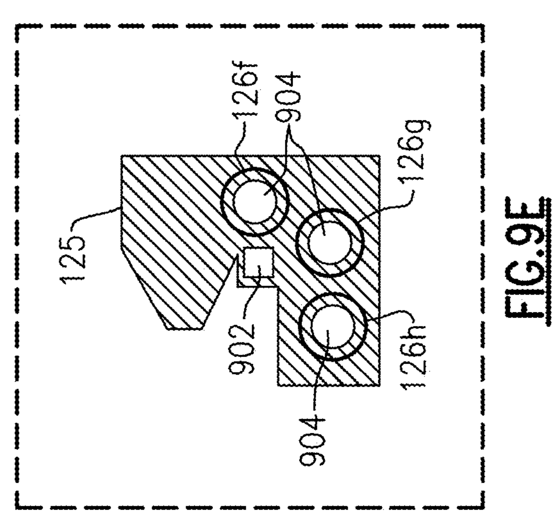
Figure 9A:
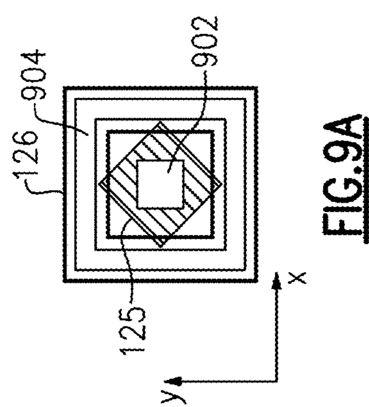
Figure 9D:
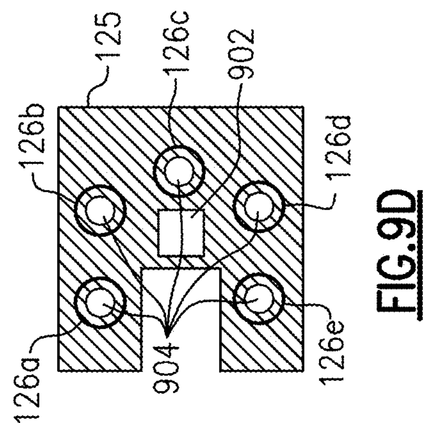

The electrode configuration shown in FIG. 9F comprises a rectangular bottom electrode 125 and an L-shaped top electrode 126 configured to form an L-shaped overlapping area with the bottom electrode 125. In some examples, the overlapping area can be continuously extended along two edges of the bottom electrode 125. In some implementations, the contact region 902 of the bottom electrode 125 may comprise a rectangular or square shaped region near an edge of the bottom electrode 125 and the contact region 904 of the top electrode 126 may comprise an L-shaped strip extending around and near the outer edge of the top electrode 126.

In various implementations, a shape, size, and location of a contact region of an electrode, through which the electrode is connected to a voltage node), may determine, at least partially, the potential distribution over the electrode. As such, in some implementations, the geometry of the electrode may be configured based on a desired geometry of one or more contact regions. In some embodiments, a shape of the top and/or bottom electrodes 126, 125 may allow a configuration of the respective voltage supply regions that provides a desired potential distribution over the top and/or bottom electrodes 126, 125.

It should be understood that the electrode configuration of a vertical spark gap device is neither limited to the specific designs shown in FIGS. 9A-9F nor to configurations that include at least some of the features of these designs with respect to the geometry and alignment of the electrodes and the respective voltage supply regions.

Figure 9G:
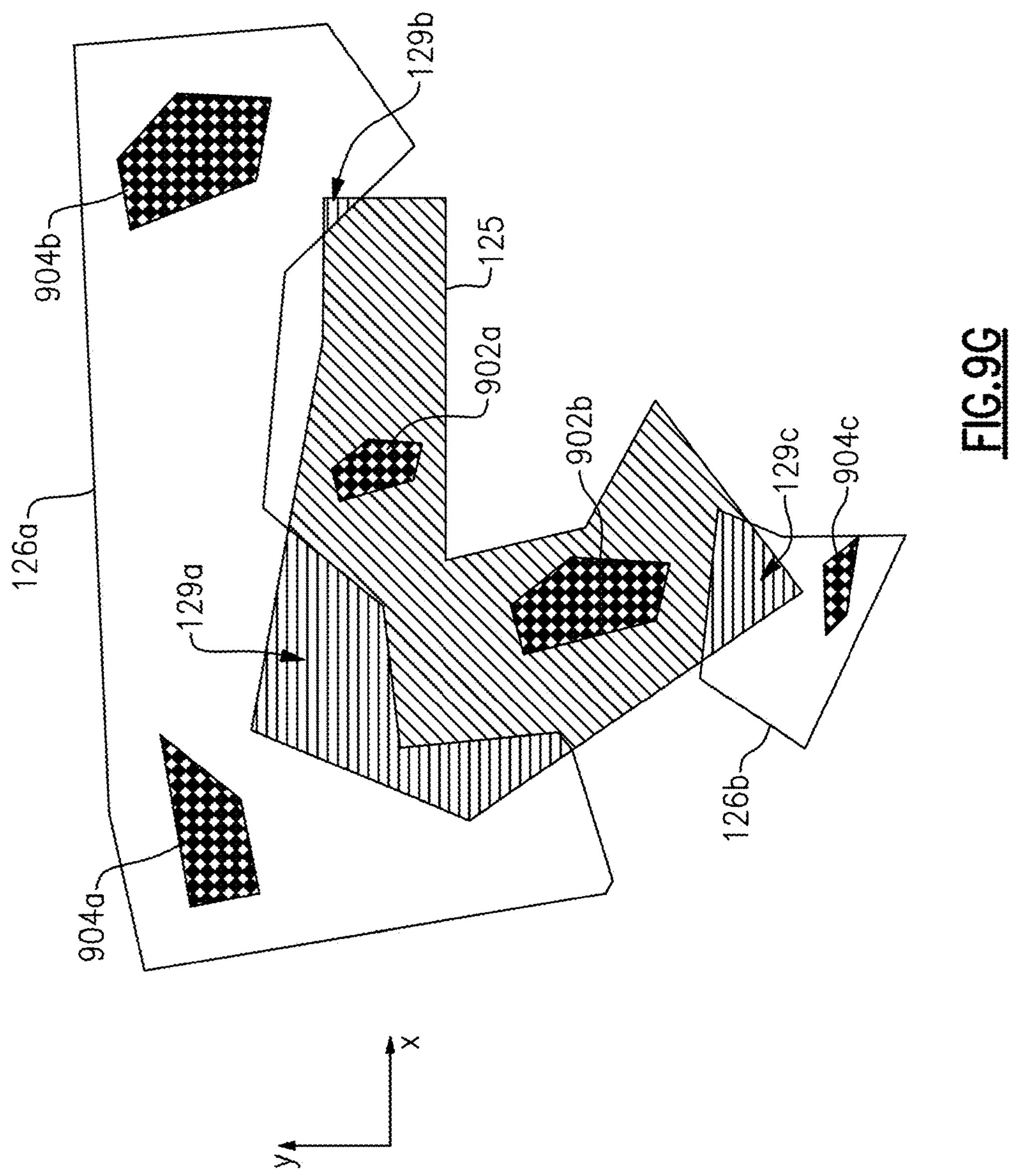
FIG. 9G schematically illustrates a top view of a generic electrode configuration for a vertical spark gap device having vertically separated top and bottom electrodes.

FIG. 9G schematically illustrates a generic electrode configuration for a vertical spark gap device having vertically separated top and bottom electrodes. In various implementations, the top electrode may comprise one or more segments 126*a*, 126*b* and each segment may comprise one or more contact regions 904*a*, 904*b*, 904*c*. The bottom electrode 125 can comprise one or more contact regions 902*a*, 902*b* and, in some cases, more than one segment. The top electrode segments 126*a*, 126*b* may be formed in a top metallization layer of an IC or semiconductor device and the bottom electrode 125 may be formed in a bottom metallization layer of the IC or semiconductor device below the top metallization layer and may be vertically separated from the top metallization layer by an ILD. In some examples, the thickness of the ILD layer defines the vertical gap size, also referred to as gap size, (g) of the vertical spark gap device. The top and bottom electrodes 126, 125 may be positioned and oriented with respect to each other such that projection of each top electrode segment 126*a*, 126*b*, on the bottom metallization layer at least partially overlaps with the bottom electrode 125 providing one or more overlapping areas 129*a*, 129*b*, 129*c*, and respective gap regions. The electrical characteristics of a vertical spark gap device formed by the electrode configuration shown in FIG. 9G (e.g., $V_{TR}$, current handling limit, and the like) may be determined by multiple parameters and features including but not being limited to:

- Geometry (e.g., shape, area, thickness) of the top and bottom electrodes.
- Material composition of the top and the bottom electrodes.
- Vertical separation between the top and bottom electrodes (vertical gap size, or gap size, g) that can be substantially equal to the thickness of the ILD layer disposed between the top and bottom electrodes.
- Composition of interelectrode region and, in some cases, other regions of the ILD layer.
- Composition of the gap region which can be similar or different from that of the interelectrode region.
- Relative alignment of the top and the bottom electrodes.
- Geometry (e.g., shape, area, volume) of the overlapping areas and the respective gap regions.
- Geometry (e.g., shape, area) of the contact regions
- Number of contact regions and their position and orientation within the respective electrode.

Density of the conductive vias connected to each contact region and geometry (diameter, cross-sectional area) of individual conductive vias.

It should be understood that the electrical characteristics of a vertical spark gap device can be affected by all or a subset of the above-mentioned parameters or other parameters (e.g., parameters may become relevant in alternative designs).

In a process for designing a vertical spark gap device having predetermined electrical characteristics, all or a subset of the above-mentioned parameters or other parameters may be estimated based at least in part on the predetermined electrical characteristics and additionally based on constraint imposed by the corresponding IC within which the vertical spark gap device is integrated and a circuit or device of the IC protected and/or monitored by the vertical spark gap device.

In some embodiments, symmetrical properties of the top and/or bottom electrodes may be exploited to provide a more uniform spatial distribution of electric potential and thereby a more uniform spatial distribution of electric discharge current over top and/or bottom electrodes. In some implementations, uniformity of the spatial distribution of electric potential and discharge current may provide a more accurate and controllable $V_{TR}$ and may decrease damage to the electrode structure during each electric discharge event.

In some implementations, the electrical characteristics and performance of a vertical spark gap device may benefit from circularly symmetric top and bottom electrodes comprising disks, rings (annuli), disk segments, ring segments, or a combination thereof. FIG. 10A-10D schematically illustrate four circularly symmetric electrode configurations for a vertical spark gap device.

Figures 10A, 10B, 10C, 10D:
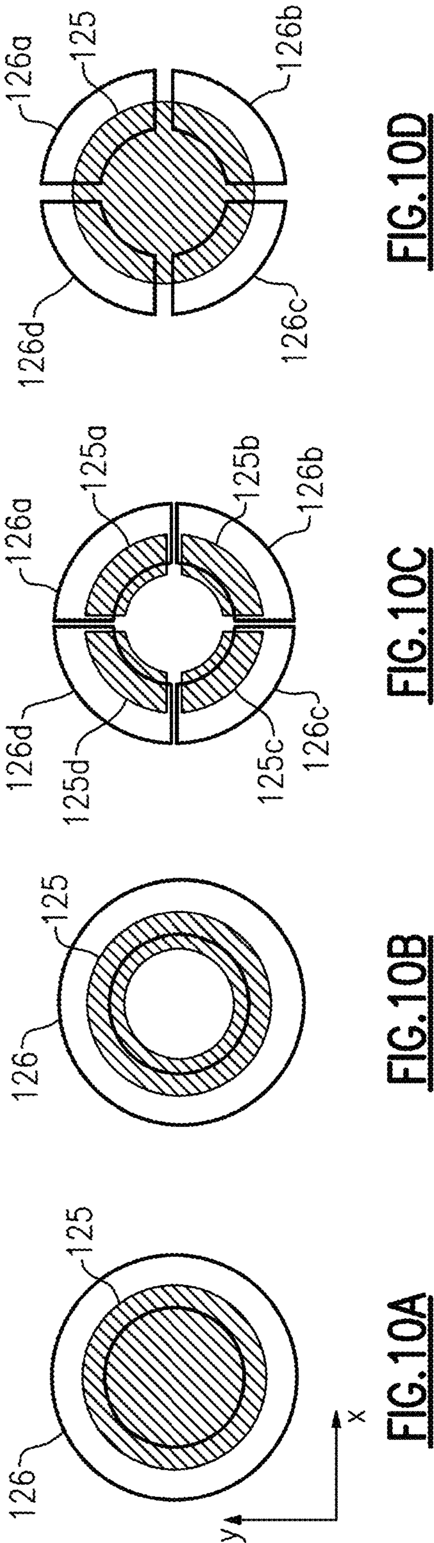
FIGS. 10A-10D are schematic diagrams illustrating example cylindrically symmetric electrode configurations for vertical spark gap devices, according to embodiments.

The electrode configuration shown in FIG. 10A comprises a disk shape bottom electrode 125 and an annular top electrode 126 forming an annular overlapping area and a corresponding gap region comprising a cylindrical shell. In some implementations, the contact region (not shown) of the bottom electrode 125 may comprise a disk near the center of the bottom electrode 125 and the contact region (not shown) of the top electrode 126 may comprise an annulus, e.g., concentric with the top electrode 126.

The electrode configuration shown in FIG. 10B comprises an annular bottom electrode 125 and an annular top electrode 126 forming an annular overlapping area and a corresponding gap region comprising a cylindrical shell. In some implementations, the contact region (not shown) of the bottom electrode 125 may comprise an annulus, e.g., concentric with the bottom electrode 125 and the contact region (not shown) of the top electrode 126 may comprise an annulus, e.g., concentric with the top electrode 126.

The electrode configuration shown in FIG. 10C includes a segmented bottom electrode comprising a first segmented annulus and a top electrode comprising a second segmented annulus. In the example shown the first segmented annulus comprises four segments 125*a*-125*d* and the second segmented annulus comprises four segments 126*a*-126*d* positioned to form a segmented annular overlapping area with the segments 125*a*-125*d*. The segmented annular overlapping area comprises four overlapping areas and corresponding gap regions comprising four cylindrical shell sections. In some implementations, the contact region (not shown) of each the bottom electrode segments 125*a*-125*d* may comprise four annular segments within the respective bottom electrode segments 125*a*-125*d*, and the contact region (not shown) of each the top electrode segments 126*a*-126*d* may comprise four annular segments within the respective top electrode segments 126*a*-126*d*.

The electrode configuration shown in FIG. 10D includes a disk shape bottom electrode and a segmented top electrode comprising a segmented annulus. In the example shown the segmented annulus comprises four segments 126*a*-126*d* that are positioned to form a segmented annular overlapping area with the bottom electrode 125. The segmented annular overlapping area comprises four overlapping areas and corresponding gap regions comprising four cylindrical shell sections. In some implementations, the contact region (not shown) of each the top electrode segments 126*a*-126*d* may comprise four annular segments within the respective top electrode segments 126*a*-126*d* and the contact region (not shown) of the bottom electrode may comprise a disk shape region near the center the bottom electrode 125.

Advantageously, circular or cylindrically symmetric electrodes (e.g., the electrodes configuration shown in FIGS. 9D, 9E, 10A-10D), can eliminate the formation of large electric fields near or at the corners (e.g., sharp corners) and provide a more controllable, and in some cases, lower trigger voltage ($V_{TR}$).

FIG. 11A-11D schematically illustrate cross-sectional views of example vertical spark gap devices formed by metallization and ILD layers within an IC. In the example devices shown, the IC comprises at least five metallization layers and the vertical spark gap device is formed between the second and third metallization layers. The bottom panels show lateral cross-sections of the spark gap devices in a plane (e.g., x-y plane) parallel to a major surface of the substrate on which the metallization layers are formed and passing through the fourth metallization layer (Met4). The top panels show vertical cross-sections of the spark gap devices along AA' cut line (shown in the respective bottom panels) and in a plane (e.g., x-z plane) perpendicular to the major surface of the substrate on which the metallization layers are formed.

Figure 11A:
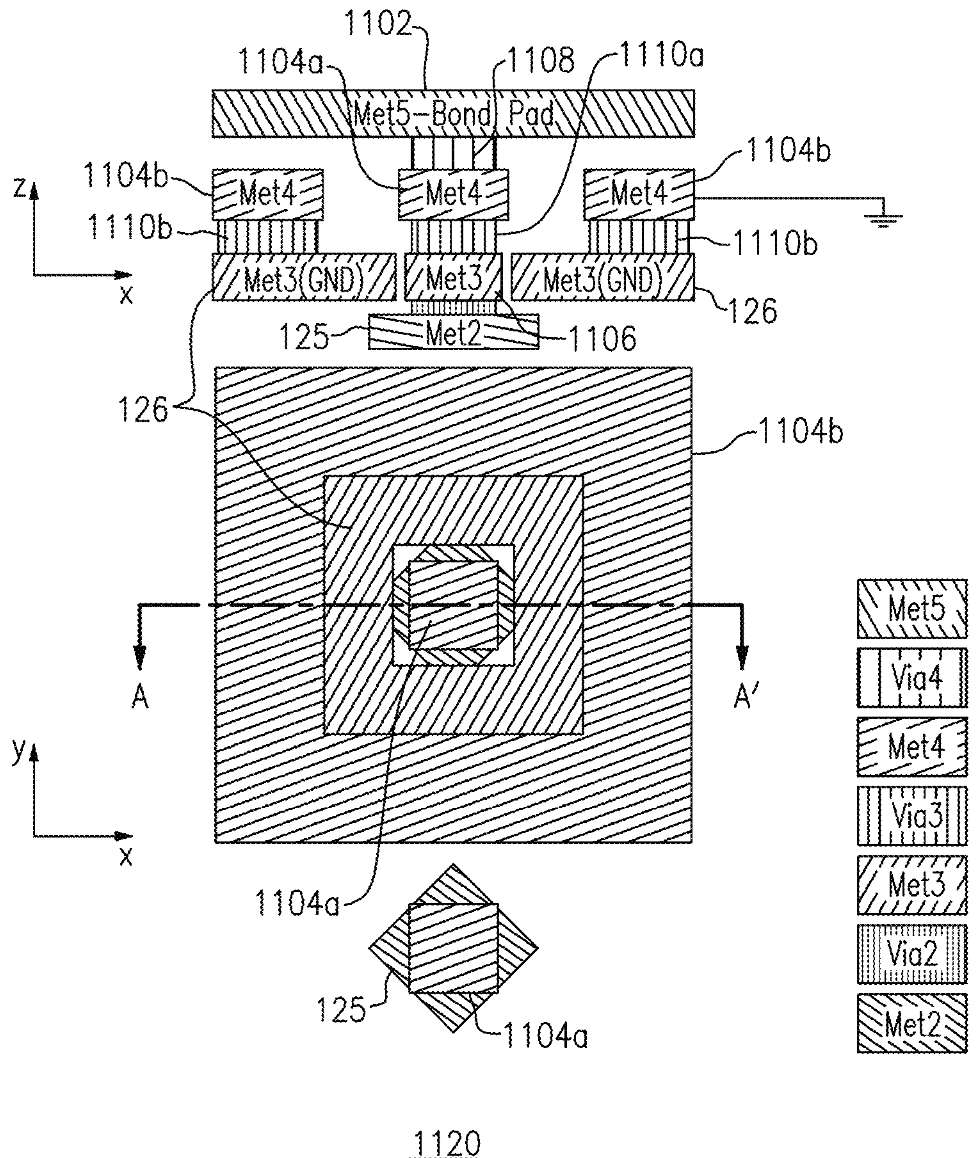
FIGS. 11A-11C are schematic diagrams illustrating example vertical spark gap devices formed by vertically separated rectangular or square shaped electrodes formed in a semiconductor integrated circuit having multiple levels of interconnect metallization.

The example vertical spark gap device 1120 shown in FIG. 11A comprises an electrode configuration similar to the electrode configuration described with respect to FIG. 9A. The bottom electrode 125 of the vertical spark gap device 1120 comprises a square shape conductive element formed in the second metallization layer and is electrically connected to a bond pad 1102 formed in the fifth metallization layer above the metallization layers one to four (Met1-Met4). The electrical connection between the bottom electrode 125 and bond pad 1102 is provided by three groups of conductive vias and two conductive regions 1106, 1104*a*, in the third and fourth metallization layers, respectively. The first group of conductive vias (not shown) comprises a plurality of conductive vias extending along the vertical direction (e.g., parallel to z-axis) from the bottom electrode 125 to the conductive region 1106 in the third metallization layer. The second group of conductive vias 1110 comprises a plurality of conductive vias extending along the vertical direction (e.g., parallel to z-axis) from the conductive region 1106 to the conductive region 1104*a*. The third group of conductive vias 1108 comprises a plurality of conductive vias extending along the vertical direction (e.g., parallel to z-axis) from the conductive region 1104*a* to the bond pad 1102. In some implementations, the bond pad 1102 may be electrically connected to another structure for receiving a high voltage by a wire bond, a solder ball, or other types of electrical connections.

Still referring to FIG. 11A, the top electrode 126 of the vertical spark gap device 1120 comprises a square-shaped conductive element having a square-shaped hole, formed in the fourth metallization layer and is electrically connected to electrical ground. The electrical connection between the top electrode 126 and electrical ground is provided by at least by a plurality of conductive vias 1110*b* and a conductive region 1104*b* in the fourth metallization layer. The top electrode 126 is electrically isolated from the conductive region 1106 by a first lateral gap and the conductive region 1104*b* is electrically isolated from the conductive region 1104*a* by a second lateral gap. The plurality of conductive vias 1110*b* extend from a contact region of the top electrode 126 to the conductive region 1104*b* along vertical direction (e.g., parallel to z-axis). In some implementations, the conductive region 1104*b* may comprise a square shape conductive layer having a square shape hole.

Still referring to FIG. 11A, in some embodiments, the adjacent metallization layers are vertically separated by at least one ILD layer and the conductive vias connecting the conductive regions of the metallization layers may be formed in the respective ILDs. As such, a vertical distance between two consecutive metallization layers can be substantially equal to the thickness of the ILD layer (or ILD layers) that is (are) disposed between the two consecutive metallization layers. In various implementations, the ILD layers between different metallization layers may comprise different material compositions. In some embodiments, an interelectrode ILD between the second and third metallization layers, where the first and the second electrodes are formed, may comprise an interelectrode region comprising the gap region formed between the bottom and top electrodes 125, 126. As described above, the interelectrode region of the interelectrode ILD layer can have a material composition different from other regions of the interelectrode ILD layer outside of the interelectrode region. In some cases, the interelectrode region may laterally extend (e.g., along x and y directions) from an outer edge of the bottom electrode to an inner edge of the conductive region 1106. In some implementations, the interelectrode region may comprise vacuum, air or another gas mixture. In other implementations, the interelectrode region may comprise a dielectric material (e.g., a composite dielectric material).

Figure 11B:
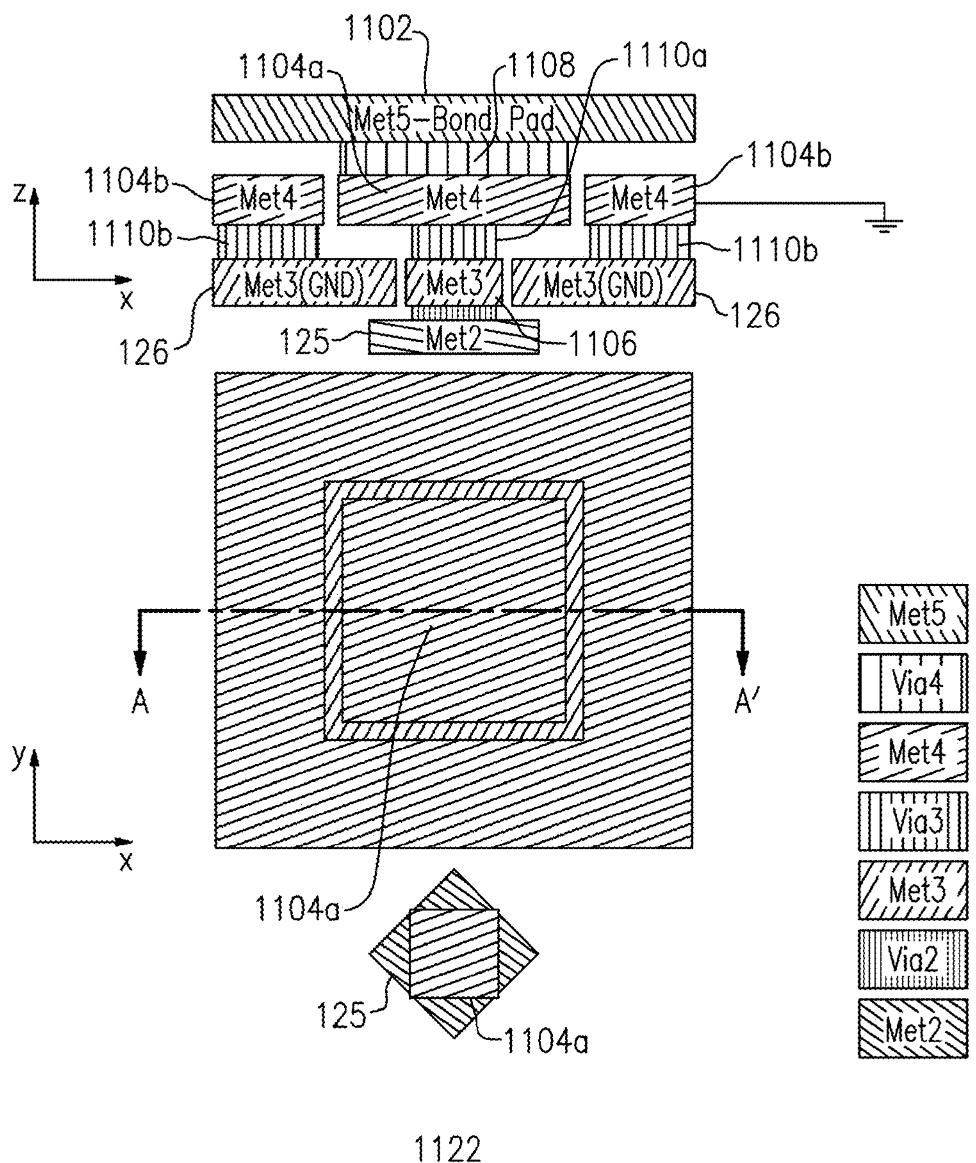

The example vertical spark gap device 1122 shown in FIG. 11B comprises an electrode configuration similar to the electrode configuration described above with respect to vertical spark gap device 1120 in FIG. 11A; however, in this example, a width of the conductive region 1104*a* is larger and the second lateral gap between the conductive regions 1104*a* and 1104*b*.

Figure 11C:
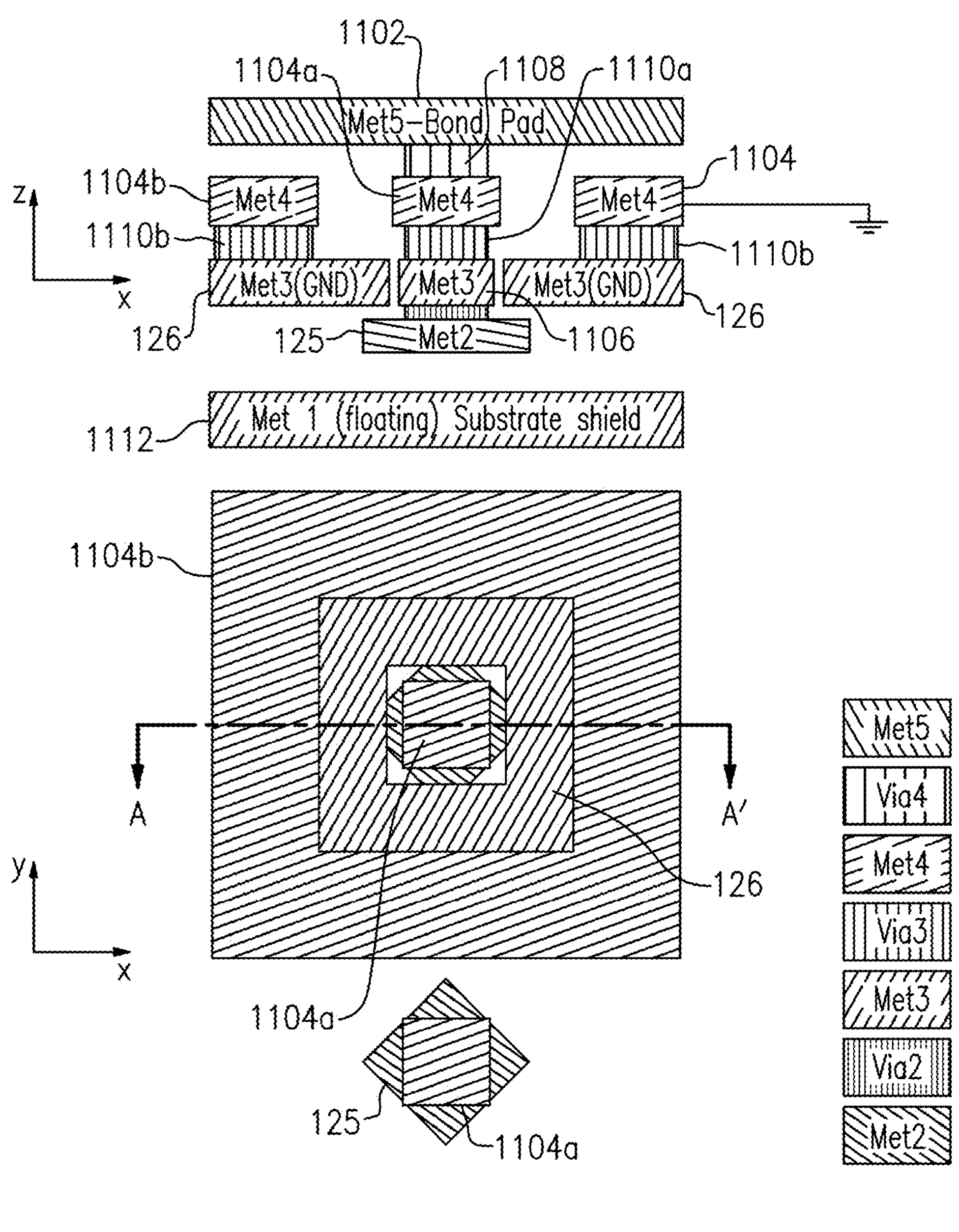

The example vertical spark gap device 1124 shown in FIG. 11C comprises an electrode configuration similar to electrode configuration described above with respect to vertical spark gap device 1120 in FIG. 11A; however, in this example, the vertical spark gap device 1124 includes an additional square shape of rectangular conductive region 1112 (e.g., a conductive plate) formed in a first metallization layer of the corresponding IC or semiconductor device. In some implementations, the additional conductive region 1112 may be electrically floating and configured to serve as an electromagnetic shield between the bottom electrode 125 and the substrate on which the vertical spark gap device is formed.

Figure 11D:
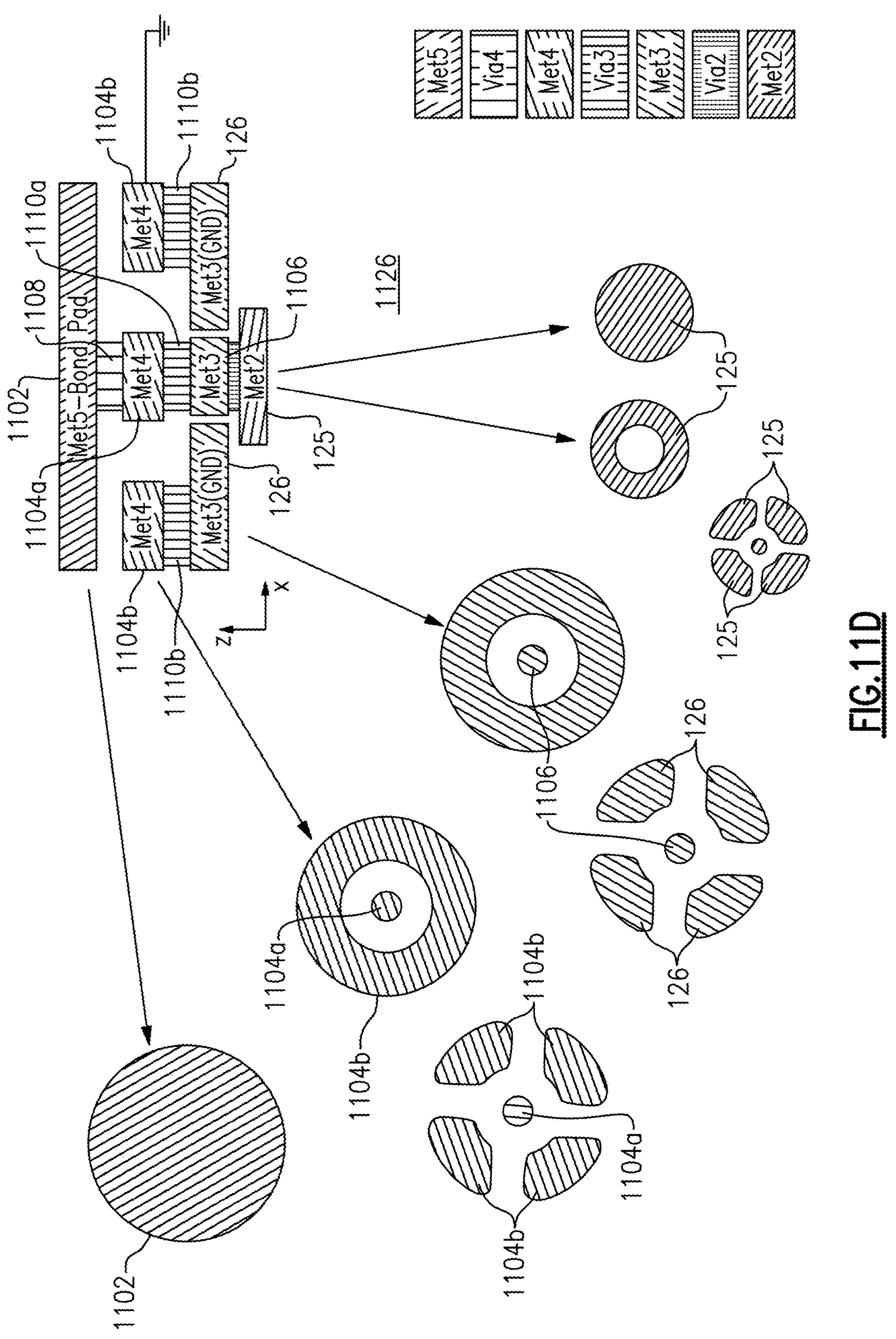
FIG. 11D is a schematic diagram illustrating an example vertical spark gap device formed by vertically separated cylindrically symmetric electrodes formed in a semiconductor integrated circuit having multiple levels of interconnect metallization.

The example vertical spark gap device 1126 shown in FIG. 11D is cylindrically symmetric vertical spark gap device comprising one or more features described above with respect to vertical spark gap devices 1120, 1122, and 1124. In some implementations the bond pad 1102 of the vertical spark gap device 1126 may comprise a cylindrical conductive region formed in the fifth metallization layer. In some embodiments, the vertical spark gap device 1126 may have a layer structure similar to the vertical spark gap devices 1120, 1122, and 1124, however its top electrodes may have geometries similar to the electrode configuration described with respect to FIG. 9B. In some implementations, the bottom electrode 125 may comprise a conductive region annular region, conductive segmented annular region, or conductive cylindrical region formed in the second metallization layer. In some implementations, the bottom electrode 125 may comprise a conductive region annular region, conductive segmented annular region, or conductive cylindrical region formed in the second metallization layer. In some implementations, the top electrode 126 may comprise a conductive region annular region or a conductive segmented annular region formed in the third metallization layer. In some embodiments, the conductive regions 1106 and 1104*a*, which are formed in the third and fourth metallization layers, respectively, and are configured to electrically connect the bottom electrode 125 to the bond pad 1102, may comprise a cylindrical conductive region. In some cases, the conductive regions 1106 can be concentric with the top electrode 126. In some embodiments, the conductive regions 1106 and 1104*a*, which are formed in the third and fourth metallization layers, respectively, may comprise a cylindrical conductive region. In some embodiments, the conductive region 1104, which is formed in the fourth metallization layer and is electrically connected the top electrode 126 to the bond pad 1102, may comprise a cylindrical conductive region. In some cases, the conductive region 1104*b* can be concentric with the conductive region 1104*a*. Advantageously, having cylindrically symmetric electrodes electrically connected to the potential sources and/or electrical ground via cylindrically symmetric conductive paths may result in a near uniform and cylindrically symmetric distribution of electrical potential and discharge current around the top and bottom electrodes 126, 125, and thereby provide a more controllable, and in some cases, lower $V_{TR}$.

Figure 12C:
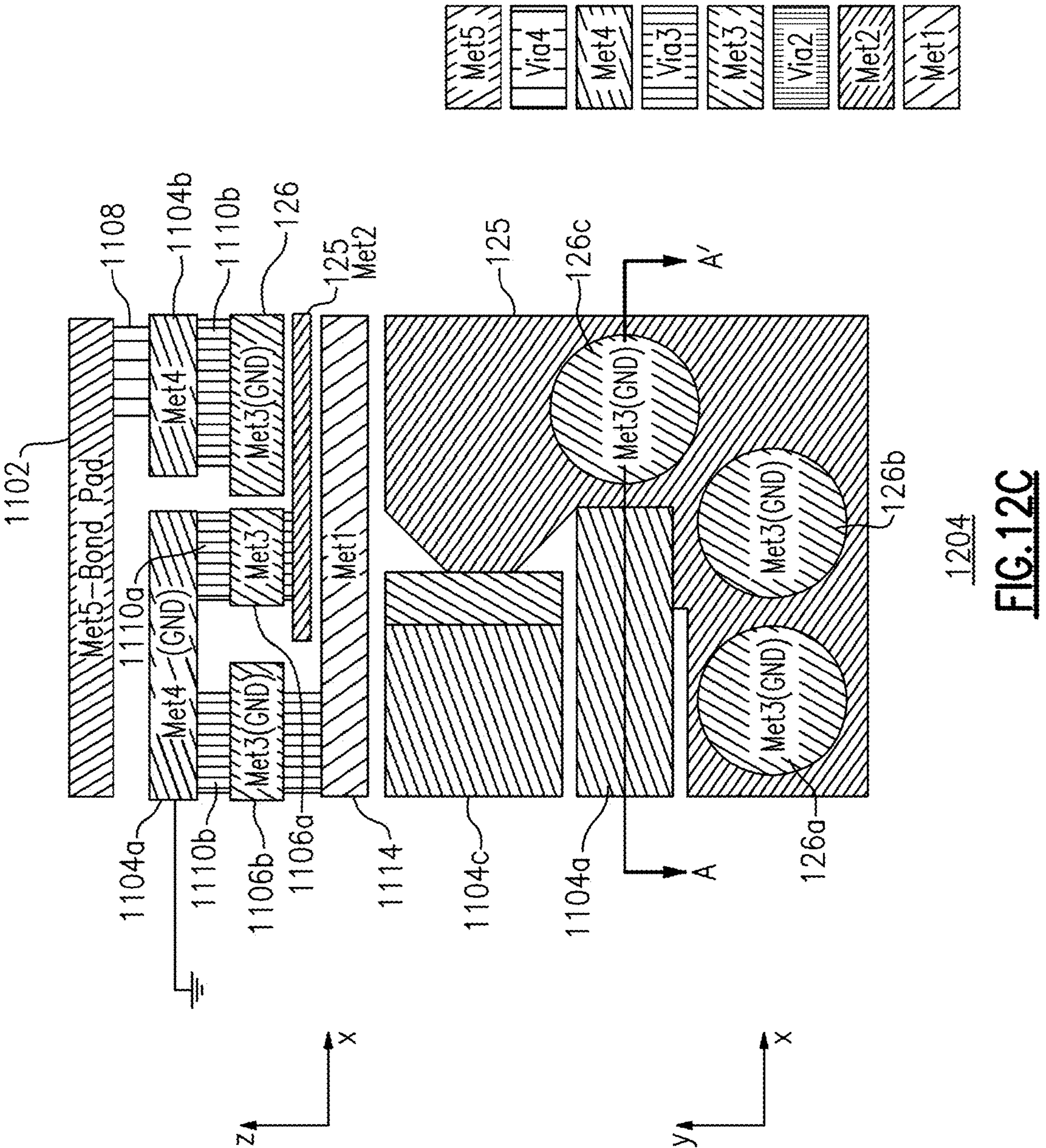

FIGS. 12A-12C schematically illustrate cross-sectional views of three other example vertical spark gap devices 1200, 1202, 1204 formed by metallization and ILD layers within an IC. In the examples, shown the IC comprises at least five metallization layers and the vertical spark gap device is formed between the second and third metallization layers. The bottom panels show lateral cross-sections of the spark gap devices in a plane (e.g., x-y plane) parallel to a major surface of the substrate on which the metallization layers are formed and passing through the fourth metallization layer (Met4). The top panels show vertical cross-sections of the spark gap devices along AA' cut line (shown in the respective bottom panels) and in a plane (e.g., x-z plane) perpendicular to the major surface of the substrate on which the metallization layers are formed.

The example vertical spark gap device 1200 shown in FIG. 12A comprises an electrode configuration similar to the electrode configuration described with respect to FIG. 9B. The bottom electrode 125 of the vertical spark gap device 1200 comprises a square shape conductive element formed in the second metallization layer and is electrically connected to electric ground. The electrical connection between the bottom electrode 125 and the electric ground is provided by two groups of conductive vias and two conductive regions 1106*a*, 1104*a*, in the third and fourth metallization layers, respectively. The first group of conductive vias (not shown) comprises a plurality of conductive vias extending along the vertical direction (e.g., parallel to z-axis) from the bottom electrode 125 to the conductive region 1106 in the third metallization layer. The second group of conductive vias 1110*a* comprises a plurality of conductive vias extending along the vertical direction (e.g., parallel to z-axis) from the conductive region 1106*a* to the conductive region 1104*a*.

Still referring to FIG. 12A, the top electrode 126 comprises a U-shaped rectangular conductive element formed in the third metallization layer and is electrically connected to a bond pad 1102 formed in the fifth metallization layer above the metallization layers 1-4. In some implementations, the electrical connection between the top electrode 126 and the bond pad 1102 is provided by two groups of conductive vias 1110*b*, 1108 and a conductive region 1104*b* in the fourth metallization layer. The first group of conductive vias 1110*a* comprises a plurality of conductive vias extending along vertical direction (e.g., parallel to z-axis) from the top electrode 126 to the conductive region 1104*b* in the fourth metallization layer. The second group of conductive vias 1108 comprises a plurality of conductive vias extending along the vertical direction (e.g., parallel to z-axis) from the conductive region 1104*b* to the bond pad 1102. In some embodiments, the vertical spark gap device 1200 further comprises a conductive region 1114 formed in the first metallization layer below the bottom electrode 125 and electrically connected to electric ground and therefore serving as ground plane. In some implementations, the electrical connection between the conductive region 1114 and the electric ground is provided by two groups of conductive vias and two conductive regions 1106*b* and 1104*a* formed in the third and fourth metallization layers, respectively.

Still referring to FIG. 12A, in some embodiments, the conductive region 1104*b*, which is electrically connected to the top electrode 126, may comprise a U-shaped rectangular region having a slot, and the conductive region 1104*a*, which is electrically connected to the bottom electrode 125 and the conductive region 1114, can extend within the slot. In some such embodiments, the conductive region 1104*a* can be electrically isolated from the conductive region 1104*b* by third and fourth lateral gaps extended along the opposite edges of the conductive region 1104*a* and the opposite edges of the slot. In some embodiments, the conductive region 1106*a* can be electrically isolated from the top electrode 126 and the conductive region 1106*b* by fifth and sixth lateral gaps, respectively. In some embodiments, the sixth later gap size can be greater than the fifth lateral gap size.

The example vertical spark gap device 1202 shown in FIG. 12B comprises an electrode configuration similar to the electrode configuration described with respect to FIG. 9D. The vertical spark gap device 1202 may comprise one or more feature described above with respect to vertical spark gap device 1200 however the shape of the top electrode 126 of the vertical spark gap device 1202 is different from that of the vertical spark gap device 1200. In some embodiments, the top electrode of the vertical spark gap device 1202 can be a segmented electrode comprising a plurality of disk shape electrodes 126*a*-126*e* distributed over the bottom electrode 125. In some embodiments, each of the plurality of the disk shape top electrodes 126*a*-126*e* may be electrically connected by a group of conductive vias (similar to the plurality of conductive vias 1110*b*) to the conductive region 1104*b* (not shown).

The example vertical spark gap device 1204 shown in FIG. 12C comprises an electrode configuration similar to the electrode configuration described with respect to FIG. 9E. The vertical spark gap device 1204 may comprise one or more feature described above with respect to vertical spark gap device 1202, however the shape of the conductive region 1104*b*, which electrically connects the top electrode segments to the bond pad 1102, can be different from that of the vertical spark gap devices 1202 and 1200 in that one of its fingers is shorter to allow formation of a third conductive region 1104*c* in the fourth metallization layer. In the example shown, the top electrode of the vertical spark gap device 1204 comprises three disk shape electrodes 126*a*-126*c* distributed over the bottom electrode 125. In some embodiments, each of the plurality of the disk shape top electrodes 126*a*-126*c* may be electrically connected by a group of conductive vias (similar to the plurality of conductive vias 1110*b*) to the conductive region 1104*b* (not shown).

Figure 12D:
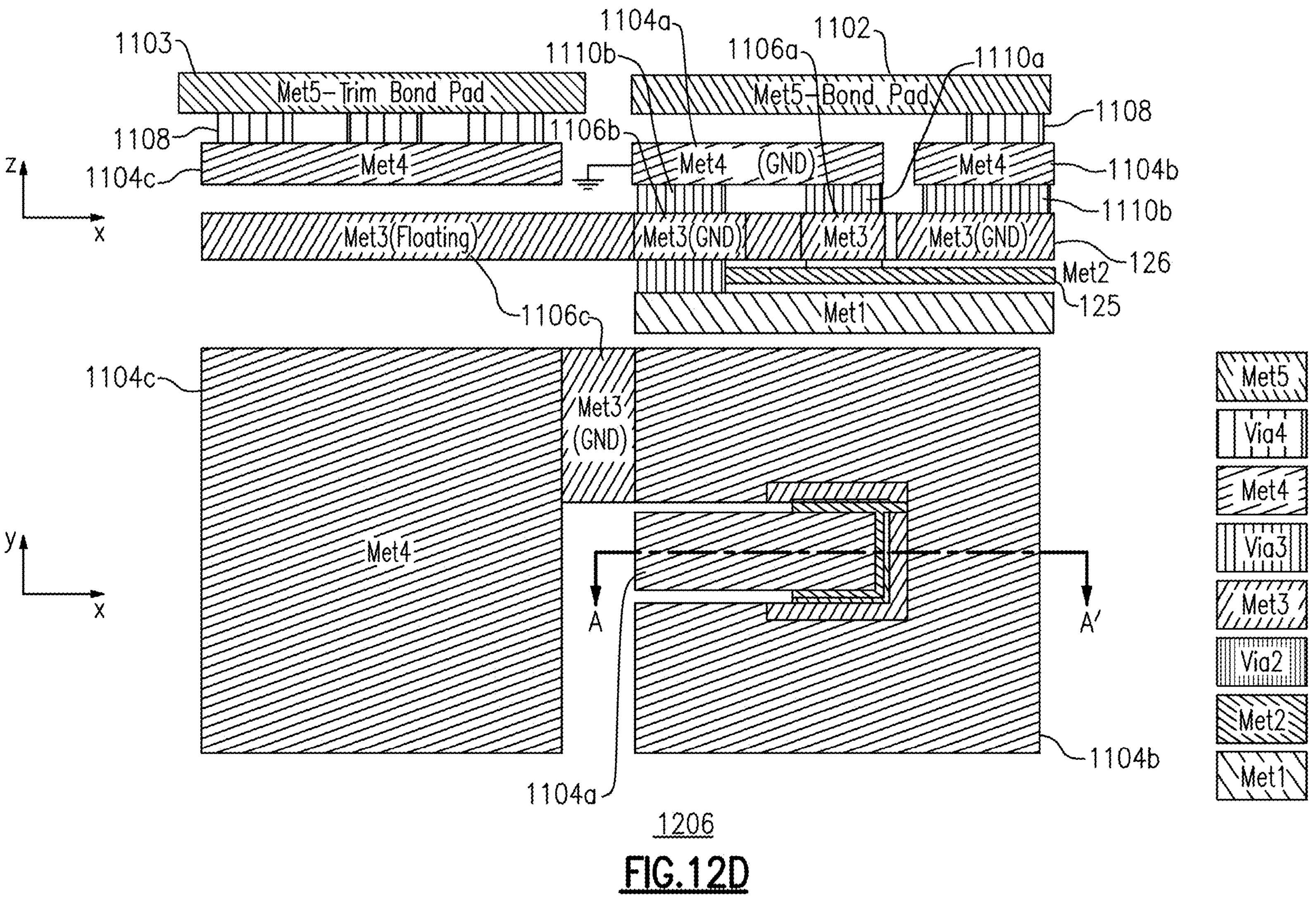
FIG. 12D is a schematic diagram illustrating an example programmable vertical spark gap device having a charge storage element to provide a controllable trigger voltage ($V_{TR}$).

The example vertical spark gap device 1206 shown in FIG. 12D comprises an electrode configuration similar to the electrode configuration described with respect to FIG. 9F. In some embodiments, the vertical spark gap device 1206 can be a programable vertical spark gap having a controllable (e.g., voltage controlled) $V_{TR}$. The vertical spark gap device 1206 may comprise one or more feature described above with respect to vertical spark gap device 1200, however the shape of the top electrode 126 can be different from that of the vertical spark gap devices 1200, 1202, and 1204. In some embodiments, the top electrode 126 of the vertical spark gap device 1206 may comprise an L-shaped to allow a third conductive region 1106*c* in the third metallization layer to be extended over the bottom electrode 125 and below the conductive region 1104*b*. In some implementations, this additional conductive region 1106*c* can be electrically floating and isolated from the other conductive regions of the third metallization layer. In some examples, the conductive region 1106*c* can be electrically isolated from top electrode 126 and conductive regions 1106*a*, 1106*b*, by a gap extending along an edge of the conductive region 1106*c* and the edges of the electrode 126 and conductive regions 1106*a*, 1106*b*. In some implementations, the vertical spark gap device 1206 may comprise a third conductive region 1104*c* within the fourth metallization layer and a second bond pad 1103 (referred to as trim bond pad) where the second bond pad 1103 is electrically connected to the conductive region 1104*c* by a plurality of vertically extended conductive vias. In some implementations the conductive region 1104*c* can be electrically isolated from other conductive regions within the fourth metallization layer (e.g., conductive regions 1104*a*, 1104*b*) and the trim bond pad 1103 can be electrically isolated from other conductive regions within the fifth metallization layer (e.g., bond pad 1102). In some implementations, a first portion of the conductive region 1106*c* (an electrically floating conductive plate) can be positioned below the conductive region 1104*c* and a second portion of the conductive region 1106*c* can be positioned between the conductive region 1104*b* and the bottom electrode 125. As such, in some implementations, the conductive region 1106*c* can be capacitively coupled to the conductive region 1104*c* and the bottom electrode 125. In some implementations, the conductive region can be a rectangular region extending from an edge of the top electrode 126 opposite to the conductive region 1104*c* to a distal edge of the conductive region 1104*c* with respect to top electrode 126. In some implementations, the capacitive coupling between conductive region 1104*c*, which is electrically connected to trim bond pad 1103, may allow storing and controlling electric charge on the conductive region 1106*c* by applying a voltage on the trim bond pad 1103. Without being limited to any theory, the $V_{TR}$ of the vertical spark gap device 1206 may be controlled by an amount of charge stored on conductive region 1106*c* (the floating conductive plate). In other words, the conductive region 1106*c* may serve as an electric charge storage element for controlling $V_{TR}$. As such in these implementations, the $V_{TR}$ of the vertical spark gap device 1206 can be tuned by tuning a voltage applied to the trim bond pad 1103.

Figure 13:
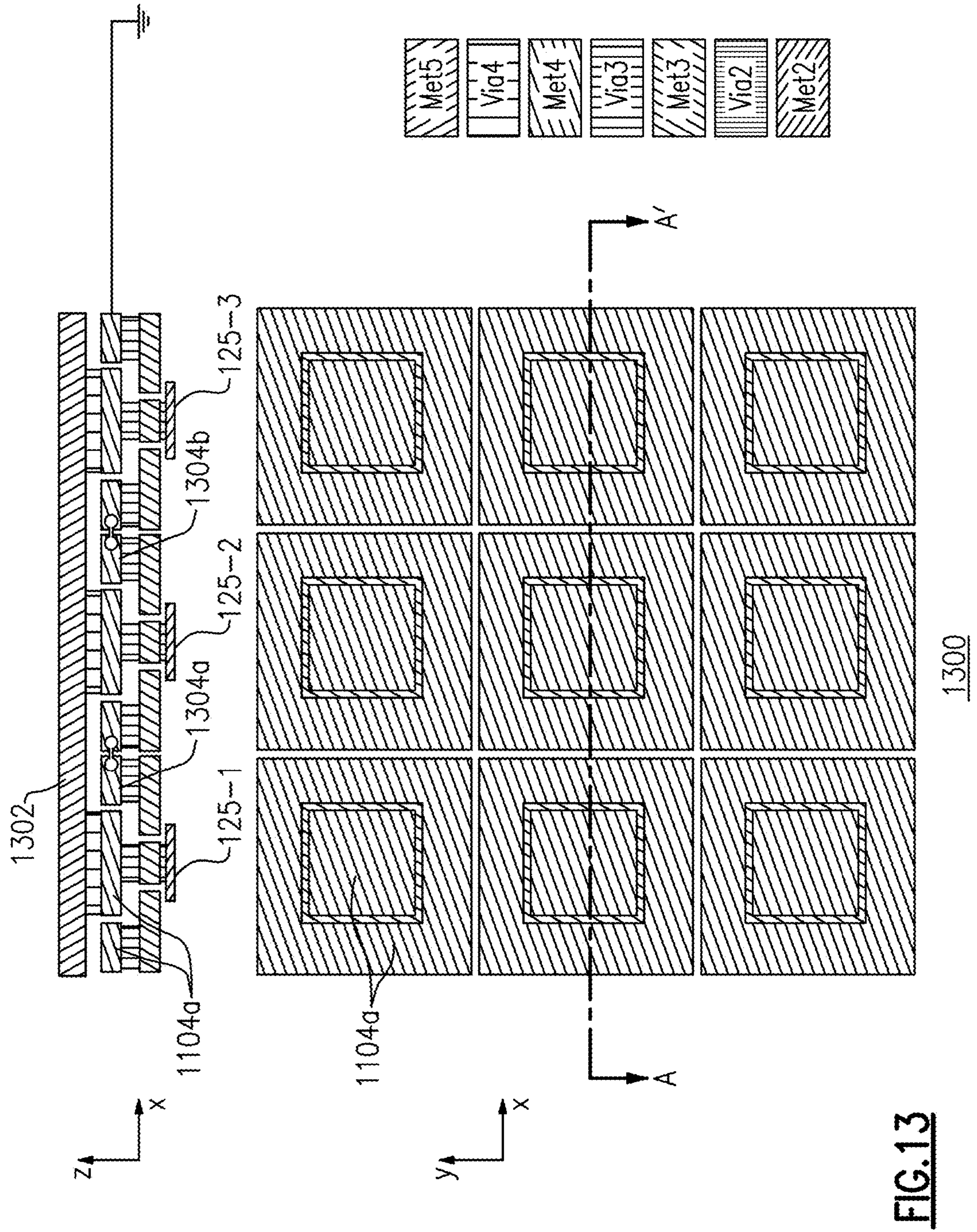
FIG. 13 is a schematic diagram illustrating an example spark gap array device formed by a plurality of vertical spark gap devices arranged as a matrix formed in a semiconductor integrated circuit having multiple levels of interconnect metallization.

As described above with respect to FIG. 1F, in some embodiments a plurality of vertical spark gap devices can be electrically connected in parallel. In some examples, the plurality of spark gap devices may comprise the vertical spark gap devices 1120, 1122, 1124, 1126, 1200, 1202, 1204, 1206, or a combination thereof. FIG. 13 is a schematic diagram illustrating an example spark gap device array 1300 formed by a plurality of vertical spark gap devices formed electrically connected in parallel and arranged as a matrix in a semiconductor integrated circuit having multiple levels of interconnect metallization. The top panel shows a vertical cross-section of the spark gap device array 1300 along AA' cut line (shown in the bottom panel) and in a plane (e.g., x-z plane) perpendicular to the major surface of the substrate on which the metallization layers are formed. In the example shown, the spark gap device array 1300 includes nine spark gap devices than each can be similar to any one of the vertical spark gap devices 1120, 1122, 1124, 1126.

In some embodiments, the plurality of spark gap devices may be formed in a metallization layer of an IC. In some implementations, the top electrodes of the plurality of spark gap devices may be electrically connected to a common bond pad 1302. In some implementations, electrical connection between each top electrode and the common bond pad 1302 pad may be provided by a plurality of conductive vias vertically extending from the top electrode to the common bond pad 1302. In some implementations, the bottom electrodes of the plurality of vertical spark gap devices can be electrically connected to a common source of voltage or electric ground. In some embodiments, the bottom electrodes, top electrodes of the plurality of vertical spark gap devices and the respective conductive regions and ILDs may be formed in common levels of the IC. For example, the bottom electrodes may be formed in a second metallization layer, the top electrodes may be formed in a third metallization layer, and the conductive regions electrically connected to the top and bottom electrodes may be formed in a fourth metallization layer. In some cases, the conductive regions formed in the fourth metallization layer may provide electrical connection between the bottom electrodes and the top electrodes, to the bond pad 1302 and the common potential, respectively.

In some examples, at least two vertical spark gap devices of the plurality of spark gap devices can have different $V_{TR}$'s. In some examples, all of the vertical spark gap devices of the plurality of spark gap devices can have substantially equal $V_{TR}$'s. In some examples, at least one of the vertical spark gap devices of the plurality of vertical spark gap device can have a $V_{TR}$ different from those of other vertical spark gap devices. In some examples, the plurality of spark gap devices can have substantially the same electrode configuration with similar different gap sizes and/or gap regions.

Figure 14:
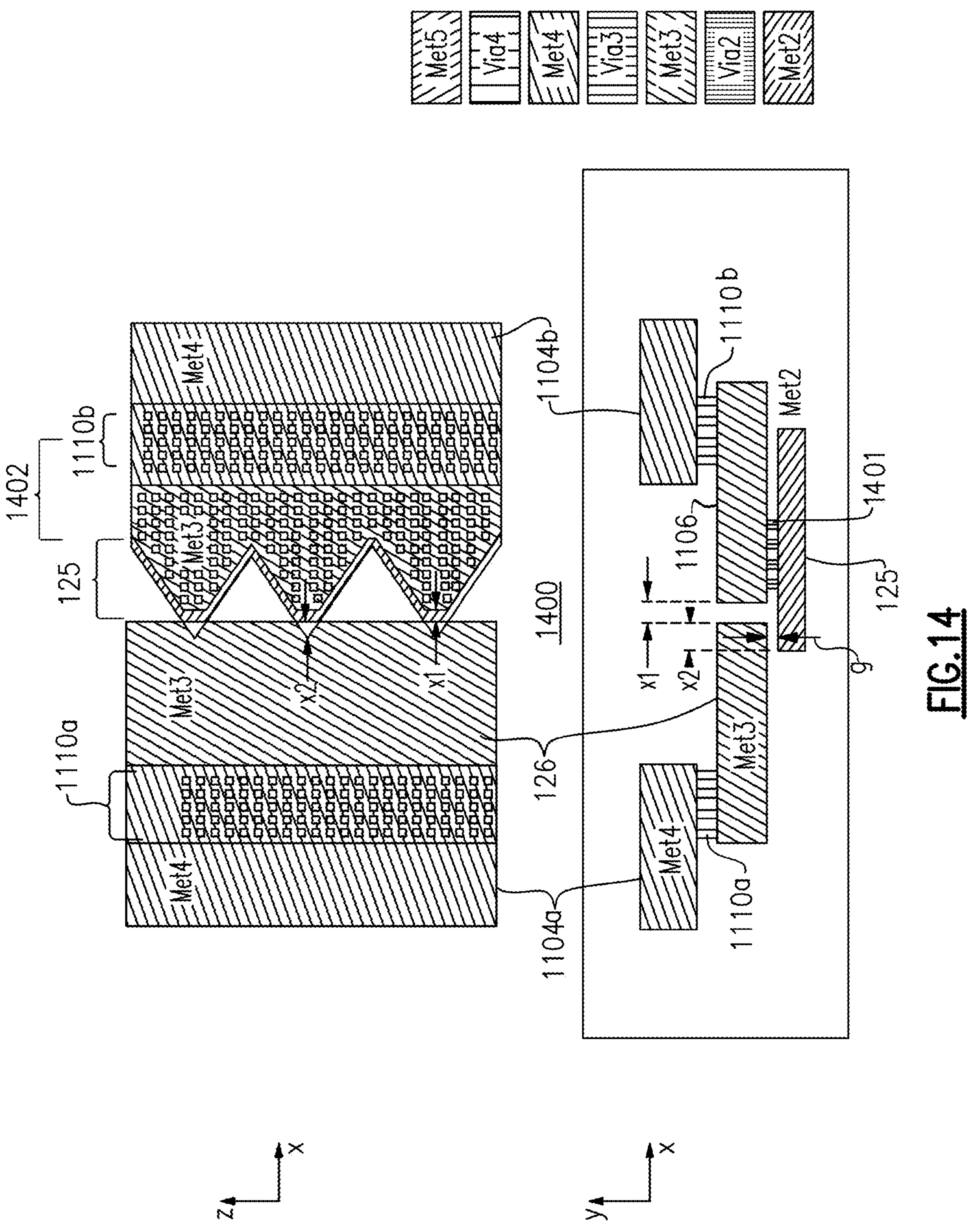
FIG. 14 is a schematic diagram illustrating an example vertical spark gap device having multiple interelectrode gap regions.

FIG. 14 is a schematic diagram illustrates another example vertical spark gap device 1400 having multiple interelectrode gap regions. The top and bottom panels schematically illustrate top and side cross-sectional views of the vertical spark gap device 1400 respectively. In some embodiments, the vertical spark gap device 1400 comprises a bottom electrode 125 and top electrode 126 formed in second and third metallization layers of an IC or semiconductor device. In some implementations, the bottom electrode 125 may comprise a plurality of electrode fingers connected to a common section 1402. In various implementations, each electrode finger can be configured to form a gap region with a portion of the top electrode 126. In some examples, the plurality of electrode fingers may have substantially ideal shapes and/or dimensions. In some examples, at least two electrode fingers of the plurality of electrode fingers may have different shapes and/or sizes. In some implementations, the plurality of electrode fingers may comprise a periodic pattern formed by equally spaced electrode fingers along the lateral direction (e.g., along y-axis). In some cases, each electrode finger can have rectangular, triangular, circular, elliptical, trapezoidal, or other shapes. In the example shown, the bottom electrode of vertical spark gap device 1400 includes three substantially identical triangular electrode fingers connected to a rectangular common section. In some cases, the top electrode 126 may comprise a rectangular shape and may be positioned in the third metallization layer, which is vertically separated from the bottom electrode 125, such that the top electrode 126 at least partially overlaps with two or more electrode fingers of the bottom electrode 125 to form a plurality of gap regions. In some cases, the plurality of gap regions may have substantially the same volume and/or shape and may be configured to spark at same potential difference. In some cases, at least two gap regions of the plurality of gap regions may have different volume and/or shape and may be configured to spark at the same or different potential differences. In some implementations, a lateral overlap ($x_2$) can be from 0.1 to 0.5 microns, from 0.5 to 1 micron, from 1 to 5 microns, from 5 to 10 microns, or any range formed by these values.

Still referring to FIG. 14, The bottom electrode 125 can be electrically connected to a conductive region 1106 formed in the third metallization layer where the conductive region 1106 is laterally separated and is electrically isolated from the top electrode 126 (also formed in the third metallization layer) by the first lateral gap ($x_1$). The electrical connection between the bottom electrode 125 and the conductive region 1106 may be provided a plurality of conductive vias 1401 formed within an interelectrode ILD layer that vertically separates the second and third metallization layers and defines the vertical gap size (g) between the bottom and top electrodes 125, 126. The conductive region 1106 can be electrically connected to the first conductive region 1104 a formed in the fourth metallization. The electrical connection between the conductive region 1106 and second conductive region 1104*b* may be provided by a second plurality of conductive vias 1110*b* formed within an ILD layer that vertically separates the third and fourth metallization layers.

Still referring to FIG. 14, the top electrode 126 can be electrically connected to a first conductive region 1104*a* formed in the fourth metallization layer where the first conductive region 1104*a* is laterally separated and is electrically isolated from the second conductive region 1104*b* formed in the fourth metallization layer. The electrical connection between the top electrode 126 and the second conductive region 1104*b* may be provided by a first plurality of conductive vias 1110*a* formed within the ILD layer that vertically separates the third and fourth metallization layers. In some implementations, each plurality of conductive vias can be arranged in a two-dimensional array.

In some implementations, the gap size (g) of the vertical spark gap devices shown in FIGS. 11A-11D (e.g., a vertical distance between a bottom surface of the top electrode 126 and a top surface of the bottom electrode can be from 0.1 to 0.4 microns, from 0.4 to 1 micron, from 1 to 5 microns, from 5 to 10 microns, from 10 to 30 microns, from 30 to 50 microns, or any range formed by these values or larger or smaller values.

In some implementations, a thickness of the top electrode 126 can be from 1 to 0.5 microns, from 0.5 to 1 micron, from 1 to 5 microns, from 5 to 10 microns, from 10 microns to 30 microns, from 30 microns to 50 microns, from 50 microns to 100 microns or any range formed by these values.

In some implementations, the thickness of bottom electrode 125 can be from 1 to 0.5 microns, from 0.5 to 1 micron, from 1 to 5 microns, from 5 to 10 microns, from 10 microns to 30 microns, from 30 microns to 50 microns, from 50 microns to 100 microns or any range formed by these values.

In some implementations, a lateral gap size between the conductive region 1106 and the top electrode 126 (e.g., the first lateral gap size) in any of the spark gap devices shown in FIGS. 11A-11D, 12A-12D, 13, and 14 can be from 0.1 to 0.5 microns, from 0.5 to 1 micron, from 1 to 5 microns, from 5 to 10 microns, or any range formed by these values.

In some implementations, the second lateral gap size between the conductive regions 1104*a* and 1104*b* in any of the spark gap devices shown in FIGS. 11A-11D, 12A-12D, 13, and 14 can be from 0.5 to 1 micron, from 1 to 10 microns, from 10 to 50 microns, from 50 to 100 microns, from 100 to 500 microns, from 500 to 1000 microns or any range formed by these values or greater values.

In some implementations, the third, and fourth lateral gap sizes between the conductive regions 1104*a* and 1104*b* in FIG. 12A can be from 0.1 to 0.5 microns, from 0.5 to 1 micron, from 1 to 5 microns, from 5 to 10 microns, or any range formed by these values.

In some implementations, the fifth lateral gap size between the top electrode 126 and the conductive region 1106*a* in FIG. 12A can be from 0.1 to 0.5 microns, from 0.5 to 1 micron, from 1 to 5 microns, from 5 to 10 microns, or any range formed by these values.

In some implementations, the sixth lateral gap size between the conductive region 1106*a* and the conductive region 1106*b* in FIG. 12A can be from 0.1 to 0.5 microns, from 0.5 to 1 micron, from 1 to 5 microns, from 5 to 10 microns, or any range formed by these values. In some embodiments, the sixth later gap size can be greater than the fifth lateral gap size by at least 1 micron, 2 microns, 3 microns, or larger values.

Spark Gaps with Ballast Resistors for High Current Capability

In addition to higher reliability and reusability, in some applications, the spark gaps configured as an EOS monitor or protection device can be configured to handle high electric current (e.g., during a short electric discharge event or a period of continues current flow through a spark gap). In some embodiments, the overall current handling capacity of such devices may be improved by dividing the current across multiple spark gaps connected in parallel (e.g., similar to the spark gaps described above with respect to FIGS. 1E, 1F and 14. However, providing multiple spark gaps may not lead to sufficiently high current handling capability under some circumstances, because the current may not necessarily flow through all of the multiple spark gaps, or through all of the multiple spark gaps in substantially equal amounts. This is because the current may flow preferentially through a path of least resistance that can include a single or a small subset the multiple spark gaps. The inventors have discovered that, in addition to providing multiple spark (or arcing) gaps formed by multiple electrode fingers, providing added series resistance with particular magnitudes across the paths of electric current flow through one or more of the spark gaps, e.g., by including series resistors between the arcing tips and the corresponding arcing voltage nodes, the EOS monitor or protection device can be induced to conduct the current through multiple spark gaps. These series resistors between the arcing tips and the corresponding arcing voltage nodes is also referred to herein as series ballast resistors. Furthermore, the series resistors can reduce the degradation such as melting or evaporation the arcing tips may undergo after arcing by providing for power dissipation across a longer resistor segment. To provide these and other advantages, various embodiments of vertical and coplanar (also referred to as lateral) spark gap devices that include series resistors, or high resistance electrodes (e.g., elongated electrodes), for improved current handling are described herein.

To realize these and other technical advantages, in some embodiments, an EOS monitor or protection device with improved current handling capacity may comprise one or more spark gaps each formed by at least two vertically separated electrodes or two coplanar electrodes, and at least one resistor disposed in series between an electrode tip and a voltage node. In some embodiments, the series resistor may comprise a portion (e.g., an elongated section) of an electrode or electrode finger between the arcing tip and a region of the electrode where an electrical contact is made with a voltage node, e.g., through one or more vias, or between the tip and a conductive region of a metallization layer electrically connected to the voltage node. In some embodiments, a resistance value of the series resistor can be tuned to have a particular value by tuning the length and/or the cross-sectional area of the elongated section of the electrode. In some other embodiments, the resistance value of the series resistor may tuned by forming the series resistor from a suitable material or a combination of materials. In various implementations at least a section of such electrode may comprise one or more resistive layers. For example, the electrode or electrode finger may be or comprise a single titanium tungsten (TiW) layer or be or comprise a bilayer, e.g., comprising a TiW layer and a silicon chromium (SiCr) layer. As another example, the electrode or electrode finger may comprise two bilayer sections connected by an elongated mono-layer section (e.g., a resistive monolayer). In some examples, the bilayer sections may include a titanium tungsten layer disposed over a silicon chromium layer and the mono-layer section may include a silicon chromium layer. In some implementations, the electrode may comprise three or more layers. In some implementations, the electrode may comprise two multilayer sections having N layers and an elongated multilayer section having M layers where N can be equal or larger than M, and both M and N can be greater than 1, 2, 3, 4, 5, or larger values.

In one embodiment, a spark gap comprises a substrate having a horizontal main surface (e.g., a dielectric layer), and a first conductive layer and a second conductive layer each extending over the substrate and substantially parallel to the horizontal main surface. The first and second conductive layers can be separated in a vertical direction crossing the horizontal main surface or be at the same vertical level. One of the first and second conductive layers can be electrically connected to a first voltage node and the other of the first and second conductive layers can be electrically connected to a second voltage node. As described herein and with respect to FIGS. 1C and 1D, when the first and second conductive layers, also referred to as first and a second electrodes, are at the same vertical level (e.g., formed within the same metallization layer), they form a coplanar or lateral spark gap (e.g., coplanar spark gap 119) and when the first and second conductive layers are vertically separated, they form a vertical spark gap (e.g., vertical spark gap 120).

As described above with respect to FIGS. 1E and 1F, in some embodiments, the first conductive layer or the first electrode may comprise a plurality of arcing tips forming a plurality of arcing gaps with the second conductive layer or the second electrode to generate two or more arcing gaps configured to arc in response to an EOS voltage signal received between the first and second voltage nodes. In some embodiments, a series resistor can be electrically connected in series between each of the arcing gaps and one or both of the first and second voltage nodes and serve as a ballast resistor. In some embodiments, the series resistors are formed as elongated portions of one of the electrodes of a spark gap device. However, embodiments are not so limited, and the series resistors can be formed as elongated portions of both electrodes of a spark gap device.

In some embodiments, a series resistor and the arcing tip may be integrally formed, e.g., through the same series of patterning processes from a common layer. However, embodiments are not so limited and in other embodiments, the series resistor and the arcing tip may be formed separately and/or from different layers.

In some embodiments, a series resistor can include a single arcing layer, through which the electric discharge current is conducted, is formed of a first material, e.g., titanium tungsten (TiW). In some other embodiments, the series resistor can include a multilayer structure, where the arcing layer is formed of a first material, and the first material is formed over a second material, e.g., silicon chromium (SiCr), for improved reusability with resistance control.

It will be appreciated that, as fabricated, different electrode pairs (or electrode finger pairs), even if nominally equivalent, can have different triggering voltages. As such, in operation, a first of the multiple electrode pairs (or electrode finger pairs) having the lowest triggering voltage electrically arcs first. As the current flowing through an arcing gap formed between an electrode pair (or electrode finger pair) increases, the voltage drop thereacross increases. The inventors have discovered that, by designing this voltage drop to be sufficiently high such that the total voltage drop across a first arcing gap formed between the first electrode pair exceeds a triggering voltage of a second arcing gap formed between a second electrode pair, the second electrode pair can be forced to trigger. Once the voltage across the first electrode pair exceeds a trigger voltage of another one of the electrode pairs, the next electrode pair having the next lowest trigger voltage triggers, causing the current to be divided between the first and the next electrode pairs. The process can continue with additional electrode pairs so long as the voltage drop developed across conducting ones of the electrode pairs exceeds the trigger voltage of an untriggered electrode pair.

Figures 15A, 15B:
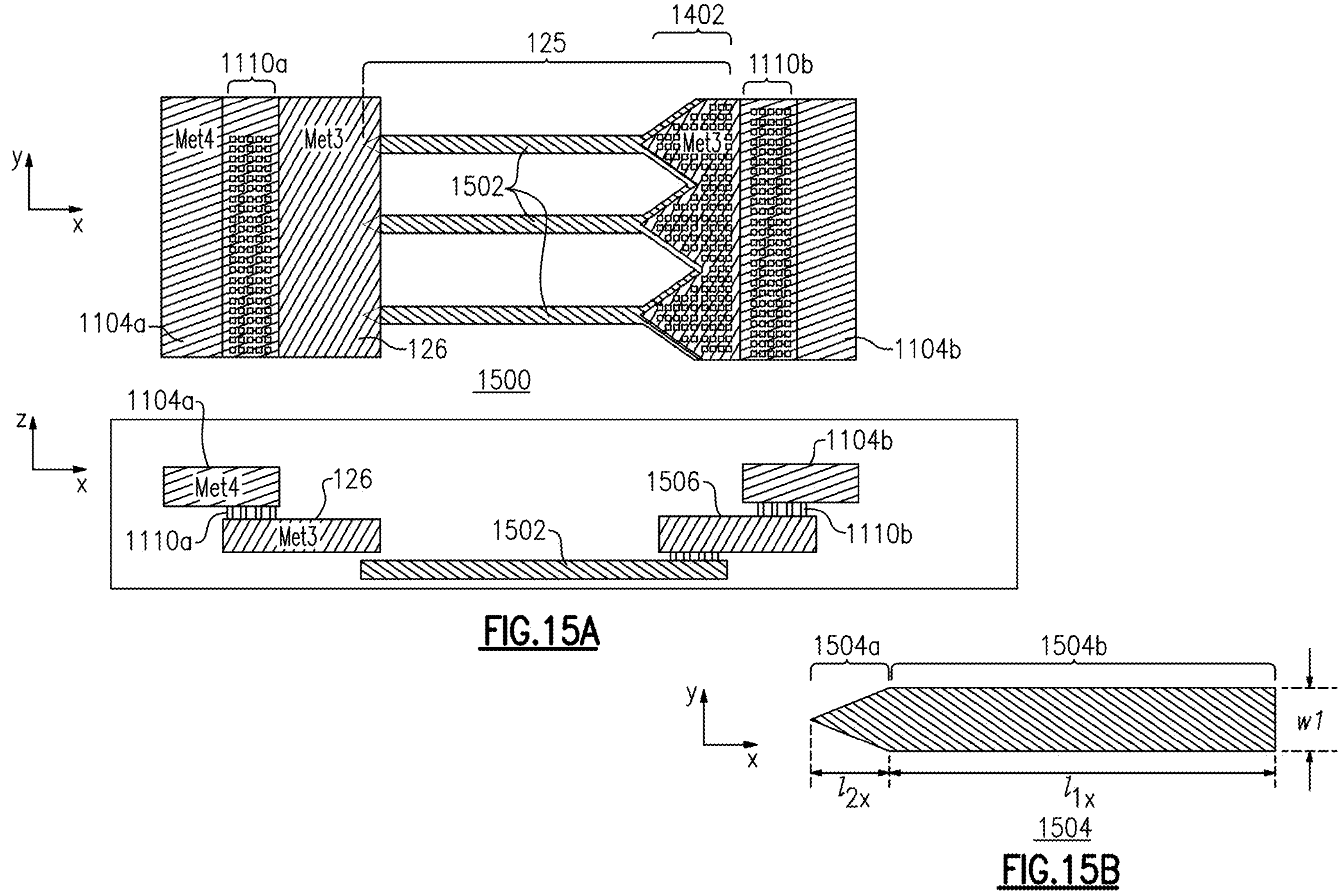
FIG. 15A is a schematic diagram illustrating a top-down view (top panel) and side cross-sectional view (bottom panel) of a vertical spark gap device having multi-gap, according to embodiments.
FIG. 15B illustrates a close-up view of an electrode finger of the plurality of electrode fingers of the vertical spark gap device shown in FIG. 15A.

In some implementations, the bottom electrode may comprise a plurality of electrode fingers, connected to a common section of the electrode finger. In some embodiments, at least a portion of an individual electrode finger of the plurality of electrode fingers may serve as a series resistor between a tip region of the electrode finger and the common section and thereby between the tip region and a voltage node electrically connected to the common section. FIG. 15A is a schematic diagram of a vertical spark gap device 1500 having multiple arcing gaps (herein referred to a multi-gap vertical spark gap device), according to embodiments. The top and bottom panels schematically illustrate top and side cross-sectional views of the vertical spark gap device 1500 respectively. In some embodiments, the vertical spark gap device 1500 comprises a bottom electrode 125 and a top electrode 126 formed in second and third metallization layers or levels of an IC or semiconductor device, respectively. The top electrode 126 is in turn connected to a fourth metallization layer or level of the IC or semiconductor device. It will be appreciated that, while embodiments are not so limited, a higher-level metallization can generally be formed of wider and/or thicker metallization features relative to a lower-level metallization. As such, in the illustrated embodiment, the bottom electrode 125 can be thinner than the top electrode 126.

In some embodiments, the spark gap device 1500 may comprise one or more features described above with respect to vertical spark gap device 1400; however, the bottom electrode 125 of the vertical spark gap device 1500, serving as the first arcing electrode layer electrically connected to a first voltage node, comprises a plurality of elongated electrode fingers 1502, serving as series resistors, extending from an end region connected to a common section below the conductive region 1506 to an arcing tip below the top electrode 126, serving as the second electrode layer electrically connected to a second voltage node. An individual elongated electrode finger may extend in a longitudinal direction (e.g., parallel to x-axis) from the common section. An individual elongated electrode finger may be laterally separated from one or two immediately adjacent elongated electrode fingers. In some implementations, the plurality of elongated electrode fingers 1502 may be equally spaced to form a periodic array in a lateral direction (e.g., parallel to the y-axis). In some examples, a lateral spacing between two consecutive electrode fingers of such periodic array can be from 0.5 to 1 microns, from 1 to 5 micron, from 5 to 10 microns, from 10 to 15 microns, or any ranges formed by these values or larger or smaller values.

In various implementations, the plurality of electrode fingers 1502 may have substantially identical geometries (e.g., shapes and dimensions). In some other implementations, at least one of the electrode fingers may have a different shape and/or dimensions compared to other electrode fingers of the same electrode. FIG. 15B illustrates a closeup view of an electrode finger 1504 of the plurality of electrode fingers 1502. The electrode finger 1504 includes an elongated section 1504*b* and an arcing tip or tip section 1504*a*, where the elongated section 1504*b* is longitudinally extended from an end region to the tip section 1504*a*. In the example shown, the elongated section 1504*b* has a rectangular shape having a length $l_{1x}$ and a width ($w_1$), and the tip section 1504*a* has a triangular (or tapered) shape having a length $l_{2x}$ and a width that is longitudinally tapered from a first width substantially equal to the width ($w_1$) of the elongated section 1504*b* to a second width. In some examples, the second width can be smaller than the first width by a factor of 2, 5, 10, 100, 1000, or large values. In various implementations, the tip section 1504*a* can have other shapes. In some implementations, the elongated section 1504*b* serves as a series resistor (also referred to as a ballast resistor) between the tip section 1504*a* and the end region of the elongated section 1504*b* that is electrically connected to a voltage node via a common section 1402 of the bottom electrode and one or more conductive regions within the metallization layers above the electrode. The common section 1402 can be designed for high current capability and to reduce current crowding at the junctions with the electrode fingers. In the illustrated embodiment, the common section of the bottom electrode 125 comprises a contacting portion for contacting the bottom electrode layer 125 to an upper metallization layer using a plurality of vias. The common section may further comprise a plurality of tapered (or bevel) portions narrowing to the elongated sections 1504*b* of the ballast resistors. Resistance of the elongated section 1504*b* can be proportional to its length $l_{1x}$. In some examples, the material composition of the elongated section 1504*b* may be configured to provide a desired or target ballast resistance for a given $l_{1x}$. In some other examples, for a given material composition, the length, $l_{1x}$, of the elongated section 1504*b* may be configured to provide a desired or target ballast resistance. In yet other examples, the material composition and the length, $l_{1x}$, of the elongated section 1504*b* may be configured to provide a desired or target ballast resistance. In some examples, $l_{1x}$ can be from 5 to 10 microns, from 10 to 20 microns, from 20 to 50 microns, from 50 to 100 microns, from 100 to 200 microns or any ranges formed by these values or larger values, $l_{2x}$ and $w_1$ can be from 1 to 5 microns, from 5 to 10 microns or any ranges formed by these values or larger or smaller values. In some examples, the series resistance provided by the elongated section of the electrode finger 1504 can be from 50 to 100 ohms, from 100 to 300 ohms, from 300 to 600 ohms, from 600 to 800 ohms, from 800 to 1000 ohms or any ranges formed by these values or larger or smaller values.

In some implementations, when the individual electrode fingers of the plurality of electrode fingers 1502 are configured to have a ballast resistance substantially equal to a target resistance, the plurality of electrode fingers 1502 may discharge (or spark) substantially at the same time (or in parallel), or within a collective sparking period. Additionally, the ballast resistance provided by the elongated section 1504*b* of the individual electrode fingers may reduce damage or degradation of the tip section 1054*a* after each electric discharge (or sparking) event. In some examples, when a first electrode finger sparks, the voltage drop across the ballast resistor allows the voltage along another electrode finger to exceed $V_{TR}$ and this process can continue until all the fingers spark within a collective sparking period. In some embodiments, as the voltage difference between the top and bottom electrodes exceeds the $V_{TR}$ for one of the arcing gap, the arcing gap sparks and up on further increasing the voltage difference more arcing gaps spark resulting a in near exponential current-voltage relation.

According to various embodiments, the series resistor has an electrical resistance that is substantially higher than an electrical resistance of the common section 1402, the top electrode 126 and the conductive regions 1506, 1104*a*, 1104*b*, individually or in combination. According to embodiments, the series resistor has an electrical resistance that is substantially higher than an electrical resistance of each of a path between each of the arcing electrodes and the respective one of the first and second voltage nodes. According to various embodiments, the series resistor comprises an elongated line portion having a length-to-width ratio exceeding 2, 5, 10, 20, 30, 40, 50, or a value in a rage defined by any of these values.

Figure 16:
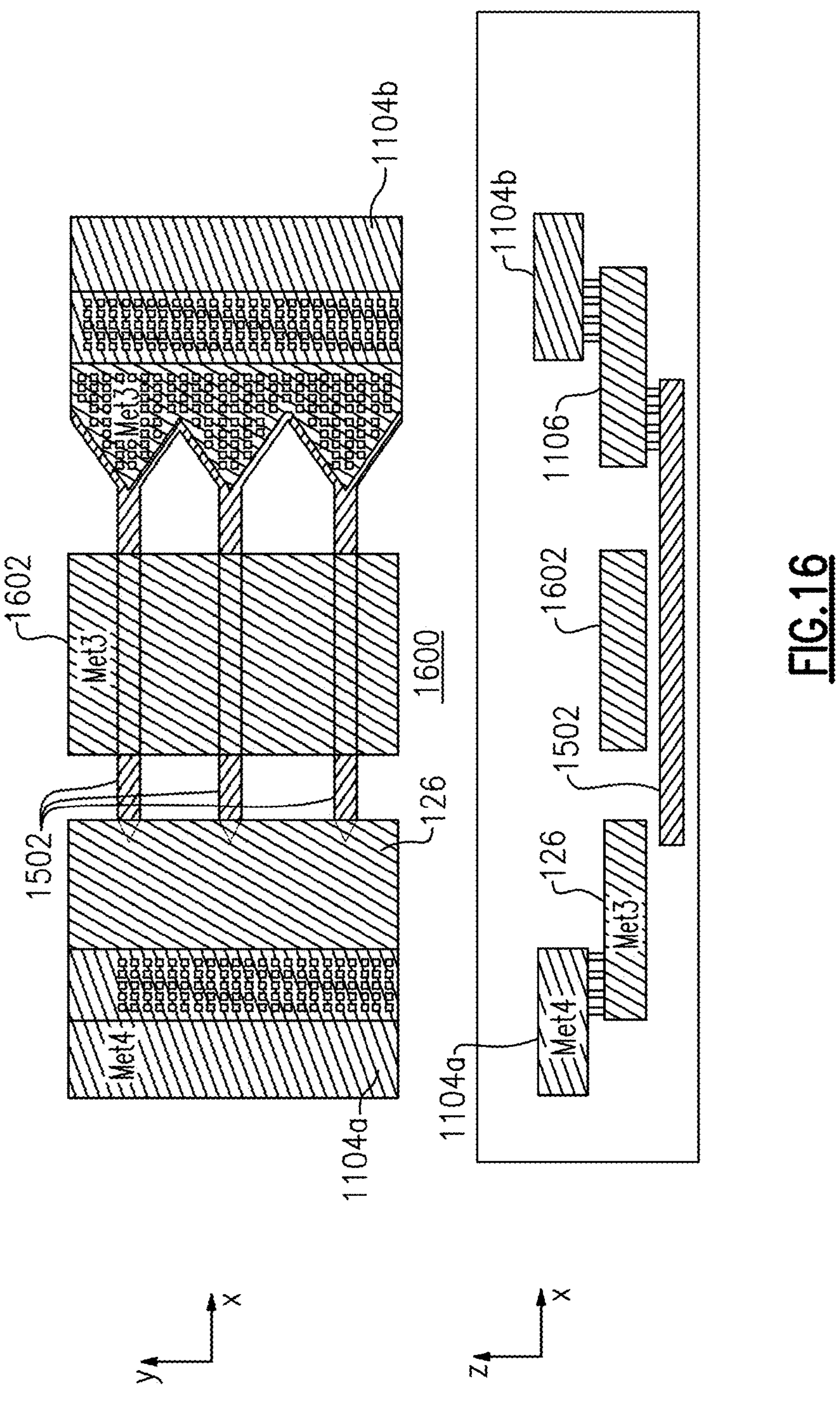
FIG. 16 is a schematic diagram of a vertical spark gap device comprising a plurality of electrode fingers and an electrically floating metal plate formed above the electrode fingers.

FIG. 16 is a schematic diagram of a vertical spark gap device 1600 comprising a plurality of electrode fingers and a metal plate (e.g., an electrically floating metal plate) formed above the electrode fingers. The top and bottom panels schematically illustrate top and side cross-sectional views of the vertical spark gap device 1600 respectively. The vertical spark gap device 1600 may comprise one or more features described above with respect to vertical spark gap device 1500. In one embodiment, the vertical spark gap device 1600 may include a conductive plate 1602 formed within the third metallization layer over the elongated sections of the plurality of electrode fingers 1502. In some implementations, the conductive plate 1602 can be electrically isolated from the voltage nodes connected to the plurality of electrode fingers, electric ground, or any other voltage node or source, such that it is electrically floating. In some cases, the electrical isolation of the conductive plate 1602 may be provided by ILDs and the insulating portion of the third metallization layer. In various implementations, the conductive plate 1602 may comprise the same or different conductive material compared to other conductive regions (e.g., top electrode 126) formed in the third metallization layer. In some embodiments, the conductive plate 1602 may serve as a protective shield configured to prevent formation of a parasitic (or unwanted) electrical discharge between the elongated section of an electrode finger of the plurality of electrode fingers 1502 and a region (e.g., conductive region) a layer above and/or below the second metallization layer within which the bottom electrode 125 is formed (e.g., between an electrode finger and a top surface of the device or between an electrode finger and a substrate over which the device is formed). In some embodiments, the conductive plate 1602 may electrically couple the plurality of electrode fingers 1502 and facilitate formation of collective sparking of at least a subset of spark gaps formed between the top electrode 126 and the bottom electrode 125, e.g., within a collective sparking period or as a voltage difference between the two electrodes increases. In some examples, the conductive plate 1602 may capacitively couple the individual electrode fingers. In some examples, application of a high voltage on a voltage node may cause one of the electrode fingers to arc to the conductive plate 1602 (which can be electrically floating) and thereby trigger one more of other electrode fingers to discharge via their respective arcing tips (e.g., by applying a bias on the one more of other electrode fingers).

Figures 17A, 17B, 17C:
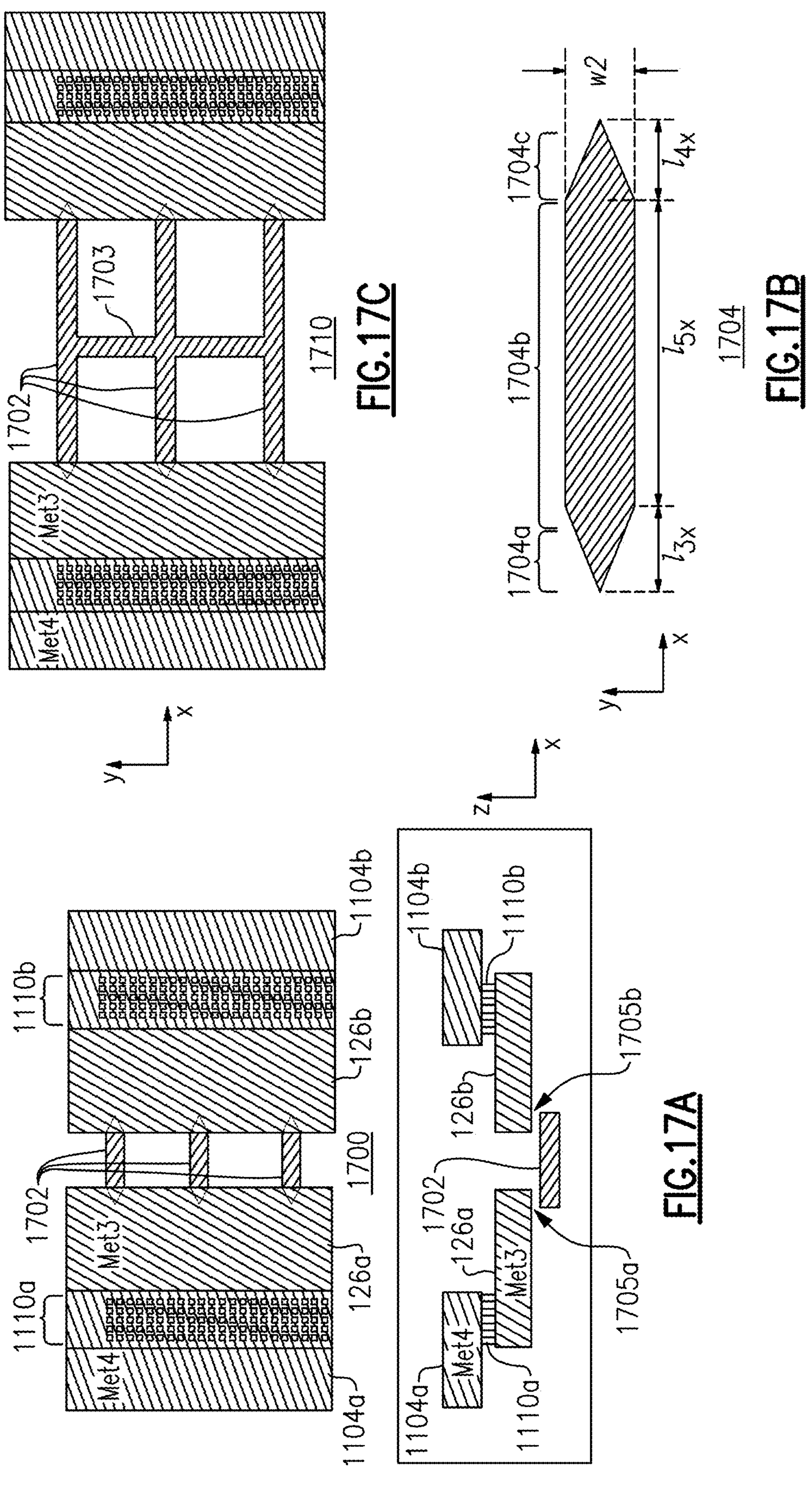
FIG. 17A is a schematic diagram of an example multi-gap vertical spark gap device having double-sided electrodes, according to embodiments.
FIG. 17B illustrates a close-up view of a double-sided electrode of the plurality of double-sided electrodes of the vertical spark gap device shown in FIG. 17A.
FIG. 17C is a schematic diagram of an example multi-gap vertical spark gap device having electrically connected double-sided electrodes, according to embodiments.

In some embodiments, a vertical spark gap device may include two top electrodes and one or more double-sided bottom electrodes each forming one vertical spark gap with one of the two top electrodes. FIG. 17A is a schematic diagram of another example of such multi-gap vertical spark gap device, according to embodiments. The top and bottom panels schematically illustrate top and side cross-sectional views of the vertical spark gap device 1700 respectively. The multi-gap vertical spark gap device 1700 may comprise one or more features described above with respect to vertical spark gap device 1500 and vertical spark gap device 1600.

In some embodiments, the multi-gap vertical spark gap device 1700 comprises two longitudinally separated top electrodes 126*a*, 126*b* and a plurality of double-sided bottom electrodes 1702 each longitudinally extended between the two top electrodes 126*a*, 126*b* forming first and second plurality of arcing gaps with the first top electrode 126*a* and second top electrode 126*b*, respectively. In some implementations, the double-sided bottom electrodes 1702 can be formed in the second metallization layer and the first and second tope electrodes 126*a*, 126*b*, can be formed in a third metallization layer above the second metallization layer of an IC or semiconductor device. In some implementations, each double-sided bottom electrode may comprise two sparking tips (or tip sections) each positioned below one of the first or second top electrodes 126*a*, 126*b*, forming two arcing gaps where each arcing gap comprises an overlap region between a sparking tip and the respective top electrode. In the example shown, the spark gap device includes three double-sided bottom electrodes 1702 and three pairs of arcing gaps each formed by one of the double-sided bottom electrodes 1702. In some examples, the pair of arcing gaps formed by a double-sided bottom electrode can be different or substantially identical. In some examples, a first pair of arcing gaps formed by a first double-sided bottom electrode can be different or substantially identical to a second pair of arcing gaps formed by a second double-sided bottom electrode. In some embodiments, each double-sided electrode may comprise a ballast resistor (a series resistor) disposed between two arcing tips. In some such embodiments, the ballast resistor may comprise an elongated portion the double-sided electrode extending between the two arcing tips. In various implementations, the plurality of double-sided electrodes 1702 may have substantially identical geometries (e.g., shapes and dimensions). In some other implementations, at least one of the double-sided electrodes may have a different shape and/or dimension compared to other double-sided electrodes. In some implementations, the plurality of the double-sided electrodes 1702 can be electrically floating. In some implementations, the plurality of the double-sided electrodes 1702 can be extended in a longitudinal direction (e.g., parallel to x-axis) and laterally separated from each other (e.g. along a direction parallel to y-axis). In some such implementations, the double-sided electrodes 1702 can be periodically arranged along the lateral direction such that the lateral separation between immediately adjacent electrodes are substantially equal. In some examples, a lateral spacing between two consecutive electrode figures of such periodic array can be from 1 to 5 microns, from 5 to 10 microns, from 10 to 20 microns, or any ranges formed by these values.

FIG. 17B illustrates a closeup view of a double-sided bottom electrode 1704 of the plurality of double-sided electrodes 1702. The double-sided electrode 1704 includes two arcing tips or tip sections 1704*a*, 1704*c*, and an elongated section 1704*b* longitudinally extended from a first tip section 1704*a* to a second tip section 1704*c*. In the example shown, the elongated section 1704*b* has a rectangular shape having a length $l_{5x}$ and a width $w_2$, and first and second tip sections 1704*a*, 1704*c* each comprising a triangular (or tapered) shape having a lengths $l_{3x}$ and $l_{4x}$, respectively. First and second tip sections 1704*a*, 1704*c* each can have a width that is longitudinally tapered from a first width substantially equal to the width ($w_2$) of the elongated section 1704*b* to a second width. In some examples, the second width can be smaller than the first width by a factor of 2, 5, 10, 100, 1000, or large values. In various implementations, the tip sections 1704*a*, 1704*c*, can have other shapes. In some implementations, the two tip sections 1704*a*, 1704*c*, can be substantially identical or have different shapes/and or lengths. In some examples, $l_{5x}$ can be from 5 to 10 microns, from 10 to 20 microns, from 20 to 50 microns, from 50 to 100 microns, from 100 to 200 microns or any ranges formed by these values or larger values, $l_{3x}$, $l_{2x}$ and $w_2$ can be from 1 to 5 microns, from 5 to 10 microns or any ranges formed by these values or larger or smaller values. In some examples, the series resistance provided by the elongated section of the double-sided electrode 1704 can be from 50 to 100 ohms, from 100 to 300 ohms, from 300 to 600 ohms, from 600 to 800 ohms, from 800 to 1000 ohms or any ranges formed by these values or larger or smaller values.

In some implementations, the elongated section 1704*b* serves as a ballast resistance between the two tip sections 1704*a*, 1704*c* limiting the discharge current following through the arcing gaps formed by the first and second tip sections (arcing tips) 1704*a*, 1704*c*. The resistance of the elongated section 1704*b* can be proportional to $l_{5x}$. In some examples, the material composition of the elongated section 1704*b* may be configured to provide a desired or target ballast resistance for a given $l_{5x}$. In some other examples, for a given material composition, the length, $l_{5x}$, of the elongated section 1704*b* may be configured to provide a desired or target ballast resistance. In yet other examples, the material composition and the length, $l_{5x}$, of the elongated section 1704*b* may be configured to provide a desired or target ballast resistance. In some implementations, when the individual double-sided electrodes of the plurality of double-sided electrodes 1702 are configured to have a ballast resistance substantially equal to a target resistance, the plurality of double-sided electrodes 1702 may discharge (or spark) substantially at the same time (or in parallel), or within a collective sparking period.

In various implementations, the double-sided bottom electrode 1704 may be positioned with respect to first and second top electrodes 126*a*, 126*b* such that a first overlapping area formed between the first tip section 1704*a* and the first top electrode 126*a* is substantially equal to the overlapping area formed between the second tip section 1704*c* and the second top electrode 126*b*. Advantageously such symmetric positioning of the double-sided bottom electrode 1704 with respect to first and second top electrodes 126*a*, 126*b* may result in substantially equal $V_{TR}$'s for the spark gaps formed by first and second tip sections 1704*a*, 1704*c*.

In some embodiments, the first top electrode 126*a* may be connected to a first voltage node, e.g., via a first plurality of conductive vias 1110*a* and a first conductive region 1104*a* in a third metallization layer and the second top electrode 126*b* may be connected to a second voltage node, e.g., via a second plurality of conductive vias 1110*b* and a second conductive region 1104*b* in the third metallization layer. When a voltage difference between the first and second voltage nodes exceeds a threshold value, one or more double-sided electrodes 1702 can be triggered each providing a discharge current path between the first and second voltage nodes via the respective pair of arcing gaps. In some embodiments, when the double-sided electrodes 1702 are positioned symmetrically with respect to the first and second electrodes the arcing gaps formed between the double-sided electrodes 1702 and the first top electrode 126*b* can have substantially the same $V_{TR}$'s as the arcing gaps formed between the double-sided electrodes 1702 and the second top electrode 126*a*. In some such embodiments, the threshold voltage at which the spark gaps of the vertical spark gap device 1700 are triggered (e.g., near collectively triggered) can be independent of the polarity of a voltage difference applied between the first and second voltage nodes.

FIG. 17C is a schematic diagram of another example of a multi-gap vertical spark gap device 1710 having two top electrodes 126*a*, 126*b* and a plurality of double-sided electrodes 1702, according to embodiments. The vertical spark gap device 1710 may comprise one or more features described above with respect to vertical spark gap device 1700. In some implementations, the plurality of double-sided electrodes 1702 can be electrically connected to have the same floating electric potential. In some implementations, the double-sided electrodes 1702, which are formed in the same metallization layer (e.g., the second metallization layer) can be electrically connected by a conductive region formed in the same metallization layer. For example, the double-sided electrodes 1702, can be electrically connected by a conductive line or conductive trace 1703 extending in the lateral direction (e.g., parallel to y-axis). In some examples, the conductive line 1703 may comprise the same or different material composition and layers as the double-sided electrodes 1702.

Figure 17D:
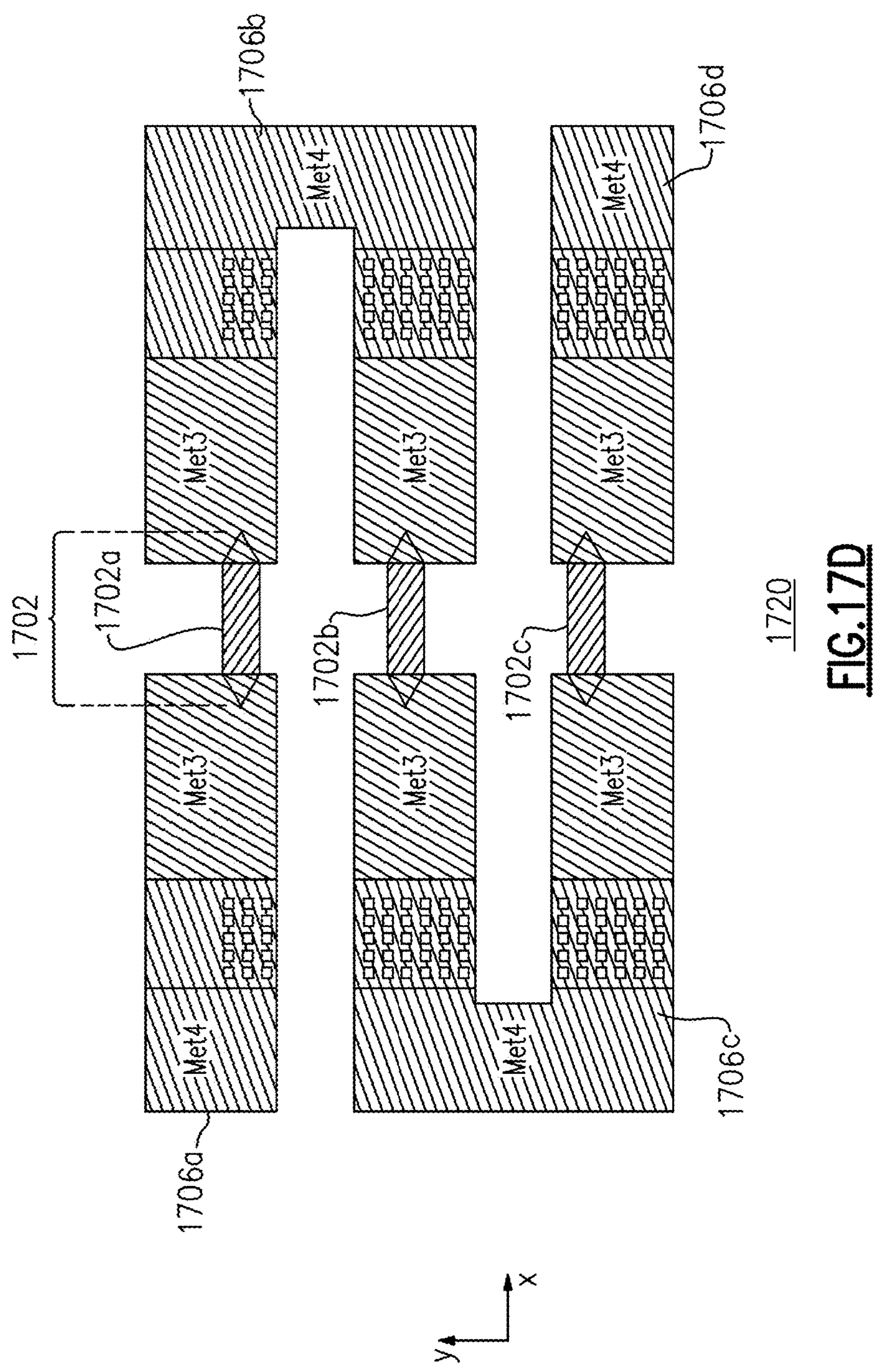
FIG. 17D is a schematic diagram of an example multi-gap vertical spark gap device having a segmented top electrode and a plurality of double-sided bottom electrodes, according to embodiments.

FIG. 17D is a schematic diagram of an example of a multi-gap vertical spark gap device 1720 having a segmented top electrode and a plurality of double-sided bottom electrodes 1702, according to embodiments. In some embodiments, the plurality of bottom electrodes 1702 and the top electrode segments 1706*a*, 1706*b*, 1706*c*, 1706*d* are serially arranged such that a double-sided bottom electrode is disposed between two segments. In the example shown, a first double-sided bottom electrode 1702*a* is disposed between a first top electrode segment 1706*a* and a second top electrode segment 1706*b*, a second double-sided bottom electrode 1702*b* is disposed between a second top electrode segment 1706*b* and a third top electrode segment 1706*c*, and a third double-sided bottom electrode 1702*c* is disposed between the third top electrode segment 1706*c* and a fourth top electrode segment 1706*d*. In some implementations, the second double-sided bottom electrodes 1702*a*, 1702*b*, 1702*c* can be substantially similar to double-sided bottom electrode 1704 described above with respect to FIG. 17B. In some implementation, one or more of the top electrode segments can be configured to allow formation of two groups of vertical arcing gaps substantially along a lateral direction by longitudinally extended and laterally separated double-sided bottom electrodes. With continued reference to FIG. 17D, the top electrode segments 1706*a*, 1706*b*, 1706*c*, 1706*d* of the multi-gap vertical spark gap device 1720 includes two straight top electrode segments 1706*a*, 1706*d*, and two U-shaped top electrode segments 1706*b*, 1706*c*. These segments 1706*a*, 1706*b*, 1706*c*, 1706*d* are positioned to form two groups of arcing gaps with tip sections of three double-sided bottom electrodes 1702*a*, 1702*b*, 1702*c*. Each group of arcing gaps is laterally extended at a different longitudinal position and the two groups of arcing gaps comprise opposite tip sections of the double-sided bottom electrodes 1702*a*, 1702*b*, 1702*c*. In some embodiments, each double-sided bottom electrode may comprise a ballas resistance. For example, the elongated portion of each double-sided bottom may be configured to provide a desired series resistance between the corresponding tip sections. In various implementations, the double-sided bottom electrodes 1702*a*, 1702*b* and 1702*c* may comprise one or more features described above with respect to the double sided electrode 1704.

Figures 18A, 18B:
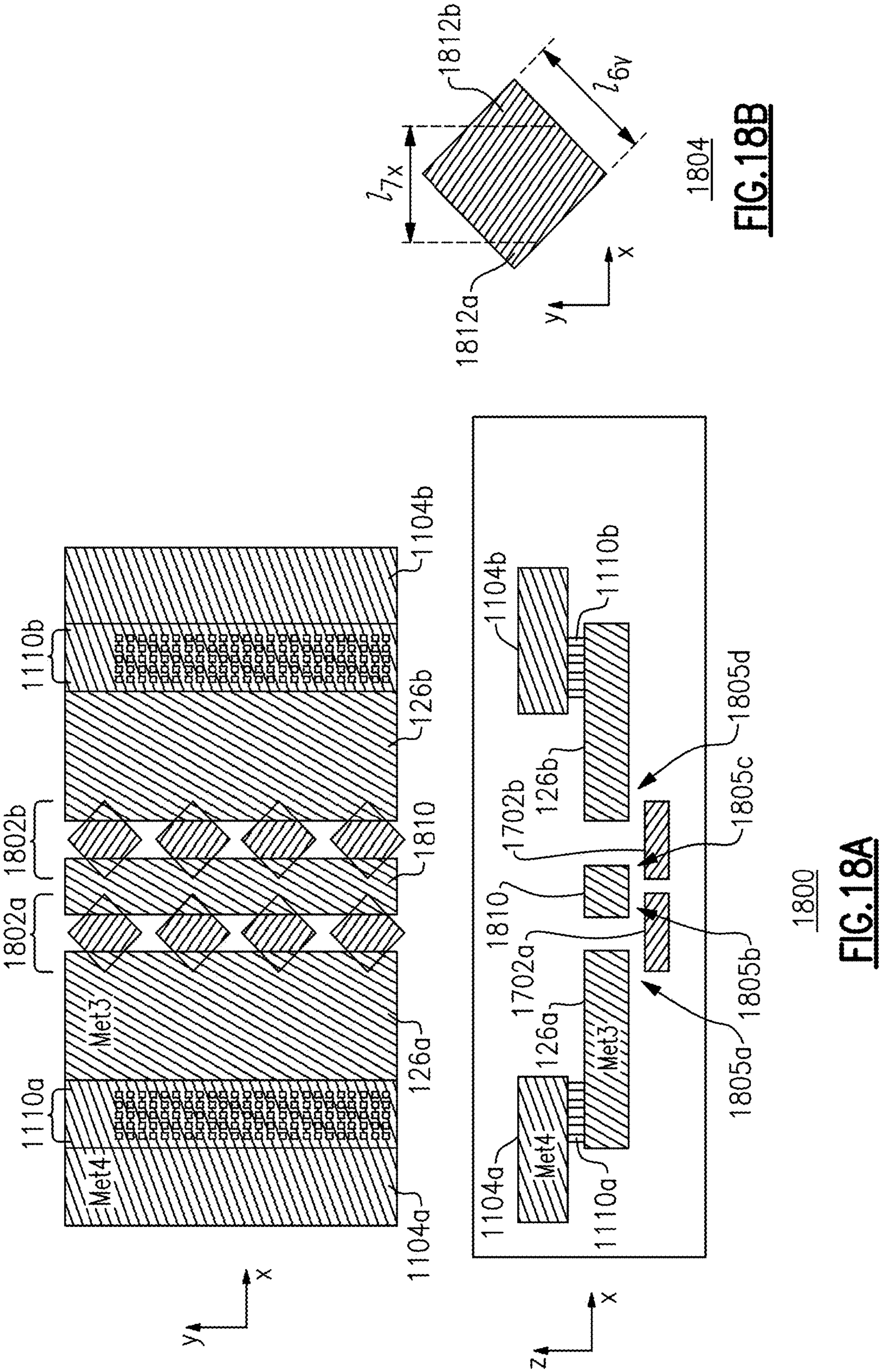
FIG. 18A is a schematic diagram of a multi-gap vertical spark gap device 1800 having two top electrodes, two groups of double-sided bottom electrodes 1802*a*, 1802*b*, and a floating conductive plate 1810.
FIG. 18B illustrates a close-up view of an individual double-sided electrode of the multi-gap vertical spark gap device shown in FIG. 18A.

FIG. 18A is a schematic diagram of a multi-gap vertical spark gap device 1800 having two top electrodes 126*a*, 126*b*, two groups of double-sided bottom electrodes 1802*a*, 1802*b*, and a floating conductive plate 1810. The top and bottom panels schematically illustrate top and side cross-sectional views of the vertical spark gap device 1800 respectively. The vertical spark gap device 1800 may comprise one or more features described above with respect to vertical spark gap device 1700.

In some embodiments, a first group of laterally spaced double-sided bottom electrodes 1802*a* may form a first group of arcing gaps with a first top electrode 126*a* and a second group of arcing gaps with the electrically floating plate 1810, and a second group of laterally spaced double-sided bottom electrodes 1802*b* may form a third group of arcing gaps with the floating plate 1810 and a fourth group of arcing gaps with a second top electrode 126*b*. In some embodiments, the first and second groups of the double-sided bottom electrodes 1802*a*, 1802*b* may be formed in a second metallization layer, and the first top electrode 126*a*, the second top electrode 126*b*, and the floating plate 1810 may be formed in a third metallization layer above the second metallization layer.

In some implementations, a first double-sided electrode of the first group of double-sided electrodes 1802*a* may be positioned between the first top electrode 126*a* and the floating plate 1810 forming a first vertical arcing gap 1805*a* with the first top electrode 126*a* and a second arcing gap 1805*b* with the floating plate 1810 and a second double-sided electrode of the second group of double-sided electrodes 1802*b* may be positioned between the floating plate 1810 and the second top electrode 126*b* forming a third vertical arcing gap 1805*c* with the floating plate 1810 and a second arcing gap 1805*d* with the second top electrode 126*b*. In some implementations, the first and second double-sided electrodes having identical geometries can be symmetrically positioned between the first top electrode 126*a*, the floating plate 1810 and the second top electrode 126*b* such that the first, second, third, and fourth arcing gaps 1805*a*, 1805*b*, 1805*c*, 1805*d* are substantially identical, e.g., have the same overlapping areas and regions. In some implementations, the first and second double-sided electrodes may have substantially identical lateral positions (e.g., parallel to y-axis) with respect to the floating plate 1810. In some implementations, the first and second double-sided electrodes may have substantially identical lateral positions (e.g., parallel to y-axis) with respect to the floating plate 1810.

In some embodiments the first top electrode 126*a* may be connected to a first voltage node, e.g., via a first plurality of conductive vias 1110*a* and a first conductive region 1104*a* in a third metallization layer and the second top electrode 126*b* may be connected to a second voltage node, e.g., via a second plurality of conductive vias 1110*b* and a second conductive region 1104*b* in the third metallization layer. When a potential difference between the first and second voltage nodes exceeds a threshold value, a pair of double-sided electrodes each from one of the first or second groups of double-sided electrodes 1802*a*, 1802*b*, and having substantially equal lateral positions, may be triggered together (e.g., at about the same time) providing a discharge current path (a path of least resistance) between the first and second voltage nodes via the respective pair of arcing gaps.

In some implementations, a double-sided electrode of the first or second group of double-sided electrodes 1802*a*, 1802*b*, may comprise a ballast resistance between the two arcing gaps formed by the double-sided electrode. In some examples, a middle portion or section of a double-sided electrode may comprise the ballast resistance. Advantageously, in such implementations, when a potential difference between the first and second voltage nodes exceeds a threshold value, a plurality of such electrode pairs may be triggered together (e.g., at about the same time) providing a plurality of discharge current paths (a path of least resistance) between the first and second voltage nodes via the respective pair of arcing gaps.

In some implementations, the first group of double-sided bottom electrodes 1802*a* may comprise substantially identical double-sided electrodes. In some implementations, the second group of double-sided bottom electrodes 1802*b* may comprise substantially identical double-sided electrodes. In some implementations, the first and second groups 126*a*, 126*b*, of double-sided bottom electrodes 1802*b* may comprise substantially identical double-sided electrodes.

In some implementations, at least one double-sided electrode in the first group of double-sided bottom electrodes 1802*a* may have a shape and/or dimension different from those of the other double-sided electrodes in the first group of double-sided bottom electrodes 1802*a*. In some implementations, at least one of the double-sided electrodes in second group of double-sided bottom electrodes 1802*b* may have a shape and/or dimension different from those of the other double-sided electrodes in the second group of double-sided bottom electrodes 1802*b*.

FIG. 18B illustrates a closeup view of an individual double-sided electrode 1804 of the multi-gap vertical spark gap device 1800. The double-sided electrode 1804 may comprise a quadrilateral shape having two tip sections 1812*a*, 1812*b* near two opposite vertices. Each tip section can have a triangular shape and comprise an overlapping area between the double-sided electrode 1804 and first top electrode 126*a*, second top electrode 126*b* or floating plate 1810. In various implementations, the areas of the two tip sections can substantially equal or different. In various implementations, the areas of the two tip sections can be adjusted by laterally moving the double-sided electrode 1804 under a top electrode and the floating plate 1810.

In some implementations, the areas of tip sections positioned under the same top electrode or under the floating plate 1810 can be substantially equal. In some implementations, the areas of tip sections positioned under a top electrode or under the floating plate 1810 can be substantially equal.

A middle section of the electrode 1804 extended between the two tip sections 1812*a*, 1812*b* may comprise a ballast resistor. A value of the ballast resistor may be tailored by adjusting a side ($l_{6x}$) of the electrode 1804 and/or to length of the middle section ($l_{7x}$). The length ($l_{8x}$) of the middle section is equal to a lateral distance between the edges of a top electrode and the floating plate 1810 that define the two tip sections 1812*a*, 1812*b*.

In various implementations, electrode 1504, double-sided electrode 1704, or double-sided electrode 1804 may comprise a single layer or a stack formed by two or more layers. In some examples, at least two layers of such stack can be formed from materials having different resistivities. In some embodiments, the double-sided electrode 1704 can be a bilayer comprising a TiW layer formed on a SiCr.

In various implementations, the thickness of the electrode 1504, double-sided electrode 1704, or double-sided electrode 1804 can be from 0.1 to 0.5 microns, from 0.5 to 1 microns, from 1 to 2 microns, or any ranges formed by these values.

Figure 19A:
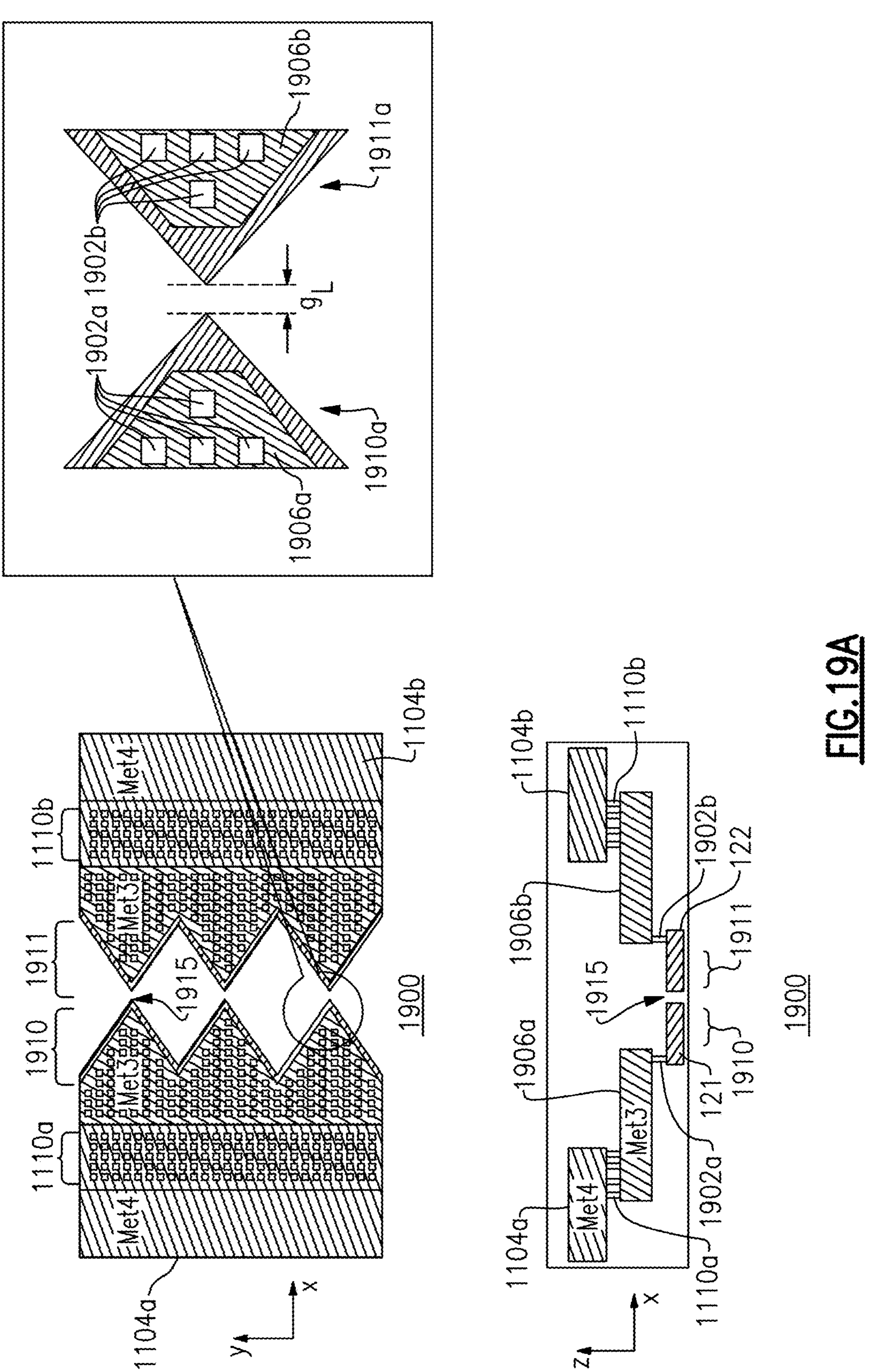
FIG. 19A is a schematic diagram of a lateral (or coplanar) spark gap device having multiple arcing gaps, according to embodiments.

FIG. 19A is a schematic diagram of a lateral (or coplanar) spark gap device 1900 having multiple arcing gaps, according to embodiments. The top and bottom panels schematically illustrate top and side cross-sectional views of the lateral spark gap device 1900, respectively. In some embodiments, the multi-gap lateral spark gap device 1900 comprises a first electrode 121 and second electrode 122 formed in a common metallization layer, e.g., a second metallization layer of an IC or semiconductor device. In some implementations, the first electrode 121 comprises a first plurality of electrode fingers 1910 connected to a first common section and the second electrode 122 comprises a second plurality of electrode fingers 1911 connected to a second common section. In some embodiments, the multi-gap lateral spark gap device 1900 may comprise one or more features described above with respect to EOS monitor device 133 described above (FIG. 1E).

With continued reference to FIG. 19A, in some embodiments, the first electrode 121 is electrically connected to a first voltage node via one or more conductive regions formed in metallization layers above (or below) the metallization layer within which the electrodes are formed and the second electrode 122 is electrically connected to a second voltage node via one or more conductive regions formed in metallization layers above (or below) the metallization layer within which the electrodes are formed. In some cases, one of the first or the second voltage node may comprise an electrical ground. In the example shown in FIG. 19, the first electrode 121 is formed in a second metallization layer of an IC and is electrically connected to a first conductive region 1906*a* in the third metallization layer of the IC, by one more conductive vias 1902*a* formed in an ILD layer between the second and third metallization layers. The second electrode 122 is formed in the second metallization layer and is electrically connected to a second conductive region 1906*b* in the third metallization layer by one more vias 1902*b* formed in the ILD layer between the second and third metallization layers. The first conductive region 1906*a* is electrically connected to a first conductive region 1104*a* formed in a fourth metallization layer of the IC, by one or more conductive vias 1110*a*. The second conductive region 1906*b* in the third metallization layer is electrically connected to a second conductive region 1104*b* formed in the fourth metallization layer by one or more conductive vias 1110*b*. In various embodiments, the first and second conductive regions 1104*a*, 1104*b* of the fourth metallization layer may comprise two bond pads, may be electrically connected to two bond pads, or may be electrically connected to conductive regions in other layers through which they are electrically connected to the first and second voltage nodes, respectively.

In some embodiments, the first and second electrodes 121, 122 are longitudinally separated and laterally aligned such that a plurality of lateral arcing gas are formed between the first electrode fingers 1910 of the first electrode 121 and the second electrode fingers 1911 of the second electrode 122. In some implementations, a number of electrode fingers in the first plurality of electrode fingers 1910 can be equal to a number of electrode fingers in the second plurality of electrode fingers 1911, and thereby equal to a number of arcing gaps formed therebetween. The inset in FIG. 19A schematically illustrates a closeup view of an arcing gap formed by a pair of electrode fingers. In some implementations, a lateral gap size ($g_L$) for a lateral arcing gap formed between a first electrode finger 1910*a*, of the first plurality of electrode fingers 1910, and a second electrode finger 1911*a*, of the second plurality of electrode fingers 1911, can be defined as the closest longitudinal distance (e.g., along x-axis) between the first and second electrode fingers 1910*a*, 1911*a*. In some examples, the lateral gap size gi can be from 0.02 to 0.05 microns, from 0.05 to 0.1 microns, from 0.1 to 0.15 microns, from 0.15 to 0.2 microns, from 0.2 to 0.25 microns, from 0.25 to 0.3 microns, from 0.3 to 0.35 microns, from 0.35 to 0.4 microns, from 0.4 to 0.5 microns, form 0.5 to 1 microns, from 1 to 5 microns or any ranges formed by these values or larger or smaller values. In some implementations, $l_{8x}$ can be from 20 to 50 microns, from 50 to 100 microns, from 100 to 150 microns, or any ranges formed by these values or larger or smaller values.

An individual electrode finger of the first electrode 121 or the second electrode 122 may be laterally separated from one or more immediately adjacent electrode fingers. In some cases, the first and second plurality of electrode fingers 1910, 1911 may be equally spaced to form a periodic array along the lateral direction (e.g., parallel to the y-axis).

In various implementations, the electrode fingers in each or the first and second pluralities of electrode fingers 1910, 1911 may have substantially identical geometries (e.g., shapes and dimensions). In some other implementations, the electrode fingers in the first and second pluralities of electrode fingers 1910, 1911 may have substantially identical geometries. In some implementations, at least one electrode finger is the first or second plurality of electrode fingers may have a different geometry compared to other electrode fingers in the same plurality of electrode fingers.

In some embodiments, an IC may comprise a plurality of coplanar (or lateral) spark gap devices each comprising the coplanar spark gap device 1900. In some embodiments, the plurality of coplanar spark gap devices may form a one-dimensional (1D) array (e.g., a periodic array) of electrically isolated spark gap devices. In these embodiments, the electrodes of each coplanar spark gap device may be electrically connected to a pair of conductive bond pads. For example, the first and second conductive regions 1104*a*, 1104*b* in the fourth metallization layer can be electrically connected two separate conductive bond pads each providing electrical connection between a voltage node and one of the electrodes of the coplanar spark gap device 1900. In some embodiments, the gap sizes (and thereby $V_{TR}$'s) of the plurality of spark gap devices in such 1D arrangement may increase in a stepwise manner from first spark gap device to an $N^{th}$ spark gap device in the array. In some embodiments, the step size by which the gap size increases may change from a first subset of lateral spark gap devices to a second subset of lateral spark gap devices in the 1D array. For example, a 1D array of coplanar spark gap devices may include 11 lateral spark gap devices where the gap size ($g_L$) increases from a first value of 0.025 microns for the first lateral spark gap device in the array to a fourth value of 0.1 micron for the fourth lateral spark gap device in the array, with a step size of 0.025 microns, and from the fourth value of 0.1 micron to an eleventh value of 0.5 microns for the eleventh lateral spark gap device in the array, with a step size of 0.05 microns. In some examples, a 1D array of electrically isolated vertical spark gaps having different gaps sizes (g) may be formed in the same manner described above with respect to the 1D array of isolated lateral spark gaps and may comprise similar features.

Figure 19B:
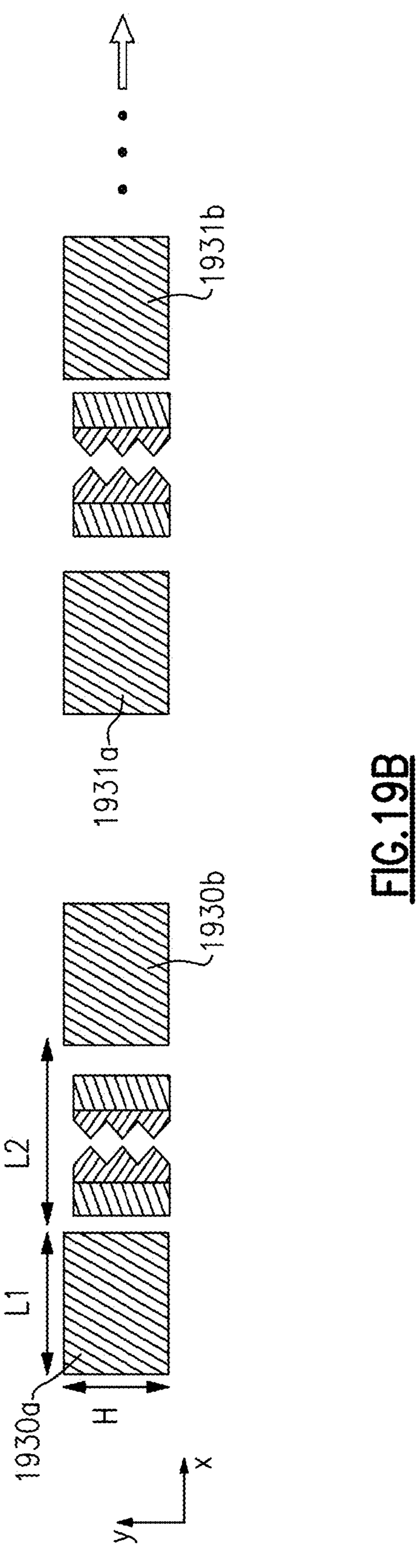
FIG. 19B schematically illustrates a top view of a portion of an example integrated circuit (IC) device comprising a plurality of longitudinally arranged coplanar spark gap devices.

FIG. 19B schematically illustrates a top view of a portion of an example IC device comprising a plurality of longitudinally arranged coplanar spark gap devices. In the example shown, a first and second conductive bond pads 1930*a*, 1930*b*, provide electrical connections to first and second electrodes of a first coplanar spark gap device and a third and fourth conductive bond pads 1931*a*, 1931*b*, provide electrical connections to first and second electrodes of a second coplanar spark gap device. The two conductive bond pads of each coplanar spark gap device are longitudinally separated by an inter-pad spacing and the adjacent conductive bond pads of two consecutive coplanar spark gap devices are longitudinally separated by an inter-device spacing.

In some examples a width H of a conductive bond pad can be from 5 to 10 microns, from 10 to 30 microns, from 30 to 50 microns, from 50 to 100 microns, from 100 microns to 200 microns, or any ranges formed by these values or larger or smaller values. In some examples a length $L_1$ of a conductive bond pad can be from 10 microns, from 10 to 30 microns, from 30 to 70 microns, from 70 to 100 microns, from 100 microns to 200 microns, or any ranges formed by these values or larger or smaller values. In some examples inter-pad spacing $L_2$ can be from 50 to 90 microns, from 90 to 120 microns, from 120 to 200 microns, from 200 microns to 500 microns, or any ranges formed by these values or larger or smaller values.

In various embodiments, the longitudinal arrangement of the spark gaps and respective conductive bond pads described above with respect to coplanar spark gap device 1900, may be used to provide a longitudinal arrangement of other coplanar spark gap devices or vertical spark gap devices (e.g., vertical spark gap devices 1500, 1600, 1700, 1710, 1720 and 1800). In some examples, a longitudinal arrangement of spark gaps may comprise 2, 4, 6, 8, 10, 12, 14, 18, 20, 30, 40, 50, or larger number of spark gaps.

In some embodiments, the electrode fingers of the coplanar spark gap device 1900 may be elongated to include a series resistance to serve as a ballast resistance for limiting the current flow through the electrode fingers.

Figures 20A, 20B:
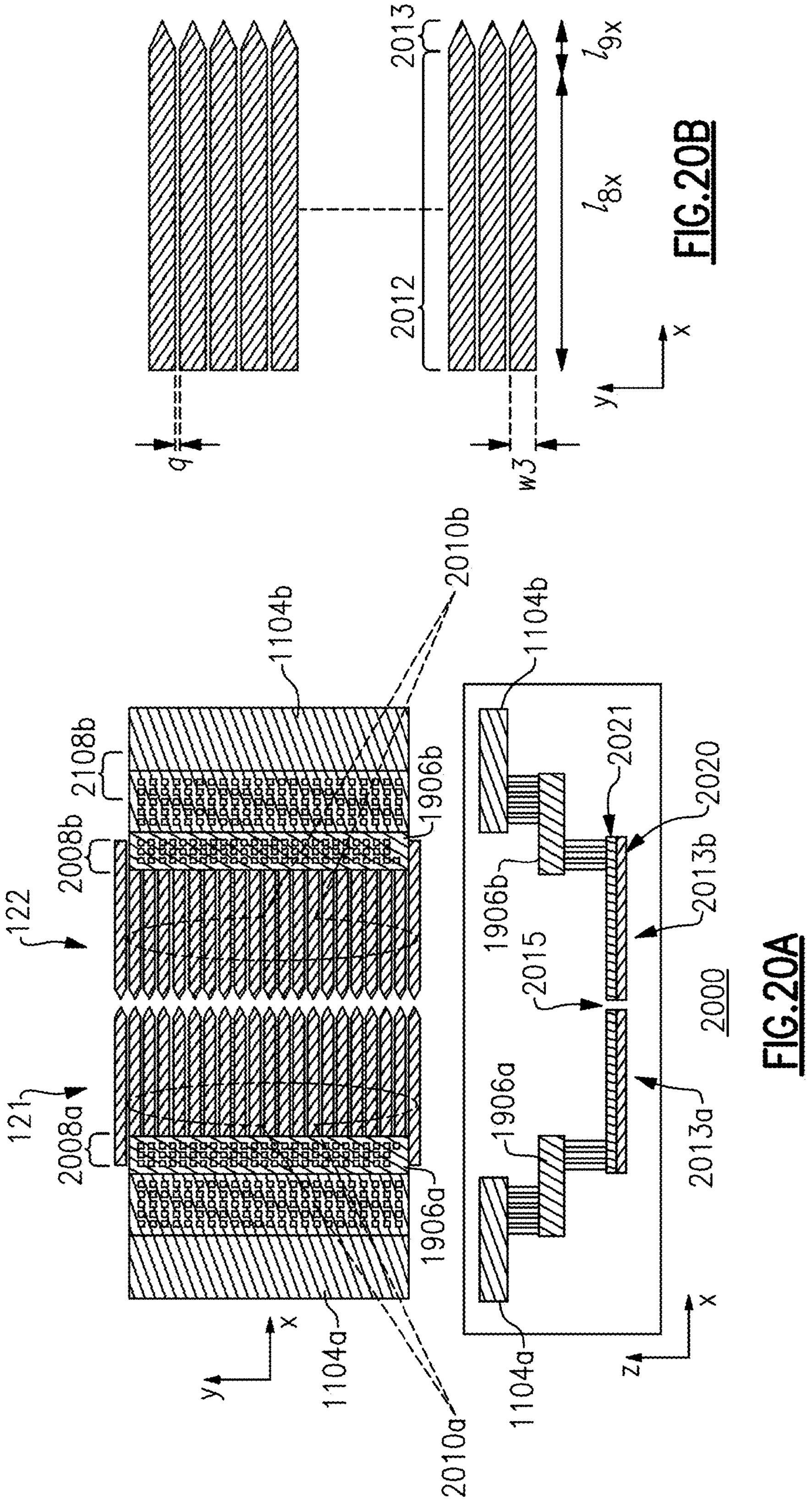
FIG. 20A schematically illustrates a multi-gap lateral spark gap device having a plurality of dual layer elongated electrode fingers comprising resistive layers.
FIG. 20B illustrates a close-up view of a subset of elongated electrode fingers of the lateral spark gap device shown in FIG. 0 20A.

FIG. 20A schematically illustrates a multi-gap coplanar spark gap device 2000 comprising a first electrode 121 having a first common section 2008*a* and a first plurality of elongated electrode fingers 2010*a* extending from the first common section 2008*a* and a second electrode 122 having a second common section 2008*b* and a second plurality of elongated electrode fingers 2010*b* extending from the second common section 2008*b*. In some embodiments, the first plurality of elongated electrode fingers 2010*a* longitudinally extend from the first common region 2008*a* positioned below the first conductive region 1906*a* toward the second conductive region 1906*b* in the third metallization layer and a second plurality of elongated electrode fingers 2010*b* longitudinally extend from the second common section 2008*b* toward the first conductive region 1906*a*. A plurality of arcing gaps may be formed by the first and second pluralities of elongated electrode fingers 2010*a*, 2010*b*. An individual arcing gap 2015 is formed between arcing tips or tip sections of a first elongated electrode 2013*a* of the first plurality of elongated electrode fingers 2010*a* and a second elongated electrode 2013*b* of the second plurality of elongated electrode fingers 2010*b*. In some implementations, the first and second pluralities of elongated electrode fingers 2010*a*, 2010*b* can be configured such that plurality of arcing gaps are distributed along a lateral direction at the same longitudinal position (e.g., at a middle point between the first and second conductive regions 1906*a*, 1906*b*.

FIG. 20B illustrates a closeup view of a subset of elongated electrode fingers of the first plurality of electrode fingers 2010*a*. An individual electrode finger includes an elongated section 2012 and an arcing tip or tip section 2013. The elongated section 2012 is longitudinally extended from an end region attached to the common section 2008*a* of the first electrode 121, to the tip section 2013. In the example shown, the elongated section 2012 has a rectangular shape having a length $l_{8x}$ and a width $w_3$, and the tip section 2013 has a triangular (or tapered) shape having a length $l_{9x}$ and width that is longitudinally tapered from a first width substantially equal to the width ($w_3$) of the elongated section 2012 to a second width. In some examples, the second width can be smaller than the first width by a factor of 2, 5, 10, 100, 1000, or large values. In various implementations, the tip section 2013 can have other shapes. In some implementations, the elongated section 2012 serves as a ballast between the tip section 2013 and the end region of the elongated section 2012 that is electrically connected to the common section 2008*a*. The resistance of the elongated section 2012 can be proportional to its length $l_{8x}$. In some examples, the material composition of the elongated section 2012 may be configured to provide a desired or target ballast resistance for a given $l_{8x}$. In some other examples, for a given material composition, the length, $l_{8x}$, of the elongated section 2012 may be configured to provide a desired or target ballast resistance. In yet other examples, the material composition and the length, $l_{8x}$, of the elongated section 2012 may be configured to provide a desired or target ballast resistance. In some implementations, when the individual electrode fingers of the first and second pluralities of electrode fingers 2010*a*, 2010*b* are configured to have a ballast resistance substantially equal to a target resistance, the plurality of arcing gaps may discharge substantially at the same time (or in parallel), or within a collective sparking period. Additionally, the ballast resistance provided by the elongated section of the individual electrode fingers may reduce damage or degradation of the tip sections after each electric discharge (or sparking) event. In some examples, when a first electrode finger sparks, the voltage drop across the ballast allows the voltage along another electrode finger to exceed $V_{TR}$ and this process can continue until all the electrode fingers spark within the collective sparking period.

In various implementations, a thickness of an individual electrode of the plurality of electrode fingers 2010*a* or 2010*b* can be from 0.1 to 0.5 microns, from 0.5 to 1 micron, from 1 to 2 microns, or any ranges formed by these values or larger or smaller values. In some examples, $l_{8x}$ can be from 5 to 10 microns, from 10 to 20 microns, from 20 to 50 microns, from 50 to 100 microns, from 100 to 300 microns or any ranges formed by these values or larger values, $l_{9x}$ and $w_3$ can be from 1 to 5 microns, from 5 to 10 microns or any ranges formed by these values or larger or smaller values. In some examples, the series resistance provided by the elongated section of the electrode finger 1504 can be from 50 to 100 ohms, from 100 to 300 ohms, from 300 to 600 ohms, from 600 to 800 ohms, from 800 to 1000 ohms or any ranges formed by these values or larger or smaller values.

In some embodiments, the lateral gap size ($g_L$) between a pair of identical elongated electrodes may be determined based on the length of the elongated portion that serves as the ballast resistance. In some examples, $l_{8x}$ can be 20, 50, or 100 microns and $g_L$ can be from 0.02 to 0.05 microns, from 0.05 to 0.1 microns, from 0.1 to 0.15 microns, from 0.15 to 0.2 microns, from 0.2 to 0.25 microns, from 0.25 to 0.3 microns, from 0.3 to 0.35 microns, from 0.35 to 0.4 microns, from 0.4 to 0.5 microns, form 0.5 to 1 microns, from 1 to 5 microns or any ranges formed by these values or larger or smaller values. In some implementations, $l_{8x}$ can be from 20 to 50 microns, from 50 to 100 microns, from 100 to 150 microns, or any ranges formed by these values or larger or smaller values. In some implementations, $g_L$ can be from 0.1 to 0.3 microns, from 0.3 to 0.6 microns, from 0.6 to 0.8 microns or any ranges formed by these values or larger or smaller values.

In some embodiments, the first and second plurality of electrode fingers 2010*a*, 2010*b* may comprise two or more layers. In some examples, the two or more layers may comprise one or more TiW layers and one or more SiCr layers. In some implementations, each individual elongated electrode of the plurality of electrodes shown in FIGS. 20A-20B may be formed by patterning a bilayer comprising a TiW layer 2021 formed on a SiCr layer 2020, within a metallization layer (e.g., the second metallization layer). In some such examples, ballasting resistance of each individual elongated electrode may be provided by the TiW layer and the length of the elongated section 2012 can be determined based on the resistivity of TiW.

In some embodiments, the first and second plurality of electrode fingers 2010*a*, 2010*b* may comprise a single resistive layer. In some examples, the resistive layer may comprise TiW, SiCr, or other materials. For example, each individual elongated electrode of the plurality of electrodes shown in FIG. 20B may be formed by patterning a TiW layer formed within a metallization layer (e.g., the second metallization layer).

Figure 21B:
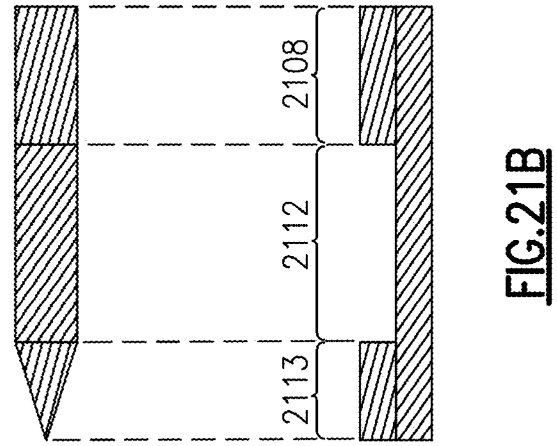
FIG. 21B schematically illustrates an individual elongated electrode finger of the lateral spark gap device shown in FIG. 21A.
Figure 21A:
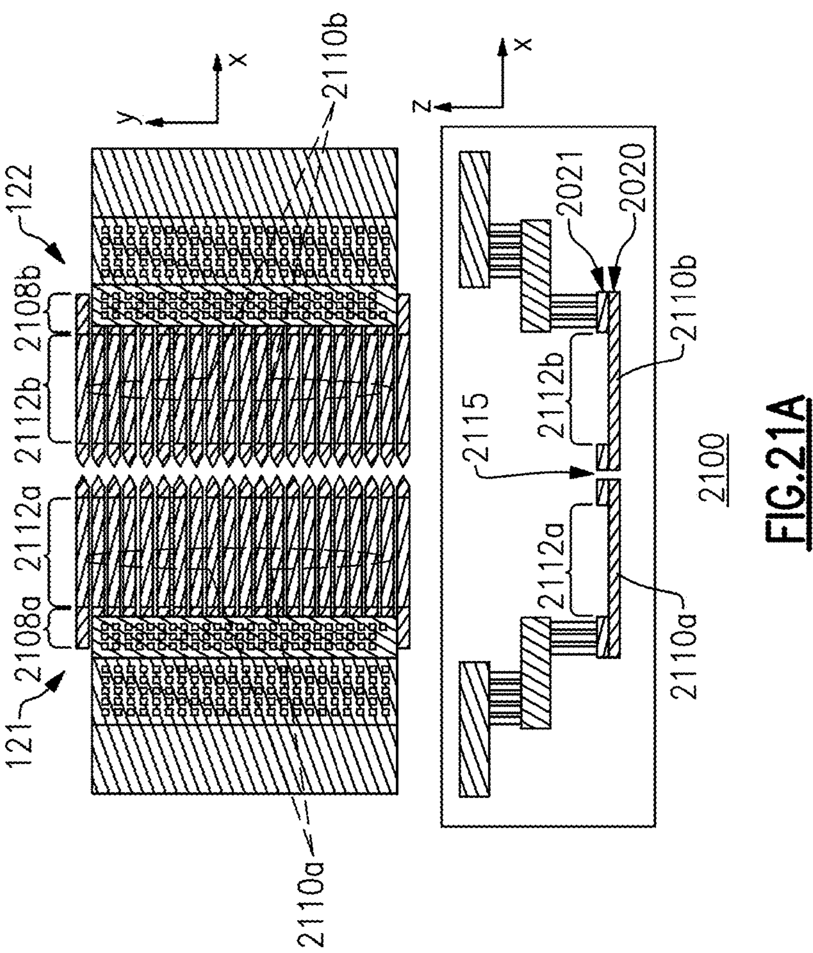
FIG. 21A schematically illustrates a multi-gap lateral spark gap device having elongated electrode fingers comprising resistive layers and single and dual layer regions.

In some embodiments, the elongated section 2012 of an elongated electrode finger may comprise a first layer comprising a first material while the tip section 2013 and the corresponding common section may comprise a bilayer formed by the first layer and a second layer comprising a second material, disposed on the first layer. In some examples, the resistivity of the first material can be greater than that of the first material. FIG. 21A schematically illustrates a multi-gap coplanar spark gap device 2100 having elongated electrode fingers comprising single and dual layer regions. In some implementations, the elongated sections 2112*a*, 2112*b* of the first and second plurality elongated electrode fingers 2110*a*, 2110*b*, may comprise a single layer and their tip sections and the common sections 2108*a*, 2108*b*, comprise a dual layer. FIG. 21B schematically illustrates an individual elongated electrode of the multi-gap coplanar spark gap device 2100 comprising a single layer (resistive) elongated section 2112, a dual layer tip section 2113, and dual layer common section 2108. In some examples, the elongated section 2112 of an elongated electrode finger may comprise a single layer of SiCr and the tip section 2113 and the common section 2108 may comprise a bilayer comprising a TiW layer formed on a SiCr layer. In some implementations, such elongated electrode may be formed by patterning a bilayer comprising a TiW layer formed on a SiCr layer, and selectively removing the top TiW layer from the elongated section 2112. In some such examples, ballasting resistance of the elongated electrode may be provided by the SiCr layer and the length of the elongated section 2012 can be determined based on the resistivity of SiCr.

In some examples, the length of the tip section 2113 from 1 to 5 microns, from 5 to 10 microns or any ranges formed by these values or larger or smaller values, the length of the elongated section 2112 can be from 5 to 10 microns, from 10 to 20 microns, from 20 to 50 microns, from 50 to 100 microns, from 100 to 300 microns or any ranges formed by these values or larger values, and the length common section 2108 can be from 1 to 5 microns, from 5 to 10 micron, from 10 to 20 microns or any ranges formed by these values.

Figure 22:
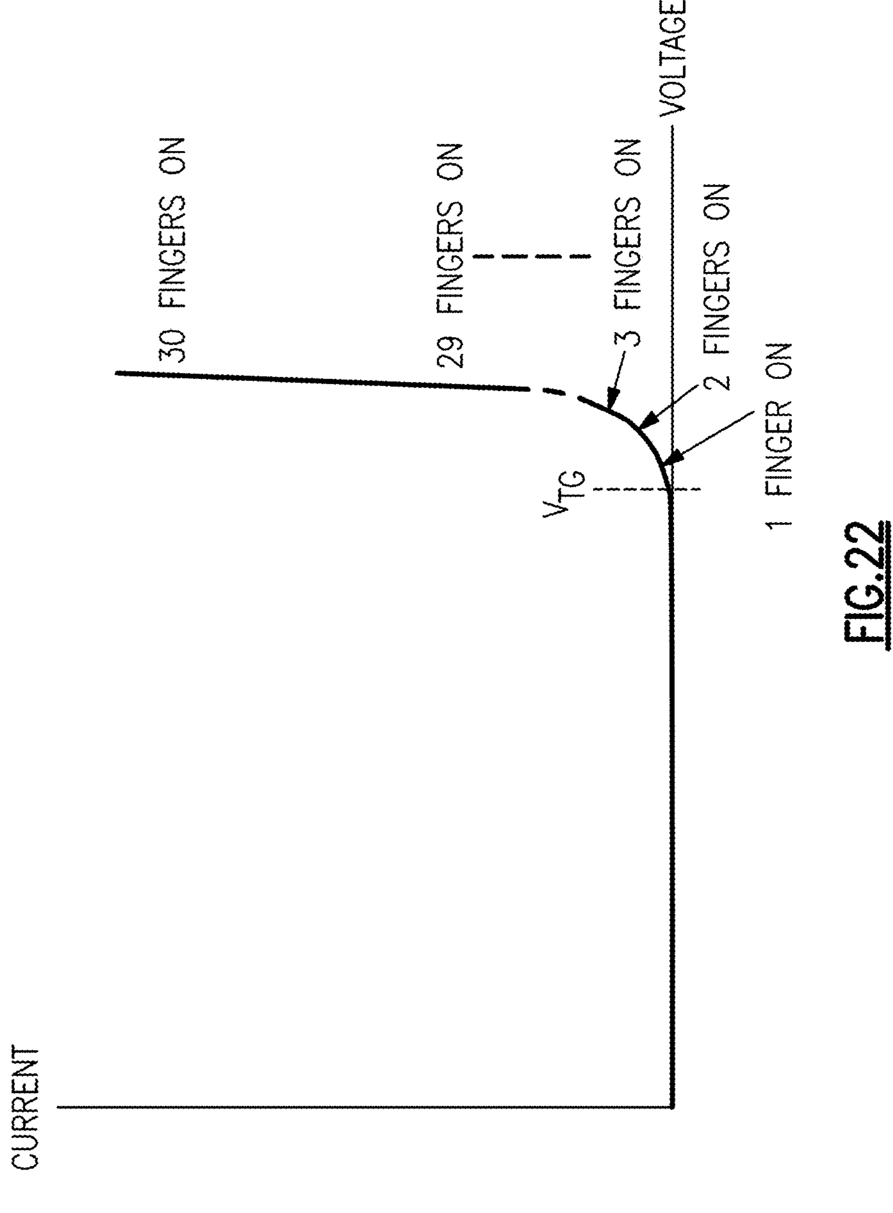
FIG. 22 is a schematic diagram of a current-voltage relationship for a multi-gap coplanar spark gap having 30 arcing gaps formed by 30 pairs of symmetric elongated electrode fingers, each elongated electrode fingers having a 20 micron long elongated region.

FIG. 22 is a schematic diagram of a projected transmission line pulse (TLP) plot representing current-voltage relationship for a multi-gap coplanar spark gap having 30 arcing gaps formed by 30 pairs of symmetric elongated electrode fingers, each elongated electrode fingers having a 20 micron long elongated region ($l_{8x}$=20 microns). As shown in FIG. 22, when a voltage difference between the two electrodes is increased above a trigger voltage ($V_{TR}$) one pair of elongated electrode fingers is triggered (e.g., an electric arc is formed in the corresponding arcing gap). Further increasing the voltage triggers a second pair, a third pair, and eventually all 30 pairs of elongated electrode fingers resulting in a near exponential current-voltage relationship. In some embodiments, the resistance of the electrical path provided through one pair of electrode fingers can be about 274 ohms, the resistance of the electrical path provided through two pairs can be about 137 ohms, the resistance of the electrical path provided through three pair can be about 91 ohms, the resistance of the electrical path provided through twenty nine pair can be about 9.5 ohms, and the resistance of the electrical path provided through thirty pairs can be about 9.1 ohms. In the example shown, a voltage difference between trigger and holding may be taken up by the ballast resistance so a snapback behavior may not be evident in the TLP plot.

In some implementations, similar to elongated electrode described above with respect to FIG. 21B, at least a portion of the elongated electrode finger 1504 or the double-sided electrode 1704 may comprise two or more layers. In some such embodiments, the tip sections 1504*a*, 1704*a*, 1704*c*, may have two layers and the elongated sections 1504*b* or 1704*b* can have a single layer. In some examples, different layers of a double-sided electrode may have different compositions and thereby different resistivities. In one implementation, the elongated electrode 1504 or the double-sided electrode 1704 can include a first layer comprising silicon chromium (SiCr) and a second layer formed on the first layer comprising titanium tungsten (TiW). In another implementation, the tip sections 1504*a*, 1704*a*, 1704*c* and the corresponding common sections can include two layers (e.g., a SiCr layer on a TiW layer) and the elongated sections 1504*b* or 1704*b*, can include a single layer (e.g., a TiW layer).

In various implementations, wherein the series ballast resistor or resistance of an elongate portion of an electrode finger of a first electrode of a spark gap device can be substantially greater than an electrical resistance of a second electrode of the spark gap device.

In various implementations, the elongated section of an elongated electrode or electrode finger (e.g., the electrode finger 1504, double-sided electrode 1704, or the electrode fingers 2010*a*/2010*b*) has a length-to-width ratio exceeding larger than 2, 3, 4, 5, 10, 20 or larger values.

In various implementations, an elongated electrode finger of a multi-gap lateral or vertical spark gap device may comprise a sharpened arcing tip portion pointing in the lateral direction (e.g., parallel to x-axis). In some such implementations, the arcing tip can be integrally formed in series with a ballast resistor or the elongated section of the electrode finger in the same metallization layer.

In some embodiments, thickness of a first electrode (e.g., the bottom electrode) of a vertical spark gap device can be smaller than a second electrode (e.g., the top electrode). In some such embodiment, the thickness of the first electrode can be smaller than the thickness of a mentalization layer within which the first electrode is formed.

In some implementations, an electrode or electrode finger of a vertical or a lateral spark gap device may have a material composition different from conductive region of a metallization layer withing which the electrode or electrode finger is formed.

In some embodiments, the series ballast resistor (e.g., ballast resistance of an elongated section) of an electrode or electrode finger can be substantially greater than a resistance of a common section (contact section) or a tip portion (arcing tip) of the electrode or electrode finger, greater than a resistance of the conductive regions in metallization layers above or below the electrode or electrode fingers, or greater than a resistance of another electrode or electrode finger vertically separated from the electrode or electrode finger.

Array of Spark Gaps with Ballast Resistors for High Current Capability

As described above, by designing the arcing electrodes to arc between overlapping vertically separated surfaces, rather than between, e.g., sharpened tips, the arcing electrodes of a vertical spark gap can be used through multiple arcing events. In some embodiments, a vertical spark gap can include a plurality of sparking gaps formed by a plurality of electrode fingers having series resistors where the series resistors force the electric current to be conducted through the plurality of arcing gaps, thereby enabling high current capability. As further discussed above, at least some regions of an electrode of a vertical spark gap (e.g., the bottom electrode) may comprise two layers. In some embodiments, one of these layers (e.g., the lower layer) can have a higher resistance and/or resistivity than the other layer (e.g., the upper layer). In some examples, the lower layer may comprise SiCr and the upper layer may comprise TiW. In some embodiments, the layer having the higher resistance and/or resistivity can be suitably patterned to provide a series ballast resistance. In some implementations, the patterned high resistance layer may comprise a two-dimensional resistive region limiting current flow between a voltage node and an arcing tip of an electrode of the spark gap via a plurality of current paths within the high resistance layer. In some implementations, the layer having the higher resistance may comprise a high resistance region and a low resistance region. In some such implementations, the low resistance region may be surrounded by the high resistance region. In some examples, the low resistance region may comprise silicided-polysilicon and the high resistance region may comprise polysilicon.

These and other advantages can be realized by arranging the arcing electrodes in an array, and strapping electrodes of one of the polarities with a series resistor. Without limitation, example configurations are described below.

According to some embodiments, a vertical spark gap device serving as an electrical overstress (EOS) monitor and/or protection device may comprise a substrate having a horizontal main surface, and a first conductive layer or a first electrode (e.g., a bottom electrode) and a second conductive layer or a section electrode (e.g., a top electrode), extending over opposite surfaces of the substrate and substantially parallel to the horizontal main surface and thereby are separated in a vertical direction crossing the horizontal main surface. One of the first and second conductive layers is electrically connected to a first voltage node and the other of the first and second conductive layers is electrically connected to a second voltage node. The first and second voltage nodes can receive an EOS voltage therebetween.

Figure 23:
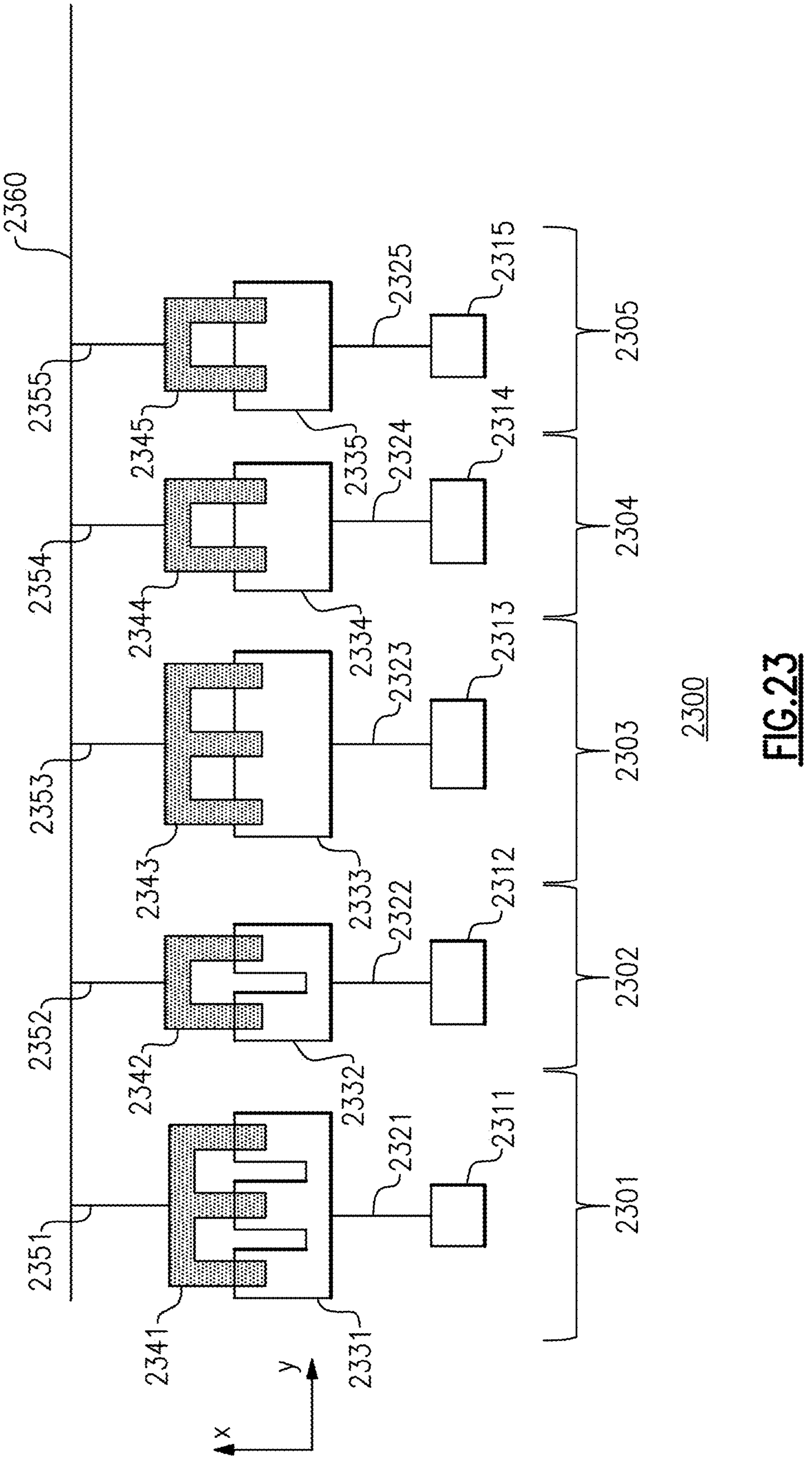
FIG. 23 schematically illustrates a top-down view of an example multi-gap vertical spark gap array comprising an array of arcing electrode pairs associated with a plurality of electrically connected vertical spark gaps.

FIG. 23 schematically illustrates a top-down view of an example multi-gap vertical spark gap array 2300 comprising an array of arcing electrode pairs associated with a plurality of electrically connected vertical spark gap devices 2301, 2302, 2303, 2304 and 2305. In some embodiments, at least one of the electrodes (e.g., bottom electrodes) of each vertical spark gap devices can comprise two or more electrode fingers. In some implementations the electrode fingers may extend laterally from a common (or node connection) section of the electrode. In some implementations, the electrode fingers may protrude in a vertical direction from the common section of the electrode. The common section may provide electric connection between the electrode fingers and a voltage node (e.g., via one or more conductive vias and metallization layers). In some embodiments, at least one of the electrodes (e.g., bottom electrodes) of each vertical spark gap device can be electrically connected to a common voltage node (e.g., a first voltage node) 2360 via a plurality of electrical links 2341, 2342, 2343, 2344 and 2345. In some examples, where the multi-gap vertical spark gap array 2300 is formed in a multilayer IC device, each electrical link may comprise a contact pad, one or more conductive regions formed in different metallization layers of the IC, and/or one or more conductive vias formed in ILD layer layers of the IC.

In some implementations, the electrical path between each electrode finger and the common voltage node 2360 may comprise a series resistance. In some embodiments, the common section of each electrode connected to common voltage node 2360 may provide the series resistance between the corresponding electrode fingers.

The vertical spark gap devices of the multi-gap vertical spark gap array 2300 can be configured to generate arc discharges in response to an EOS voltage signal received between the common voltage node 2360 and respective second, third, fourth, fifth, and sixth voltage nodes electrically connected to the contact pads 2311, 2312, 2313, 2314 and 2315. In some implementations, e.g., where the multi-gap vertical spark gap array 2300 is formed in a multilayer IC device, each contact pad can be electrically connected to an electrode of a vertical spark gap device by one or more conductive regions formed in different metallization layers of the IC and one or more conductive vias formed in ILD layers of the IC. In some implementations, the contact pads 2311, 2312, 2313, 2314 and 2315 can be electrically connected to a second common voltage node. In these implementations, the vertical spark gap devices 2301, 2302, 2303, 2304 and 2305 of the multi-gap vertical spark gap array 2300 may collectively spark in response to a voltage difference between the common voltage node 2360 and the second common voltage node exceeding a threshold value (e.g., a value larger than $V_{TR}$ of at least one of the vertical spark gap devices).

In some embodiments, different vertical spark gap devices of a vertical spark gap array can have similar or different designs. In FIG. 23, for illustrative purposes only, the multi-gap vertical spark gap array 2300 includes differently arranged vertical gap devices. As examples, the vertical spark gap device 2301 includes segmented top 2331 and bottom 2341 electrodes each having three electrode fingers, the vertical spark gap device 2302 includes segmented top 2332 and bottom 2342 electrodes each having two electrode fingers, the vertical spark gap device 2303 includes a non-segmented top electrode 2333 and a segmented bottom electrode 2343 having three electrode fingers, and the vertical spark gap devices 2304 and 2305, which are substantially identical, each includes a non-segmented top electrode 2334 (2335) and a segmented bottom electrode 2344 (2345) having two electrode fingers.

In some embodiments, a vertical spark gap array may comprise substantially identical vertical spark gap devices arranged as a periodic array (e.g., one or two-dimensional array of multiple vertical spark gap devices) to form an array of arcing electrode pairs. For example, a vertical spark gap may be used as a unit cell to form a one or two-dimensional lattice of vertical spark gap devices sharing at least one electrode or electrode layer (e.g., a resistive layer of the bottom electrode). In some embodiments, a plurality of electrode fingers of an electrode may be connected to a common patterned resistive layer comprising high and low resistivity regions configured to provide ballast resistance between the plurality of the electrode fingers and a voltage node, e.g., a voltage node receiving an EOS voltage.

In some embodiments, a lateral spark gap array may be formed by connecting a plurality of lateral spark gap devices connected to ballast resistors (e.g., lateral spark gap devices 2000 or 2100 described above with respect to FIGS. 20 and 21) based on an arrangement similar to that of the vertical spark gap array 2300. Such lateral spark gap array may comprise an array of arcing electrode pairs and one or more features similar to those described above with respect to the vertical spark gap array 2300.

In some embodiments, an electrode of a multi-gap vertical spark gap device may comprise a patterned bilayer that can be formed by an etch process that patterns the top layer to form first arcing electrodes, e.g., electrode fingers, and stops at the bottom layer, such that the bottom layer serves as a sheet resistor including unpatterned inter-electrode regions (herein also referred to as node connection regions). Thus, patterned electrode fingers are connected through the bottom layer, which in turn may be connected to a voltage node. In some embodiments, the patterned electrode fingers may include a low resistivity layer (e.g., a TiW layer), while the bottom layer, comprising the inter-electrode regions extending between the electrode fingers, may include a high resistivity layer (e.g., a SiCr layer) serving as the sheet resistor. In some embodiments, the bottom layer of the bilayer serves as a sheet resistor, which provides ballast resistance between the electrode fingers and a voltage node (e.g., a voltage node receiving an EOS voltage).

Figure 24:
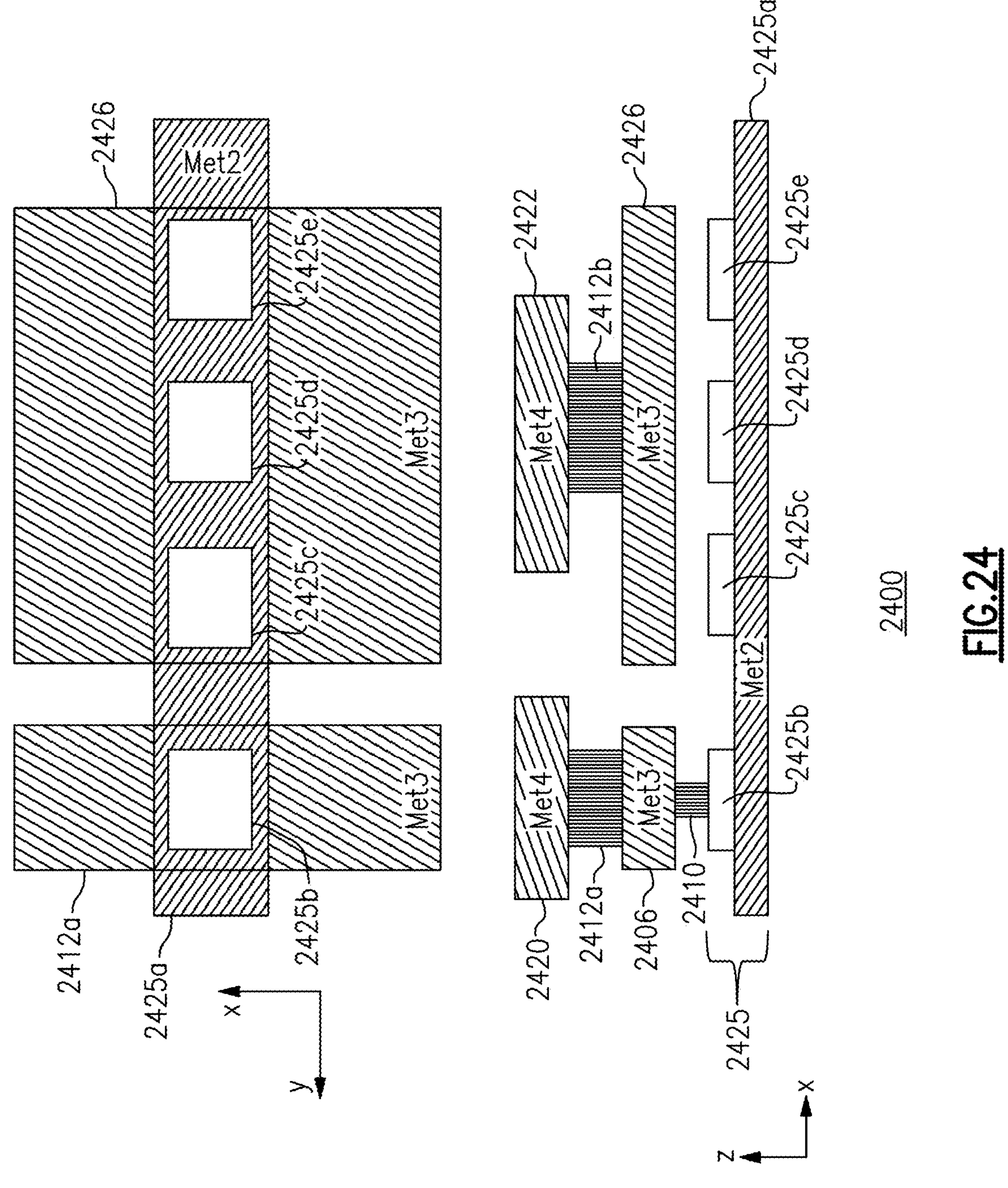
FIG. 24 schematically illustrates an example of a multi-gap vertical spark gap device with ballast resistance.

FIG. 24 schematically illustrates an example of such multi-gap vertical spark gap device 2400 with ballast resistance. The top and bottom panels schematically illustrate top-down and cross-sectional side views of the multi-gap vertical spark gap device 2400 respectively. The multi gap vertical spark gap device 2400 includes a non-segmented sheet top electrode 2426 and a segmented bottom electrode 2425. The segmented bottom electrode 2425 comprises a base layer 2425*a* serving as the common (or node connection) section of the bottom electrode 2425 extending in a lateral direction (e.g., along y-axis), and further comprises a patterned top layer comprising a plurality (four shown) of laterally separated regions comprising a region 2425*b* through which the base layer 2425*a* (the common section) is electrically connected to a first voltage node, and first, second and third electrode fingers 2425*c*, 2425*d*, 2425*e* vertically extending from and electrically connected to the base layer 2425*a*. The top electrode 2426 of the multi-gap vertical spark gap device 2400 is vertically separated from the electrode fingers 2425*c*, 2425*d*, 2425*e* and is electrically connected to a second voltage node. In some implementations, the base layer (the common section) 2425*a* of the bottom electrode 2425 can have a greater resistance and/or resistivity than the electrode fingers 2425*c*, 2425*d*, 2425*e*. In some such implementations, the base layer (the common section) 2425*a* of the bottom electrode 2425 can provide series resistance (e.g., a ballast resistance) between the electrode fingers 2425*c*, 2425*d*, 2425*e* and the first voltage node. In some examples, the resistivity of the base layer 2425*a* of the segmented bottom electrode 2425, which can serve as a sheet resistor to provide ballast resistance, can be greater than the resistivity of the electrode fingers 2425*c*, 2425*d*, 2425*e*, which serves as arcing electrodes, by a factor larger than 2, 4, 8, 10, 50, 100, 1000 or larger factors. In some examples, where the multi-gap vertical spark gap array 2400 is formed in a multilayer IC device, the bottom electrode is formed in a second metallization layer (Met 2) and the top electrode 2426 is formed in a third metallization layer (Met3) vertically separated from the second metallization layer by a first ILD layer. In some implementations, an inter-electrode portion of the first ILD layer, between electrode fingers 2425*c*, 2425*c*, 2425*e* of the bottom electrode 2425 and the top electrode 2426, may have different compositions and electrical properties compared to the other regions of the first ILD layer. In some implementations, the inter-electrode portion of the first ILD layer may comprise an air gap or sealed volume comprising a gas or gas mixture having a specified pressure. In some implementations, the base layer 2425*a* of the bottom electrode 2425 can be electrically connected to the first voltage node through the region 2425*b*, a first plurality of conductive vias 2410, a conductive region of the third metallization layer electrically isolated from the top electrode 2426, a second plurality of conductive vias 2412*a*, and a first contact pad 2420 formed in the fourth metallization layer vertically separated from the third metallization layer by a second ILD layer. As such each electrode finger of the bottom electrode 2425 can be electrically connected to the first voltage node by a series resistance comprising a section of the base layer 2425*a* extended between that electrode finger and the region 2425*b*. The top electrode 2426 can be electrically connected to the second voltage node through a third plurality of conductive vias 2412*b*, and a second contact pad 2422 formed in the fourth metallization layer. It will be appreciated that, by forming an array of arcing electrode pairs in this manner, because of the precise control of thicknesses of the layers, the arcing gaps of the electrode pairs can be precisely controlled.

In some embodiments, a one dimensional or two-dimensional vertical spark gap array may comprise a plurality of vertical spark gaps formed by a plurality of electrode fingers on top electrode sections having geometries and an arrangement similar to those of the electrodes of the multi-gap vertical spark gap device 2400. In some embodiments, a one dimensional or two-dimensional vertical spark gap array may comprise a plurality of vertical spark gaps similar to the multi-gap vertical spark gap device 2400 sharing the base layer 2425*a* of their bottom electrodes. In some such embodiments, the top electrodes 2426 of at least a subset of the plurality of vertical spark gaps may be electrically connected by a common second contact pad 2422 extending above the subset of the plurality of vertical spark gaps, e.g., along a longitudinal direction along (e.g., parallel to x-axis). In some embodiments, the plurality of vertical spark gaps may share a common first contact pad 2420 extending above the subset of the plurality of vertical spark gaps, e.g., along a longitudinal and/or lateral direction (e.g., parallel to x-axis and y-axis respectively).

Figure 25:
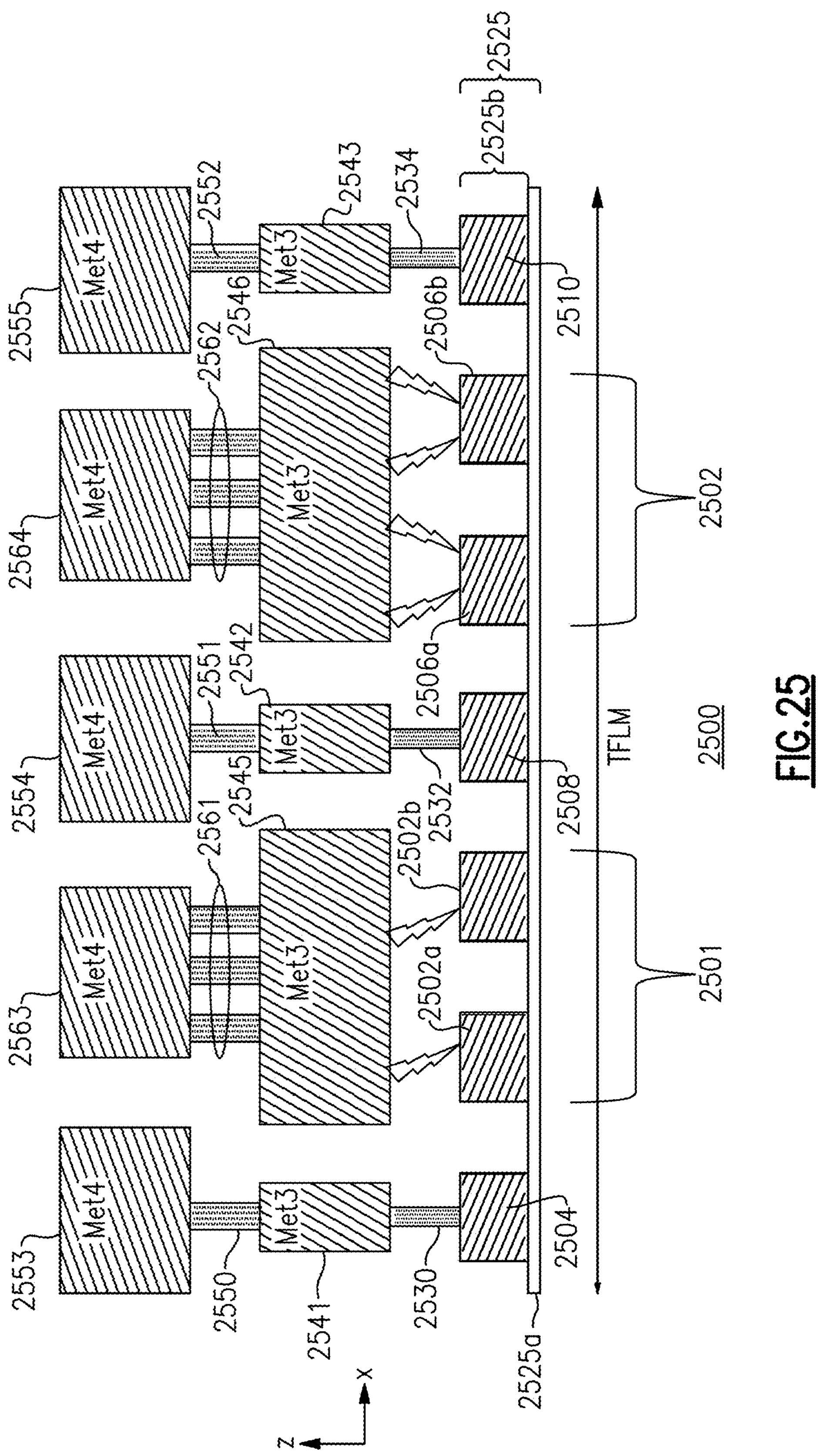
FIG. 25 schematically illustrates a portion of an example of a multi-gap vertical spark gap array with ballast resistance.

FIG. 25 schematically illustrates a cross-sectional view of a portion of a spark gap array 2500 showing a plurality of vertical spark gaps along a lateral direction (e.g., y-axis). In some implementations, the spark gap array 2500 may comprise an array of arcing gaps formed by an array of electrode pairs. An individual electrode pair may comprise a bottom arcing electrode, e.g., an electrode finger of the array of bottom electrode fingers, and a top arcing electrode, e.g., an arcing electrode sheet formed over multiple bottom electrodes. In some cases, the bottom electrode fingers can be electrically connected by a sheet resistor or resistive layer providing ballast resistance for the individual arcing gaps. In some embodiments, the spark gap array 2500 may comprise a plurality of substantially identical vertical spark gap devices similar to the spark gap device 2400. The spark gap array 2500 may comprise a sheet resistor or resistive layer 2525*a* (common base layer) shared among and electrically connected to the plurality of vertical spark gaps and extended along the lateral and longitudinal directions. The bottom electrode of each of the plurality of vertical spark gap device may comprise one or more electrode fingers formed on the resistive layer 2525*a* (two electrode fingers in the example shown). The electrode fingers may comprise laterally and longitudinally separated regions of a segmented conductive layer 2525*b* formed on the resistive layer 2525*a*. In some examples, the resistive layer 2525*a* may comprise SiCr and the segmented conductive layer 2525*b* may comprise TiW. In other examples, the resistive layer and the patterned conductive layer 2525*b* may comprise other materials (e.g., other allows, or composites comprising metals and semiconductors). For example, the resistive layer may comprise polysilicon and the conductive layer may comprise Aluminum (Al) or Tungsten (W).

In some embodiments, the resistive layer 2525*a* (the sheet resistor) can have a thickness and may be formed of a material such that when an arc discharge is generated between a top and a bottom electrode finger and a current path is formed between the first and second voltage nodes, a portion of the current path passing through the resistive layer 2525*a* (sheet resistor) provides the highest resistance value in the current path.

The resistive layer 2525*a* may be electrically connected to one or more contact pads by one or more regions of the segmented conductive layer 2525*b*. In some embodiments, the bottom electrode fingers and contact segments of the segmented conductive layer 2525*b* may be formed by patterning (e.g., using photolithography and etching) a top layer of a bilayer 2525 formed, e.g., in the second metallization layer of an IC device where the bilayer comprises the top layer formed on a bottom resistive layer having a resistivity greater than the top layer. In some implementations, the top layer of a bilayer 2525 can have a uniform thickness such that the electrode fingers (arcing electrodes) and contact segments formed by patterning the top layer have substantially flat top surfaces at a same vertical height. In some implementations, electrode fingers and contact segments are patterned to be individually isolated features contacting the sheet resistor such that no other physical connections are made thereto.

5, the resistive layer 2525*a* is connected to first, second, and third contact pads 2553, 2554, 2555, by first, second, and third contact segments 2504, 2508, 2510 of the segmented conductive layer 2525*b*. In some embodiments, the first, second, and third contact pads 2553, 2554, 2555 are connected to a first voltage node.

In some examples, the first, second, and third contact segments 2504, 2508, 2510 are electrically connected to first, second, and third conductive regions 2541, 2542, 2543 formed in the third metallization layer (Met 3) by first, second, and third conductive vias 2530, 2532, 2534. In some examples, the first, second, and third conductive regions 2541, 2542, 2543 are connected to the first, second, and third contact pads 2553, 2554, 2555 by a fourth, fifth, and sixth conductive vias 2550, 2551, 2552. In some embodiments, each of these conductive vias may comprise a plurality of conductive vias. In some embodiments, a spark gap array may comprise a plurality of arcing gaps formed between a plurality of electrode fingers and top electrode sections. In some cases, the plurality of arcing gas comprise a plurality of arcing gaps pairs, triplets, or larger groups of arcing gaps, where an individual pair, triplet, or group of arcing gaps is formed between a top electrode section and a plurality of electrode fingers at least partially overlapping with the top electrode section. An individual arcing gap pair, triplet, or group may be configured to generate an arc discharge in response to an EOS voltage signal received between first and second voltage nodes.

With continued reference to FIG. 25, the spark gap array 2500 may comprise a plurality of arcing gap pairs two of which are shown. A first arcing gap pair is formed between overlapping portions of a first top electrode 2545 and first and second bottom electrode fingers 2502*a*, 2502*b* and a second arcing gap pairs are formed between overlapping portions of a second top electrode 2546 and third and fourth bottom electrode fingers 2506*c*, 2506*b*. The first top electrode 2545 and the first and second bottom electrode fingers 2502*a*, 2502*b* may form a first vertical spark gap device 2501, and the second top electrode 2546 and the third and fourth bottom electrode fingers 2506*a*, 2506*b* may form a second vertical spark gap device 2502 the first and second vertical spark gap devices sharing the common resistive layer 2525*a*.

In some implementations, at least one of the first and second top electrodes 2545, 2546 may be configured (e.g., have sufficient area) to span a two or more bottom electrode fingers along one or both of the two orthogonal directions (e.g., lateral and longitudinal directions) parallel to a major surface of the resistive layer 2525*a*.

In some embodiments the first and second top electrodes 2545, 2546 are electrically connected fourth and fifth contact pads 2563, 2564 via first and second plurality of conductive vias 2561, 2562. In some embodiments, the fourth and fifth contact pads 2563, 2564 can be connected to a second voltage node. In some other embodiments, the fourth and fifth contact pads 2563, 2564 can be connected to different voltage nodes.

As configured, the arc discharge that is generated between each electrode pair extends generally in the vertical direction, e.g., through an ILD layer formed between the second and third metallization layers, in response to an EOS voltage signal received between first and second voltage nodes.

In some examples, the top electrodes and the bottom electrode fingers may form first and second arrays of arcing metal layers where the second array of electrode arcing metal layers are strapped together by the common resistive layer (or line) 2525*a*. The common resistive layer 2525*a* may serves as a series resistor or a ballast resistor electrically connected in series between each of the arcing gap pairs and one or both of the first and second voltage nodes, wherein a resistance of the series resistor is substantially higher than a resistance of a respective one of the first and second acing metal layers between the series resistor and a respective one of the first and second voltage nodes. In some embodiments, the resistive layer 2525*a* may comprise one or more low resistivity regions and one or more high resistivity regions. For example, regions of the resistive layer under the bottom electrode fingers 2502*a*, 2502*b*, 2506*a* and 2506*b*, and/or contact segments 2504, 2508 and 2510 can have lower resistivity compared to intervening regions extending between the bottom electrode fingers and contact segments. In some such embodiments, a low resistivity region under and/or around an electrode finger or contact segment may be surrounded with a high resistivity region (extended in two dimensions) configured to limit electric current flow into or out of the low resistivity region along multiple directions within the resistive layer 2525*a*.

In some embodiments, one or more of the bottom electrode fingers 2502*a*, 2502*b*, 2506*a* and 2506*b*, and/or contact segments 2504, 2508 and 2510 may vertically extend from a bottom surface of the resistive layer 2525*a* of the segmented conductive layer 2525*b* toward the respective top electrodes and conductive regions. In some such embodiments, resistive layer 2525*a* may comprise a through hole and an electrode finger or a contact segment may be formed by overfilling the hole with a low-resistivity material (e.g., TiW).

In some implementations, a difference between sheet resistance of a low resistivity region of the resistive layer 2525*a* and sheet resistance of the segmented conductive layer 2525*b* (or the sheet resistance of the individual bottom electrode fingers) can be less than 5 ohms/sq, less than 10 ohms/sq, less than 50 ohm/sq, or less than 100 ohms/sq, or larger or smaller values.

In some implementations, a resistivity of a high resistivity region of the resistive layer 2525*a* (resistive sheet) can be greater than the resistivity of a low resistivity region of the resistive layer 2525*a* by a factor from 1.5 to 10, from 10 to 50, from 50 to 100, from 100 to 1000, or any ranges formed by these values or larger values.

In some implementations, a resistivity or an average resistivity of the resistive layer 2525*a* (resistive sheet) can be greater than the resistivity of the segmented conductive layer 2525*b* (or the resistivity of the individual bottom electrode fingers) by a factor from 1.5 to 10, from 10 to 50, from 50 to 100, from 100 to 1000, or any ranges formed by these values or larger values.

In some implementations, a thickness of the segmented conductive layer 2525*b* (or the thickness of the individual bottom electrode fingers) can be greater than the thickness of the resistive layer 2525*a* (resistive sheet) by a factor from 1.1 to 2, from 2 to 4, from 4 to 6, from 6 to 10, from 10 to 50, from 50 to 100 or any ranges formed by these values or larger values.

In some implementations, the thickness of the resistive layer 2525*a* (resistive sheet) can be from 1 nm to 10 nm, from 10 nm to 0.1 microns, form 0.1 to 0.2 microns, from 0.2 to 1 micron, from 1 to 5 microns, from 5 to 10 microns, or any ranges formed by these values or larger values.

In a similar manner as described above, in operation, a first of the arcing gap pairs having the lowest triggering voltage will electrically arc first. As the current flowing through the first arcing gap increases, the voltage drop thereacross increases. Once the voltage across the first arcing gap pair exceeds a trigger voltage of another one of the arcing gaps of the arcing gap pair, the next arcing gap having the next lowest trigger voltage triggers, causing the current to divide between the first and next arcing gaps. When more bottom electrode fingers overlap with a top electrode, forming more than two arcing gaps, the process will continue with additional arcing gaps so long as the voltage drop developed across conducting ones of the arcing gaps exceeds the trigger voltage of the next untriggered electrode pair having the next lowest trigger voltage. In a similar fashion, arcing gaps associated with different top electrodes of the vertical spark gap array may trigger based on the trigger voltages or an average trigger voltage of the corresponding arcing gaps.

FIGS. 26A-26D schematically illustrate four cross-sectional views of the vertical spark gap array 2500 shown in FIG. 25. Each cross-section is formed by a horizontal cut plane parallel to a major surface of a substrate on which the vertical spark gap array 2500 is formed. In the examples shown the cut plane is parallel to x-y plane. Each cut plane passes through a different vertical position along a direction perpendicular to the cut plane (e.g., parallel to z-axis).

Figures 26A, 26B, 26C, 26D:
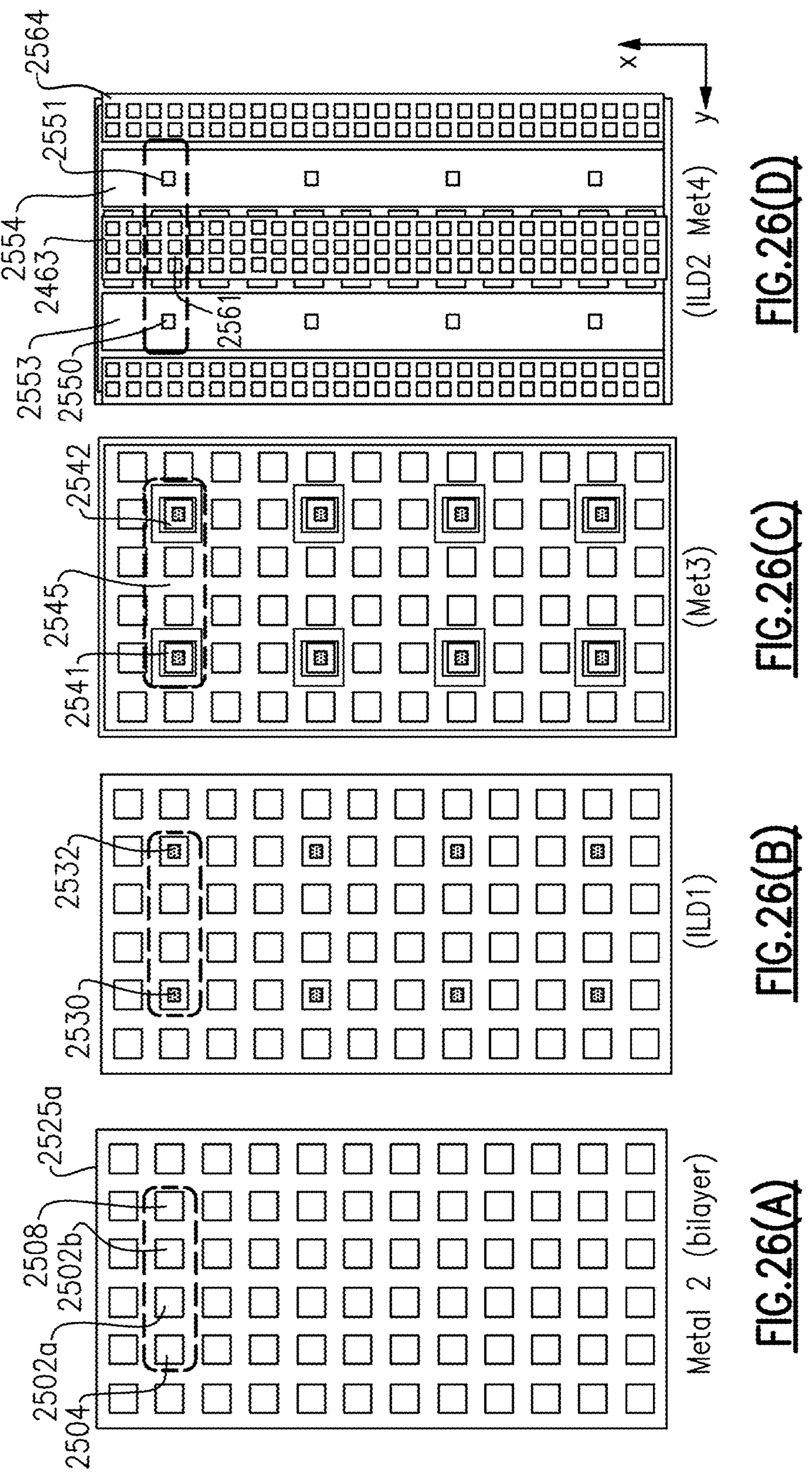
FIGS. 26A-26D schematically illustrate four cross-sectional views of the vertical spark gap array shown in FIG. 25. Each cross-section is formed by a horizontal cut plane parallel to a major surface of a substrate on which the vertical spark gap array is formed.

FIG. 26A is a cross-section of the vertical spark gap array 2500 in a cut plane passing through the segmented conductive layer 2525*b* showing a matrix of conductive segments comprising the bottom electrode fingers and contact segments configured to connect the resistive layer 2525*a* to a contact pad). The subset of conductive segments in the dashed box correspond to the first and second contact segments 2504, 2508 and the first and second bottom electrode fingers 2502*a*, 2502*b*. The resistive layer 2525*a* may electrically connect the electrode fingers and contact segments, e.g., via regions of the resistive layer 2525*a* serving as series ballast resistors.

As described above, in some embodiments, the resistive layer 2525*a* may comprise high-resistivity and low-resistivity regions. In some examples, a high-resistivity regions may comprise non-silicided polysilicon and a high resistivity region may comprise silicided polysilicon. In some cases, a silicided polysilicon region may comprise a polysilicon region partially covered by a silicide layer. In some such embodiments, a resistive region may serve as a distributed ballast resistor for EOS protection.

In some embodiments, an electrode finger (e.g., the bottom electrode fingers 2502*a*, 2502*b*) and/or a contact segment (e.g., contact segments 2504, 2508) may be formed at least partially within an opening or a through hole formed in the resistive layer 2525*a*. In some such embodiments, the resistive layer 2525*a* may comprise a low-resistivity region formed around the hole and a high-resistivity region formed around the low-resistivity region thereby serving as two-dimensionally distributed ballast resistor that limits current flow to or from the electrode finger or contact segment along a plurality of directions within the resistive layer 2525*a*.

In some implementations, the high-resistivity region of the resistive layer 2525*a* may be electrically connected to a voltage node via an edge of the resistive layer 2525*a*. In such implementations, the high-resistivity region of the resistive layer 2525*a* may be electrically connected to the voltage node through a second low-resistivity region surrounding the high-resistivity region. The second low-resistivity region may extend from the high-resistivity region to the edge of the resistive layer 2525*a*.

FIG. 26B is a cross-section of the vertical spark gap array 2500 in a cut plane passing through first, second, and third conductive vias 2530, 2532, 2534. The conductive vias (e.g., conductive vias 2530, 2532) can be configured to electrically connect the contact segments (e.g., the contact segments 2504, 2508) and thereby the resistive layer 2525*a* and the electrode fingers (e.g., the bottom electrode fingers 2502*a*, 2502*b*) to a first voltage node (e.g., via one or more conductive regions and contact pads and ballast resistance). In some implementations, a contact segment can be electrically connected to a conductive region by one or more conductive vias. As shown in FIG. 26B, in this specific arrangement, each row (herein referred to a contacted row) of conductive segments that comprises two or more contact segments, is followed by two rows of electrode fingers that do not include any contact segment and each contacted row two electrode fingers are formed between two subsequent contact segments along the lateral direction (e.g., parallel to y-axis). In some embodiments, a number and distribution of conductive vias over contact segments may be configured based at least in part of electrical properties of the resistive layer 2525*a* and interspacing between the contact segments to provide electrical connections having a desired characteristics to the electrode fingers.

FIG. 26C is a cross-section of the vertical spark gap array 2500 in a cut plane passing through the first, second, and third conductive regions 2541, 2542, 2543 and the first and second top electrodes 2545, 2546. FIG. 26D is a cross-section of the vertical spark gap array 2500 in a cut plane passing through the fourth, fifth, and sixth conductive vias 2550, 2551, 2552 and the first and second plurality of conductive vias 2561, 2562. As shown in FIG. 26D, in this specific arrangement, the conductive regions in the same column are electrically connected to a common contact pad elongated along the longitudinal direction (e.g., along x-axis). For example, the conductive regions in a first column are electrically connected to a first common contact pad 2553, and the conductive regions in a second column are electrically connected to a second contact pad 2554.

FIG. 26D further shows that, in this specific arrangement, the pluralities of the conductive vias connecting the top electrodes in the same column are electrically connected to a common contact pad elongated along the longitudinal direction (e.g., along x-axis). For example, the first plurality of conductive vias 2561 and plurality of conductive vias in the same column are connected to the fourth contact pad 2563.

In some embodiments, a lateral spacing between a conductive region of the third metallization layer that provides electrically connection between a contact segment of the segmented conductive layer 2525*b* and a contact pad, and an adjacent top electrode can be from 0.1 to 1 micron, from 1 to 5 microns, from 5 to 10, from 10 to 20 microns or any ranges formed by these values or larger or smaller. In some examples, the lateral spacing between the first conductive region 2541 and the first top electrode 2545 is 0.6 microns.

In some embodiments, a lateral spacing between the segments of the segmented conductive layer 2525*b* can be from 0.1 to 1 micron, from 1 to 5 microns, from 5 to 10, from 10 to 20 microns or any ranges formed by these values or larger or smaller. In some examples, the lateral spacing between the segments of the segmented conductive layer 2525*b* is 0.94 microns.

In some embodiments a lateral spacing between the contact pads can be from 0.1 to 1 micron, from 1 to 5 microns, from 5 to 10, from 10 to 20 microns or any ranges formed by these values or larger or smaller values. In some examples, the lateral spacing between first, second, third, fourth, and fifth contact pads 2553, 2554, 2555, 2563, 2564 is 0.6 microns.

In some embodiments, a lateral width of a conductive region of the third metallization layer that provides electrically connection between a contact segment of the segmented conductive layer 2525*b* and a contact pad, and an adjacent top electrode can be from 0.1 to 1 micron, from 1 to 5 microns, from 5 to 10, from 10 to 20 microns or any ranges formed by these values or larger or smaller. In instance, the lateral width of each of the first, second, and third conductive regions 2541, 2542, 2543 is 0.6 microns.

In some embodiments, a lateral width of a segment of the segmented conductive layer 2525*b* (e.g., an electrode finger or a contact region) can be from 0.1 to 1 micron, from 1 to 5 microns, from 5 to 10, from 10 to 20 microns any ranges formed by these values or larger or smaller values. For instance, the lateral width of first, second, third, and fourth bottom electrode fingers 2502*a*, 2502*b*, 2506*a*, 2506*b* is 1.06 micron.

In some embodiments, a lateral width of a contact pad can be from 0.1 to 1 micron, from 1 to 5 microns, from 5 to 10, from 10 to 20 microns or any ranges formed by these values or larger or smaller values. For instance, the lateral width of the first, second, third, fourth, and fifth contact pads 2553, 2554, 2555, 2563, 2564 is 2.4 microns.

In some embodiments, a lateral width of a conductive via connecting a contact segment of the segmented conductive layer 2525*b* and a conductive region of in the third metallization layer can be from 0.05 to 0.1 microns, from 0.1 to 1 micron, from 1 to 3 microns, from 3 to 5 microns or any ranges formed by these values or larger or smaller. For instance, the lateral width of the first, second, and third conductive vias 2530, 2532, 2534 is 0.26 microns.

In some embodiments, a lateral width of a conductive via connecting a top electrode to a contact pad can be from 0.05 to 0.1 microns, from 0.1 to 1 micron, from 1 to 3 microns, from 3 to 5 microns or any ranges formed by these values or larger or smaller. For instance, the lateral width of the fourth, fifth, and sixth conductive vias 2550, 2551, 2552 and the first and second plurality of conductive vias 2561, 2562 is 0.36 microns.

In some embodiments, a conductive vias can be extended from a middle lateral point of a contact segment to a middle lateral point of a conductive region in the third metallization layer.

In some embodiments, a conductive vias can be extended from mid lateral point of a conductive region in the third metallization layer to a middle lateral point of a contact pad.

Spark Gap Devices with Structured or Fluidic Arcing Medium

As described above, the inventors have discovered that vertical spark gap devices having arcing electrodes designed to arc between overlapping lateral surfaces, e.g., planar surfaces, of vertically separated electrodes rather than between, e.g., sharpened tips of lateral spark gap devices, the reusability and reliability of arcing electrodes can be improved. Various physical features of the vertical spark gap structures can be adjusted to control electrical parameters, e.g., trigger voltage ($V_{TR}$), associated with a vertical spark gap (e.g., used as EOS monitor device and/or protection device). For example, the inter-electrode vertical separation (gap distance), the material and the shape of the arcing tips can be controlled to control $V_{TR}$ and/or the amount of current flow after triggering. In various fabrication technologies such as semiconductor fabrication technologies, thicknesses of the various layers can be controlled relatively precisely and cost-effectively, compared to, e.g., controlling lateral dimensions of the layers using patterning techniques. In the following, various structures and methods associated with the arcing medium are disclosed, which provide yet another degree of freedom in controlling the electrical parameters, e.g., trigger voltage, associated the EOS monitor device and/or an EOS protection device.

Figure 27B:
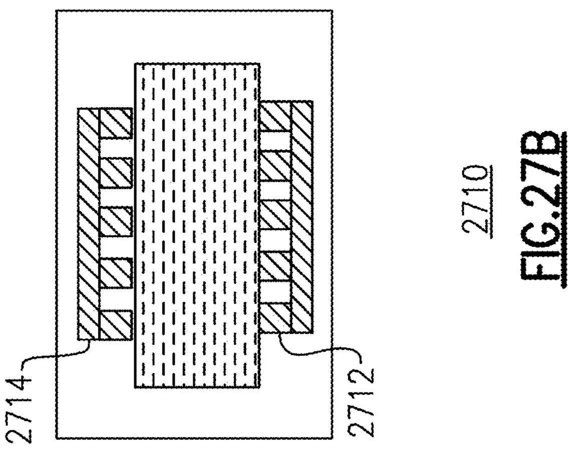
FIG. 27B illustrates a side cross-sectional view of an example of a multi-gap vertical spark device, according to some embodiments.
Figure 27A:
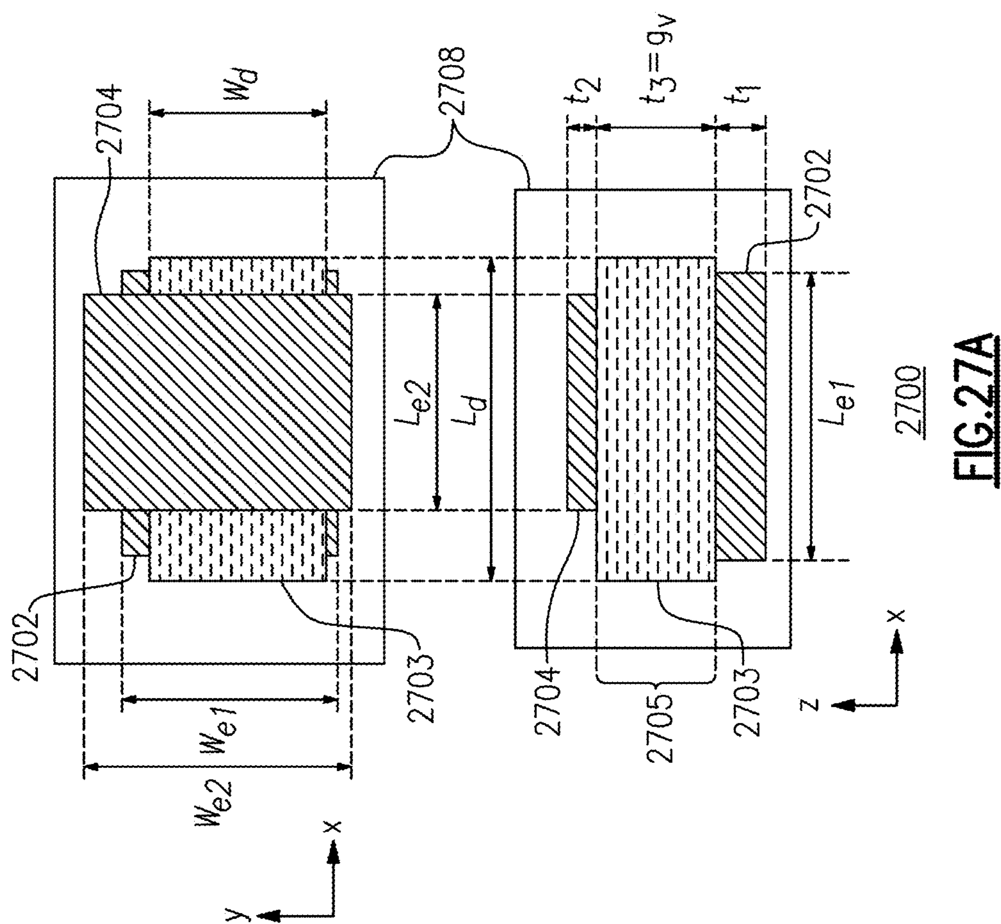
FIG. 27A illustrates a top-down view (top panel) and a side cross-section view (bottom panel) of an example of a vertical spark device, according to some embodiments.

FIG. 27A schematically illustrates an example vertical spark gap design having a first electrode or metallic layer 2702 (e.g., a bottom electrode) vertically separated from a second electrode or metallic layer 2704 (e.g., a top electrode) by an inter-electrode dielectric layer 2705 having an inter-electrode region 2703. In some embodiments, the bottom electrode 2702, the top electrode 2704, can be formed in two different metallization layers of an IC and inter-electrode dielectric layer 2705 can be an inter-layer dielectric (ILD) layer between the two metallization layers. The bottom electrode 2702 can have a length ($L_{e1}$) along a longitudinal direction (e.g., along x-axis), have a thickness ($t_1$) along a vertical direction (e.g., along z-axis) and a width ($W_{e1}$) along a lateral direction (e.g., along y-axis). The top electrode 2704 can have a length ($L_{e2}$) along the longitudinal direction, have a thickness ($t_2$) along the vertical direction and a width ($W_{e2}$) along the lateral direction. The inter-electrode region 2703 can have a length ($L_d$) along the longitudinal direction, have a thickness ($t_3$) along the vertical direction and a width ($W_d$) along the lateral direction. In various embodiments, the geometry and material composition of the inter-electrode region 2703 may be engineered to control the electrical properties of the vertical spark gap 2700. For example, the thickness ($t_3$), also referred to as vertical arcing gap size ($g_V$), and a composition of the inter-electrode region 2703 can be designed to provide a target $V_{TR}$.

In various implementations, $L_{e1}$, $L_{e2}$ and $L_d$ can be from 0.18 to 1 micron, from 1 to 20 microns, from 20 to 50 microns or any ranges formed by these values or larger or smaller values.

In various implementations, $t_1$ and $t_2$ can be from 1 to 10 nm, from 10 nm to 100 nm, from 0.1 to 1 micron, from 1 to 5 microns or any ranges formed by these values or larger or smaller values.

In various implementations, $W_{e1}$, $W_{e2}$ and $W_d$ can be from 2 to 10 microns, from 10 to 20 microns, from 20 to 50 microns or any ranges formed by these values or larger or smaller values.

In various implementations, $g_V$=$t_3$ can be from 1 to 10 nm, from 10 nm to 100 nm, from 0.1 to 1 micron or any ranges formed by these values or larger or smaller values.

In some embodiments, the inter-electrode region 2703 may comprise two or more regions (e.g., layers and/or lateral sections) each comprising a different material and/or compositions. In some such embodiments, the geometry of these regions (e.g., lateral extension and/or thickness) can be engineered to control the electrical properties of the resulting arcing gap (e.g., the $V_{TR}$). For example, the inter-electrode region 2703 may comprise multiple dielectric layers having different compositions and thicknesses.

In some embodiments, one or both of the bottom electrode 2702 and the top electrode 2704 can be segments electrodes having a plurality of electrode fingers electrical connected via a common (or contact) region. FIG. 27B schematically illustrates an example vertical spark gap 2710 having segmented top and bottom electrodes. In this example shown, the segmented bottom and top electrodes 2712, 2714, each include five electrode fingers and the vertical spark gap 2710 includes five arcing gaps formed by five electrode finger pairs each comprising one bottom electrode finger and one top electrode finger. In various embodiments, such as the example shown, the electrode finger may extend away from a common section in a vertical direction or in a lateral direction.

In various implementations, $V_{TR}$ of the vertical spark gap device 2700 (or 2710) can be from 3.3 to 15 volts, from 5.5 to 30 volts, from 10 to 1000 volts, from 500 volts to 1000 volts or any ranges formed by these values or larger or smaller values.

In some embodiments, one or both top and bottom electrodes 2702, 2704, may comprise a metal (e.g., aluminum, titanium, or tungsten) or a metallic alloy. In some embodiments, one or both top and bottom electrodes 2702, 2704, may comprise a metal-semiconductor compound. In some embodiments, one or both top and bottom electrodes 2702, 2704 may comprise a doped region in a semiconductor layer (e.g., a silicon layer). In some embodiments, one or both top and bottom electrodes 2702, 2704 may include two or more layers each comprising a metal, a metal alloy, or a metal-semiconductor compound.

In some embodiments, the inter-electrode region 2703 may comprise a gas (e.g., an inert gas) or gas mixture. In some such examples the inter-electrode region 2703 may comprise a sealed volume configured to maintain the gas or gas mixture at a certain pressure. In various implementations, the gas or gas mixture may comprise nitrogen, helium, carbon dioxide, argon, neon, or xenon; however other gas molecules may be included in some cases. In some implementations, the gas pressure and/or mixture may be tailored to control $V_{TR}$. In some of these implementations, the vertical spark gap devices 2700 (or 2710) may be configured to provide functionaries other than electrostatic discharge (ESD) protection or monitoring. For example, the vertical spark gap devices 2700 (or 2710) may serve as an electronic device having certain electrical or electro-optical characteristics (e.g., current-to-voltage dependence) tailored for a specified application (e.g., electronic switching, amplification, oscillation, optical modulation and the like).

In the following, various embodiments of an integrated circuit device with EOS monitoring or protection include a semiconductor substrate and one or more conductive structures or spark gap structures integrated on the semiconductor substrate and configured to electrically arc in response to an EOS event at a trigger voltage less than about 100V.

Some of the fabrication methods described below may be used to control a vertical point electrode dielectric breakdown.

In some embodiments, at least one dielectric material used in the structure of a vertical spark gap may have etch selectivity with respect to a dry and/or wet etch chemistry allowing precise control over the geometry of a layer or region of the vertical spark gap. For example, the inter-electrode region 2703 may comprise a dielectric material that can be selectively etched to control $g_V$, $t_3$, $L_d$ and/or $W_d$.

FIGS. 28A-28D illustrate side views of intermediate structures at various stages of fabricating an EOS monitor/protection device (e.g., a vertical spark gap) 2800D configured to electrically arc in response to an EOS event at a trigger voltage less than about 100V, according to embodiments. The EOS monitor/protection device 2800D comprises a pair of conductive structures that are configured to arc in response to an EOS event, in a similar manner as described above with respect to various embodiments. Referring to FIG. 28D, the pair of conductive structures of the EOS monitor/protection device 2800D comprises a doped region 2808 in a semiconductor substrate 2802 that is doped heavier relative to the semiconductor substrate 2802. The doped region 2808 serves as a first conductive structure of the pair of conductive structures, and as one of a cathode or an anode during arcing. The pair of conductive structures additionally includes a conductive structure 2816, e.g., a conductive via or a plug structure, that is formed above the doped region 2808 and serves as the second conductive structure of the pair of conductive structures, and the other of the cathode or the anode during arcing. The doped region 2808 and the conductive structure 2816 are interposed by a first dielectric layer 2804 that serves as an arcing medium. The conductive structure 2816 can be formed of multiple layers of materials. For example, in the illustrated embodiment, the conductive structure 2816 includes a trigger voltage tuning layer 2812 contacting the first dielectric layer 2804 and a current carrying or filler conductive structure 2814 formed on the trigger voltage tuning layer 2812. Additional details of the feature of the pair of conductive structures are provided below, along with a method of forming the same.

Referring to FIG. 28A, an intermediate structure 2800A is illustrated, which includes a substrate 2802 in which a doped region 2808 is formed, followed by formation of a first dielectric layer 2804 on the substrate 2802 and formation of a second dielectric layer 2806 over the substrate 2802.

The substrate 2802 can be implemented in a variety of ways, including, but not limited to, a doped semiconductor substrate, which can be formed of an elemental Group IV material (e.g., Si, Ge, C or Sn) or an alloy formed of Group IV materials (e.g., SiGe, SiGeC, SiC, SiSn, SiSnC, GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials. The substrate can also be implemented as a semiconductor on insulator, such as silicon on insulator (SOI) substrate. An SOI substrate typically includes a silicon-insulator-silicon structure in which the various structures described above are isolated from a support substrate using an insulator layer such as a buried $SiO_2$ layer. In addition, it will be appreciated that the various structures described herein can be at least partially formed in an epitaxial layer formed at or near a surface region.

The doped region 2808 can be doped with the same or opposite dopant type as the substrate 2802 when the substrate 2802 is doped. The doped region 2808 can generally have a peak dopant concentration between about $1\times10^{13}$ $cm^{-3}$ and about $1\times10^{22}$ $cm^{-3}$. In some embodiments, the doped region 2808 comprises a heavily doped regions ($N^+$ or $P^+$ regions) that can have a peak doping concentration exceeding about $1\times10^{18}$ $cm^{-3}$ or about $1\times10^{19}$ $cm^{-3}$. However, embodiments are not so limited and the doped region 2808 can include a lightly doped region ($N^-$ or $P^-$ regions) that can have a peak doping concentration lower than about $1\times10^{14}$ $cm^{-3}$ or about $1\times10^{13}$ $cm^{-3}$ The doped region 2808 can also include an intermediately doped region having a doping concentration in a range defined by any of the above values.

The doped region 2808 can be formed by ion implantation of dopants, e.g., p-type or n-type dopants. For example, when the doped region 2808 comprises a localized doped region, the doped region 2808 may be formed by patterning an opening through a masking layer (not shown), e.g., a photoresist layer, formed over the substrate 2802. The patterning may be performed, e.g., lithographically. The ion implantation may be performed at any suitable point during fabrication including before formation of the first dielectric layer 2804, after formation of the first dielectric layer 2804, after formation of the second dielectric layer 2806, by forming and patterning the masking layer on the substrate 2802 before formation of the first dielectric 2804, after formation of the first dielectric layer 2804, and after formation of the second dielectric layer 2806, respectively.

However, embodiments are not so limited. For example, other masking (e.g., imprinting or shadow masking) and doping (e.g., diffusion) techniques may be used in lieu or in addition to using a patterned resist layer as an implantation mask.

The material and the thickness of the first dielectric layer 2804 are selected such that it can relatively reliably break down at a low voltage thereacross. In various embodiments, a suitable dielectric material may include $SiO_2$, $Si_3N_4$, $TiO_2$, $Ta_2O_5$, $SrTiO_3$, $ZrO_2$, $HfO_2$, $Al_2O_3$, $La_2O_3$, $Y_2O_3$, $HfSiO_4$, $LaAlO_3$ or non-stoichiometric versions of the above as well as various mixtures and combinations or stacks thereof, to name a few. Without being bound to any theory, it will be appreciated that, in some instances, dielectric materials with relatively high conduction band offsets relative to the electron emitting trigger voltage tuning layer 2812 may give rise to relatively higher triggering voltage, due to a higher energy barrier the electrons must overcome before substantial current starts to flow there through, which may eventually lead to a full onset of arcing. The first dielectric layer 2804 may be formed using a suitable technique, such as thermal oxidation, atomic layer deposition (ALD), chemical vapor deposition (CVD), physical vapor deposition (PVD), evaporation, spin-coating, etc., to name a few. It will be appreciated that the thickness can be selected based on a variety of factors, including the desired trigger voltage for arcing, the material of the first dielectric layer 2804, the doping type/level of the doped region 2808 serving as one of a cathode or an anode, the material of the trigger voltage tuning layer 2812 contacting the first dielectric layer 2804, and the shape of the conductive structure (2816, FIG. 28D) serving as the other of the cathode or the anode, among other physical attributes of the EOS monitor/protection device 2800D (FIG. 28D). According to various embodiments, for trigger voltage less than about 100V, the thickness of the first dielectric layer 2804 can be between about 1-10 nm, 10-20 nm, 20-50 nm, 50-100 nm, 100-200 nm, 200-300 nm, 300-400 nm, 400-500 nm, 500-600 nm, 600-700 nm, 700-800 nm, 800-900 nm, 900 nm-1000 nm, or a thickness in a range defined by any of these values.

The material and the thickness of the second dielectric layer 2806 are selected such that it can serve as suitable template for defining the shape of the current carrying structure 2814, as described below. The material of the second dielectric layer 2806 is selected such that it can be etched selectively against the first dielectric layer 2804, as described below. A suitable material for the second dielectric layer 2806 can include a different material from the first dielectric layer 2804, e.g., a dielectric material such as $SiO_2$ or $Si_3N_4$, polysilicon, amorphous silicon, a polymeric material or a metal. The thickness can be, e.g., greater than that of the first dielectric layer 2804, e.g., 100 nm-100 □m.

Referring to FIG. 28B, an intermediate structure 2800B is illustrated, which represents the intermediate structure 2800A (FIG. 28A), which has been further processed to form an opening 2810 through the second dielectric layer 2806. The opening 2810 may be formed by a suitable masked etching process. For example, a photoresist layer (not shown) may be formed on the second dielectric layer 2806 and locally removed to form an opening therethrough, followed by a suitable etching process to form the opening 2810. The patterning may be performed, e.g., lithographically or using other suitable techniques. The bottom of the opening 2810 at least partly laterally overlaps the doped region 2808. In the illustrated embodiment, the opening 2810 is laterally formed within the doped region 2808. The suitable etching process can be a wet and/or a dry etching process, where the etch removal is substantially selective between the first and second dielectric materials 2804, 2806, such that the etch removal stops at the first dielectric layer 2804.

The opening 2810 is formed to have a suitable shape that is adapted for arcing, e.g., at a voltage less than about 100V. For example, in the illustrated embodiment, the opening 2810 has a tapered profile such that the sidewalls of the opening 2810 forms an angle □ greater than >90° with respect to the horizontal surface of the bottom surface of the opening 2810. For example, the □ may be 90°-100°, 100°-110°, 110°-120°, 120°-130°, 130°-140°, 140°-150°, 150°-160°, 160°-170°, or any angle in a range defined by any of these values, according various embodiments. While not illustrated, the opening 2810 can have any suitable lateral shape, i.e., the shape apparent in a top-down view, e.g., circle, oval or a polygon. In the illustrated embodiment, the bottom surface of the opening 2810 has a suitable width d which, in combination with the □, defines the sharpness of the arcing region of the conductive structure 2816 (FIG. 28D).

Referring to FIG. 28C, an intermediate structure 2800C is illustrated, which represents the intermediate structure 2800B (FIG. 28B), which has been further processed to form the trigger voltage tuning layer 2812 on the inner surfaces of the opening 2810. The trigger voltage tuning layer 2812 may be selectively deposited in the opening 2810, or blanket deposited followed by removing from regions outside the opening 2810.

The material of the trigger voltage tuning layer 2812 is selected to have a particular work function to tune the trigger voltage or the arcing voltage of the pair of conductive structures. Without being bound to any theory, it will be appreciated that the trigger voltage or the arcing voltage of the pair of conductive structures can depend in part on an energy difference between a metal work function of the trigger voltage tuning layer 2812 and the Fermi level of the doped region 2808.

In some embodiments, when the doped region 2808 is p-doped, the trigger voltage tuning layer 2812 may include a p-doped semiconductor such as polycrystalline silicon or a suitable "p-type" metal such that the work function $\Phi_m$ of the trigger voltage tuning layer 2812 is engineered to be between about 4.1 eV and about 4.65 eV, between about 4.1 eV and about 4.4 eV, or between about 4.4 eV and about 4.65 eV. However, embodiments are not so limited, and in other embodiments, the trigger voltage tuning layer 2812 may have these work function values when the doped region 2808 is n-doped.

In some other embodiments, when the doped region 2808 is n-doped, the trigger voltage tuning layer 2812 may include an n-doped semiconductor material such as n-doped polycrystalline silicon or a suitable metal such that the work function $\Phi_m$ of the trigger voltage tuning layer 2812 is engineered to be between about 4.65 eV and about 5.2 eV, between about 4.65 eV and about 4.9 eV, or between about 4.9 eV and about 5.2 eV. However, embodiments are not so limited, and in other embodiments, the trigger voltage tuning layer 2812 may have these work function values when the doped region 2808 is p-doped.

In various embodiments, suitable metals for the trigger voltage tuning layer 2812 include, e.g., aluminum (Al), tungsten (W), titanium (Ti), tantalum (Ta), niobium (Nb), molybdenum (Mo), rubidium (Ru), WN, TiN, TaN, TaCN, and $TaSi_xN_y$, to name a few.

In some embodiments, trigger voltage tuning layer 2812 may be chosen such that the difference ($\Phi_m - E_F$), where $\Phi_m$ is the work function of the trigger voltage tuning layer 2812 and $E_F$ is the Fermi level of the doped region 2808 channel region, does not exceed about 0.8 eV, 0.5 eV, 0.3 eV, 0.2 eV or a value in any range defined by these values.

The trigger voltage tuning layer 2812 may be formed by a suitable technique, e.g., atomic layer deposition (ALD), chemical vapor deposition (CVD) or physical vapor deposition (PVD).

Referring to FIG. 28D, an intermediate structure 2800D is illustrated, which represents the intermediate structure 2800C (FIG. 28C), which has been further processed to fill the remaining space in the opening 2810 with a current carrying metal or a filler metal to form the current carrying conductive structure 2814 to complete formation of the conductive structure 2816. The current carrying metal may be a suitable material such as aluminum, copper, tungsten, or heavily doped silicon, to name a few examples. The current carrying conductive structure 2814 may be blanket deposited, followed by removal from regions outside the opening 2810 by, e.g., chemical mechanical polishing. The current carrying conductive structure 2814 may be formed by a suitable technique, e.g., atomic layer deposition (ALD), chemical vapor deposition (CVD) and physical vapor deposition (PVD).

Thus, the pair of conductive structures comprising a doped region 2808 in a semiconductor substrate 2802 that is doped heavier relative to the semiconductor substrate 2802 serving as one of a cathode or an anode during arcing in response to an EOS event, and a conductive structure 2816 serving as the other of the cathode or the anode during arcing in response to the EOS event is formed, as described above.

FIGS. 29A-29D illustrate side views of intermediate structures at various stages of fabricating an EOS monitor/protection device 2900D configured to electrically arc in response to an EOS event at a trigger voltage less than about 100V, according to some other embodiments. The EOS monitor/protection device 2900D comprises a pair of conductive structures that are configured in a similar manner as described above with respect to FIGS. 28A-28D in some aspects, and a detailed description of similar aspects are omitted herein for brevity. For example, referring to FIG. 29D, the pair of conductive structures comprises a doped region 2808 formed in a semiconductor substrate 2802 that is doped heavier relative to the semiconductor substrate 2802, and serves as one of the cathodes or the anode during arcing. The pair of conductive structures additionally includes a conductive structure 2904 formed above the doped region 2808 and serves as the second conductive structure of the pair of conductive structures, and the other of the cathode or the anode during arcing. The doped region 2808 and the conductive structure 2904 are interposed by a first dielectric layer 2804. However, unlike the conductive structure 2816 described above with respect to FIG. 28D, the conductive structure 2904 does not include includes a trigger voltage tuning layer 2812. In addition, the conductive structure 2904 does not have tapered sidewalls and the lateral width of the conductive structure 2904 is relatively constant in a vertical direction, instead of decreasing towards the substrate 2802. Additional details of the feature of the pair of conductive structures are provided below, along with a method of forming the same.

Figures 29A, 29B, 29C, 29D:
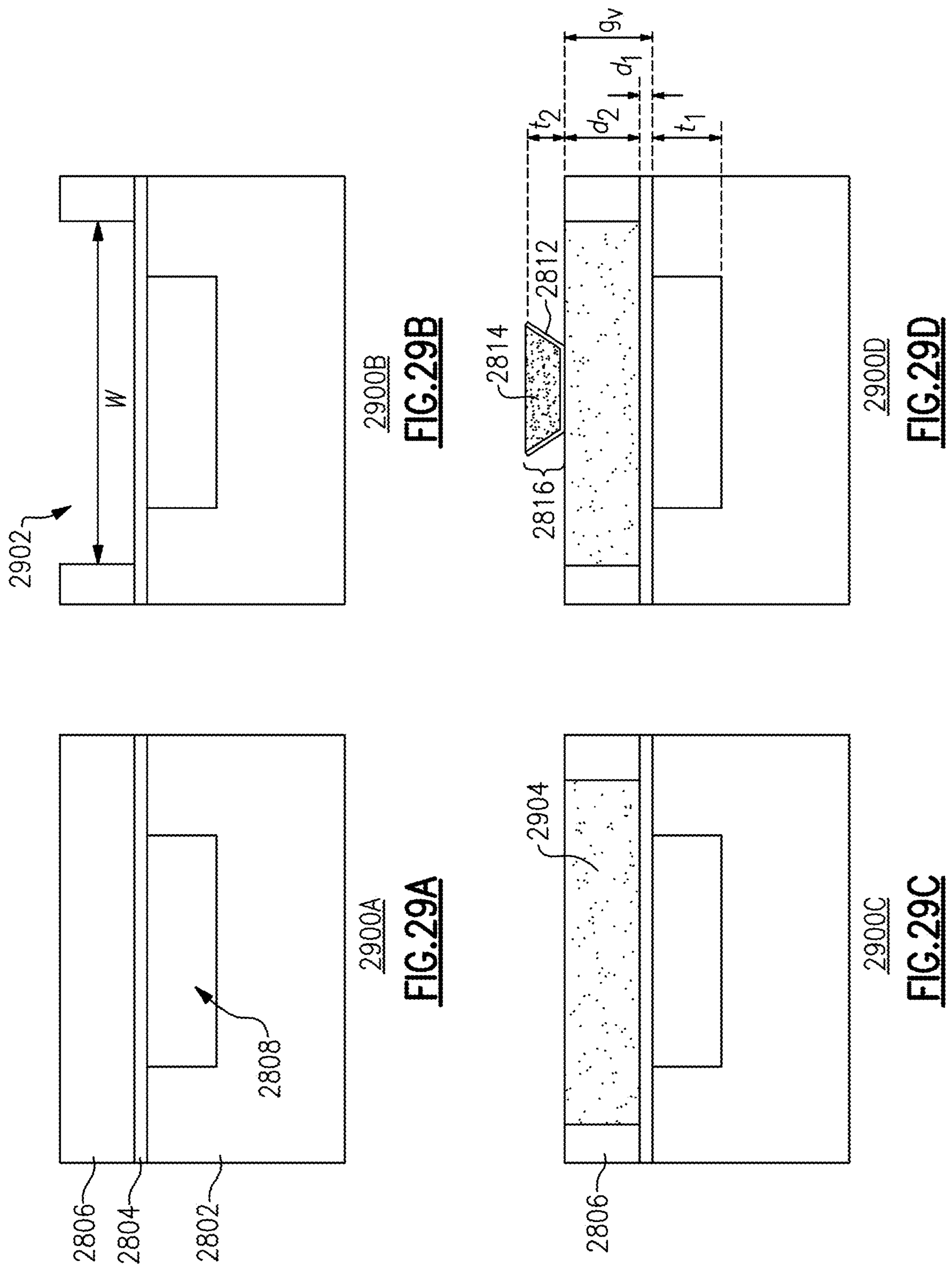
FIGS. 29A-29D illustrate side views of intermediate structures at various stages of fabricating another vertical spark gap EOS monitor/protection device comprising a pair of conductive layers having a double layer inter-electrode dielectric layer, according to some embodiments.

Referring to FIG. 29A, an intermediate structure 2900A is illustrated, which includes a substrate 2802 in which a doped region 2808 is formed, followed by formation of a first dielectric layer 2804 on the substrate 2802 and formation of a second dielectric layer 2806. At this stage of fabrication, the intermediate structure 2900A is similar to the intermediate structure 2800A described above with respect to FIG. 28A, and the details of the fabrication steps are omitted herein for brevity.

Referring to FIG. 29B, an intermediate structure 2900B is illustrated, which represents the intermediate structure 2900A (FIG. 29A), which has been further processed to form an opening 2902 through the second dielectric layer 2806. The opening may be formed in a similar manner as that described above with respect to FIG. 28B except, the lateral dimension d of the opening 2902 is larger than the width of the doped region 2808 and laterally extends outside of the lateral footprint occupied by the doped region 2808. In addition, the opening 2902 is formed to have a relatively straight profile instead of having tapered sidewalls.

Referring to FIG. 29C, an intermediate structure 2900C is illustrated, which represents the intermediate structure 2900B (FIG. 29B), which has been further processed to fill the opening 2902 with a trigger the voltage tuning layer to form the conductive structure 2904. The trigger voltage tuning layer may be selectively deposited in the opening 2902, or blanket deposited followed by removing from regions outside the opening 2902.

Referring to FIG. 29D, an intermediate structure 2900D is illustrated, which represents the intermediate structure 2900C (FIG. 29C), which has been further processed to form a contact 2814.

Referring to FIGS. 29C and 29D, in the illustrated embodiment, while a single voltage tuning layer 2904 fills the opening 2902 (FIG. 29B) to form the conductive structure 2904, embodiments are not so limited. In some other embodiments, in a similar manner as described above with respect to FIGS. 28C-28D, the opening 2902 (FIG. 29B) may first be lined with a thin layer of trigger voltage tuning layer, followed by filling of the remaining space in the opening with a current carrying conductive material, in a similar manner as described above with respect to FIGS. 28C-28D to complete the formation of the second conductive structure 2904.

FIGS. 30A-30D illustrate side views of intermediate structures at various stages of fabricating an EOS monitor/protection device 3000D configured to electrically arc in response to an EOS event at a trigger voltage less than about 100V, according to some other embodiments. The EOS monitor/protection device 3000D comprises a pair of conductive structures that are configured in a similar manner as described above with respect FIG. 28D in some aspects, and a detailed description of similar aspects are omitted herein for brevity. However, unlike FIG. 28D, referring to FIG. 30D, the pair of conductive structures comprises a metal layer 3004 formed over a substrate (not shown), e.g., a semiconductor substrate, on which the first dielectric layer 2804 is formed. The metal layer 3004 serves as one of a cathode or an anode during arcing. The pair of conductive structures additionally includes a conductive structure 2816 formed above the metal layer 3004 and serves as the second conductive structure of the pair of conductive structures, or the other of the cathode or the anode during arcing, in a similar manner as described above with respect to FIG. 28D. The metal layer 3004 and the conductive structure 2816 are interposed by the first dielectric layer 2804 that serves as an arcing medium. The conductive structure 2816 includes a trigger voltage tuning layer 2812 contacting the first dielectric layer 2804 and a current carrying conductive structure 2816 formed on the trigger voltage tuning layer 2812. Additional details of the feature of the pair of conductive structures are provided below, along with a method of forming the same.

Figures 30A, 30B, 30C, 30D:
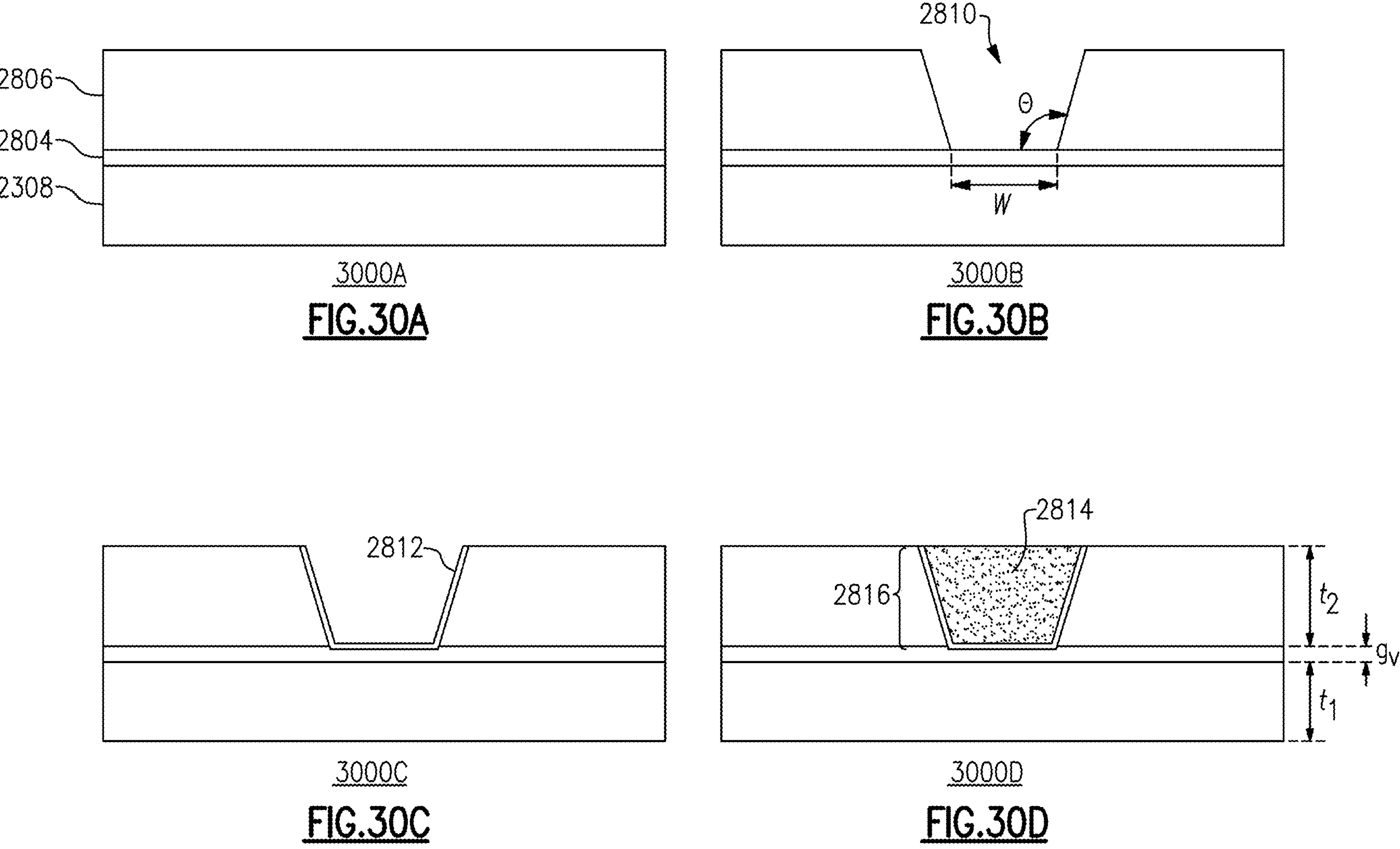
FIGS. 30A-30D illustrate side views of intermediate structures at various stages of fabricating another vertical spark gap EOS monitor/protection device comprising a pair of conductive layers including a bilayer inter-electrode dielectric region, according to some embodiments.

Referring to FIG. 30A, an intermediate structure 3000A is illustrated, which includes a metal layer 3004, which may be formed on a substrate (not shown). The substrate may include a suitable substrate described above with respect to FIG. 28A. Instead of forming a doped region in the substrate as described above with respect to FIGS. 28A and 29A, in the illustrated embodiment, the metal layer 3004 serves as one of the conductive structures of the pair of conductive structures. The formation of the metal layer 3004 is followed by formation of a first dielectric layer 2804 on the metal layer 3004 and a second dielectric layer 2806 on the first dielectric layer 2806. At this stage of fabrication, the intermediate structure 3000A is similar to the intermediate structure 2800A described above with respect to FIG. 28A, except that the semiconductor substrate having a doped region is omitted and replaced by the metal layer 3004, which serves as the first conductive structure of the pair of conductive structures adapted for arcing in response to an EOS event.

Referring to FIGS. 30B, 30C and 30D, intermediate structures 3000B, 3000C and 3000D are illustrated, which are analogously fabricated as the corresponding intermediate structures 2800B (FIG. 28B), 2800C FIG. 28C) and 2800D (FIG. 28D), respectively, a detailed description of which is omitted herein for brevity.

As described above with respect to FIGS. 28C and 28D, depending on the desired trigger voltage, the current carrying metal layer 2814 may comprise or be formed of the same or a different material as the trigger voltage tuning layer 2812.

Figures 31A, 31B, 31C, 31D:
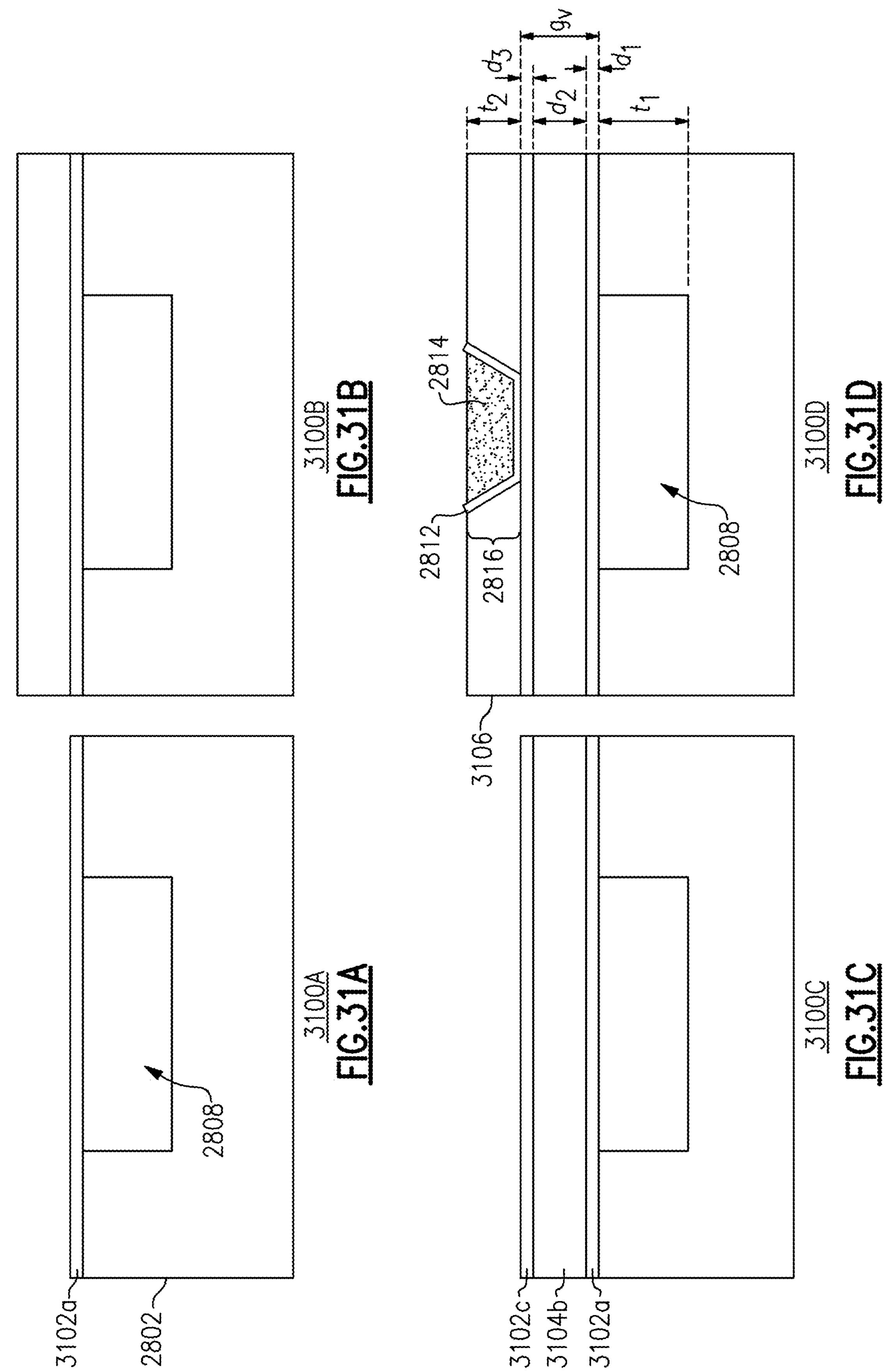
FIGS. 31A-31D illustrate side views of intermediate structures at various stages of fabricating another vertical spark gap EOS monitor/protection device comprising a pair of conductive layers including a doped semiconductor conductive layer and a triple layer inter-electrode dielectric region, according to some embodiments.

FIGS. 31A-31D illustrate side views of intermediate structures at various stages of fabricating an EOS monitor/protection device 3100D configured to electrically arc in response to an EOS event at a trigger voltage less than about 100V, according to embodiments. The EOS monitor/protection device 3100D comprises a pair of conductive structures that are configured to arc in response to an EOS event, in a similar manner as described above with respect to FIG. 28D. Referring to FIG. 31D, similar to FIG. 28D, the pair of conductive structures of the EOS monitor/protection device 2800D comprises a doped region 2808 in a semiconductor substrate 2802 that is doped heavier relative to the semiconductor substrate 2802 and serves as a first conductive structure (bottom electrode) of the pair of conductive structures, and as one of a cathode or an anode during arcing. The pair of conductive structures additionally includes a conductive structure 2816 formed above the doped region 2808 and serves as the second conductive structure of the pair of conductive structures, or the other of the cathode or the anode during arcing. However, unlike FIG. 28D, the doped region 2808 and the conductive structure 2816 are interposed by a stack of dielectric layers 3102*a*/3102*b*/3102*c* (instead of a single dielectric layer 2804). The conductive structure 2816 can be formed of multiple layers of materials. For example, in the illustrated embodiment, the conductive structure 2816 includes a trigger voltage tuning layer 2812 contacting the stack of dielectric layers 3102*a*/3102*b*/3102*c* and a current carrying conductive structure 2814 formed on the trigger voltage tuning layer 2812. Additional details of the feature of the pair of conductive structures are provided below, along with a method of forming the same.

Referring to FIG. 31A, an intermediate structure 3100A is illustrated, which includes a substrate 2802 in which a doped region 2808 is formed, followed by formation of a first dielectric layer 3102*a* of the stack of dielectric layers 3102*a*/3102*b*/3102*c* on the substrate 2802. The method of forming the intermediate structure 3100A is similar to that described above with respect to the intermediate structure 2800A described above with respect to FIG. 28A, the details of which are omitted herein for brevity.

Referring to FIGS. 31B and 31C, intermediate structures 3100B and 3100C are illustrated, which show successive formation of a second dielectric layer 3102*b* and a third dielectric layer 3102*c*, respectively, thereby completing the formation of the stack of dielectric layers 3102*a*/3102*b*/3102*c*.

In various embodiments, first, second and third dielectric layers 3102*a*, 3102*b* and 3102*c* of the stack of dielectric layers 3102*a*/3102*b*/3102*c* can be formed of dielectric materials having first, second and third conduction band energies, respectively, or first, second and third electron barrier heights relative to the work function of the trigger voltage tuning layer 2812 (FIG. 31D). In addition, the stack of dielectric layers 3102*a*/3102*b*/3102*c* can be formed of dielectric materials having first, second and third thicknesses, and/or first, second and third dielectric constants, according to embodiments. For example, each of first, second and third dielectric layers 3102*a*, 3102*b* and 3102*c* of the stack of dielectric layers 3102*a*/3102*b*/3102*c* can be one of suitable dielectric materials described above, e.g., $SiO_2$, $Si_3N_4$, $TiO_2$, $Ta_2O_5$, $SrTiO_3$, $ZrO_2$, $HfO_2$, $Al_2O_3$, $La_2O_3$, $Y_2O_3$, $HfSiO_4$, $LaAlO_3$ or non-stoichiometric versions of the above various mixtures and combinations or stacks thereof, to name a few. According to embodiments, the combination of materials and the thicknesses of the stack of dielectric layers 3102*a*/3102*b*/3102*c* are selected such that it can relatively reliably break down at desired voltage thereacross less than, e.g., 100V.

In some embodiments, each of the first, second and third dielectric layers 3102*a*, 3102*b*, 3102*c* may be formed of a different material and/or have a different thickness.

In some other embodiments, two of the first, second and third dielectric layers 3102*a*, 3102*b*, 3102*c* may be formed of the same material and/or have the same thicknesses.

In some embodiments, first and third dielectric layers 3102*a*, 3102*c* may be formed of the same material and/or have about the same thickness.

In some embodiments, the stack of dielectric layers 3102*a*/3102*b*/3102*c* is selected such that the conduction bands or electron barrier heights relative to the work function of the trigger voltage tuning layer 2812 (FIG. 31D) of one or both of the outer first and third dielectric layers 3102*a*, 3102*c* are lower than those of the second dielectric layer 3102*b* disposed in the middle. As configured, relative to single layer formed of the same material as the second dielectric layer 3102*b*, the stack of dielectric layers 3102*a*/3102*b*/3102*c* may provide a lower triggering voltage. For example, a stack of $HfO_2/Al_2O_3/HfO_2$ may provide a lower trigger voltage relative to a single layer of $Al_2O_3$ having the same thickness as the combined thickness of the stack of $HfO_2/Al_2O_3/HfO_2$.

However, embodiments are so limited and in other embodiments, the stack of dielectric layers 3102*a*/3102*b*/3102*c* is selected such that the conduction bands or electron barrier heights relative to the work function of the trigger voltage tuning layer 2812 (FIG. 31D) of one or both of the outer first and third dielectric layers 3102*a*, 3102*c* are higher than those of the second dielectric layer 3102*b* disposed in the middle. For example, a stack of $Al_2O_3/HfO_2/Al_2O_3$ may lower the trigger voltage relative to a single layer of $Al_2O_3$ having the same thickness as the combined thickness of the stack of $Al_2O_3/HfO_2/Al_2O_3$.

In some other embodiments, the stack of dielectric layers 3102*a*/3102*b*/3102*c* is selected such that the conduction bands or electron barrier heights relative to the work function of the trigger voltage tuning layer 2812 (FIG. 31D) of first to third dielectric layers 3102*a*-3102*c* are graded in one direction. As configured, relative to single layer formed of the same material as the second dielectric layer 3102*b*, the stack of layers 3102*a*/3102*b*/3102*c* may lower the triggering voltage. For example, a stack of $HfO_2/Al_2O_3/SiO_2$ or $SiO_2/Al_2O_3/HfO_2$ may lower the trigger voltage relative to a single layer of $SiO_2$ having the same thickness as the combined thickness of the three-layer stacks.

In some embodiments, the material composition of a layer of stack of dielectric layers 3102*a*/3102*b*/3102*c* may comprise Dielectric materials with dry and wet etch chemistry selectivity. For example, the dielectric layer 3102*c* may serve as etch an etch stop layer for forming the opening in the top dielectric layer 3106 disposed on the stack of dielectric layers 3102*a*/3102*b*/3102*c*.

It will be appreciated that various other combinations are possible. Where two of the first to third dielectric layers 3102*a*-3102*c* are different, the conduction bands of the stack of dielectric layers 3102*a*/3102*b*/3102*c* can be ordered to have any combination, e.g., high/medium/low, high//low/medium, medium/high/low, medium/low/high, low/high/medium, or low/medium/high.

In addition, while in the illustrated embodiment, the stack of dielectric layers 3102*a*/3102*b*/3102*c* include three layers, other embodiments are possible, e.g., stacks having two layers or four or more layers. In these embodiments, any suitable combination and order of the layers are possible in a manner similar to the three-layer embodiment described herein.

As described above, the electrical characteristics (e.g., $V_{TR}$ and current handling limit), damage threshold, and/or a number of arcing events supported before a significant change in the performance of a spark gap device may be controlled by tailoring the geometrical characteristics and composition of the electrodes and the gap region (inter-electrode region) of the device. In some embodiments, the trigger voltage of a vertical spark gap device may be controlled by changing the thickness and/or composition of the gap region along a lateral direction.

Figures 32A, 32B, 32C:
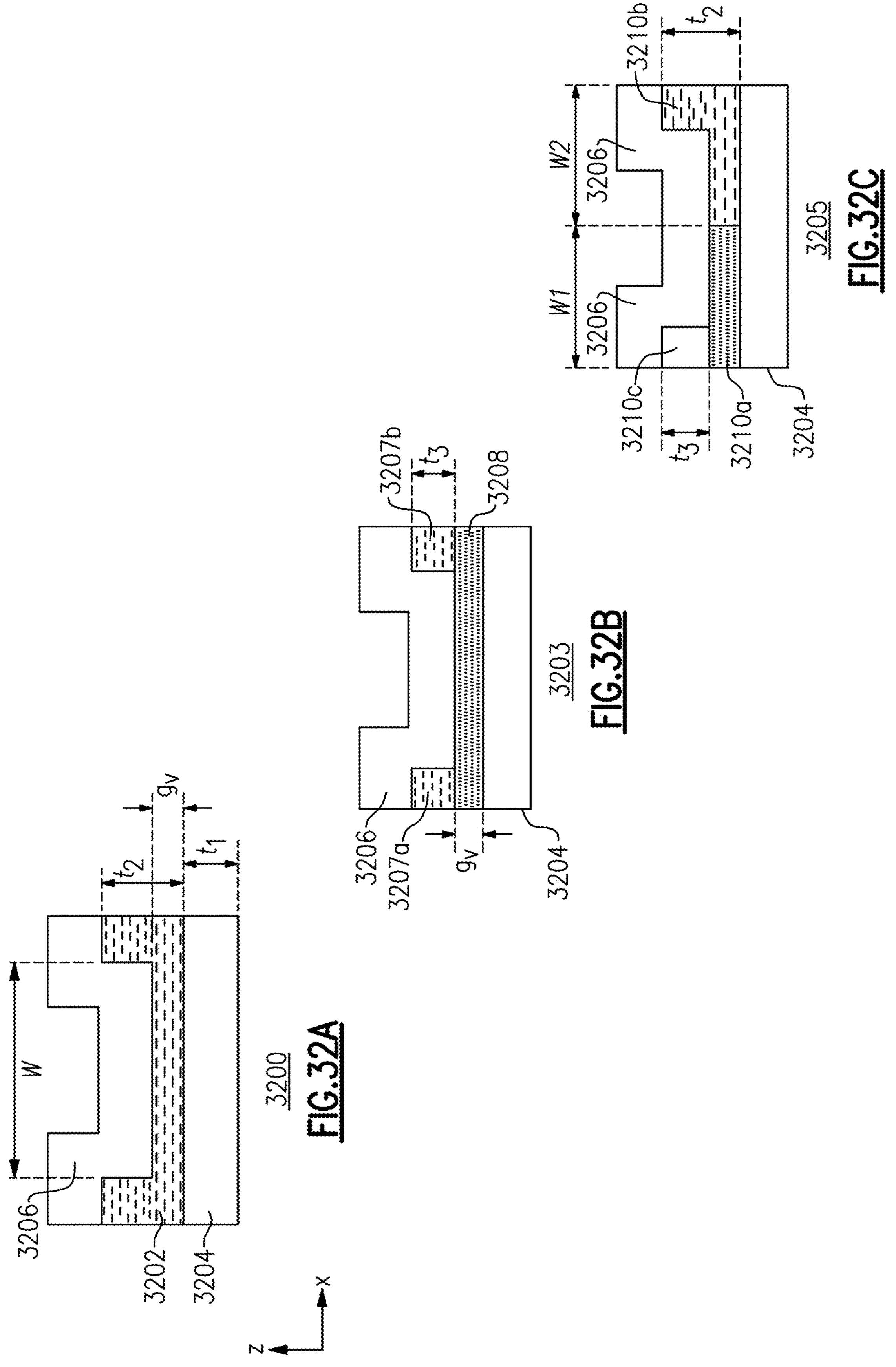
FIG. 32A illustrates a side cross-sectional view of an example vertical spark gap EOS monitor/protection devices comprising a tailored interelectrode dielectric region, according to some embodiments.
FIGS. 32B-32C illustrate side cross-sectional views of example vertical spark gap EOS monitor/protection devices having tailored interelectrode dielectric region comprising multiple materials, according to some embodiments.

In some embodiments, one or both electrodes of a vertical spark gap device may comprise semiconductor layers having high conductivity (e.g., highly doped semiconductor layers). FIG. 32A illustrates a side cross-sectional view of an example vertical spark gap EOS monitor/protection device 3200 having polysilicon electrodes vertically separated by an engineered inter-electrode layer 3202 comprising one or more dielectric materials. In some examples, using polysilicon electrodes may allow greater flexibility in fabrication and processing steps and thereby engineering the gap region. In some examples, the bottom electrode 3204 of the vertical spark gap device 3200 may comprise a polysilicon layer disposed over a major surface of a semiconductor substrate (e.g., a silicon substrate). The interelectrode region 3202 may comprise a thin center portion or section laterally extending between two thick portions or sections. Advantageously a thicker inter-electrode region near the of the vertical spark gap device 3200 may provide more control over $V_{TR}$ and improve manufacturability. The interelectrode region 3202 may comprise a dielectric material (e.g., an oxide such as silicon dioxide) configured to provide a desired $V_{TR}$ between top and bottom electrodes 3206, 3204. In some implementations, the interelectrode region 3202 may comprise $SiO_2$, $Si_3N_4$, $TiO_2$, $Ta_2O_5$, $SrTiO_3$, $ZrO_2$, $HfO_2$, $Al_2O_3$, $La_2O_3$, $Y_2O_3$, $HfSiO_4$, $LaAlO_3$ or non-stoichiometric versions of the above various mixtures and combinations or stacks thereof, to name a few.

The top electrode 3206 may be disposed on the inter-electrode region 3202 such that the thickness of the top electrode 3206 remains substantially constant along the lateral direction over the thin and thick portions of the inter-electrode region 3202. In some examples, the gap size ($g_V$) of the vertical spark gap device 3200 can be the thickness of the center portion of the dielectric region.

FIG. 32B illustrates side cross-sectional view of example vertical spark gap EOS monitor/protection device 3203 having an engineered interelectrode region comprising an inter-electrode layer 3208 laterally extending along the vertical spark gap 3203 and two side portions 3207*a*, 3207*b*, disposed over end regions of the inter-electrode layer 3208. Similar to the vertical spark gap device 3203, the top electrode 3206 may comprise polysilicon and can be disposed on the inter-electrode region 3202 and the two side portions 3207*a*, 3207 such that the thickness of the top electrode 3206 remains substantially constant in the lateral direction across the vertical spark gap 3203. In some examples, the bottom electrode 3204 of the vertical spark gap device 3203 may comprise a polysilicon layer disposed over a major surface of a substrate (e.g., a silicon substrate). In some examples, the inter-electrode layer 3208 may comprise a first dielectric material (e.g., silicon nitride) and the two side portions 3207*a*, 3207*b*, may comprise a second dielectric material (e.g., silicon dioxide). In some cases, the inter-electrode layer 3208 may be configured to provide electric conduction under high electric fields to limit damage to the electrodes.

FIG. 32C illustrates side cross-sectional view of a vertical spark gap EOS monitor/protection device 3205 having an engineered interelectrode region comprising a segmented inter-electrode region comprising two or more regions having different geometries and material compositions. In some implementations, at least two regions of the segmented inter-electrode region comprising different material compositions may be configured to form an interface (e.g., having at least on vertical section) to provide a focused conduction path between the top and bottom electrodes. It will be appreciated that an interface formed by two different materials can preferentially conduct under a bias, relative to bulk portions of the two different materials. Such an approach can predefine an arcing path to be substantially confined along the interface. In some embodiments, the segmented inter-electrode region of the vertical spark gap device 3205 may include a first lateral portion 3210*a* laterally extending from a first edge to a middle region of the vertical spark gap device 3205 and a second lateral portion 3210*b* laterally extended from the middle region to a second edge of the vertical spark gap device 3205 (opposite to the first edge) such that the first and second lateral regions 3210*a*, 3210*b*, form a vertical interface (a vertically extended interface) in the middle region of the vertical spark gap device 3205. In some cases, thickness of the second lateral portion 3210 near the second edge can be larger than the thickness of the second lateral portion 3210 near the vertical interface. Interelectrode region of the vertical spark gap device 3205 may further include a vertical portion 3210*c* disposed above the first lateral portion 3210*a* near the first edge. In some implementations, the first and second lateral portions 3210*a*, 3210*b* and the vertical portion 3210*c*, may comprise different materials. In some implementations, the first and second lateral portions 3210*a*, 3210*b*, may comprise different materials and the vertical portion 3210*c* can have a material composition substantially identical to the that of the first and/or second lateral portions 3210*a*, 3210*b*. In some examples, the first lateral portion 3210*a* may comprise a nitride (e.g., silicon nitride), the second lateral portion 3210*b*, may comprise an oxide (e.g., silicon dioxide) and the vertical portion 3210*c* may comprise the same oxide as the first lateral portion 3210*a*.

Similar to the vertical spark gap devices 3200, 3203, the top electrode 3206 of the vertical spark gap device 3205 may comprise polysilicon and can be disposed on the inter-electrode region spark gap device 3205 such that its thickness substantially constant along the lateral direction across the vertical spark gap device 3205. In some examples, the bottom electrode 3204 of the vertical spark gap device 3205 may comprise a polysilicon layer disposed over a major surface of a substrate (e.g., a silicon substrate). In some examples, a nitride-oxide interface formed in the middle region of the vertical spark gap device 3205 may be extended from the bottom electrode 3204 to the top electrode 3206 and can be configured to focus an electric discharge path between the top and bottom electrodes 3206, 3204.

In various implementations, the material composition, thickness and/or geometry of a portion of the interelectrode region of the vertical spark gap devices 3200, 3203, 3205 can be engineered to provide a desired $V_{TR}$ (or breakdown voltage) between the top and bottom electrodes 3206, 3204. In some examples, the material composition, thickness and/or geometry of the portion of the interelectrode region may be selected such that the conduction band (or electron barrier height) of that portion of interelectrode region relative to those of the top and bottom electrodes 3206, 3204, is configured to provide the desired $V_{TR}$ (or breakdown voltage).

In various implementations, the gap size ($g_V$) or thickness of the center portion of the inter-electrode region 3202 can be from 1 to 10 nm, from 10 nm to 100 nm, from 0.1 to 1 micron, from 1 to 10 microns, from 10 to 20 microns or any ranges formed by these values. Thickness ($t_2$) of the thick portion of the interelectrode region 3202 can be from 1 to 2, from 2 to 4, from 4 to 6, or from 6 to 10 times the gap size ($g_V$) or thickness of the center portion. Thickness ($t_1$) of the bottom electrode 3204 can be from 1 to 10 nm, from 10 nm to 100 nm, from 0.1 to 1, from 1 to 10 microns, from 10 to 20 microns or any ranges formed by these values.

In various implementations, thickness ($t_3$) of the side portions of the inter-electrode layer 3208 can be from 1 to 2, from 2 to 4, from 4 to 6, or from 6 to 10 times the gap size ($g_V$) or thickness of the center portion.

In various implementations, Width (W) of the center portion of the inter-electrode region 3202 can be from 1 to 5 microns, from 5 to 10 microns, from 10 to 50 microns or any ranges formed by these values.

In various implementations, Widths (W1 and W2) of the first and second lateral portions 3210*a*, 3210*b*, of the inter-electrode region can be from 1 to 5 microns, from 5 to 10 microns, from 10 to 50 microns or any ranges formed by these values.

Spark Gaps Enclosed in Sealed Volume

To further improve reusability and reliability, the arcing medium can be designed for further control of arcing parameters including the arcing voltage. Further, by using relatively inert arcing medium, oxidation or corrosion of the arcing electrodes can be advantageously suppressed. Without limitation, example configurations are described herein.

In some embodiments, an electrical overstress (EOS) monitor or protection device (e.g., a spark gap device) comprises a substrate having a horizontal main surface, and a hermetically sealed volume formed over the horizontal main surface and, in some cases, filled with a medium (e.g., a gas). The device additionally comprises one or more electrode pairs fabricated at least partially in the hermetically sealed volume. In some embodiments, electrodes of each electrode pair can be separated in a vertical direction crossing the horizontal main surface by a gap. In some embodiments, electrodes of each electrode pair can be separated in a lateral direction a gap. In various embodiments, the electrode pair may serve as arcing electrodes configured to generate an arc discharge in response to an EOS signal received between a first voltage node and a second voltage node.

In some embodiments, the electrodes of one of the polarities may be electrically connected by a common resistive line, to serve as a ballast resistor in a similar manner as described above. In the illustrated configurations, the lower electrodes are electrically connected by a resistive line formed underneath the upper and lower electrodes to serve as the ballast resistor.

Thus configured, in a similar manner as described above, in operation, a first of the multiple electrode pairs having the lowest triggering voltage will electrically arcs first. As the current flowing through the first electrode pair increases, the voltage drop thereacross increases. Once the voltage across the first electrode pair exceeds a trigger voltage of another one of the electrode pairs, the next electrode pair having the next lowest trigger voltage triggers, causing the current to divide between the first and next electrode pairs. The process will continue with additional electrode pairs so long as the voltage drop developed across conducting electrode pairs exceeds the trigger voltage of an untriggered electrode pair.

FIGS. 33A-33D illustrate side views of intermediate structures at various stages of fabricating a vertical spark gap EOS monitor/protection device configured to electrically arc in response to an EOS event, where the arcing medium is engineered to control the trigger voltage, according to some embodiments. In some embodiments, at least a portion of the interelectrode (gap region) may comprise a void or sealed cavity.

Figures 33A, 33B, 33C, 33D:
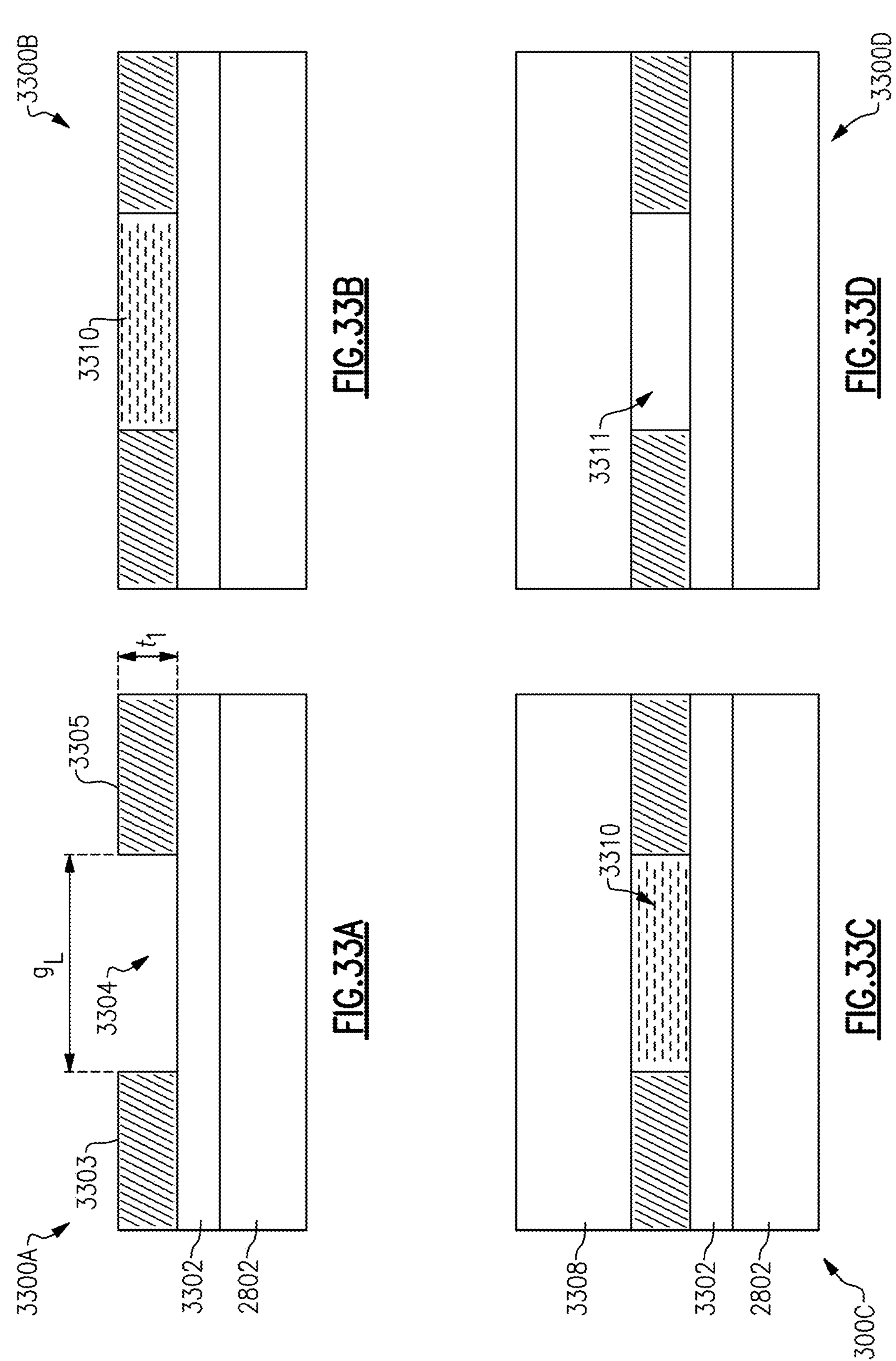
FIGS. 33A-33D illustrate side views of intermediate structures at various stages of fabricating another lateral spark gap EOS monitor/protection device comprising a pair of conductive structures and a customized arcing medium, according to some embodiments.

Referring to FIG. 33A, a side view of an intermediate structure 3300A is illustrated, which includes a substrate 2802. A first dielectric layer 3302 is formed on the substrate 2802, followed by a pair of conductive structures including a first conductive structure 3303 and a second conductive structure 3305, which serve as a laterally arranged cathode-anode pair during arcing. The first and second conductive structures 3303, 3305 can be laterally arranged in a similar manner as any of various pairs of conductive structures configured for arcing in response to an EOS described above. The first dielectric layer 3302 can be formed of any material that can serve to electrically isolate the substrate 2802 from the pair of conductive structures 3303, 3305, e.g., $SiO_2$ or $Si_3N_4$. The lateral gap 3304 between the first and second conductive structures 3303, 3305 represents the spark gap, which can be a void 3311 or filled with a customized arcing medium, according to embodiments.

Referring to FIG. 33B, an intermediate structure 3300B is illustrated, which represents the intermediate structure 3300A (FIG. 33A), which has been further processed to form fill the gap 3304 with an arcing medium 3310, according to embodiments. The arcing medium 3310 can be a suitable material for customizing, among other things, the trigger voltage at which the pair of the conductive structures are configured to arc, in response to an EOS event. The arcing medium 3310 can be a suitable material, e.g., a solid dielectric material. For example, the arcing medium 3310 can be any inorganic material such those described above, e.g., the first dielectric layer 2804 described above with respect to FIGS. 28A-28D. In some examples, the arcing medium 3310 may comprise low density dielectric material or another sacrificial material configured to be removed by etching or heating to generate a void. However, embodiments are not so limited and the arcing medium 3310 can be a suitable solid organic dielectric material, e.g., a polymeric material. The acing medium 3310 can be, e.g., deposited as a blanket material and removed from outside the gap 3304 by, e.g., etching or by chemical mechanical polishing. Still further embodiments are possible, and the arcing medium 3310 can be a liquid dielectric material.

Referring to FIG. 33C, an intermediate structure 3300C is illustrated, which represents the intermediate structure 3300B (FIG. 33B), which has been further processed to encapsulate or cap the arcing medium 3310 with a second dielectric material 3308, thereby completing the fabrication of the EOS monitor/protection device 3300C filled with a customized arcing medium 3310, according to some embodiments.

While in the illustrated embodiment of FIG. 33C, the arcing medium 3310 includes a condensed matter, e.g., a solid or liquid dielectric material, embodiments are not so limited. In some embodiments, it may be desirable to have the arcing medium 3310 be a gas, e.g., air or an inert gas. Referring to FIG. 33D, an alternative embodiment is illustrated, in which the arcing medium 3310 is removed to form a void or sealed cavity 3311. In some embodiments, the arcing medium may be removed by heating (e.g., in an electric oven or by laser heating). In some implementations, the resulting sealed cavity can be filled with a gas to serve as the arcing medium. Such structure may be formed by, e.g., filing the gap 3304 with a sacrificial medium using the process flow described with respect to FIGS. 33A-33C and, subsequent to encapsulation with the second dielectric material 3308, selectively removing, e.g., by wet etching.

Figures 34A, 34B:
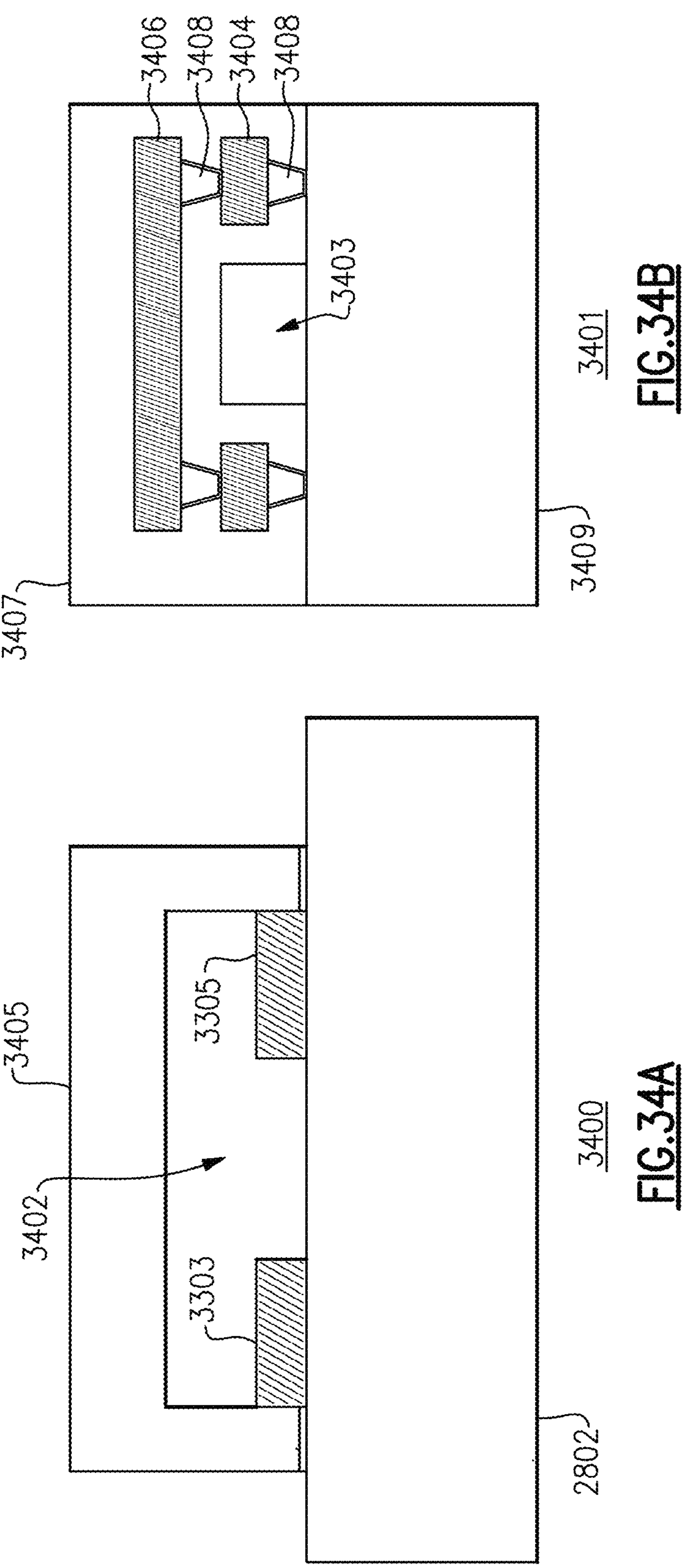
FIG. 34A illustrates a side view of a lateral spark gap EOS monitor/protection device having an arcing medium comprising a sealed gas environment, according to some embodiments.
FIG. 34B illustrates a side view of a device having an arcing medium comprising a sealed gas environment, according to some embodiments.

FIG. 34A illustrates a side view of an example lateral spark gap EOS monitor/protection device 3400 formed over a substrate 2802 (e.g., a silicon substrate) and having an arcing medium comprising a sealed gas environment. In some embodiments, the lateral spark gap device 3400 can include a pair of laterally separated conductive structures (or electrodes) 3303, 3305, formed over the substrate 2802, (e.g., in a similar manner as described above with respect to FIG. 33A). In some implementations, the electrodes 3303, 3305, can be, at least partially, encapsulated in a cavity 3402 filled with a desirable gas, e.g., an inert gas such as $N_2$ or air having a desired pressure. In some examples, the cavity 3402 may comprise a controlled gas and pressure environment. In some implementations, the cavity 3402 (e.g., sealed cavity) may be formed over the substrate 2802 by fabricating or bonding a capping layer 3405 over the substrate 2802. In some examples, the cavity 3402 can be sealed, e.g., hermetically sealed, by the capping layer 3405. In some examples, the capping layer 3405 may be fabricated using a microelectromechanical systems (MEMS) fabrication method. In some examples, the capping layer 3405 may comprise silicon.

FIG. 34B illustrates a side view of another example EOS monitor/protection device 3401 formed over substrate 3409 (e.g., a silicon substrate) having an arcing medium comprising a sealed gas environment. In some embodiments, the EOS device 3401 may include a pair of conductive structures (not shown). In some such embodiments, the pair of conductive structures can be at least partially encapsulated in a cavity 3403 filled with a desirable gas, e.g., an inert gas, e.g., $N_2$ or air. In some examples, the cavity 3403 may be formed within and sealed by a region of a metallization layer 3407 comprising interconnection structures. In some embodiments, the EOS monitor/protection device 3401 can be a vertical spark gap formed over the substrate 3409 comprising the cavity 3403 and a top electrode formed above the cavity 3403. In some examples, the top electrode can be connected to substrate 3409 or a conductive region in the substrate 3409.

Figure 35:
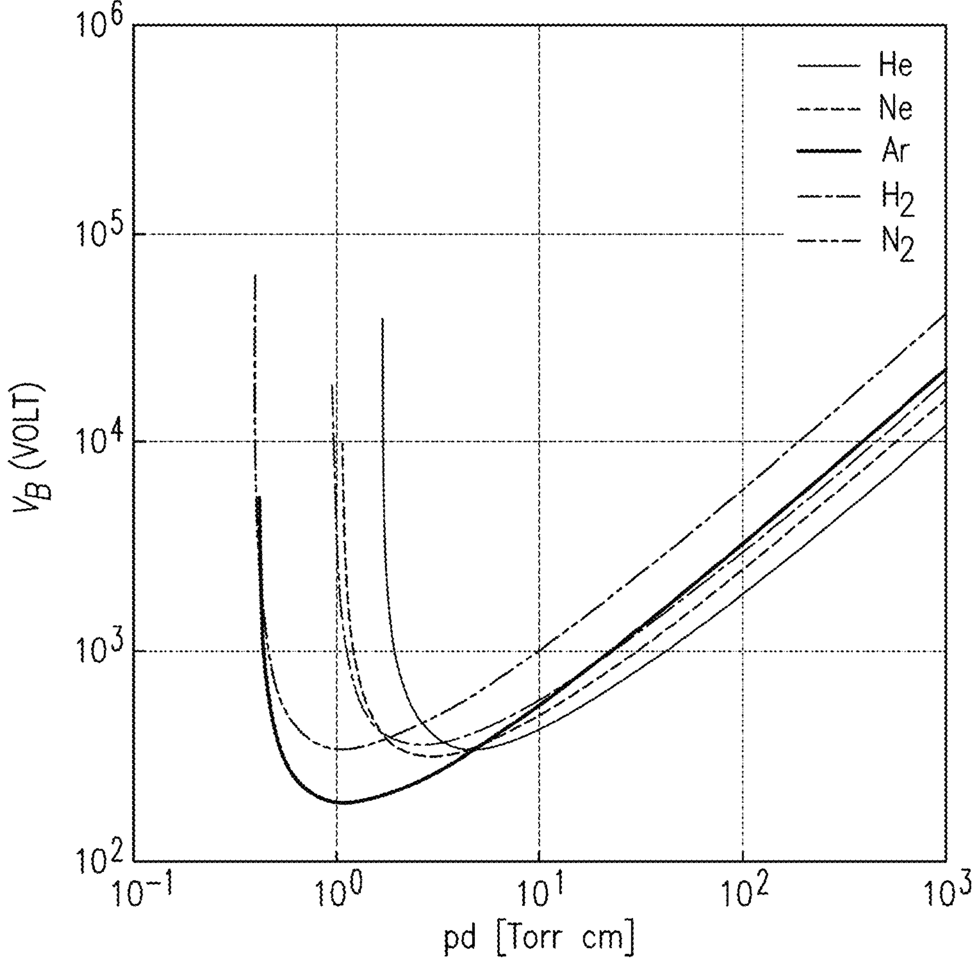
FIG. 35 illustrates breakdown voltage plotted against gas pressure for electric discharge through a gaseous arcing medium comprising different types of molecules.

FIG. 35 illustrates a breakdown voltage plotted against pressure for electric discharge through a gaseous arcing medium comprising different types of molecules (helium, neon, argon, hydrogen, nitrogen). FIG. 35 illustrates that, by filling the sealed inter-electrode region of a spark gap device (e.g., the spark gap devices shown in FIG. 32D, 33A or 33B) with an appropriate gas, the breakdown or trigger voltage of the spark gap device can be tuned by controlling the pressure of the gas. Without being bound to any theory, the dependence of the breakdown or trigger voltage on the pressure, the gap distance and the gas molecule may generally follow what is known as Paschen's curves. In various embodiments, the trigger voltage of a spark device having an inter-electrode region comprising a gas medium (e.g., comprising a gas filed cavity) may be tuned by controlling the pressure of the gas. As such, in various implementations including a gas filled region in the inter-electrode region may provide an additional degree of freedom (in addition to geometrical and material properties of the electrodes and the inter-electrode region) for tuning the trigger voltage of a lateral or vertical spark gap or spark gap array. Accordingly, an electrical overstress (EOS) monitor or protection device according to embodiments of comprises an enclosed volume formed over a horizontal main surface of a substrate and filled with a medium, which can be a gas, and one or more arcing electrode pairs separated by the enclosed volume, wherein electrodes of each arcing electrode pair are separated in a vertical direction crossing the horizontal main surface by a gap and serve as arcing electrodes configured to generate an arc discharge in response to an EOS signal received between a first voltage node and a second voltage node.

In various implementations, the spark gap devices, structures and designs described above with respect to FIGS. 1-27 may benefit from including a gas filled region between the corresponding sparking tips. In various embodiments, the entire or a portion of the gap region of spark gap device may include a gas or otherwise fluidic medium. In some cases, a portion of one or more electrodes or electrode fingers can be in contact with the fluidic (e.g., gaseous) medium. In some cases, one more electrodes or electrode fingers can be isolated from fluidic medium. In some embodiments, the fluidic medium can be contained in a sealed cavity or a flow in a fluidic channel (e.g., a fluidic channel integrated with the spark gap device).

In some embodiments, the arcing medium through may comprise a gas instead of a dielectric material. For example, the spark gap array 2500, described above with respect to FIG. 25, may be configured such that its arcing gaps are discharged comprise through a sealed cavity configured to contain a gas or gas mixture at a given pressure, or a fluidic channel configured to allow a gas or a liquid through flow.

In some embodiments, a spark gap array, which may serve as an electrical overstress (EOS) monitor or protection device, may comprise an array of arcing gaps formed within a cavity filled with a gas and between a top and a bottom electrode at least one of which is segmented and includes an array of electrode fingers. In some examples, the segmented electrode may comprise a sheet resistor on which the array of electrode fingers is formed and through which an individual electrode finger is electrically connected to a voltage node through an electric path comprising a high resistance portion provided by the sheet resistor. The high resistance portion within the resistive sheet may have a resistance larger than the resistance of the other portions of the electric path between the electrode finger and the voltage node.

FIGS. 36A-36D illustrate cross-sectional side views (top panels) and top-down view (bottom panels) of intermediate structures at various stages of fabricating a multi-gap vertical spark gap device or a vertical spark gap array comprising a pair of segmented electrodes and an engineered inter-electrode region comprising a gaseous arcing medium, according to some embodiments.

Figures 36A, 36B:
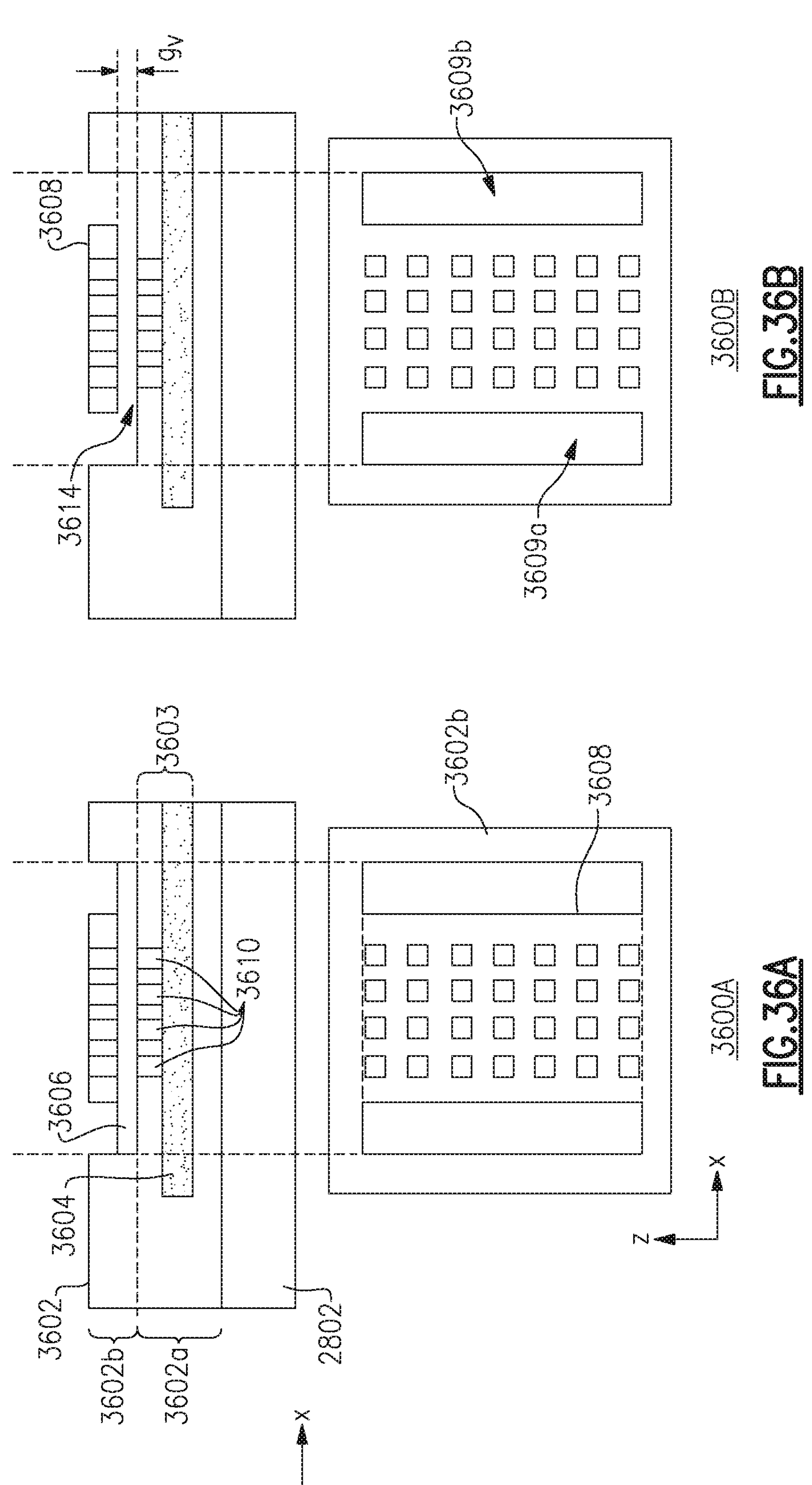
FIGS. 36A-36D illustrate cross-sectional side views (top panels) and top-down views (bottom panels) of intermediate structures at various stages of fabricating a vertical spark gap array comprising a sealed gas-filled interelectrode interelectrode region, according to some embodiments.

Referring to FIG. 36A, a side cross-sectional view (top panel) and top-down view (bottom panel) of an intermediate structure 3600A are illustrated. The intermediate structure 3600A includes a substrate 2802 (e.g., a silicon substrate) and a partially fabricated vertical spark gap array formed above the substrate 2802 within a dielectric layer 3602 formed on the substrate 2802. The partially fabricated spark gap array includes a multi-finger bottom electrode 3603 comprising an array (e.g., a two-dimensional array) of bottom electrode fingers 3610 (also referred to herein as lower partial vias) and a first common electrode section (e.g., a first resistive sheet) 3604 electrically connecting the bottom electrode fingers 3610, a sacrificial layer (e.g., a polysilicon layer) 3606 formed above the bottom electrode fingers 3610, and an array (e.g., a two-dimensional array) of top electrode fingers 3612 (also referred to herein as upper partial vias) formed above the sacrificial layer 3606 within a top dielectric layer 3608. The sacrificial layer 3606, which is vertically extended from the bottom electrode fingers 3610 to the top electrode fingers 3612, can be configured to temporarily support the top dielectric layer 3608 and the electrode fingers 3612 formed therein. As such, thickness of the top sacrificial layer 3606 may define the vertical separation between the top and bottom electrode fingers 3612, 3610 (inter-electrode spacing) or the arcing gap size $g_v$. In some examples, the sacrificial layer 3606 can have a uniform thickness so that arcing gaps formed between top and bottom electrode fingers 3612, 3610 have substantially identical $g_v$'s.

In some embodiments, the bottom electrode 3603 may be formed within a lower vertical section 3602*a* of the dielectric layer 3602, which is in contact with the substrate 2802, and the sacrificial layer 3606 and the top electrode fingers 3612 may be formed within an upper vertical section 3602*b* of the dielectric layer 3602. In some embodiments, the upper vertical section 3602*b* may comprise an opening within which the sacrificial layer 3606 and the top dielectric layer 3608 are formed. In some implementations, the top dielectric layer 3608 can be patterned (e.g., using photolithography and etching) to form an array of holes, within which the top electrode fingers are formed and one or more auxiliary holes configured to allow removal of the sacrificial layer 3606 and forming a void or cavity between the top and bottom electrode fingers 3612, 3610. Additionally, in some cases, the one or more auxiliary holes may be used to fill the cavity with a gas and subsequently sealing the cavity to form a sealed gaseous arcing medium between the top and bottom electrode fingers 3612, 3610. In some implementations, the one or more auxiliary holes may comprise two slots 3609*a*, 369*b* longitudinally (e.g., parallel to y-axis) extending along opposite lateral edges of the top electrode fingers 3612 and above the sacrificial layer 3606. In various implementations, the top dielectric layer 3608 and the dielectric layer 3602 may comprise different or substantially identical materials.

In some embodiments, the bottom electrode fingers 3610 and the top electrode fingers 3612 may comprise a two-dimensional periodic array extending in lateral (e.g., parallel to x-axis) and longitudinal (e.g., parallel to y-axis) direction parallel to a top major surface of the substrate 2802. In these embodiments, electrode fingers may form a two-dimensional periodic array of arcing gaps. In various implementations, the two-dimensional periodic array may have different or identical periods along the lateral and longitudinal directions.

Referring to FIG. 36B, an intermediate structure 3600B is illustrated, which represents the intermediate structure 3600A (FIG. 36A), which has been further processed to remove the sacrificial layer 3606 to form a void 3614 between the top and bottom electrode fingers 3612, 3610 and suspend a portion of the top dielectric layer 3608 containing top electrode fingers 3612. In some examples, the sacrificial layer 3606 may be removed by dry or wet etching techniques and through the slots 3609*a*, 3609*b*.

Figures 36C, 36D:
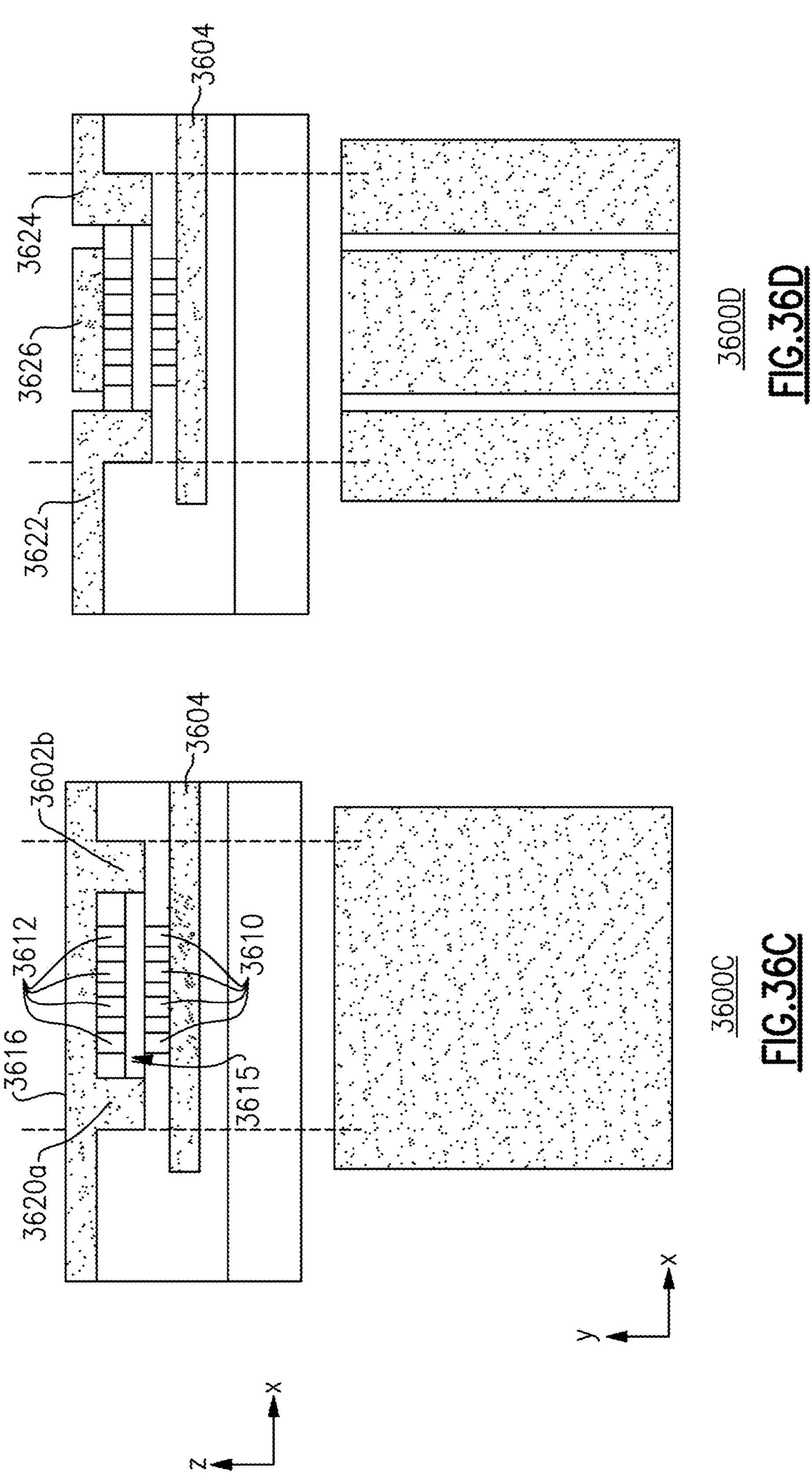

Referring to FIG. 36C, an intermediate structure 3600C is illustrated, which represents the intermediate structure 3200B (FIG. 36B), which has been further processed to seal or cap the void 3614 to form a sealed cavity 3615 and to form a resistive layer 3616 extending over the top electrode fingers and a top surface of the dielectric layer 3602. In some implementations the void 3614 may be sealed by depositing a resistive material that fills the slots 3609*a*, 3609*b* and forms two side walls 3620*a*, 3620*b* of the sealed cavity 3615 and forms the resistive layer 3616. In some cases, before and/or during deposition of the resistive layer 3616 the void 3614 may be filled with a gas or gas mixture having a specific pressure (e.g., by controlling a gas mixture and pressure within the deposition chamber). In some implementations, the resistive material (e.g., doped polysilicon) may be deposited using various deposition methods such as physical vapor deposition (PVD), chemical vapor deposition (CVD), or other methods. In some implementations, the deposition of the resistive material may comprise in situ doping of a dialectical material to control the resistivity of the resistive layer 3616 such that it can provide ballast resistance for the top electrode fingers. In some implementations, the resistive layer 3616 may comprise the same material used to form the first resistive sheet 3604.

Referring to FIG. 36D, a spark gap array 3600D is illustrated, which represents the intermediate structure 3600C (FIG. 36C), which has been further processed to form a second resistive sheet 3626 electrically connecting the top electrode fingers 3612 thereby completing the fabrication of the spark gap array device 3600D having multiple arcing gaps and a gas filled arcing medium. In some implementations, the second resistive sheet 3626 may be formed by etching two slots along opposite lateral sides of the top electrode finger array to electrically isolate a portion of the resistive layer 3616 above the top electrode fingers 3612 from the remaining portions of the restive layer 3616.

According to embodiments, as fabricated, the arcing electrode pairs comprise upper conductive partial vias, or top electrode fingers 3615, electrically connected to the first voltage node and lower conductive partial vias, or the bottom electrode fingers 3610, electrically connected to the second voltage node. Each of the upper conductive partial vias has one end electrically connected to an upper metallization layer over the enclosed volume, or the sealed cavity 3615, and the other end terminating at the enclosed volume. Similarly, each of the lower conductive partial vias has one end connected to a second metallization layer over the enclosed volume, or the sealed cavity 3615, and the other end terminating at the enclosed volume, the second metallization layer formed at a different metallization level relative to the first metallization layer. As arranged, the pairs of partial vias serve as arcing electrode pairs configured to generate an arc discharge in response to an EOS signal received between the first voltage node and the second voltage node.

Figure 36E:
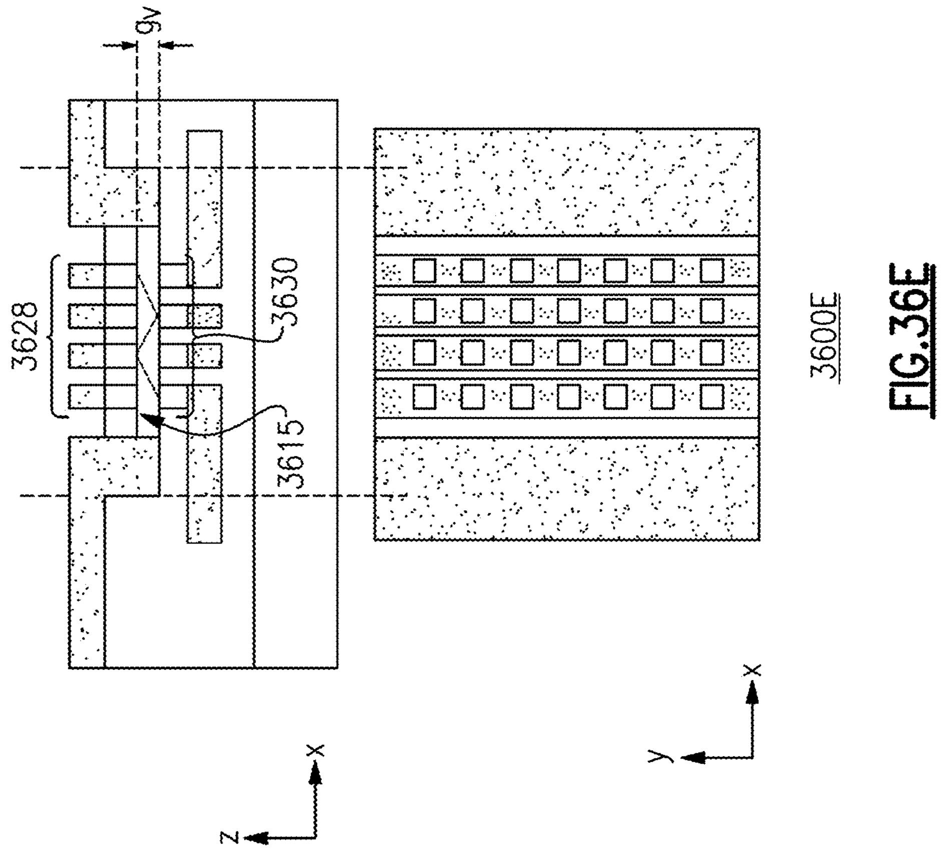
FIG. 36E illustrates a cross-sectional side view (top panel) and top-down view (bottom panel) of another vertical spark gap array device comprising a sealed gas-filled interelectrode inter-electrode region, according to some embodiments.

While in the illustrated embodiment of FIG. 36D, the first resistive sheet 3604, electrically connects all bottom electrode fingers 3610 and the second resistive sheet 3626 electrically connects all top electrode fingers 3612, embodiments are not so limited. In some embodiments, the first and second (bottom and top) resistive sheets 3604, 3626 may be divided into multiple electrically isolated segments such that each segment electrically connects a subset of top electrode fingers 3612 or bottom electrode fingers. In some implementations, the first and second resistive sheets 3604, 3626 may be segmented such that individual electrode fingers of a first subset of electrically connected top electrode fingers 3612 are formed above individual electrode fingers of a second subset of electrically connected bottom electrode fingers 3610. Referring to FIG. 36E, an alternative embodiment is illustrated, in which the top and bottom resistive sheets 3604, 3626, each is divided to four electrically isolated longitudinal segments (or columns), where a longitudinal resistive segment electrically connects a subset of top or bottom electrode fingers having the same lateral positions (e.g., with respect to an edge of the array) and distributed along the longitudinal direction (e.g., parallel to y-axis). In some examples, each subset of electrically connected top or bottom electrode fingers may comprise a one-dimensional periodic array of electrode fingers extended along the longitudinal direction. In the examples shown, the segmented bottom electrode comprises four longitudinally extended bottom resistive sheet segments 3630 and the segmented bottom electrode comprises four longitudinally extended top resistive sheet segments 3628. In various implementations, a resistive sheet may be segmented using lithography and etching techniques.

In some embodiment, the spark gap array 3600D, or the spark gap array 3600E, can be formed with an integrated circuit (IC). In these embodiments, the metallization and ILD layers of the IC may comprise the dielectric layers, resistive sheets, and electrode fingers these spark gap arrays 3600D, 3600E.

In some embodiment, the first and second resistive sheets 3604, 3626 of the spark gap array 3600D, or a segment of the resistive sheet segments 3630 and a segment of the resistive sheet segments 3630 of the spark gap array 3600E, can be electrically connected (e.g., via metallization layers, conductive vias, contact pads, or a combination thereof) to first and second voltage nodes, respectively. The first and second voltage node may be connected to an electronic circuit such that an ESD signal in the circuit is received by the first and second voltage nodes.

In some embodiments, one or more of the bottom electrode fingers 3610 (or the top electrode fingers 3612) may vertically extend from a bottom surface of the first resistive sheet 3604 (or top surface of the second resistive sheet 3626) toward the cavity 3615. In some such embodiments, the first resistive sheet 3604 (or the second resistive sheet 3626) may comprise a through hole and the one or more electrode fingers may be formed by overfilling the hole with a low-resistivity material (e.g., TiW).

Figures 37A, 37B:
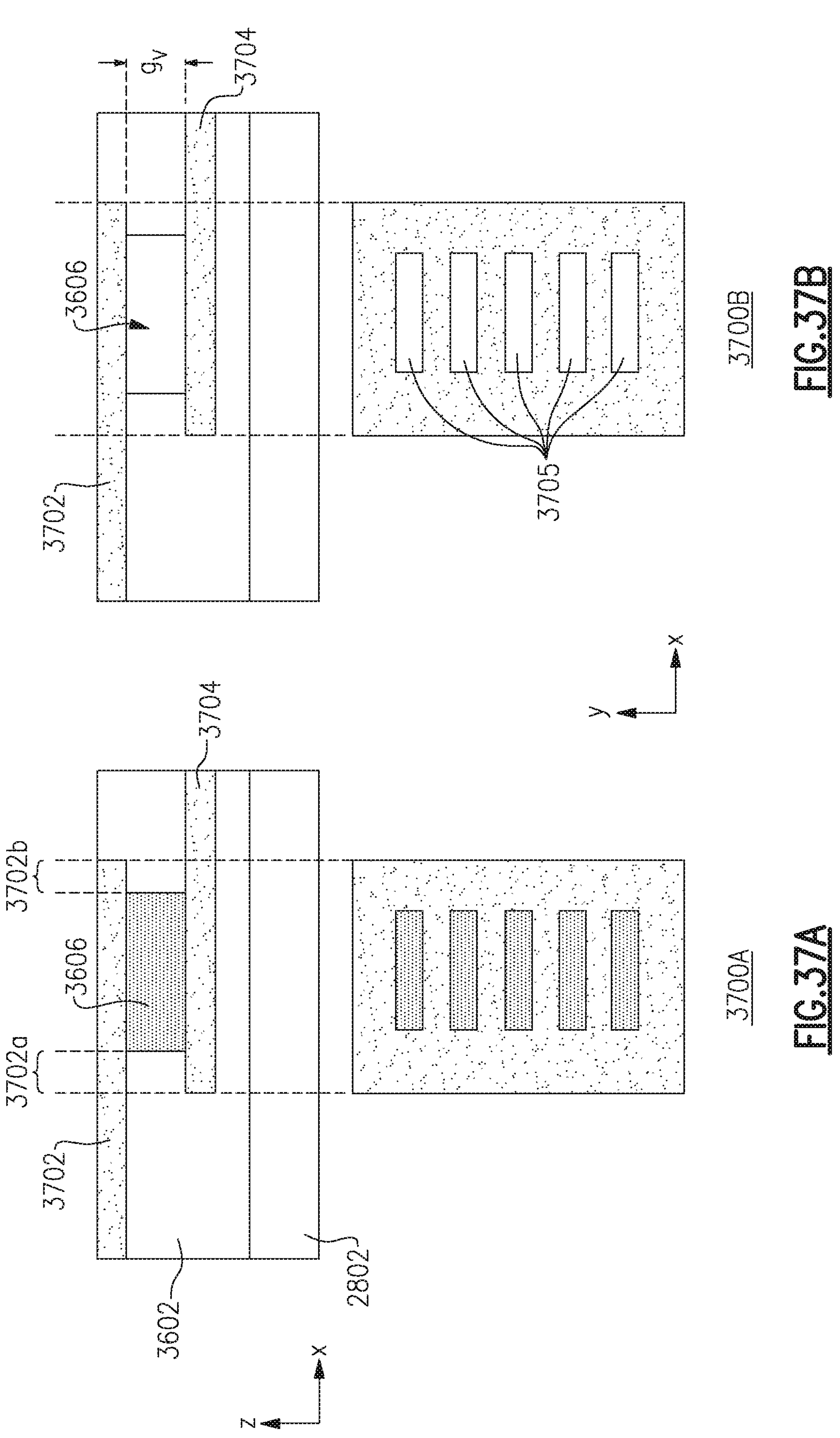
FIGS. 37A-37C illustrate cross-sectional side views (top panels) and top-down view (bottom panels) of intermediate structures at various stages of fabricating an example vertical spark gap array comprising a sealed gas-filled interelectrode region or a porous dielectric interelectrode region, according to some embodiments.
Figures 37C, 37D:
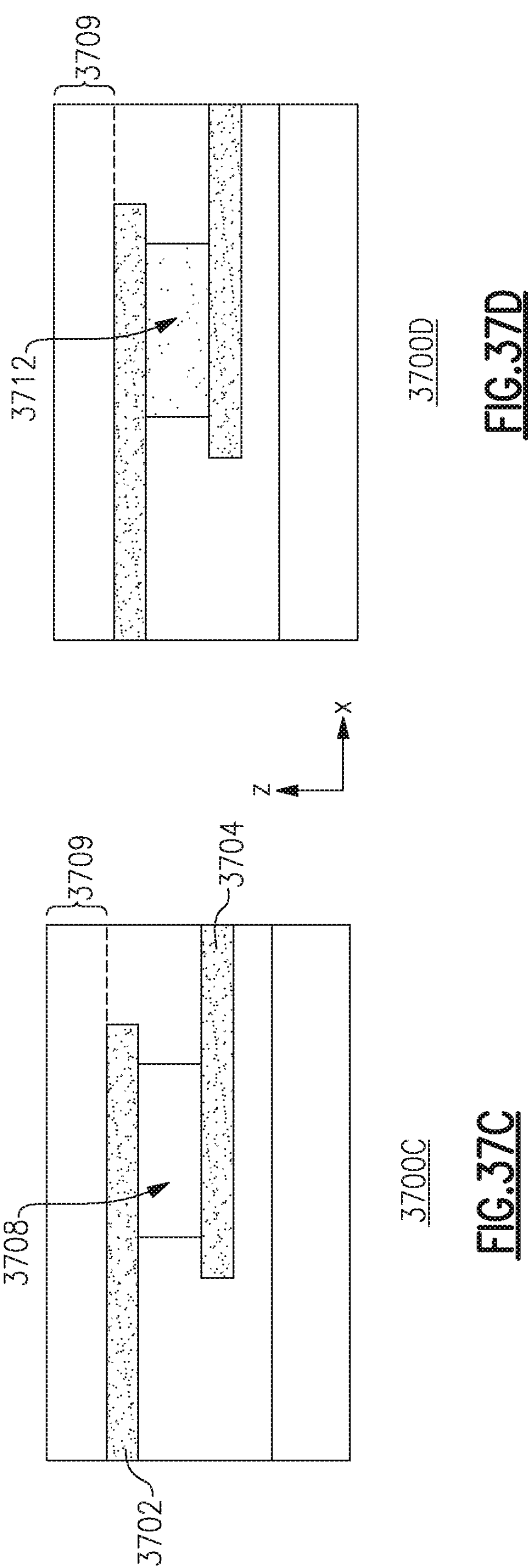
FIG. 37D illustrates a cross-sectional side view of a multi-gap vertical spark gap comprising a one-dimensional array of arcing gaps and a sealed gas-filled interelectrode dielectric region, according to some embodiments.

FIGS. 37A-37C illustrate cross-sectional side views (top panels) and top-down view (bottom panels) of intermediate structures at various stages of fabricating an example vertical spark gap array comprising a sealed gas-filled inter-electrode region or a porous dielectric (e.g. a porous oxide) interelectrode region, according to some embodiments. In these structures, the enclosed volume or the sealed inter-electrode region is vertically interposed by an upper metallization layer electrically connected to the first voltage node and a lower metallization layer electrically connect to the second voltage node. The upper and lower metallization layers may be directly exposed to the enclosed volume.

Referring to FIG. 37A, a side cross-sectional view (top panel) and top-down view (bottom panel) of an intermediate structure 3700A are illustrated. The intermediate structure 3700A includes a substrate 2802 (e.g., a silicon substrate) and a vertical spark gap array formed above the substrate 2802 within a dielectric layer 3602 formed on the substrate 2802. In some embodiments, the partially fabricated spark gap array may include a bottom electrode or electrode layer 3704, a sacrificial layer (e.g., a polysilicon layer) 3606 formed above the bottom electrode 3704, and a top electrode or electrode layer 3702 formed over the sacrificial layer 3606. In some embodiments, the top and/or the bottom electrodes may comprise an array (e.g., a one-dimensional array) of electrically connected electrode segments (not shown). The sacrificial layer 3606, which is vertically extended from the bottom electrode 3704 to the top electrode 3702, can be configured to temporarily support the top electrode 3702. As such, thickness of the sacrificial layer 3606 may define the vertical separation between the top and bottom electrodes 3702, 3704 (inter-electrode spacing) or the arcing gap size $g_v$. In some examples, the sacrificial layer 3606 can have a uniform thickness so that arcing gaps formed between the segments of the top and bottom electrodes 3702, 3704 have substantially identical $g_v$'s. In some embodiments, the top and/or the bottom electrode 3702, 3704, may comprise a dielectric layer and a conductive layer (e.g., a metallic layer) disposed on the dielectric layer, e.g., below the dielectric layer of the top electrode 3702 and above the dielectric layer of the bottom electrode 3704.

In some embodiments, the top electrode 3702 (or the bottom electrode 3704 may patterned to form an array of holes or slots 3705 laterally extended (e.g., along x-axis) across a portion of the electrode and longitudinally distributed along the electrode (e.g., along y-axis). In some cases, the array of holes 3705 may allow etching/removing the sacrificial layer 3606 using a wet or dry etching process (e.g., xenon difluoride etching). In some cases, conductive regions between the holes or slots may serve as the electrode segments.

In some embodiments, the bottom electrode 3704 (e.g., a conductive layer of the bottom electrode 3704) may be patterned substantially identical to the top electrode 3702 (e.g., a conductive layer of the top electrode 3702) such that the top and bottom electrodes 3702, 3704 comprise substantially identical electrode segments. In some such embodiments, the top and bottom electrodes 3702, 3704 may be aligned within two vertically separated parallel planes such that the electrode segments of the top electrode 3702 form vertical arcing gaps with the respective electrode segments of the bottom electrode 3704. For example, an individual electrode segment of the top electrode 3702 is positioned above the respective individual electrode segment of the bottom electrode 3704.

In some embodiments, the top and bottom electrodes 3702, 3704 may comprise a one-dimensional array of laterally extended electrode segments periodically distributed along a longitudinal direction (e.g., parallel to y-axis). In some embodiments, the electrode segments of top electrode 3702 (or the bottom electrode 3704) may be connected to one or more common sections of the electrode. For example, the electrode segments of the top electrode 3702 can be electrically connected by two elongated edge regions 3702*a*, 3702*b* longitudinally extending along the edges of the electrode segments.

In some embodiment, the top and bottom electrodes 3702, 3704 may be electrically connected (e.g., via metallization layers, conductive vias, contact pads, or a combination thereof) to first and second voltage nodes, respectively. The first and second voltage node may be connected to an electronic circuit such that an ESD signal in the circuit is received by the first and second voltage nodes.

In some embodiments, the top and bottom electrodes 3702, 3704 may comprise a resistive material having a resistivity larger than resistivities of conductive regions and conductive vias that establish electric paths between the top and bottom electrodes 3702, 3704 and the first and second voltage nodes. As such the common sections of these electrodes (e.g., the elongated section 3702*a*, 3702*b* of the top electrode 3702), which provide electrical connection among the electrode segments and the voltage nodes, may serve as ballast resistance for the electrode segments. In some embodiments, the electrode segments may have a lower resistivity compared to the common sections to allow uniform potential distribution along the individual electrode segments.

In some embodiments, the sacrificial layer 3606 may be laterally extended between the top and bottom electrodes 3702, 3704 from a first lateral end to a second lateral end of the electrode segments such that the regions between the common sections of the top and bottom electrodes 3702, 3704 (e.g., the elongated section 3702*a*, 3702*b* of the top electrode 3702), comprises the dielectric electric layer 3606.

Referring to FIG. 37B, an intermediate structure 3700B is illustrated, which represents the intermediate structure 3700A (FIG. 37A), which has been further processed to remove the sacrificial layer 3606 to form a void 3707 between the top and bottom electrodes 3702, 3704 and suspend a portion of the top electrode 3702 where the electrode segments are formed. In some examples, the sacrificial layer 3606 may be removed by dry or wet etching techniques and through holes or slots 3705.

Referring to FIG. 37C, a spark gap array 3700C is illustrated, which represents the intermediate structure 3700B (FIG. 37B), which has been further processed to seal or cap the void 3707 to form a sealed cavity 3708 thereby completing the fabrication of the spark gap array 3700C having multiple arcing gaps and a gas filled arcing medium. In some implementations the void 3707 may be sealed by depositing a dielectric layer 3709 that covers or fills the slots 3705 formed in the top electrode 3702. In some implementations, before and/or during deposition of the dielectric layer 3709 the void 3707 may be filled with a gas or gas mixture having a specific pressure (e.g., by controlling a gas mixture and pressure withing the deposition chamber). In some implementations, the dielectric layer 3709 may have substantially the same or a different material composition compared to the dielectric layer 3602. The dielectric layer 3709 may be formed using various deposition methods such as physical vapor deposition (PVD), chemical vapor deposition (CVD), or other methods.

While in the illustrated embodiment of FIG. 37C, has interelectrode region comprising a gas filled sealed cavity 3708, embodiments are not so limited. In some embodiments, the sealed cavity 3708 comprises a solid-state material. Referring to FIG. 37D, an alternative embodiment is illustrated, in which the sacrificial layer 3606 comprises a porous dielectric material and the dielectric layer 3709 is deposited over the top electrode 3702 without removing the sacrificial layer 3606 such that the inert-electrode region 3712 comprises a sealed cavity filled with the porous dielectric. In some implementations, before and/or during deposition of the dielectric layer 3709 the porous dielectric may be exposed to a gas or gas mixture having a specific pressure (e.g., by controlling a gas mixture and pressure withing the deposition chamber) such that holes and spaces of the porous dielectric is filled with the gas. In some examples, the porous material 3712 may comprise a porous oxide.

In some embodiments, a spark gap array having a dielectric arcing medium may comprise some of the structural features described above with respect to the spark gap array 3600D, 3600E or 3700B (FIGS. 36D, 36E and 37B). For example, a spark gap array having a dielectric arcing medium may comprise the spark gap array 3600D, 3600E or 3700B where the void 3614 and the cavity 3615 comprise a dielectric medium (e.g., one or more dielectric layers disposed between top and bottom electrode fingers. The dielectric constant and other electrical properties of such dielectric medium may be configured to provide a desired trigger voltage for the corresponding arcing gaps.

In some embodiments, the first and second resistive sheets 3604, 3626, or the segmented top and bottom electrodes 3702, 3704, may comprise one or more low resistivity regions and one or more high resistivity regions. For example, regions near and in contact with electrode fingers and electrode segments through which the electric discharge occur can have lower resistivity compared to intervening regions extending between the electrode fingers and electrode segments. In some such embodiments, a low resistivity region can be surrounded, at least partially, with a high resistivity region (extended in two dimensions) configured to limit electric current flow into or out of the low resistivity region along multiple directions within the corresponding resistive sheet.

In some implementations, a resistivity of a high resistivity region of a resistive sheet can be greater than the resistivity of a low resistivity region of that resistive sheet a factor from 1.5 to 10, from 10 to 50, from 50 to 100, from 100 to 1000, or any ranges formed by these values or larger values.

In some implementations, a resistivity or an average resistivity of the resistive sheet can be greater than the resistivity of electrode fingers electrically connected to the resistive sheet by a factor from 1.5 to 10, from 10 to 50, from 50 to 100, from 100 to 1000, or any ranges formed by these values or larger values.

In some implementations, a thickness of the electrode fingers can be greater than the thickness of a resistive sheet electrically connected to the electrode fingers by a factor from 1.1 to 2, from 2 to 4, from 4 to 6, from 6 to 10, or any ranges formed by these values or larger values.

In various implementations, $g_V$ (e.g., height of the cavities 3615, 3708 along z-axis) of a spark gap array having a gas-filled interelectrode region (e.g., spark gap arrays 3600D, 3600E or 3700C) can be from 0.5 to 1 micron, from 1 to 5 microns, from 5 to 10 microns or any ranges formed by these values or larger values.

In various implementations, $g_V$ (e.g., height dielectric inter-electrode region 3712 along z-axis) of a spark gap array having a dielectric interelectrode region (e.g., spark gap array 3700D) can be from 0.5 to 1 micron, from 1 to 5 microns, from 5 to 10 microns or any ranges formed by these values or larger values.

In various implementations, thickness of the first resistive sheet 3604. Second resistive sheet 3626, bottom electrode 3704 or top electrode 3702 can be from 0.5 to 1 micron, from 1 to 5 microns, from 5 to 10 microns or any ranges formed by these values or larger values.

In various implementations, a lateral width (e.g., along x-axis) of the cavities 3615, 3708 or the dielectric inter-electrode region 3712 can be from 1 to 5 microns, from 5 to 10 microns, from 10 to 20 microns or any ranges formed by these values or larger values.

Figures 37E, 37F:
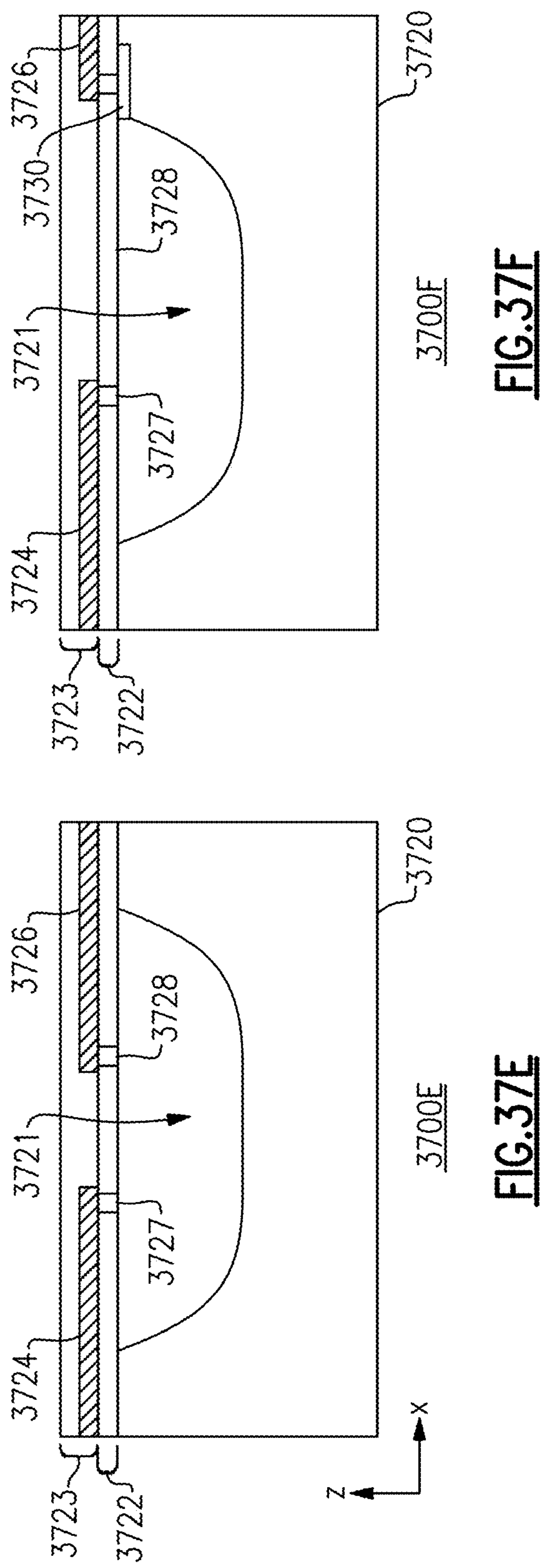
FIG. 37E-37F illustrate side cross-sectional views of example spark gap devices comprising etched sealed gas-filed cavities.

In some embodiments, a spark gaps device may comprise a sealed gas-filled chamber comprising a cavity formed within a substrate and sealed by a layer disposed over the substrate. In some such embodiments, the spark gaps device may be configured such that the arcing medium of the spark gap device comprises at least a portion of the ga-filed cavity. FIG. 37E illustrates a side cross-sectional view of an example spark gap device 3700E comprising an etched sealed gas-filed cavity 3721. In some embodiments, the integrated spark gap device 3700E may be fabricated by etching (e.g., dry or wet etching) a region of the substrate 3720 to form the cavity 3721 below a major surface of the substrate 3720 and disposing a caping dielectric layer 3722 over the cavity 3721 to provide a sealed chamber dielectric layer 3804. In some examples, the caping layer 3722 may be bonded to the substrate 3720. In some embodiments, the caping dielectric layer 3722 may comprise a first and a second conductive electrodes 3727, 3728 laterally separated by a gap and serving as the first and second electrodes of the spark gap device 3700E, respectively. In some implementations, the first electrode 3727 may be electrically connected to a first voltage node via a first conductive line 3724 formed on the capping layer and the second electrode 3728 may be electrically connected to a second voltage node via a second conductive line 3726 formed on the capping layer 3722. In some implementations, an additional dielectric layer 3723 may be disposed over the capping dielectric layer first layer to further seal the cavity 3721. In some implementations, a composition and pressure of the gas filling the cavity 3721 may be configured such when an electric potential difference between the first and second electrodes 3727, 3728, is generated by an EOS event, the electric discharge between the first and second electrodes 3727, 3728, occurs through the gas filled cavity. In various implementations, a lateral spacing (e.g., along x-axis) between the first and second electrodes 3727, 3728, a composition of gas within the cavity 3721, and/or the pressure inside the cavity 3721 may be configured to provide a desired trigger voltage for the spark gap device 3700E. FIG. 37F illustrates a side cross-sectional view of another example spark gap device 3700F comprising an etched sealed gas-filed cavity 3721. The spark gap device 3700F may comprise one or more features described above with respect to spark gap 3700E however a spark gap device 3700F may comprise a conductive layer formed on a top region the substrate 3720 below the capping layer 3722. In other embodiments, both electrodes of a spark gap device having an etched gas-filled cavity may be formed within a top region of the substrate 3720 below the capping layer 3722. In various embodiments, at least one of the two electrodes of a spark gap device having an etched gas-filled cavity may comprise two or more electrode fingers. In various implementations, the substrate 3720 may comprise a silicon substrate and the capping layer may comprise an oxide layer, a silicon layer. In some examples, a boding layer may be provided between the capping layer 3722 and the substrate 3720 to facilitate boding. In some examples, the cavity 3721 may be formed by etching the substrate 3720 through a patterned masking layer. I some such embodiments, the patterned masking layer may be removed before disposing or bonding the capping dielectric layer 3722. In some other embodiments, the capping layer 3722 may be disposed or bonded over the patterned masking layer may the patterned masking layer.

In some embodiments, a single or multi-gap vertical spark gap device or vertical spark gap array may be formed above a substrate. In some embodiments, some of the electrodes or electrode fingers (e.g., a top electrode or top electrode fingers) may be suspended above a horizontal major surface of the substrate by a support structure, e.g., a bridge anchored to the substrate. In some embodiments, a single or multi-gap vertical spark gap device or vertical spark gap array formed above a substrate may comprise a gas-filled inter-electrode or arcing region. In some such embodiments, a sealed chamber formed over the substrate may allow controlling a composition and pressure of gas-filled inter-electrode or arcing region.

Figure 38A:
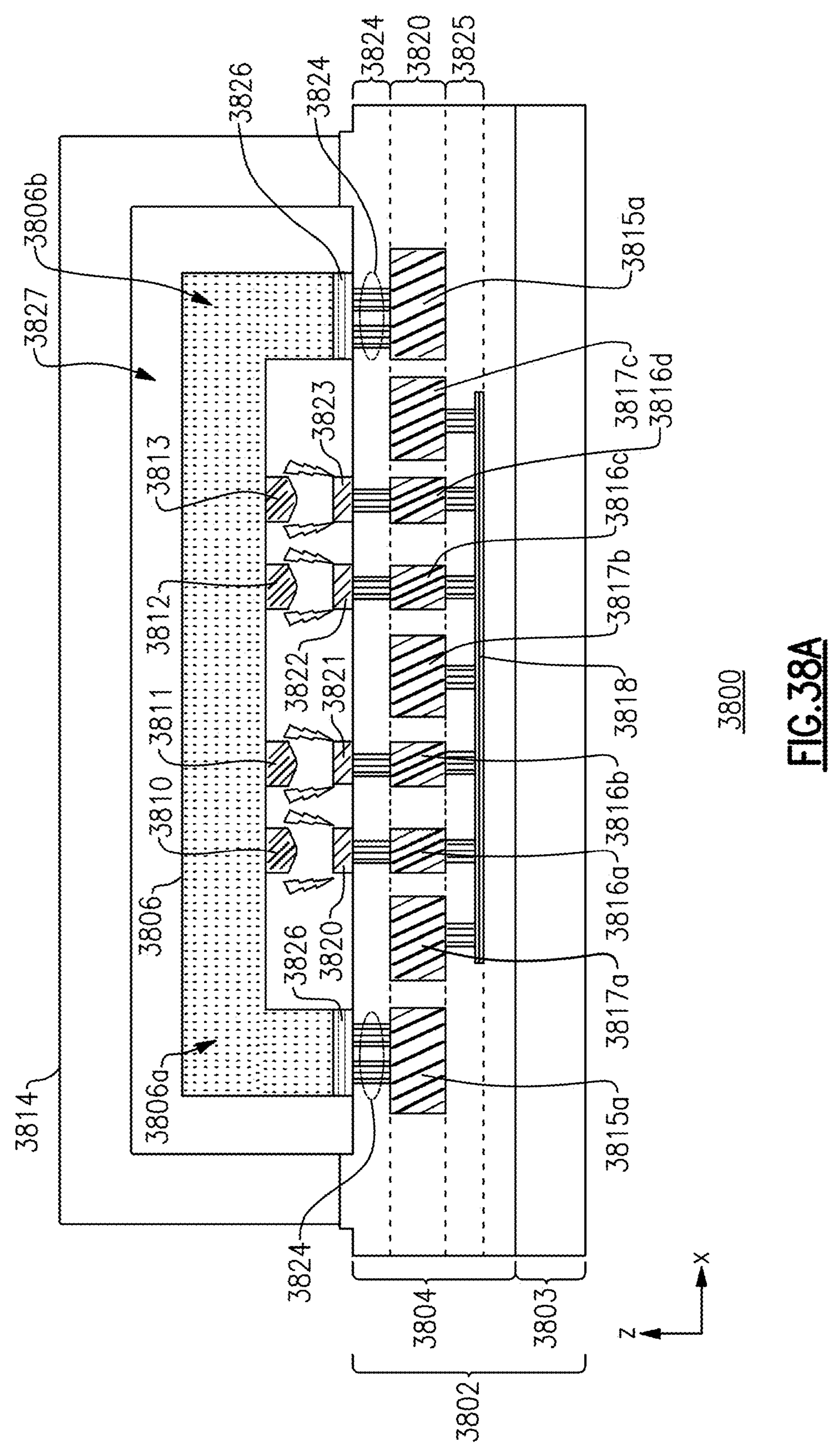
FIG. 38A illustrates a side cross-sectional side view of a portion of another example multi-gap vertical spark gap array comprising a gas-filled chamber formed over by a caping layer.

FIG. 38A illustrates a side cross-sectional view of a portion of an example multi-gap vertical spark gap array 3800 comprising a gas-filled chamber formed on a top major surface of a substrate 3802.

In some implementations, the substrate 3802 may comprise a base layer (e.g., a handle wafer) 3803 and a top layer 3804 on which the spark gap array 3800 is fabricated. In some implementations, the base layer 3803 may comprise silicon (e.g., a silicon wafer) and the top layer 3804 may comprise a dielectric (e.g., silicon dioxide). In some embodiments, the spark gap array 3800 may comprise one or more features described above with respect to spark gap 2500 in FIGS. 25 and 26A-26D; however, at least an ILD layer extending between the top electrodes and bottom electrode fingers in spark gap 2500 is replaced by a gas medium within a sealed cavity formed by a capping layer 3814.

In some embodiments, the spark gap array 3800 may comprise a conductive bridge 3806 or an electrically conductive beam disposed over the horizontal main surface of the substrate. The conductive bridge 3806 may be anchored on opposing end. The electrically conductive bridge 3806 extends in a lateral direction (e.g., along x-axis) from a first lateral end 3806*a* to a second lateral end 3806*b*, and has a plurality of upper arcing electrodes or top electrode fingers 3810, 3811, 3812, 3813 protruding from a bottom surface of the conductive bridge 3806, a plurality of lower arcing electrodes or bottom electrode fingers 3820, 3821, 3822, 3823 formed on a top surface of the top layer 3804 (e.g., protruding from the top surface), where the plurality of top and bottom fingers are configured to form a plurality of arcing gaps (spark gaps) in a region below the conductive bridge 3806 and the top surface of the top layer 3804. In some examples, the plurality of top electrode fingers 3810, 3811, 3812, 3813 may be electrically connected to each other and to a first voltage node by the conductive bridge 3806. In some implementations, the conductive bridge 3806 may be electrically connected to the first voltage node via one or more conductive vias and conductive regions formed in the top layer 3804. In the example shown the conductive bridge 3806 is electrically connected to a conductive region 3815 by a plurality of conductive vias 3824 and the conductive region 3815 is electrically connected to the first voltage node. In some embodiments, a conductive bonding layer 3826 may be disposed between the top layer 3804 and the conductive bridge 3806 to electrically connect the conductive bridge 3806 and the conductive vias 3824. In some examples, the conductive bonding layer 3826 may comprise a conductive bonding frame at least partially surrounding the bottom electrode fingers 3810, 3811, 3812, 3813.

In some examples, the conductive bonding layer 3826 may comprise Ruthenium or other conductive materials.

In some examples, the top and bottom electrode fingers 3810, 3811, 3812, 3813, 3820, 3821, 3822, 3823, may comprise, TiW, ruthenium, gold, aluminum, copper, or a combination thereof.

In some examples, the top electrode fingers 3810, 3811, 3812, 3813, and/or the bottom electrode fingers 3820, 3821, 3822, 3823, may comprise the same material as the conductive bonding layer 3826 (e.g., ruthenium).

In some embodiments, the spark gap array 3800 may further comprise a resistive layer 3818 formed within the top layer 3804 and configured to provide a resistive electrical connection between the plurality bottom electrode fingers 3820, 3821, 3822, 3823 and a second voltage node. In some embodiments, the resistive sheet 3818 may be electrically connected to the plurality bottom electrode fingers 3820, 3821, 3822, 3823 via a first group of conductive vias and conductive regions formed in the top layer 4604. For example, the resistive sheet 3818 may be electrically connected to the bottom electrode fingers 3820, 3821, 3822, 3823 via the first group of conductive regions 3816*a*, 3816*b*, 3816*c*, 3816*d* formed in a metallization layer 3825*b* within the top layer 3804, respectively. Each of the conductive regions 3816*a*, 3816*b*, 3816*c*, 3816*d* can be electrically connected to a top electrode finger by a conductive via formed in a first ILD layer 3825*c* formed above the metallization layer 3825*b* and to the resistive sheet 3818 by a conductive via formed in a second ILD layer 3825*a* formed below the metallization layer 3825*b*.

In some embodiments, the restive sheet 3818 may have a resistivity larger than a resistivity of other portions of an electrical path that electrically connects the plurality bottom electrode fingers 3820, 3821, 3822, 3823 to the second voltage node and thereby can serve as ballast resistance for the plurality of the arcing gaps formed between the plurality of top electrode fingers 3810, 3811, 3812, 3813 and the respective plurality of bottom electrode fingers 3820, 3821, 3822, 3823. In some embodiments, the electrical connection between the resistive sheet 3818 and the second voltage node may be provided by a second group of conductive vias and conductive regions 3817*a*, 3817*b*, 3817*c* formed in the top layer 3804. In some examples, the second group of conductive regions 3817*a*, 3817*b*, 3817*c* may be formed in the metallization layer 3825*b* and each may be connected to the resistive sheet 3818 by a conductive via formed in the second ILD layer 3825*a* formed below the metallization layer 3825*b*. The resistive sheet 3818 may laterally extend between conductive vias connected to first and second conductive regions 3817*a*, 3817*b* of the second group of conductive regions.

In some implementations, regions of the resistive sheet 3818 extending between the conductive vias, connected to the first and second groups of the conductive regions, may have higher resistivity compared to the regions connected to these conductive vias.

In some implementation, the resistive sheet 3818 may include a silicon chromium (SiCr) layer and the regions of the resistive sheet 3818 connected to the conductive vias may additionally include a titanium tungsten (TiW) layer disposed between the SiCr and the respective conductive vias.

In some implementation, the resistive sheet 3818 may comprise polysilicon sheet (or layer), or a single or multi-layer resistive metal sheet.

In some implementations, the conductive bonding layer (or frame) 3826, the plurality of top electrode fingers 3810, 3811, 3812, 3813 and the plurality of bottom electrode fingers 3820, 3821, 3822, 3823 may comprise ruthenium, or other conductive materials.

In some implementations, the conductive vias may comprise gold, aluminum, copper, and an alloy comprising two or more of these metals (e.g., gold-aluminum alloy).

In some embodiments, the spark gap array 3800 may comprise a capping layer ("Silicon Cap") 3814 enclosing the conductive bridge 3806, the electrode fingers and arcing gaps formed below the conductive bridge 3806 and above the top layer 3804. The capping layer 3814 can be hermetically sealed to form a gas-filled cavity 3827 such that an arcing medium of the arcing gaps formed between the plurality of top electrode fingers 3810, 3811, 3812, 3813 and the plurality of bottom electrode fingers 3820, 3821, 3822, 3823 comprises a gas or gas mixture having a specified composition and pressure. In some implementations, the capping layer 3814 can be hermetically sealed such that the gas or gas mixture inside its enclosed volume does not substantially mix with outside air. For example, the enclosure can be fabricated under an atmosphere other than air at a sufficient pressure such that the cavity inside the capping layer 3814 remains isolated with an internal pressure that is about the same or slightly higher relative to the outside air. In various implementations, by selecting a suitable gas filling the sealed cavity 3827 inside the capping layer 3814, the breakdown or trigger voltage of the arcing gaps formed within the sealed cavity 3827 can be tuned. Additionally, the trigger voltage of the arcing gaps can be tuned by selecting the material and composition of the electrode fingers and the resistive sheet 3818.

In some embodiments, the capping layer 3814 may be fabricated separate from the substrate 3802 and then bonded or otherwise connected to a substrate 3802, on which the arcing gaps are formed, via one or more sealing connections. In some embodiments, the one or more sealing connections may be configured to from a hermetic seal between the capping layer 3814 and the substrates. In some embodiments, a sealing connection may comprise a sealing pad or a bond frame formed on the substrate 3802 and/or on the capping layer 3814. For example, a sealing connection may comprise a first scaling pad disposed on the substrate 3802 and a second sealing pad may be disposed on the capping layer 3814 (e.g., on a bottom surface of the capping layer) where the first and second sealing pads are bonded via thermal bonding, soldering, and the like. In some cases, the sealing pad may comprise glass (e.g., glass frit).

In some embodiments, at least a portion of a spark gap array 3800 can be fabricated using a microelectromechanical systems (MEMS) fabrication technique. For example, the conductive bridge 3806 and the top electrode fingers 3810, 3811, 3812, 3813 may be fabricated using methods used for fabricating bridges and cantilever structures for MEMS device. In some examples, the conductive bridge 3806 may be fabricated using a plating process (e.g., a gold electroplating process). As another example, the caping layer 3814 may be fabricated and bonded to the substrate 3802 using common MEMS fabrication and bonding techniques. In some embodiments, a portion of a spark gap array 3800 may be co-fabricated with corresponding regions or regions of one more MEMS devices on a common substrate.

Figure 38B:
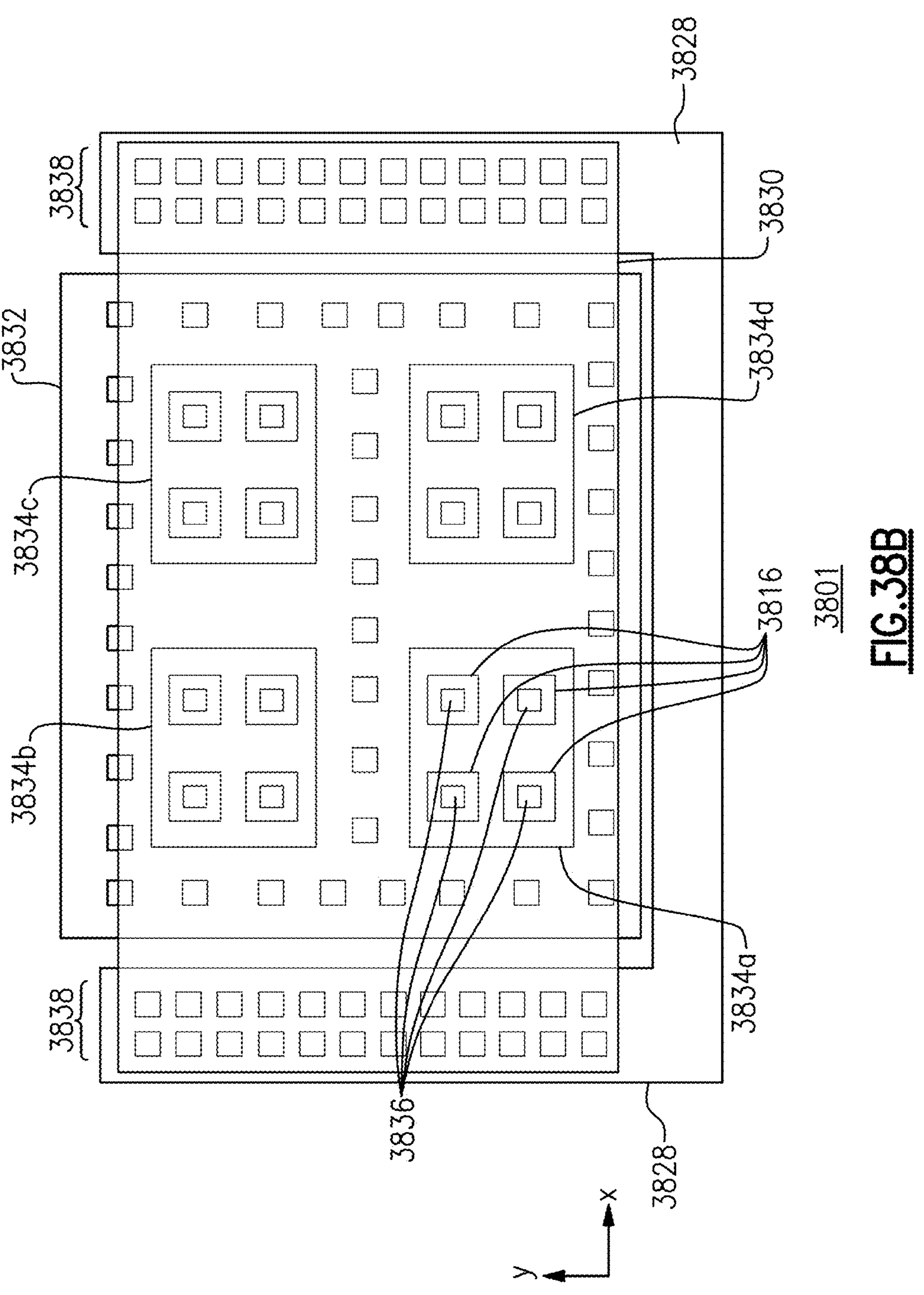
FIG. 38B illustrates a top-down view of a spark gap array comprising four spark gap sub-arrays formed on a top surface of a substrate.

FIG. 38B illustrates a top-down view of a spark gap array 3801 comprising four spark gap sub-arrays formed above over a substrate. In some embodiments, the spark gap array 3801 may comprise one or more features described above with respect to spark gap array 3800. In some embodiments, the spark gap array 3801 may comprise four substantially identical spark gap sub-arrays each including four arcing gaps. In some embodiments, a spark gap array may comprise N substantially identical spark gap sub-arrays each including M arcing gaps. In yet other embodiments, a spark gap array may comprise N spark gap sub-arrays having different numbers of arcing gaps.

In some implementations, an individual spark gap sub-array may comprise a resistive sheet formed below and electrically connected to the bottom electrode fingers of the spark gap sub-array. For example, the first spark gap sub-array of the spark gap array 3801 includes four bottom electrode fingers 3836 electrically connected to a first resistive sheet 3834*a* via four electrically isolated conductive regions 3816 and a plurality of conductive vias (not shown). The first resistive sheet 3834*a* sheet can be electrically connected to a first voltage node via a first conductive region 3832. In some embodiments, the first conductive region 3832 may be a common conductive region shared among two or more spark gap sub-arrays such that the resistive sheets of the two or more spark gap sub-arrays are electrically connected to the first conductive region 3832. For example, the resistive sheets 3834*b*, 3834*c*, 3834*d* or of the second, third, and fourth spark gap sub-arrays may be electrically connected to the first conductive region 3832.

In some implementations, a spark gap array may comprise a conductive bridge (e.g., similar to conductive bridge 3806 of the spark gap array 3800) extending over the plurality of spark gap sub-arrays. In some examples, the conductive bridge 3806 may comprise a plurality of top electrode fingers protruding from a bottom surface of the conductive bridge 3806 such that each top electrode finger is positioned above a bottom electrode finger to form an arcing gap. In some other implementations, the conductive bridge 3806 may serve as the top electrode for the arching gaps of the plurality of spark gap sub-arrays. In the example shown in FIG. 38B, the spark gap array 3801 includes a conductive bridge 3830 formed over the bottom electrode fingers of the four spark gap sub-arrays. In some implementations, the conductive bridge 3830 comprises four top electrode fingers above each spark gap sub-array forming four arcing gaps per spark gap sub-array. In some implementations, the conductive bridge 3830 may laterally extend from a first anchoring region to a second anchoring region. The first and second anchoring regions may comprise first and second anchors formed on the substrate to support the conductive bridge 3830. In some examples, the anchors may include conductive regions that electrically connect the conductive bridge 3830, and thereby the top electrode fingers, to a second conductive region 3828 by a plurality of the conductive vias 3838. The second conductive region 3828 may be electrically connected to a second voltage node. In some examples, the second conductive region 3828 can be configured (e.g., have a U-shape design) to partially surround the first conductive region 3832 that electrically connects the bottom electrode fingers to the first voltage node.

In some embodiments, the spark gap array 3801 may comprise a capping layer (not shown) forming a sealed gas-filled cavity over the four spark gap sub-arrays such that a gas or gas mixture having a specified composition and pressure can serve as a common arcing medium for the 16 arcing gaps formed by the top and bottom electrode fingers of the four spark gap sub-arrays as described above with respect to the spark array 3800.

Figures 39A, 39B, 39C:
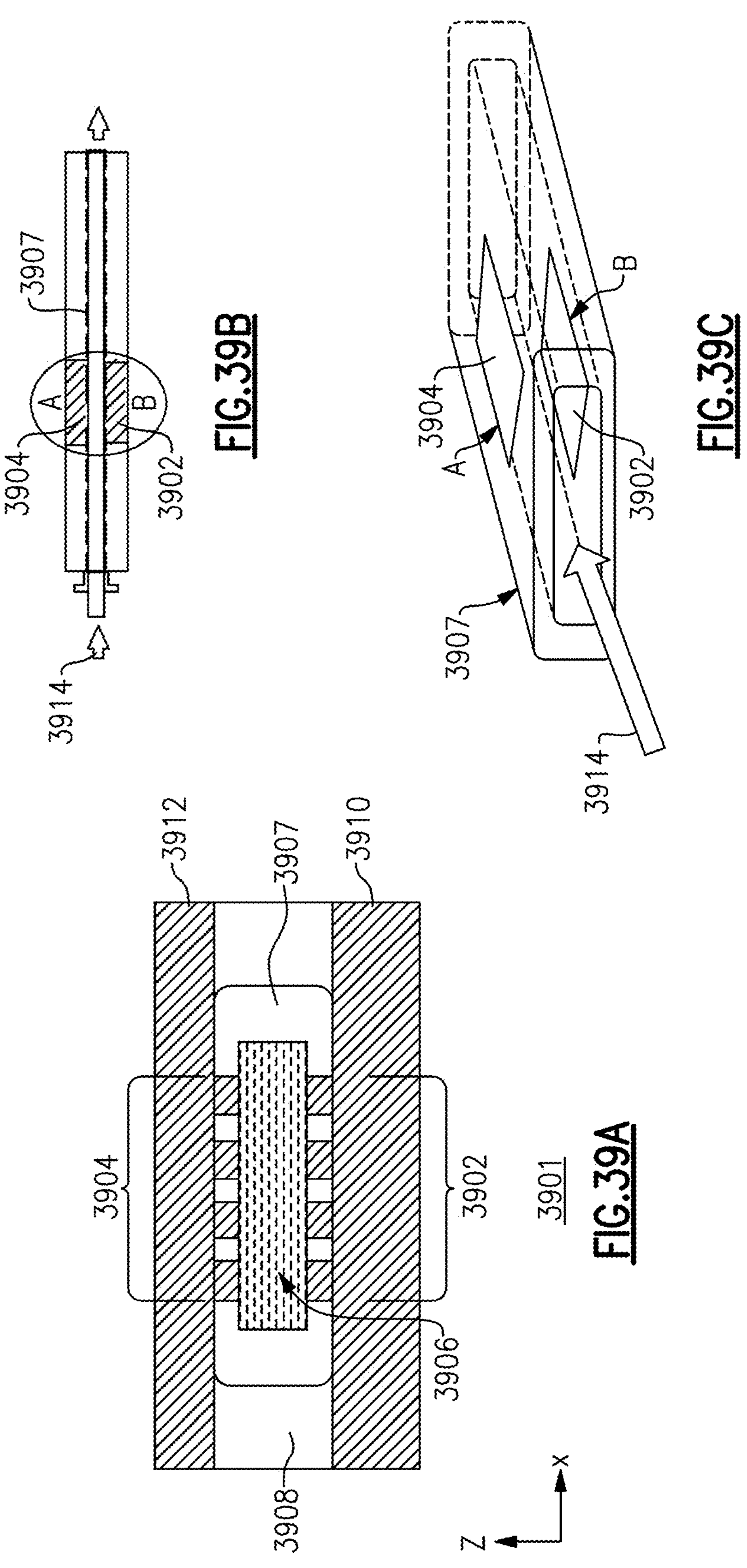
FIGS. 39A-39C illustrate front and side cross-sectional views and a three-dimensional view of a multi-gap vertical spark gap device having an interelectrode region configured to support gas or liquid flow between two electrodes.

FIGS. 39A-39C illustrate front view (A), side cross-sectional view (B) and a three-dimensional view (C) of a multi-gap vertical spark gap device 3901 having an inter-electrode region configured to support gas or liquid flow between top and bottom electrode fingers 3904, 3902. In some embodiments, the inter-electrode region of the multi-gap vertical spark gap device 3901 may be formed around a chamber or channel 3907 configured to allow a fluid (e.g., a gas) to flow through the inter-electrode region 3906. In some implementations the channel 3907 may comprise a top layer, a bottom layer, and two laterally separated side walls extending from the top layer to the bottom layer. In some embodiments, the bottom and top electrode fingers 36902, 3904 may be formed in the bottom and top layers of the channel 3907, respectively. As such the arching medium of inter-electrode region of the spark gap device 3901 may comprise the internal region of the channel 3907 bound by the top layer and bottom layer in a vertical direction (e.g., parallel to z-axis), and the sidewalls in a lateral direction (e.g., parallel to x-axis). FIG. 39B illustrates a side-view of channel 3907 and the spark gap device 3901 comprising the top and bottom electrode fingers, 3904, 3902. An input fluid stream 3914 may enter a portion of the channel 3907 where the spark gap 3901 device is formed and pass though the spark gap 3901 device. FIG. 39C illustrates a three-dimensional view of channel 3907 and the spark gap device 3901.

In some embodiments, one or both top and bottom electrodes of the spark gap device 3901 may comprise a single conductive region extending over/under an internal surface region of the channel 3907. For example, the electrode fingers 3904 and the bottom electrode fingers 3902 may be replaced by top and bottom electrodes extending in the lateral direction.

In some embodiments, the $V_{TR}$ of the vertical spark gap device 3901 can be tuned or controlled by changing the dielectric properties of a fluid that flows through channel 3907. In some embodiments, a property of the fluid flowing through channel 3907 may be determined by monitoring the $V_{TR}$ and/or an I-V behavior of the vertical spark gap device 3901. As such, the vertical spark gap device 3901 may be used for material detection or characterization based on a measured electrical response of the arching gaps formed across the channel 3907. In some examples, a voltage applied on the spark gap device 3901 and the resulting current can be controlled using a control and readout circuit to characterize a fluid inside the channel 3907. In some such examples, the spark gap device 3901 and the channel 3907 may be integrated with the control and/or readout circuit on a common substrate or a common printed circuit board (PCB). In some embodiments, the control circuit can modulate, pulsate, scan, or otherwise change a voltage difference between the top and bottom electrode fingers 3904, 3902, limit the current, or change the temperature of the arching medium, to measure electronic properties of the arching medium at different modulation frequencies, temporal variation profiles, voltage amplitudes, temperatures, among other parameters that may be used to electrically interrogate the fluid within the channel 3907.

In some embodiments, the phase of the fluid may change as it flows through chamber 3907. In some embodiments, a fluid flowing through channel 3907 may comprise conductive particles (e.g., metallic particles) and a discharge path across the channel may be established by the conductive particles. As such the electrical characteristics of the vertical spark gap device 3901 may be used to quantify the concentration of conductive particles and in some cases, size and electrical properties of the conductive particles.

In some embodiments, a fluid flowing through channel 3907 may be ionized by the voltage applied between the electrode fingers 3902, 3904, and the resulting ions may form a discharge path across the channel 3907. As such the electrical characteristics of the vertical spark gap device 3901 may be used to quantify a concentration of ions at a given temperature, temperature dependence of the ionization, and in some cases, molecular properties of the fluid.

Figures 40A, 40B, 40C:
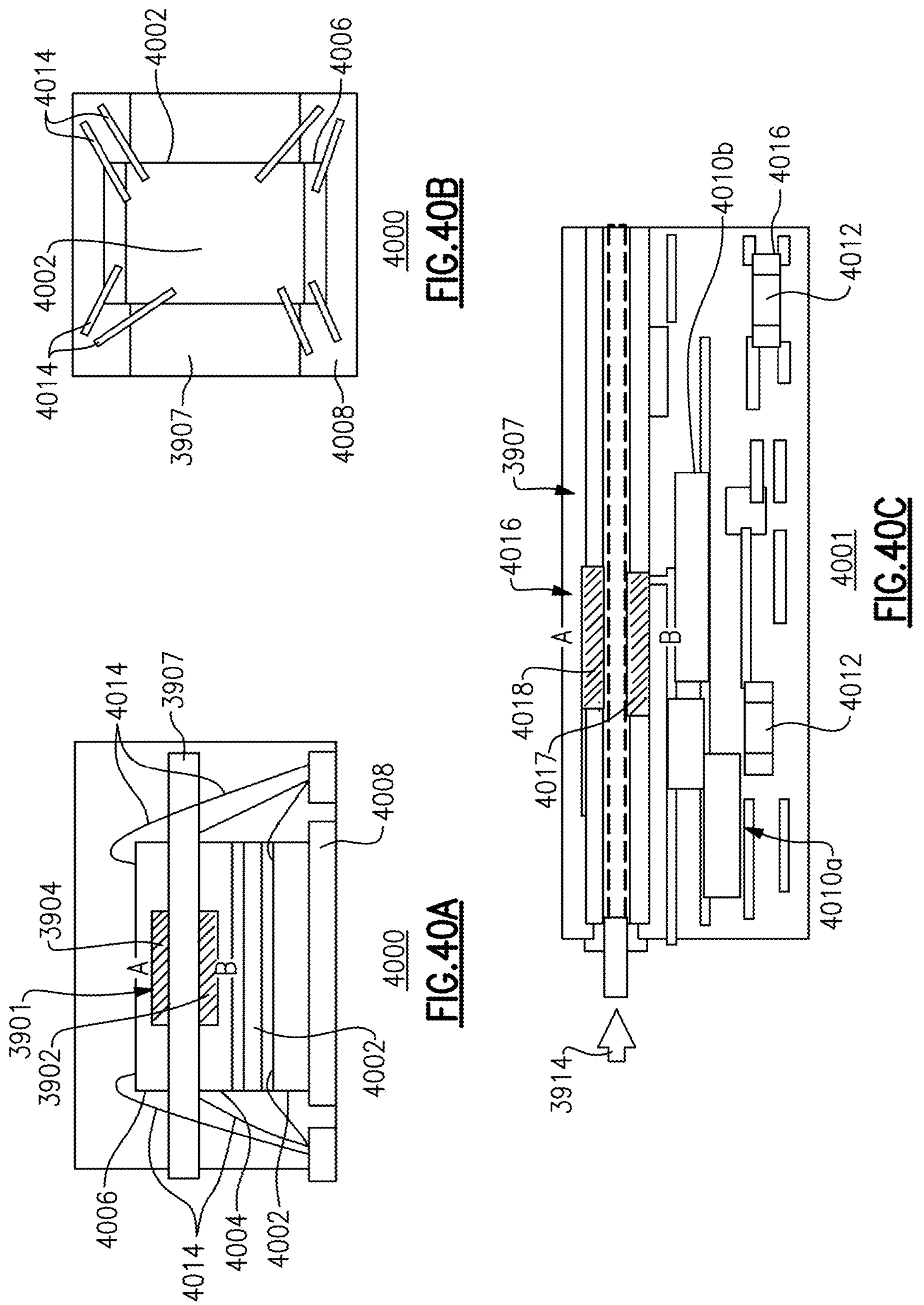
FIGS. 40A-40C illustrate an integrated circuit device comprising the vertical spark gap device shown in FIGS. 39A-C.

FIG. 40A-40B illustrate side-view and top-view of an integrated circuit device 4000 comprising the vertical spark gap device 3901 shown in FIGS. 39A-C. In some embodiments, the integrated device 4000 may comprise an SIP/Module having a channel 3907 configured to receive a fluid stream and pass the fluid via the spark gap device 3901. In some cases, one or more circuit of the integrated device 4000 may be electrically connected to the spark gap device 3901 to control a voltage applied to the spark gap device 3901 and monitor its $T_V$, an I-V behavior, and/or other electrical characteristics to assess a property of the fluid. In some cases, the one or more circuits may comprise an application specific integrated circuit (ASIC), an electronic processing circuit, or other electronic circuits. In some implementations, one or more of these electronic circuits may comprise a die. In some embodiments, the integrated device 4000 may comprise a carrier or base substrate 4008 on which one or more dies and the channel 3907 and the spark gap device 3901 are mounted or bonded. In the example shown, the integrated device 4000 includes a vertical stack comprising a first die 4002 bonded/mounted on the base substrate 4008, a second die 4004 mounted over the first die, the channel 3907 and the spark gap device 3901 mounted over the second die 4004, and a third die 4006 mounted over spark gap device 3901. In some examples, the first, second, and the third dies 4002, 4004, 4006 may be in electrical contact with the spark gap device 3901 via contact pads, wire bonds, and/or other electrical links. In some examples, the first, second, and the third die may be electrically connected to a circuit formed on the base substrate 4008 via wire bonds 4014. In some examples, the first, second, and the third dies 4002, 4004, 4006 may comprise a sensor die, an electronic processing die, or an ASIC die.

FIG. 40C illustrate a top-view of another integrated device 4001 comprising a lateral spark gap device 4016 comprising two electrodes 4017, 4018, formed around the channel 3907. In some embodiments, the integrated device 4001 can be SIP/Module having comprising the fluidic channel 3907 configured to receive a fluid stream 3914 and pass the fluid via the inter-electrode region of the lateral spark gap device 4016. In some cases, the integrated device may comprise a PCB on which the channel 3907, the lateral spark gap 4016 and one or more electronic circuits are mounted and through which the lateral spark gap 4016 and the one or more electronic circuits are electrically connected. In some examples, the electronic circuit may comprise first and second dies 4010*a*, 4010*b* and one or more discrete electronic components (e.g., passive surface mounted components). In some examples, the first and the second dies 4010*a*, 4010*b*, may comprise an ASIC and/or an electronic processing circuit. The ASIC, the electronic processing circuit, the ASIC, and the discrete electronic components may be configured to control the lateral spark gap device 4016 and monitor its $V_t$ and/or I-V behavior to assess a property of the fluid passing through the channel 3907.

Figure 41:
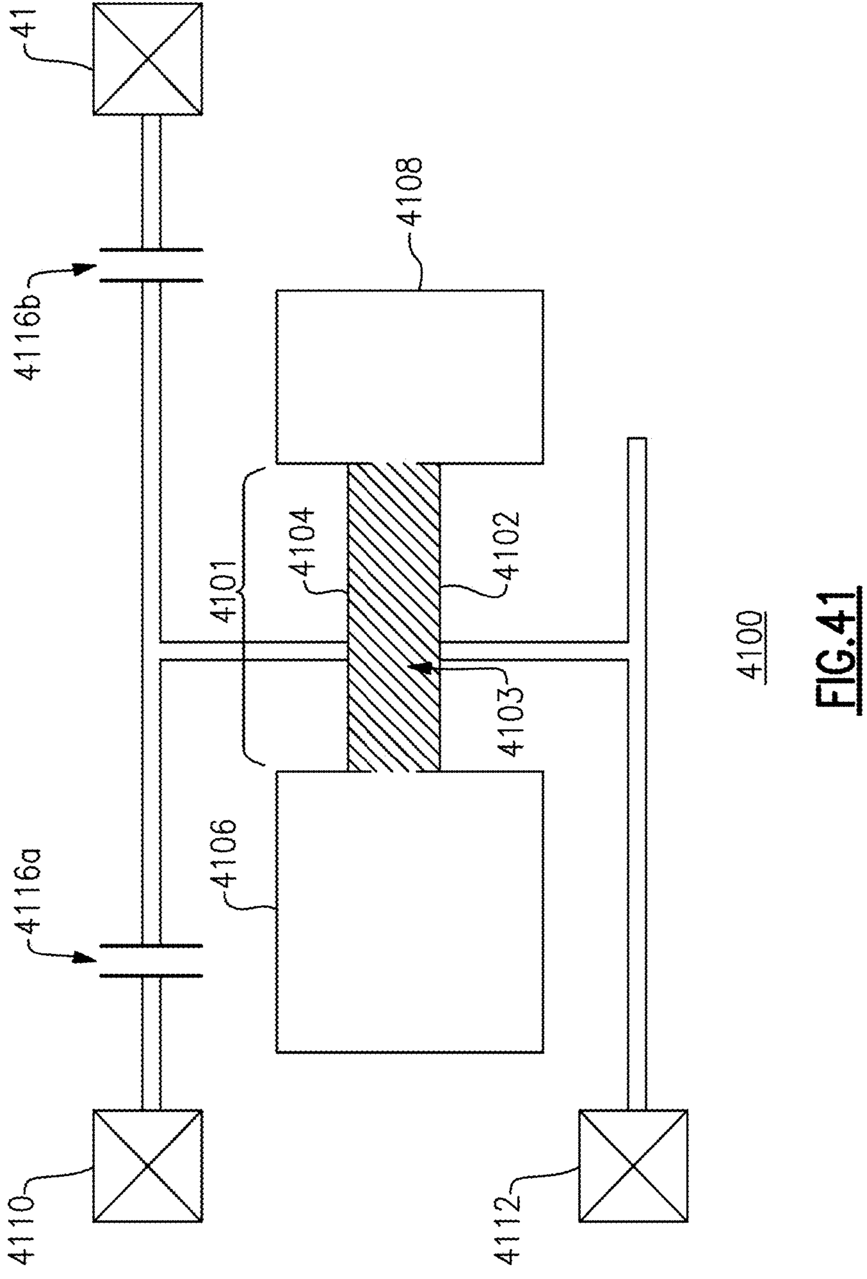
FIG. 41 illustrates a side cross-sectional view of a temperature sensing device comprising a vertical spark gap configuration.

FIG. 41 illustrates a side cross-sectional view of a temperature sensing device comprising a vertical spark gap configuration. In some implementations, the inter-electrode region of a vertical spark gap may comprise a channel connecting a first gas chamber 4106 to a second gas chamber 4108 and a region 4101 of the channel extending between the top electrode 4104 and the bottom electrode 4102 may comprise a material 4103 having a temperature dependent phase. The top electrode 4104 can be electrically connected to a floating plate of a first capacitor 4116*a* and to a floating plate of a second capacitor 4116*b* such that the floating plates and the top electrode 4104 are electrically floating. In some embodiments, a plate of the second capacitor 4116*b* opposite to the floating plate the second capacitor 4116*b* can be connected to the electric ground 4112, and a plate of the first capacitor 4116*a* opposite to the floating plate of the first capacitor 4116*a* can be connected to a positive or negative voltage 4110 with respect to ground potential. The bottom electrode 4102 can be electrically connected to the electric ground 4112.

In some implementations, the first gas chamber 4106 may comprise conductive particles and have a first pressure larger than a second pressure of the second gas chamber 4108. In some implementations, the material 4103 can be in a first phase below a threshold temperature and in a second phase above the threshold temperature.

In some examples, in an initial state the first and second capacitors 4116*a*, 4116*b* can be charged and the material 4103 can be at a first temperature below the threshold temperature and the material 4103 can be in a first phase (e.g., solid phase) that does not allow gas flow between the first and second gas chambers 4106, 4108. In some cases, in an initial state, the electric potential 4110 may be configured such that the voltage difference between the top and bottom electrodes 4104, 4102 is less than $V_{TR}$ of the spark gap formed between the top and bottom electrodes 4104, 4102 and the material 4103 in the first phase.

In some cases, starting from the initial state, when the temperature of the material 4103 rises above the threshold temperature, the phase of the material 4103 may change to a second phase (e.g., a fluidic phase) allowing the particles (e.g., conductive particles) in the first gas chamber to flow into the inter-electrode region enabling spark conduction. Such spark conduction may be detected by an external circuit to evaluate the phase and temperature of the material 4103.

Spark Gaps Integrated with Micro-Electromechanical System (MEMS)

During fabrication or in operation, micro-electromechanical system (MEMS) devices can be subjected to electrical overstress (EOS) events. For example, some MEMS devices such as electrical switches can include gas and/or movable structures (e.g., cantilevers) that are prone to arcing. In various implementations, MEMS devices may include, e.g., radio frequency (RF) MEMS such as RF MEMS switches. The inventors have discovered that portions of a movable switch, such as the tip portion of a cantilever, may be particularly prone to arcing due to a small size of a gap formed between such portions with the underlying surface. However, integrating or co-fabricating the MEMS devices with conventional semiconductor device-based EOS monitor or protection devices can be costly. In addition, integrating MEMS devices with conventional semiconductor device-based EOS monitor and protection devices can adversely affect the performance of the MEMS device. For example, integrating MEMS devices can expose the substrate on which the MEMS devices are fabricated to incorporation of dopants, e.g., by ion implantation, which decreases the impedance of the substrate. In some applications, e.g., RF MEMS switches, decreasing the impedance of the substrate can increase the parasitic losses of the transmission lines (e.g., RF transmission lines) and thereby attenuate the signals controlled by the RF MEMS. The inventors have discovered that, by integrating spark gaps with the MEMS devices instead of semiconductor device-based EOS monitor or protection devices, the impedance of the substrate can be kept relatively high, thereby reducing the parasitic losses of RF signals flowing in the MEMS devices.

Thus, there is a need to monitor and/or protect MEMS devices from the EOS events, and a further need to synergistically integrate the EOS monitor or protection devices with existing MEMS fabrication processes to reduce cost and parasitic losses.

To address these and other needs, according to various embodiments, EOS monitor/protection devices and MEMS devices that can be co-fabricated on a common substrate and/or be integrated together are disclosed. In some embodiments, a MEMS switch can be co-fabricated with an EOS monitor or protection device (e.g., the vertical spark gap device 3800) that is a separate device from the MEMS switch. In some embodiments, a MEMS switch can include an integrated vertical spark gap device. In some embodiments, an EOS monitor or protection device that is this integrated or co-fabricated with a MEMS switch may be configured to arc in response to an overvoltage applied on the MEMS switch to protect the MEMS switch from being damaged. In some such embodiments, the EOS monitor or protection device may be electrically connected with the MEMS switch in parallel. For example, the vertical spark gap device 3800 may be co-fabricated with a MEMS switch on a common substrate and can be electrically connected to the MEMS switch to protect the MEMS switch. In various implementations, at least a portion of a spark gap (e.g., a vertical spark gap) co-fabricated with the MEMS switch can have substantially the same physical dimension as the corresponding portion of the MEMS switch.

In some embodiments, a portion (e.g., a moving portion) of the MEMS device may comprise an electrode, an electrode portion or an electrode finger of the spark gap device that protects the MEMS device against EOS events. For example, an arcing gap may be integrated with a MEMS switch (e.g. RF MEMS switch) to protect the contact pads of the MEMS switch from parking due to EOS events by providing an electrical path having a resistance lower than an electrical path passing through the contact pads. In some implementations, a multi-gap spark gap device or a spark gap array may be integrated with MEMS device for EOS protection and/or monitoring. In various implementations, a spark gap device, an arcing gap or a spark gap array integrated with a MEMS device (e.g., a MEMS switch) may comprise one or more features described above, e.g., with respect to the vertical spark gap devices described above.

In some embodiments, an electronic or electrical system (e.g., a radio frequency system) may comprise a substrate having a horizontal main surface and a MEMS device formed in the substrate. In various implementations, the MEMS device may comprise a MEMS switch (e.g., RF MEMS switch), a MEMS phase shifter, a MEMS varactor, a MEMS oscillator, a micromachined inductor, or the like. In some such embodiments, the MEMS device may be integrated and/or co-fabricated with an electrical overstress (EOS) monitor or protection device configured to protect the MEMS device. Advantageously, the MEMS switch and the EOS monitor or protection device may have corresponding structures that can be co-fabricated from a common layer over the substrate.

In one embodiment, the MEMS device may comprise an anchored beam formed on a substrate. The MEMS device additionally can include at least a portion of an electrical overstress (EOS) monitor or protection device comprising one or more pairs of conductive structures (electrodes) fabricated on the substrate. The conductive structures of each pair may be separated in a vertical direction crossing a horizontal main surface of the substrate by a gap and can serve as arcing tips (or electrode fingers) configured to generate an arc discharge in response to an EOS signal received by the MEMS device.

In some examples, the MEMS switch and the EOS monitor or protection device (e.g., a spark gap) may be electrically connected to each other. For example, when the structure of the MEMS device to be protected includes a cantilever or otherwise separated conductive regions (e.g., a metal layers), the anchored beam, or a conductive region to be protected, may be electrically connected to one of the electrodes of a spark gap, such that the MEMS switch and the spark gap are electrically connected in parallel. In some embodiments, the voltage at which an electrode pair of the spark gap are triggered to arc in response to an EOS event can be lower than a voltage at which the cantilever or conductive region is triggered to arc, such that the cantilever or conductive region is protected from the EOS events. It will be appreciated that, when the cantilever or the conductive region of the MEMS device is subjected to an arcing event, the arc discharge may occur at a point of relatively high electric field, e.g., at a tip of the anchored beam or a sharp corner of a conductive region. However, the arcing event may occur at any location of the anchored beam or the conductive region, depending on the circumstances.

In some embodiments, an arcing gap or a spark gap device that protects the MEMS device can be co-fabricated with the MEMS device on a common substrate and can be electrically connected to electric ports (or terminals) of the MEMS device for EOS protection and/or monitoring.

In various implementations, a portion of the MEMS device (e.g., cantilever of a MEMS switch) and an electrode (or capping layer) of the EOS monitor or protection device (e.g., a spark gap device) can be co-fabricated using a plating process, e.g., a gold electroplating process. In some examples, other structures of the EOS monitor or protection device and the MEMS switch can be co-fabricated, including embedded metallization layers including metal layers and vias, ballast resistor lines, as well as a capping layers ("Silicon Cap") for enclosing the EOS monitor or protection device and the MEMS device.

Figure 42:
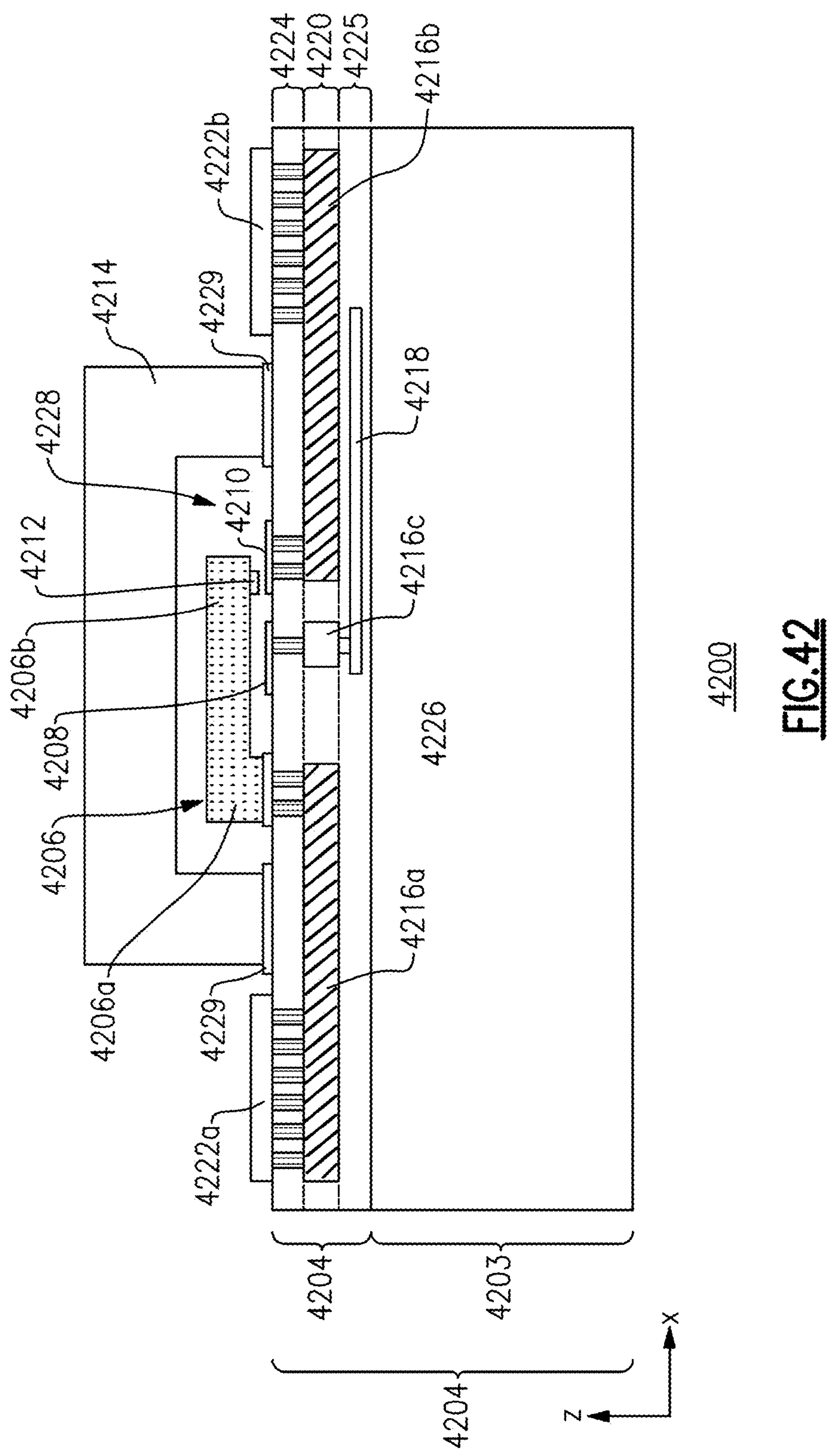
FIG. 42 illustrates a side cross-sectional view of an example of a micro-electromechanical system (MEMS) device having an integrated arcing gap for EOS protection/monitoring, according to some embodiments.

Without limitation, FIG. 42 schematically illustrates an example MEMS switch (e.g., RF MEMS switch) 4200 that can be co-fabricated and/or integrated with a vertical spark gap on a top major surface of a common substrate 4202, where the vertical spark gap is configured for ESD protection and/or monitoring of the MEMS switch. In some implementations, the substrate 4202 may comprise a base layer (e.g., a handle wafer) 4203 and a top layer 4204 on which the MEMS switch 4200 is fabricated. In some implementations, the base layer 4203 may comprise silicon (e.g., a silicon wafer) and the top layer 4204 may comprise a dielectric (e.g., silicon dioxide). In some embodiments, The MEMS switch 4200 may comprise a cantilever 4206 (also referred to as switch beam) extended from an anchored end **4206*a* to a tip end 4206*b*, a first conductive bond pad 4222*a* electrically connected to at least a portion of the cantilever 4206, a first switch contact 4210 formed on the substrate below the tip end 4206*b* and a second conductive bond pad 4222*b* electrically connected the first switch contact 4210**.

In some embodiments, the MEMS switch 4200 may be configured to control a DC and/or radiofrequency electrical connection between the first and second conductive bond pads **4222*a*, 4222*b*. For example, when the MEMS switch 4200 is in an OFF state the first and second conductive bond pads 4222*a*, 4222*b* can be electrically disconnected and when the MEMS switch 4200 is an ON state, the first and second conductive bond pads 4222*a*, 4222*b* can be connected via a DC and/or RF electrical path established by or through the cantilever 4206. In some embodiments, the cantilever may comprise a conductive region (e.g., a conductive line) configured to provide electrical connection between the anchored end 4206*a* to the tip end 4206*b*. In some implementations, in the OFF state the cantilever 4206 may be vertically separated from the top layer 4204 and extended along a direction substantially parallel to the top major surface of the substrate 4202 (e.g., parallel to x-axis). In some implementations, in the ON state the cantilever 4206 may bend toward the top layer 4204 such that at least the tip portion 4206*b* of the cantilever 4206 contacts the first switch contact 4210 to provide the DC and/or RF electrical connection between the first and second bond pads 4222*a*, 4222*b*. In some examples, the tip portion 4206*b* may comprise a second switch contact 4212 formed on the bottom surface of the cantilever 4206 and configured to contact the first switch contact 4210 when the cantilever 4206** is in the ON state.

In some implementations, the MEMS switch 4200 may comprise an actuator (e.g., an electrostatic or capacitive actuator) configured to control the vertical separation between the tip portion **4206*b* (or the second switch contact 4212) and the first switch contact 4210 and thereby the state of the cantilever 4206 and the MEMS switch 4200. In embodiments, the actuator may comprise at least one pull-down electrode (also referred to as gate electrode) formed on the top layer 4204 below the cantilever 4206. In some implementations, the actuator may further comprise an arcing electrode of a spark gap (e.g., vertical spark) formed on a top or bottom surface of the cantilever 4206. In some implementations, a conductive region of the cantilever 4206** may serve as a second pull-down electrode and/or a second arcing electrode of the spark gap.

In some examples, such as the example shown in FIG. 42, a conductive region of the cantilever 4206 may serve as the second pull-down electrode and provide the electrical link between the first and second conductive bond pads 4222*a*, 4222*b*, in the ON state. In some implementations, when a voltage difference between the first and second pull-down electrodes is below a switching voltage (e.g., near zero), the cantilever 4206 (and thereby the MEMS switch 4200) is in the OFF state and when the voltage difference between the first and second pull-down electrodes is above the switching voltage the cantilever is in the ON state. In some cases, the cantilever 4206 can be actuated by an electrostatic force between the cantilever 4206 and the pull-down electrode. As configured, the MEMS switch 4200 is configured as a three-terminal device comprising the anchored end of the cantilever 4206 serving as a source terminal, the first switch contact 4210 serving as a drain terminal, and the pull-down electrode serving as a gate terminal. In operation, when a voltage is applied to the pull-down electrode, an electrostatic pull-down force is generated on the cantilever 4206. When the gate voltage applied to the pull-down electrode ramps to a high enough value, it creates enough attraction force to overcome the resistive spring force of the cantilever 4206, and the cantilever 4206 is pulled down until the tip (the second switch contact 4212) contacts the first switch contact 4210 serving as the drain, which completes the circuit between the source and the drain, and the switch is turned on. Thus actuated, the second switch contact 4212 contacts the first switch contact 4210 to flow current through the switch beam 4206. The force it takes to pull the switch beam down is related to the spring constant of the cantilever beam and its resistance to movement. When the gate voltage at the pull-down electrode is removed, then the electrostatic attraction force disappears, and the cantilever 4206 returns to the original off position in which the second switch contact 4212 is no longer in contact with the first switch contact 4210.

In some examples, the tip portion 4206*b*, the second switch contact 4212, or otherwise a conductive region of the cantilever 4206 can be electrically connected to the first conductive bond pad 4222*a* via the anchor that mechanically supports the cantilever 4206, one or more conductive vias and a first conductive region 4216*a* that is at least partially embedded in the top layer 4204. In some embodiments, the conductive region of the cantilever 4206 can be electrically in contact with the first conductive region 4216*a* via a conductive contact layer 4226. For example, the conductive contact layer 4226 may be formed between the anchor or the anchored region of the cantilever 4206 and a top surface of the top layer 4204 and one more conductive vias may electrically connect the conductive contact layer 4226 to the first conductive region 4216*a*.

In some examples, the first switch contact 4210 can be electrically connected to the second conductive bond pad 4222*b* via one or more conductive vias and a second conductive region 4216*b* that is at least partially embedded in the top layer 4204.

In some examples, conductive vias and the conductive bond pads 4222*a*, 4222*b* may be formed in a metallization layer 4220 and an ILD layer 4224 of the top layer 4204, respectively. In some embodiments, the cantilever 4206 and the anchor may be formed as a single element using a conductive material (e.g., a metal such as gold, copper, aluminum, or a metal alloy). In some embodiments, the cantilever and or the anchor may comprise a dielectric structural material and conductive regions formed within or over the dielectric material. In various implementations, the anchor and the cantilever may comprise the same or different structural materials.

In some implementations, the MEMS switch 4200 may further comprise a conductive pad 4208 formed on the top major surface of the substrate 4202 below the cantilever 4206 (e.g., between the tip region 4206*b* and anchored region 4206*a*). In some embodiments, the conductive pad 4208 can serve as the gate electrode (pull-down electrode) of the MEMS switch (for applying electrostatic force to the cantilever 4206). In some embodiments, the conductive pad 4208 can further form a vertical arcing gap with a conductive region of the cantilever 4206. For example, conductive pad 4208 and conductive region of the cantilever 4206 can serve as bottom and top electrodes of a vertical spark gap, respectively. In some embodiments, the conductive pad 4208 can serve both as the bottom electrode of a vertical spark gap and the gate electrode (pull-down electrode) of the MEMS switch (for applying electrostatic force to the cantilever 4206).

In one embodiment shown in FIG. 42, the EOS protection and/or monitoring (the spark gap device), which is integrated with the MEMS switch 4200, may comprise an arcing gap formed between a conductive region of the cantilever 4206, which is electrically connected to the conductive bond pad 4222*a*, and the conductive pad 4208. In some examples, this arcing gap can protect the MEMS switch (e.g., the first and second switch contacts 4210, 4212) from being damaged by an EOS event during fabrication or operation. As such, the conductive pad 4208 and/or the first switch contact 4210 can serve as the bottom electrode (or the first conductive layer) of the spark gap and the conductive region of the cantilever 4206 serves as the top electrode of the spark gap. In this configuration, the first conductive bond pad 4222*a* serves both as a terminal for the MEMS switch 4200 and a first voltage node or first voltage node connection. In order to protect the MEMS switch 4200, during fabrication or in use, in response to an EOS signal, the arcing electrodes of an EOS monitor or protection device (e.g., FIGS. 38A and 38B) integrated with the MEMS switch 4200 are configured to generate an arc discharge across the arcing gap at an arcing voltage that is lower relative to a breakdown voltage of the MEMS switch between the cantilever 4206 and the conductive pad 4208 and/or the first switch contact 4210. Thus, arcing in the MEMS switch 4200 is suppressed, thereby reducing the chances of damage from arcing.

In some embodiments, the conductive pad 4208 (e.g., serving as a bottom electrode of the spark gap) may be electrically connected to a second voltage node via a conductive line 4218 formed in the top layer 4204. In some embodiments, the second voltage node may comprise a ground potential. In some such embodiments, the conductive line 4218 may comprise a resistive sheet serving as a ballast resistor for the arcing gap formed between cantilever 4206 and the first switch contact 4210. In some embodiments, the conductive line 4218 (e.g., serving as a pull-down electrode) may be electrically connected to a control circuit via the conductive pad 4208. In various implementations, the conductive line 4218 may be formed in the metallization layer 4220 or another metallization layer 4225 below the metallization layer 4220.

In some embodiments, the second voltage node may comprise a ground potential. In various implementations, the conductive line 4218 may be formed in the metallization layer 4220 or another metallization layer 4225 below the metallization layer 4220.

In some embodiments, to protect the MEM Switch 4200, more specifically to protect the first and second switch contacts 4210, 4212, against an EOS event, the cantilever; 4206 (e.g., top electrode) and the conducive pad 4208 (e.g., bottom electrode) can be configured to generate an arc discharge at a lower arcing voltage relative to an arcing voltage of the first and second switch contacts 4210, 4212.

In some embodiments, a MEMS device may include a sealed cavity within which at least a portion of the MEMS structure is formed. In some embodiments, the sealed cavity can be formed by a capping layer ("Silicon Cap") configured to enclose and protect the MEMS device. In some embodiments, an EOS protection or monitoring device integrated with the MEM device (e.g., a spark gap or spark gap array) may be positioned with respect to the MEMS device such that at least the sparking gap(s) of EOS protection or monitoring device are inside the sealed cavity. In these embodiments, the arcing medium of the sparking gap(s) may comprise a portion of the sealed cavity. In some cases, the cavity can be hermetically scaled such that the gas inside the enclosed volume does not substantially mix with outside air. In some such cases, the capping layer ("Silicon Cap") may be fabricated separate from the MEMS device and then bonded or otherwise connected to a substrate on which the MEMS device is fabricated via one or more sealing connections. In some embodiments, the one or more sealing connections are configured to form a hermetic seal between the capping layer and the substrates. In various embodiments, a sealing connection can be further configured to allow an electric transmission line (e.g., an RF feed though) to provide an electrical connection between the portion of MEMS device and/or the integrated EOS protection or monitoring device within the sealed cavity and a conductive bond pad positioned outside of the sealed cavity. In some embodiments, a sealing connection may comprise a sealing pad or a bond frame formed on the substrate and/or on the capping layer. For example, a sealing connection may comprise a first sealing pad disposed on the substrates and a second sealing pad disposed on the capping layer where the first and second sealing pad are bonded via thermal bonding, soldering, and the like. In some cases, the sealing pad may comprise glass (e.g., glass frit).

In some implementations, the first and second switch contacts 4210, 4212, and/or the conductive pad 4208 may comprise ruthenium or other conductive materials.

In some implementations, the vertical separation between the cantilever 4206 and the conductive pad 4208 (or the size of the arcing gap) can be from 0.5 to 1 micron, from 5 to 10 microns, from 10 to 20 microns or any ranges formed by these values or larger or smaller values.

As described above, e.g., with respect to FIGS. 34A-34B and 36A-36E, in some embodiments, a spark gap or spark gap array may comprise a sealed gas-filed inter-electrode region or arcing medium having a specified composition and pressure configured to provide desired arcing characteristics including but not being limited to trigger voltage ($V_{TR}$). Advantageously, when the MEMS device includes a sealed cavity, the sealed cavity can be filed with a gas or gas mixture and maintain the pressure of the gas or gas mixture to provide arcing medium that supports the desired arcing characteristics of the spark gap or spark gap array. As such, in some cases, the capping layer serves both as a protecting shield for the MEMS device and a gas-filed chamber for the spark gap or spark gap array. In some embodiments, the capping layer can be fabricated under an atmosphere other than air (e.g., an atmosphere comprising a specified gas mixture) at a sufficient pressure such that the cavity inside the capping layer remains isolated with a desired internal pressure. In some cases, the desired internal pressure can be about the same or slightly higher relative to the outside air.

With continued reference to FIG. 42, the MEMS switch comprises a capping layer 4214 that forms a sealed cavity 4228 around the cantilever 4206 such that at least the cantilever 4206, the conductive pad 4208 and the first switch contact 4210 are within the sealed cavity and are isolated from the atmosphere outside the caping paler 4214. In some embodiments, the capping layer 4214 may be pre-fabricated and then bonded to the substrate 4202 using a MEMS bonding process. In some examples, the capping layer 4214 may be bonded to a top surface of the top layer 4204 via a bond frame 4229. In some implementations, the bond frame 4229 may comprise a glass layer.

One skilled in the art would appreciate that that the capping layer 4214 may be fabricated and then bonded to the substrate 4202 using common MEMS fabrication and bonding techniques.

In some implementations, the sealed cavity 4228 may be filled with a gas mixture comprising nitrogen, helium, argon, a combination thereof or other gases. In some embodiments, the gas mixture and pressure within the sealed cavity 4228 may be configured to provide a trigger voltage ($V_{TR}$) for the arcing gap formed between the cantilever 4206 (e.g., a conductive region of the cantilever 4206) that is smaller than a arcing voltage between the first and second switching contacts 4210, 4212, when the cantilever is in the OFF state, be a factor larger than from 1.1 to 2, from 2 to 4, from 4 to 6 or any ranges formed by these values or larger or smaller values.

In some embodiments, at least a portion of a spark gap or spark gap array can be fabricated using a MEMS fabrication technique. In some embodiments, at least a portion of a spark gap or spark gap array having an arcing medium comprising a gas filed scaled cavity can be fabricated using MEMS fabrications techniques. For example, the spark gap array 2500 described above with respect to FIG. 25 can include a gas-filed arcing medium formed by a capping layer formed using MEMS fabrication techniques. In some cases, in addition to the capping layer, an electrode, an electrode finger, or other portions of such spark gap array may be fabricated using MEMS fabrication techniques. In some embodiments, at least a portion (e.g., a layer) of a spark gap or spark gap array can be co-fabricated with a portion (e.g., a layer) of a MEMS device on a common substrate. In some embodiments, at least a portion of a spark gap or spark gap array having an arcing medium comprising a gas filed sealed cavity can be co-fabricated with a portion of a MEMS device on a common substrate. For example, the spark gap array 2500 described above with respect to FIG. 25 may have gas-filed arcing medium formed by a capping layer co-fabricated with another capping layer formed over a MEMS device. In some cases, in addition to the capping layer, an electrode, an electrode finger, or other portions of such spark gap array may be co-fabricated with a portion of the MEMS device. In some embodiments, the spark gap or spark gap array can be co-fabricated with the MEMS device on a common substrate. In some examples, the cantilever **4206*a* (switch beam) of the MEMS switch 4200 and the conductive beam 3806 of the spark gap device 3800** can be co-deposited to have the same thickness at a corresponding horizontal portion thereof.

In various embodiments, at least one the conductive bridge 3806 of the spark gap device 3800 (shown in FIG. 38), the electrode fingers, the capping layer 4214 may be co-fabricated with corresponding regions or regions of one more MEMS device on the substrate. In some embodiments, conductive bridge 3806 and, in some cases, a metallic portion of a MEMS device, may be fabricated using a plating process, e.g., a gold electroplating process. Various other structures of the spark gap device 3800 and a MEMS device can be co-fabricated, including embedded metallization layers including metal layers and vias, ballast resistor lines, as well as a capping layers ("Silicon Cap") for enclosing the EOS monitor or protection device and the RF MEMS switch. When the MEMS device and the EOS monitor or protection device are co-fabricated, they can have one or more corresponding structures that are co-fabricated such that the corresponding structures comprise a same material or have at least one common feature dimension. For example, the conductive bridge 3806 and the cantilever 4206 may be formed of the same metal, and/or may have the same thickness of the horizontal portions. Thus, the conductive bridge 3806 may have similar or the same horizontal portion as the horizontal portion of the cantilever 4206. In addition, the anchor portion formed at one end of the cantilever 4206 may be similar to the anchor portions at both ends of the conductive bridge 3806. Other structures such as the metallization layers and vias below the surface of the substrate may also be formed of the same material and have similar or the same thicknesses and/or lateral dimensions.

Multiple Vertical Spark Gaps with Multiple Trigger Voltages

In various fabrication technologies such as semiconductor fabrication technologies (e.g., layer growth and deposition control technologies), the thicknesses of various layers of a structure or IC can be controlled relatively precisely and cost-effectively, compared to, e.g., controlling lateral dimensions of the layers using patterning techniques (e.g., lithographic or direct patterning techniques). As described above, the inventors have discovered that a vertical spark gap can be designed to have a vertically extended arcing gap formed between vertically separated and laterally overlapping electrodes configured to arc through an inter-electrode layer formed therebetween. Advantageously, the size of the arcing gap and thereby the trigger voltage of such vertical spark gap can be controlled by controlling the thickness of the inter-electrode layer using the above-mentioned semiconductor fabrication technologies. Moreover, the electrodes of the vertical spark gap can arc between planar surface portions, rather than between, e.g., sharpened tips, allowing the electrodes to be reused multiple times before a significant change in the trigger voltage or other electrical characteristics of the spark gap occur.

In another aspect of the disclosed technology, these advantageous aspects can be utilized to integrate a plurality of vertical arcing gaps (or vertical spark gaps) having different trigger voltages, on a common substrate (e.g., a semiconductor substrate). In some embodiments, at least one of the electrodes (or electrode fingers), e.g., the top electrode (or top electrode finger) of a first vertical spark gap may be disposed at a first electrode layer and the top electrode of a second vertical spark gap may be disposed at a second electrode layer different from the first electrode layer, such that the resulting different pairs of electrodes (or electrode fingers) are separated by different thicknesses of one or more interlayer dielectric (ILD) layers. In some implementations, inter-electrode regions of the first and the second arcing gaps may comprise similar or different material compositions. In some implementations, an inter-electrode region of at least one vertical arcing gap of the plurality of vertical arcing gaps may comprise a gas-filled cavity formed between electrode layers and/or ILD layers. In some embodiments, the first electrode layer, the second electrode layer, and the ILD layer can be layers within an integrated circuit (IC) device. In some such embodiments, the IC device may comprise one or more semiconductor devices (e.g., electronics, optoelectronic, or photonic devices). In some examples, at least one of the semiconductor devices may be co-fabricated with the first and second vertical spark gap devices. In some such examples, at least one region or section of the first and/or second vertical spark gap device may have substantially the same physical dimension as a corresponding region or section of the at least one semiconductor device.

Without limitation, example embodiments of such integrated spark gap device having multiple trigger voltages are described below.

According to various embodiments, an electrical overstress (EOS) monitor or protection device comprises a substrate having a horizontal main surface having formed thereover a plurality of pairs of conductive layers, where different ones of the arcing electrode pairs are separated in a vertical direction by different vertical distances. Each pair serves as an arcing electrode pair and different ones of the arcing electrode pairs are configured to arc discharge at different voltages in response to an EOS signal. The conductive layers can be patterned using semiconductor fabrication techniques including lithography and etch, and the different vertical distances may be formed using semiconductor fabrication techniques including thin film deposition techniques. In some embodiments, the EOS monitor or protection device may comprise a plurality of first conductive layers formed at different vertical levels above the horizontal main surface. Each of the first conductive layers can extend in a lateral direction substantially parallel to the horizontal main surface. The device additionally can include a second conductive layer formed between the first conductive layers and the horizontal main surface and extending in the lateral direction. Each of the first conductive layers can have an overlapping portion with the second conductive layer, where the overlapping portions serve as arcing electrode pairs configured to form arc discharges at different voltages in response to an EOS signal. In some examples, the second conductive layers may be formed within a common electrode layer and the first conductive layers may be formed withing different electrode layers having different vertical separations from the horizontal main surface. In some embodiments the second conductive layer may be electrically connected. In various implementations, an electrode layer may comprise at least one electrically conductive section or region and at least one electrically insulating section or region. In some implementations, the electrically insulating section or region may comprise a dielectric material. In some implementations, the electrically conductive section or region may comprise a metal or a doped semiconductor material (e.g., heavily doped polysilicon). In some cases, an electrode layer may comprise a metallization layer formed within an IC device and an electrode can be a metallic region formed within the metallization layer. For example, a plurality of first conductive layers may include multiple upper polycrystalline silicon layers formed at different vertical levels, and the second conductive layer includes a lower polycrystalline silicon layer formed below the upper polycrystalline silicon layers such that different pairs of arcing electrodes formed by one of the upper polycrystalline silicone layers and the lower polycrystalline layer are separated by different dielectric layer stacks having different thicknesses, such that the different pairs are configured to arc at different voltages in response to an EOS signal.

Figure 43:
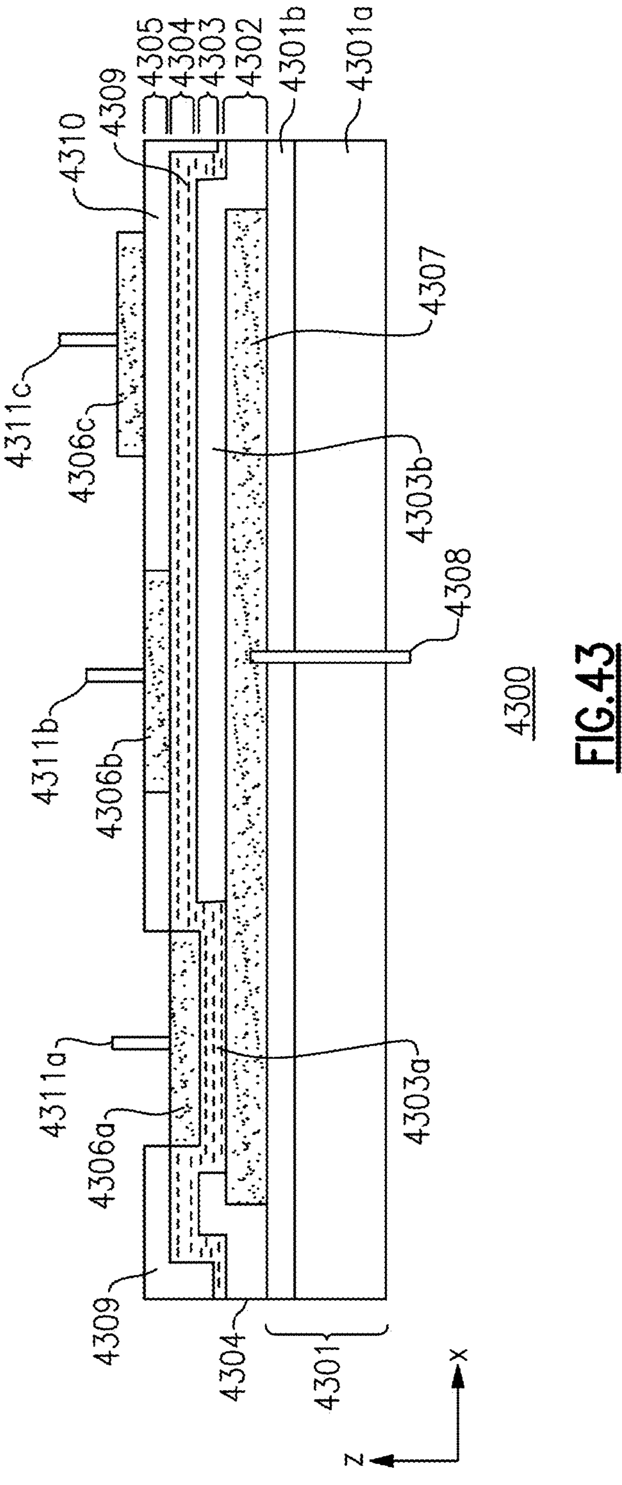
FIG. 43 illustrates a side cross-sectional view of an example of a multi-gap vertical spark gap device that includes three arcing gaps having different trigger voltages.

FIG. 43 illustrates a side cross-sectional view of an example of a multi-gap vertical spark gap device 4300 that includes three arcing gaps having different trigger voltages. In some embodiments, the multi-gap vertical spark gap device 4300 may comprise a substrate 4301 having a top horizontal main surface (herein referred to as top surface) and three top electrodes 4306*a*, 4306*b*, 4306*c* formed at different vertical levels above the horizontal main surface. The top electrodes 4306*a*, 4306*b*, 4306*c* may be formed as patterned thin films and can extend in a lateral direction (e.g., along x-axis) substantially parallel to the top surface of the substrate 4301. The multi-gap vertical spark gap device 4300 can include a common bottom electrode 4307 formed on or over the substrate 4301 between the top surface and the electrodes 4306*a*, 4306*b*, 4306*c* and extending in the lateral direction. An individual one of the top electrodes 4306*a*, 4306*b*, 4306*c* can have an overlapping portion with the bottom electrode 4307 to form a vertical arcing gap having an inter-electrode region extending from the bottom electrode 4307 to the corresponding top electrode. In various implementations the inter-electrode region may comprise one or more layers or regions along the vertical direction (e.g., along z-axis) and one or more lateral regions. In some examples, two layers and/or two lateral regions within the inter-electrode region may comprise similar or different material compositions. In some embodiments, such as the embodiment shown in FIG. 43, each of the top electrodes 4306*a*, 4306*b*, 4306*c* can have an overlapping portion with the bottom electrode 4307, where the overlapping portions serve as arcing electrode pairs configured to form arc discharges at different voltages in response to an EOS signal. In some implementations, an inter-electrode region between each of the arcing electrode pairs may comprise one or more layers or regions along the vertical direction and one or more lateral regions. In some examples, two layers and/or two lateral regions within one or more inter-electrode regions may comprise similar or different material compositions (e.g., insulating materials having different dielectric properties). As described herein, an electrode may be described as being formed within an electrode layer that can include non-electrode regions. Thus, an electrode layer can include a conductive section (e.g., the electrode) and a dielectric section. In some embodiments, different electrodes can be formed within different electrode layers. For example, the bottom electrode 4307, the first top electrode 4306*a* and the second top electrode 4306*b* may be formed within the first, second and third electrode layers 4302, 4304, 4305, respectively, where the third electrode layer 4305 is formed above the second electrode layer 4304, and the second electrode layer 4304 is formed above the first electrode layer 4302.

In some implementations, different arcing gaps of the multi-gap spark gap device 4300 may comprise different numbers of dielectric layers and/or different numbers of lateral regions having different dielectric properties. In some embodiments, two or more inter-electrode regions of the arcing gaps formed between the top electrodes 4306*a*, 4306*b*, 4306*c* and the common bottom electrode 4307, may comprise at least one layer or one vertical region having the same dielectric properties and/or material compositions. In some embodiments, two or more inter-electrode regions of the arcing gaps may comprise at least one common layer (e.g., an electrode layer an ILD layer) laterally extending across the spark gap device 4300. In some embodiments, an inter-electrode region of a vertical spark gape may comprise a dielectric section of an electrode layer of another vertical spark gap formed over the same substrate. In some embodiments, different lateral sections of the common layer under different top electrodes 4306*a*, 4306*b*, 4306*c* may comprise multiple sections having different materials and/or electric properties.

With continued reference to FIG. 43, the multi-gap vertical spark gap device 4300 comprises an ILD layer 4303 formed over the first electrode layer 4302 and the bottom electrode 4307 therein, and laterally extending below the top electrodes 4306*a*, 4306*b*, 4306*c*. The ILD layer 4303 may comprise a first dielectric section 4303*a* laterally extending below a first top electrode 4306*a*, and a second dielectric section 4303*b* laterally extending below the second and third top electrodes 4306*b*, 4306*c*. In some embodiments, the first and second sections of the ILD layer 4303 may have different material compositions and/or dielectric properties. In one embodiment, the first dielectric section 4303*a* of the ILD layer 4303 may comprise silicon nitride and the second dielectric section 4303*b* of the ILD layer 4303 may comprise silicon dioxide.

The multi-gap vertical spark gap device 4300 further comprises a second electrode layer 4304 within which the first top electrode 4306*a* is formed. In some implementations, the second electrode layer 4304 may comprise a third dielectric section 4309 laterally extending from the first top electrode 4306*a* below the second and third top electrodes 4306*b*, 4306*c* and through the respective inter-electrode regions. In some embodiments, the third dielectric section 4309 of the second electrode layer 4304 may have similar or identical material composition and/or dielectric properties as the first section of the ILD layer 4303 below the first top electrode 4306*a*. In some implementations, the multi-gap vertical spark gap device 4300 further comprises a third electrode layer 4305 within which the second top electrode 4306*b* is formed. In some implementations, the third electrode layer 4305 may comprise a fourth dielectric section 4310 laterally extending from the second top electrode 4306*b* below the third top electrode 4306*c* and through its trough inter-electrode regions. In some embodiments, the third dielectric section 4309 of the second electrode layer 4304 may have similar or identical material composition and/or dielectric properties as the first dielectric section 4303*a* of the ILD layer 4303 below the first top electrode 4306*a*. In some embodiments, the fourth dielectric section 4310 of the third electrode layer 4304 may have similar or identical material composition and/or dielectric properties as the second dielectric section 4303*b* of the ILD layer 4303 below the second and third top electrodes 4306*b*, 4306*c*. In various implementations, the thickness and material composition of the ILD layer 4303 and those of the second and third electrode layers 4304, 4305 (and thereby the dielectric sections therein), may be tailored to provide desired and different $V_{TR}$'s for the three arcing gaps formed by the three top electrodes 4306*a*, 4306*b*, 4306*c*.

In some embodiments, the bottom electrode 4307 and the top electrodes 4306*a*, 4306*b*, 4306*c* may comprise doped polysilicon or another doped semiconductor having high conductivity.

In some embodiments, the bottom electrode 4307 may be electrically connected to a first voltage node via a first conductive path 4308. In some embodiments, individual ones of the top electrodes 4306*a*, 4306*b*, 4306*c* may be electrically connected to a second voltage node via a second conductive path. In some cases, the first and second conductive paths may comprise one or more conductive vias and conductive regions formed in ILD layers, electrode layers and/or metallization layers above or below the respective electrodes. In some embodiments, the top electrodes 4306*a*, 4306*b*, 4306*c* may be electrically connected to second, third, and fourth voltage nodes via electrically isolated second, third, and fourth conductive paths, respectively. In some implementations, the first voltage node may comprise a ground potential and the second, third, and third voltage nodes may comprise a positive or negative potential with respect to the ground potential.

In some embodiments, a resistivity of at least a portion of the bottom electrode 4307 can be greater than the resistivity of the top electrodes 4306*a*, 4306*b*, 4306*c* and/or the resistivity of different portions of the first electric path that electrically connects the bottom electrode 4307 to the first voltage node. In some embodiments, a resistance of at least a portion of the bottom electrode 4307 can be greater than the resistance of the first conductive path 4308 that electrically connects the bottom electrode 4307 to the first potential. In some embodiments, at least a portion of the bottom electrode 4307 may serve as a ballast resistance for at least one of the arcing gaps of the multi-gap vertical spark gap device 4300. In some embodiments, the bottom electrode 4307 may comprise one or more features described above with respect to the bottom electrodes and bottom electrode fingers of the vertical spark gap devices shown in FIGS. 20A-20B and 21A-21B. In some embodiments, a ballas resistor may be disposed between the bottom electrode 4307 and the first voltage node. In some examples, a ballast resistor may be formed in the first electrode layer 4302 of layer (e.g., an electrode layer) above or below the bottom electrode 4307.

In some embodiments, thickness of the ILD 4303 can be from 0.2-1 microns, from 1-5 microns, from 5-10 microns, or any ranges formed by these values or larger or smaller values.

In some embodiments, thickness of the first, second and third electrode layers 4302, 4304, 4305 can be from 0.2-1 micron, from 1-5 microns, from 5-10 microns, or any ranges formed by these values or larger or smaller values.

In various implementations, ILD layer 4303 and dielectric sections 4309, 4310 of the second and third electrode layers 4304, 4305, may comprise silicon nitride, silicon dioxide, or other dielectric materials.

In some implementations, the third top electrode 4306*c* may be formed over the fourth dielectric section 4310 of the third electrode layer 4305. In some such implementations, the third top electrode 4306*c* may be formed within a fifth electrode layer formed over the third electrode layer 4305. In some embodiments, in the same manner described above, a multi-gap vertical spark gap may comprise N electrode layers formed over a substrate above a bottom electrode, where each electrode layer includes at least one top electrode that forms a vertical arcing gap with the bottom electrode. Such vertical spark gap device may include at least N arcing gaps having N different trigger voltages. In various implementations, one or more ILD layers may be disposed between two electrode layers adding to vertical inter-electrode spacing of the corresponding arcing gap(s). In various implementations, thickness and compositions of the dielectric sections of the electrode layers and intervening ILD layers may be designed and tailored to provide a desired $V_{TR}$ for each of the arcing gaps formed in such multilayer electrode arrangement. In some embodiments, an arching gap may comprise a dielectric section of the an electrode layer associated with another arcing gap.

In the embodiment shown in FIG. 43, a first inter-electrode region between the bottom electrode 4307 and the first top electrode 4306*a* comprises a first vertical region, a second inter-electrode region between the bottom electrode 4307 and the second top electrode 4306*b* comprises a second vertical region and a third vertical regions above the second vertical region, and a third inter-electrode region between the bottom electrode 4307 and the third top electrode 4306*c* comprises a fourth vertical region, a fifth vertical region above the fourth vertical region and a sixth vertical region above the fifth vertical region. In some implementations, the first, third and fifth vertical regions may comprise substantially the same material. In some implementations, the second, fourth and sixth vertical regions may comprise substantially the same material. For example, the first, third and fifth vertical regions may comprise silicon nitride and the second, fourth and sixth vertical regions may comprise silicon dioxide.

In some embodiments, the substrate may comprise a base layer 4301*a* and atop layer 4301*b* on which the arcing gaps are formed.

In some embodiments, the top electrodes, 4306*a*, 4306*b*, 4306*c*, the inter-electrode regions between any of the top electrodes 4306*a*, 4306*b*, 4306*c* and the bottom electrode 4307 (or multiple bottom electrodes), and their surrounding regions, may comprise one of more features described above with respect to any of the vertical spark gap devices 2700, 2710, 2800D, 2900D, 3000D, 3100D, 3200, 3203 and 3205. In some such embodiments, fabrication of the one or more features may comprise an intermediate structure described above with respect to parts A, B and C in FIGS. 28-32. For example, the bottom electrode 4307 may comprise a doped conductive region within a semiconductor substrate, any of the top electrodes 4306*a*, 4306*b*, 4306*c*, may comprise a trigger voltage tuning layer having a particular work function for tune the trigger voltage or the arcing voltage of the respective arcing gap, any of the inter-electrode regions may include two or more vertical regions or layers having different thicknessed and dielectric properties and formed using different methods, any of the top electrodes 4306*a*, 4306*b*, 4306*c* may comprise sections or regions having different vertical separations from the bottom electrode 4307 (similar to vertical spark gap devices 3200, 3203, 3205), and other features.

In some embodiments, the inter-electrode regions between any of the top electrodes 4306*a*, 4306*b*, 4306*c* and the bottom electrode 4307 (or multiple bottom electrodes), may comprise a gas-filled cavity. For example, a portion of the first dielectric region of the ILD layer 4303 may be removed to generate a void and then capped by the first top electrode 4306*a* (e.g., a in a controlled atmosphere) to provide a gas-filled cavity having specified pressure and molecular composition, between the first top electrode 4306*a* and the bottom electrode 4307.

In some embodiments, at least two arcing gaps may comprise bottom electrodes or bottom electrode sections formed in different electrode layers having different vertical separations with respect to the top surface of the substrate 4301. In some such embodiments, these bottom electrodes can be electrically connected or isolated.

In some embodiments, any of the top electrodes, 4306*a*, 4306*b*, 4306*c* and the bottom electrode 4307, may comprise multiple electrically connected sections or electrode fingers. In some such embodiments, the multiple sections may be electrically connected via a resistive sheet serving as a ballast resistance for the respective arcing gaps. As such, in some examples, the three arcing gaps of the multi-gap vertical spark gap device 4300, having different $V_{TR}$'s, may comprise one or more arcing gaps having substantially identical $V_{TR}$'S.

In some embodiments, the top electrodes 4306*a*, 4306*b*, 4306*c*, the bottom electrode 4307, and the inter-electrode regions between any of the top electrodes 4306*a*, 4306*b*, 4306*c* and the bottom electrode 4307 (or multiple bottom electrodes), and their surrounding regions, may comprise one of more features described above with respect to any of the vertical multi-gap spark gap devices 3600D, 3600E and 3700B.

Figures 44A, 44B, 44C, 44D, 44E, 44F:
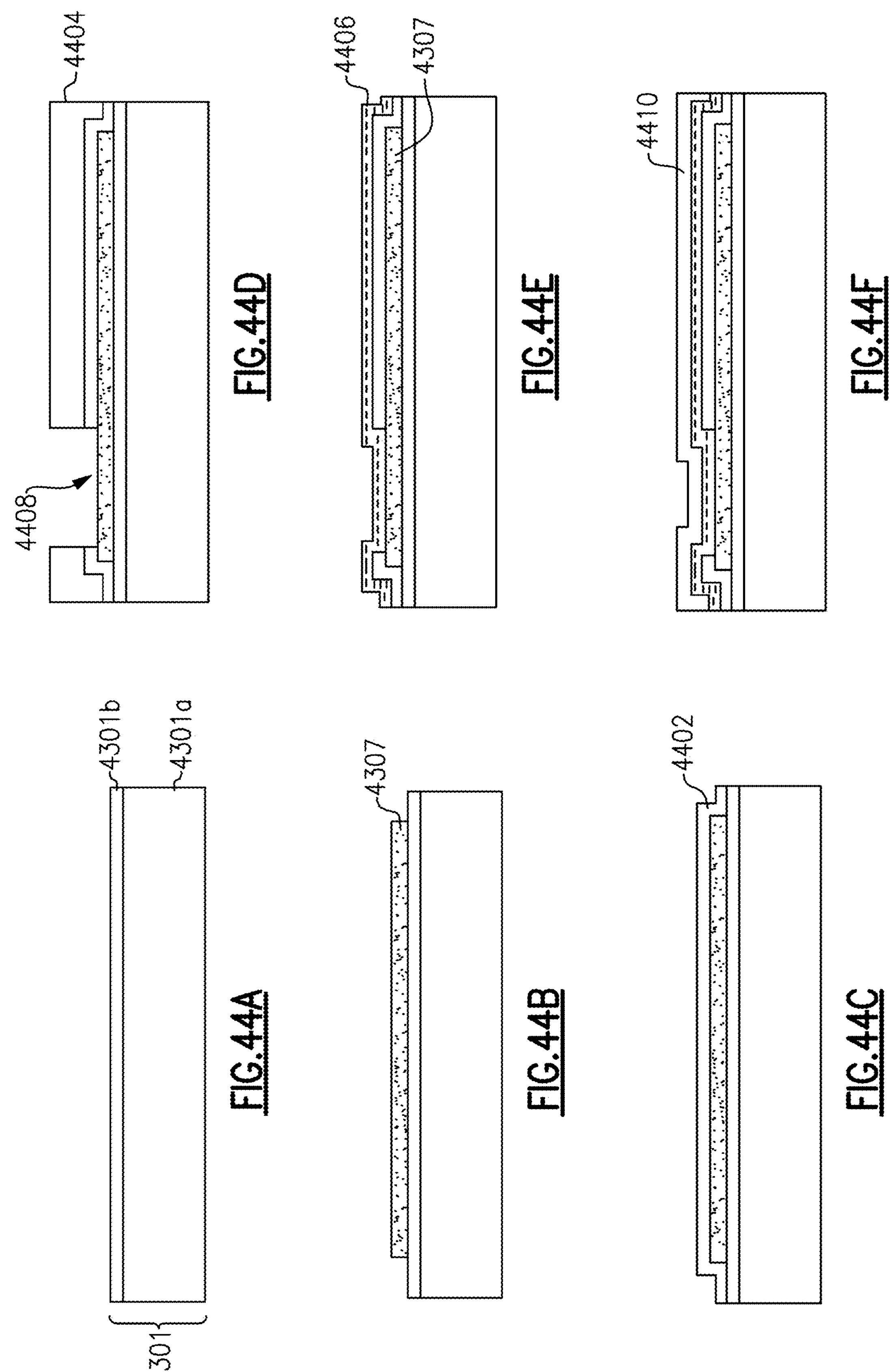
FIGS. 44A-44J illustrate side cross-sectional views of intermediate structures at various stages of fabricating of the multi-gap vertical spark gap device shown in FIG. 43.

FIGS. 44A-44J illustrate side cross-sectional views of intermediate structures at various stages of fabricating of the multi-gap vertical spark gap device 4300 (shown in FIG. 43) comprising three arcing gaps having different $V_{TR}$'s. FIG. 44A, a substrate 4301 having a base layer 4301*a* and a top layer 4301*b* may be provided. In some examples, the top layer can be a silicon dioxide layer and the base layer can be a silicon wafer. In some embodiments, the multi-gap spark gap device 4300 may be fabricated over the substrate 4301 by deposition and patterning of several layers. In various fabrication stages described below a metallic layer, a dielectric layer, a conductive semiconductor layer, or other layer may be disposed by a suitable deposition technique including but not being limited to atomic layer deposition (ALD), chemical vapor deposition (CVD) or physical vapor deposition (PVD) and other techniques. In various fabrication stages described below a dielectric or metallic layer may be patterned by depositing a masking layer, patterning the masking layer and then patterning the layer underneath. In some examples, the masking layer may be patterned using a photolithographically patterned photoresist layer. In some other examples, the patterned mask may comprise a photolithographically patterned photoresist layer. In various implementations, patterning a dielectric or metallic layer may comprise etching the dielectric or metallic layer through the patterned masking layer using dry or wet etching techniques. In various implementations, patterning a photoresist layer may comprise illuminating the photoresist layer via a mask and developing the illuminated photoresist.

Referring to FIG. 44B, an intermediate structure is illustrated, which includes the substrate 4301 on which the bottom electrode 4307 is formed, e.g., by forming a conductive layer on the top layer 4301*b* and then patterning the conductive layer. In some examples, the conductive layer and the resulting bottom electrode 4307 may comprise a doped semiconductor such as polysilicon layer. In some examples, the polysilicon layer can be doped after being disposed on the substrate 4301 before or after being patterned. In some other examples, the polysilicon layer may be doped in situ as it is being disposed on substrate 4301. In some embodiments, the bottom electrode 4307 may comprise two or more layers where at least one layer has a greater resistivity than the other layers. In some embodiments, the bottom electrode 4307 may comprise two or more lateral regions or sections where at least one lateral section or region has a greater resistivity than the other regions or sections. In some examples, the bottom electrode may comprise a metal such as aluminum, gold, TiW, SiCr, or a combination thereof.

Referring to FIG. 44C, an intermediate structure is illustrated, which represents the intermediate structure shown in FIG. 44B, which has been further processed to form a first dielectric layer 4402 over the bottom electrode 4307. In some implementations, a thickness and/or a dielectric property the first dielectric layer 4402 may be selected based on a desired $V_{TR}$ for the arcing gap formed by the first top electrode 4306*a*.

Referring to FIG. 44D, an intermediate structure is illustrated, which represents the intermediate structure shown in FIG. 44C, which has been further processed to pattern the first dielectric layer 4402, and thereby provide a first opening 4408 above the bottom electrode 4307, by removing a region or section of the first dielectric layer 4402. In some cases, the first opening 4408 may be formed by forming a patterned photoresist layer 4404 on the first dielectric layer 4402 and etching the region or section of the first dielectric layer 4402 through the patterned photoresist layer 4404. In some implementations, a dimension (e.g., a depth, a length or a width) of the first opening 4408 may comprise a corresponding dimension of the first top electrode 4306*a*.

Referring to FIG. 44E, an intermediate structure is illustrated, which represents the intermediate structure shown in FIG. 44D, which has been further processed to remove the patterned photoresist layer 4404 and to form a second dielectric layer 4406 over the first dielectric layer 4402 and the exposed region of the bottom electrode 4307. In some implementations, the second dielectric layer 4406 may have different material composition and dielectric properties compared to the first dielectric layer 4402. For example, the first dielectric layer 4402 may comprise silicon dioxide and the second dielectric layer 4406 may comprise silicon nitride. In some implementations, a thickness and/or a dielectric property the second dielectric layer 4406 may be selected based on a desired $V_{TR}$ for the arcing gaps formed by the second and third top electrodes 4306*b*, 4306*c*.

Referring to FIG. 44F, an intermediate structure is illustrated, which represents the intermediate structure shown in FIG. 44E, which has been further processed to form a third dielectric layer 4410 over the second dielectric layer 4406. In some implementations, the third dielectric layer 4410 may have different material composition and dielectric properties compared to the first dielectric layer 4402 and/or the second dielectric layer 4406. In some implementations, the third dielectric layer 4410 may have a material composition and dielectric properties substantially identical to those of the first dielectric layer 4402 but different from those of the second dielectric layer 4406. In some implementations, a thickness and/or a dielectric property the third dielectric layer 4410 may be selected based on a desired $V_{TR}$ for the arcing gaps formed by the second and third top electrodes 4306*b*, 4306*c*.

Figures 44G, 44H, 44I, 44J:
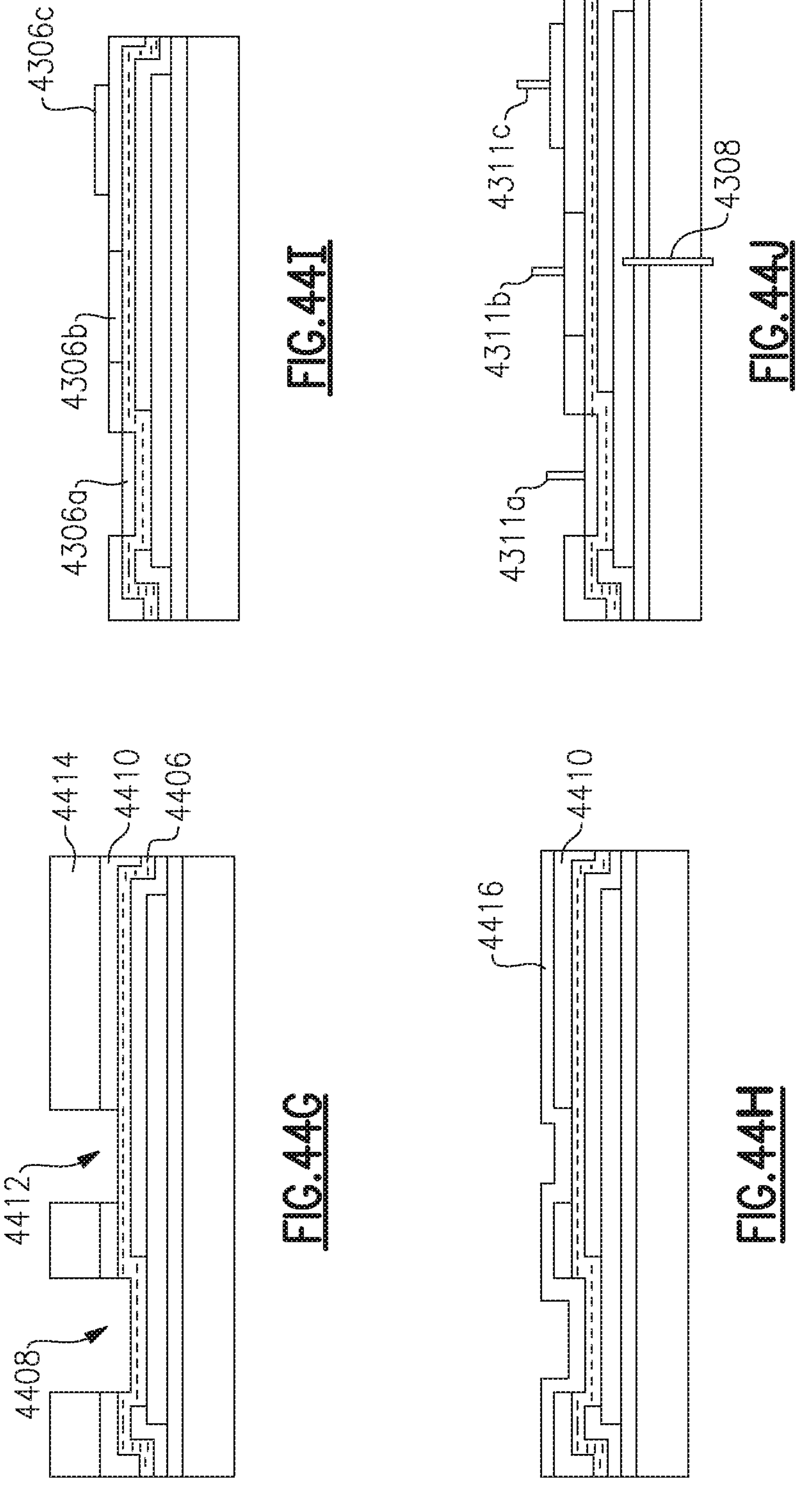

Referring to FIG. 44G, an intermediate structure is illustrated, which represents the intermediate structure shown in FIG. 44F, which has been further processed to pattern the third dielectric layer 4410 to provide a second opening 4412 above the second dielectric layer 4406, by removing a region or section of the third dielectric layer 4410. In some cases, the opening 4412 may be formed by forming a second patterned photoresist layer 4414 on the third dielectric layer 4410 and etching the region or section of the second dielectric layer 4406 through the patterned photoresist layer 4414. In some implementations, a dimension (e.g., a depth, a length or a width) of the opening 4412 may comprise a corresponding dimension of the second top electrode 4306*b*.

Referring to FIG. 44H, an intermediate structure is illustrated, which represents the intermediate structure shown in FIG. 44G, which has been further processed to form a second conductive layer 4416 over the third dielectric layer 4410 and the exposed region of the second dielectric layer 4406. In some implementations, the second conductive layer 4416 may have different material composition and conductivity compared to the bottom electrode 4307. In some implementations, the second conductive layer 4416 may have different material composition and conductivity substantially identical to those of the bottom electrode 4307. In some embodiments, the second conductive layer can comprise a voltage tuning layer formed on the third dielectric layer and a main layer formed on the voltage tuning layer.

The thickness and material composition and properties (e.g., work function, conductivity and thickness) of the voltage tuning layer may be selected based at least in part on properties of the underlying dielectric layers to provide desired $V_{TR}$'s for the resulting arcing gaps. In some examples, the second conductive layer 4416 may comprise a doped semiconductor such as polysilicon layer. In some examples, the polysilicon layer can be doped after being disposed on the third dielectric layer 4410 before or after being patterned. In some other examples, the polysilicon layer may be doped in situ as it is being disposed. In some embodiments, the conductive layer 4416 may comprise two or more layers where at least one layer has a greater resistivity than the other layers. In some embodiments, the conductive layer 4416 may comprise two or more lateral regions or sections where at least one lateral section or region has a greater resistivity than the other regions or sections. In some examples, conductive layer 4416 may comprise a metal such as aluminum, gold, TiW, SiCr, or a combination thereof.

Referring to FIG. 44I, an intermediate structure is illustrated, which represents the intermediate structure shown in FIG. 44H, which has been further processed to pattern the second conductive layer 4416 to form the first, second, and third top electrodes 4306*a*, 4306*b*, 4306*c*.

Referring to FIG. 44J, a structure is illustrated, which represents the intermediate structure shown in FIG. 44I, which has been further processed to form three conductive paths 4311*a*, 4311*b*, 4311*c*, 4308 configured to provide electrical connection to the first, second, and third top electrodes 4306*a*, 4306*b*, 4306*c*, respective. In some implementations, forming an individual conductive path of the conductive paths 4311*a*, 4311*b*, 4311*c* 4308, may comprise forming one or more vias and conductive regions in layers above a top electrode or below the bottom electrode 4307.

In some implementations, an individual conductive path of the conductive paths 4311*a*, 4311*b*, 4311*c*, 4308, may electrically connect a top electrode or the bottom electrode 4307 to a voltage node.

In some implementations, during any of the fabrication stages described above, a new layer may be conformally disposed over an existing layer on the substrate 4301 such that a thickness of the dielectric layer is substantially constant over different regions of the underlying layer and thereby a variation of the vertical separation between a top surface of the newly disposed dielectric and a major surface of the substrate 4301 is substantially equal to a variation of vertical separation between a top surface of the underlying layer and the major surface of the substrate 4301.

In some examples, thickness of the bottom electrode 4307, first, second or third dielectric layers 4402 4406,4410, the bottom electrode 4307, or the second conductive layer 4416 can be from 0.2-1 micron, from 1-5 microns, from 5-10 microns, or any ranges formed by these values or larger or smaller values.

In some embodiments, EOS monitoring or protection device, such a spark gap device, may comprise one or more structural features of a semiconductor electronic or photonic device and/or using one or more procedures used in forming such device. In some implementations, the semiconductor device may comprise a switch or transistor (e.g., a field-effect or bipolar junction transistor) and the fabrication procedure may comprise a complementary metal oxide semiconductor (CMOS) process. In some such embodiments, at least a portion, a region, a layer or a structural feature of a spark device may be co-fabricated with a semiconductor electronic or photonic device on a common substrate, e.g., using a CMOS process.

In some embodiments, a spark gap device may comprise a doped region formed in a semiconductor substrate and a layer stack formed on the top surface of the semiconductor substrate. In some such embodiments, a portion of the doped region (e.g., a heavily doped portion) may serve as a first electrode of the spark gap device and a conductive region or layer of the layer stack may serve as a second electrode of the spark gap device. In some embodiments, conductive regions or layers of two separate layer stacks or heavily doped regions of two separate doped regions, on the substrate may serve as first and second electrodes of the spark gap device. In these embodiments, one or more additional doped regions and/or layer stacks may be disposed between the first and second electrodes. The first and second electrodes can be connected to first and second voltage nodes. The layer stack may comprise a top conductive layer (e.g., a dope polysilicon or a metallic layer) and one or more dielectric layers formed between the top conductive layer and a top surface of the substrate.

The electronic properties of doped regions of the substrate, the substrate, and different layers of the layer stacks may establish a tiger voltage above which a low resistance path is established through which an arc or discharge current may be formed between the first and second electrodes. In some examples, the low resistance path may pass through dielectric layers of a layer stack, a region of the substrate, or a combination thereof. In various implementations, a spark gap device may comprise multiple intervening doped regions and later stacks between the doped regions and/or layer stacks serving as the first and second electrodes.

Advantageously, a spark gap device formed based on doped regions and layer stacks may be co-fabricated with IC on a common substrate along with electrons (e.g., CMOS devices) and thereby serve as a EOS protection and/or monitoring device for the corresponding circuits and components. Such high level of integration may allow fabrication of complex IC's having a large number of such EOS protection and/or monitoring devices at a low cost, e.g., by eliminating the need for separate fabrication and hybrid integration EOS protection and/or monitoring devices. Additionally, the trigger voltage of such spark gap device may be tuned or controlled by controlling the geometries and electronic properties of layers and regions through which a low resistance path may be established. Such arrangements provide a relatively large number of degrees of freedom for tuning electrical properties of the resulting spark gap. These degrees of freedom include but are not limited to doping levels and geometries of doped regions and thickness and material composition of layer stacks that may constitute a conductive path between the first and second electrodes.

In some embodiments, a spark gap may comprise at least one layer stack formed over a semiconductor substrate (e.g., over a main horizontal surface of the semiconductor substrate) and at least one heavily doped region of the semiconductor substrate near an edge of the layer stack. A conductive layer of the layer stack above the substrate and the heavily doped region may serve as arcing electrodes and a dielectric layer of the layer stack may serve as an inter-electrode region of the spark gap. In some examples, the heavily doped region may be formed within a lightly doped region of the semiconductor substrate. In some implementations, a vertical spacing between the arcing electrodes may be substantially equal to the thickness of the dielectric layer of the layer stack. In some implementations, the arcing electrodes may be laterally separated by at least a width of the lightly doped region (along a direction parallel to the main horizontal region of the semiconductor substrate).

Figures 45A, 45B, 45C, 45D:
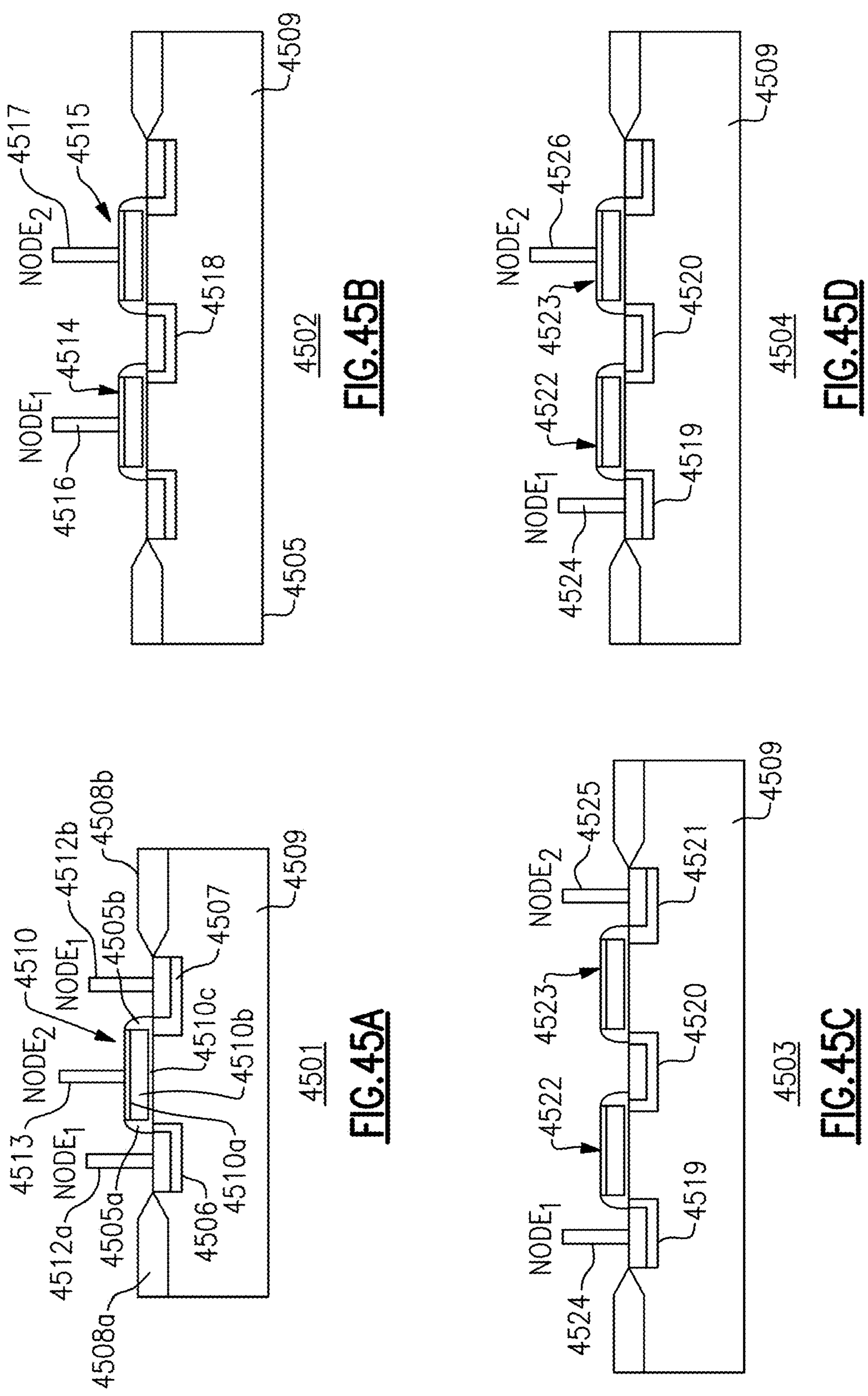
FIGS. 45A-45D illustrate cross-sectional views of four spark gap devices comprising layer stacks and dopped regions formed on a substrate.

FIGS. 45A-45D illustrate cross-sectional views of four spark gap devices 4501, 4502, 4503, 4504 comprising layer stacks and doped regions formed on a substrate. FIG. 45A illustrates a spark gap device 4501 comprising first and second doped regions 4506, 4507 in a substrate, and a layer stack 4510 formed on the substrate 4509 between the first and second doped regions 4506, 4507. In some embodiments, the layer stack 4510 may comprise a bottom layer 4510*c* disposed on a top major surface of the substrate 4509, an intermediate layer 4510*b* disposed on the bottom layer 4510*c*, and a top layer 4510*a* disposed on the intermediate layer 4510*b*. In some examples, the bottom layer 4510*c* comprises an insulating or dielectric layer, the intermediate layer 4510*b* comprises a first conductive layer, and the top layer 4510*a* comprises a second conductive layer. In some implementations, the first and second conductive layers may comprise a doped semiconductor (e.g., doped polysilicon) or a metal. In some implementations, the first conductive layer is thicker than the second conductive layer. In some cases, the second conductive layer may comprise an ohmic contact for electrically connecting to a contact structure such as a via. For example, the first conductive layer may be a heavily doped poly silicon, and the second conductive layer may be a silicide configured to contact a conductive via. In some implementations, the first and second doped regions 4506, 4507 may each comprise a heavily doped portion configured to provide an ohmic contact to a lightly doped portion of the doped region. In some implementations, the first and second doped regions 4506, 4507 may each comprise a heavily doped portion configured to provide an ohmic contact to a less heavily or lightly doped portion of the doped region. In some implementations, the first and second doped regions 4506, 4507 may comprise the same or different dopant types (e.g., n-type or p-type). In some implementations, a region laterally extending between the first and second doped regions 4506, 4507 may comprise an intrinsic region or a doped region having a doping type similar or different from that of the first and/or second doped regions 4506, 4507. In some embodiments, an individual one of the first and second doped regions 4506, 4507 or layer stack 4510 may be electrically connected to a voltage node via a conductive path. In some implementations, the conductive path may comprise one or more conductive vias and conductive regions formed in ILD layers, electrode layers and/or metallization layers above or below the first and second doped regions 4506, 4507 or layer stack 4510. For example, the first and second doped regions 4506, 4507 may be electrically connected to a first voltage node by a first and second conductive paths 4512*a*, 4512*b* and the layer stack 4510 may be electrically connected to a second voltage node by a third conductive path 4513. In some implementations, one of the first and second voltage nodes may comprise a ground potential and other of the first and second voltage nodes may comprise a positive or negative potential with respect to the ground potential. In some implementations, one of the first or the second voltage node may comprise potential higher than the other one. In some implementations, the doped regions 4506, 4507 or layer stack 4510 may be laterally extended between two extended between two isolating dielectric layers 4508*a*, 4508*b* (e.g., silica layers) grown or disposed on the substrate 4509.

In some embodiments, the spark gap device 4501 may comprise spacer structures 4505*a*, 4505*b*, formed on side walls of layer stack 4510. In some the bottom portion of the spacer structures 4505*a*, 4505*b*, may define lateral widths of heavily doped portion or section of the first and second doped regions 4506, 4507, respectively. In some cases, the heavily doped portions or sections of the first and second doped regions 4506 and 4507 may have widths extending in the lateral direction between the isolating dielectric layers 4508*a*, 4508*b* and the spacer structures 4505*a*, 4505*b*.

In operation, as configured, the top and intermediate layers 4510*a*, 4510*b* serve as a first arcing electrode, and the first and second doped regions 4506, 4507 serve as second electrodes. When a voltage difference between the first and second nodes exceeds a trigger voltage of the spark gap device 4501, a spark or a discharge may occur between the first arcing electrode and one or both of the second arcing electrodes, e.g., through the bottom layer 4510*c*, which may be a thin dielectric layer configured to break down at a certain voltage.

FIG. 45B illustrates another spark gap device 4502 comprising first and second layer stacks 4514, 4515 formed on a substrate 4509, and a doped region 4518 formed in the substrate 4509 between the first and second layer stacks 4514, 4515. In some embodiments, the first and second layer stacks 4514, 4515 and the doped region 4518 may comprise one or more corresponding features described above with respect to the spark gap device 4501 in FIG. 45A, including the layer stack 4510 and doped regions 4506, 4507, respectively. In some cases, a region of the substrate below the first layer stack 4514 and/or a region of the substrate below the second layer stack 4515 may comprise an intrinsic region or a region having a different dopant type and/or concentration compared to doped region 4518. In some cases, a heavily doped portion or section of the doped region 4518 may have a width extending in the lateral direction between the bottom portions of spacer structures formed on the side walls of the first and second layer stacks 4514, 4515.

In some implementations, the first layer stack 4514 may be electrically connected to a first voltage node by a first path 4516 and the second layer stack 4515 may be electrically connected to a second voltage node by a second conductive path 4517. In some implementations, one of the first or the second voltage node may comprise a ground potential and other one may comprise a positive or negative potential with respect to the ground potential. In some implementations, one of the first or the second voltage node may comprise potential higher than the other one. In some embodiments, when a voltage difference between the first and second nodes exceeds a trigger voltage of the spark gap device 4502 a spark or a discharge current may be formed between a top layer and/or the intermediate layer of the first layer stack 4514 and a top layer and/or the intermediate layer of the second layer stack 4515 via the doped region 4518.

FIG. 45C illustrates another spark gap device 4503 comprising first, second, and third doped regions 4519, 4520, 4521 formed in a substrate 4509, and first and second layer stacks 4522, 4523 formed on the substrate 4509 between the first and second doped regions 4519, 4520, and second and third doped regions, 4520, 4521, respectively. In some embodiments, the first, second, and third doped regions 4519, 4520, 4521 and first and second layer stacks 4522, 4523 may comprise one or more features described above with respect to the layer stacks 4510, 4514, 4515 and doped regions 4506, 4507, 4518. In some cases, a region of the substrate 4509 below the first layer stack 4522 and/or a region of the substrate 4509 below the second layer stack 4523 may comprise an intrinsic region or a region having a different dopant type and/or concentration compared to the first, second, and third doped regions 4519, 4520, 4521. In some cases, a heavily doped portion or section of the first, second, and third doped regions 4519, 4520, 4521 may have a lateral width defined by the bottom portions of spacer structures formed on the side walls of the first and second layer stacks 4522, 4523.

In some implementations, the first doped region 5019 may be electrically connected to a first voltage node by a first path 4524 and the third doped region 4521 may be electrically connected to a second voltage node by a second conductive path 4525. In some implementations, one of the first or the second voltage node may comprise a ground potential and other one may comprise a positive or negative potential with respect to the ground potential. In some implementations, one of the first or the second voltage node may comprise potential higher than the other one. In some embodiments, when a voltage difference between the first and second nodes exceeds a trigger voltage of the spark gap device 4503 a spark or a discharge current may be formed between a heavily doped portion of the first doped region 4519 and heavily doped region of the third doped region 4521 via the regions of the substrate below the first and second layer stacks 4522, 4523 and the second doped region 4520.

FIG. 45D illustrates a spark gap device 4504 comprising one or more features described above with respect to the spark gap 4503. In some embodiments, the spark gap device 4504 may comprise first and second doped regions 4519, 4520 formed in the substrate 4509, and first and second layer stacks 4522, 4523 formed on the substrate 4509, and arranged similar to corresponding regions of the spark gap device 4503. In some implementations, similar to the spark gap device 4503, the first doped region 4519 may be electrically connected to a first voltage node by a first path 4524, however, in contrast to the spark gap device 4503, the connection to the second voltage may be established via the second layer stack 4523. As such, the second layer stack 4523 be electrically connected to a second voltage node by a second conductive path 4526. In some implementations, one of the first or the second voltage node may comprise a ground potential and other one may comprise a positive or negative potential with respect to the ground potential. In some implementations, one of the first or the second voltage node may comprise potential higher than the other one. In some embodiments, when a voltage difference between the first and second nodes exceeds a trigger voltage of the spark gap device 4504 a spark or a discharge current may be formed between a heavily doped portion of the first doped region 4519 and the top and/or intermediate layer of the second layer stack 4523 via the regions of the substrate below the first and second layer stacks 4522, 4523 and the second doped region 4520.

In some embodiments, any one of the spark gap devices 4501, 4502, 4503 and 4504, can be co-fabricated with a semiconductor transistor, for example a MOSFET or a BJT, on the common substrate. As such, in some examples, one or more regions, and/or layers of the spark gap device 4501, 4502, 4503 and 4504 may be co-fabricated with the corresponding regions, and/or layers of the transistor and have the same or substantially identical physical dimensions, dopant concentrations, dopant type, material composition and the like. In some implementations, the layer stack 4510 may be fabricated and have a similar structural features as a layer stack of the transistor. For example, the top and intermediate layers 4510*a*, 4510*b*, of the layer stack 4510 may be co-fabricated and have similar physical dimensions and/or material composition as gate contact layer or reduced surface field (RESURF) layer of a layer stack of the transistor.

Advantageously, in some embodiments, any one of the spark gap devices 4501, 4502, 4503 and 4504, can be fabricated on a common substrate 4509 with transistors of an electronic circuit and can be electrically connected to various nodes, terminals, or components of the electronic circuit via conductive paths formed between the layer stacks and/or doped regions of the spark gap devices 4501, 4502, 4503 and 4504, and the corresponding nodes, terminals, or components, via one or more metallization layer formed over the substrate 4509 and above the spark gaps and the electronic circuit.

In some embodiments, an electric path from a voltage node to a doped region of a spark gap device may comprise a resistive layer serving as a ballast resistor configured to reduce a magnitude of a current passing through the spark gap device and/or increase $V_{TR}$ for given layer stack. In some embodiments, including the resistive layer in the electric path from the voltage node to a doped region may increase $V_{TR}$ by dividing the voltage difference between two voltage nodes, each electrically connected to one of the doped regions of the spark gap device, to a first voltage drop along the resistive layer and a second voltage drop along the spark gap device (between the corresponding doped regions). In some embodiments, where a spark gap device includes two or more arcing gaps formed between two or more doped regions and a layer stack, the resistive layer (ballast resistor) may be configured to enforce arcing via the two or more arcing gaps. In some embodiments, such resistive layer may be integrated with any of the spark gap devices 4501, 4502, 4503, and 4504 described above. In various implementations the resistive layer may comprise TiW, SiCr, a metal alloy, or polysilicon. In some examples, the resistive layer can include multiple layers having different resistivities (e.g., a bilayer consisting of a TiW layer formed on a SiCr layer). In some cases, the resistive layer may be formed in a layer (e.g., a metallization layer) formed above the diode-based spark gap device or on a thick dielectric layer that isolates the diode-based spark gap device from a neighboring device on the same substrate.

Figure 45F:
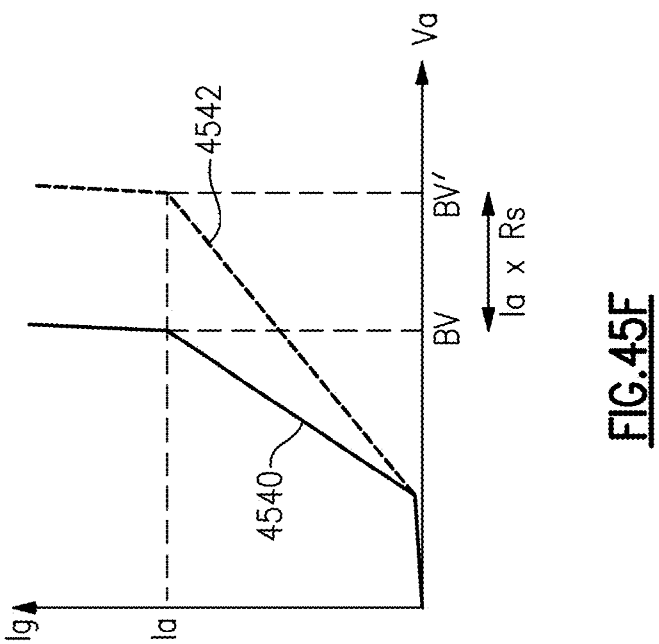
FIG. 45F illustrates a schematic curve of electric current passing through the first doped region, in the presence and absence of the resistive layer.
Figure 45E:
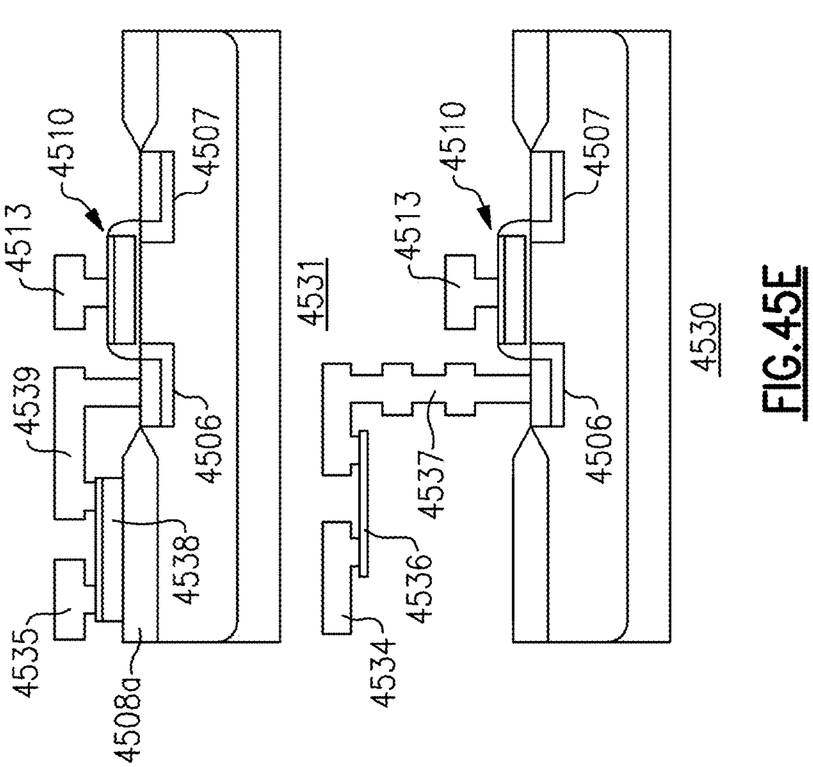
FIG. 45E illustrates a cross-sectional view for integrating a resistive layer (a ballast resistor) with the diode-based spark gap device.

FIG. 45E illustrates two example configurations 4530, 4531 for integrating a resistive layer (a ballast resistor) with the diode-based spark gap device 4700. In the first configuration 4530 the resistive layer 4536 is formed in a top metallization layer above the spark gap device as a portion of an electric path that electrically connects a first voltage node to the first doped region 4506. The resistive layer 4536 extends from a first end electrically connected to a conductive layer 4534 to a second end electrically connected to a conductive path 4537, which is electrically connected to the anode well 4605 via one or more conductive vias and one or more conductive regions formed in the metallization layers between the top metallization layer and the spark gap device. In the first configuration 4530 the resistive layer 4536 may comprise TiW, SiCr, or a metal alloy. In some examples, the resistive layer 4536 may comprise a bilayer consisting of a TiW layer formed on a SiCr layer.

In the second configuration 4531 the resistive layer 4538 is formed over the isolating dielectric layer 4508*a* as a portion of an electric path that electrically connects a first voltage node to the first doped region 4506. The resistive layer 4538 extends from a first end electrically connected to a conductive layer 4535 to a second end electrically connected to a conductive path 4539, which is electrically connected to the first doped region 4506 via one or more conductive vias and a conductive region formed in the metallization layer above the spark gap device (e.g., the metallization layer comprising the conductive layer 4535).

In some examples, in the second configuration 4531 the resistive layer 4538 may comprise a polysilicon layer disposed on the isolating dielectric layer 4508*a*.

FIG. 45F illustrates a schematic curve of electric current passing through the first doped region 4506 plotted as a function of potential difference applied between the first and second voltage nodes, in the presence 4542 and absence 4540 of the resistive layer. As shown in FIG. 45F, connecting a resistive layer (e.g., as shown in configurations 4530, 4531), reduces the slope of the current-voltage curve 4542 compared to the slope of current-voltage curve 4540 of the spark gap device 4501 in the absence of the resistive layer. As a result, at a given current (I), a voltage drop across the dielectric layer of layer stack 4510 can be smaller in the presence of the resistive layer. Since for the spark gap device 4501, $V_{TRG}$=BV, adding the resistive layer can increase $V_{TR}$ above BV by $R_s$×I, where $R_s$ is the resistance of the resistive sheet.

Vertical Spark Gap Integrated with Lateral Reverse Bias Diode

As described above, in various fabrication technologies such as semiconductor fabrication technologies, the thicknesses of various layers can be controlled relatively precisely and cost-effectively, compared to, e.g., controlling lateral dimensions of the layers. For example, by precisely controlling the thickness of a dielectric layer serving as the arcing medium, the arcing voltage may be tuned over a range. For some applications, there may be a need for the range of controlled arcing voltage to be further increased. Such need may exist where, for example, increasing the trigger voltage, e.g., by increasing the thickness of the dielectric layer serving as the arcing medium, may be limited because arcing may damage the spark gap and render the spark gap less adapted to reusability.

To provide further room for reusable spark gaps to have larger trigger voltages, the inventors have discovered that semiconductor junctions can be connected with the spark gaps as voltage dividers. In some embodiments, an electrical overstress (EOS) monitor or protection device may comprise a lateral PN diode. For example, a diode-based spark gap device may be formed by integrating a vertical spark gap over a lateral diode that is reverse-biased in response to an electrical overstress (EOS) signal, such that the voltage of the EOS signal is divided between the reverse-biased lateral diode and the vertical spark gap. In an EOS event, the voltage across the spark gap can be smaller than the voltage between the two nodes monitored or protected by such spark gap device. In this manner such diode-based spark gap device can withstand against high voltage EOS events without causing damage to the arcing medium of the vertical spark gap, and thereby can be reused to provide protection against multiple EOS events. Given that during an EOS event the vertical spark gap arcs at a lower voltage, the constraints on the thickness and composition of the arcing medium of the vertical spark gap are relaxed and may be adjusted for reusability.

Additionally, given that the ratio between the voltage across the lateral diode and the vertical spark gap can be tuned at least by changing the position of the vertical spark gap over the lateral diode, for a given vertical spark gap structured, the trigger voltage (the voltage that breaks down an inter-electrode region of the vertical spark gap) can be controlled by changing the position of the vertical spark gap, and the ratio between the received voltage (e.g., the voltage difference between protected voltage nodes) and a voltage drop across the inter-electrode region of the spark gap.

To realize these and other advantages, in another aspect of the disclosed technology, a diode-based spark-gap device may comprise a vertical spark gap formed over an anode semiconductor region of a lateral diode lateral diode having a PN junction formed between the semiconductor anode region and a semiconductor cathode region. In some embodiments, when the lateral diode lateral diode in reverse biased, a voltage gradient (e.g., linear or near liner gradient) along a direction parallel to a surface of the anode semiconductor region may result in dependence of the voltage applied on the vertical spark gap on a position of the vertical spark gap over respect to the PN junction. In some embodiments, an electrical overstress (EOS) monitor or protection device includes a semiconductor substrate having a horizontal main surface, a first and second oppositely doped semiconductor regions (e.g., anode and cathode regions) formed in the semiconductor substrate that form a lateral PN junction within the semiconductor substrate, and a stack of layers formed on the horizontal main surface over the first doped semiconductor region. In some embodiments, the stack of layer may comprise an arcing electrode layer and a dielectric layer between the horizontal main surface and the arcing electrode layer. In some implementations, the EOS monitor or protection device may further comprise a first metal layer electrically connected to a first doped semiconductor region and a second metal layer electrically connected to the second doped semiconductor region and the arcing electrode layer of the stack layers. In some embodiments, the first and second metal layers can be electrically connected to first and second voltage nodes, respectively. In some embodiments, the layer stack and first doped semiconductor region may be configured such that when an EOS voltage signal is received between the first and second voltage nodes, an arc discharge may be generated between the arcing electrode layer and a portion of the first doped semiconductor region below the stack.

Figure 46A:
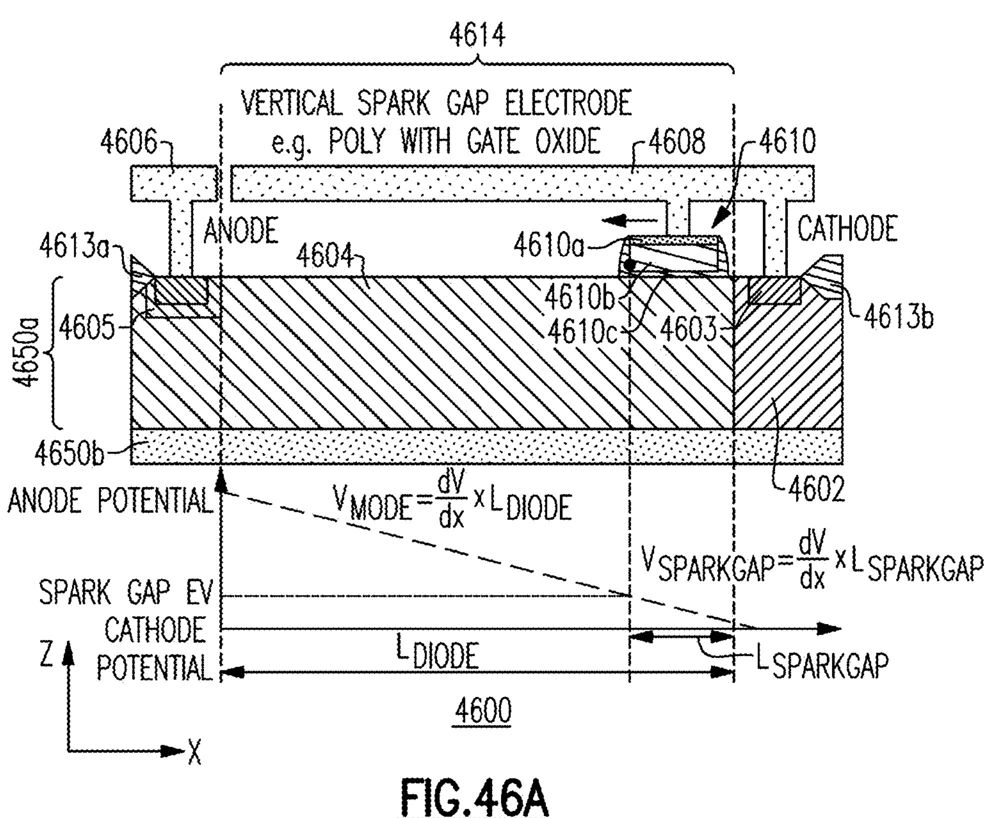
FIGS. 46A-46B illustrate side cross-sectional views of example diode-based spark gap devices (top panels) and voltage variation along the corresponding drift regions (bottom panels).
Figure 46B:
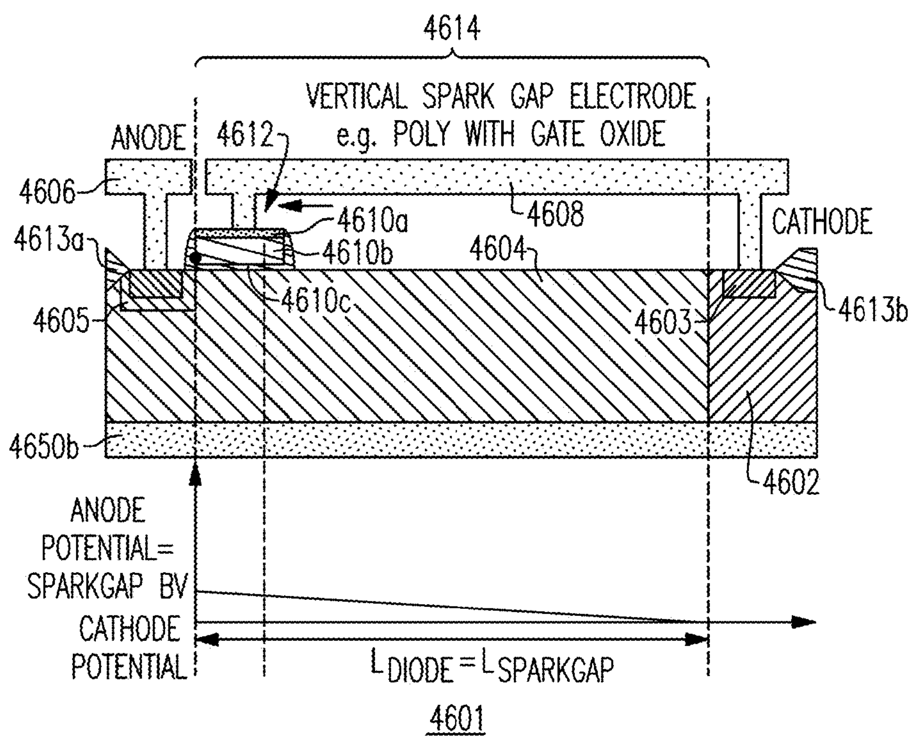

FIGS. 46A and 46B schematically illustrate example EOS monitor or protection devices 4600, 4601, (top panels) and the respective voltage variations across each device. In some embodiments, each of the EOS monitor or protection devices 4600, 4601, may comprise a lateral semiconductor PN junction diode formed over a semiconductor substrate and a vertical spark gap formed over the lateral diode. In some cases, the vertical spark gap of the EOS monitor or protection device 4600 or 4601, may comprise a layer stack formed on a top surface region of the respective lateral diode. The layer stack 4610 of the diode-based spark gap device 4600 (FIG. 46A) can be closer to a PN junction of the corresponding lateral diode compared to the layer stack 4612 of the diode-based spark gap device 4601 (FIG. 46B). The EOS monitor or protection devices 4600, 4601 may be referred to as diode-based spark gap devices 4600, 4601.

In some implementations, the semiconductor substrate can have a horizontal main surface, and first and second oppositely doped semiconductor regions 4604, 4602, formed in the semiconductor substrate forming a lateral PN junction (at the interface between oppositely doped semiconductor regions). In some embodiments, the semiconductor substrate may a have a top layer formed on a base layer 4650*b* and the first and second oppositely doped semiconductor regions 4604, 4602, may be formed in the top layer 4650*a*. In some cases, a dopant density of the base layer 4650*b* can be different from the dopant densities of one or both first and second doped semiconductor regions 4604, 4602. In some cases, the top layer 4650*a* may comprise an epitaxial layer grown on the bottom layer. In some cases, the first doped semiconductor region 4604 may be p-doped and may be referred to anode region 4604 and the second doped semiconductor region 4602 may be n-doped and may be referred to cathode region 4602.

In some embodiments, an anode well 4605 may be formed in the anode region 4604 to provide electrical connection to the anode region 4604 and a cathode well 4603 may be formed in the cathode region 4602 to provide electrical connection to the cathode region 4602. In some embodiments, the anode well 4605 can be a heavily doped (HD) region having the same dopant type (e.g., p-type) as the anode region 4604 and the cathode well 4603 can be an HD region having the same dopant type (e.g., n-type) as the cathode region. In some cases, the dopant density of the anode well 4605 and cathode well 4603 can be larger than the dopant density of the respective anode and cathode regions 4604, 4602, by a factor larger than $10^2$, $10^3$, $10^4$, $10^5$, or larger values. In some embodiments, one or both the anode well 4605 and cathode well 4603 may comprise a first region formed in a second region where the first region has a greater dopant density than the second region.

In some examples, a drift region 4614 within the anode region 4604 may laterally extend from the PN junction to the anode well 4605 and a cathode region within cathode region may laterally extend from the PN junction to the cathode well 4603. In some embodiments, the anode well 4605 can be electrically connected to a first voltage node and the cathode well 4603 can be electrically connected to a second voltage node. In some cases, the first voltage node may be a negative voltage and the second volage node may be a positive voltage.

The layer stack 4610 may be formed on a horizontal main surface of the substrate over the drift region. In some embodiments, the layer stack 4610 may comprise a dielectric layer **4610*c* formed over the drift region and a conductive layer formed over the dielectric layer 4610*c*. In some implementations, the conductive layer may comprise a first conductive layer 4610*b* formed over the dielectric layer 4610*c*, and a second conductive layer 4610*a* formed over the first conductive layer 4610*b*. In some examples, the dielectric layer 4610*c* may comprise an oxide (e.g., silicon dioxide). In some examples, the first conductive layer 4610*b* may comprise a doped semiconductor (e.g., heavily doped polysilicon) and the second conductive layer 4610*a* may comprise a metal (e.g., aluminum, gold, copper, or an alloy comprising one or more there or other metals) or a silicide of the metal. In some examples, the dielectric layer 4610*c*** may comprise two or more dielectric layers.

In some embodiments, the first conductive layer of a layer stack may have a conductivity larger than 10 Ω/sq, larger than 30 Ω/sq, larger than 50 Ω/sq, or larger than 70 Ω/sq. In some examples, the first conductive layer of a layer stack may comprise polysilicon (e.g., n-doped or p-doped polysilicon). However, embodiments are not so limited and the first conductive layer may be formed of a metal.

In some embodiments, the conductive layer (e.g., the second and/or first conductive layers **4610*a*, 4610*b*) of the layer stack 4610 may serve as a first arcing electrode of the vertical spark gap formed by the layer stack 4610 and the lateral diode. In some such embodiments, a top surface region or top portion of the drift region 4614 below the layer stack 4610 may serve as a second arcing electrode and the dielectric layer 4610*c*** may serve as the arcing medium or inter-electrode layer of the spark gap.

In some embodiments, the anode well 4605 can be electrically connected to the first voltage node by a first conductive via and a first conducive region 4606, e.g., a first metal layer, formed in a first metallization layer above the diode-based spark gap device 4600 and the cathode well 4603 can be electrically connected to the second voltage node by a second conductive via and a second conducive region 4608, e.g., a second metal layer, formed in the first metallization layer or another metallization layer formed above the diode-based spark gap device 4600. In some embodiments, the second conductive layer **4610*a* of the layer stack can be electrically connected to the cathode well 4603 and the second voltage node by a third conductive via and the second conductive region 4608**.

In some examples, the second conductive region 4608 may be configured as a field plate extended above the drift region 4614 in a direction parallel to a major surface of the lateral diode. In these examples, the second conductive region 4608 may be configured to vary the longitudinal component (e.g., a component parallel to a major surface of the top layer **4650*a* or parallel to x-axis) of the total electric field in the drift region 4614 from the PN junction to the anode well 4605**, when the lateral diode is reverse biased (e.g., when the first voltage node is at lower electric potential compared to the second voltage node).

In some embodiments, the conductive layer of the layer stack 4610 and the top surface region of the drift region 4614 below the layer stack 4610 may be configured to generate an arc discharge through the dielectric layer **4610*c*** in response to an EOS voltage signal received between the first and second voltage nodes.

In some embodiments, a thickness of the top layer **4650*a* and dopant densities of the anode and cathode regions 4604, 4602, may be configured to allow a low on-resistance and high breakdown voltage for the lateral diode. In some cases, the thickness of the top layer 4650*a* and doping densities of the cathode and anode regions 4604, 4602, and in some case, the base layer 4650*b*, may be configured to decrease a surface field when the lateral diode is biased (e.g., reverse biased) such that larger voltages can be applied to the anode and cathode regions 4604, 4602, before the PN junction breaks down. For example, the thickness of the top layer 4650*a* and doping densities of the cathode and anode regions 4602, 4604 may be configured to such that when the PN junction is reversed biased, e.g., when the anode well 4605 is electrically connected to a negative voltage and the cathode well 4603 is connected to a positive voltage, the depletion region extends across more than 50%, 70%, 80%, or 90% of the thickness of the top layer. In some embodiments, the thickness of the top layer 4650*a* and doping concentrations of the cathode and anode regions 4602, 4604 may be configured to maintain a magnitude of a longitudinal component of the total E-field within the drift region 4614 substantially constant or nearly constant along the drift region 4614**, e.g., when the lateral diode is biased (e.g., reverse biased).

In some embodiments, where the top layer **4650*a*, the cathode and anode regions 4602, 4604 therein, and/or the second conductive region 4608 are configured to decrease a variation of the longitudinal component of the total E-field within the drift region, the electric potential may increase in a linear or near linear fashion from the PN junction toward the anode well 4605 (when the lateral diode s reverse based), as illustrated. As a result, the ratio between voltage applied across the dielectric layer 4610*c* and the voltage drop across the drift region can be controlled or tuned by changing the position of the layer stack over the drift region with respect to the PN junction and the anode well 4605. For example, for the diode-based spark gap device 4600 (FIG. 46A), the layer stack 4610 is closer to the PN junction, whereas for the diode-based spark gap device 4601 (FIG. 46B), the layer stack 4610 is farther way from the PN junction. In some implementations, the ratio between the voltage drop across the dielectric layer 4610***c* and the voltage drop across the drift region may decrease (e.g., linearly increase) by moving the layer stack 4610 closer to the anode well 4605. For example, the ratio between the voltage drop across the dielectric layer 4610*c* of the layer stack 4610 and the voltage drop across the drift region of the diode-based spark gap device 4600 can be larger relative to the ratio between the voltage drop across the dielectric layer 4610*c* of the layer stack 4612 and the voltage drop across the drift region of the diode-based spark gap device 4601. As such, for a given breakdown voltage of the dielectric layer 4610*c*, the trigger voltage of the diode-based spark gap device 4600 can be larger than the trigger voltage of the diode-based spark gap device 4601.

In some embodiments, the diode-based spark gap device 4600 (or 4601) may further comprise one or more isolation dielectric layers formed on the anode region 4604 and/or cathode region 4602. In various implementations, a thick dielectric layer serving as the isolation dielectric layer may be formed by local oxidation of silicon (LOCOS) or by forming a shallow trench and depositing an oxide within the trench. In some embodiments, the diode-based spark gap device 4600 (or 4601) may comprise a first isolating dielectric layer 4613*a* formed over the anode region 4604 and configured to isolate the anode well 4605 from a neighboring device, region, and/or structure formed on the anode region 4604 or another region formed over the base layer 4650*b*. In some embodiments, the diode-based spark gap device 4600 (or 4601) may comprise a second isolating dielectric layer 4613*b* formed over the cathode region 4602 and configured to isolate the cathode well 4603 from a neighboring device, region, and/or structure formed on the cathode region 4602 or another region formed over the base layer 4650*b*.

In some embodiments, the diode-based spark gap device 4600 may further comprise additional conductive regions extending over the drift region 4614 serving as field plates configured to further reduce variations of the longitudinal E-field component along the drift region and thereby further linearize the electric potential drop from the anode well 4605 toward the PN junction. In various implementations, the conductive regions serving as field plates may be electrically connected to the cathode well 4603.

In various implementations, a field plate (e.g., the second conductive region 4608 additional conductive regions extending over the drift region 4614) can produce a vertical E-field component ($E_{RESURF}$) in the drift region 4614. The total E-field ($E_{tot}$) at any point along the drift region 4614 can correspond to a vector sum of a junction E-field and the $E_{RESURF}$. In some cases, at least the magnitude of the longitudinal component of the $E_{tot}$ (e.g., a component of $E_{tot}$ substantially parallel to x-axis) can remain constant or nearly constant along the drift region from the PN junction to the anode well 4605. In some implementations, the field plate can be electrically connected to the anode well 4603. In some implementations, the field plate can be electrically floating.

In some embodiments, when the PN junction is reverse biased, the longitudinal component of $E_{tot}$ along the drift region, from PN junction to the anode well 4605, may change less than 2%, less than 4%, less than 6%, less than 8%, or less than 10% of its vale at the PN junction.

In some embodiments, when a voltage difference between the anode well 4605 and the cathode well 4603 exceeds a trigger voltage of diode-based spark gap device 4600 (or 4601), an electric discharge may occur between the conductive layer of the layer stack 4610 (or layer stack 4612) and a portion of the drift region 4614 below the layer stack 4610, through a region of the dielectric layer 4610*c* where a voltage drop across the dielectric layer 4610*c* exceeds the break down voltage (BV) of the dielectric layer 4610*c*. In some examples, the electric arcing or discharge may occur near a distal edge region of the dielectric layer 4610*c* with respect to the PN junction. In some examples, an electric field within a region of the dielectric layer 4610*c* may be controlled by a longitudinal separation (e.g., along x-axis) of the region from the PN junction and a shape of the region (e.g., a shape including a sharp corner may locally enhance the E-field). In some cases, a top surface region of the dielectric layer 4610*c* through which electric arcing or discharge occurs (e.g., due to a combination of distance from the PN junction and local field enhancement) may be referred to as an arcing point of the layer stack or the dielectric layer 4610*c* therein.

Depending on the trigger voltage, the dielectric layer 4610*c* may be formed of a suitable dielectric, e.g., silicon dioxide or a high K dielectric, having a thickness of 1-10 nm.

Figure 46C:
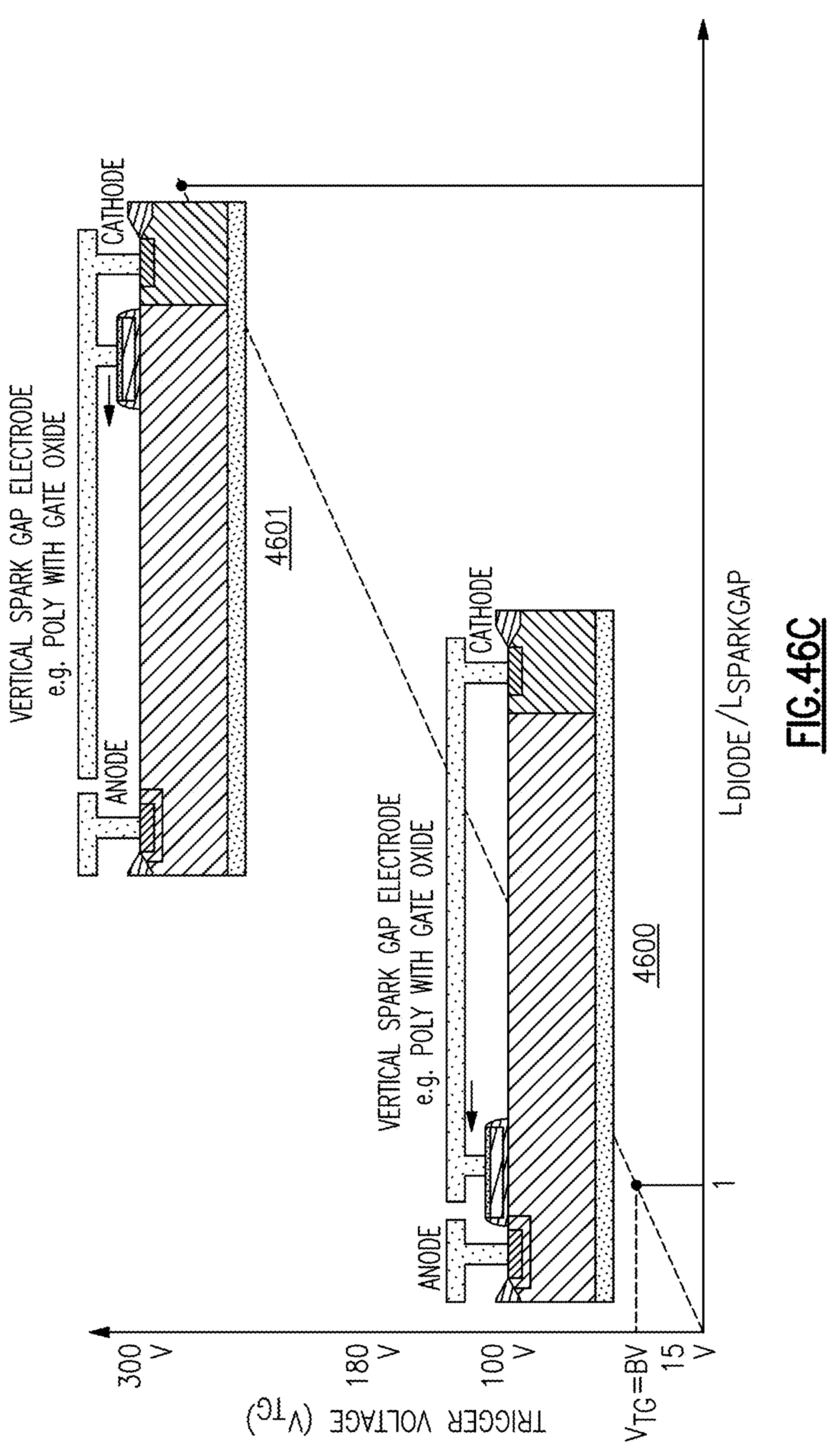
FIG. 46C illustrates trigger voltage of a diode-based spark gap device plotted as a function of the ratio between length of the drift region of the corresponding lateral diode and the longitudinal position of the layer stack on the drift region. Two points associated with the diode-based spark gap devices shown in FIGS. 46A-46B are shown on the plot.

The bottom panels of FIGS. 46A and 46B represent voltage variation in the drift regions of the diode-based spark gap device 4600 and 4601 plotted against a longitudinal distance (e.g., along x-axis). As described above, the thickness and/or doping concentration of the top layer 4650*a* and the presence of a field plate above the drift region 4614 may maintain a longitudinal component of the E-field ($E_x$) near a top surface of the drift region 4614 that is constant or nearly constant along the drift region. As such, for a given reverse bias voltage applied between the anode well 4605 and the cathode well 4603 (e.g., via the first and second voltage nodes), an electric potential difference between a region on the surface of the drift region 4614 and the PN junction may change with constant or near constant slope ($dV/dx=E_{tot,x}$) with respect to a longitudinal distance (x) from the PN junction. As a result, placing the layer stack 4610 at different longitudinal locations (L) over the drift region 4614 of the anode region 4604, can allow for customizing a voltage across ($V_x$) the dielectric layer 4610*c* of the layer stack 4610 ($L\times dV/dx=V_x$) and thereby $V_{TR}$ or the reverse bias voltage at which an electric arc is formed through the arcing point of the dielectric layer 4610*c*. In some cases, a longitudinal distance between the arcing point of the dielectric layer 4610*c* and the PN junction determines a ratio between a voltage applied between the voltage first and second nodes (also referred to as anode voltage, $V_{anode}$, or the applied voltage on the diode-based spark gap device) and a voltage drop $V_{sparkgap}$ between the arcing point and top surface of the drift region 4614 below the arcing point. In some examples, the ratio between $V_{anode}$ and $V_{sparkgap}$ may be expressed as:

$$\frac{V_{anode}}{V_{sparkgap}} = \frac{L_{diode}}{L_{sparkgap}}$$

where $L_{diode}$ is the length of the drift region or the longitudinal distance (e.g., along x-axis) between the anode well 4605 and the PN junction, and $L_{sparkgap}$ is the longitudinal distance between the arcing point and the PN junction. As such the trigger voltage ($V_{TR}$) of a diode-based spark gap device may be written as:

$$V_{TG} = \frac{L_{diode}}{L_{sparkgap}} \times BV$$

where BV is the breakdown voltage of the dielectric layer 4610$c$ at the arcing point. As such for a given layer stack 4610 (having a dielectric layer 4610$c$ with a given BV) formed over a given lateral diode configuration, $V_{TR}$ of the resulting diode-based spark gap device can be tuned from BV ($L_{sparkgap}=L_{diode}$) to M×BV where $M=L_{diode}/L_{stack}$ and $L_{stack}$ is a length of the layer stack or shortest longitudinal distance between arcing point and PN junction. In some cases, 1/M may be referred to as voltage division ratios for the diode-based spark gap device. The layer stack 4610 of the diode-based spark gap device 4600 is positioned at edge of the PN junction resulting in the largest value of M and thereby the largest $V_{TR}$ for this specific configuration. The layer stack 4612 of the diode-based spark gap device 4601 is positioned at edge of the anode well 4605 resulting in the smallest value of M (~1) and thereby the smallest $V_{TR}$ for this specific configuration. Advantageously, for the diode-based configurations shown in FIGS. 46A, 46B, M can be tuned with high level of accuracy using precise lithographic techniques available for controlling the position of the layer stack with respect to the PN junction during the fabrication of the diode-based spark gap devices 4600 or 4601. FIG. 46C illustrates trigger voltage ($V_{TR}$) of a diode-based spark gap device, having a structure similar to diode-based spark gap devices 4600, 4601, plotted as a function of the ratio between length of the drift region of the corresponding lateral diode and the longitudinal position of the layer stack on the drift region ($L_{diode}/L_{sparkgap}$). Two points associated with the diode-based spark gap devices 4600, 4601 (shown in FIGS. 46A-46B) are shown on the plot.

Figure 47A:
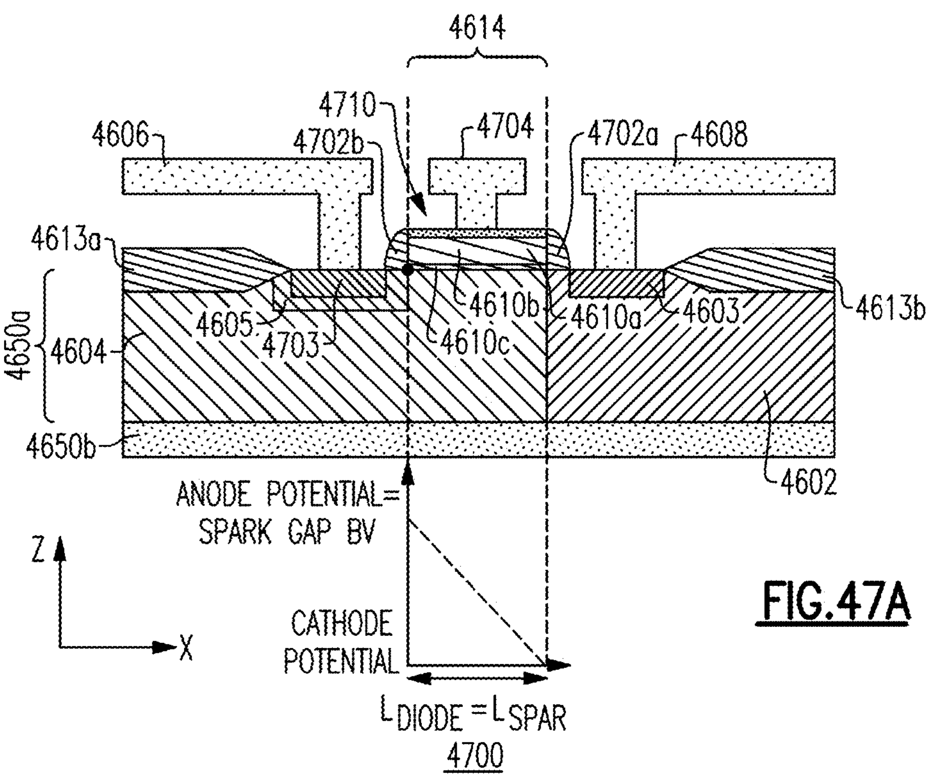
FIG. 47A illustrates a side cross-sectional view of an example diode-based spark gap device (top panel) having a layer stack extending over the entire drift region of the corresponding lateral diode, and voltage variation along the corresponding drift region (bottom panels).

In some embodiments, where M=1 is desired, e.g., when the BV of the dielectric layer 4610$c$ is sufficiently large, the footprint of a diode-based spark gap device can be decreased by reducing the length of the drift region 4614 and making it substantially equal to the length of the layer stack 4610 such that $M=L_{diode}/L_{stack}=1$. FIG. 47A illustrates a side cross-sectional view of an example diode-based spark gap device 4700 having a layer stack 4710 extending over the entire drift region 4614 of the corresponding lateral diode. The diode-based spark gap device 4700 may comprise one or more features described above with respect to the diode-based spark gap device 4600; however, in some cases, the conductive region of the layer stack 4710 may not be electrically connected to the cathode well 4603 and the layer stack 4710 and/or a conductive region 4704 formed above and electrically connected to the layer stack 4710 (e.g., by a conductive via), can serve as a floating field plate. In some embodiments, the layer stack 4710 of the diode-based spark gap device 4700 may comprise two spacers 4702$a$, 4702$b$ formed on the sided walls the of the layer stack 4710. In some embodiments, a first spacer 4702$a$ may extend over the cathode region 4602 and may be used to define the cathode well 4603 having a dopant density greater than a remaining portion of the cathode region 4602. In some such embodiments, a vertical interface between the first spacer 4702$a$ and the first conductive layer 4610$b$ of the layer stack 4710 may be aligned with the PN junction. In some embodiments, a second spacer 4702$b$ may extend over the anode well 4605 and may be used to define a region (e.g., central region) of the anode well 4605 having a dopant density greater than a region of the anode well 4605 covered by the first spacer 4702$a$. The bottom panel in FIG. 47A illustrates voltage variation along the drift region 4614 of the diode-based spark gap device 4700 plotted against a longitudinal distance from the PN junction, when diode-based spark gap device 4700 is reverse biased by applying a positive voltage to cathode well 4603 and a negative voltage to the anode well 4605 (e.g., via the first and second voltage nodes). In some implementations, the sparking point of the layer stack 4710 can be above an interface between the anode well 4605 and the drift region 4614. As such the $L_{diode}=L_{spark\ gap}$.

In various embodiments, $L_{diode}$ can be increased by increasing the length of the drift region 4614. However, in some cases, maintaining a constant or near constant $E_{tot,\ x}$ (=dV/dx) along the drift region 4614 can impose a limit on the $L_{diode}$. In some embodiments, by further integrating various reduced surface field (RESURF) structures (e.g., field plates and isolating oxide layers) over the drift region 4614, the $V_{TR}$ can be further increased for a given value of BV. In some embodiments, $V_{TR}$ can be tuned over a range including about 10 V to over 300 V by extending the drift region and providing RESURF structures over the extended drift region.

Figure 47B:
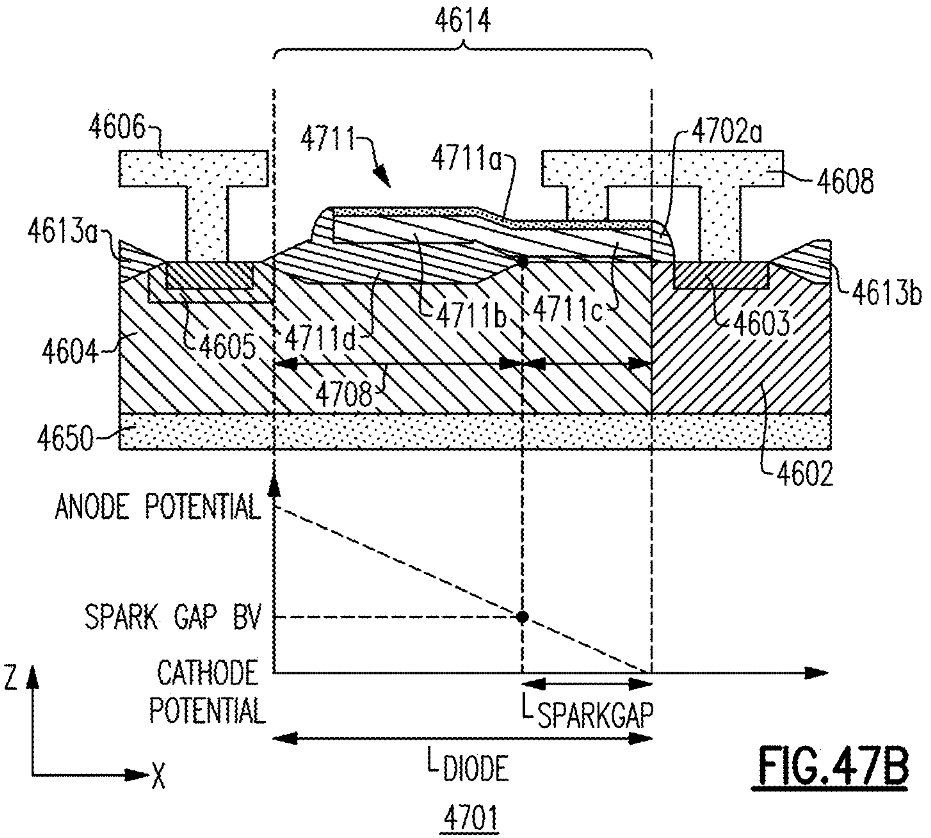
FIG. 47B illustrates a side cross-sectional view of an example diode-based spark gap device (top panel) having an extended layer stack and a thick dielectric layer over the drift region of the corresponding lateral diode, and voltage variation along the corresponding drift region (bottom panel).

FIG. 47B illustrates a side cross-sectional view of an example diode-based spark gap device 4701 having an extended layer stack 4711 and a thick dielectric layer over, and in some cases partially within, the drift region 4614 of the corresponding lateral diode (e.g., along the longitudinal direction parallel to a major surface of the top layer 4650$a$. The diode-based spark gap device 4701 may comprise one or more features described above with respect to the diode-based spark gap devices 4600 and 4700. In some embodiments, the extended layer stack 4711 of the diode-based spark gap device 4701 may comprise a first dielectric layer 4711$c$ and a second dielectric layer 4711$d$ having a thickness greater than the thickness of the first dielectric layer 4711$c$. In some implementations, the first dielectric layer 4711$c$ may extend over the drift region 4614 from the PN junction to the second dielectric layer 4711$d$ forming a dielectric junction with the second dielectric layer 4711$d$. The second dielectric layer 4711$d$ may extend from the dielectric junction to the anode well 4605 over, and in some cases partially within, the drift region 4614. In various implementations, the thickness of the second dielectric layer 4711$d$ can be greater than the thickness of the first dielectric layer 4711$c$ by a factor larger than 1.2, larger than 1.5, larger than 2, larger than 3, larger than 4, larger than 5 or larger or smaller values. In some cases, layer stack 4711 may further comprise a conductive region formed over the first dielectric layer 4711$c$ and at least partially over the second dielectric layer 4711$d$. The anode well 4605 of the diode-based spark gap device 4701 can be electrically connected to a first voltage node via a first conductive region 4606 and the cathode well 4603 can be electrically connected to second voltage node via a second conductive region 4608. In some embodiments, the conductive region of the extended layer stack 4711 may be electrically connected to the cathode well 4603 via the second conductive region 4608. The conductive region of the extended layer stack 4711 may compromise a first conductive layer 4711$b$ and a second conductive layer 4711$a$ formed over the first conductive layer 4711$b$. In some embodiments, the extended layer stack 4711 may extend along the longitudinal direction over the drift region from a first end at the PN junction to a second end over the second direct layer 4711$d$ (the thick dielectric layer). In some embodiments, the arcing point of the first dielectric layer

4711*c* may be located at or near dielectric junction between the first dielectric layer 4711*c* and the second dielectric layer 4711*d*. As such, $L_{sparkgap}$ for the diode-based spark gap device 4701 can be a distance between the PN junction and the interface between the first and second dielectric layers 4711*c*, 4711*d*. The voltage division ratio (1/M) of the diode-based spark gap device 4701 may be tuned by controlling a length of the first dielectric layer 4711*c*.

The bottom panel in FIG. 47B illustrates voltage variation along the drift region 4614 of the diode-based spark gap device 4701 plotted against a longitudinal distance from the PN junction, when the diode-based spark gap device 4701 is reverse biased by applying a positive voltage to cathode well 4603 and a negative voltage to the anode well 4605 (e.g., via the first and second voltage nodes).

In some embodiments, the drift region 4614 of the diode-based spark gap device 4701 may be elongated to increase M. In these embodiments, the second dielectric layer 4711*d* (the thick dielectric layer) may be extended over the elongate drift region from the first dielectric layer 4711*c* (the thin dielectric layer) to the anode well 4605. In some such embodiments, one or more field plates may be formed over the extended portion of the second dielectric layer 4711*d* to reduce a variation of a longitudinal component of the electric field ($E_x$) in the drift region 4614 (e.g., near a surface region of the drift region 4614).

In some embodiments, the extended layer stack 4711 of the diode-based spark gap device 4701 may comprise a first spacer 4702*a* formed over side wall of the extended layer stack 4711. The first spacer 4702*a* may extend over the cathode region 4602 and may be used to define the cathode well 4603 having a dopant density greater than a remaining portion of the cathode region 4602. In some such embodiments, a vertical interface between the first spacer 4702*a* and the first conductive layer 4610*b* of the layer stack 4710 may be aligned with the PN junction.

Figure 47C:
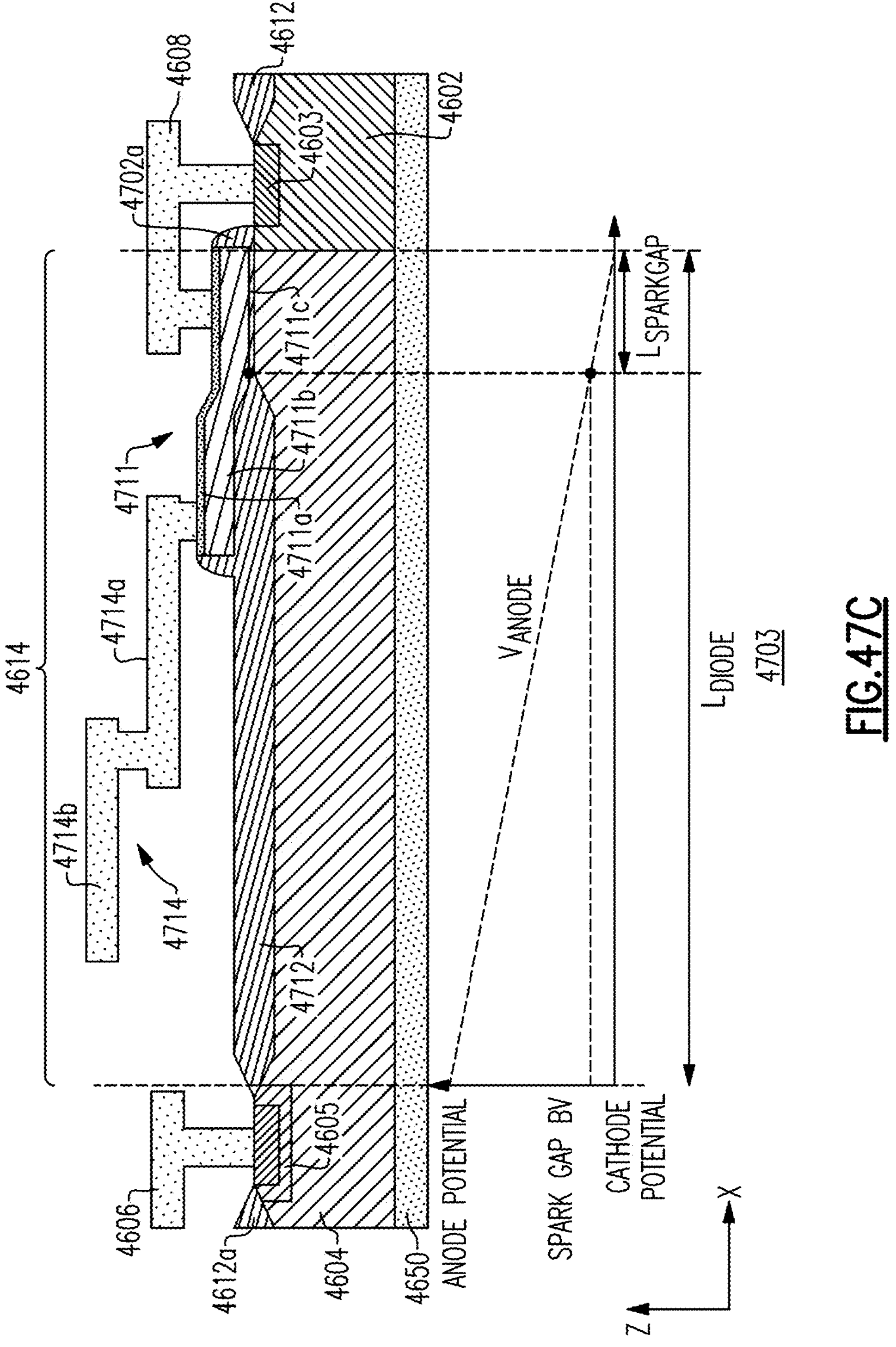
FIG. 47C illustrates a side cross-sectional view of an example diode-based spark gap device (top panel) having an extended layer stack, a thick dielectric layer over the drift region of the corresponding lateral diode, and two field plates, and voltage variation along the corresponding drift region (bottom panel).

FIG. 47C illustrates a side cross-sectional view of an example diode-based spark gap device 4703 having an extended layer stack 4711, an elongate dielectric layer over the drift region of the corresponding lateral diode, and two field plates. The diode-based spark gap device 4701 may comprise one or more features described above with respect to the diode-based spark gap device 4600, 4700 and 4701.

In some embodiments, the extended layer stack 4711 of the diode-based spark gap device 4701 may comprise a first dielectric layer 4711*c* and a second elongate dielectric layer 4712 having a thickness larger than a thickness of the first dielectric layer 4711*c*. In some implementations, the first dielectric layer 4711*c* may extend over the drift region 4614 from the PN junction to the second elongate dielectric layer 4712 forming a dielectric junction with the second elongate dielectric layer 4712. The second elongate dielectric layer 4712 may extend from the dielectric junction to the anode well 4605. In various implementations, the thickness of the second elongate dielectric layer 4712 can be larger than the thickness of the first dielectric layer 4711*c* by a factor larger than 1.2, larger than 1.5, larger than 2, larger than 3, larger than 4, larger than 5 or larger or smaller values.

In some embodiments, the diode-based spark gap device 4703 may further comprise a multi-section field plate 4714 extending over the second elongate dielectric layer 4712. In some examples, the multi-section field plate 4714 may comprise a first field plate 4714*a* extending in the longitudinal direction (e.g., parallel to x-axis) from the extended layer stack 4711 toward the anode well 4605. In some cases, the first field plate may be formed in a metallization layer above the drift region 4614 (e.g., a metallization layer within which the first and second conductive regions 4606, 4608 are formed) and can be electrically connected to the conductive region of the extended layer stack 4711 by a conductive via. In some examples, the multi-section field plate 4714 may comprise a second field plate 4714*b* extending in the longitudinal direction from a distal end of the first field plate with respect to the extended layer stack 4711, toward the anode well 4605. In some cases, the second field plate 4714*b* may be formed in a metallization layer above the drift region 4614 (e.g., a metallization layer above the metallization layer within which the first field plate 4714*a* is formed) and can be electrically connected to the first field plate 4714*a* by a conductive via. In some implementations, a vertical spacing (e.g., along z-axis) between a top major surface of the second elongate dielectric layer 4712 and the second field plate 4714*b* can be larger than a vertical spacing (e.g., along z-axis) between a top major surface of the second elongate dielectric layer 4712 and the first filed plate 4714*a*.

In various implementations, the multi-section field plate 4714 may cover at least 20%, 40%, 60%, 70%, or 80% of the length of the second elongate dielectric layer 4712.

In some embodiments, the multi-section field plate 4714 may produce a vertical E-field component ($E_{RESURF}$) in the drift region 4614 such that the total E-field ($E_{tot}$) at any point along the extended drift region can correspond to a vector sum of a junction E-field and the $E_{RESURF}$. In some cases, at least the magnitude of the longitudinal component of the $E_{tot}$ ($E_{tot,\,x}$) can remain constant or nearly constant along the drift region 4614 from the PN junction to the anode well 4605. In some examples, the lateral component of the $E_{tot,x}$ along the drift region 4614 of the diode-base spark gap device 4703 may change less than 2%, less than 4%, less than 6%, less than 8%, or less than 10% of its vale at the boundary of the base well.

With continued reference to FIG. 47C, in some cases, layer stack 4711 of the diode based spark gap device 4703 may further comprise a conductive region formed over the first dielectric layer 4711*c* and at least partially over the second elongate dielectric layer 4712. The anode well 4605 of the diode-based spark gap device 4703 can be electrically connected to a first voltage node via a first conductive region 4606 and the cathode well 4603 can be electrically connected to second voltage node via a second conductive region 4608. In some embodiments, the conductive region of the extended layer stack 4711 may be electrically connected to the cathode well 4603 via the second conductive region 4608. The conductive region of the extended layer stack 4711 may compromise a first conductive layer 4711*b* and a second conductive layer 4711*a* formed over the first conductive layer 4711*b*. In some embodiments, layer stack 4711 may extend along the longitudinal direction over the drift region from a first end at the PN junction to a second end over the second direct layer 4711*d* (the thick dielectric layer). In some embodiments, the arcing point of the extended layer stack 4711 may be located at or near an interface between the first dielectric layer 4711*c* and the second dielectric layer 4711*d*. As such, $L_{sparkgap}$ for the diode-based spark gap device 4703 can be a distance between the PN junction and the interface between the first and second elongate dielectric layers 4711*c*, 4712. The voltage division ratio (1/M) of the diode-based spark gap device 4703 may be tuned by controlling the length of the first dielectric layer 4711*c*.

The bottom panel in FIG. 47C illustrates voltage variation along the drift region 4614 of the diode-based spark gap device 4703 plotted against a longitudinal distance from the PN junction, when diode-based spark gap device 4703 is reverse biased by applying a positive voltage to cathode well 4603 and a negative voltage to the anode well 4605 (e.g., via the first and second voltage nodes).

In various implementations, the first dielectric layer 4711*c*, the second dielectric layer 4711*d* and/or the second elongate dielectric layer 4712 of the diode-based spark gap devices 4701, 4703 may be formed by local oxidation of silicon (LOCOS) or forming a shallow trench and depositing an oxide within the trench.

In some implementations, the second dielectric layers 4711*d* and the second elongate dielectric layer 4712 may electrically isolate a portion of the first and second conductive layers 4711*b*, 4711*a* extending over the second dielectric layer 4711*d* and the second elongate dielectric layer 4712, respectively, from the anode region 4604 (the drift region 4614 of the anode region 4604). As such, the second dielectric layer 4711*d* and the second elongate dielectric layer 4712 may be referred to as isolation regions of the diode-based spark gap device 4701 and 4703, respectively.

Figure 47D:
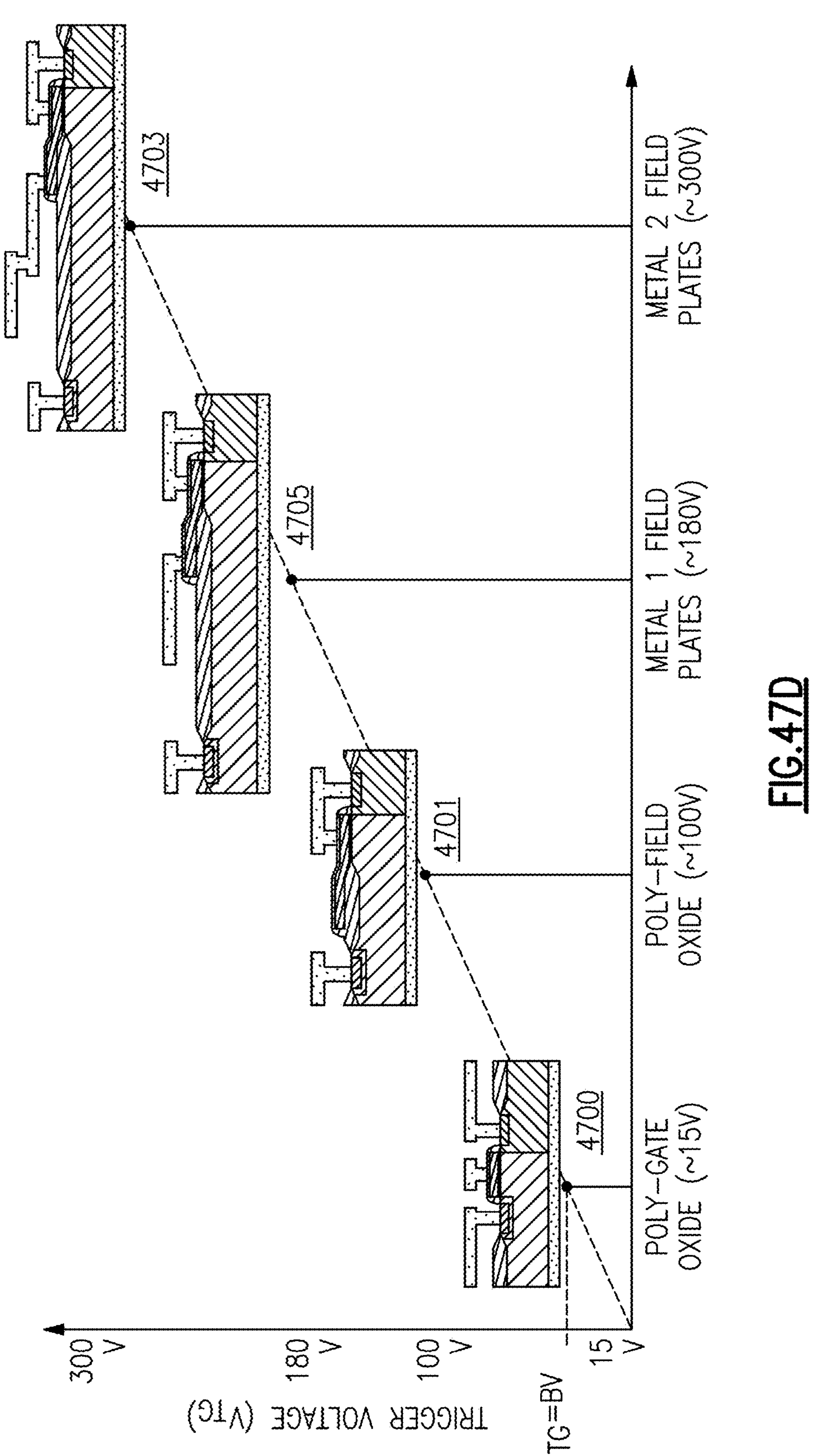
FIG. 47D illustrates the trigger voltage of a diode-based spark gap device plotted as a function of drift region length. Four points associated with the diode-based spark gap devices shown in FIGS. 47A-47C are shown on the plot.

FIG. 47D illustrates trigger voltage of a diode-based spark gap device plotted as a function of drift region length. Three points associated with the diode-based spark gap devices 4700, 4701, and 4703 are shown on the plot. Additionally, a fourth point shown in the plot, corresponds to a diode-based spark gap device similar to diode-based spark gap device 4703, having a single filed plate (instead of a multi-section field plate). In various implementations, for a given BV (e.g., given composition and thickness of the first dielectric layer 4711*c* through which arcing occurs), the $V_{TR}$ of the diode-based spark gap device may be increased by increasing the length of the drift region 4614 and extending the field plate over the drift region (e.g., by adding more filed plate sections). In the examples shown in FIG. 47D, for the diode based spark gap device 4700, where $L_{diode}=L_{sparkgap}$, $V_{TR}$=BV=12 volts, for the diode diode based spark gap device 4701 with extended layer stack 4711, $V_{TR}$=100 volts (M~8.3), for the diode based spark gap device 4705 with extended layer stack 4711 and a single field plate, $V_{TR}$=180 volts (M=12) and for the diode based spark gap device 4703 with extended layer stack 4711 and a two field plates, $V_{TR}$=300 volts (M=20).

It will be appreciated that various features of the diode-based spark gap devices disclosed herein are formed using structures that can be used to fabricate a transistor. As such, some or all of the features of the diode-based spark gap devices can be co-fabricated with a transistor. For example, the layer stack 4610 including the second conductive layer 4610*a*, the first conductive layer 4610*b* and the dielectric layer 4610*c* can be co-fabricated with a gate stack of a transistor. Similarly, the spacers and diffusion regions of the diode-based spark gap devices can be co-fabricated with corresponding regions of a transistor. For example, the anode and cathode wells 4605 and 4603 can correspond to and be co-fabricated with source/drain regions of a transistor.

In some embodiments, two or more diode-based spark gap devices may be integrated on a common substrate and electrically connected in series between first and second voltage nodes to provide a large trigger voltage ($V_{TR-tot}$). In these embodiments, potential difference between the first voltage node and the second voltage node, e.g., caused by an EOS event, may be divided among multiple diode-based spark gap devices (e.g., N devices) such that $V_{TR-tot}$ is substantially equal to the sum of trigger voltages of the individual diode-based spark gap devices ($V_{TR-i}$'s, i=1,2, 3, . . . , N). In various implementations, the diode-based spark gap devices connected in series may have substantially equal or different $V_{TR-i}$'s. In some examples, N diode-based spark gap devices having substantially equal $V_{TR-i}$'s may be connected in series between the first and second voltage nodes to provide protection against EOS events causing a potential difference larger than $N \times V_{TR-i}$.

Figure 48:
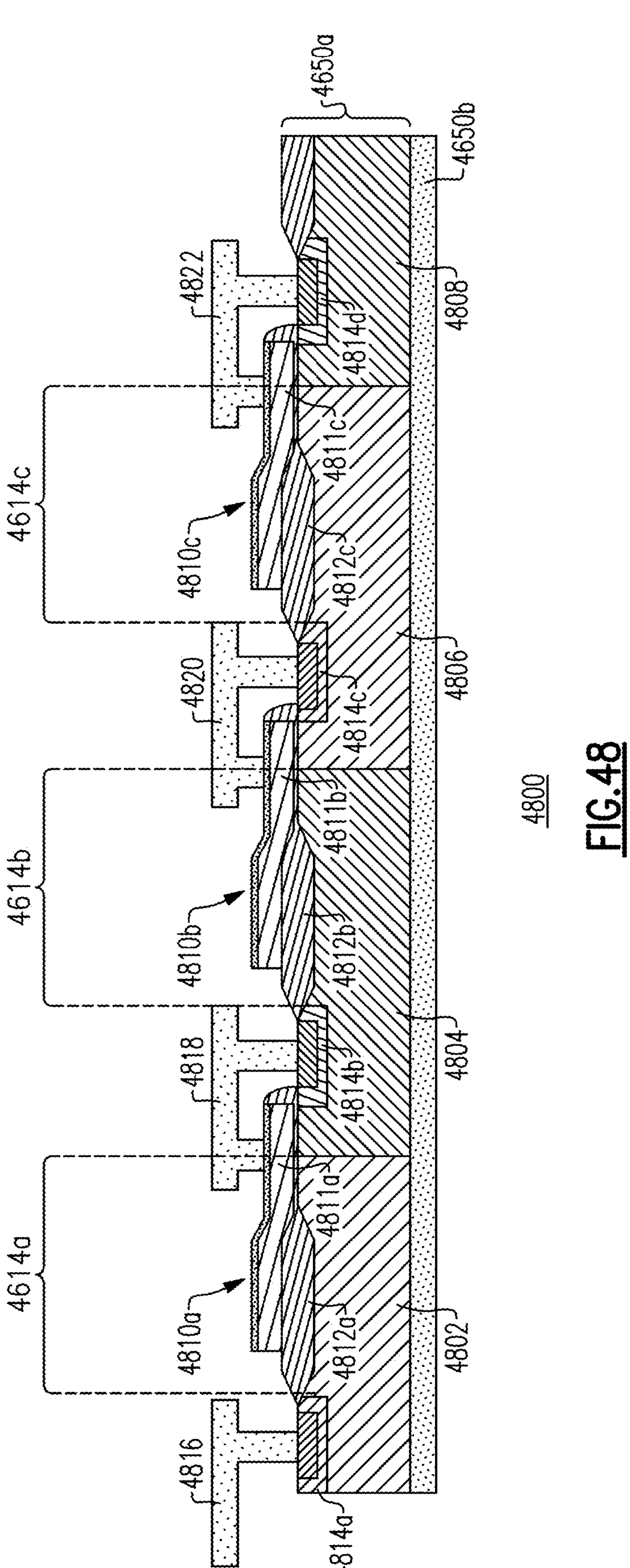
FIG. 48 illustrates diode-based spark gap formed by electrically connecting three diode-based spark gap devices similar to the diode-based spark gap device shown in FIG. 47B.

FIG. 48 illustrates diode-based spark gap device 4800 formed by fabricating three diode-based spark gap devices similar to the diode-based spark gap device 4701 on a common substrate and electrically connecting them in series. In some implementations, the diode-based spark gap device 4800 may comprise four doped regions 4802, 4804, 4806, 4808, formed in a top layer 4650*a* of a substrate where the four doped regions 4802, 4804, 4806, 4808, are doped with alternating dopant type (e.g., alternating between p-type and n-type), to provide three PN junctions along the device. In some examples, an individual doped region may serve as an anode region for a diode-based spark gap device having a layer stack above the doped region and as a cathode region for a subsequent diode-based spark gap device having a layer stack formed over a subsequent doped region forming a PN junction with the doped region.

In the example shown, diode-based spark gap device 4800 comprises a first doped region 4802 (e.g., a p-doped region), a second doped region 4804 (e.g., an n-doped region) forming a first PN junction with the first doped region 4802, a third doped region 4806 (e.g., a p-doped region) forming a second PN junction with the second doped region 4802 and a fourth doped region 4808 (e.g., an n-doped region) forming a third PN junction with the third doped region 4806. In some implementations, the diode-based spark gap device 4800 further comprises first, second, third and fourth HD wells 4814*a*, 4814*b*, 4814*c*, 4814*d* formed in the first, second, third, and fourth doped regions 4802, 4804, 4806, 4808, respectively. The diode-based spark gap device 4800A can include a first drift region 4614*a* extending from the first PN junction to the first HD well 4814*a*, a second drift region 4614*b* extending from the second PN junction to the second HD well 4814*b*, and a third drift region 4614*c* extending from the third PN junction to the third HD well 4814*c*. In some cases, each HD well may comprise an inner region having a larger doping concentration than an outer region.

A first thin dielectric layer 4811*a* may longitudinally extend over portions of the first and second doped regions 4802, 4804 from the second HD well 4814*b* to a first thick dielectric layer 4812*a*, which is longitudinally extended from the first thin dielectric layer 4811*a* to the first HD well 4814*a*. A second thin dielectric layer 4811*b* may longitudinally extend over portions of the second and third doped regions 4804, 4806 from the third HD well 4814*c* to a second thick dielectric layer 4812*b*, which is longitudinally extended from the second thin dielectric layer 4811*b* to the second HD well 4814*b*. A third thin dielectric layer 4811*c* may longitudinally extend over portions of the third and fourth doped regions 4806, 4808 from the fourth HD well 4814*d* to a third thick dielectric layer 4812*c*, which is longitudinally extended from the third thin dielectric layer 4811*c* to the third HD well 4814*c*.

The diode-based spark gap device 4800 further comprises a first extended layer stack 4810*a* comprising the first thin dielectric layer 4811*a* having a conductive region longitudinally extended over a portion of the first thick dielectric layer 4812*a*, a second extended layer stack 4810*b* comprising the second thin dielectric layer 4811*b* having a conductive region longitudinally extended over a portion of the second thick dielectric layer 4812*b*, a third extended layer stack 4810*c* comprising the third thin dielectric layer 4811*c* having a conductive region longitudinally extended over a portion of the third thick dielectric layer 4812*c*.

In some embodiments, The first HD well 4814*a* can be electrically connected to a first voltage node (e.g., via a first conductive layer 4816), the second HD well 4814*b* can be electrically connected to the conductive region of the first extended layer stack 4810*a* (e.g., via a second conductive layer 4818), the third HD well 4814*c* can be electrically connected to the conductive region of the second extended layer stack 4810*b* (e.g., via a third conductive layer 4820), and the fourth HD well 4814*d* can be electrically connected to the conductive region of the third extended layer stack 4810*c* and a second voltage node (e.g., via a fourth conductive layer 4822). In some examples, the first, second, third, and fourth conductive layers 4816, 4818, 4820, 4822 can be formed in a metallization layer above the top layer 4650*a* of the substrate and the HD wells can be electrically connected these conductive layers by vertical conductive vias.

In some embodiments, an electric path from a voltage node to the anode or cathode well of a diode-based spark gap device may comprise a resistive layer serving as a ballast resistor configured to reduce a magnitude of a current passing through the diode-based spark gap device and/or increase $V_{TR}$ for given layer stack and layer stack position over the drift region. In some embodiments, including the resistive layer in the electric path from a voltage node to the anode or cathode well may increase $V_{TR}$ by dividing the voltage difference between two voltage nodes, each electrically connected to one of the anode and cathode wells, to a first voltage drop along the resistive layer and a second voltage drop along the diode-based spark gap device (between anode and cathode wells). In some embodiments, such resistive layer may be integrated with any of the diode-based spark gap devices described above. In various implementations the resistive layer may comprise TiW, SiCr, a metal alloy, or polysilicon. In some examples, the resistive layer can include multiple layers having different resistivities (e.g., a bilayer consisting of a TiW layer formed on a SiCr layer). In some cases, the resistive layer may be formed in a layer (e.g., a metallization layer) formed above the diode-based spark gap device or on a thick dielectric layer that isolates the diode-based spark gap device from a neighboring device on the same substrate.

Figure 49B:
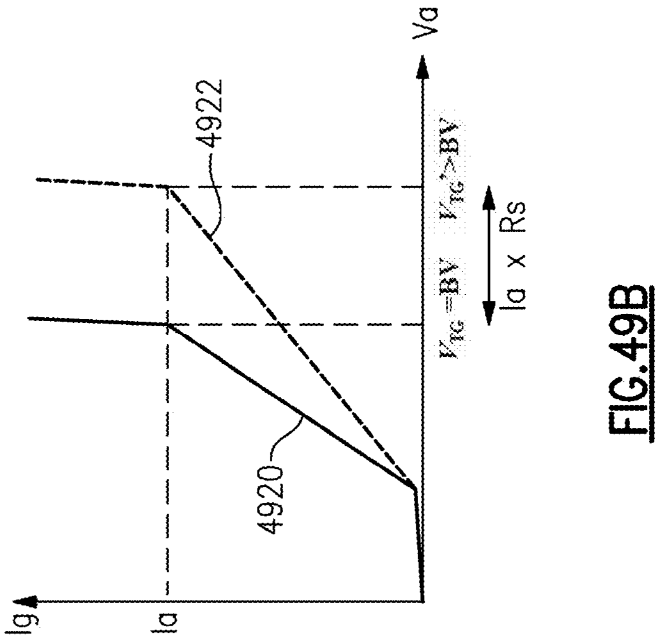
FIG. 49B illustrates an example current-voltage plot for the diode-based spark gap devices shown in FIG. 49A comprising ballast resistors.
Figure 49A:
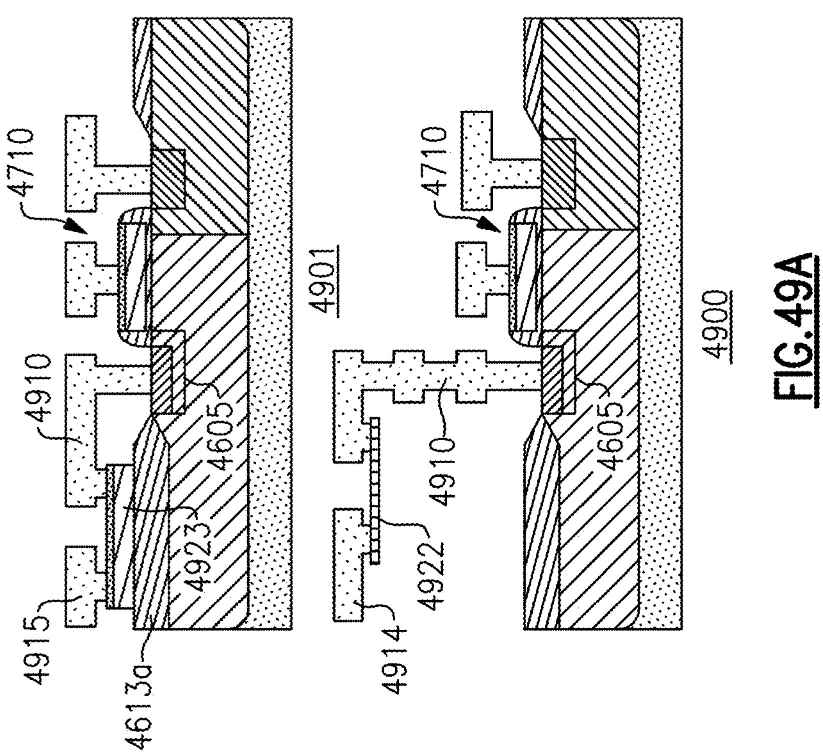
FIG. 49A illustrates two diode-based spark gap devices each comprising an integrated ballast resistor.

FIG. 49A illustrates two example configurations 4900, 4901 for integrating a resistive layer (a ballast resistor) with the diode-based spark gap device 4700.

In the first configuration 4900 the resistive layer 4922 is formed in a top metallization layer above the diode-based spark gap device as a portion of an electric path that electrically connects a first voltage node to the anode well 4605. The resistive layer 4922 extends from a first end electrically connected to a conductive layer 4914 to a second end electrically connected to a conductive path 4910, which is electrically connected to the anode well 4605 via one or more conductive vias and one or more conductive regions formed in the metallization layers between the top metallization layer and diode-based spark gap device. In some examples, the resistor) with the diode-based spark gap device 4700. In the first configuration 4900 the resistive layer 4922 may comprise TiW, SiCr, or a metal alloy. In some examples, the resistive layer 4922 may comprise a bilayer consisting of a TiW layer formed on a SiCr layer.

In the second configuration 4901 the resistive layer 4923 is formed over the first isolating dielectric layer 4613*a* as a portion of an electric path that electrically connects a first voltage node to the anode well 4605. In some examples, the resistive layer 4923 may comprise two or more layer wherein at least one layer has a greater resistivity than the other layers. The resistive layer 4923 extends from a first end electrically connected to a conductive layer 4915 to a second end electrically connected to a conductive path 4910, which is electrically connected to the anode well 4605 via one or more conductive vias and a conductive region formed in the metallization layer above the diode-based spark gap device (e.g., the metallization layer that includes the conductive layer 4915). In some examples, in the second configuration 4900 the resistive layer 4922 may comprise a polysilicon layer disposed on the first isolating dielectric layer 4613*a*.

FIG. 49B illustrates an example electric current passing through the anode well 4605 plotted as a function of potential difference applied between the first and second voltage nodes, in the presence 4922 and absence 4920 of the resistive layer. As shown in FIG. 49B, connecting a resistive layer (e.g., as shown in configurations 4900, 4901), reduces the slope of the current-voltage curve 4922 compared to the slope of current-voltage curve 4920 of the diode-based spark gap device 4700 in the absence of the resistive layer. As a result, at given anode current ($I_a$), a voltage drop across the dielectric layer of layer stack 4710 can be smaller in the presence of the resistive layer. Since for the diode-based spark gap device 4700, $V_{TR}$=BV, adding the resistive layer can increase $V_{TR}$ above BV by $R_s \times I_a$, where $R_s$ is the resistance of the resistive sheet.

Advantageously, in some embodiments, at least a portion of any of the diode-based spark gap devices described above with respect to FIGS. 46A, 46B, 47A, 47B, 47C, and 48 may be synergistically co-fabricated with a field effect transistor (FET), a lateral bipolar junction transistor (BJT) or other electronic devices on a common substrate (e.g., using CMOS co-fabrication techniques). For example, the anode and/or cathode wells of a diode-based spark gap device can be co-fabricated with a drain well or a source well of an FET, or a base or a collector well of a BJT (e.g., a lateral BJT). In some examples, a layer stack of diode-based spark gap device can be co-fabricated with a gate stack of a FET or a RESURF stack of a BJT. In some examples, a field plate of a diode-based spark gap device can be co-fabricated with a field plate (or RETURF plate) of a FET or a BJT. In some examples, a thick dielectric layer of a diode-based spark gap device can be co-fabricated with a thick dielectric layer of a FET or a BJT. Accordingly, in various implementations, the anode and/or cathode wells, the layer stack, the field plate, and/or the thick dielectric layer of a diode-based spark gap may have at least one physical dimensions substantially equal in size to drain and/or source wells of a FET, base and/or collector wells of a BJT (e.g., lateral BJT), gate stack of a FET, RESURF stack of a BJT, field plate of a FET and/or BJT, and thick dielectric layer of a FET and/or a BJT, respectively.

In various implementations, a length of the drift region 4614 of the diode-based spark gap device 4600 may in the longitudinal direction (e.g., along x-axis) can be from 0.5 to 2.0 microns, or from 2.0 to 5.0 microns, from 5.0 to 15.0 microns, from 15.0 to 25.0 microns, or a value in a range defined by any of these values or smaller or larger.

In various implementations, a length of the drift region 4614 of the diode-based spark gap device 4700 may in the longitudinal direction (e.g., along x-axis) can be from 0.5 to 2.0 microns, or from 2.0 to 5.0 microns, or a value in a range defined by any of these values or smaller or larger.

In various implementations, a length of the drift region 4614 of the diode-based spark gap device 4701 may in the longitudinal direction (e.g., along x-axis) can be from 0.5 to 2.0 microns, or from 2.0 to 5.0 microns, from 5.0 to 15.0 microns, or a value in a range defined by any of these values or smaller or larger.

In various implementations, a length of the drift region 4614 of the diode-based spark gap device 4703 may in the longitudinal direction (e.g., along x-axis) can be from 0.5 to 2.0 microns, or from 2.0 to 5.0 microns, from 5.0 to 15.0 microns, from 15.0 to 30.0 microns, or a value in a range defined by any of these values or smaller or larger.

Figures 50A, 50B:
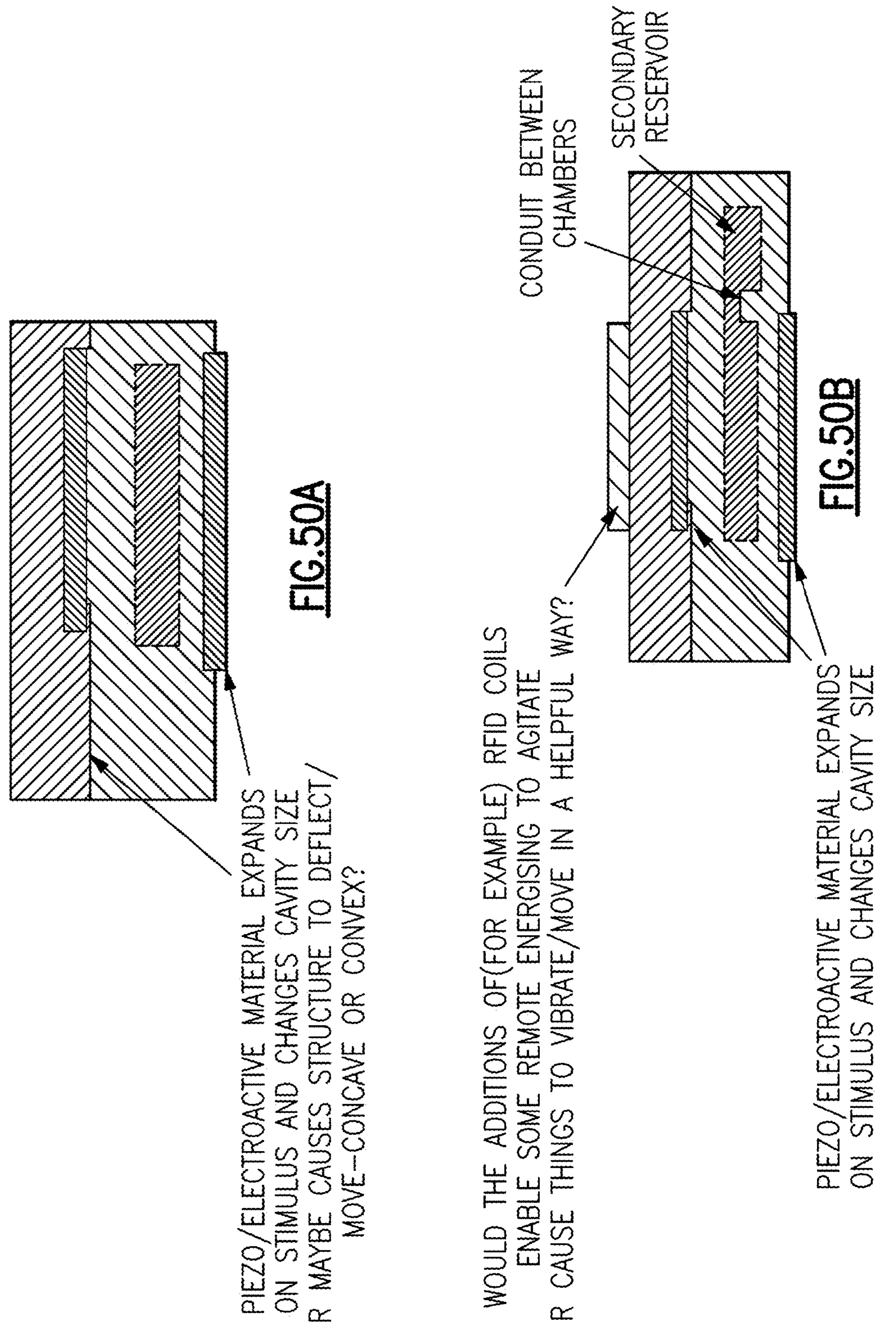
FIG. 50A schematically illustrates an example vertical spark gap device having two piezoelectric regions or elements.
FIG. 50B schematically illustrates a vertical spark gap device having two piezoelectric regions or elements and a radio frequency identification (RFID) coil.

Applications of EOS Monitoring/Protection Devices in Energy Management and Industrial Systems In some embodiments, a lateral or vertical spark gap may comprise a piezo electric section or region configured to adjust (e.g., continuously adjust) the trigger voltage ($V_{TR}$) of the spark gap. In some implementations, the piezoelectric section or region may be used to adjust the $V_{TR}$ by changing a spacing between two laterally or vertically separated electrodes, electrode regions, or electrode fingers. In some implementations, the piezoelectric section or region may be used to change $V_{TR}$ by changing the size (e.g., a volume, or a height along the vertical direction) of a cavity formed between two vertically separated electrodes, electrode regions, or electrode fingers. In some examples, $V_{TR}$ of a lateral or a vertical spark gap having a piezoelectric region or section may be adjusted by adjusting a tuning voltage applied across the piezoelectric region or section. In some cases, a piezoelectric section may deflect or move a portion of a spark gap structure. In some cases, a piezoelectric section may change the shape of a spark gap structure (e.g., change a flat surface of an electrode to a concave or convex surface). FIG. 50A illustrates a vertical spark gap device having two piezoelectric regions. In some cases, an inter-electrode region of the vertical spark gap shown in FIG. 50A may include a gas filled cavity. In some such cases, at least one of the piezoelectric regions may be configured to change the height (along the vertical direction) of the gas filed cavity, upon being stimulated by a tuning voltage. FIG. 50B illustrates a vertical spark gap device having two piezoelectric sections and a radio frequency (RF) coil. In some examples, the RF coil may comprise an RF identification (RFID) coil. In some implementations, the RF coil may be configured to wirelessly stimulate a piezoelectric region of the vertical spark gap. For example, the RF coil convert wirelessly received magnetic or electromagnetic energy to a voltage across the piezoelectric region to change a characteristic of the spark gap (e.g., $V_{TR}$). In some cases, an inter-electrode region of the vertical spark gap shown in FIG. 50B may include a gas filled cavity having two compartments (or reservoirs) connected by a conduit. In some cases, the piezoelectric region may be configured to change one or both compartments.

In some implementations, a spark gap device having a piezo electric region or section may be used for EOS event capture. For example, for a given electrical potential difference between two voltage nodes electrically connected to the electrodes of the spark gap device, $V_{TR}$ can be scanned within a specified voltage range, by scanning the tuning voltage, to capture an EOS event than may occur within the specified voltage range. The specified voltage may be modified for a specific application, e.g., by changing gap size, electrode size and/or shape, topography, material thickness, dielectric composition and other factors as shown in this filing). In various implementations, $V_{TR}$ can be from 50 to 100 Volts, 100-200 Volts, 200 to 300 Volts, 400-600 Volts, 700-800 Volts, 800 to 1000 Volts, 1000 to 2000 Volts, 200 to 3000 Volts, 3000 to 4000 Volts, or any ranges formed by these values or greater values.

Figures 51, 52, 53, 54:
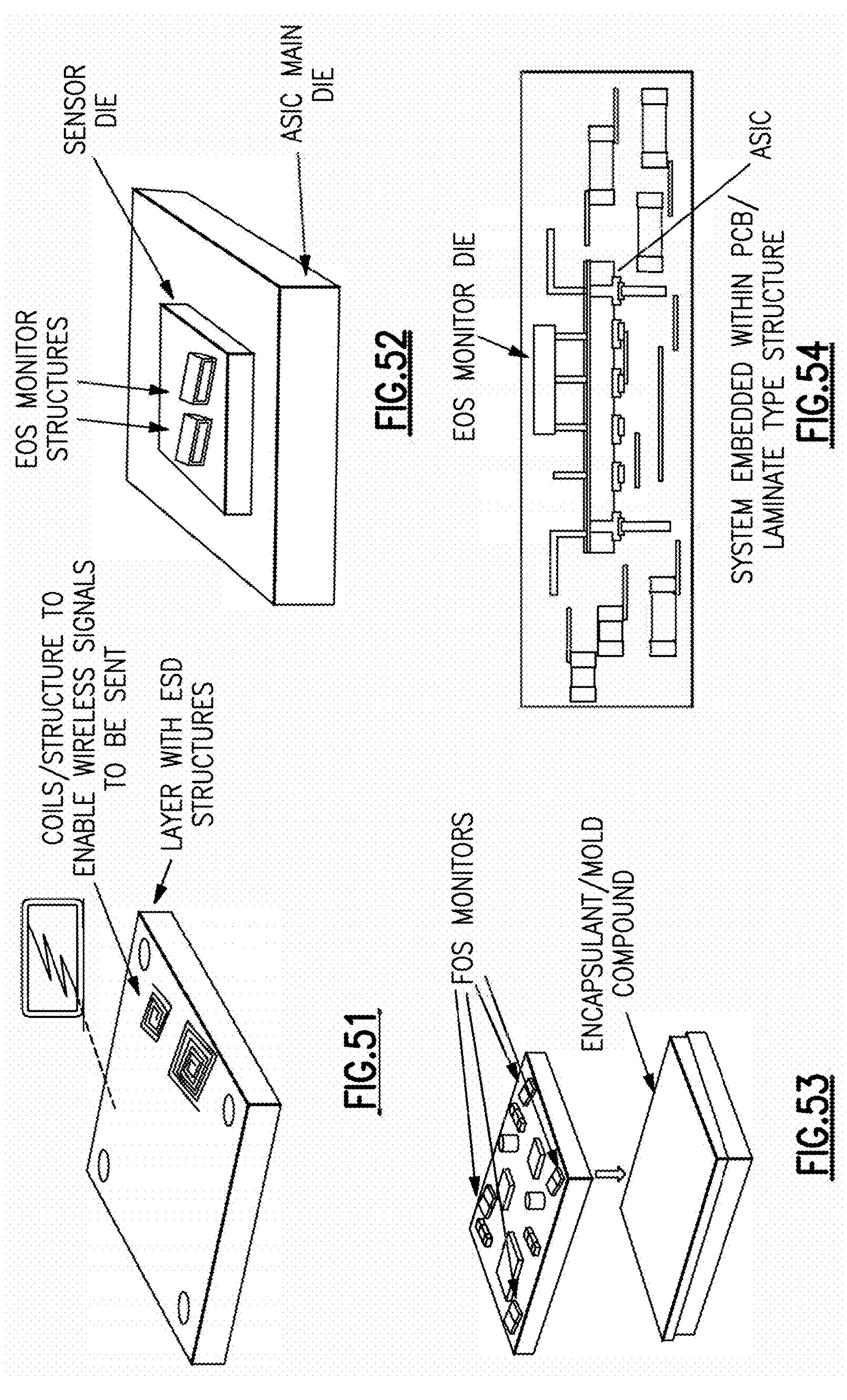
FIG. 51 schematically illustrates an electronic circuit comprising electric overstress (EOS) monitoring devices electrically connected or coupled to one or more RFID coils configured to wirelessly transmit signals indicative of an EOS event or carrying EOS data.
FIG. 52 schematically illustrates a sensor die having two EOS monitor/protection devices electrically connected to an application specific integrated circuit (ASIC).
FIG. 53 schematically illustrates an electronic circuit board having four EOS monitor/protection devices, before (top) and after (bottom) encapsulation.
FIG. 54 schematically illustrates a printed circuit board (PCB) comprising an EOS monitor/protection device and an ASIC.

FIG. 51 illustrates an electronic circuit (e.g., an electronic printed circuit board or an IC) comprising EOS monitoring devices electrically connected or coupled to one or more RF ID coils configured to wirelessly transmit signals indicative of an EOS event or carrying EOS data. In some embodiments, RFID coils can be incorporated as part of an EOS Monitoring system to wirelessly transmit EOS event/monitor information.

In some embodiments, an EOS monitoring or protection device may be integrated with an ASIC. In some cases, the ASIC may be formed in a main die or chip and the EOS monitoring or protection device may be fabricated or boned over the main die. In some examples, EOS structure may be formed on a sensor die or chip and the sensor die, or sensor chip may be bonded or otherwise electrically connected to the main die. FIG. 52 illustrates two EOS monitor structures (e.g., spark gap devices) disposed over a sensor die that is mounted, integrated, or otherwise electrically connected to an ASIC die.

In some embodiments, one or more EOS monitoring or protection devices may be included or integrated with a module or system formed over a main substrate. In some such embodiments, the module or the system and the EOS monitoring or protection devices therein may be encapsulated by disposing an encapsulation layer over the main substrate to protect the module or the components integrated within the system. In some cases, the encapsulating layer may comprise a molding compound. In some applications, an encapsulated system or module having an EOS monitoring or protection device may function with EOS protection while being placed in a harsh environment or otherwise be exposed to certain external conditions. In some embodiments, the components and the substrate may be integrated within a cavity and protected with a lid or a cap that can be hermetically sealed. FIG. 53 illustrates an electronic circuit board having four EOS monitoring/detection devices, before (top) and after bottom) encapsulation.

In some embodiments, EOS monitoring or protection device may be mounted and electrically connected to a printed circuit board (PCB) or laminate type substrate along with other dies, components or integrated circuits (e.g., an ASIC). FIG. 54 illustrates a PCB comprising an EOS monitor die and an ASIC.

Encryption and Security

In various embodiments, an EOS monitor/detection device (e.g., an of the spark gap devices described above) may provide additional or alternative functionalities other than providing protection against an EOS event and/or monitoring/recording an EOS event. In some embodiments, an electronic system may use lightweight cryptographic algorithms for both data integrity and confidentiality. In some cases, cryptographic algorithms may comprise an Authenticated Encryption with Associated Data (AEAD) construction. In some implementations, authentication algorithm and the corresponding hardware can be sufficiently lightweight to be powered via RFID tag reader. In some such implementations, electric charge associated with an EOS event can be sufficient to power a single run of such lightweight cryptographic algorithm/system to digitally sign record of the EOS event. In some embodiments, an EOS detection/monitor device (e.g., a spark gap device) may be used to detect tampering of a system and provide protection against fault injection attacks. In some such embodiments, the EOS charge may be used to wipe stored security/privacy keys from a memory of the system instead of relying on battery-backed random-access memory (RAM). In some embodiments, a spark gap may be configured and used for random number generation (RNG) or as a Physical unclonable functions (PUF). For example, the spark gap may be configured to generate a series of EOS events randomly distributed over a period where presence and absence of an EOS event are registered as logic 1 and logic 0, respectively.

Cryptographic Integrity of EOS Event Record

In various systems and devices EOS events can be a significant source of failures that may result in product returns. As such, it is desirable if occurrence of an EOS event can be confidently determined based on recorded data. Additionally, recording data associated with various aspects of an EOS event (e.g., magnitude of a voltage causing the EOS event, time and duration of the EOS event, location within a system where the EOS occurs, and the like) may be used to determine the broader environmental state of an affected components or portion of the system at the time of the event as well as other information that may be used for failure analysis.

In some embodiments, various characteristics (e.g., structure) of spark gaps used to protect and/or monitor a system (e.g., an electronic system) may be evaluated to determine whether an EOS has occurred. In some implementations, an automated test equipment (ATE) can be configured to autonomously or semi-autonomously examine one or more spark gaps of a device or system under test and determine occurrence of an EOS event and measure EOS data or spark gap status data. In some embodiments, the EOS events may be locally recorded in a memory of the device or system and a technician of an ATE may use the EOS data or spark gap status data for further analysis. A manufacturer may use measured or recorded EOS or spark gap status data to establish that the EOS event occurred when the system was deployed. Given that in some cases an EOS event may result in a costly failure of a larger system, it can be desirable to protect the EOS data recorded for an EOS against tampering or being used by unauthorized users or to verify that the system was mis-operated in an un-intended or non-recommended manner.

In some embodiments, when an EOS occurs, a spark gap detecting the EOS event (e.g., a spark gap that arcs in response to the EOS event), may be configured to trigger generation of electronic data comprising a state of the device or system available at the time of the EOS event, In some case, electronic data may comprise a time of the EOS event, register values, chip identification value, or other parameters of the system that can be useful for failure analysis and identifying a cause of the EOS event. In some cases, electronic data can be encrypted to prevents access or any modification of the recorded data, e.g., by an unauthorized user. In some embodiments, electronic data may comprise a digital signature or a cryptographic digital signature. In some embodiments, such cryptographic digital signature may be generated using an on-board computing system. In various implementations, the cryptographic digital signature and EOS event record may be stored locally on the device or may be transmitted at the time of the event to external systems. In some implementations, the cryptographic digital signature of the event can be recorded directly without requiring the more computationally expensive task of encrypting the record.

Using EOS Energy to Power Cryptographic Processing

In some cases, if a device or system is resource-constrained, performing cryptographic operations (e.g., used to maintain integrity or confidentiality of information) can be challenging. In some such cases, simplified or lightweight cryptographic algorithms, such as those standardized by the National institute of standards and technology (NIST), may be designed to provide security with minimal area and power overhead. The power used to execute some such lightweight cryptographic algorithms can be sufficiently small to be wirelessly received from an external wireless reader. In some embodiments, a spark gap and the corresponding encryption system can be linked (e.g., electrically connected) to an on-board radio frequency identification (RFID) system and an external RFID reader may power the encryption system to execute a cryptographic algorithm (e.g., a digital signature or encryption scheme). The cryptographic algorithm may be used to digitally sign or encrypt data to guarantee the integrity or confidentiality of a record of a spark gap event. The encrypted and/or digitally signed data may then be wirelessly transmitted to an external reader.

In some embodiments, the EOS event itself may provide sufficient power to the encryption system to execute cryptographic algorithm and generate the encrypted and/or digitally signed data. For example, a spark gap may be configured to transfer at least a portion of the electric power generated during an EOS event to the on-board encryption system along with the spark gap data so that the encryption system can perform a cryptographic operation associated with the spark gap data using the power received from the spark gap. Advantageously, for devices and systems that are resource-constrained and cannot perform extensive computation for encryption, the power extracted from an EOS event can power the cryptographic system.

Using EOS Event to Mitigate Fault Attack or Tampering

In some embodiments, a fault may bypass the security measure or reveal sensitive information such as cryptographic key material that results in a security failure. In some implementations, the cryptographic key can be held in a RAM and/or execution of a cryptographic algorithm may be powered by a battery. In some such implementations, the system may be configured to use power from the battery to wipe the cryptographic key when a tamper event is detected. However, maintaining and replacing the battery can be difficult and may significantly increase both the product and maintenance cost.

In some cases, a tampering attempt may trigger an EOS event. In some such cases, the EOS event may indicate that an adversary has been attempting to introduce a fault in the system, e.g., to circumvent certain security measures. For example, an EOS event can be indicative of an adversary altering the execution of a cryptographic algorithm (e.g., a cryptographic algorithm executed to encrypt data associated with EOS events). As such, in some cases, a spark gap device may be used for detecting a tampering attempt. In addition to serving as a fault or tampering detection sensor, in some cases, a spark gap device may provide the electric energy for wiping a cryptographic key or other sensitive data stored in a memory. For example, in response to an EOS event, the spark gap may be configured to wipe the cryptographic key or related data using the electric power generated by the EOS event. For example, the spark gap may reroute an EOS overvoltage to blow some or all bits of a one-time programmable memory responsible for storing cryptographic key and related data key to prevent recovery (e.g., by an adversary). Advantageously, in some embodiments, a spark gap may protect a system against EOS events caused by a system malfunction or external voltage and/or detect an EOS event associated with a tapering attempt and in response to the tapering attempt provide the electric energy for wiping the encrypted information or other private secured data.

Using EOS Event for Random Number Generation

In some embodiments, a spark gap may be configured to operate near threshold, e.g., by applying a voltage close to $V_{TR}$ to generate random sparking events that may be used to generate random numbers and/or operate as a physical unclonable function (PUF). In some implementations, an inter-electrode gap size of a spark gap may be configured such that when a voltage within a specified range is provided to the spark gap, the likelihood of a sparking event is substantially equal to 50%. In these implementations, when the spark gap is reusable (e.g., a vertical spark gap) and is configured to maintain its functionality and electrical characteristics over multiple spark events, a series of arcing events may occur randomly and can be used to generate random bits. This functionality can serve as an entropy source for the construction of a random number generator (RNG), or for the construction of a physical unclonable function (PUF), which subsequently could be used for cryptographic applications such as key generation or device authentication. Physical inspection of the spark gap will not reveal whether or not a spark will occur at a particular voltage. However, the same (subject to ideally a low error rate) output, specific to that device's spark gap configuration, may be recovered by re-applying the particular voltage across the spark gap array and recording which spark gaps exhibit a spark. This output could serve as the basis of a PUF, as the physical characteristics of the spark gap array determine the behavior of the PUF and are specific to each spark gap array instantiation.

EOS Monitor/Protection Devices in Energy Management and Industrial Systems

In some embodiments, an EOS monitor/detector device may be used to provide protection against EOS events, reacting to EOS events, detect and record EOS events, and/or monitor EOS events (e.g., for predicting future EOS events) at different parts, modules, or blocks in an energy management system or an industrial setting. The energy management systems can include, but are not limited to, energy distributions systems, energy storage systems, electric vehicles (EV), EV charging systems, EV docking stations, battery energy storage systems (e.g., in renewable energy hubs), data centers, grid energy storage systems, and the like. Industrial systems can include assembly lines, manufacturing plants, or any industrial setting involving electric or electronic machinery. In some cases, the EOS monitor/detector device may be used within a high voltage system involving power conversion (invertors, DC-DC regulation, chargers) and/or electric energy storage system. In various implementations, an EOS monitor/detector device may be used as a sensor or monitor to detect EOS events and generate data (e.g., data associated with the EOS event), where the data is usable for predicting future EOS events, characterize the EOS events, identify a location in the system that an EOS occurs, or a cause of an EOS event. Additionally or alternatively, the EOS monitor/detector device may be used to protect a portion of an energy management system against EOS events. In various implementations, an EOS monitor/detector device can be used in combination with an electric isolator and/or switch to protect a module, a circuit, or a device in an energy management system or industrial setting.

In some embodiments, an energy management system can include an electric charging system comprising an energy transmit circuitry configured to transmit electric energy to an electric energy storage system having a rechargeable battery. The electric energy storage system may comprise an energy receive circuitry configured to couple to the energy transmit circuitry to receive the electric energy from the electric charging system to charge the rechargeable battery. In some such embodiments, one or both of the energy transmit circuitry and the energy receive circuitry can be configured to be monitored for or protected from electrical overstress (EOS) events, by an EOS protection and/or monitor device, e.g., during energy transfer from the electric charging system to the electric energy storage system. The EOS protection and/or monitor device may comprise any one of the spark gap devices described above (e.g., lateral spark gaps, vertical spark gaps, spark gap arrays, diode-based speak gap devices). In some examples, the EOS protection and/or monitor device may comprise one or more pairs of arcing electrodes fabricated on a substrate, where the arcing electrodes of each pair are separated in a vertical direction, crossing a horizontal main surface of the substrate, by an arcing gap and are configured to generate an arc discharge in response to the EOS signal received between a first voltage node and a second voltage nodes of the energy management system. In some examples, the pairs of arcing electrodes can be formed by one or more lower arcing electrodes and one or more upper arcing electrodes. In some implementations, the lower arcing electrodes can be electrically shorted to each other by a ballast resistor where a resistance of the ballast resistor is substantially higher than a resistance between the ballast resistor and the first voltage node electrically connected to the lower arcing electrodes. In some embodiments, the pairs of arcing electrodes and the arcing gap can be enclosed in a volume filled with a gas medium different from ambient air. In some examples, the upper arcing electrodes can be electrically shorted to each other.

In some implementations, one or both the energy transmit circuitry and the energy receive circuit may comprise the EOS protection and/or monitor device electrically connected to the first and second voltage nodes. In some embodiments, the energy management system can include an electric energy grid connected to the electric charging system and configured to provide electric energy to the electric charging system. In some implementations, one or both the energy transmit circuitry and the energy receive circuit may comprise a micro-electromechanical system (MEMS) switch. In some examples, the MEMS switch and the EOS monitor or protection device can be co-fabricated on the substrate and comprise corresponding portions having at least one common physical dimension. In some cases, the MEMS switch may be configured to disconnect a circuit from the first voltage node in response to generation of the arc discharge. In some examples, the energy storage system may comprise an electric vehicle (EV) and the charging system may comprise an EV charging (or docking) station. In some embodiments, one or both of the energy transmit circuitry and the energy receive circuitry may comprise an electric isolator electrically coupled to the EOS protection and/or monitor device. In some embodiments, the electric isolator may comprise an inductive isolator or capacitive isolator.

Figure 55:
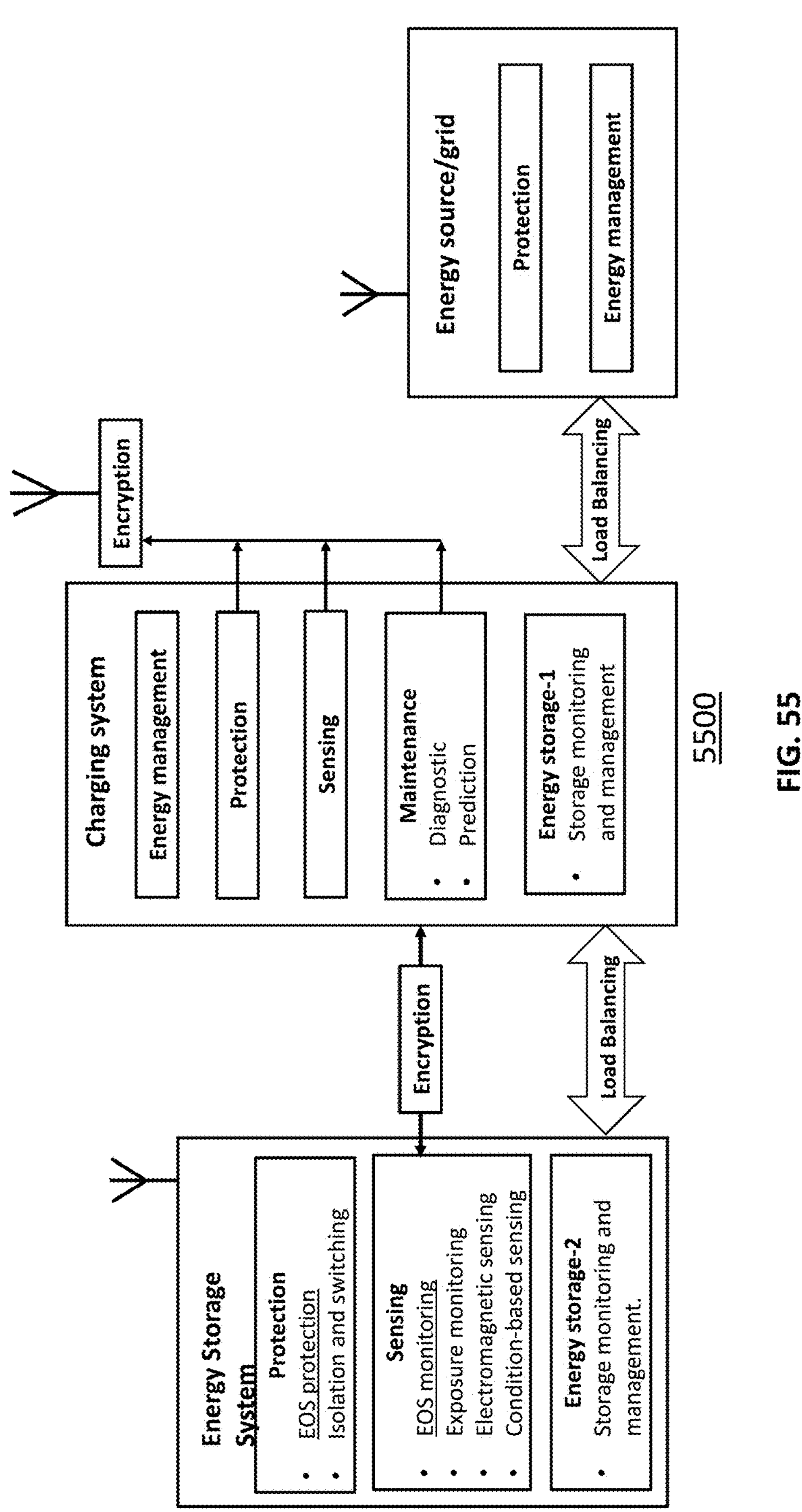
FIG. 55 is a block diagram illustrating an example energy management system having one or more EOS protection/monitor devices withing various modules.

FIG. 55 is a block diagram illustrating an energy management system 5500 comprising an energy storage system, a charging system, and an energy source or grid. In some embodiments. The energy source/grid may comprise an electric generation system (e.g., fuel, solar, nuclear, hydraulic, wind power plants or a combination thereof) and a grid configured to transmit the electric energy to a charging system. The charging system may be configured to temporarily store and/or provide the electric energy received from the energy source/grid to multiple energy storage systems at different times. For example, the charging system may comprise an electric vehicle (EV) docking system configured to connect to an EV and provide energy to the EV. The energy storage system may be configured to store electric energy received from the charging and provide the electric energy to an electrical, electronic, or an energy conversion system (e.g., electoral-to-mechanical, electric-to-thermal) system that performs a task. For example, the energy storage system can be the storage system of an electric vehicle (EV) providing electric energy to an elector-motor. The energy storage system can include a protection module configured to protect various components and modules within the energy storage system, a sensing module configured to monitor various components and modules within the energy storage system, and an energy storage module, energy storage device, (e.g., rechargeable batteries) configured to store electric energy received from the charging system. In some embodiments, the energy management system 5500 can include load balancing systems configured to control energy transfer between the energy storage system, the charging system, and the energy source/grid.

In some embodiments, EOS protective and monitoring elements (e.g., the lateral and/or vertical spark gaps described above) can be inserted and used at different nodes of the energy source/grid (e.g., a grid storage system of the energy grid), the load balancing system, the charging system, or the energy storage system. In some implementations, at least one of the energy storage system, the charging system, or the energy source/grid of the energy management system 5500 may include a protection module configured to provide protection against EOS events. In some examples, the protection module may include an EOS protection device (e.g., a spark gap device such the lateral and/or vertical spark gaps described above), a switch (e.g., a MEMS switch or an alternative isolated protection switch), or an isolator (e.g., magnetic isolator). In some examples, the MEMS switch may include an integrated EOS protection device (e.g., similar to the MEMS switch described above). In some examples, the isolator may be integrated with the EOS protection device.

In some implementations, one or both the energy storage system and the charging system may include a sensing module configured to monitor components and modules within the energy storage system and generate sensor signals indicative of a deice or component condition, a parameter value, an EOS event, various forms of device or system failure, and the like. In some embodiments, sensors used in the sensor module may include an EOS monitoring device, an exposure monitor device, a capacitive sensor, an electrostatic field detector, a magnetic sensor, a condition-based sensor, or other type of sensors. Examples of these sensors and switches are described below.

In some embodiments, one or both the charging system and the energy source/grid may comprise an energy management module configured to control energy distribution to energy storage systems and/or energy charging systems (e.g., schedule, prioritize, authenticate user, and the like).

In some embodiments, the charging system may further comprise a maintenance module, an energy storage module, energy storage-1 (e.g., rechargeable batteries), and in some cases, a local energy source (e.g., a renewable energy source such a solar cell or other energy harvesters) for providing additional energy to the energy storage module (in addition to the energy received from the energy source/grid. The maintenance module can be configured to process data received from the energy storage system (e.g., from the sensing and/or protection modules of the energy storage system) to diagnose a problem, predict future problems, and initiate maintenance and preventive actions. In some embodiments, the charging system may use Artificial Intelligence to monitor different sensing inputs and data generated to enable optimal operational efficiency and safety.

In various implementations, the data generated by the sensing module of the charging system and/or the energy storage system may be used by the energy source/grid, the charging system and/or the energy storage system, for maintenance, energy management (including energy storage management within the charging system and/or the energy storage system). In particular, data generated by EOS monitoring devices, e.g., one or more vertical spark gaps, may be used to determine various parameters and conditions that may directly or indirectly affect energy management, energy storage and system maintenance. As various vertical spark gap devices described above may be used at multiple nodes in any of the modules of the energy management system 5500.

In various implementations, sensor data generated by the sensing module may be encrypted before transmission to the charging system. Similarity, data generated by charging system (e.g., control data) may be encrypted before transmission to the energy storage system. In some implementations, the energy for encrypting sensor or control data may be provided by a EOS protection/monitor device (e.g., a vertical spark gap device) in a protection or sensing module. In some implementations, a security key or a random number used for encrypting sensor or control data may be generated by an EOS protection/monitor device (e.g., a vertical spark gap device) in a protection or sensing module.

In some embodiments, storage system, the charging system, or the energy source/grid may include one or more exposure monitors, e.g., for monitoring and recording cumulative temperature exposure.

In various implementations, the energy storage system, the charging system, and the energy source may be in communication through wired or wireless links to share data (e.g., sensor data generated by a vertical spark ga device) and commands.

In various implementations, one or more EOS protection/monitor device (e.g., a vertical spark gap device or a vertical spark gap array) may be used at one or more nodes of the energy management system 5500 within the or between modules of the corresponding energy storage system, charging system, and/or energy source/grid. In some embodiments, the EOS protection/monitor device may protect a circuit, module, or component from being damaged by an EOS event, generate functional safety data usable for identifying a damage or fault, generate data usable for predicting and preventing future EOS events, generate a control signal to activate or deactivate a relay or switch (e.g., a MEMS switch), generate a signal to trigger a maintenance request (or a conditional based maintenance cycle), generate data usable for reconfiguring a circuit or module, or generate data usable for reconfiguring or redesigning a circuit or module to reduce vulnerability to EOS events. As such, EOS protection/monitor device may be used to reduce overall cost of maintaining and repairing an energy management system. In some embodiments, the energy management system 5500 may use Artificial Intelligence to monitor different sensing inputs and data generated to enable optimal operational efficiency and safety.

Figure 56:
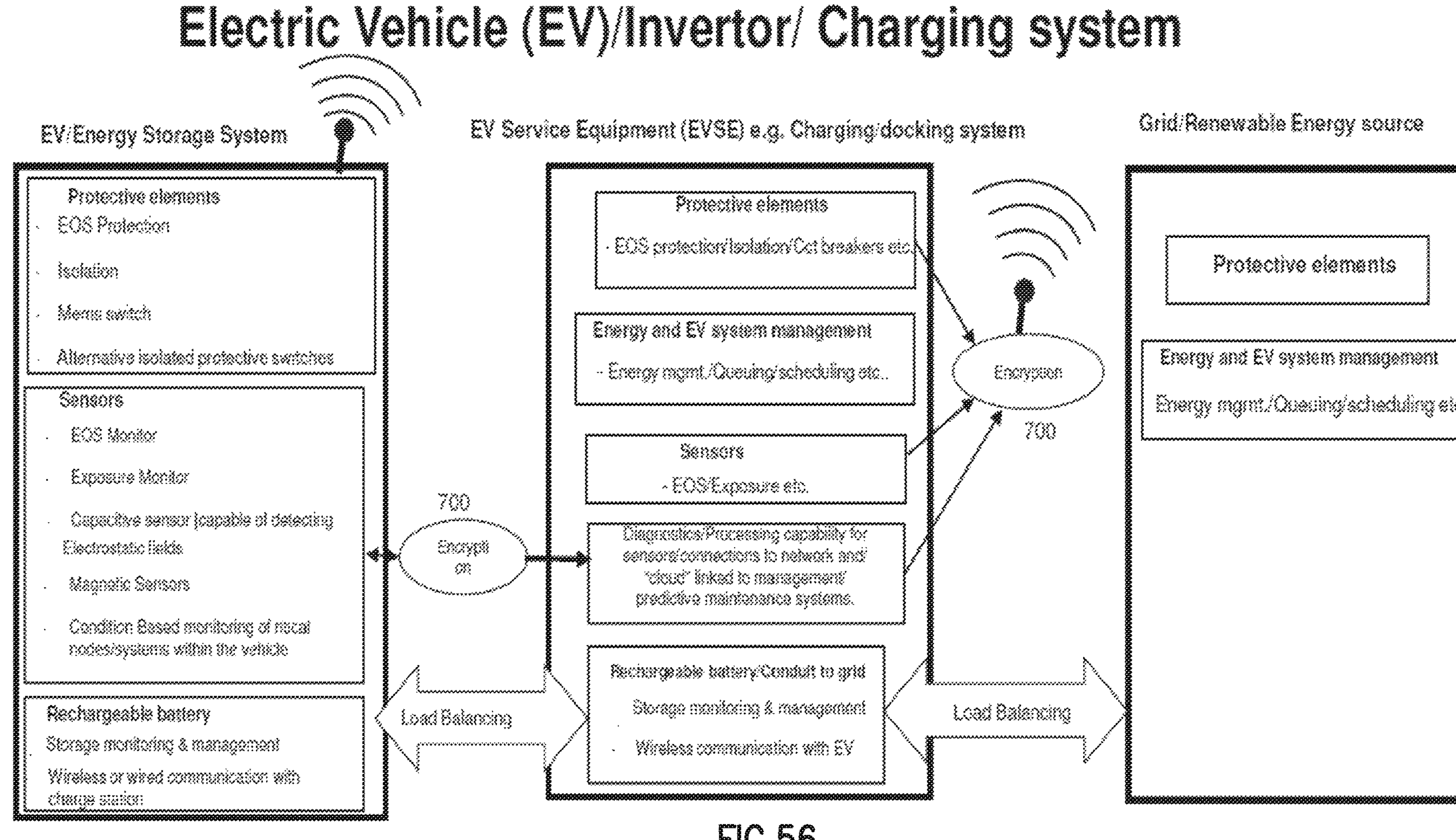
FIG. 56 schematically illustrates an implementation of the energy management system shown in FIG. 55 as an electric vehicle (EV) charging system.

FIG. 56. Illustrates an implementation of the system shown in FIG. 55 for an electric vehicle (EV) charging system.

Figure 57:
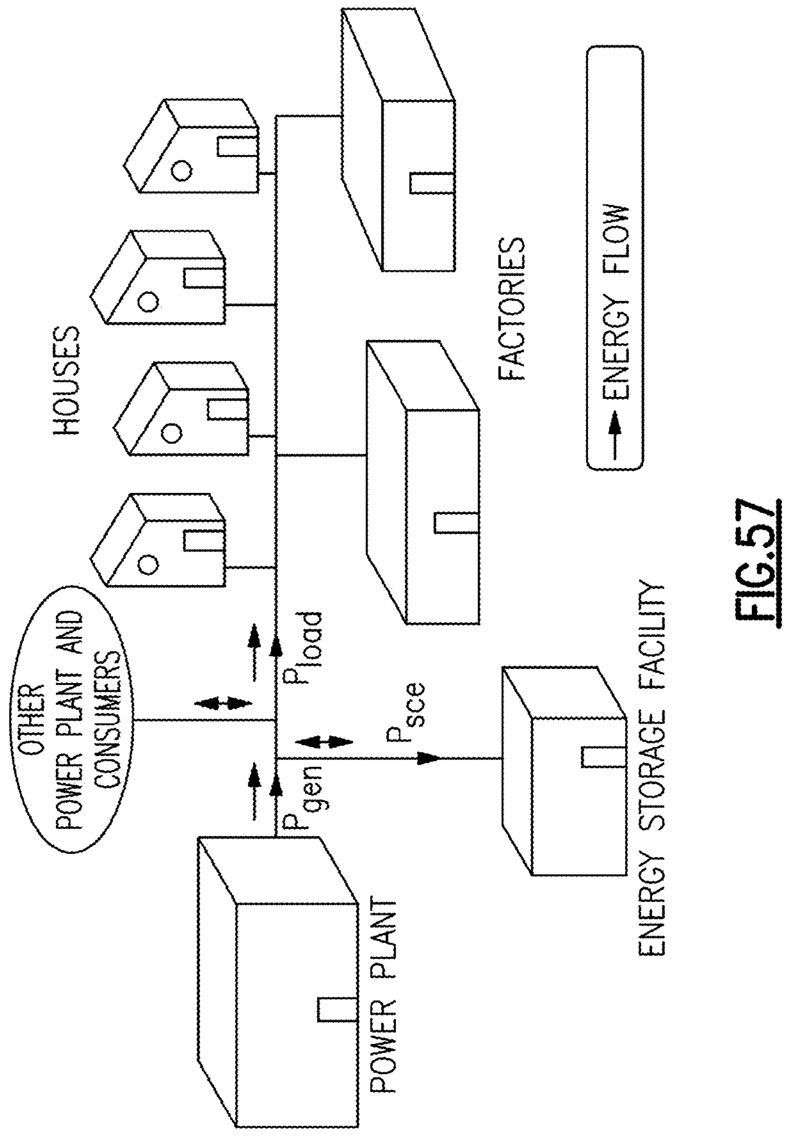
FIG. 57 schematically illustrates an example energy grid having a grid energy storage system.

FIG. 57 illustrates an example energy grid having a grid energy storage system and energy storage facility. In some cases, the energy grid shown in FIG. 55 may comprise the energy grid shown in FIG. 57. In some cases, a grid energy storage (also referred to as large-scale energy storage) can be a collection of methods used for energy storage on a large scale within an electrical power grid. Electrical energy can be stored during times when electricity is plentiful and inexpensive (e.g., from intermittent power sources such as renewable electricity from wind power, tidal power and solar power) or when demand is low, and later returned to the grid when demand is high, and electricity prices tend to be higher. In some cases, EOS protective or monitoring elements (e.g., the vertical spark gap devices described above) can be used at different nodes of a grid energy storage system to provide protection against EOS events and/or monitor EOS events and generate data usable for determining the overall health of the system, predict future EOS events, determining location and time of an EOS event and initiating maintenance and preventive actions.

In some cases, load balancing, load matching, or daily peak demand reserve refers to the use of various techniques by electrical power stations to store excess electrical power during low demand periods for release as demand rises. The aim is for the power supply system to have a load factor of 1. Grid energy storage stores electricity within the transmission grid beyond the customer. Alternatively, the storage can be distributed and involve the customer, for example in storage heaters running demand-response tariffs such as the United Kingdom's Economy 7, or in a vehicle-to-grid system to use storage from electric vehicles during peak times and then replenish it during off peak times. These require incentives for consumers to participate, usually by offering cheaper rates for off-peak electricity.

Figure 58:
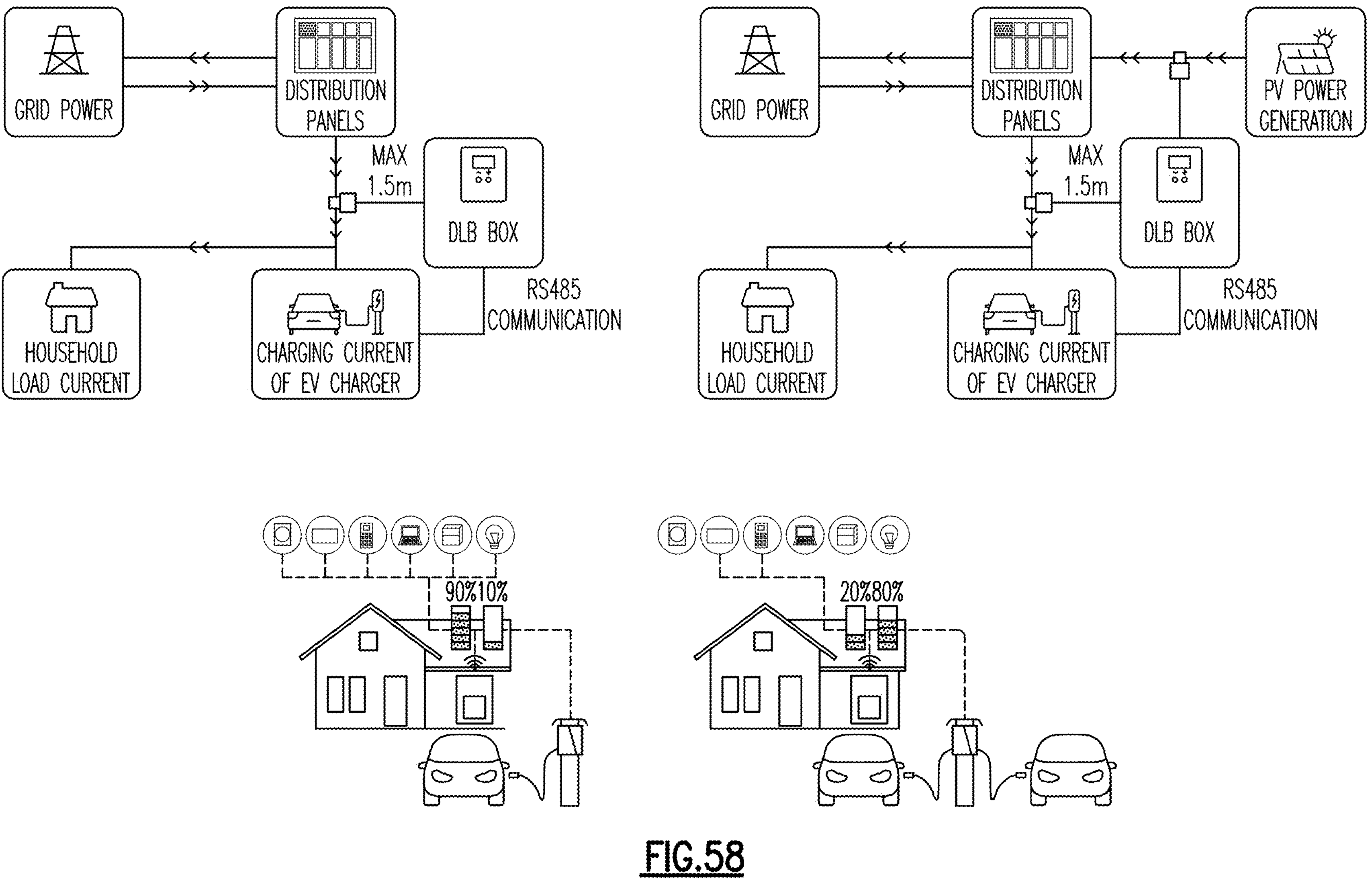
FIG. 58 schematically illustrates example load balancing systems that may be used in the energy management system shown in FIG. 55.

FIG. 58 illustrates example load balancing systems that may be used in the energy management system 5500 shown in FIG. 55 or its implementation as an EV charging system (FIG. 56). In some embodiments, EOS protective elements can be inserted and used at different nodes of such load balancing systems.

The top panel in FIG. 58 illustrates example dynamic load balancing systems (DLBs) configured to balance the electric power load between an electric vehicle (EV) charger and other electric devices connected to a grid. In some cases, DLB may allow faster EV charging, control electric power transmission to different devices, and maintain electric current passing through fuse below a trigger current. The bottom panel in FIG. 58 illustrates load balancing between an EV charger and household appliances. As the load in the EV charger increases (e.g., charging two cars instead of one car), certain appliances are disconnected. For example, an electric vehicle (EV) energy managing system, may balance the load between a rechargeable battery of the EV, a docking station, and an electric grid such by controlling energy transfer from the grid to the charging system, energy storage and generation (e.g., by a solar electric generator) within the docking station, and energy transfer from the docking station to the EV.

One or more EOS protection/monitor devices may be used within the circuits, nodes and modules integrated within load balancing systems to provide protection against EOS events and generate data usable for improving load balancing. In some embodiments, the energy management system 5500 may use Artificial Intelligence to monitor the different sensing inputs and data generated to enable optimal operational efficiency and safety.

Example Protective Elements

In various embodiments, EOS protective devices (e.g., the lateral and/or vertical spark gaps described above) may be used in various portions of an energy management system such as an electric vehicle, a docking station, a renewable energy storage, an energy generation system, or the like. Additionally, in some applications, isolating elements, electrical or electro-mechanical switches (e.g., MEMS switches), and/or alternative isolating protective switches may be used in combination with the EOS protective device. In various implementations, EOS protective devices may include lateral spark gaps or vertical spark gaps. In some examples, EOS protective devices can be positioned at multiple points in a system. In some examples, EOS protective device can be linked to wired or wireless/management systems such that any recorded EOS event can be received, flagged to initiate an action, or recorded for future use.

In various implementations, electric isolation may be provided using different mechanisms and device configurations. FIGS. 59A-59B illustrate example magnetic isolators. FIGS. 60A-60C illustrate an integrated on-chip inductive isolator, an inductive isolator within a laminate, and capacitive isolator, respectively. In some embodiments, the EOS monitor/protection devices may be used in a circuit with an isolating device such as a magnetic isolator, inductive isolator, or magnetic isolation driver. In some embodiments, integration of an EOS monitor/protection device with a signal or power isolation device can increase robustness of different systems. In some examples an EOS monitoring device can be integrated with an EV, a charging system, an energy storage system, or energy conversion system. In some examples an EOS protection device can be integrated with an EV, an EV docking system, an EV charging system, or an external test equipment. In some embodiments, an EOS device (e.g., any of the spark gap devices described above) may be used to provide information about a harsh environment and protect against electrically harsh conditions within such an environment. The information can include type and magnitude of a high voltage EOS event. In some embodiments, the EOS information may be used to select an isolator that isolates a device or select an isolated device such that it can operate in the harsh environment without being damaged (e.g., a device having a high voltage rating).

Figure 61A:
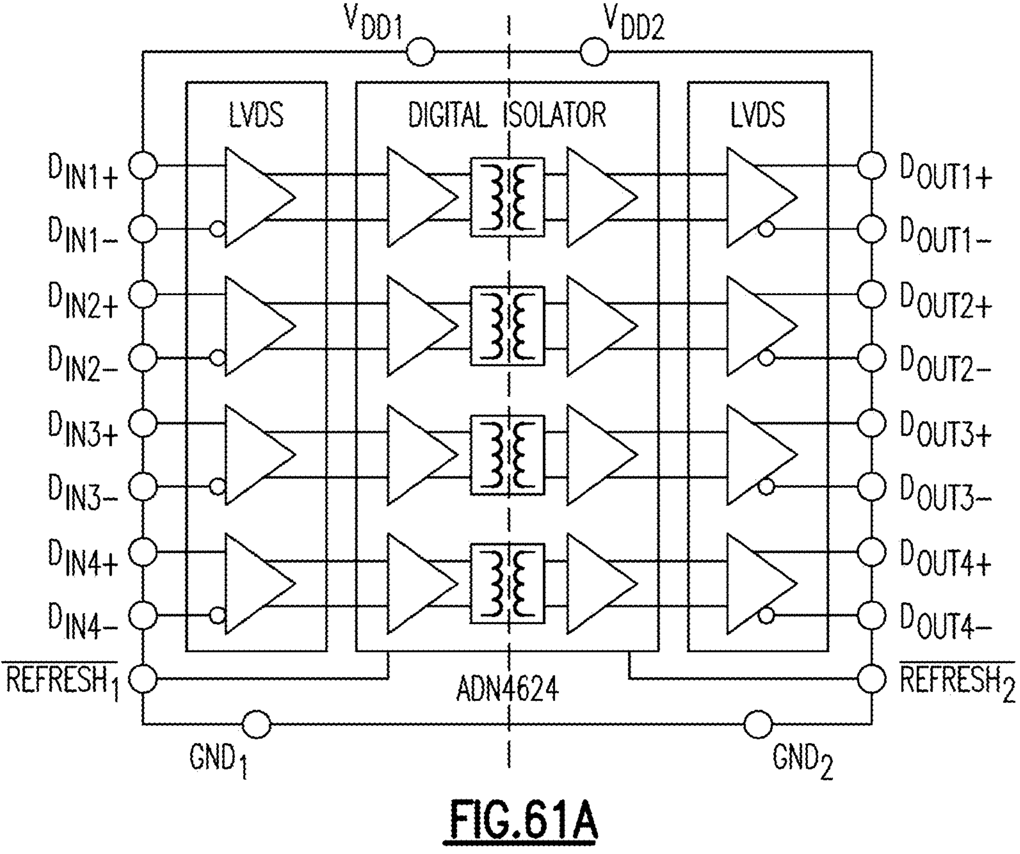
FIG. 61A schematically illustrates an example interlink data isolation device.

In some cases, the isolation device may comprise an interlink isolation device connected to the external world via cables or PCB routing to an external connector. As example interlink isolation device (e.g., the 2.5 Gbps LVDS isolator) is shown in FIG. 61A. In some cases, input/output (I/O) protection and isolation can be tolerant to ESD, surge voltage, working voltage, or otherwise withstand voltage requirement of an end market (e.g., industrial, instrumentation, medical, EV charging systems, Solar PV, or the like). In these cases, adding an EOS protection and/or monitoring device (e.g., the lateral and/or vertical spark gaps described above) before or after or at the input/output terminals of the isolation device may allow detection of EOS over the voltage conditions described above. In some examples, external cabling between systems (e.g., an EV charging station or EV) may be exposed to external perturbations which can impact the power or information transfer (Pilot Wire) between both systems. As the interlink isolated device technology evolves it may include increased system level capability with protocol awareness. For example, high speed protocols like USB3/Display Port/PCIe contains IP to overcome channel loss through the use of adaptive Continuous Time Linear Equalizers (CTLE). The inclusion of an exposure monitor (e.g., exposure monitor shown in FIG. 61B) at the system level can provide feedback to the isolator device to change the equalizer setting based on thermal changes in the system level environment increasing the efficiency of the overall systems operation.

In some embodiments, an EOS monitoring and/or protection device, individually or combined with an isolator (e.g., a galvanic isolator), may be used to protect the maintenance module in charging system of the energy management system 5500 when the maintenance module is connected to the storage system for testing a system in the energy storage system. For example, when the diagnostic/test equipment included in an EV docking station is used to test one or more systems of an EV connected to the docking station, an EOS monitoring and/or protection device may protect the diagnostic/test equipment. In some cases, the diagnostic/test equipment may be connected to the EV by an electric isolator (e.g., a data isolator such as MAX22444, ADN4620, ADN4621, and the like). FIG. 63 is a block diagram illustrating the circuits, components and voltage levels associated with a connection established between diagnostic system and an EV front-end or terminal having a high working voltage. The inclusion of the EOS protection device if triggered by an electrical overstress can get used to raise a flag to indicate overvoltage events are present with the potential to damage the I/O pins of any component connected to the diagnostic link. This is independent of the high voltage standoff the isolation provides, instead the EOS device can get triggered relative to its local ground, depending on the magnitude of the EOS event.

FIG. 62 illustrate additional examples where electric isolation may be used in combination with the EOS monitor/protection devices.

As described above EOS monitor and/or protection devices (such as lateral/vertical spark gaps described above), may be used in variety of systems and modules in the energy space including energy generation, storage, and distribution. An example energy generation system that may benefit from incorporating EOS monitor and/or protection devices is a solar or photovoltaic electricity generator. In some implementations, a solar electricity generator may comprise a solar panel (e.g., an array of solar or photovoltaic cells) and an inverter that may referred to as a solar inverter or photovoltaic (PV) inverter. A solar inverter or PV inverter can convert variable direct current (DC) output by a photovoltaic (PV) solar panel into a utility frequency alternating current (AC) that can be fed into a commercial electrical grid or used by a local, e.g., off-grid, electrical network. Solar (or PV) inverters may be classified into three broad types: 1) Stand-alone inverters, used in isolated systems where the inverter draws its DC energy from batteries charged by photovoltaic arrays, 2) Grid-tic inverters, which match phase with a utility-supplied sine-wave, 3) Intelligent hybrid inverters, that can manage a photovoltaic array, a battery storage and the corresponding utility grid (that can be coupled directly to a main unit). As such, two independent voltage domains may co-exist within a PV system: an AC domain and a DC domain. In some cases, various electric isolators may be used in a PV system to isolate circuits and devices with respect to two or more voltage domains (e.g., voltages in AC and DC domains). In some embodiments, an EOS monitor or protection device or a corresponding device structure may be included in a PV system (e.g., in combination with the electric isolators) to provide additional high voltage robustness to the PV system and allow for the potential readback and report of harmful events to the overall health of the system. For example, any of the vertical spark gap devices described above may be included at different nodes of a PV system, in some cases in combination with an electric isolator, to provide protection against EOS events and/or generate data indicative of overall health of the system and/or presence, or frequency of EOS events.

Figures 64B, 64C:
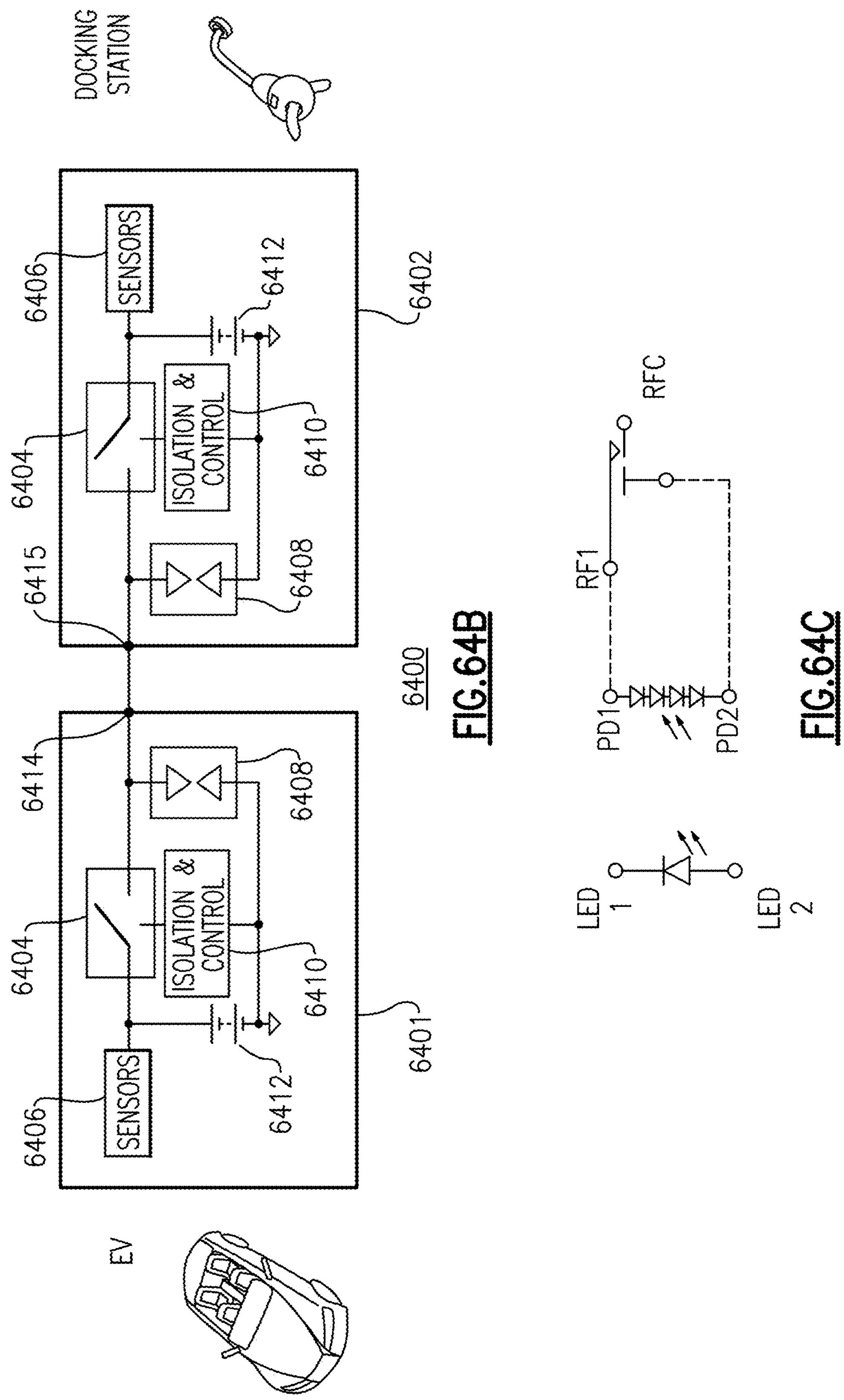
FIG. 64B schematically illustrates an example front-end protection system for an EV charging system having two EOS protection/monitor devices.
FIG. 64C schematically illustrates an example isolated drive connected to a circuit breaker switch.

FIGS. 64A-64C illustrate example EV charging systems that may include electric isolating elements that may be combined and/or integrated with EOS monitor/protection devices. FIG. 64A illustrates an example EV charging system and specifications of the corresponding chargers. FIG. 64B illustrates an example front end protection system 6400 for an EV charging system. In some cases, the front-end protection system 6400 may be implemented between an EV (e.g., rechargeable batteries of the EV) and a docking station. In some embodiments, the front-end protection system 6400 may comprise a first protection circuit 6401 (e.g., integrated with the EV energy storage system) and a second protection circuit 6402 (e.g., integrated with an energy storage or source in the docking station). In some cases, the first and second protection circuits 6401, 6402 can be electrically connected via one or more cables and connectors (e.g., when the EV is charged via the docking station). For example, during an EV charging period, an input port 6414 of the first protection circuit 6401 can be electrically connected to an output port 6415 of the second protection circuit 6402. In some examples, the first and second protection circuits 6401, 6402 may comprise different or similar configurations and/or components. In some embodiments, the first protection circuit 6401 may be configured to protect the components of the EV energy storage system and the second protection circuit 6402 may be configured to protect the components of the docking station.

In some embodiments, one or both of the first and second protection circuits 6401, 6402 may comprise a breaker switch 6404 (e.g., a MEMS switch), an EOS protective device 6408 (e.g., a spark gap), an isolated drive 6410, and a sensor 6406. In some implementations, one of the ports of the circuit breaker switch 6404 can be electrically connected to a first pole of a battery 6412 (e.g., a battery in the EV or docking station) and the input port 6414, the isolated drive 6410 can connect the second pole of the battery 6412 to the gate of the beaker switch 6404, the isolated drive 6410 can connect the second pole of the battery 6412 to the gate of the beaker switch 6404, and the EOS protective device 6408 may connect the second pole of the battery 6412 to the input port 6414. In some cases, the sensor 6406 may be connected to the first pole of the battery 6412. In some examples, the second pole of the battery 6412 can be connected to the ground potential. In various implementations, the battery 6412 may comprise a battery array. In some cases, the sensor 6406 may be configured to detects a malfunction or tampering attempt. In some examples, upon detecting a malfunction or tampering attempt the sensor 6406 may activate the breaker switch 6404 to disconnect the battery 6412 from the input port 6414 (or the output port 6415).

In some embodiments, the breaker switch 6404 may be configured to disconnect the battery 6412 array and the sensor 6406, from the input port 6414 (or the output port 6415) in response to a fault detection, to limit correct flow between the EV and the docking system and thereby prevent damage to the sensor 6406 and/or the battery 6412. In some examples, the breaker switch 6404 may comprise a MEMS switch. Advantageously, a MEMS switch can be more compact and can respond faster to a fault compared to an electro-mechanical switch (e.g., a relay).

In various implementations, the EOS protective device 6408 may comprise any of the vertical spark gap devices described above, a lateral spark gap device, a conventional solid-state shunt protection device (e.g., a diode or a field effect transistor) or other EOS protective devices.

In various implementations, the isolated drive 6410 may be configured to turn off the breaker switch 6404 when the EOS protection device 6408 is triggered by an EOS event without electrically connecting the EOS protection device 6408 to the gate terminal of the breaker switch 6404. As such, when the fault involves a high voltage the isolated drive 6410 protects the breaker switch 6404 from being damaged. In some examples, the Isolated drive 6410 may comprise an optical isolator that includes a light source (e.g., a light emitting diode) and a photodetector (e.g., a photodiode). An example isolated drive connected to a breaker switch is schematically shown in FIG. 64C.

Figure 65:
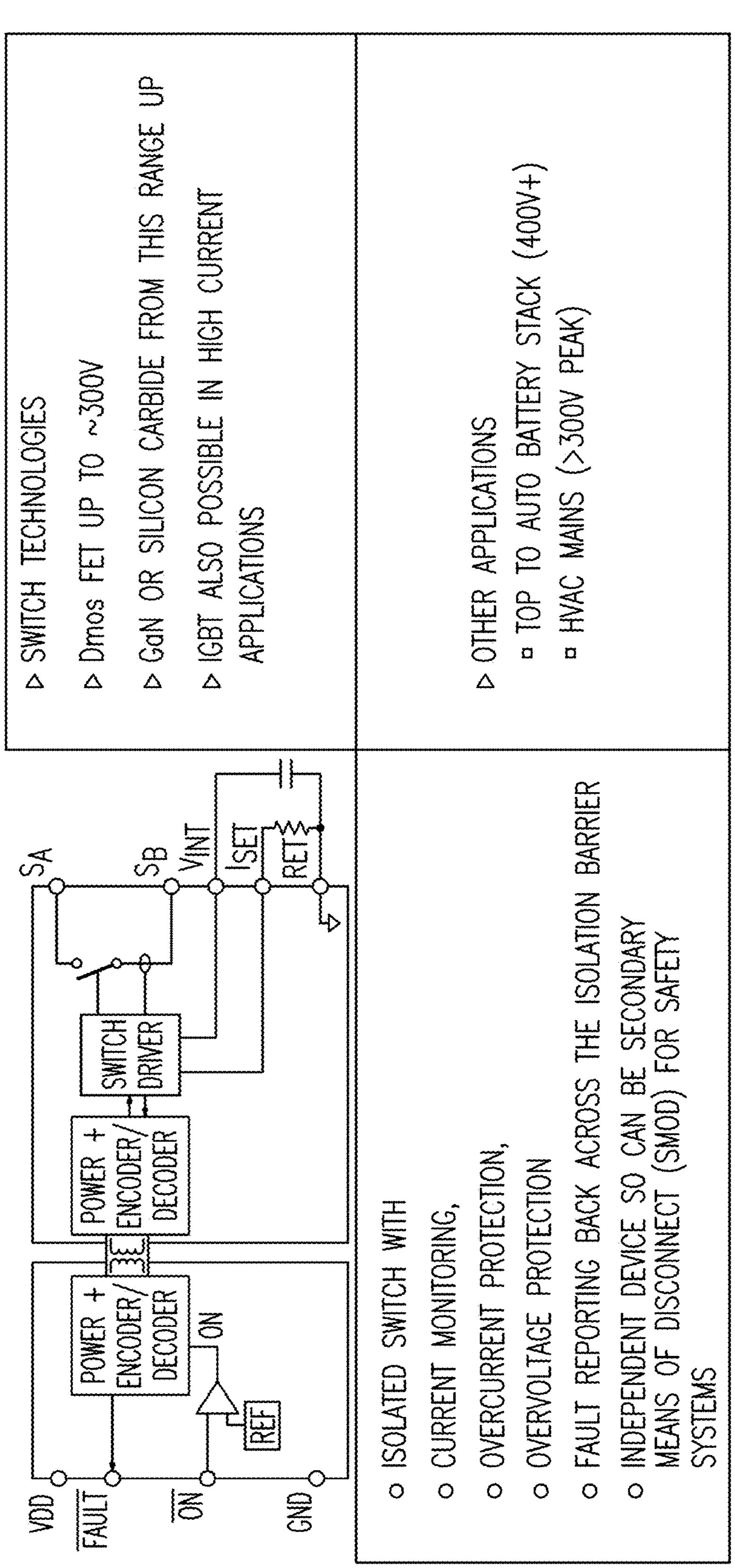
FIG. 65 schematically illustrates an example isolated protection switch.

In some implementations, a switch used in the protection module of the energy management system shown in FIG. 55, the EV charging system shown in FIG. 56, or the protection circuits 6401, 6402, may comprise an alternative isolated protection switch. An example of an isolated protection switch is shown in FIG. 65.

Example Sensor Elements

In various implementations, the devices in the sensing module of the energy management system shown in FIG. 55 can be linked to the energy management module and/or the predictive maintenance module of the energy distribution node using a wired or wireless link to transmit a sensor data. In some examples, wired or wireless link can be an encrypted link. Upon receiving sensor data, the energy management module may initiate an action (e.g., for functional safety) and/or the predictive maintenance module may initiate a process for predictive maintenance.

In various implementations, an EOS monitor device used in the sensing module of the energy management system shown in FIG. 55 (or the EV charging system shown in FIG. 56), may comprise an of the vertical spark gap devices described above, a lateral spark gap device, or other EOS monitor devices. In some cases, multiple EOS monitor devices may be positioned at multiple points of the energy management system shown in FIG. 55. In various implementations, EOS monitor device can be linked to the energy management module and/or the predictive maintenance module of the energy distribution node using a wired or wireless link to transmit a recorded EOS event. In some examples, wired or wireless link can be an encrypted link. Upon receiving data associated with an EOS event (from the EOS monitor), the energy management module may flag the EOS event to initiate an action for functional safety and/or the predictive maintenance module may initiate a process for prognostic predictive maintenance. In some embodiments, the energy management system 5500 may use Artificial Intelligence to monitor the different sensing inputs and data generated to enable optimal operational efficiency and safety.

Figure 61B:
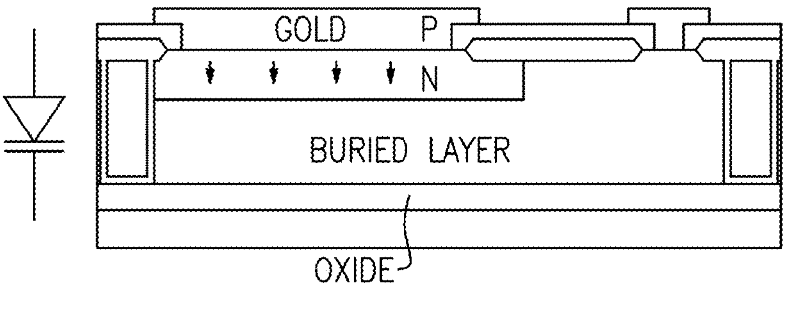
FIG. 61B schematically illustrates an example exposure monitor device.

In some embodiments, the sensing module of the energy management system shown in FIG. 55 or the EV charging system shown in FIG. 56 may comprise an exposure monitor device used as a condition-based device. An example of an exposure monitor device is shown in FIG. 61B. In some embodiments, an exposure monitor may monitor cumulative temperature exposure. In some embodiments, an exposure monitor can be intermittently examined to make decisions regarding predictive maintenance.

In various implementations, an exposure monitor device may transmit a recorded threshold of cumulative exposure to the energy management module and/or the predictive maintenance module of the energy distribution node the where the sensor data can be flagged to initiate an action.

FIG. 66 illustrates an example electric field (e.g., electrostatic electric field) sensor/detector that may be used in the sensing module of the energy management system shown in FIG. 55 or the EV charging system shown in FIG. 56.

Figure 67:
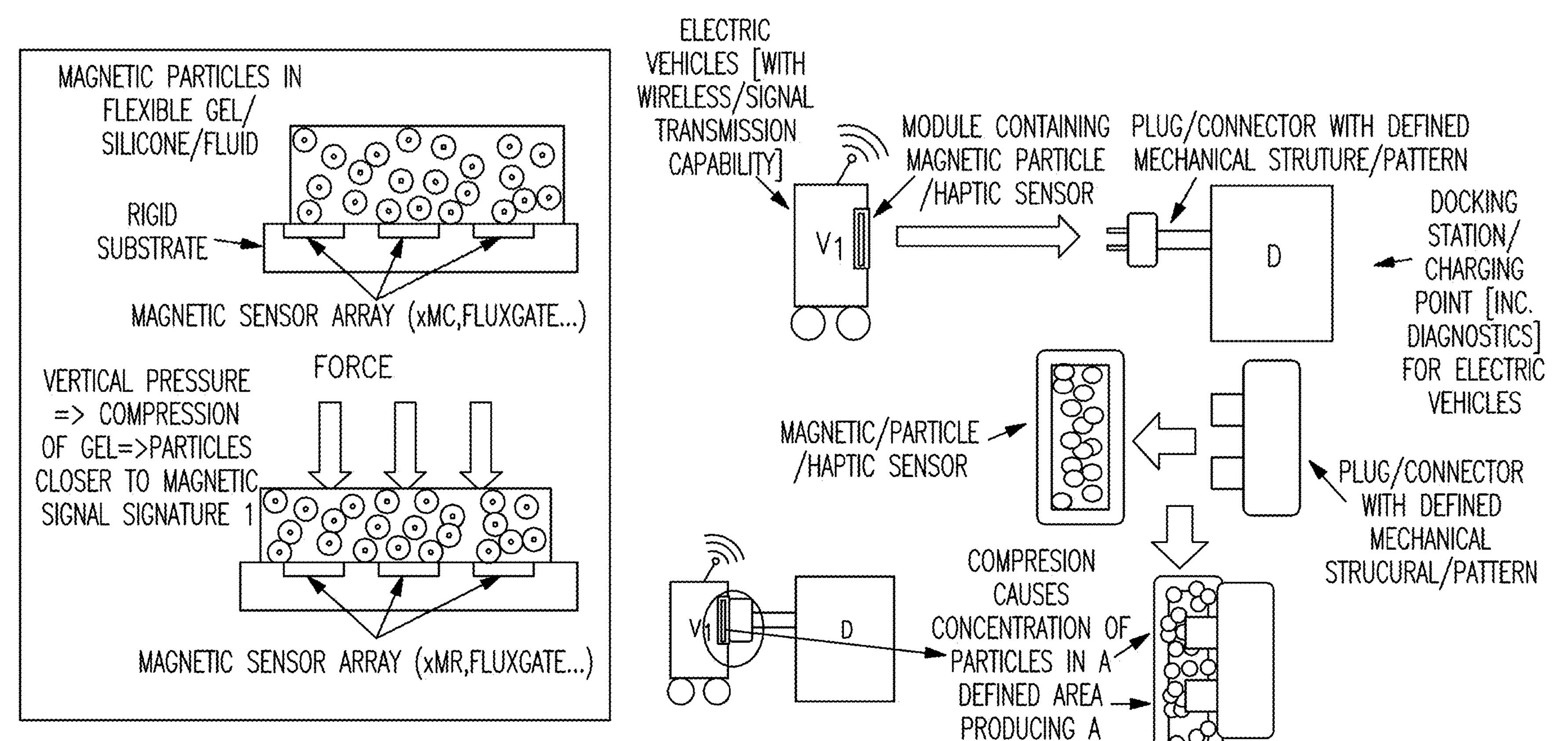
FIG. 67 schematically illustrates an example magnetic sensor that may be to control and/or facilitate inter-module connection in an energy management system.

FIG. 67 illustrates an example magnetic sensor that may be used in the sensing module of the energy management system shown in FIG. 55 or the EV charging system shown in FIG. 56. In some examples, a magnetic sensor may be used to engage and/or connect to charging points or conduits of the charging system with those of the energy storage system. For example, the magnetic sensor shown in FIG. 67 may be used to navigate a robotized charging plug (e.g., connected to an EV) toward a connection point (an energy outlet) of a docking station. In some cases, when a plug of the EV is fully engaged and connected to the connection point of the docking station, the magnetic sensor may generate a charge initiation signal indicating that the plug is 360 degrees connected and there are no gaps and that charging can begin. The charge initiation signal may further indicate that connections to the docking station system are safe. Upon receiving the charge initiation signal the docking station may provide electric energy to the EV.

Figure 68:
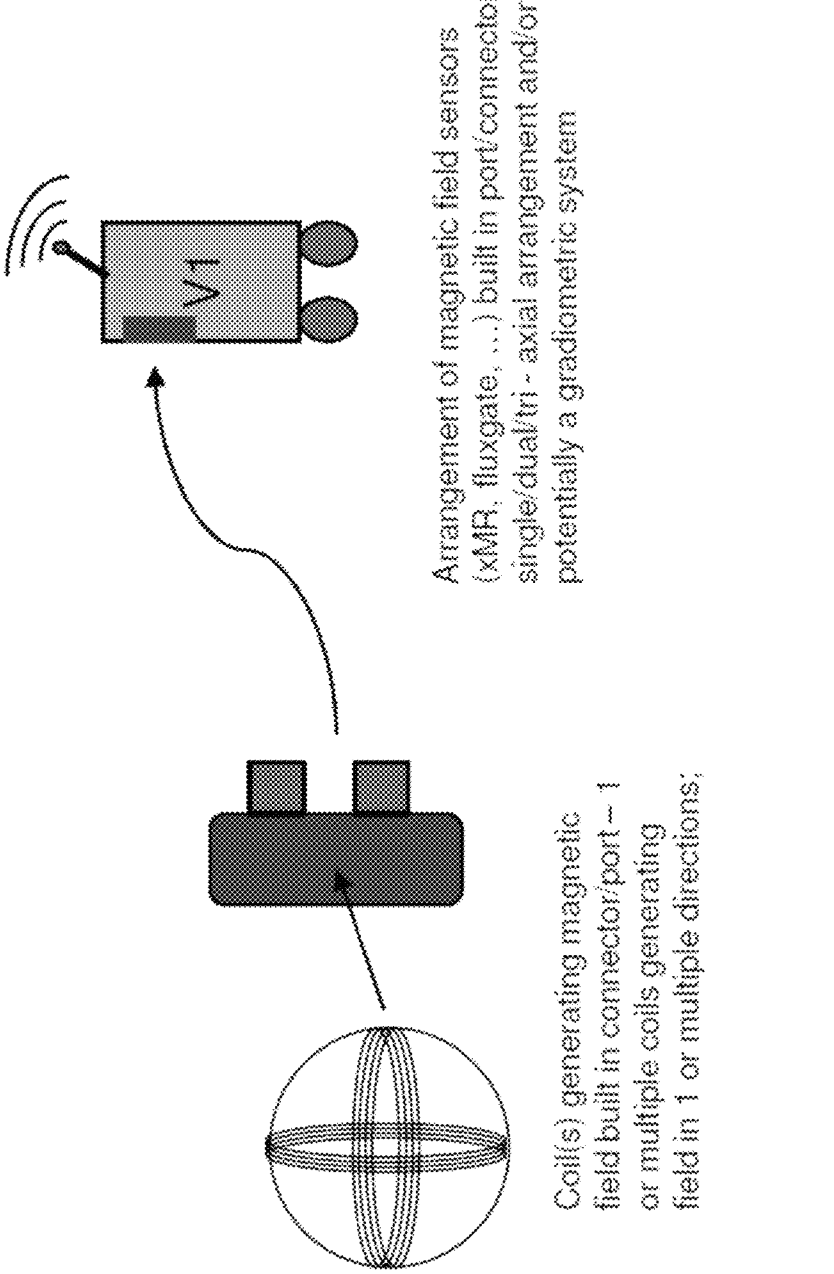
FIG. 68 schematically illustrates a connector navigation system based on the magnetic sensor shown in FIG. 67.

As an example of a magnetic connector navigation system configured to navigate a connector toward a charging port using a magnetic sensor is shown in FIG. 68. In some examples, the magnetic connector navigation system may comprise one or more magnetic sensors and magnetic field generating coils. In some cases, a magnetic connector navigation system may use alternating magnetic fields and synchronous detection to avoid interferences from geomagnetic fields and nearby electric currents or ferromagnetic objects. In some implementations, in addition to navigating the connector to a charging port and, the magnetic connector navigation system may verify a correct position of the connector before an electric contact is made between the connector and the charging port (e.g., it may determine whether the connector is fully plugged or not).

In various implementations, various types of sensors (e.g., condition-based sensors) may be included in an energy management system (e.g., the energy management system shown in FIG. 55) to monitor the health and/or condition of components, devices, circuits, and/or modules of the energy management system. Examples of such sensors include vibrational sensors (e.g., monitoring mechanical/moving parts/bearings and the like), temperature sensors, particle detectors (e.g., for monitoring dust/metal particle content in fluid), PH sensors, gas sensors, mileage and revolution per minute (RPM) sensors (e.g., for monitoring EVs). In some cases, sensor data or sensor signal generated by a sensor (e.g., a condition-based monitoring sensors) may be used to adjust protection devices to different needs of an energy management system (e.g., an EV management system). In some examples, sensors such as temperature sensor, vibration sensor, magnetic sensor can be incorporated in an EV charging system for detection of metal particles in a fluid (e.g., oil) suggesting potential oil change or failure of a system (e.g., in a transmission system or brake system, actuators, air-conditioning system, switch gear, or other systems of an EV charging system). In some embodiments, the energy management system 5500 may use Artificial Intelligence to monitor the different sensing inputs and data generated to enable optimal operational efficiency and safety.

In some embodiments, the protection devices of an energy management system may provide static protection based on a parameter value (e.g., a voltage) exceeding a threshold value. In some embodiments, the protection devices of an energy management system may provide adaptive protection where a threshold value can depend on the specific device or circuit protected. For example, a threshold based on which the protection device is configured to be triggered is adaptively determined based on the device, circuit, or system that is being protected (e.g., an EV or element that is charged, a personal battery charger, a small car, a truck, and the like). For example, a parameter of the protection device may be atomically adjusted based on a device or system connected to the energy management system. In some embodiments, an EV management system may comprise a first protection stage that provides static protection and a second protection stage that provides adaptive or dynamic protection. In some embodiments, a protection stage may provide adaptive or dynamic protection based at least in part on a sensor signal received from a sensor in the sensing module of the energy management system.

Figure 69:
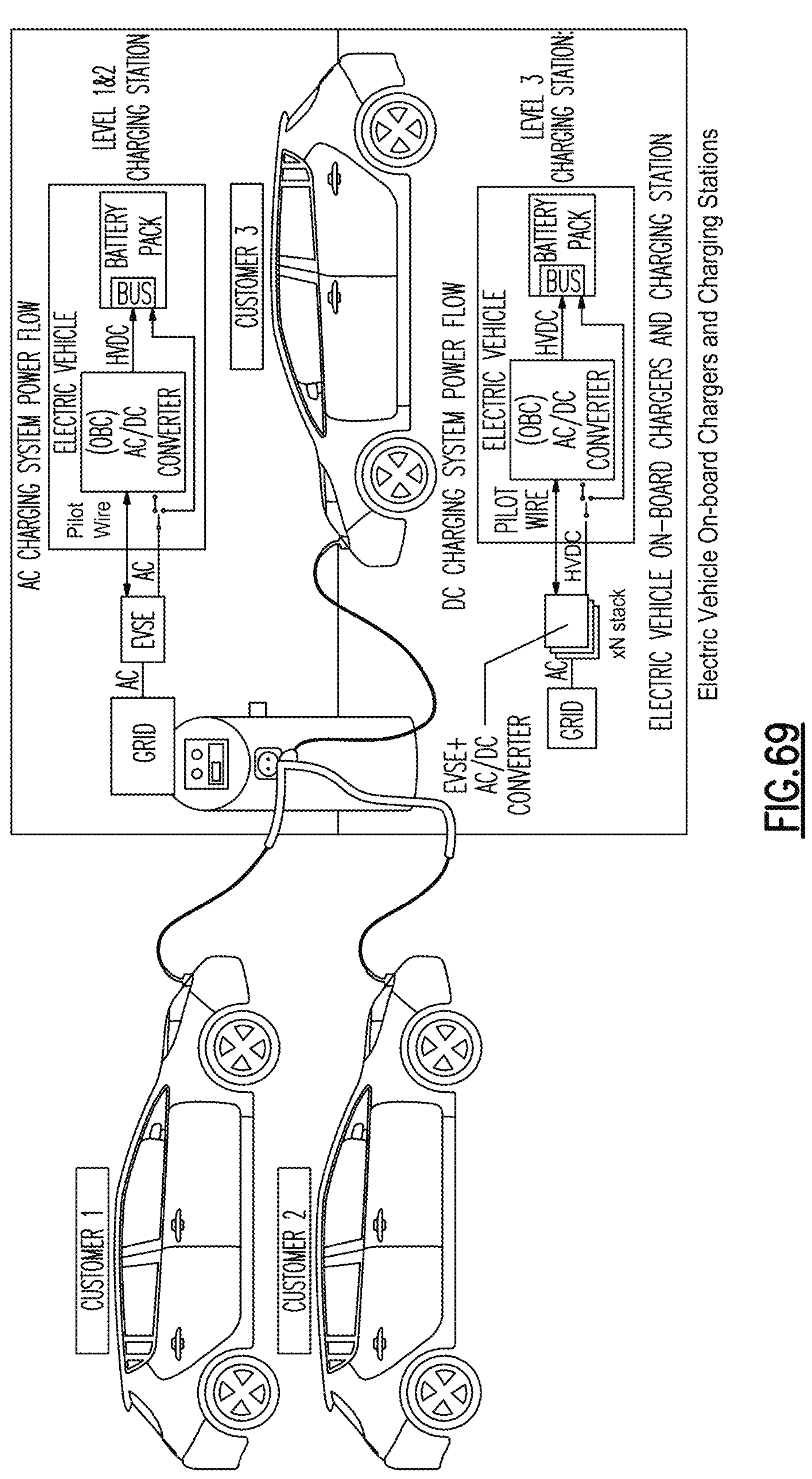
FIG. 69 schematically illustrates a prioritized charging scenario for an EV charging system.

In some embodiments, sensing and protection modules of an EV management system may be configured to enable prioritizing charging in an EV charging system such that when a customer is willing to pay a primum to receive a faster charge. An example of such scenario is show in shown in FIG. 69. In the example shown, customers 1 and 2 can be plugged in a charging station and they pay a standard rate for the charge. Customer 3 arrives and is in a hurry and is willing to pay a premium (or has a premium account) for faster charging. As such charge may be diverted to customer 3 providing a shorter charging time at a higher cost.

Communication Between Docking Station and EV

Figure 70:
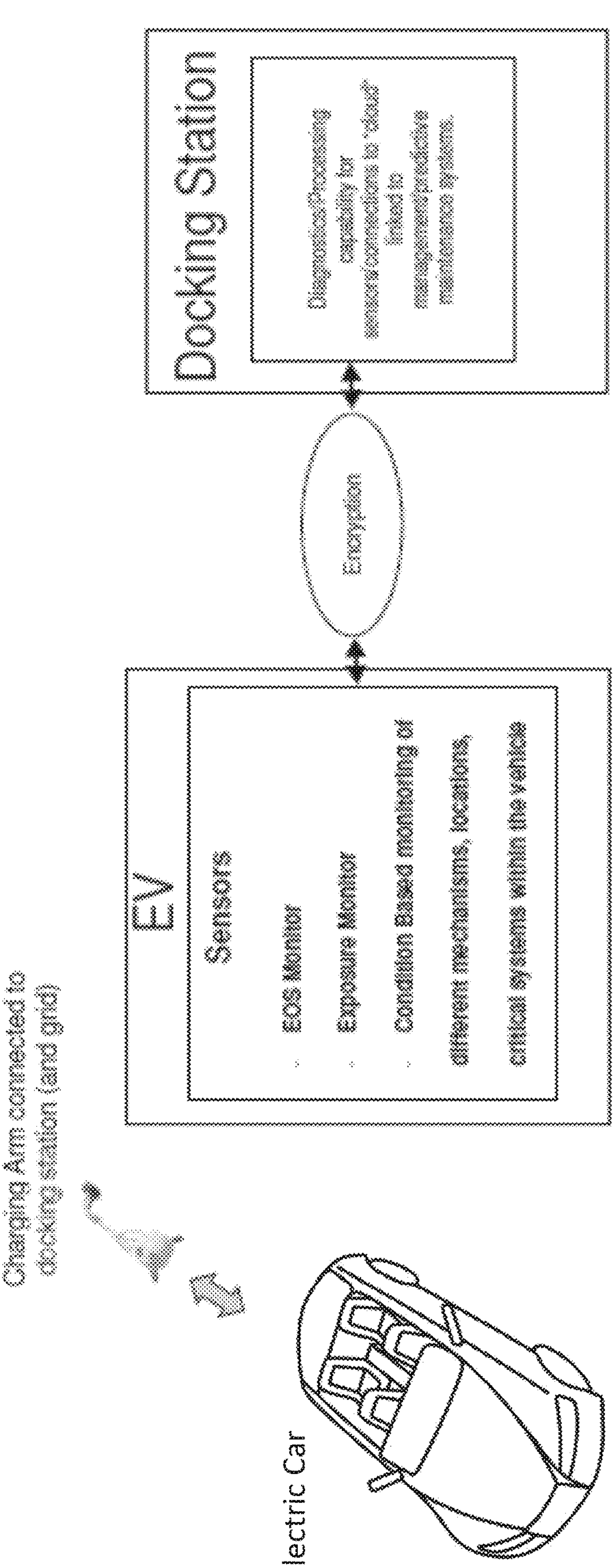
FIG. 70 schematically illustrates communication between an EV and a docking station.

FIG. 70 illustrates communication between an EV and a docking station (charging system). In some examples, two-way communication may be established between the EV and the docking station via wired or wireless link. Using these communication links, real time data can be gathered on vehicle operation and performance, available charging time of docking station can be monitored and managed, sensors within the EV can upload data (e.g., encrypted data) during charging, diagnostic tasks may be performed, and potential problems may be flagged (e.g., using prognostic preventive maintenance algorithms). In some cases, one or more sensors (in the EV or the docking station) may monitor systems within the EV to determine cumulative wear and evaluate performance of a system, monitor the overall condition of the EV, and prompt service interventions. In some cases, a charging slot of the docking station can be booked, sequenced or scheduled, e.g., according to load balancing algorithm or plan. For example, an availability of a charging slot and/or energy transfer rate from a selected slot may be determined based at least in part on a charge deficit in the EV. In some embodiments, the energy management system 5500 may use Artificial Intelligence to monitor the different sensing inputs and data generated to enable optimal operational efficiency and safety.

Mutual Authentication Between EV and EV Service Equipment

In some examples, third party charging components (e.g., EV connection or EV Service Equipment or Docking Station) can circumvent safety precautions to provide certain desirable features, e.g., faster charging. This may result in faster battery degradation, circuit overload, or catastrophic failure of the system resulting in serious injury to users. In some cases, to prevent connections with potentially unsafe non-certified components, the EV and docking station may perform a mutual authentication process to establish that the EV and docking station (or the respective charging modules) each is an appropriately certified component.

In some embodiments, each component may include a public-private key pair representing its identity and configured to establish public key cryptography (or asymmetric cryptography). The public key may be signed by an independent certifying body to attest that the product conforms to appropriate safety standards and protocols. Each component may include their own local copy of one or more public keys from independent certifying bodies. Public keys of components passing the independent certifying authority can be digitally signed by the certifying body. The digital signature may be implemented using, e.g., RSA, elliptic curves, post-quantum cryptographic algorithms, or lightweight cryptographic algorithms. Before establishing a charging or diagnostic connection, the components of the EV and docking station can mutually authenticate one another. This may be performed by, e.g., a challenge-response signature protocol or a zero-knowledge proof protocol.

Figure 71:
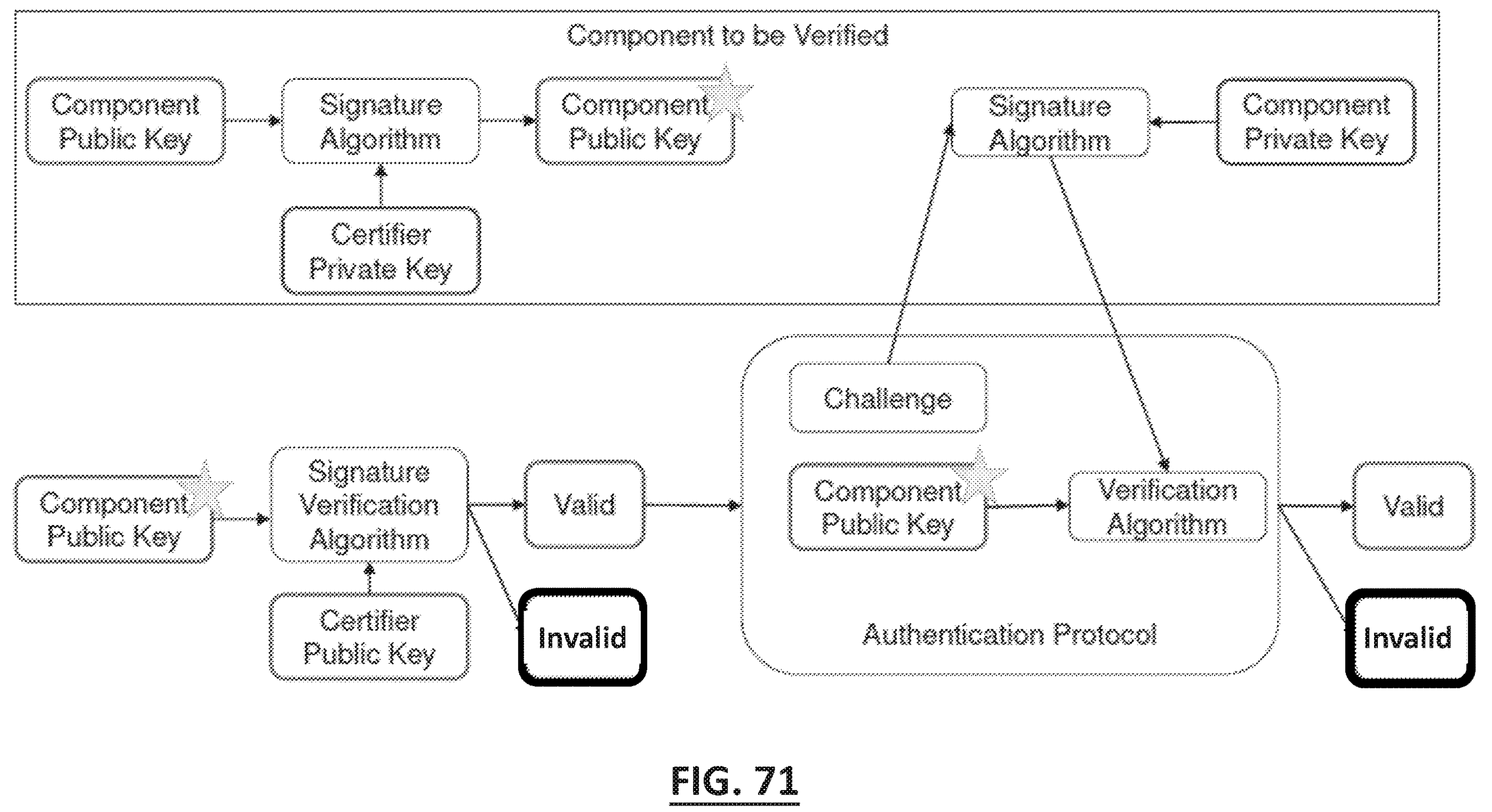
FIG. 71 is a block diagram illustrating a mutual authentication process between an EV and a docking station.

FIG. 71 is a block diagram illustrating mutual authentication process between an EV and a docking station described above. In some cases, an adversary who has physical access to a charging system or a charging component, may leverage invasive (e.g., probing) or noninvasive (e.g., power/EM/timing side-channel) attacks to extract the private key of an authentic certified component. The extracted key could then be copied into non-certified components to successfully complete the authentication protocol despite the component not conforming to safety standards and protocols.

In some embodiments, to protect against such invasive key extractions, a physical unclonable function (PUF) may be used. For example, rather than storing a key in NVM/eFuses, a PUF may enable dynamic regeneration of cryptographic keys by using the certain physical properties of the individual chip. In some cases, probing attempts may alter these physical characteristics, which prevents the subsequent regeneration of the key. In some examples, cryptographic algorithms may incorporate mitigations against side-channel attacks. For example, using dual-rail designs to eliminate fluctuations in power consumption or using Montgomery ladders to avoid timing attacks that exploit optimized number theoretic operations.

Integrity of Log Events

In some cases, warranty of charging components may be voided when exposed to conditions outside of normal parameters (e.g., EOS events). In some such cases, a user may attempt to alter logs of these events in order to make a successful warranty claim.

In some embodiments, when an event occurs (e.g., an EOS is detected using a spark gap), a log entry capturing the state of the system and other relevant parameters may be generated (e.g., time, date, event type, environmental parameters, etc.). To prevent the log entry from being modified, the charging component may add a cryptographic message authentication code (MAC) or digital signature over the log entry. Modifications to the log entry will prevent the MAC or digital signature from properly validating. In some cases, authenticated encryption with associated data (AEAD) constructions may be used to provide integrity protection, or optionally both confidentiality and integrity protection if the log content itself should not be viewable by unauthorized parties.

Figure 72:
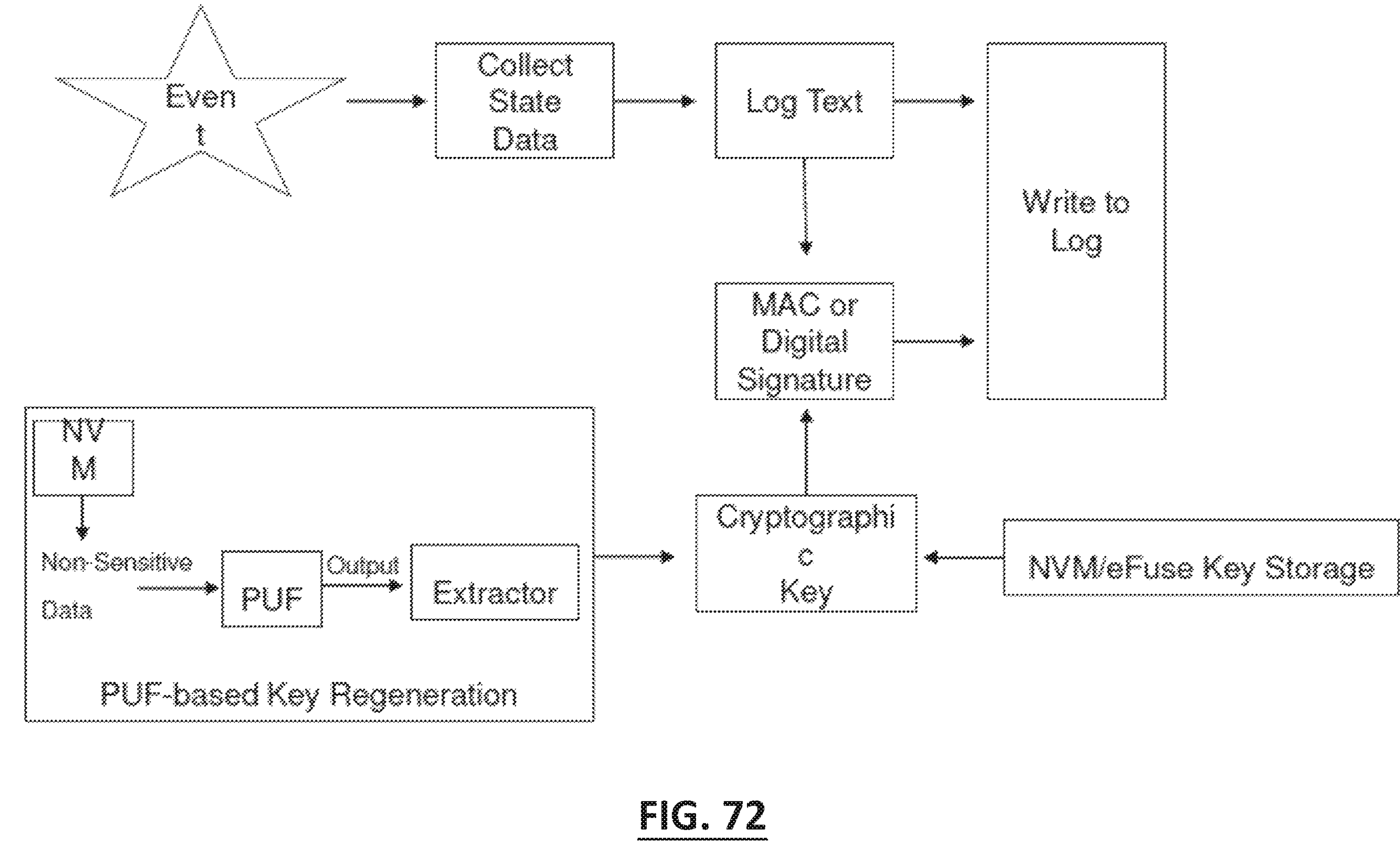
FIG. 72 is a block diagram illustrating an example system configured to maintain integrity of data transferred between an EV and a docking station.

FIG. 72 is a block diagram illustrating an example system configured to provide integrity of data (e.g., log data) transfer between an EV and a docking station.

EOS Data Transmission

In some cases, a system can be constructed using components within a substrate enabling multiple functions sensing systems, including EOS Monitoring. An example of added functionality to a sensor can include one or more of a processor, a communication circuitry, inductive coils, or RFID structures. In an example, a multiple function sensing system can wirelessly communicate information on detection of one or more materials or when respective threshold levels of certain materials are detected. In certain examples, processing electronics can include an application specific integrated circuit (ASIC) die to be used with customized sensing substrates depending on the specific application. Customized systems on a chip can be constructed using an ASIC, with customized substrates mounted on top of the ASIC that can allow for various combinations of sensors, sensor arrays, processing circuitry, discrete components etc. as desired. In certain examples, instead of having external terminations from the processing electronics to communicate sensor information, the substrate can include an antenna to wirelessly communicate the sensor information. In some examples, a companion communication device can be placed near the sensor to wirelessly exchange information with the sensor. In certain examples, the sensor can include a battery, capacitor, or some other energy storage device to supply power to the electrode and the processing electronics. In some examples, energy can be wirelessly transferred to the sensor. In certain examples, the sensor can be placed in one or more locations that are not practical for wired EOS monitor/sensors. In certain examples, the sense information can be processed by the active electronics of the substrate among other information can be provided via wired or wireless media. In certain examples, the indication can be an analog signal, a digital signal or a combination of analog and digital signals. Measurement data generated by the EOS monitoring system (such as the specific values/readings/thresholds etc.) can be encrypted to protect the integrity or functional safety of the system. In certain examples, encryption can be accomplished via processing electronics integrated on the substrate of the electrodes of the sensor. Encryption may be accomplished via software, firmware or hardware to ensure that the measurement information is not compromised.

Figure 73:
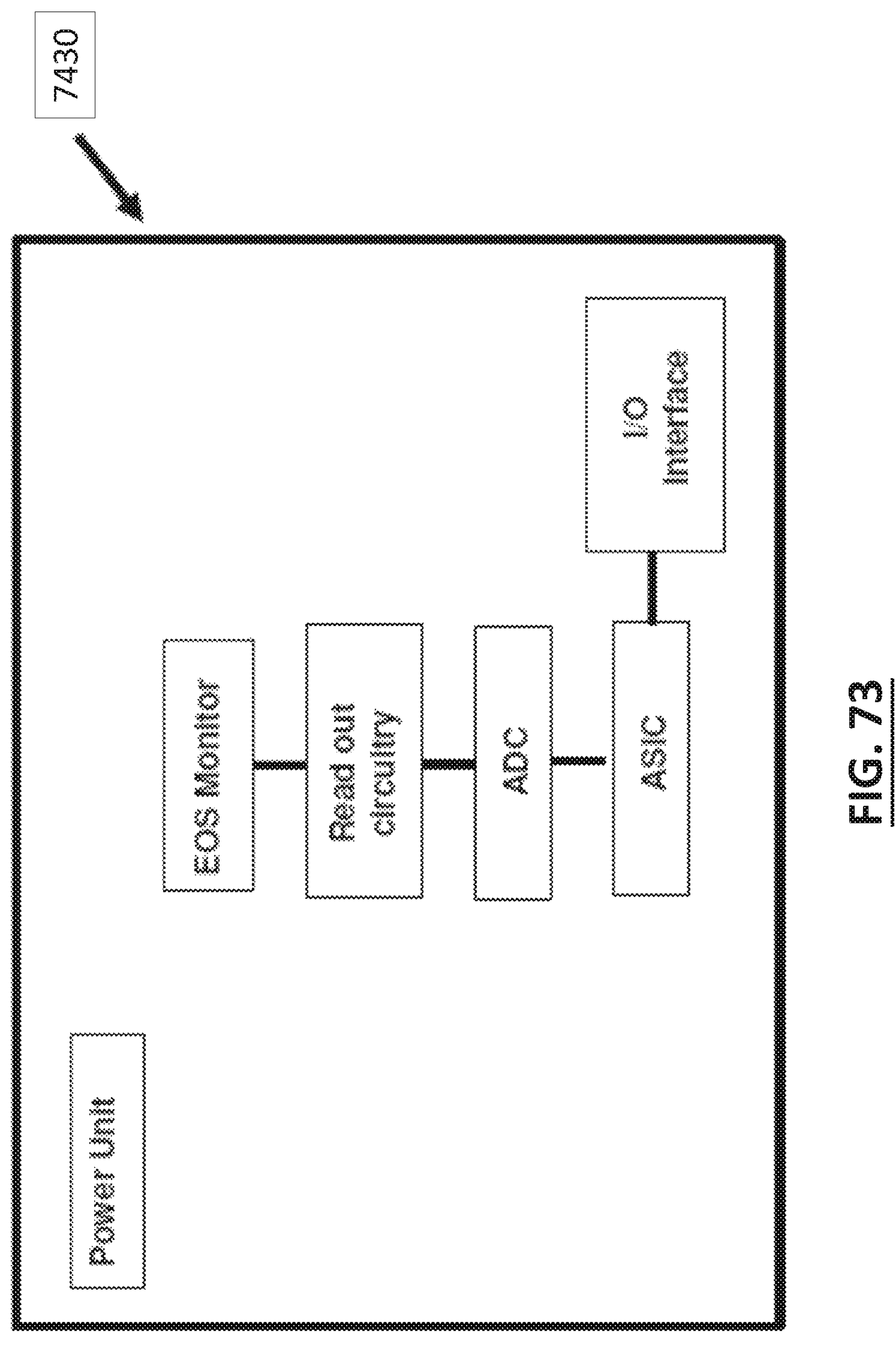
FIG. 73 is a block diagram illustrating an example system incorporating an EOS monitor device that can be incorporated within a charge management system.

FIG. 73 is a block diagram illustrating an example system incorporating an EOS monitor device (e.g. a vertical spark gap structure) that can be incorporated within a charge management system.

Figure 74:
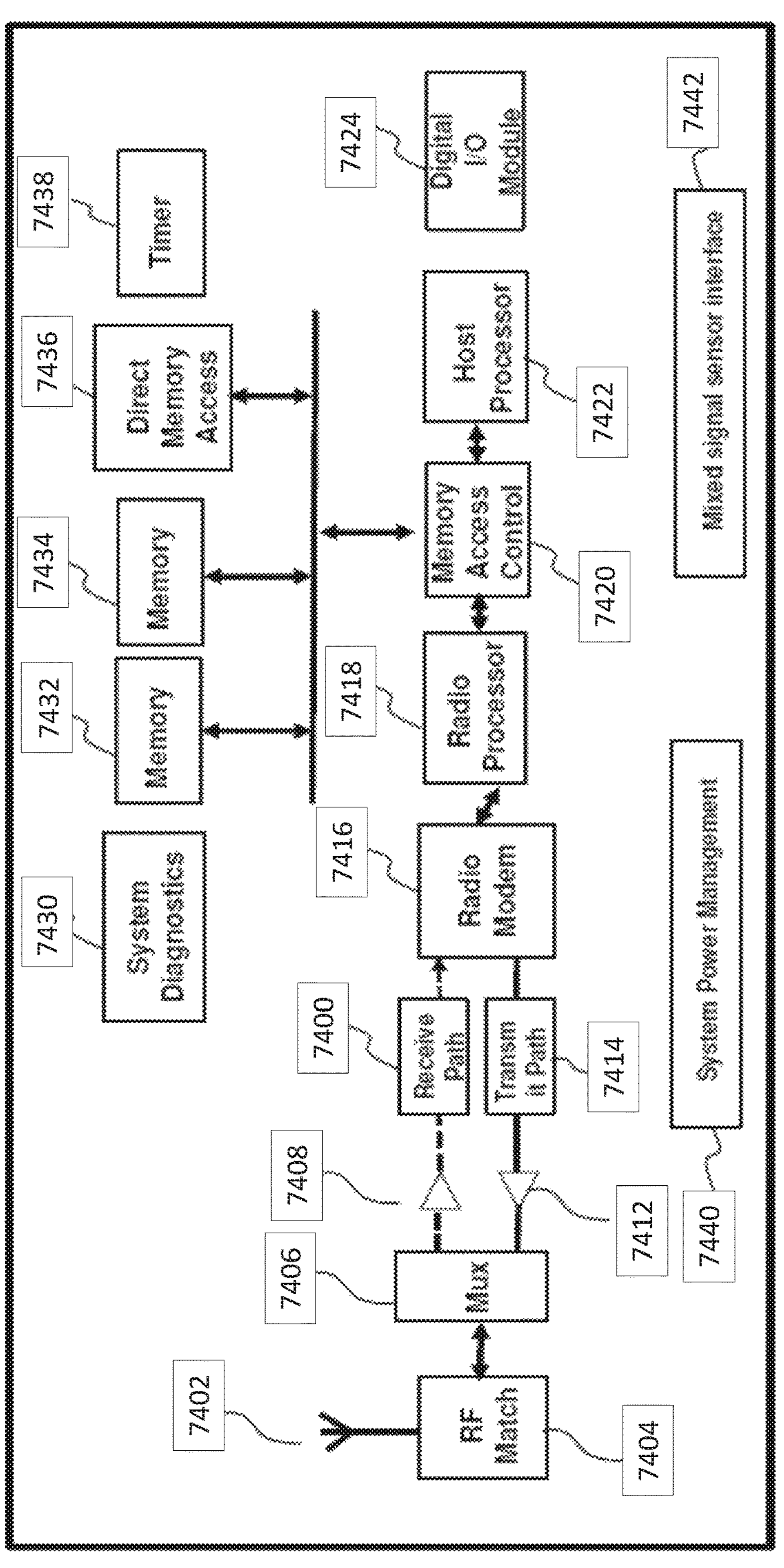
FIG. 74 is a block diagram of an exemplary implementation of an input/output (I/O) interface incorporating an EOS monitor/protection device and configured to transmit EOS data generated by the EOS monitor device from a protection module to another module or system.

FIG. 74 illustrates a block diagram of an exemplary implementation of an I/O interface incorporating an EOS monitor device (e.g., a vertical spark gap device) configured to transmit EOS data generated by the EOS monitor device from a protection module to another module or system. The wireless input/output (I/O) interface shown in FIG. 74 may be configured to transmit and/or receive data via Wi-Fi, Bluetooth, Bluetooth Low Energy (BLE), Zigbec, Thread, ANT, ANT+, IEEE 802.15.4, IEEE 802.11.ah, or any other suitable wireless communication protocol.

Alternatively, or additionally, wireless I/O interface may be configured to transmit and/or receive data using proprietary connectivity protocols. Wireless I/O interface 7400 may comprise an antenna 7402, an RF match 7404, a multiplexer (mix) 7406, amplifiers 7408 and 7412, receive path 7410, transmit path 7414, radio modem 7416, radio processor 7418, memory access control 7420, host processor 7422, digital I/O module 7424, system diagnostics 7430, memories 7432 and 7434, direct memory access 7436, timer 7438, system power management 7440, mixed signal sensor interface 7442, or any suitable combination thereof. Antenna 7402 may comprise a microstrip antenna, a loop antenna, a slot antenna, a serpentine-shaped antenna, or any other suitable type of antenna. In some embodiments, antenna 7402 may comprise one or more carbon nanotube antennas. RF match 7404 may be connected to antenna 7402, and may comprise circuitry configured to provide impedance matching, and/or to provide a desired impedance. Multiplexer (mux) 7406 may be configured to combine and/or separate communication channels in the time domain and/or in the frequency domain. Alternatively, or additionally, multiplexer 7406 may be configured to separate transmit signals directed to antenna 7402 from receive signals obtained by antenna 7402. Amplifier 7408 may be configured to amplify a signal received with antenna 7402. In some embodiments, a receive path 7410 may be provided and may be coupled to amplifier 7408. Receive path 7410 may comprise a filter in some embodiments. Similarly, transmit path 7414 may comprise a filter, and may be configured to provide a transmit signal to amplifier 7412. Radio modem 7416 may comprise circuitry configured to modulate a signal for transmission, and/or demodulate received signals. Radio processor 7418 may be configured to select the type of communication protocol, the data rate, the communication channel, the type of data to be transmitted, or any other suitable transmission parameter. The data to be transmitted may be stored within memory 7432 or memory 7434. Radio processor 7418 may be configured to access the data stored in any of the memories of wireless I/O interface 7400. Memory access control 7420 and direct memory access 7436 may be configured to access any of the memories of wireless I/O interface 7400 independently of radio processor 7418. For example, the host processor may request access to the memory using direct memory access 7436 without having to send an interrupt signal to radio processor 7418. Host processor 7422 may be configured to control the operations of wireless I/O interface 7400. For example, the host processor may control system power management 7440 to place the wireless I/O interface in sleep mode, thus increasing battery's lifetime. The I/O interface may be placed in sleep mode at certain predetermined times. In some embodiments, an I/O interface may be placed in a sleep mode, and may wake up at regular intervals, such as once a second, to monitor if a device, such as ASIC 1010, has provided a wake-up signal. ASIC 1010 may be configured to provide wake up signals when a sensor, such as accelerometer has detected a signal or a signal variation. In some embodiments, the sleep/awake duty cycle may be less than 50%, less than 20%, less than 1% or less than 0.1%.

In some embodiments, host processor 7422 may be configured to perform data compression on the data obtained by a sensor, such as an EOS Monitor. For example, compression may comprise creating a data set representing the variations in an existing data set. The compression may be performed to decrease the size of the packet, or sequence, to be transmitted. Timer 7438 may provide a time base to wireless I/O interface 7400. System diagnostics 7430 may be configured to perform tests to verify the integrity of any suitable combination of the components of wireless I/O interface 7400. Mixed signal sensor interface 7442 and digital I/O module 7424 may be configured to provide signals obtained from one or more EOS Monitors. In some embodiments, wireless I/O interface 7400 may be configured to transmit a continuous flux of data. In such embodiments, data obtained by a sensor, such as an EOS monitor may be transmitted in a streaming mode. In other embodiments, data may be buffered within a memory of the I/O interface, for example memory 7432 or 7434. In such embodiments, a processor, such as radio processor 7418 or host processor 7422 may be configured to access the data buffered in the memory, and to provide the data to antenna 7402 for transmission. Antenna 7402 and/or any suitable component of wireless I/O interface 7400 may be disposed on a substrate in some embodiments, such as a flexible substrate.

Figure 75:
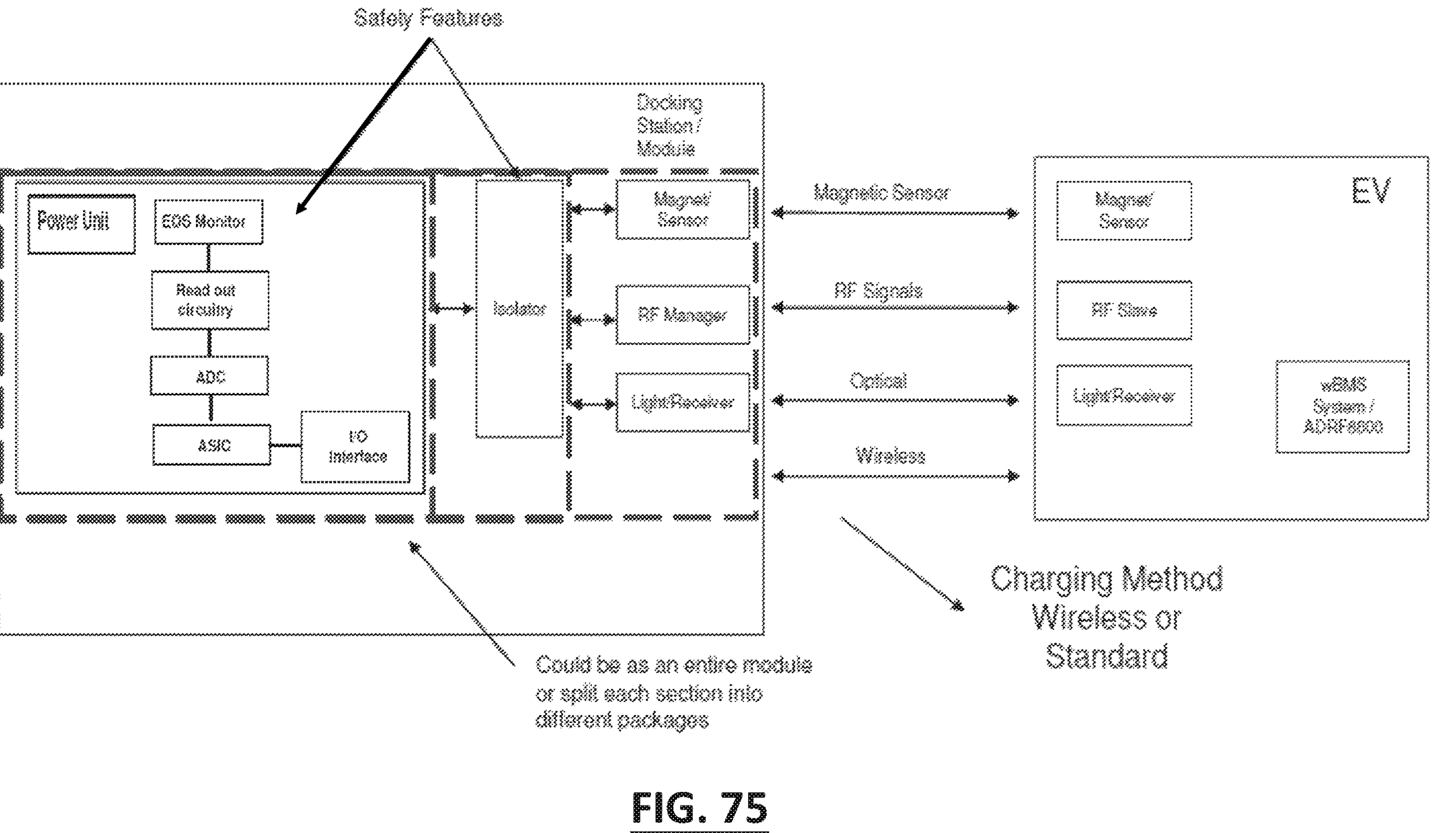
FIG. 75 is a block diagram illustrating a charging system of an EV, a charging system of a docking station and connections between the two charging systems.

FIG. 75 is a block diagram illustrating a first charging system of an EV, a second charging system of a docking station/module, and connections between the first and second charging systems.

Figure 76:
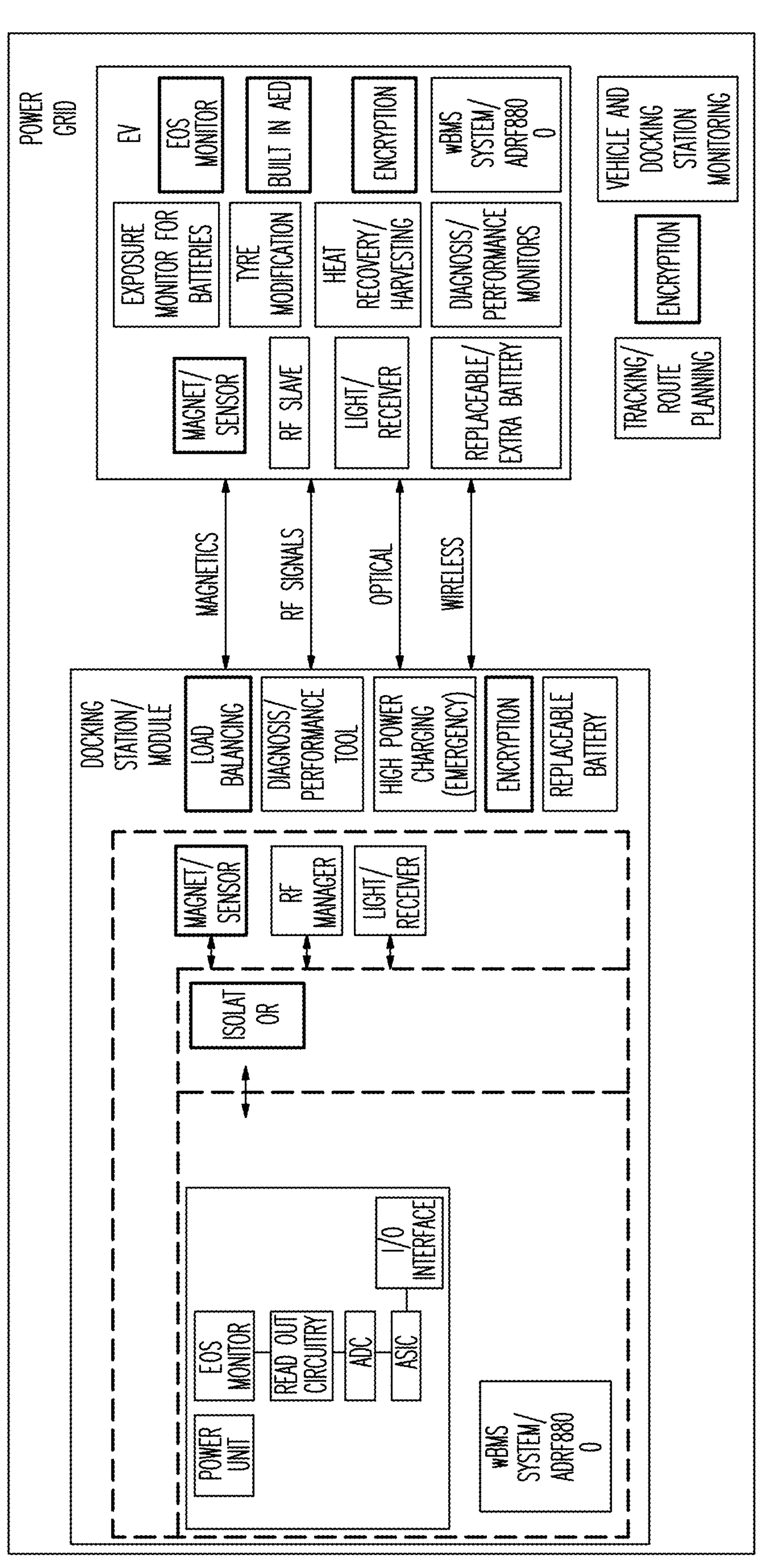
FIG. 76 is a block diagram illustrating a docking station, a power grid, and connections between the docking station and the power grid.

FIG. 76 is a block diagram illustrating a docking station/module, a power grid, and connections between the first and docking station/module and the power grid.

EXAMPLE EMBODIMENTS

Various additional example embodiments of the disclosure can be described by the following clauses:

Examples I

Example 1. An electrical overstress (EOS) monitor or protection device comprising:

a substrate having a horizontal main surface; and a first conductive layer and a second conductive layer each extending over the substrate and substantially parallel to the horizontal main surface while being separated in a vertical direction crossing the horizontal main surface, wherein one of the first and second conductive layers is electrically connected to a first voltage node and the other of the first and second conductive layers is electrically connected to a second voltage node, and wherein the first conductive layer and the second conductive layer serve as one or more arcing electrode pairs and have overlapping portions configured to generate one or more arc discharges extending generally in the vertical direction in response to an EOS voltage signal received between the first and second voltage nodes.

Example 2. The EOS monitor or protection device of Example 1, further comprising a third conductive layer formed above the first and second conductive layers and configured to serve as the first voltage node electrically connected to the first conductive layer.

Example 3. The EOS monitor or protection device of Example 2, further comprising a fourth conductive layer formed above the first and second conductive layers and configured to serve as the second voltage node electrically connected to the second conductive layer.

Example 4. The EOS monitor or protection device of Example 3, wherein the third conductive layer serves as a bond pad and laterally covers each of the first, second and third conductive layers.

Example 5. The EOS monitor or protection device of Example 1, wherein first and second conductive layers are separated by an intermetal dielectric layer formed between the overlapping portions to serve as an arcing medium.

Example 6. The EOS monitor or protection device of Example 1, wherein one or both of the first and second conductive layers comprise a rectangular ring or pad.

Example 7. The EOS monitor or protection device of Example 1, wherein one or both of the first and second conductive layers comprise a circular ring or pad.

Example 8. The EOS monitor or protection device of Example 1, wherein one of the first and second conductive layers comprise a corner region laterally extending over and overlapped by the other of the first and second conductive layers.

Example 9. The EOS monitor or protection device of Example 1, wherein one of the first and second conductive layers comprise a rectangular region laterally extending over and overlapped by the other of the first and second conductive layers.

Example 10. An electrical overstress (EOS) monitor or protection device comprising:

a substrate having a horizontal main surface;

a first conductive layer and a second conductive layer each extending over the substrate and laterally overlapping each other while being separated in a vertical direction crossing the horizontal main surface by an intermetal dielectric formed therebetween; and a third conductive layer formed above the first and second conductive layers and electrically connected to the first conductive layer by one or more conductive vias, wherein an EOS voltage between the third conductive layer and the second conductive layer generates an arc discharge extending generally in the vertical direction between overlapping portions of the first and second conductive layers.

Example 11. The EOS monitor or protection device of Example 10, wherein each of the first, second and third conductive layers are formed as part of one of a plurality of vertically separated metallization levels, wherein adjacent ones of the metallization levels are vertically separated by a via.

Example 12. The EOS monitor or protection device of Example 11, wherein the first conductive layer and the third conductive layer are vertically separated by at least another one of the metallization levels in addition to the metallization level having formed the second conductive layer formed therein.

Example 13. The EOS monitor or protection device of Example 12, wherein the at least another one of the metallization levels comprises a fourth conductive layer electrically connected to the second conductive layer.

Example 14. The EOS monitor or protection device of Example 10, wherein the one or more conductive vias comprise a bundle of vias.

Example 15. An electrical overstress (EOS) monitor or protection device comprising:

a substrate having a horizontal main surface;

a first conductive layer and a second conductive layer each extending over the substrate and laterally overlapping each other while being separated in a vertical direction crossing the horizontal main surface by an intermetal dielectric formed therebetween; and a third conductive layer formed above the first and second conductive layers and configured to receive an EOS voltage signal relative to an electrical ground, wherein the first conductive layer is electrically connected to the third conductive layer and the second conductive layer is electrically connected to the electrical ground such that the EOS voltage signal causes arcing between the first and second conductive layers generally in the vertical direction between overlapping portions of the first and second conductive layers.

Example 16. The EOS monitor or protection device of Example 15, wherein the third conductive layer has a footprint larger than and entirely overlapping each of the first and second conductive layers.

Example 17. The EOS monitor or protection device of Example 16, wherein one of the first and second conductive layers has a footprint larger and entirely overlapping the other of the first and second conductive layers.

Example 18. The EOS monitor or protection device of Example 16, wherein one of the first and second conductive layers only partly overlaps the other of the first and second conductive layers.

Examples II

Example 1. An electrical overstress (EOS) monitor or protection device comprising:

a substrate having a horizontal main surface; and a first conductive layer and a second conductive layer each extending over the substrate and substantially parallel to the horizontal main surface while being separated in a vertical direction crossing the horizontal main surface, wherein one of the first and second conductive layers is electrically connected to a first voltage node and the other of the first and second conductive layers is electrically connected to a second voltage node, and wherein the first conductive layer comprises a plurality of arcing tips configured to form arcing electrode pairs with the second conductive layer to form an arc discharge in response to an EOS voltage between the first and second voltage nodes; and a series ballast resistor defined in the first conductive layer and electrically connected between each of the arcing tips and the first voltage node, wherein a resistance of the series ballast resistor is substantially higher than a resistance of the second conductive layer.

Example 2. The EOS monitor or protection device of Example 1, wherein the arc discharge generally occurs in the vertical direction between one or more of the arcing tips and the second conductive layer.

Example 3. The EOS monitor or protection device of Example 2, wherein the series ballast resistor has an electrical resistance that is substantially higher than an electrical resistance of the second conductive layer.

Example 4. The EOS monitor or protection device of Example 2, wherein the ballast resistor comprises an elongated line portion having a length-to-width ratio exceeding 5.

Example 5. The EOS or monitor or protection device of Example 2, wherein each of the arcing tips comprises a sharpened tip portion pointing in a lateral direction.

Example 6. The EOS monitor or protection device of Example 2, wherein the first conductive layer comprises the arcing tips each integrally formed in series with the ballast resistor in the same metallization layer.

Example 7. The EOS monitor or protection device of Example 5, wherein the first conductive layer is thinner than and is formed at a lower metallization layer relative to the second conducive layer.

Example 8. An electrical overstress (EOS) monitor or protection device comprising:

a substrate having a horizontal main surface;

a first metallization layer over the substrate and a second metallization layer formed over the first metallization layer;

the first metallization layer comprising a first arcing electrode layer comprising a first end portion comprising a plurality of arcing tips each in series with a series ballast resistor, the first metallization layer further comprising a conductive via formed on a contacting portion of the first arcing electrode layer; and the second metallization layer comprising a second arcing electrode layer laterally overlapping with the arcing tips and further comprising a contacting metal layer overlapping and contacting the conductive via, wherein the first and second arcing electrode layers are electrically connected respectively to first and second voltage nodes configured to receive an EOS voltage therebetween to cause an arc discharge between at least one of the arcing tips and the second arcing electrode layer.

Example 9. The EOS monitor or protection device of Example 8, wherein the series ballast resistor has an electrical resistance that is substantially higher than an electrical resistance of each of the first the second arcing electrode layers.

Example 10. The EOS monitor or protection device of Example 9, wherein the series ballast resistor has an electrical resistance that is substantially higher than an electrical resistance of each of a path between the first arcing electrode layer and the first voltage node and a path between the second arcing electrode layer and the second voltage node.

Example 11. The EOS monitor or protection device of Example 10, wherein the first metallization layer comprises a plurality of conductive vias formed on the contacting portion of the first arcing electrode layer, and the contacting metal layer overlaps and contacts the plurality of conductive vias.

Example 12. The EOS monitor or protection device of Example 8, wherein the ballast resistor comprises an elongated line portion having a length-to-width ratio exceeding 5.

Example 13. The EOS monitor or protection device of Example 12, wherein the contacting portion of the first arcing electrode layer comprises a plurality of bevel portions narrowing to the elongated line portions of the series ballast resistor.

Example 14. The EOS monitor or protection device of Example 12, further comprising a floating metal layer formed over the elongated line portion without making an electrical contact to another conductive feature.

Example 15. An electrical overstress (EOS) monitor or protection device comprising:

a substrate having a horizontal main surface;

a first metallization layer over the substrate and a second metallization layer formed over the first metallization layer;

the first metallization layer comprising a first arcing electrode layer comprising arcing tips formed at opposing ends thereof; and the second metallization layer comprising a pair of second arcing electrode layers each laterally overlapping a respective one of the arcing tips at the opposing ends of the first arcing electrode layer, wherein the second arcing electrode layers are electrically connected respectively to first and second voltage nodes configured to receive an EOS voltage therebetween to cause an arc discharge between at least one of the arcing tips and corresponding ones of the second arcing electrode layers.

Example 16. The EOS monitor or protection device of Example 15, wherein each of the arcing tips formed at the opposing ends arcs with the corresponding one of the second electrode layer arcs in response to the EOS voltage.

Example 17. The EOS monitor or protection device of Example 16, wherein the first metallization layer comprises a plurality of first arcing electrode layers each comprising arcing tips formed at opposing ends thereof, and wherein each of the pair of second arcing electrode layers laterally overlaps arcing tips of different ones of the plurality of first arcing electrode layers such that upon activation, the plurality of first arcing electrode layers is electrically connected in parallel.

Example 18. The EOS monitor or protection device of Example 16, wherein the first metallization layer comprises a plurality of first arcing electrode layers each comprising arcing tips formed at opposing ends thereof, wherein the second metallization layer comprises a plurality of second arcing electrode layers each laterally overlapping one of the arcing tips, and wherein adjacent ones of the first arcing electrode layers have arcing tips overlapped by electrically shorted ones of the second arcing electrode layers such that upon activation, the adjacent ones of the first arcing electrode layers are electrically connected in series.

Example 19. The EOS monitor or protection device of Example 17, wherein the arcing tips on the opposing ends of each of the first arcing electrode layer are connected by a series ballast resistor having an electrical resistance that is substantially higher than an electrical resistance of each of the pair of second arcing electrode layers.

Example 20. The EOS monitor or protection device of Example 19, wherein the series ballast resistors are electrically shorted to each other.

Examples III

Example 1. An electrical overstress (EOS) monitor or protection device comprising:

a sheet resistor formed over a substrate;

an array of arcing electrode pairs formed by:

an array of first arcing electrodes formed on the sheet resistor, the first arcing electrodes electrically connected to a first voltage node, and a second arcing electrode arranged as a sheet formed over the first arcing electrodes and separated from the first arcing electrodes by an arcing gap, the second arcing electrode electrically connected to a second voltage node, wherein the arcing electrode pairs are configured to generate arc discharges in response to an EOS voltage signal received between the first and second voltage nodes.

Example 2. The EOS monitor or protection device of Example 1, wherein the sheet resistor has a thickness and is formed of a material such that when an arc discharge is generated between one of the first arcing electrodes and the second arcing electrode to form a current path between the first and second voltage nodes, a path through the sheet resistor provides a highest resistance value in the current path.

Example 3. The EOS monitor or protection device of Example 1, wherein the first arcing electrodes are formed of a different conductive material from the sheet resistor.

Example 4. The EOS monitor or protection device of Example 1, wherein the first arcing electrodes are substantially thicker than the sheet resistor.

Example 5. The EOS monitor or protection device of Example 1, wherein the first arcing electrodes are formed by patterning first electrode layer having a substantially uniform thickness such that the first arcing electrodes have substantially flat top surfaces at a same vertical height.

Example 6. The EOS monitor or protection device of Example 5, wherein the first arcing electrodes are patterned to be individually isolated features contacting the sheet resistor such that no other physical connections are made thereto.

Example 7. The EOS monitor or protection device of Example 1, wherein the second arcing electrode has an area sufficient to laterally span a plurality of first arcing electrodes in each of two orthogonal directions.

Example 8. An electrical overstress (EOS) monitor or protection device comprising:

a sheet resistor formed over a substrate;

a first metallization level comprising an array of metallization structures formed on the sheet resistor, wherein some of the metallization structures are configured as first arcing electrodes while some others of the metallization structures serve as contact landing pads electrically connected to a first voltage node; and a second metallization level formed above the first metallization level and comprising a second arcing electrode arranged as a sheet formed over the first arcing electrodes and separated from the first arcing electrodes by a gap distance, the second arcing electrode electrically connected to a second voltage node;

wherein first arcing electrodes and the second arcing electrode are arranged to form a plurality of arcing electrode pairs configured to generate arc discharges in response to an EOS voltage signal received between the first and second voltage nodes.

Example 9. The EOS monitor or protection device of Example 8, wherein the sheet resistor has a thickness and is formed of a material such that when an arc discharge is generated between one of the first arcing electrodes and the second arcing electrode to form a current path between the first and second voltage nodes, a path through the sheet resistor provides a highest resistance value in the current path.

Example 10. The EOS monitor or protection device of Example 8, further comprising a third metallization level formed above the second metallization level, wherein the third metallization level comprises a first contact pad configured as one of the first and second voltage nodes.

Example 11. The EOS monitor or protection device of Example 10, wherein the third metallization level further comprises a second contact pad configured as the other of the first and second voltage nodes.

Example 12. The EOS monitor or protection device of Example 10, wherein the first contact pad is configured as the first voltage node electrically connected to one of the contact landing pads through one or more vias.

Example 13. The EOS monitor or protection device of Example 12, wherein the one or more vias pass through an opening formed in the second arcing electrode.

Example 14. The EOS monitor or protection device of Example 11, wherein the second contact pad is configured as the second voltage node electrically connected to the second arcing electrode through one or more vias.

Example 15. An electrical overstress (EOS) monitor or protection device comprising:

a first metallization level comprising an array of metallization structures formed on a sheet resistor, wherein the metallization structures comprise a first arcing electrode and a contact pad electrically connected to a first voltage node; and a second metallization level formed above the first metallization level and comprising a second arcing electrode arranged as a sheet formed over the first arcing electrode and separated from the first arcing electrodes by a gap distance, the second electrode electrically connected to a second voltage node;

wherein the first arcing electrode and the contact pad are formed on the sheet resistor providing a highest resistance in a current path from the first arcing electrode to the second arcing electrode when an arc discharges between the first and second electrodes in response to an EOS voltage signal received between the first and second voltage nodes.

Example 16. The EOS monitor or protection device of Example 15, wherein the first arcing electrode is formed of a different conductive material from the sheet resistor in contact therewith.

Example 17. The EOS monitor or protection device of Example 15, wherein the first arcing electrode is substantially thicker than the sheet resistor.

Example 18. The EOS monitor or protection device of Example 15, further comprising a third metallization formed above the second metallization level, wherein the third metallization level comprises a first contact pad configured as the first or the second voltage nodes.

Example 19. The EOS monitor or protection device of Example 18, wherein the third metallization level further comprises a second contact pad configured as the other of the first and second voltage nodes.

Example 20. The EOS monitor or protection device of Example 19, wherein the first contact pad is configured as the first voltage node electrically connected to the contact pad through one or more vias.

Examples IV

Example 1. An electrical overstress (EOS) monitor or protection device comprising:

a substrate having a horizontal main surface;

an enclosed volume formed over the horizontal main surface and filled with a medium; and one or more arcing electrode pairs separated by the enclosed volume, wherein electrodes of each arcing electrode pair are separated in a vertical direction, crossing the horizontal main surface, by a gap and serve as arcing electrodes configured to generate an arc discharge in response to an EOS signal received between a first voltage node and a second voltage node.

Example 2. The EOS monitor or protection device of Example 1, wherein the medium comprises a sealed volume of a gas.

Example 3. The EOS monitor or protection device of Example 2, wherein the gas has a different composition from ambient air.

Example 4. The EOS monitor or protection device of Example 2, wherein the arcing electrode pairs comprise upper conductive partial vias electrically connected to the first voltage node and lower conductive partial vias electrically connected to the second voltage node.

Example 5. The EOS monitor or protection device of Example 4, wherein each of the upper conductive partial vias has one end electrically connected to a first metallization layer over the enclosed volume and the other end terminating at the enclosed volume.

Example 6. The EOS monitor or protection device of Example 5, wherein each of the lower conductive partial vias has one end connected to a second metallization layer over the enclosed volume and the other end terminating at the enclosed volume, the second metallization layer formed at a different metallization level relative to the first metallization layer.

Example 7. The EOS monitor or protection device of Example 2, wherein enclosed volume is vertically interposed by an upper metallization layer electrically connected to the first voltage node and a lower metallization layer electrically connect to the second voltage node.

Example 8. The EOS monitor or protection device of Example 7, wherein the enclosed volume is vertically defined by the upper metallization layer and the lower metallization layer both exposed to the enclosed volume and serving as the arcing electrode pair.

Example 9. The EOS monitor or protection device of Example 7, wherein at least one of the upper and lower metallization layers comprise one or more slots.

Example 10. An electrical overstress (EOS) monitor or protection device comprising:

a substrate having a horizontal main surface having formed thereon one or more lower arcing electrodes; and an electrically conductive beam disposed over the horizontal main surface and anchored on opposing ends, the electrically conductive beam having one or more upper arcing electrodes formed on a bottom surface thereof, wherein the upper and lower arcing electrodes are separated in a vertical direction, crossing the horizontal main surface, by a gap to serve as one or more arcing electrode pairs configured to generate an arc discharge in response to an EOS signal received between a first voltage node and a second voltage node.

Example 11. The EOS monitor or protection device of Example 10, wherein the upper and lower arcing electrodes are disposed in an enclosed volume of a gas serving as an arcing medium.

Example 12. The EOS monitor or protection device of Example 11, wherein the upper arcing electrodes comprise upper protrusions electrically connected to the first voltage node and the lower arcing electrodes comprise lower protrusions electrically connected to the second voltage node.

Example 13. The EOS monitor or protection device of Example 12, wherein the upper arcing electrodes are electrically connected to the first voltage node through a first interconnect metal layer and the lower arcing electrodes are electrically connected to the second voltage node through a second interconnect metal layer.

Example 14. The EOS monitor or protection device of Example 13, wherein the first and second interconnect metal layers are formed at a common metallization level.

Example 15. The EOS monitor or protection device of Example 14, wherein the common metallization level is formed below the main surface.

Example 16. The EOS monitor or protection device of Example 10, wherein the lower arcing electrodes are electrically shorted to each other by a ballast resistor, and wherein the upper arcing electrodes are electrically shorted to each other by the electrically conductive beam.

Example 17. An electrical overstress (EOS) monitor or protection device comprising:

a substrate having a horizontal main surface;

an enclosed volume formed over the horizontal main surface and filled with a gas medium; and one or more arcing electrode pairs formed in the enclosed volume, wherein electrodes of each arcing electrode pair are separated in a vertical direction crossing the horizontal main surface by a gap and serve as arcing electrodes configured to generate an arc discharge in response to an EOS signal received between a first voltage node and a second voltage node.

Example 18. The EOS monitor or protection device of Example 17, wherein the arcing electrode pairs comprise:

one or more lower arcing electrodes formed over the horizontal main surface of the substrate; and one or more upper arcing electrodes formed on a bottom surface an electrically conductive beam disposed over the horizontal main surface, the electrically conductive beam being anchored on opposing ends.

Example 19. The EOS monitor or protection device of Example 18, wherein the gas medium has different composition from ambient air.

Example 20. The EOS monitor or protection device of Example 19, wherein the enclosed volume is hermetically sealed.

Examples V

Example 1. An integrated micro-electromechanical system (MEMS) device, comprising:

a substrate having a horizontal main surface;

a MEMS switch comprising a switch beam anchored at one end over the horizontal main surface; and an electrical overstress (EOS) monitor or protection device comprising one or more pairs of arcing electrodes fabricated on the substrate, wherein the arcing electrodes of each pair are separated in a vertical direction crossing the horizontal main surface by an arcing gap and are configured to generate an arc discharge in response to an EOS signal received by the MEMS device received between a first voltage node and a second voltage node, wherein the MEMS switch and the EOS monitor or protection device have one or more corresponding structures that are co-fabricated such that the corresponding structures comprise a same material or have at least one common feature dimension.

Example 2. The integrated MEMS device of Example 1, wherein the EOS monitor or protection device comprises an electrically conductive beam disposed over the horizontal main surface and anchored on opposing ends, and wherein the pairs of arcing electrodes are disposed vertically between the electrically conductive beam and the horizontal main surface of the substrate.

Example 3. The integrated MEMS device of Example 2, wherein the pairs of arcing electrodes are formed by one or more lower arcing electrodes formed over the horizontal main surface and one or more upper arcing electrodes formed on a bottom surface of the electrically conductive beam.

Example 4. The integrated MEMS device of Example 3, wherein the lower arcing electrodes are electrically shorted to each other by a ballast resistor, and wherein the upper arcing electrodes are electrically shorted to each other by the electrically conductive beam.

Example 5. The integrated MEMS device of Example 4, wherein a resistance of the ballast resistor is substantially higher than a resistance between the ballast resistor and the first voltage node electrically connected to the lower arcing electrodes.

Example 6. The integrated MEMS device of Example 2, wherein the corresponding structures comprise the electrically conductive beam of the EOS monitor or protection device and the switch beam.

Example 7. The integrated MEMS device of Example 6, wherein the electrically conductive beam of the EOS monitor or protection device and the switch beam of the MEMS switch are formed of a same metal.

Example 8. The integrated MEMS device of Example 6, wherein the electrically conductive beam of the EOS monitor or protection device and the switch beam of the MEMS switch are co-deposited to have the same thickness at corresponding horizontal portions thereof.

Example 9. The integrated MEMS device of Example 1, wherein the switch beam of the MEMS switch and the pairs of arcing electrodes are enclosed in a volume filled with a gas medium different from ambient air.

Example 10. The integrated MEMS device of Example 1, wherein a bottom electrode of the (EOS) monitor or protection device is formed over the horizontal main surface of the substrate below the switch beam and between the anchored end and a tip of the switch beam.

Example 11. The integrated MEMS device of Example 10, wherein the switch beam comprises a top electrode of the (EOS) monitor or protection device that is separated from the bottom electrode in the vertical direction, by the arcing gap.

Example 12. The integrated MEMS device of Example 11, wherein the switch beam and the bottom electrode are enclosed in a volume filled with a gas medium different from ambient air.

Example 13. The integrated MEMS device of Example 12, wherein the switch beam is electrically connected to the second voltage node and the bottom electrode is electrically connected to the first voltage node.

Example 14. The integrated MEMS device of Example 12, wherein the bottom electrode is electrically connected to the first voltage node by a ballast resistor having a resistance substantially higher than a resistance between the ballast resistor and the first voltage node.

Example 15. An integrated micro-electromechanical system (MEMS) device, comprising:

a substrate having a horizontal main surface;

a MEMS switch comprising a switch beam anchored at one end and a switching gap at the other end between a tip of the switch beam and a conductive pad formed on the horizontal main surface; and an electrical overstress (EOS) monitor or protection device comprising one or more pairs of arcing electrodes fabricated on the substrate, wherein the arcing electrodes of each pair are separated in a vertical direction crossing the horizontal main surface by an arcing gap, wherein in response to an EOS signal, the arcing electrode pairs are configured to generate an arc discharge across the arcing gap at an arcing voltage that is lower relative to a breakdown voltage of the MEMS switch across the switch gap.

Example 16. The integrated MEMS device of Example 15, wherein the switch beam comprises a cantilever beam configured to be actuated by an electrostatic force between the switch beam and a gate electrode formed under the switch beam on the horizontal main surface.

Example 17. The integrated MEMS device of Example 16, wherein the MEMS switch is a three-terminal device comprising the one end of the switch beam serving as a source terminal, the conductive pad serving as a drain terminal, and the gate electrode serving as a gate terminal, wherein when actuated, the tip of the switch beam touches the conductive pad to flow current through the switch beam.

Example 18. The integrated MEMS device of Example 16, wherein the EOS monitor or protection device comprises an electrically conductive beam disposed over the horizontal main surface and anchored on opposing ends, and wherein the pairs of arcing electrodes are disposed vertically between the electrically conductive beam and the horizontal main surface of the substrate.

Example 19. The integrated MEMS device of Example 18, wherein the pairs of arcing electrodes are formed by one or more lower arcing electrodes formed over the main surface and one or more upper arcing electrodes formed on a bottom surface of the electrically conductive beam.

Example 20. The integrated MEMS device of Example 19, wherein the electrically conductive beam of the EOS monitor or protection device and the cantilever beam are co-fabricated and have corresponding structures that comprise a same material or have at least one common feature dimension.

Example 21. The integrated MEMS device of Example 20, wherein the electrically conductive beam of the EOS monitor or protection device and the cantilever beam of the MEMS switch are formed of a same metal.

Example 22. An integrated micro-electromechanical system (MEMS) device, comprising:

a substrate having a horizontal main surface;

a MEMS switch comprising a switch beam anchored at one end over the horizontal main surface; and an electrical overstress (EOS) monitor or protection device comprising one or more pairs of arcing electrodes fabricated on the substrate, wherein the arcing electrodes of each pair are separated in a vertical direction crossing the horizontal main surface by a gap and are configured to generate an arc discharge in response to an EOS signal received between a first voltage node and a second voltage node, wherein one or both of the switch beam and the one or more pairs of arcing electrodes are enclosed in an enclosed volume filled with a gas medium different from ambient air.

Example 23. The integrated MEMS device of Example 22, wherein the enclosed volume is hermetically sealed.

Example 24. The integrated MEMS device of Example 23, wherein each of the switch beams and the one or more pairs of arcing electrodes are enclosed in a separate enclosed volume.

Example 25. The integrated MEMS device of Example 22, wherein the pairs of arcing electrodes comprise:

one or more lower arcing electrodes formed over the horizontal main surface of the substrate; and one or more upper arcing electrodes formed on a bottom surface of an electrically conductive beam disposed over the horizontal main surface, the electrically conductive beam being anchored on opposing ends.

Examples VI

Example 1. An electrical overstress (EOS) monitor or protection device comprising:

a substrate having a horizontal main surface; and a plurality of pairs of conductive layers over the horizontal main surface, different ones of the pairs separated in a vertical direction by different vertical distances, wherein each pair serves as an arcing electrode pair and different ones of the arcing electrode pairs are configured to arc discharge at different voltages in response to an EOS signal.

Example 2. The EOS monitor or protection device of Example 1, wherein the plurality of pairs of conductive layers comprise:

a plurality of first conductive layers formed at different vertical levels above the horizontal main surface, each of the first conductive layers extending in a lateral direction substantially parallel to the horizontal main surface; and a second conductive layer formed between the first conductive layers and the horizontal main surface and extending in the lateral direction, wherein different ones of the arcing electrode pairs are formed by different one of the first conductive layers paired with the second conductive layer.

Example 3. The EOS monitor or protection device of Example 2, wherein each of the first conductive layers is electrically connected to a first voltage node, wherein the second conductive layer is electrically connected to a second voltage node, and wherein the arcing electrode pairs are configured to arc discharge in response to an EOS voltage between the first and second voltage nodes in response to the EOS signal.

Example 4. The EOS monitor or protection device of Example 2, wherein each of the first conductive layers has an overlapping portion with the second conductive layer, the overlapping portions serving as arcing regions.

Example 5. The EOS monitor or protection device of Example 2, wherein different ones of the arcing electrode pairs are separated by dielectric regions having different thicknesses.

Example 6. The EOS monitor or protection device of Example 5, wherein different ones of the arcing electrode pairs are separated by dielectric regions having different numbers of discrete dielectric layers.

Example 7. The EOS monitor or protection device of Example 5, wherein different ones of the arcing electrode pairs are separated by dielectric regions having different dielectric materials.

Example 8. An electrical overstress (EOS) monitor or protection device comprising:

a semiconductor substrate having formed thereon one or more layer stacks, wherein each layer stack comprises a dielectric layer formed on the semiconductor substrate and a conductive electrode formed on the dielectric layer, a pair of doped regions formed in the semiconductor substrate at opposing sides of each of the layer stack, and wherein one of the conductive electrodes and the doped regions is electrically connected to a first voltage node and serves as a first arcing electrode, and wherein another one of the conductive electrodes and the doped regions is electrically connected to a second voltage node and serves as a second arcing electrode, and wherein in response to an EOS signal between the first and second voltage nodes, an arc discharge occurs between the first and second arcing electrodes.

Example 9. The EOS monitor or protection device of Example 8, wherein the arc discharge occurs through the dielectric layer of at least one of the layer stacks.

Example 10. The EOS monitor or protection device of Example 9, wherein the conductive electrode of one of the layer stacks is electrically connected to the first voltage node, and the pair of doped regions at opposing sides of the one of the layer stacks is electrically connected to the second voltage node.

Example 11. The EOS monitor or protection device of Example 9, wherein the one or more layer stacks comprise a first layer stack and a second layer stack, wherein the conductive electrode of the first layer stack is electrically connected to the first voltage node, and wherein the conductive electrode of the second layer stack is electrically connected to the second voltage node.

Example 12. The EOS monitor or protection device of Example 11, wherein the doped regions formed at opposing sides of the first and second layer stacks are electrically floating.

Example 13. The EOS monitor or protection device of Example 9, wherein the one or more layer stacks comprise a first layer stack and a second layer stack, wherein one of the pair of doped regions formed at opposing sides of the first layer stack is electrically connected to the first voltage node, and wherein one of the pair of doped regions formed at opposing sides of the second layer stack is electrically connected to the second voltage node.

Example 14. The EOS monitor or protection device of Example 13, wherein the conductive electrode of each of the first layer stack and the second layer stack are electrically floating.

Example 15. The EOS monitor or protection device of Example 9, wherein the one or more layer stacks comprise a first layer stack and a second layer stack, wherein the conductive electrode of the first layer stack is electrically connected to the first voltage node, and wherein one of the pair of doped regions formed at opposing sides of the second layer stack is electrically connected to the second voltage node.

Example 16. The EOS monitor or protection device of Example 8, wherein the arc discharge occurs through the dielectric layers of two or more adjacent ones of the layer stacks.

Example 17. An integrated circuit device, comprising:

a semiconductor substrate having formed thereon a transistor device;

a spark gap device formed on the semiconductor substrate and comprising:

a semiconductor substrate having formed thereon one or more layer stacks, wherein each layer stack comprises a dielectric layer formed on the semiconductor substrate and a conductive electrode formed on the dielectric layer, a pair of doped regions formed in the semiconductor substrate at opposing sides of each of the layer stack, wherein in response to an EOS signal, an arc discharge occurs through the dielectric layer of at least one of the layer stacks, and wherein the spark gap device is not arranged to function as a transistor device.

Example 18. The integrated circuit device of Example 17, wherein the transistor device and the spark gap device are co-fabricated such that the transistor device and the spark gap device have one or more corresponding features having a same physical dimension.

Example 19. The integrated circuit device of Example 18, wherein the corresponding features comprise a gate dielectric of the transistor device and the dielectric layer of the spark gap device.

Example 20. The integrated circuit device of Example 18, wherein one of the conductive electrodes and the doped regions of the spark gap device is electrically connected to a first voltage node and serves as a first arcing electrode, and wherein another one of the conductive electrodes and the doped regions of the spark gap device is electrically connected to a second voltage node and serves as a second arcing electrode, and wherein in response to an EOS signal between the first and second voltage nodes, an arc discharge occurs between the first and second arcing electrodes.

Examples VII

Example 1. An electrical overstress (EOS) monitor or protection device, comprising:

a semiconductor substrate having a horizontal main surface;

first and second oppositely doped semiconductor regions formed in the semiconductor substrate to form a lateral PN junction;

a stack of layers formed on the horizontal main surface over the first doped semiconductor region, the stack of layers comprising a dielectric layer between the horizontal main surface and an arcing electrode layer;

a first metal layer electrically connected to a first voltage node and the first doped semiconductor region; and a second metal layer electrically connected to a second voltage node and the arcing electrode layer, wherein the arcing electrode layer and the first doped semiconductor region are configured to generate an arc discharge therebetween through the dielectric layer in response to an EOS voltage signal received between the first and second voltage nodes.

Example 2. The EOS monitor or protection device of Example 1, wherein the second metal layer is further electrically connected to the second doped semiconductor region.

Example 3. The EOS monitor or protection device of Example 1, further comprising a third electrically floating metal layer electrically connected to the second doped semiconductor region.

Example 4. The EOS monitor or protection device of Example 1, wherein the second metal layer electrically shorts the second doped semiconductor region and the arcing electrode layer.

Example 5. The EOS monitor or protection device of Example 1, wherein the first and second doped semiconductor regions are such that in response to the EOS voltage signal resulting in the second voltage node being placed at a higher voltage relative to the first voltage node, the PN junction becomes reverse-biased.

Example 6. The EOS monitor or protection device of Example 5, wherein the first metal layer is electrically connected to the first doped semiconductor region through a first contact, and wherein the second metal layer electrically connected to the second doped semiconductor region through a second contact, and wherein a first distance between the first contact and the PN junction is greater than a second distance between the second contact and the PN junction.

Example 7. The EOS monitor or protection device of Example 6, wherein the dielectric layer has a thickness of 1 nm to 10 nm.

Example 8. The EOS monitor or protection device of Example 7, wherein the first distance between the first contact and the PN junction and the thickness of the dielectric is such that the arc discharge occurs in response to the EOS voltage signal between 10V and 300V.

Example 9. The EOS monitor or protection device of Example 6, wherein the stack of layers is closer to the PN junction than to the first contact.

Example 10. The EOS monitor or protection device of Example 6, wherein the stack of layers is closer to the first contact than to the PN junction.

Example 11. The EOS monitor or protection device of Example 6, wherein the first doped semiconductor region comprises a first heavily doped region doped with a same dopant type as the first doped semiconductor region, and wherein the first contact contacts the first heavily doped region.

Example 12. The EOS monitor or protection device of Example 6, wherein the second doped semiconductor region comprises a second heavily doped region doped with a same dopant type as the second doped semiconductor region, and wherein the second contact contacts the second heavily doped region.

Example 13. An electrical overstress (EOS) monitor or protection device, comprising:

a semiconductor substrate having a horizontal main surface;

first and second oppositely doped semiconductor regions formed in the semiconductor substrate to form a lateral PN junction;

an isolation region formed in the first doped semiconductor region;

a stack of layers formed on the horizontal main surface over the first doped semiconductor region, the stack of layers comprising a dielectric layer between the horizontal main surface and an arcing electrode layer, wherein a portion of arcing electrode layer extends over the isolation region;

a first voltage node electrically connected to the first doped semiconductor region; and a second voltage node electrically connected to the second doped semiconductor region, wherein the arcing electrode layer and the first doped semiconductor region are configured to generate an arc discharge therebetween through the dielectric layer in response to an EOS voltage signal received between the first and second voltage nodes.

Example 14. The EOS monitor or protection device of Example 13, further comprising a first metal layer electrically connected to the first voltage node and the first doped semiconductor region, and a second metal layer electrically connected to the second voltage node, the second doped semiconductor region and the arcing electrode layer.

Example 15. The EOS monitor or protection device of Example 14, wherein the second metal layer electrically shorts the second doped semiconductor region and the arcing electrode layer.

Example 16. The EOS monitor or protection device of Example 14, wherein the first and second doped semiconductor regions are such that in response to the EOS voltage signal resulting in the second voltage node being placed at a higher voltage relative to the first voltage node, the PN junction becomes reverse-biased.

Example 17. An electrical overstress (EOS) monitor or protection device, comprising:

a semiconductor substrate having a horizontal main surface;

first and second oppositely doped semiconductor regions formed in the semiconductor substrate to form a lateral PN junction;

an isolation region formed in the first doped semiconductor region;

a stack of layers formed on the horizontal main surface over the first doped semiconductor region, the stack of layers comprising a dielectric layer between the horizontal main surface and an arcing electrode layer, a metal layer connected to the arcing electrode layer extending at least partly over the isolation region;

a first voltage node electrically connected to the first doped semiconductor region; and a second voltage node electrically connected to the second doped semiconductor region, wherein the arcing electrode layer and the first doped semiconductor region are configured to generate an arc discharge therebetween through the dielectric layer in response to an EOS voltage signal received between the first and second voltage nodes.

Example 18. The EOS monitor or protection device of Example 17, wherein a portion of arcing electrode layer extends over the isolation region, and wherein the metal layer is connected to the portion of arcing electrode layer.

Example 19. The EOS monitor or protection device of Example 18, further comprising a further metal layer connected to the metal layer and formed at a higher metallization level than the metal layer.

Example 20. The EOS monitor or protection device of Example 17, further comprising a first contact metal layer electrically connected to the first voltage node and the first doped semiconductor region, and a second contact metal layer electrically connected to the second voltage node, the second doped semiconductor region and the arcing electrode layer.

Examples VIII

Example 1. An energy management system comprising:

an electric charging system comprising an energy transmit circuitry configured to transmit electric energy to an electric energy storage system;

the electric energy storage system comprising an energy receive circuitry configured to couple to the energy transmit circuitry to receive the electric energy therefrom and to charge a secondary battery, wherein one or both of the energy transmit circuitry and the energy receive circuitry are configured to be monitored or protected from an electrical overstress (EOS)

signal during transferring of energy from the electric charging system to the electric energy storage system by an EOS protection or monitor device; and the EOS protection or monitor device comprising one or more pairs of arcing electrodes fabricated on a substrate, wherein the arcing electrodes of each pair are separated in a vertical direction, crossing a horizontal main surface of the substrate, by an arcing gap and are configured to generate an arc discharge in response to the EOS signal received between a first voltage node and a second voltage nodes of the energy management system.

Example 2. The energy management system of Example 1, further comprising an electric energy grid connected to the electric charging system and configured to provide electric energy to the electric charging system.

Example 3. The energy management system of Example 1, wherein the energy transmit circuitry comprises the EOS protection or monitor device electrically connected to the first and second voltage nodes.

Example 4. The energy management system of Example 1, wherein the energy receive circuitry comprises the EOS protection or monitor device electrically connected to the first and second voltage nodes.

Example 5. The energy management system of Example 1, wherein the one or both of the energy transmit circuitry and the energy receive circuitry comprise a micro-electromechanical system (MEMS) switch.

Example 6. The energy management system of Example 5, wherein the MEMS switch and the EOS monitor or protection device are co-fabricated on the substrate and comprise corresponding portions having at least one common physical dimension.

Example 7. The energy management system of Example 5, wherein the MEMS switch is configured to disconnect a circuit from the first voltage node in response to generation of the arc discharge.

Example 8. The energy management system of Example 1, wherein the pairs of arcing electrodes are formed by one or more lower arcing electrodes and one or more upper arcing electrodes.

Example 9. The energy management system of Example 8, wherein the lower arcing electrodes are electrically shorted to each other by a ballast resistor, and the upper arcing electrodes are electrically shorted to each other.

Example 10. The energy management system of Example 9, wherein a resistance of the ballast resistor is substantially higher than a resistance between the ballast resistor and the first voltage node electrically connected to the lower arcing electrodes.

Example 11. The energy management system of any one of Examples 1-10, wherein the pairs of arcing electrodes and the arcing gap are enclosed in a volume filled with a gas medium different from ambient air.

Example 12. The energy management system of any one of Examples 1-10, wherein the energy storage system comprises an electric vehicle and the charging system comprises an electric vehicle charging station.

Example 13. The energy management system of any one of Examples 1-10, wherein the one or both of the energy transmit circuitry and the energy receive circuitry further comprise an electric isolator coupled to the EOS protection or monitor device.

Example 14. The energy management system of Example 13, wherein the electric isolator comprises an inductive isolator.

Example 15. An electric vehicle charging system comprising:

a docking station;

an electric vehicle (EV) energy storage system connected to a first voltage node of the docking station to receive electric energy from the docking station, wherein a charging circuit path between the docking station and the EV energy storage system is configured to be monitored or protected from an electrical overstress (EOS) signal during transferring of energy from the docking station to the EV energy storage system by an electrical overstress (EOS) protection or monitor device connected between the first voltage node and a second voltage node; and the EOS protection or monitor device comprising one or more pairs of arcing electrodes fabricated on a substrate, wherein the arcing electrodes of each pair are separated in a vertical direction, crossing a horizontal main surface of the substrate, by an arcing gap and are configured to generate an arc discharge in response to an EOS signal received between the first voltage node and the second voltage node.

Example 16. The electric vehicle charging system of Example 15, further comprising a MEMS switch connected to the first voltage node and a sensor and configured to electrically connect the sensor to the first voltage node in an ON state.

Example 17. The electric vehicle charging system of Example 16, wherein the MEMS switch and the EOS monitor or protection device are co-fabricated on the substrate and comprise corresponding portions having at least one common physical dimension.

Example 18. The electric vehicle charging system of Example 16, further comprising an isolator connected between a gate of the MEMS and the second voltage node and configured to electrically decouple the gate from the second voltage node and control a state of the MEMS switch based on a voltage drop across the EOS protection or monitor device.

Example 19. The electric vehicle charging system of Example 16, wherein an electric arc formed in the arcing gap of the EOS protection or monitor device electrically disconnects the sensor from the first voltage node by changing a state of the MEMS switch from the ON state to an OFF state.

Example 20. The electric vehicle charging system of Example 18, wherein the isolator comprises an optical isolator.

Example 21. The electric vehicle charging system of Example 18, wherein the isolator comprises a magnetic isolator.

Example 22. The electric vehicle charging system of any one of Examples 15-21, wherein the pairs of arcing electrodes are formed by one or more lower arcing electrodes and one or more upper arcing electrodes.

Example 23. The electric vehicle charging system of Example 22, wherein the lower arcing electrodes are electrically shorted to each other by a ballast resistor, and the upper arcing electrodes are electrically shorted to each other.

Example 24. The electric vehicle charging system of Example 23, wherein a resistance of the ballast resistor is substantially higher than a resistance between the ballast resistor and the first voltage node electrically connected to the lower arcing electrodes.

Example 25. The electric vehicle charging system of any one of Examples 15-21, wherein the pairs of arcing electrodes and the arcing gap are enclosed in a volume filled with a gas medium different from ambient air.

Example 26. The electric vehicle charging system of any one of Examples 16-21, wherein the EOS protection or monitor device, the MEMS switch and the sensor are within the EV energy storage system.

Example 27. The electric vehicle charging system of Example 26, further comprising a second EOS protection or monitor device within the docking station, the second EOS protection or monitor device comprising one or more additional pairs of arcing electrodes fabricated on a second substrate, wherein the arcing electrodes of each additional pair are separated in a vertical direction, crossing a horizontal main surface of the second substrate, by a second arcing gap and are configured to generate an arc discharge in response to the EOS signal received between the first voltage node and a second voltage node of the energy storage system.

Example 28. The electric vehicle charging system of Example 27, further comprising a second MEMS switch connected to the first voltage node and a second sensor and configured to electrically connect the second sensor to the first voltage node in an ON state, wherein the second MEMS switch and the second sensor are withing the docking station.

Example 29. The electric vehicle charging system of any one of Examples 28, wherein an electric arc formed in the second arcing gap of the EOS protection or monitor device electrically disconnects the second sensor from the first voltage node by changing a state of the second MEMS switch from the ON state to an OFF state.

Example 30. The electric vehicle charging system of Example 28, wherein the MEMS switch and the EOS monitor or protection device are co-fabricated on the substrate and comprise corresponding portions having at least one common physical dimension.

Example 31. The electric vehicle charging system of Example 28, further comprising a second isolator connected between a second gate of the second MEMS switch and the second voltage node and configured to electrically decouple the second gate from the second voltage node and control a state of the second MEMS switch based on a voltage drop across the second EOS protection or monitor device.

Example 32. The electric vehicle charging system of Example 31, wherein the second isolator comprises an optical isolator.

Example 33. The electric vehicle charging system of Example 31, wherein the second isolator comprises a magnetic isolator.

Terminology

In the foregoing, it will be appreciated that any feature of any one of the embodiments can be combined or substituted with any other feature of any other one of the embodiments.

Aspects of this disclosure can be implemented in various electronic devices. Examples of the electronic devices can include, but are not limited to, consumer electronic products, parts of the consumer electronic products, electronic test equipment, cellular communications infrastructure such as a base station, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a personal digital assistant (PDA), a microwave, a refrigerator, a vehicular electronics system such as an automotive electronics system, a stereo system, a DVD player, a CD player, a digital music player such as an MP3 player, a radio, a camcorder, a camera such as a digital camera, a portable memory chip, a washer, a dryer, a washer/dryer, peripheral device, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The various features and processes described above may be implemented independently of one another or may be combined in various ways. All possible combinations and subcombinations of features of this disclosure are intended to fall within the scope of this disclosure.

What is claimed is:

1. An electrical overstress (EOS) monitor or protection device comprising:

a substrate having a horizontal main surface;

a first conductive layer and a second conductive layer, each extending over the substrate and substantially parallel to the horizontal main surface while being separated in a vertical direction crossing the horizontal main surface, wherein one of the first and second conductive layers is electrically connected to a first voltage node and the other of the first and second conductive layers is electrically connected to a second voltage node, wherein the first conductive layer comprises a plurality of arcing tips laterally extending to overlap with the second conductive layer, and wherein the arcing tips are configured to form arcing electrode pairs with the second conductive layer to form an arc discharge in response to an EOS voltage between the first and second voltage nodes; and a series ballast resistor defined in the first conductive layer and electrically connected between each of the arcing tips and the first voltage node, wherein a resistance of the series ballast resistor is substantially higher than a resistance of the second conductive layer.

2. The EOS monitor or protection device of claim 1, wherein the arc discharge occurs between one or more of the arcing tips and the second conductive layer.

3. The EOS monitor or protection device of claim 2, wherein the series ballast resistor has an electrical resistance that is substantially higher than an electrical resistance of the second conductive layer.

4. The EOS monitor or protection device of claim 2, wherein the series ballast resistor comprises an elongated line portion having a length-to-width ratio exceeding 5.

5. The EOS monitor or protection device of claim 2, wherein each of the arcing tips comprises a sharpened tip portion pointing in a lateral direction.

6. The EOS monitor or protection device of claim 2, wherein each of the arcing tips is integrally formed in series with the series ballast resistor in the same metallization layer.

7. The EOS monitor or protection device of claim 5, wherein the first conductive layer is thinner than and is formed at a lower metallization layer relative to the second conductive layer.

* * * * *